US009691873B2

(12) United States Patent
Rogers et al.

(10) Patent No.: US 9,691,873 B2
(45) Date of Patent: Jun. 27, 2017

(54) TRANSIENT DEVICES DESIGNED TO UNDERGO PROGRAMMABLE TRANSFORMATIONS

(71) Applicants: THE BOARD OF TRUSTEES OF THE UNIVERSITY OF ILLINOIS, Urbana, IL (US); TRUSTEES OF TUFTS COLLEGE, Medford, MA (US)

(72) Inventors: John A. Rogers, Champaign, IL (US); Fiorenzo G. Omenetto, Wakefield, MA (US); Suk-Won Hwang, Urbana, IL (US); Hu Tao, Medford, MA (US); Dae-Hyeong Kim, Urbana, IL (US); David Kaplan, Concord, MA (US)

(73) Assignees: The Board of Trustees of the University of Illinois, Urbana, IL (US); Trustees of Tufts College, Medford, MA (US)

(*) Notice: Subject to any disclaimer, the term of this patent is extended or adjusted under 35 U.S.C. 154(b) by 36 days.

(21) Appl. No.: 13/624,096

(22) Filed: Sep. 21, 2012

(65) Prior Publication Data

US 2013/0140649 A1 Jun. 6, 2013

Related U.S. Application Data

(60) Provisional application No. 61/565,907, filed on Dec. 1, 2011, provisional application No. 61/636,510, filed on Apr. 20, 2012.

(51) Int. Cl.
*H01L 29/66* (2006.01)
*H01L 31/08* (2006.01)
(Continued)

(52) U.S. Cl.
CPC .............. *H01L 29/66* (2013.01); *B82Y 10/00* (2013.01); *H01L 29/0669* (2013.01);
(Continued)

(58) Field of Classification Search
CPC ....................... G06F 2221/2143; G06F 21/554
(Continued)

(56) References Cited

U.S. PATENT DOCUMENTS

| 3,949,410 A | 4/1976 | Bassous |
| 4,058,418 A | 11/1977 | Lindmayer |

(Continued)

FOREIGN PATENT DOCUMENTS

| CN | 1222758 | 7/1999 |
| CN | 1454045 | 11/2003 |

(Continued)

OTHER PUBLICATIONS

Abbaschian et al. (Dec. 2005) "High Pressure-High Temperature Growth of Diamond Crystals Using Split Sphere Apparatus," *Diamond Relat. Mater.* 14(11-12):1916-1919.
(Continued)

*Primary Examiner* — Peniel M Gumedzoe
*Assistant Examiner* — Christopher Johnson
(74) *Attorney, Agent, or Firm* — Lathrop & Gage LLP

(57) ABSTRACT

The invention provides transient devices, including active and passive devices that electrically and/or physically transform upon application of at least one internal and/or external stimulus. Materials, modeling tools, manufacturing approaches, device designs and system level examples of transient electronics are provided.

34 Claims, 116 Drawing Sheets

(51) Int. Cl.
*H01L 29/786* (2006.01)
*B82Y 10/00* (2011.01)
*H01L 29/06* (2006.01)
*H01Q 1/22* (2006.01)
*H01Q 7/00* (2006.01)
*G11B 23/28* (2006.01)
*H01L 29/861* (2006.01)
*H01L 29/778* (2006.01)
*H01L 29/812* (2006.01)
*H01L 29/872* (2006.01)
*H01L 23/29* (2006.01)
*H01L 27/01* (2006.01)
*H01L 49/02* (2006.01)

(52) U.S. Cl.
CPC .... *H01L 29/66007* (2013.01); *H01L 29/7869* (2013.01); *H01L 29/78603* (2013.01); *H01L 29/78696* (2013.01); *H01L 31/08* (2013.01); *H01Q 1/2283* (2013.01); *H01Q 7/00* (2013.01); *G11B 23/282* (2013.01); *H01L 23/293* (2013.01); *H01L 27/016* (2013.01); *H01L 28/10* (2013.01); *H01L 28/20* (2013.01); *H01L 28/40* (2013.01); *H01L 29/7787* (2013.01); *H01L 29/812* (2013.01); *H01L 29/861* (2013.01); *H01L 29/872* (2013.01); *H01L 2924/0002* (2013.01); *Y10S 257/922* (2013.01)

(58) Field of Classification Search
USPC ........................................................ 257/414
See application file for complete search history.

(56) References Cited

U.S. PATENT DOCUMENTS

| | | | |
|---|---|---|---|
| 4,392,451 A | | 7/1983 | Mickelsen et al. |
| 4,471,003 A | | 9/1984 | Cann |
| 4,487,162 A | | 12/1984 | Cann |
| 4,663,828 A | | 5/1987 | Hanak |
| 4,761,335 A | | 8/1988 | Aurichio et al. |
| 4,766,670 A | | 8/1988 | Gazdik et al. |
| 4,784,720 A | | 11/1988 | Douglas |
| 4,855,017 A | | 8/1989 | Douglas |
| 5,041,973 A | | 8/1991 | Lebron et al. |
| 5,118,400 A | | 6/1992 | Wollam |
| 5,178,957 A | | 1/1993 | Kolpe et al. |
| 5,204,144 A | | 4/1993 | Cann et al. |
| 5,313,094 A | | 5/1994 | Beyer et al. |
| 5,339,180 A | | 8/1994 | Katoh |
| 5,376,820 A * | | 12/1994 | Crafts et al. .................. 257/529 |
| 5,403,700 A | | 4/1995 | Heller et al. |
| 5,427,096 A | | 6/1995 | Bogusiewicz et al. |
| 5,434,751 A | | 7/1995 | Cole, Jr. et al. |
| 5,455,178 A | | 10/1995 | Fattnger |
| 5,469,845 A | | 11/1995 | Delonzor et al. |
| 5,501,893 A | | 3/1996 | Laermer et al. |
| 5,512,218 A | | 4/1996 | Gresser et al. |
| 5,525,815 A | | 6/1996 | Einset |
| 5,545,291 A | | 8/1996 | Smith et al. |
| 5,625,471 A | | 4/1997 | Smith |
| 5,648,148 A | | 7/1997 | Simpson |
| 5,653,742 A | | 8/1997 | Parker et al. |
| 5,687,737 A | | 11/1997 | Branham et al. |
| 5,691,245 A | | 11/1997 | Bakhit |
| 5,753,529 A | | 5/1998 | Chang et al. |
| 5,757,081 A | | 5/1998 | Chang et al. |
| 5,767,578 A | | 6/1998 | Chang et al. |
| 5,772,905 A | | 6/1998 | Chou |
| 5,783,856 A | | 7/1998 | Smith et al. |
| 5,790,151 A | | 8/1998 | Mills |
| 5,817,242 A | | 10/1998 | Biebuyck et al. |
| 5,824,186 A | | 10/1998 | Smith et al. |
| 5,904,545 A | | 5/1999 | Smith et al. |
| 5,907,189 A | | 5/1999 | Mertol |
| 5,915,180 A | | 6/1999 | Hara et al. |
| 5,917,534 A | | 6/1999 | Rajeswaran |
| 5,928,001 A | | 7/1999 | Gilette et al. |
| 5,954,715 A | | 9/1999 | Harrington et al. |
| 5,955,781 A | | 9/1999 | Joshi et al. |
| 5,976,683 A | | 11/1999 | Liehrr et al. |
| 5,998,291 A | | 12/1999 | Bakhit et al. |
| 6,024,702 A | | 2/2000 | Iverson |
| 6,057,212 A | | 5/2000 | Chan et al. |
| 6,080,608 A | | 6/2000 | Nowak |
| 6,091,979 A | | 7/2000 | Madsen |
| 6,097,984 A | | 8/2000 | Douglas |
| 6,134,045 A | | 10/2000 | Jiang et al. |
| 6,165,391 A | | 12/2000 | Vedamuttu |
| 6,171,730 B1 | | 1/2001 | Kuroda et al. |
| 6,225,149 B1 | | 5/2001 | Gan et al. |
| 6,236,883 B1 | | 5/2001 | Ciaccio et al. |
| 6,265,326 B1 | | 7/2001 | Ueno |
| 6,274,508 B1 | | 8/2001 | Jacobsen et al. |
| 6,276,775 B1 | | 8/2001 | Schulte |
| 6,277,712 B1 | | 8/2001 | Kang et al. |
| 6,281,038 B1 | | 8/2001 | Jacobsen et al. |
| 6,284,418 B1 | | 9/2001 | Trantolo |
| 6,291,896 B1 | | 9/2001 | Smith |
| 6,316,278 B1 | | 11/2001 | Jacobsen et al. |
| 6,316,283 B1 | | 11/2001 | Saurer |
| 6,317,175 B1 | | 11/2001 | Salerno et al. |
| 6,322,895 B1 | | 11/2001 | Canham |
| 6,334,960 B1 | | 1/2002 | Willson et al. |
| 6,380,729 B1 | | 4/2002 | Smith |
| 6,403,397 B1 | | 6/2002 | Katz |
| 6,413,790 B1 | | 7/2002 | Duthaler et al. |
| 6,417,025 B1 | | 7/2002 | Gengel |
| 6,420,266 B1 | | 7/2002 | Smith et al. |
| 6,433,401 B1 | | 8/2002 | Clark et al. |
| 6,451,191 B1 | | 9/2002 | Bentsen et al. |
| 6,459,418 B1 | | 10/2002 | Comiskey et al. |
| 6,468,638 B2 | | 10/2002 | Jacobsen et al. |
| 6,479,395 B1 | | 11/2002 | Smith et al. |
| 6,517,995 B1 | | 2/2003 | Jacobson et al. |
| 6,527,964 B1 | | 3/2003 | Smith et al. |
| 6,555,408 B1 | | 4/2003 | Jacobsen et al. |
| 6,559,905 B1 | | 5/2003 | Akiyama |
| 6,566,744 B2 | | 5/2003 | Gengel |
| 6,580,151 B2 | | 6/2003 | Vandeputte et al. |
| 6,586,338 B2 | | 7/2003 | Smith et al. |
| 6,590,346 B1 | | 7/2003 | Hadley et al. |
| 6,606,079 B1 | | 8/2003 | Smith |
| 6,606,247 B2 | | 8/2003 | Credelle et al. |
| 6,608,370 B1 | | 8/2003 | Chen et al. |
| 6,623,579 B1 | | 9/2003 | Smith et al. |
| 6,639,578 B1 | | 10/2003 | Comiskey et al. |
| 6,655,286 B2 | | 12/2003 | Rogers |
| 6,657,289 B1 | | 12/2003 | Craig et al. |
| 6,661,037 B2 | | 12/2003 | Pan et al. |
| 6,665,044 B1 | | 12/2003 | Jacobsen et al. |
| 6,666,821 B2 | | 12/2003 | Keimel |
| 6,683,663 B1 | | 1/2004 | Hadley et al. |
| 6,693,384 B1 | | 2/2004 | Vicentini et al. |
| 6,706,402 B2 | | 3/2004 | Rueckes et al. |
| 6,720,469 B1 | | 4/2004 | Curtis et al. |
| 6,723,576 B2 | | 4/2004 | Nozawa et al. |
| 6,730,990 B2 | | 5/2004 | Kondo et al. |
| 6,731,353 B1 | | 5/2004 | Credelle et al. |
| 6,743,982 B2 | | 6/2004 | Biegelsen et al. |
| 6,780,696 B1 | | 8/2004 | Schatz |
| 6,784,450 B2 | | 8/2004 | Pan et al. |
| 6,787,052 B1 | | 9/2004 | Vaganov |
| 6,814,898 B1 | | 11/2004 | Deeman et al. |
| 6,816,380 B2 | | 11/2004 | Credelle et al. |
| 6,844,673 B1 | | 1/2005 | Bernkopf |
| 6,848,162 B2 | | 2/2005 | Arneson et al. |
| 6,850,312 B2 | | 2/2005 | Jacobsen et al. |
| 6,856,830 B2 | | 2/2005 | He |
| 6,863,219 B1 | | 3/2005 | Jacobsen et al. |
| 6,864,435 B2 | | 3/2005 | Hermanns et al. |
| 6,864,570 B2 | | 3/2005 | Smith |

(56) References Cited

U.S. PATENT DOCUMENTS

| | | |
|---|---|---|
| 6,872,645 B2 | 3/2005 | Duan et al. |
| 6,878,871 B2 | 4/2005 | Scher et al. |
| 6,881,979 B2 | 4/2005 | Starikov et al. |
| 6,887,450 B2 | 5/2005 | Chen et al. |
| 6,900,094 B2 | 5/2005 | Hammond et al. |
| 6,917,061 B2 | 7/2005 | Pan et al. |
| 6,936,181 B2 | 8/2005 | Bulthaup et al. |
| 6,949,199 B1 | 9/2005 | Gauzner et al. |
| 6,949,206 B2 | 9/2005 | Whiteford |
| 6,950,220 B2 | 9/2005 | Abramson et al. |
| 6,984,934 B2 | 1/2006 | Moller et al. |
| 6,989,285 B2 | 1/2006 | Ball |
| 7,029,951 B2 | 4/2006 | Chen et al. |
| 7,033,961 B1 | 4/2006 | Smart et al. |
| 7,067,903 B2 | 6/2006 | Tachibana et al. |
| 7,116,318 B2 | 10/2006 | Amundson et al. |
| 7,132,313 B2 | 11/2006 | O'Connor et al. |
| 7,148,512 B2 | 12/2006 | Leu et al. |
| 7,158,277 B2 | 1/2007 | Berggren et al. |
| 7,169,546 B2 | 1/2007 | Suzuki et al. |
| 7,169,669 B2 | 1/2007 | Blakers et al. |
| 7,170,164 B2 | 1/2007 | Chen et al. |
| 7,186,624 B2 | 3/2007 | Welser et al. |
| 7,190,051 B2 | 3/2007 | Mech et al. |
| 7,195,733 B2 | 3/2007 | Rogers et al. |
| 7,223,609 B2 | 5/2007 | Anvar et al. |
| 7,253,442 B2 | 8/2007 | Huang et al. |
| 7,255,919 B2 | 8/2007 | Sakata et al. |
| 7,291,540 B2 | 11/2007 | Mech et al. |
| 7,374,968 B2 | 5/2008 | Kornlivich et al. |
| 7,425,523 B2 | 9/2008 | Ikemizu et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,629,691 B2 | 12/2009 | Roush et al. |
| 7,635,755 B2 | 12/2009 | Kaplan et al. |
| 7,674,882 B2 | 3/2010 | Kaplan et al. |
| 7,700,402 B2 | 4/2010 | Wild et al. |
| 7,704,684 B2 | 4/2010 | Rogers et al. |
| 7,705,280 B2 | 4/2010 | Nuzzo et al. |
| 7,709,961 B2 | 5/2010 | Greenberg et al. |
| 7,727,575 B2 | 6/2010 | Kaplan et al. |
| 7,799,699 B2 | 9/2010 | Nuzzo et al. |
| 7,842,780 B2 | 11/2010 | Kaplan et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 2001/0003043 A1 | 6/2001 | Metspalu et al. |
| 2002/0021445 A1 | 2/2002 | Bozhevolnyi et al. |
| 2002/0110766 A1 | 8/2002 | Tsai et al. |
| 2003/0003759 A1 | 1/2003 | Kudelka |
| 2003/0006527 A1 | 1/2003 | Rabolt et al. |
| 2003/0032892 A1 | 2/2003 | Erlach et al. |
| 2003/0082889 A1 | 5/2003 | Maruyama et al. |
| 2003/0087476 A1 | 5/2003 | Oohata et al. |
| 2003/0138704 A1 | 7/2003 | Mei et al. |
| 2003/0149456 A1 | 8/2003 | Rottenberg et al. |
| 2003/0178316 A1 | 9/2003 | Jacobs et al. |
| 2003/0227116 A1 | 12/2003 | Halik et al. |
| 2004/0005723 A1 | 1/2004 | Empedocles et al. |
| 2004/0026684 A1 | 2/2004 | Empedocles et al. |
| 2004/0079464 A1 | 4/2004 | Kumakura |
| 2004/0081384 A1 | 4/2004 | Datesman et al. |
| 2004/0095658 A1 | 5/2004 | Buretea et al. |
| 2004/0112964 A1 | 6/2004 | Empedocles et al. |
| 2004/0136866 A1 | 7/2004 | Pontis et al. |
| 2004/0146560 A1 | 7/2004 | Whiteford et al. |
| 2004/0155290 A1 | 8/2004 | Mech et al. |
| 2004/0176312 A1 | 9/2004 | Gillis |
| 2004/0178390 A1 | 9/2004 | Whiteford |
| 2004/0192082 A1 | 9/2004 | Wagner et al. |
| 2004/0200734 A1 | 10/2004 | Co et al. |
| 2004/0206448 A1 | 10/2004 | Dubrow |
| 2004/0211458 A1 | 10/2004 | Gui et al. |
| 2004/0211459 A1 | 10/2004 | Suenaga et al. |
| 2004/0250950 A1 | 12/2004 | Dubrow |
| 2004/0252559 A1 | 12/2004 | Gupta |
| 2005/0020094 A1 | 1/2005 | Forbes et al. |
| 2005/0038498 A1 | 2/2005 | Dubrow et al. |
| 2005/0082526 A1 | 4/2005 | Bedell et al. |
| 2005/0124712 A1 | 6/2005 | Anderson et al. |
| 2005/0133954 A1 | 6/2005 | Homola |
| 2005/0149158 A1 | 7/2005 | Hunter et al. |
| 2005/0214962 A1 | 9/2005 | Daniels et al. |
| 2005/0227389 A1 | 10/2005 | Bhattacharya et al. |
| 2005/0233546 A1 | 10/2005 | Oohata et al. |
| 2005/0238967 A1 | 10/2005 | Rogers et al. |
| 2005/0255686 A1 | 11/2005 | Yamano et al. |
| 2005/0260706 A1 | 11/2005 | Kaplan et al. |
| 2005/0261561 A1 | 11/2005 | Jones et al. |
| 2006/0038182 A1 | 2/2006 | Rogers et al. |
| 2006/0049485 A1 | 3/2006 | Pan et al. |
| 2006/0076561 A1 | 4/2006 | Hioki et al. |
| 2006/0084012 A1 | 4/2006 | Nuzzo et al. |
| 2006/0085976 A1 | 4/2006 | Eldridge et al. |
| 2006/0102525 A1 | 5/2006 | Volkel et al. |
| 2006/0119853 A1 | 6/2006 | Baumberg et al. |
| 2006/0127817 A1 | 6/2006 | Ramanujan et al. |
| 2006/0129056 A1 | 6/2006 | Leuthardt et al. |
| 2006/0132025 A1 | 6/2006 | Gao et al. |
| 2006/0134893 A1 | 6/2006 | Savage et al. |
| 2006/0141617 A1 | 6/2006 | Desai et al. |
| 2006/0159837 A1 | 7/2006 | Kaplan et al. |
| 2006/0169989 A1 | 8/2006 | Bhattacharya et al. |
| 2006/0173364 A1 | 8/2006 | Clancy et al. |
| 2006/0177479 A1 | 8/2006 | Giachelli et al. |
| 2006/0178655 A1 | 8/2006 | Santini et al. |
| 2006/0244105 A1 | 11/2006 | Forbes et al. |
| 2006/0255341 A1 | 11/2006 | Pinnington et al. |
| 2006/0273279 A1 | 12/2006 | Kaplan et al. |
| 2006/0279191 A1 | 12/2006 | Gehegan et al. |
| 2006/0286488 A1 | 12/2006 | Rogers et al. |
| 2006/0286785 A1 | 12/2006 | Rogers et al. |
| 2007/0009968 A1 | 1/2007 | Cunningham et al. |
| 2007/0031607 A1 | 2/2007 | Dubson et al. |
| 2007/0032089 A1 | 2/2007 | Nuzzo et al. |
| 2007/0043416 A1 | 2/2007 | Callas et al. |
| 2007/0058254 A1 | 3/2007 | Kim |
| 2007/0073130 A1 | 3/2007 | Finch et al. |
| 2007/0085078 A1 | 4/2007 | Kuroda et al. |
| 2007/0187862 A1 | 8/2007 | Kaplan et al. |
| 2007/0212730 A1 | 9/2007 | Vepari et al. |
| 2007/0227586 A1 | 10/2007 | Zapalac |
| 2007/0233208 A1 | 10/2007 | Kurtz et al. |
| 2008/0000871 A1 | 1/2008 | Suh et al. |
| 2008/0038236 A1 | 2/2008 | Gimble et al. |
| 2008/0041617 A1 | 2/2008 | Chen et al. |
| 2008/0055581 A1 | 3/2008 | Rogers et al. |
| 2008/0085272 A1 | 4/2008 | Kaplan et al. |
| 2008/0090322 A1 | 4/2008 | Mech et al. |
| 2008/0102096 A1 | 5/2008 | Molin et al. |
| 2008/0108171 A1 | 5/2008 | Rogers et al. |
| 2008/0142870 A1 | 6/2008 | Watanabe |
| 2008/0152281 A1 | 6/2008 | Lundquist et al. |
| 2008/0157235 A1 | 7/2008 | Rogers et al. |
| 2008/0183076 A1 | 7/2008 | Witte et al. |
| 2008/0203431 A1 | 8/2008 | Garcia et al. |
| 2008/0212102 A1 | 9/2008 | Nuzzo et al. |
| 2008/0219122 A1* | 9/2008 | Detzler et al. ............... 369/83 |
| 2008/0239755 A1 | 10/2008 | Parker et al. |
| 2008/0243217 A1 | 10/2008 | Wildon |
| 2008/0280360 A1 | 11/2008 | Kaplan et al. |
| 2008/0288037 A1 | 11/2008 | Neysmith et al. |
| 2008/0293919 A1 | 11/2008 | Kaplan et al. |
| 2008/0306359 A1 | 12/2008 | Zdeblick et al. |
| 2009/0004737 A1 | 1/2009 | Borenstein et al. |
| 2009/0028910 A1 | 1/2009 | Desimone et al. |
| 2009/0149930 A1 | 6/2009 | Schenck |
| 2009/0198293 A1 | 8/2009 | Cauller et al. |
| 2009/0199960 A1 | 8/2009 | Nuzzo et al. |
| 2009/0202614 A1 | 8/2009 | Kaplan et al. |
| 2009/0208555 A1 | 8/2009 | Kuttler et al. |

(56) References Cited

U.S. PATENT DOCUMENTS

| | | |
|---|---|---|
| 2009/0221896 A1 | 9/2009 | Rickert et al. |
| 2009/0232963 A1 | 9/2009 | Kaplan et al. |
| 2009/0234026 A1 | 9/2009 | Kaplan et al. |
| 2009/0289246 A1 | 11/2009 | Schneider et al. |
| 2009/0294803 A1 | 12/2009 | Nuzzo et al. |
| 2010/0002402 A1 | 1/2010 | Rogers et al. |
| 2010/0028451 A1 | 2/2010 | Kaplan et al. |
| 2010/0046902 A1 | 2/2010 | Kaplan et al. |
| 2010/0052112 A1 | 3/2010 | Rogers et al. |
| 2010/0055438 A1 | 3/2010 | Kaplan et al. |
| 2010/0059863 A1 | 3/2010 | Rogers et al. |
| 2010/0063404 A1 | 3/2010 | Kaplan et al. |
| 2010/0065784 A1 | 3/2010 | Kaplan et al. |
| 2010/0068740 A1 | 3/2010 | Kaplan et al. |
| 2010/0070068 A1 | 3/2010 | Kaplan et al. |
| 2010/0072577 A1 | 3/2010 | Nuzzo et al. |
| 2010/0096763 A1 | 4/2010 | Kaplan et al. |
| 2010/0120116 A1 | 5/2010 | Kaplan et al. |
| 2010/0121420 A1 | 5/2010 | Fiset et al. |
| 2010/0160999 A1 | 6/2010 | Epstein et al. |
| 2010/0176705 A1 | 7/2010 | Van Herpen et al. |
| 2010/0178304 A1 | 7/2010 | Wang et al. |
| 2010/0191328 A1 | 7/2010 | Kaplan et al. |
| 2010/0195367 A1* | 8/2010 | Kato .......................... 365/104 |
| 2010/0196447 A1 | 8/2010 | Kaplan et al. |
| 2010/0200752 A1 | 8/2010 | Lee et al. |
| 2010/0203226 A1 | 8/2010 | Kaplan et al. |
| 2010/0252840 A1 | 10/2010 | Ibbetson et al. |
| 2010/0279112 A1 | 11/2010 | Kaplan et al. |
| 2010/0283069 A1 | 11/2010 | Rogers et al. |
| 2010/0289124 A1 | 11/2010 | Nuzzo et al. |
| 2010/0317132 A1 | 12/2010 | Rogers et al. |
| 2011/0068672 A1 | 3/2011 | Hasnain |
| 2011/0147715 A1 | 6/2011 | Rogers et al. |
| 2011/0170225 A1 | 7/2011 | Rogers et al. |
| 2011/0171813 A1 | 7/2011 | Rogers et al. |
| 2011/0187798 A1 | 8/2011 | Rogers et al. |
| 2011/0220890 A1 | 9/2011 | Nuzzo et al. |
| 2011/0227046 A1 | 9/2011 | Hwang et al. |
| 2011/0230747 A1* | 9/2011 | Rogers et al. ............ 600/377 |
| 2011/0245914 A1 | 10/2011 | Santini et al. |
| 2011/0266561 A1 | 11/2011 | Rogers et al. |
| 2011/0276124 A1* | 11/2011 | Doerr et al. ............ 623/1.15 |
| 2011/0277813 A1 | 11/2011 | Rogers et al. |
| 2011/0291078 A1* | 12/2011 | Hwang .............. B82Y 10/00 257/40 |
| 2011/0316120 A1 | 12/2011 | Rogers et al. |
| 2012/0083099 A1 | 4/2012 | Rogers et al. |
| 2012/0105528 A1 | 5/2012 | Alleyne et al. |
| 2012/0157804 A1 | 6/2012 | Rogers et al. |
| 2012/0165759 A1 | 6/2012 | Rogers et al. |
| 2012/0223293 A1 | 9/2012 | Borenstein et al. |
| 2012/0261551 A1 | 10/2012 | Rogers et al. |
| 2012/0320581 A1 | 12/2012 | Rogers et al. |
| 2012/0321785 A1 | 12/2012 | Rogers et al. |
| 2012/0327608 A1 | 12/2012 | Rogers et al. |
| 2013/0036928 A1 | 2/2013 | Rogers et al. |
| 2013/0041235 A1 | 2/2013 | Rogers et al. |
| 2013/0072775 A1 | 3/2013 | Rogers et al. |
| 2013/0100618 A1 | 4/2013 | Rogers et al. |
| 2013/0140649 A1 | 6/2013 | Rogers et al. |
| 2013/0320503 A1 | 12/2013 | Rogers et al. |
| 2013/0333094 A1 | 12/2013 | Rogers et al. |
| 2014/0092158 A1 | 4/2014 | Rogers et al. |
| 2014/0140020 A1 | 5/2014 | Rogers et al. |
| 2014/0163390 A1 | 6/2014 | Rogers et al. |
| 2014/0191236 A1 | 7/2014 | Rogers et al. |
| 2014/0216524 A1 | 8/2014 | Rogers et al. |
| 2014/0220422 A1 | 8/2014 | Rogers et al. |
| 2014/0305900 A1 | 10/2014 | Rogers et al. |
| 2014/0323968 A1 | 10/2014 | Rogers et al. |
| 2014/0361409 A1 | 12/2014 | Rogers et al. |
| 2014/0373898 A1 | 12/2014 | Rogers et al. |
| 2014/0374872 A1 | 12/2014 | Rogers et al. |
| 2015/0001462 A1 | 1/2015 | Rogers et al. |
| 2015/0080695 A1 | 3/2015 | Rogers et al. |

FOREIGN PATENT DOCUMENTS

| | | |
|---|---|---|
| CN | 1802705 | 7/2006 |
| CN | 1992084 | 7/2007 |
| CN | 101772348 A | 7/2010 |
| DE | 4241045 C1 | 5/1994 |
| DE | 19748173 | 5/1999 |
| EP | 0929097 | 7/1999 |
| EP | 1025988 | 8/2000 |
| EP | 1357773 | 10/2003 |
| EP | 1 467 224 | 10/2004 |
| EP | 1 477 230 | 11/2004 |
| EP | 1 498 456 | 1/2005 |
| EP | 1 511 096 | 3/2005 |
| EP | 1 558 444 | 8/2005 |
| EP | 1 613 796 | 1/2006 |
| EP | 1 773 240 | 4/2007 |
| EP | 1 915 436 | 4/2008 |
| EP | 1 726 329 | 8/2009 |
| EP | 2 086 749 | 8/2009 |
| EP | 2 101 975 | 9/2009 |
| EP | 2 107 964 | 10/2009 |
| EP | 2 109 634 | 10/2009 |
| EP | 2 129 772 | 12/2009 |
| EP | 2 206 017 | 7/2010 |
| EP | 2 211 876 | 8/2010 |
| EP | 2 249 886 | 11/2010 |
| JP | H01-135853 | 5/1989 |
| JP | 06-118441 | 4/1994 |
| JP | 6-163365 | 6/1994 |
| JP | 11-026344 | 1/1999 |
| JP | 11-142878 | 5/1999 |
| JP | H11-123791 | 5/1999 |
| JP | H11-183854 | 7/1999 |
| JP | H11-514252 | 12/1999 |
| JP | 2000-180969 | 6/2000 |
| JP | 2001-007340 | 1/2001 |
| JP | 2001-147301 | 5/2001 |
| JP | 2002092984 | 3/2002 |
| JP | 2004006540 | 1/2004 |
| JP | 2004237077 A2 | 8/2004 |
| JP | 2004-307661 | 11/2004 |
| JP | 2005-117482 | 4/2005 |
| JP | 2006-504450 | 2/2006 |
| JP | 2006-119424 | 5/2006 |
| JP | 2006163719 | 6/2006 |
| JP | 2006-186294 | 7/2006 |
| JP | 2007-515391 | 6/2007 |
| JP | 2008-502739 | 1/2008 |
| JP | 2009-536422 | 10/2009 |
| JP | 2010-508852 | 3/2010 |
| JP | 2010-509593 | 3/2010 |
| JP | 2010-509644 | 3/2010 |
| JP | 2010-509645 | 3/2010 |
| JP | 2010-522583 | 7/2010 |
| JP | 2010-529230 | 8/2010 |
| KR | 10-2008-0069553 | 7/2008 |
| TW | 367570 | 8/1999 |
| TW | 494257 | 7/2002 |
| TW | 200836353 | 9/2008 |
| WO | WO 96/21245 | 7/1996 |
| WO | WO 97/10784 A1 | 3/1997 |
| WO | WO 98/49936 | 11/1998 |
| WO | WO 99/45860 | 9/1999 |
| WO | WO 00/46854 | 8/2000 |
| WO | WO 00/49421 | 8/2000 |
| WO | WO 00/49658 | 8/2000 |
| WO | WO 00/55915 | 9/2000 |
| WO | WO 00/55916 | 9/2000 |
| WO | WO 01/31082 | 5/2001 |
| WO | WO 01/33621 | 5/2001 |
| WO | WO 01/66833 | 9/2001 |
| WO | WO 01/98838 | 12/2001 |
| WO | WO 02/27701 | 4/2002 |
| WO | WO 02/43032 | 5/2002 |

(56) References Cited

FOREIGN PATENT DOCUMENTS

| | | |
|---|---|---|
| WO | WO 02/45160 | 6/2002 |
| WO | WO 02/071137 | 9/2002 |
| WO | WO 02/073699 | 9/2002 |
| WO | WO 02/092778 | 11/2002 |
| WO | WO 02/097708 | 12/2002 |
| WO | WO 02/097724 | 12/2002 |
| WO | WO 02/099068 | 12/2002 |
| WO | WO 03/030194 | 4/2003 |
| WO | WO 03/032240 | 4/2003 |
| WO | WO 03/049201 | 6/2003 |
| WO | WO 03/063211 | 7/2003 |
| WO | WO 03/085700 | 10/2003 |
| WO | WO 03/085701 | 10/2003 |
| WO | WO 03/092073 | 11/2003 |
| WO | WO 04/000915 | 12/2003 |
| WO | WO 04/001103 | 12/2003 |
| WO | WO 2004/003535 | 1/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/062697 | 7/2004 |
| WO | WO 2004/086289 | 10/2004 |
| WO | WO 2004/094303 | 11/2004 |
| WO | WO 2004/100252 | 11/2004 |
| WO | WO 2004/105456 | 12/2004 |
| WO | WO 2004/107973 | 12/2004 |
| WO | WO 2005/000483 | 1/2005 |
| WO | WO 2005/005679 | 1/2005 |
| WO | WO 2005/012606 | 2/2005 |
| WO | WO 2005/015480 | 2/2005 |
| WO | WO 2005/017962 | 2/2005 |
| WO | WO 2005/022120 | 3/2005 |
| WO | WO 2005/029578 | 3/2005 |
| WO | WO 2005/031724 | 4/2005 |
| WO | WO 2005/033786 | 4/2005 |
| WO | WO 2005/033787 | 4/2005 |
| WO | WO 2005/054119 | 6/2005 |
| WO | WO 2005/065576 | 7/2005 |
| WO | WO 2005/099310 | 10/2005 |
| WO | WO 2005/104756 | 11/2005 |
| WO | WO 2005/106934 | 11/2005 |
| WO | WO 2005/122285 | 12/2005 |
| WO | WO 2005/123114 | 12/2005 |
| WO | WO 2006/028996 | 3/2006 |
| WO | WO 2006/042287 | 4/2006 |
| WO | WO 2006/076711 | 7/2006 |
| WO | WO 2006/104069 | 10/2006 |
| WO | WO 2006/130558 | 12/2006 |
| WO | WO 2006/130721 | 12/2006 |
| WO | WO 2007/000037 | 1/2007 |
| WO | WO 2007/016524 | 2/2007 |
| WO | WO 2007/028003 | 3/2007 |
| WO | WO 2007/056183 | 5/2007 |
| WO | WO 2007/126412 | 11/2007 |
| WO | WO/2007/132390 | 11/2007 |
| WO | WO 2008/030666 | 3/2008 |
| WO | WO 2008/030960 | 3/2008 |
| WO | WO 2008/036837 | 3/2008 |
| WO | WO 2008/038197 | 4/2008 |
| WO | WO 2008/055054 | 5/2008 |
| WO | WO 2008/085904 | 7/2008 |
| WO | WO 2008/103464 | 8/2008 |
| WO | WO 2008/106485 | 9/2008 |
| WO | WO 2008/108838 | 9/2008 |
| WO | WO 2008/118133 | 10/2008 |
| WO | WO 2008/118211 | 10/2008 |
| WO | WO 2008/127401 | 10/2008 |
| WO | WO 2008/127402 | 10/2008 |
| WO | WO 2008/127403 | 10/2008 |
| WO | WO 2008/127404 | 10/2008 |
| WO | WO 2008/127405 | 10/2008 |
| WO | WO 2008/140562 | 11/2008 |
| WO | WO 2008/143635 | 11/2008 |
| WO | WO 2008/150861 | 12/2008 |
| WO | WO 2009/011709 | 1/2009 |
| WO | WO 2009/023615 | 2/2009 |
| WO | WO 2009/061823 | 5/2009 |
| WO | WO 2009/075625 | 6/2009 |
| WO | WO 2009/076088 | 6/2009 |
| WO | WO 2009/090398 | 7/2009 |
| WO | WO 2009/100280 | 8/2009 |
| WO | WO 2009/111641 | 9/2009 |
| WO | WO 2009/114115 | 9/2009 |
| WO | WO 2009/114689 | 9/2009 |
| WO | WO 2009/118678 | 10/2009 |
| WO | WO 2009/126689 | 10/2009 |
| WO | WO 2009/140588 | 11/2009 |
| WO | WO 2009/155397 | 12/2009 |
| WO | WO 2010/005707 | 1/2010 |
| WO | WO 2010/036807 | 4/2010 |
| WO | WO 2010/036992 | 4/2010 |
| WO | WO 2010/040528 | 4/2010 |
| WO | WO 2010/042798 | 4/2010 |
| WO | WO 2010/049881 | 5/2010 |
| WO | WO 2010/057142 | 5/2010 |
| WO | WO 2010/065957 | 6/2010 |
| WO | WO 2010/082993 | 7/2010 |
| WO | WO 2010/126640 | 11/2010 |
| WO | WO 2010/132552 | 11/2010 |
| WO | WO 2010/141133 | 12/2010 |
| WO | WO 2011/005381 | 1/2011 |
| WO | WO 2011/006133 | 1/2011 |
| WO | WO 2011/008842 | 1/2011 |
| WO | WO 2011/011347 | 1/2011 |
| WO | WO 2011/026101 | 3/2011 |
| WO | WO 2011/038401 | 3/2011 |
| WO | WO 2011/041395 | 4/2011 |
| WO | WO 2011/046652 | 4/2011 |
| WO | WO 2011/084450 | 7/2011 |
| WO | WO 2011/112931 | 9/2011 |
| WO | WO 2011/115643 | 9/2011 |
| WO | WO 2011/130335 | 10/2011 |

OTHER PUBLICATIONS

Adachi et al (1982) "Chemical Etching of InGaAsP/InP DH Wafer," *J. Electrochem. Soc.* 129:1053-1062.
Adachi et al. (1983) "Chemical Etching Characteristics of (001)GaAs," *J. Electrochem. Soc.* 130:2427-2435.
Adrega et al. (2010) "Stretchable Gold Conductors Embedded in PDMS and Patterned by Photolithography: Fabrication and Electromechanical Characterization," *J. Micromech. Microeng.* 20:055025.
Ago et al. (2005) "Aligned Growth of Isolated Single-Walled Carbon Nanotubes Programmed by Atomic Arrangement of Substrate Surface," *Chem. Phys. Lett.* 408:433-438.
Ago et al. (2006) "Synthesis of Horizontally-Aligned Single-Walled Carbon Nanotubes with Controllable Density on Sapphire Surface and Polarized Raman Spectroscopy," *Chem. Phys. Lett.* 421:399-403.
Ahmed et al. (Web Release Oct. 11, 2005) "Extending the 3ω-Method to the MHz Range for Thermal Conductivity Measurements of Diamond Thin Films," *Diamond Relat. Mater.* 15(2-3):389-393.
Ahn et al. (2007) "Bendable Integrated Circuits on Plastic Substrates by Use of Printed Ribbons of Single-Crystalline Silicon," *Appl. Phys. Lett.* 90:213501.
Ahn et al. (Dec. 15, 2006) "Heterogeneous Three-Dimensional Electronics by Use of Printed Semiconductor Nanomaterials," *Science* 314:1754-1757.
Ahn et al. (Jun. 2006) "High-Speed Mechanically Flexible Single-Crystal Silicon Thin-Film Transistors on Plastic Substrates," *IEEE Electron Dev. Lett.* 27(6):460-462.
Alavi et al. (1992), "Fabrication of Microchannels by Laser Machining and Anisotropic Etching of Silicon", Sensors and Actuators A, vol. A32, No. 1/3, pp. 299-302.

(56) References Cited

OTHER PUBLICATIONS

Al-Halhouli et al. (2008) "Nanoindentation Testing of SU-8 Photoresist Mechanical Properties," *Microelectronic Eng.* 85:942-944.
Aliot, E. M. et al. (2009) "EHRA/HRS Expert Consensus on Catheter Ablation of Ventricular Arrhythmias: Developed in a partnership with the European Heart Rhythm Association (EHRA), a Registered Branch of the European Society of Cardiology (ESC), and the Heart Rhythm Society (HRS); in collaboration with the American College of Cardiology (ACC) and the American Heart Association (AHA)," *Europace* 11:771-817.
Alivisatos et al. (1996) "Semiconductor Clusters, Nanocrystals, and Quantum Dots," *Science* 271:933-937.
Alivisatos et al. (1998) "From Molecules to Materials: Current Trends and Future Directions," *Adv. Mater.* 10:1297-1336.
Allen et al. (Feb. 20, 2006) "Nanomaterial Transfer Using Hot Embossing for Flexible Electronic Devices," *Appl. Phys. Lett.* 88:083112.
Al-Sarawi et al. (Feb. 1998) "A Review of 3-D Packaging Technology," *IEEE Trans. Comp. Packag. Manufac. Technol. B* 21(1):2-14.
Altman et al. (2003) "Silk-Based Biomaterials," *Biomaterials* 24:401-416.
Amano et al. (Feb. 3, 1986) "Metalorganic Vapor Phase Epitaxial Growth of a High Quality GaN Film Using an AlN Buffer Layer," *Appl. Phys. Lett.* 48(5):353-355.
Ambrosy et al. (1996) "Silicon Motherboards for Multichannel Optical Modules," *IEEE Trans. Compon. Pack. A* 19:34-40.
Amir et al. (2000) "The Influence of Helium-Neon Irradiation on the Viability of Skin Flaps in the Rat," *Br. J. Plast. Surg.* 53:58-62.
Amsden et al. (Nov. 9, 2009) "Spectral Analysis of Induced Color Change on Periodically Nanopatterned Silk Films," *Opt. Express* 17(23):21271-21279.
Andersen et al. (2004) "Selecting the Signals for a Brain-Machine Interface," *Curr. Opin. Neurobiol.* 14:720-726.
Andersson et al. (Oct. 16, 2002) "Active Matrix Displays Based on All-Organic Electrochemical Smart Pixels Printed on Paper," *Adv. Mater.* 14:1460-1464.
Ando et al. (2004) "Self-Aligned Self-Assembly Process for Fabricating Organic Thin-Film Transistors," *Appl. Phys. Lett.* 85:1849-1851.
Angadi et al. (Web Release Jun. 1, 2006) "Thermal Transport and Grain Boundary Conductance in Ultrananocrystalline Diamond Thin Films," *J. Appl. Phys.* 99:114301.
Aoki et al. (2003) "Microassembly of Semiconductor Three Dimensional Photonic Crystals," *Nat. Mater.* 2:117-121.
Arnold et al. (2003) "Field-Effect Transistors Based on Single Semiconducting Oxide Nanobelts," *J. Phys. Chem. B* 107(3):659-663.
Ayón et al. (Jan. 1999) "Characterization of a Time Multiplexed Inductively Coupled Plasma Etcher," *J. Electrochem. Soc.* 146(1):339-349.
Baca et al. (2008) "Semiconductor Wires and Ribbons for High-Performance Flexible Electronics," *Angew. Chem. Int. Ed.* 47:5524-5542.
Bachtold et al. (Nov. 9, 2001) "Logic Circuits with Carbon Nanotube Transistors," *Science* 294:1317-1320.
Bae et al. (Jul. 1, 2002) "Single-Crystalline Gallium Nitride Nanobelts," *Appl. Phys. Lett.* 81(1):126-128.
Ball et al. (2004) "Towards an Implantable Brain-Machine Interface Based on Epicortical Field Potentials," *Biomed. Tech.* 49:756-759.
Balmer et al. (2005) "Diffusion of Alkanethiols in PDMS and Its Implications on Microcontact Printing (μCP)," *Langmuir* 21(2):622-632.
Banerjee et al. (May 2001) "3-D ICs: A Novel Chip Design for Improving Deep-Submicrometerinterconnect Performance and Systems-on-Chip Integration," *Proc. IEEE* 89(5):602-633.
Bao et al. (1997) "High-Performance Plastic Transistors Fabricated by Printing Techniques," *Chem. Mater.* 9:1299-1301.
Bao et al. (1999) "Printable Organic and Polymeric Semiconducting Materials and Devices," *J. Mater. Chem.* 9:1895-1904.

Barquins, M. (1992) "Adherence, Friction and Wear of Rubber-Like Materials," *Wear* 158:87-117.
Bates, F.S. (1991) "Polymer-Polymer Phase Behavior," *Science* 251:898-905.
Battaglia et al. (2003) "Colloidal Two-Dimensional Systems: CdSe Quantum Shells and Wells," Angew. Chem. Int. Ed. 442:5035-5039.
Bauer et al. (2004) "Biological Applications of High Aspect Ratio Nanoparticles," *J. Mater. Chem.* 14:517-526.
Berg et al. (2003) "Tailored Micropatterns Through Weak Polyelectrolyte Stamping," Langmuir 19:2231-2237.
Bernard et al. (1998) "Printing Patterns of Proteins," *Langmuir* 14(9):2225-2229.
Bett et al. (Aug. 1999) "III-V Compounds for Solar Cell Applications," *Appl. Phys. A. Mater. Sci.* 69(2):119-129.
Bhunia et al. (2004) "Free-Standing and Vertically Aligned InP Nanowires Grown by Metalorganic Vapor Phase Epitaxy," *Physica E* 21:583-587.
Bhushan et al. (Nov. 2004) "Multiwalled Carbon Nanotube AFM Probes for Surface Characterization of Micro/Nanostructures," *Microsyst. Technol.* 10(8-9):633-639.
Bietsch et al. (Oct. 1, 2000) "Conformal Contact and Pattern Stability of Stamps Used for Soft Lithography," *J. Appl. Phys.* 88(7):4310-4318.
Bishay et al. (2000) "Temperature Coefficient of the Surface Resistivity of Two-Dimensional Island Gold Films," *J. Phys. D. Appl. Phys.* 33(18):2218-2222.
Blanchet et al. (2003) "Large Area, High Resolution, Dry Printing of Conducting Polymers for Organic Electronics," *Appl. Phys. Lett.* 82:463-465.
Blanchet et al. (2003) "Printing Techniques for Plastic Electronics," *J. Imag. Sci. Tech.* 47(4):296-303.
Blazdell et al. (Nov. 1999) "Preparation of Ceramic Inks for Solid Freeforming Using a Continuous Jet Printer," *J. Mat. Syn. Process.* 7(6):349-356.
Boltau et al. (1998) "Surface-Induced Structure Formation of Polymer Blends on Patterned Substrates," *Nature* 391:877-879.
Boncheva et al. (Mar. 15, 2005) "Magnetic Self-Assembly of Three-Dimensional Surfaces from Planar Sheets," *Proc. Natl. Acad. Sci. USA* 102(11):3924-3929.
Boncheva et al. (Mar. 8, 2005) "Templated Self-Assembly: Formation of Folded Structures by Relaxation of Pre-Stressed, Planar Tapes," *Adv. Mater.* 17(5):553-557.
Bourzac, K. (May/Jun. 2010) "TR10: Implantable Electronics," *Technology Review*, Published by MIT, http://www.technologyreview.com/biomedicine/25086/?a=f.
Bowden et al. (1997) "Self Assembly of Mesoscale Objects into Ordered Two-Dimensional Arrays," *Science* 276:233-235.
Bowden et al. (1998) "Spontaneous Formation of Ordered Structures in Thin Films of Metals Supported on an Elastomeric Polymer," *Nature* 393:146-149.
Bowden et al. (2001) "Molecule-Mimetic Chemistry and Mesoscale Self-Assembly," *Acc. Chem. Res.* 34:231-238.
Bracher et al. (2009) "Shaped Films of Ionotropic Hydrogels Fabricated Using Templates of Patterns Paper," *Adv. Mater.* 21:445-450.
Bradley et al. (2003) "Flexible Nanotube Electronics," *Nano Lett.*, vol. 3, No. 10, pp. 1353-1355.
Braun et al. (1999) "Electrochemically Grown Photonic Crystals," *Nature* 402:603-604.
Britton et al. (Web Release Oct. 25, 2005) "Microstructural Defect Characterization of a Si:H Deposited by Low Temperature HW-CVD on Paper Substrates," *Thin Solid Films* 501(1-2):79-83.
Brown et al. (2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," *Biomaterials* 26:3123-3129.
Brown et al. (Dec. 19, 2001) "Heterogeneous Materials Integration: Compliant Substrates to Active Device and Materials Packaging," *Mater. Sci. Eng. B* 87(3):317-322.
Brown, H.R. (1991) "The Adhesion Between Polymers," *Ann. Rev. Mater. Sci.* 21:463-489.

(56) References Cited

OTHER PUBLICATIONS

Bruschi et al. (2001) "Micromachined Silicon Suspended Wires With Submicrometric Dimensions," *Microelectron. Eng.* 57-58:959-965.
Buma et al. (2001) "High-Frequency Ultrasound Array Element Using Thermoelastic Expansion in an Elastomeric Film," *Appl. Phys. Lett.* 79:548-550.
Burdinski et al. (2005) "Single Etch Patterning of Stacked Silver and Molybdenum Alloy Layers on Glass Using Microcontact Wave Printing," *J. Am. Chem. Soc.* 127(31):10786-10787.
Burdinski, D. (non-dated) "Soft Lithography and Microcontact Wave Printing," http://www.research.philips.com/technologies/light_dev_microsys/softlitho/index.html , Downloaded May 23, 2007.
Burge et al. (Jun. 25, 1997) "X-Ray Holography for VLSI Using Synthetic Bilevel Holograms," *Proc. Int. Soc. Opt. Eng.* 3183:2-13.
Burgin et al. (2000) "Large Area Submicrometer Contact Printing Using a Contact Aligner," *Langmuir* 16:5371-5375.
Burns et al. (2003) "Printing of Polymer Thin-Film Transistors for Active-Matrix-Display Applications," *J. Soc. Inf. Display* 11:599-604.
Campbell et al. (2000) "Fabrication of Photonic Crystals for the Visible Spectrum by Holographic Lithography," *Nature* 404:53-56.
Cao et al. (2006) "Bilayer Organic-Inorganic Gate Dielectrics for High-Performance, Low-Voltage, Single-Walled Carbon Nanotube Thin-Film Transistors, Complementary Logic Gates, and p-n Diodes on Plastic Substrates," *Adv. Funct. Mater.* 16:2355-2362.
Cao et al. (2006) "Highly Bendable,Transparent Thin-Film Transistors That Use Carbon-Nanotube-Based Conductors and Semiconductors with Elastomeric Dielectrics," *Adv. Mater.* 18(3):304-309.
Cao et al. (2006) "Transparent flexible organic thin-film transistors that use printed single-walled carbon nanotube electrodes," *Applied Physics Letters* 88:113511.
Cao et al. (Jan. 5, 2009) "Ultrathin Films of Single-Walled Carbon Nanotubes for Electronics and Sensors: A Review of Fundamental and Applied Aspects," *Adv. Mater.* 21(1):29-53.
Cao et al. (Jul. 24, 2008) "Medium-Scale Carbon Nanotube Thin-Film Integrated Circuits on Flexible Plastic Substrates," *Nature* 454:495-500.
Carr et al. (1998) "Measurement of Nanomechanical Resonant Structures in Single-Crystal Silicon," *J. Vac. Sci. Technol. B* 16:3821-3824.
Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.
Chang et al. (1994) "Process Techniques," "Lithography," and "Device-Related Physics and Principles," In; *GaAs High-Speed Devices: Physics, Technology and Circuit Application*, John Wiley and Sons, New York, pp. 115-278.
Chen et al. (2003) "Characterization of Pd—GaAs Schottly Diodes Prepared by the Electrodes Plating Technique," *Semiconductor. Sci. Technol.* 18:620-626.
Chen et al. (2003) "Electronic Paper: Flexible Active-Matrix Electronics Ink Display," *Nature* 423:136.
Chen et al. (2005) "InGaN Nanorings and Nanodots by Selective Area Epitaxy," *Appl. Phys. Lett.* 87:143111.
Chen et al. (2005) "The Role of Metal-Nanotube Contact in the Performance of Carbon Nanotube Field-Effect Transistors," *Nano Lett.* 5(7):1497-1502.
Chen et al. (Feb. 27, 2006) "Complementary Carbon Nanotube-Gated Carbon Nanotube Thin-Fim Transistor," *Appl. Phys. Lett.* 88:093502.
Chen et al. (Jun. 2002) Effect of Process Parameters on the Surface Morphology and Mechanical Performance of Silicon Structures After Deep Reactive Ion Etching (DRIE) *J. Microelectromech. Syst.* 11(3):264-275.
Chen et al. (Mar. 2004) "A Family of Herringbone Patterns in Thin Films," *Scripta Materialia* 50(6):797-801.
Chen et al. (Mar. 24, 2006) "An Integrated Logic Circuit Assembled on a Single Carbon Nanotube," *Science* 311:1735.
Chen et al. (Sep. 2004) "Herringbone Buckling Patterns of Compressed Thin Films on Compliant Substrates," *J. Appl. Mech.* 71:597-603.
Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.
Childs et al. (2002) "Decal Transfer Microlithography: A New Soft-Lithographic Patterning Method," *J. Am. Chem. Soc.* 124:13583-13596.
Childs et al. (2005) "Masterless Soft-Lithography: Patterning UV/Ozone-Induced Adhesion on Poly(dimethylsiloxane) Surfaces," *Langmuir* 21:10096-10105.
Childs et al. (Aug. 14, 2004) "Patterning of Thin-Film Microstructures on Non-Planar Substrate Surfaces Using Decal Transfer Lithography," *Adv. Mater.* 16(15):1323-1327.
Choi et al. (2007) "Biaxially Stretchable Wavy' Silicon Nanomembranes," *Nano Lett.* 7(6):1655-1663.
Choi et al. (Web Release Jan. 25, 2005) "Simple Detachment Patterning of Organic Layers and Its Applications to Organic Light-Emitting Diodes," *Adv. Mater.* 17(2):166171.
Chou et al. (2004) "An Orientation-Controlled Pentacene Film Aligned by Photoaligned Polyimide for Organic Thin-Film Transistor Applications," *Adv. Func. Mater.* 14:811-815.
Chou et al. (Jun. 8, 1999) "Micromachining on (111)-Oriented Silicon," *Sens. Actuators A* 75(3):271-277.
Chu et al. (2005) "High-Performance Organic Thin-Film Transistors with Metal Oxide/Metal Bilayer Electrode," *Appl. Phys. Lett.* 87:193508.
Chung et al. (2000) Silicon Nanowire Devices *Appl. Phys. Lett.* 76(15):2068-2070.
Chung et al. (Jul. 1, 2003) "A Study on Formation of Al and $Al_2O_3$ on the Porous Paper by Dc Magnetron Sputtering," *Surf. Coat. Technol.* 171(1-3):65-70.
Clerc, L. (1976) "Directional Differences of Impulse Spread in Trabecular Muscle from Mammalian Heart," *J. Physiol.* 255:335-346.
Cohen-Karni et al. (2009) "Flexible Electrical Recording from Cells Using Nanowire Transistor Arrays," *Proc. Natl. Acad. Sci. USA* 106:7309-7313.
Cole et al. (2008) "Patterned Growth and Transfer of ZnO Micro- and Nanocrystals with Size and Location Control," *Adv. Mater.* 20:1474-1478.
Collins et al. (Apr. 27, 2001) "Engineering Carbon Nanotubes and Nanotube Circuits Using Electrical Breakdown," *Science* 292:706-709.
Corazza et al. (2007) "Photobiomodulation on the Angiogenesis of Skin Wounds in Rats Using Different Light Sources," *Photomedicine Laser Surg.* 25:102-106.
Cox, H. L. (1952) "The Elasticity and Strength of Paper and Other Fibrous Materials," *Br. J. Appl. Phys.* 3:72-79.
Creagh et al. (2003) "Design and Performance of Inkjet Print Heads for Non-Graphic-Arts Applications," *MRS Bull.* 28:807-811.
Crone et al. (Feb. 3, 2000) "Large-Scale Complementary Integrated Circuits Based on Organic Transistors," *Nature* 403:521-523.
Crowder et al. (1998) "Low-Temperature Single-Crystal Si TFTs Fabricated on Si Films Processed via Sequential Lateral Solidification," *IEEE Electron. Dev. Lett.* 19:306-308.
Cui et al. (2001) "Nanowire Nanosensors for Highly Sensitive and Selective Detection of Biological and Chemical Species," *Science* 293:1289-1292.
Dai et al. (2002) "Gallium Oxide Nanoribbons and Nanosheets," *J. Phys. Chem. B* 106(5):902-904.
Dai et al. (2003) "Novel Nanostructures of Functional Oxides Synthesized by Thermal Evaporation," *Adv. Funct. Mater.* 13:9-24.
Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.
De Gans (2004) "Inkjet Printing of Polymers: State of the Art and Future Developments," *Adv. Mater.* 16(3):203-213.

(56) References Cited

OTHER PUBLICATIONS

De Sio et al. (Web Release May 18, 2005) "Electro-Optical Response of a Single-Crystal Diamond Ultraviolet Photoconductor in Transverse Configuration," *Appl. Phys. Lett.* 86:213504.
DeBoer et al. (2004) "Organic Single-Crystal Field-Effect Transistors," *Phys. Stat. Sol.* 201:1302-1331.
Deen et al. (2004) "Electrical Characterization of Polymer-Based FETs Fabricated by Spin-Coating Poly(3-alkylthiophene)s," *IEEE Trans. Electron Devices* 51:1892-1901.
Delmerche et al. (1997) "Stability of Molded Polydimethylsiloxane Microstructures," *Adv. Mat.* 9:741-746.
Deruelle et al. (1995) "Adhesion at the Solid-Elastomer Interface: Influence of Interfacial Chains," *Macromol.* 28:7419-7428.
Derycke et al. (Sep. 2001) "Carbon Nanotube Inter- and Intramolecular Logic Gates," *Nano Lett.* 1(9):453-456.
Desai et al. (Feb. 1999) "Nanopore Technology for Biomedical Applications," *Biomed. Microdevices* 2(1):11-40.
Dick et al. (Jun. 2004) "Synthesis of Branched 'Nanotrees' by Controlled Seeding of Multiple Branching Events," *Nat. Mater.* 3:380-384.
Dimroth et al. (Mar. 2007) "High Efficiency Multijunction Solar Cells," *MRS Bull.* 32:230-235.
Ding et al. (Oct. 4, 2004) "Self Catalysis and Phase Transformation in the Formation of CdSe Nanosaws," *Adv. Mater.* 16(19):1740-1743.
Dinsmore et al. (2002) "Colloidosomes: Selectively Permeable Capsules Composed of Colloidal Particles," *Science* 298:1006-1009.
Divliansky et al. (2003) "Fabrication of Three-Dimensional Polymer Photonic Crystal Structures Using Single Diffraction Element Interference Lithography," *Appl. Phys. Lett.* 82(11):1667-1669.
Dodabalapur A. (Apr. 2006) "Organic and Polymer Transistors for Electronics," *Mater Today* 9(4):24-30.
Dodabalapur et al. (1995) "Organic Transistors: Two-Dimensional Transport and Improved Electrical Characteristics," *Science* 268:270-271.
Duan et al. (2000) "General Synthesis of Compound Semiconductor Nanowires," *Adv. Mater.* 12(4):298-302.
Duan et al. (2003) "High-performance Thin-Film Transistors Using Semiconductor Nanowires and Nanoribbons," *Nature* 425:274-278.
Duan X, (2003) "Semiconductor Nanowires: From Nanoelectronics to Macroelectronics," Abstract from a presentation given at the 11th Foresight Conference on Molecular Nanotechnology, Oct. 10-20, Burlingame, CA.
Duboz et al. (1998) "Transistors and Detectors Based on GaN-Related Materials," In; *Group III Nitride Semiconductor Compounds*, Gill, B. ed., Clarendon, Oxford, pp. 343-387.
Duesberg et al. (2000) "Polarized Raman Spectroscopy on Isolated Single-Wall Carbon Nanotubes," *Phys. Rev. Lett.*, vol. 85, No. 25, pp. 5436-5439.
Duffy et al. (1998) "Rapid Prototyping of Microfluidic Systems in Poly(dimethylsiloxane)," *Anal. Chem.* 70:4974-4984.
Dupuis et al. (2008) "History, Development, and Applications of High-Brightness Visible Light-Emitting Diodes," *IEEE J. Lightwave Tech.* 26:1154-1171.
Durkop et al. (2004) "Extraordinary Mobility in Semiconducting Carbon Nanotube," *Nano Lett.* 4(1):35-39.
Eder et al. (Apr. 5, 2004) "Organic Electronics on Paper," *Appl. Phys. Lett.* 84(14):2673-2675.
Edrington et al. (2001) "Polymer-Based Photonic Crystals," *Adv. Mater.* 13:421-425.
Efimenko et al. (Oct. 15, 2002) "Surface Modification of Sylgard-184 Poly(dimethyl Siloxane) Networks by Ultraviolet and Ultraviolet/Ozone Treatment," *J. Colloid Interface Sci.* 254(2):306-315.
Eftekhari, G. (1993) "Variation in the Effective Richardson Constant of Metal-GaAs and Metal-InP Contacts Due to the Effect of Processing Parameters," *Phys. Status Solid A—Appl. Res.* 140:189-194.
Ensell, G. (1995) "Free Standing Single-Crystal Silicon Microstructures," *J. Micromech. Microeng.* 5:1-4.

Exam Report, Written Opinion and Response to Written Opinion, Corresponding to Singapore Patent Application No. 2007/18082-1, Mailed Beginning Jan. 15, 2009.
Examination Report and Response, Corresponding to Malaysian Patent Application No. PI 20062672, Mailed Aug. 28, 2009.
Examination Report, Corresponding to European Application No. EP 05 756 327.2, Dated Jan. 20, 2010.
Examination Report, Corresponding to Malaysian Patent Application No. PI 20092343, Mailed Jun. 15, 2010.
Examination Report, Corresponding to Malaysian Patent Publication No. PI 20052553, Mailed Mar. 13, 2009.
Examination Report, Corresponding to Singapore Patent Application No. 200608359-6, Completed on Aug. 27, 2008.
Examination Report, Response and Search Report, Corresponding to Malaysian Patent Application No. PI 20062537, Nov. 20, 2009.
Extended European Search Report dated Apr. 4, 2012 for corresponding European Patent Application No. 06771761.1.
Faez et al. (1999) "An Elastomeric Conductor Based on Polyaniline Prepared by Mechanical Mixing," *Polymer* 40:5497-5503.
Feigner et al. (1996) "Flexural Rigidity of Microtubules Measured with the Use of Optical Tweezers," *J. Cell Sci.* 109:509-516.
Fink et al. (1999) "Block Copolymers as Photonic Bandgap Materials," *J. Lightwave Tech.* 17:1963-1969.
Flewitt et al. (2005) "Low-Temperature Deposition of Hydrogenated Amorphous Silicon in an Electron Cyclotron Resonance Reactor for Flexible Displays," *Proc. IEEE* 93:1364-1373.
Folch et al. (1999) "Wafer-Level In-Registry Microstamping," *J. Microelectromech. Syst.* 8:85-89.
Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.
Forrest et al. (2004) "The Path to Ubiquitous and Low-Cost Organic Electronic Appliances on Plastic," *Nature* 428:911-918.
Fortunato et al. (2005) "Flexible a-Si: H Position-Sensitive Detectors," *Proc. IEEE* 93:1281-1286.
Fortunato et al. (Sep. 2008) "High-Performance Flexible Hybrid Field-Effect Transistors Based on Cellulose Fiber Paper," *IEEE Electron. Dev. Lett.* 29(9):988-990.
Freeman et al. (2000) "Spatial Spectral Analysis of Human Electrocardiograms Including the Alpha and Gamma Bands," *J. Neurosci. Methods* 95:111-121.
Freire et al. (1999) "Thermal Stability of Polyethylene Terephthalate (PET): Oligomer Distribution and Formation of Volatiles," *Packag. Technol. Sci.* 12:29-36.
Freund, L.B. (2000) "The Mechanics of Electronic Materials," *Int. J. Solids Struct.* 37:185-196.
Friedman et al. (2005) "High-Speed Integrated Nanowire Circuits," *Nature* 434:1085.
Fu et al. (Jan. 10, 2003) "Patterning of Diamond Microstructures on Si Substrate by Bulk and Surface Micromachining," *J. Mater. Process. Technol.* 132(1-3):73-81.
Furneaux et al. (1989) "The Formation of Controlled-Porosity Membranes from Anodically Oxidized Aluminum," *Nature* 337:147-149.
Gan et al. (2002) "Preparation of Thin-Film Transistors With Chemical Bath Deposited CdSe and CdS Thin Films," *IEEE Trans. Electron. Dev.* 49:15-18.
Gao et al. (Sep. 9, 2005) "Conversion of Zinc Oxide Nanobelts into Superlattice-Structures Nanohelices," *Science* 309:1700-1704.
Garcia et al. (2004) "Etchant Anisotropy Controls the Step Bunching Instability in KOH Etching of Silicon," *Phys. Rev. Lett.* 93(16):166102.
Gardner et al. (1965) "Physical Aspects of the Internal Water Relations of Plant Leaves," *Plant Physiol.* 40:705-710.
Garnier et al. (1994) "All-Polymer Field-Effect Transistor Realized by Printing Techniques," *Science* 265:1684-1686.
Geim et al. (Mar. 2007) "The Rise of Graphene," *Nature Mater.* 6:183-191.
Geissler et al. (2003) "Fabrication of Metal Nanowires Using Microcontact Printing," *Langmuir* 19(15):6301-6311.

(56) References Cited

OTHER PUBLICATIONS

Geissler et al. (Jun. 2003) "Selective Wet-Etching of Microcontact-Printed Cu Substrates with Control Over the Etch Profile," *Microelec. Eng.* 67-68:326-332.
Gelinck et al. (2000) "High-Performance All-Polymer Integrated Circuits," *Appl. Phys. Lett.* 77:1487-1489.
Gelinck et al. (2004) "Flexible Active-Matrix Displays and Shift Registers Based on Solution-Processed Organic Transistors," *Nat. Mater.* 3:106-110.
Georgakilas et al. (2002) "Wafer-Scale Integration of GaAs Optoelectronic Devices with Standard Si Integrated Circuits Using a Low-Temperature Bonding Procedure," *Appl. Phys. Lett.* 81:5099-5101.
Givargizov, E.I. (1991) "Applications," In; *Oriented Crystallization on Amorphous Substrates*, Plenum Press, New York, pp. 341-363.
Goetting et al. (1999) "Microcontact Printing of Alkanephosphonic Acids on Aluminum: Pattern Transfer by Wet Chemical Etching," *Langmuir* 15:1182-1191.
Goldman et al. (1996) "Correlation of Buffer Strain Relaxation Modes with Transport Properties of Two-Dimensional Electron Gases," *J. Appl. Phys.* 80:6849-6854.
Goldmann et al. (2004) "Hole Mobility in Organic Single Crystals Measured by a "Flip-Crystal" Field-Effect Technique," *J. Appl. Phys.* 96:2080-2086.
Goldsmith, T.H. (Sep. 1990) "Optimization, Constraint, and History in the Evolution of Eyes," *Quart. Rev. Biol.* 65(3):281-322.
Gratz et al. (1991) "Atomic Force Microscopy of Atomic-Scale Ledges and Etch Pits Formed During Dissolution of Quartz," *Science*, 251:1343-1346.
Gray et al. (Dec. 2001) "Screen Printed Organic Thin Film Transistors (OTFTs) on a Flexible Substrate," *Proc. SPIE* 4466:89-94.
Gray et al. (Mar. 5, 2004) "High-Conductivity Elastomeric Electronics," *Adv. Mater.* 16(5):393-397.
Grayson, T. (2002) "Curved Focal Plane Wide Field of View Telescope Design," *Proc. SPIE* 4849:269-274.
Gruen et al. (Mar. 21, 1994) "Fullerenes as Precursors for Diamond Film Growth Without Hydrogen or Oxygen Additions," *Appl. Phys. Lett.* 65(12):1502-1504.
Gudiksen et al. (Web Release Apr. 18, 2001) "Synthetic Control of the Diameter and Length of Single Crystal Semiconductor Nanowires," *J. Phys. Chem. B* 105:4062-4064.
Guo et al. (Aug. 19, 2002) "Metal-Insulator-Semiconductor Electrostatics of Carbon Nanotubes," *Appl. Phys. Lett.* 81(8):1486-1488.
Gur et al. (2005) "Air-Stable All-Inorganic Nanocrystal Solar Cells Processed from Solution," *Science* 310:462-465.
Gurbuz et al. (Jul. 2005) "Diamond Semiconductor Technology for RF Device Applications." *Solid State Electron.* 49(7):1055-1070.
Haisma et al. (2002) "Contact Bonding, Including Direct-Bonding in a Historical and Recent Context of Materials Science and Technology, Physics and Chemistry," *Mater. Sci Eng.* 37:1-60.
Halik et al. (2004) "Low-Voltage Organic Transistors with an Amorphous Molecular Gate Dielectric," *Nature* 431:963-966.
Hamedi et al. (May 2007) "Towards Woven Logic from Organic Electronic Fibres," *Nat. Mater.* 6:357-362.
Hamilton et al. (2004) "Field-Effect Mobility of Organic Polymer Thin-Film Transistors," *Chem. Mater.* 16:4699-4704.
Han et al. (2005) "Template-Free Directional Growth of Single-Walled Carbon Nanotues on a- and r-Plane Sapphire," *J. Am. Chem. Soc.* 127:5294-5295.
Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.
Harkonen et al. (Jun. 8, 2006) "4 W Single-Transverse Mode VECSEL Utilizing Intra-Cavity Diamond Heat Spreader," *Electron Lett.* 42(12):693-694.
Hayase et al. (2001) "Photoangioplasty with Local Motexafin Lutetium Delivery Reduces Macrophages in a Rabbit Post-Balloon Injury Model," *Cardiovascular Res.* 49:449-455.

He et al. (2005) "Si Nanowire Bridges in Microtrenches: Integration of Growth into Device Fabrication," *Adv. Mater.* 17:2098-2102.
Heffelfinger et al. (1997) "Steps and the structure of the (0001) α-alumina surface," *Surf. Sci.*, 370:L168-L172.
Hillbrog et al. (Web Release Dec. 30, 2003) "Nanoscale Hydrophobic Recovery: A Chemical Force Microscopy Study of UV/Ozone-Treated Cross-Linker Poly(dimethylsiloxane)," *Langmuir* 20(3):785-794.
Hines et al. (2005) "Nanotransfer Printing of Organic and Carbon Nanotube Thin-Film Transistors on Plastic Substrates," *Appl. Phys. Lett.* 86:163101.
Hölke et al. (1999), "Ultra-deep anisotropic etching of (110) silicon", Journal of Micromechanics & Microengineering, vol. 9, No. 1, pp. 51-57.
Hollenberg et al. (2006) "A MEMS Fabricated Flexible Electrode Array for Recording Surface Field Potentials," *J. Neurosci. Methods* 153:147-153.
Holmes et al. (Feb. 25, 2000) "Control of Thickness and Orientation of Solution-Grown Silicon Nanowires," *Science* 287:1471-1473.
Horan et al. (Jun. 2005) "In Vitro Degradation of Silk Fibroin," *Biomaterials* 26(17):3385-3393.
Horn et al. (1992) "Contact Electrification and Adhesion Between Dissimilar Materials," *Science* 256:362-364.
Hoyer, P. (1996) "Semiconductor Nanotube Formation by a Two-Step Template Process," *Adv. Mater.* 8:857-859.
Hsia et al. (2005) "Collapse of Stamps for Soft Lithography Due to Interfacial Adhesion," *Appl. Phys. Lett.* 86:154106.
Hsu et al. (2002) "Amorphous Si TFTs on Plastically Deformed Spherical Domes," *J. Non-Crystalline Solids* 299-302:1355-1359.
Hsu et al. (2003) "Nature of Electrical Contacts in a Metal-Molecule-Semiconductor System," *J. Vac. Sci. Technol. B* 21(4):1928-1935.
Hsu et al. (Jan. 15, 2004) "Spherical Deformation of Compliant Substrates with Semiconductor Device Islands," *J. Appl. Phys.* 95(2):705-712.
Hsu et al. (Mar. 2004) "Effects of Mechanical Strain on TFT's on Spherical Domes," *IEEE Trans. Electron Dev.* 51(3):371-377.
Hu et al. (1997) "Using Soft Lithography to Fabricate GaAs/AlGaAs Heterostructure Field Effect Transistors," *Appl. Phys. Lett.* 71:2020-2022.
Hu et al. (1999) Chemistry and Physics in One Dimension: Synthesis and Properties of Nanowires and Nanotubes, *Acc. Chem. Res.* 32:435-445.
Hu et al. (2004) "Percolation in Transparent and Conducting Carbon Nanotube Networks," *Nano Lett.*, vol. 4, No. 12, pp. 2513-2517.
Hu et al. (2009) "Highly Conductive Paper for Energy-Storage Devices," *Proc. Natl. Acad. Sci. USA* 106:21490-21494.
Hu et al. (2010) "Stretchable, Porous, and Conductive Energy Textiles," *Nano Lett.* 10:708-714.
Huang et al. (2001) "Directed Assembly of One-Dimensional Nanostructures into Functional Networks," *Science* 291:630-633.
Huang et al. (2001) "Room-Temperature Ultraviolet Nanowire Nanolasers," *Science* 292:1897-1899.
Huang et al. (2003) "Growth of Millimeter-Long and Horizontally Aligned Single-Walled Carbon Nanotubes on Flat Substrates," *J. Am. Chem. Soc.*, 125:5636-5637.
Huang et al. (2004) "Long and Oriented Single-Walled Carbon Nanotubes Grown by Ethanol Chemical Vapor Deposition," *J. Phys. Chem. B.* 108:16451-16456.
Huang et al. (2004) "Self-Organizing High-Density Single-Walled Carbon Nanotube Arrays from Surfactant Suspensions," *Nanotechnol.* 15:1450-1454.
Huang et al. (2005) "Nanomechanical Architecture of Strained Bilayer Thin Films: From Design Principles to Experimental Fabrication," *Adv. Mater.* 17(23):2860-2864.
Huang et al. (2005) "Nanowires for Integrated Multicolor Nanophotonics," *Small* 1(1):142-147.
Huang et al. (2005) "Nonlinear Analyses of Wrinkles in a Film Bonded to a Compliant Substrate," *J. Mech. Phys. Solids* 53:2101-2118.
Huang et al. (2005) "Stamp Collapse in Soft Lithography," *Langmuir* 21:8058-8068.

(56) References Cited

OTHER PUBLICATIONS

Huang et al. (Jan. 16, 2001) "Catalytic Growth of Zinc Oxide Nanowires by Vapor Transport," *Adv. Mater.* 13(2):113-116.
Huck et al. (2000) "Ordering of Spontaneously Formed Buckles on Planar Surfaces," *Langmuir* 16:3497-3501.
Huie, J.C. (2003) "Guided Molecular Self Assembly: A review of Recent Efforts," *Smart Mater. Struct.* 12:264-271.
Huitema et al. (2001) "Plastic Transistors in Active-Matrix Displays," *Nature* 414:599.
Hur et al. (2005) "Organic Nanodielectrics for Low Voltage Carbon Nanotube Thin Film Transistors and Complementary Logic Gates," *J. Am. Chem. Soc.* 127:13808-13809.
Hur et al. (2005) "Printed thin-film transistors and complementary logic gates that use polymer-coated single-walled carbon nanotube networks," *J. Appl. Phys.*, 98, 114302.
Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," *Appl. Phys. Lett.* 85(23):5730-5732.
Hur et al. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.
Hutchinson et al. (1992) "Mixed Mode Cracking in Layered Materials," *Adv. Appl. Mech.* 29:63-191.
Imparato et al. (2005) "Excimer Laser Induced Crystallization of Amorphous Silicon on Flexible Polymer Substrates," *Thin Solid Films* 487:58-62.
International Preliminary Report on Patentability, Corresponding to International Application No. PCT/2010/024004, Mailed Aug. 25, 2011.
International Search Report and Written Opinion dated Jul. 30, 2012, corresponding to International Patent Application No. PCT/US12/37973.
International Search Report and Written Opinion, Corresponding to International Application No. PCT/US10/50468, Mailed Jan. 6, 2011.
International Search Report and Written Opinion, Corresponding to International Application No. PCT/US10/60425, Mailed May 25, 2011.
International Search Report and Written Opinion, Corresponding to International Application No. PCT/2005/014449, Mailed Jul. 3, 2008.
International Search Report and Written Opinion, Corresponding to International Application No. PCT/US04/40192, Mailed Jul. 6, 2005.
International Search Report and Written Opinion, Corresponding to International Application No. PCT/US07/74293, Mailed Jul. 24, 2008.
International Search Report and Written Opinion, Corresponding to International Application No. PCT/US07/77217, Mailed Jun. 3, 2008.
International Search Report and Written Opinion, Corresponding to International Application No. PCT/US07/82633, Mailed May 16, 2008.
International Search Report and Written Opinion, Corresponding to International Application No. PCT/US09/47442, Mailed Sep. 21, 2009.
International Search Report and Written Opinion, Corresponding to International Application No. PCT/US2006/032125, Mailed Mar. 21, 2008.
International Search Report and Written Opinion, Corresponding to International Application No. PCT/US2009/036192, Mailed Jul. 6, 2009.
International Search Report and Written Opinion, Corresponding to International Application No. PCT/US2009/058231, Mailed Nov. 17, 2009.
International Search Report and Written Opinion, Corresponding to International Application No. PCT/US2010/024004, Mailed Nov. 26, 2010.
International Search Report and Written Opinion, Corresponding to International Application No. PCT/US2010/034520, Mailed Sep. 24, 2010.
International Search Report and Written Opinion, Corresponding to International Application No. PCT/US2010/042585, Mailed May 25, 2011.
International Search Report and Written Opinion, Corresponding to International Application No. PCT/US2011/028094, Mailed Jul. 14, 2011.
International Search Report and Written Opinion, Corresponding to International PCT Application No. PCT/US05/19354, Dated Apr. 18, 2007.
International Search Report and Written Opinion, Corresponding to International PCT Application No. PCT/US2006/021161, Mailed Feb. 28, 2008.
International Search Report and Written Opinion, Corresponding to International PCT Application No. PCT/US2007/022959, Mailed Oct. 14, 2008.
International Search Report and Written Opinion, Corresponding to International PCT Application No. PCT/US2007/077759, Mailed Apr. 11, 2008.
International Search Report and Written Opinion, Corresponding to International PCT Application No. PCT/US2007/079070, Mailed Apr. 23, 2008.
Isberg et al. (Sep. 6, 2002) "High Carrier Mobility in Single-Crystal Plasma-Deposited Diamond," *Science* 297:1670-1672.
Islam et al. (Jan. 16, 2003) "High Weight Fraction Surfactant Solubilization of Single-Wall Carbon Nanotubes in Water," *Nano Lett.* 3(2):269-273.
Ismach et al. (2004) "Atomic-Step-Templated Formation of Single Wall Carbon Nanotube Patterns," *Angew. Chem. Int. Ed.* 43:6140-6143.
Itoh et al. (1991) "Cathodoluminescence Properties of Undoped and Zn-Doped $Al_xGa_{1-x}N$ Grown by Metalorganic Vapor Phase Epitaxy," *Jap. J. Appl. Phys.* 30:1604-1608.
Jabbour et al. (2001) "Screen Printing for the Fabrication of Organic Light-Emitting Devices," *IEEE J. Select. Top. Quantum. Electron.* 7:769-773.
Jackman et al. (Aug. 4, 1995) "Fabrication of Submicrometer Features on Curved Substrates by Microcontact Printing," *Science* 269:664-666.
Jacobs et al. (2001) "Submicrometer Patterning of Charge in Thin-Film Electrets," *Science* 291:1763-1766.
Jacobs et al. (2002) "Fabrication of a Cylindrical Display by Patterned Assembly," *Science* 296:323-325.
Jain et al. (2000) "III-Nitrides: Growth, Characterization, and Properties," *J. Appl. Phys.* 87:965-1006.
Jain et al. (2005) "Flexible Electronics and Displays: High-Resolution, Roll-to-Roll, Projection Lithography and Photoablation Processing Technologies for High-Throughput Production," *Proc. IEEE* 93:1500-1510.
James et al. (1998) "Patterned Protein Layers on Solid Substrates by This Stamp Microcontact Printing," *Langmuir* 14:742-744.
Jang et al. (2003) "Lateral Growth of Aligned Multiwalled Carbon Nanotubes Under Electric Fields," *Solid State Commun.* 126:305-308.
Jang et al. (2006) "Low-Voltage and High-Field-Effect Mobility Organic Transistors with a Polymer Insulator," *Appl. Phys. Lett.* 88:072101.
Javey et al. (2002) "High-κ Dielectrics for Advanced Carbon-Nanotube Transistors and Logic Gates," *Nature Mater.* 1:241-246.
Javey et al. (2005) "High Performance n-Type Carbon Nanotube Field-Effect Transistors with Chemically Doped Contacts," *Nano Lett.*, vol. 5, No. 2, pp. 345-348.
Javey et al. (Aug. 7, 2003) "Ballistic Carbon Nanotube Field-Effect Transistors," *Nature* 424:654-657.
Jenkins et al. (1994) "Gallium Arsenide Transistors: Realization Through a Molecularly Designed Insulator," *Science* 263:1751-1753.
Jeon et al. (1995) "Patterning of Dielectric Oxide Thin Layers by Microcontact Printing of Self-Assembled Monolayers," *J. Mater. Res.* 10:2996-2999.

(56) References Cited

OTHER PUBLICATIONS

Jeon et al. (2003) "Structural and Mechanical Properties of Woven Fabrics Employing Peirce's Model," *Textile Res. J.* 73:929-933.
Jeon et al. (2004) "Fabricating Complex Three-Dimensional Nanostructures with High Resolution Conformable Phase Masks," *Proc. Natl. Acad. Sci. USA* 101:12428-12433.
Jeon et al. (Aug. 4, 2004) "Three Dimensional Nanofabrication with Rubber Stamps and Conformable Photomasks," *Adv. Mater.* 16(15):1369-1375.
Jiang et al. (1999) "Preparation of Macroporous Metal Films from Colloidal Crystals," *J. Am. Chem. Soc.* 121:7957-7958.
Jiang et al. (2002) "Polymer-on-Polymer Stamping: Universal Approaches to Chemically Patterned Surfaces," *Langmuir* 18:2607-2615.
Jiang et al. (2007) "Mechanical Properties of Robust Ultrathin Silk Fibroin Films," *Adv. Funct. Mater.* 17:2229-2237.
Jiang et al. (Oct. 2, 2007) "Finite Deformation Mechanics in Buckled Thin Films on Compliant Supports," *Proc. Natl. Acad. Sci. USA* 104(40):15607-15612.
Jin et al. (2004) "Scalable Interconnection and Integration of Nanowire Devices Without Registration," *Nano Lett.* 4:915-919.
Jin et al. (2004) "Soft Lithographic Fabrication of an Image Sensor Array on a Curved Substrate," *J. Vac. Sci. Technol. B* 22(5):2548-2551.
Jin et al. (Aug. 2005) "Water-Stable Silk Films with Reduced β-Sheet Content," *Adv. Funct. Mater.* 15(8):1241-1247.
Jin et al. (Web Release Jan. 23, 2004) "Biomaterial Films of *Bombyx mori* Silk Fibroin with Poly(ethylene oxide)," *Biomacromolecules* 5(3):711-717.
Jiyun, C.H. (2003) "Guided Molecular Self-Assembly: A Review of Recent Efforts," *Smart Mater. Struct.* 12:264-271.
Joachim et al. (Nov. 30, 2000) "Electronics Using Hybrid-Molecular and Mono-Molecular Devices," *Nature* 408:541-548.
Johnson et al. (1999) "Ordered Mesoporous Polymers of Tunable Pore Size from Colloidal Silica Templates," *Science* 283:963-965.
Jones et al. (Jul./Aug. 2004) "Stretchable Wavy Metal Interconnects," *J. Vac. Sci. Technol. A* 22(4):1723-1725.
Joo et al. (2006) "Low-Temperature Solution-Phase Synthesis of Quantum Well Structures CdSe Nanoribbons," *J. Am. Chem. Soc.* 128(17):5632-5633.
Jortner et al. (2002) "Nanostructured Advanced Materials Perspectives and Directions," *Pure Appl. Chem.* 74(9):1491-1506.
Joselevich (2002) "Vectorial Growth of Metallic and Semiconducting Single-Wall Carbon Nanotubes," *Nano Lett.*, vol. 2, No. 10, pp. 1137-1141.
Kadish et al. (1988) "Interaction of Fiber Orientation and Direction of Impulse Propagation with Anatomic Barriers in Anisotropic Canine Myocardium," *Circulation.* 78:1478-1494.
Kagan (1999) "Organic-Inorganic Hybrid Materials as Semiconducting Channels in Thin-Film Field-Effect Transistors," *Science* 286:945-947.
Kagan et al. (2001) "Patterning Organic-Inorganic Thin-Film Transistors Using Microcontact Printed Templates," *Appl. Phys Lett.* 79(21):3536-3538.
Kagan et al. (2003) *Thin Film Transistors*, Dekker, New York, pp. 1-34.
Kane et al. (2000) "Analog and Digital Circuits Using Organic Thin-Film Transistors on Polyester Substrates," *IEEE Electron. Dev. Lett.* 21:534-536.
Kang et al. (2007) "Printed Multilayer Superstructures of Aligned Single-Walled Carbon Nanotubes for Electronic Applications," *Nano Lett.* 7(11):3343-3348.
Kang et al. (Apr. 2007) "High-Performance Electronics Using Dense, Perfectly Aligned Arrays of Single-Walled Carbon Nanotubes," *Nat. Nanotechnol.* 2(4):230-236.
Kar et al. (2005) "Controlled Synthesis and Photoluminescence Properties of ZnS Nanowires and Nanoribbons," *J. Phys. Chem. B* 109(8):3298-3302.
Kar et al. (2005) "Synthesis and Optical Properties of CdS Nanoribbons," *J. Phys. Chem B.* 109(41):19134-19138.
Kar et al. (2006) "Shape Selective Growth of CdS One-Dimensional Nanostructures by a Thermal Evaporation Process," *J. Phys. Chem. B.* 110(10):4542-4547.
Karnik et al. (2003) "Lateral Polysilicon $p^+$-p-$n^+$ and $p^+$-n-$n^+$ Diodes," *Solid-State Electronics* 47:653-659.
Karnik et al. (2003) "Multiple Lateral Polysilicon Diodes as Temperature Sensors for Chemical Microreaction Systems," *Jpn. J. Appl. Phys.* 42:1200-1205.
Kato et al. (2004) the Characteristic Improvement of Si(111) Metal-Oxide-Semiconductor Field-Effect Transistor by Long-Time Hydrogen Annealing, *Jpn. J. Appl. Phys.* 43(10):6848-6853.
Katz et al. (2001) "Synthetic Chemistry for Ultrapure, Processable, and High-Mobility Organic Transistor Semiconductors," *Acc. Chem. Res.* 34:359-369.
Katz, H.E. (2004) "Recent Advances in Semiconductor Performance and Printing Processes for Organic Transistor-Based Electronics," *Chem. Mater.* 16:4748-4756.
Kawata et al. (2001) "Finer Features for Functional Microdevices," *Nature* 412:697-698.
Kellis et al. (2009) "Human Neocortical Electrical Activity Recorded on Nonpenetrating Microwire Arrays: Applicability for Neuroprostheses," *Neurosurg. Focus* 27(1):E9.
Kendall, D.L. (1979) "Vertical Etching of Silicon at Very High Apect Ratios," *Ann. Rev. Mater. Sci.* 9:373-403.
Khakani et al. (2006) "Lateral Growth of Single Wall Carbon Nanotubes on Various Substrates by Means of an 'All-Laser' Synthesis Approach," *Diamond Relat. Mater.* 15:1064-1069.
Khan et al. (1993) "High Electron Mobility Transistor Based on a GaN—$Al_xGa_{1-x}N$ Heterojunction," *Appl. Phys. Lett.* 63:1214-1215.
Khang et al. (2006) "A Stretchable Form of Single-Crystal Silicon for High-Performance Electronics on Rubber Substrates," *Science* 311:208-212.
Kilby, J.S. (1976) "Invention of the Integrated Circuit," *IEEE Trans. Electron. Dev.* 23:648-654.
Kim et al. (2000) "Field Emission from Carbon Nanotubes for Displays," *Diamond and Related Mater.* 9(3-6):1184-1189.
Kim et al. (2002) "Nanolithography Based on Patterned Metal Transfer and Its Application to Organic Electronic Devices," *Appl. Phys. Lett.* 80:4051-4053.
Kim et al. (2003) "Epitaxial Self-Assembly of Block Copolymers on Lithographically Defined Nanopatterned Substrates," *Nature* 424:411-414.
Kim et al. (2008) "Stretchable Electronics: Materials Strategies and Devices," *Adv. Mater.* 20:4887-4892.
Kim et al. (2009) "Integrated Wireless Neural Interface Based on the Utah Electrode array," *Biomed. Microdevices* 11:453-466.
Kim et al. (2009) "Optimized Structural Designs for Stretchable Silicon Integrated Circuits," *Small* 5(24):2841-2847.
Kim et al. (Apr. 25, 2008) "Stretchable and Foldable Silicon Integrated Circuits," *Science* 320:507-511.
Kim et al. (Dec. 2, 2008) "Materials and Noncoplanar Mesh Designs for Integrated Circuits with Linear Elastic Responses to Extreme Mechanical Deformations," *Proc. Natl. Acad. Sci. USA* 105(48):18675-18680.
Kim et al. (Jan. 2008) "Complementary Logic Gates and Ring Oscillators Plastic Substrates by Use of Printed Ribbons Single-Crystalline Silicon," *IEEE Electron. Dev. Lett.* 29(1):73-76.
Kim et al. (Nov. 15, 1999) "Direct Observation of Electron Emission Site on Boron-Doped Polycrystalline Diamond Thin Films Using an Ultra-High-Vacuum Scanning Tunneling Microscope," *Appl. Phys. Lett.* 75(20):3219-3221.
Kim et al. (Oct. 17, 2010) "Waterproof AlInGaP optoelectronics on stretchable substrates with applications in biomedicine and robotics," *Nature Materials* 9:929-937.
Kim et al. (Oct. 2004) "Organic TFT Array on a Paper Substrate," *IEEE Electron. Dev. Lett.* 25(10):702-704.
Kim et al. (Web Release Apr. 18, 2010) "Dissolvable Films of Silk Fibroin for Ultrathin Conformal Bio-Integrated Electronics," *Nature Materials* 9:511-517.
Kim et al. (Web Release Feb. 29, 2008) "Highly Emissive Self-Assembled Organic Nanoparticles Having Dual Color Capacity for Targeted Immunofluorescence Labeling," *Adv. Mater.* 20(6):1117-1121.

(56) References Cited

OTHER PUBLICATIONS

Kim et al. (Web Release Jul. 31, 2008) "Complementary Metal Oxide Silicon Integrated Circuits Incorporating Monolithically Integrated Stretchable Wavy Interconnects," *Appl. Phys. Lett.* 93(4):044102.
Kim et al. (Web Release Jul. 6, 2009) "Ultrathin Silicon Circuits with Strain-Isolation Layers and Mesh Layouts for High-Performance Electronics on Fabric, Vinyl, Leather and Paper," *Adv. Mater.* 21(36):3703-3707.
Kim et al. (Web Release Sep. 29, 2009) "Silicon Electronics on Silk as a Path to Bioresorbable, Implantable Devices," *Appl. Phys. Lett.* 95:133701-133703.
Kim, Y.S. (Web Release Aug. 9, 2005) "Microheater-Integrated Single Gas Sensor Array Chip Fabricated on Flexible Polyimide Substrate," *Sens. Actuators B* 114(1):410-417.
Klauk et al. (2002) "High-Mobility Polymer Gate Dielectric Pentacene Thin Film Transistors," *J. Appl. Phys.* 92:5259-5263.
Klein-Wiele et al. (2003) "Fabrication of Periodic Nanostructures by Phase-Controlled Multiple-Beam Interference," *Appl. Phys. Lett.* 83(23):4707-4709.
Knipp et al. (2003) "Pentacine Thin Film Transistors on Inorganic Dielectrics: Morphology, Structural Properties, and Electronic Transport," *Appl. Phys. Lett.* 93:347-355.
Ko et al. (2006) "Bulk Quantities of Single-Crystal Silicon Micro-/Nanoribbons Generated from Bulk Wafers," *Nano Lett.* 6(10):2318-2324.
Ko et al. (2010) "Flexible Carbon Nanofiber Connectors with Anisotropic Adhesion Properties," *Small* 6:22-26.
Ko et al. (Aug. 7, 2008) "A Hemispherical Electronic Eye Camera Based on Compressible Silicon Optoelectronics," *Nature* 454:748-753.
Ko et al. (Web Release Oct. 28, 2009) "Curvilinear Electronics Formed Using Silicon Membrane Circuits and Elastomeric Transfer Elements," *Small* 5(23):2703-2709.
Kocabas et al. (2004) "Aligned Arrays of Single-Walled Carbon Nanotubes Generated from Random Networks by Orientationally Selective Laser Ablation," *Nano Lett.*, vol. 4, No. 12, pp. 2421-2426.
Kocabas et al. (2005) "Guided Growth of Large-Scale, Horizontally Aligned Arrays of Single-Walled Carbon Nanotubes and Their Use in Thin-Film Transistors," *Small* 1(11):1110-1116.
Kocabas et al. (2006) "Large Area Aligned Arrays of SWNTs for High Performance Thin Film Transistors," American Physical Society, APS March Meeting, Mar. 13-17, Abstract # W31.004.
Kocabas et al. (2006) "Spatially Selective Guided Growth of High-Coverage Arrays and Random Networks of Single-Walled Carbon Nanotubes and Their Integration into Electronic Devices," *J. Am. Chem. Soc.* 128:4540-4541.
Kocabas et al. (2007) "Experimental and Theoretical Studies of Transport Through Large Scale, Partially Aligned Arrays of Single-Walled Carbon Nanotubes in Thin Film Type Transistors," *Nano Lett.* 7(5):1195-1202.
Kocabas et al. (Feb. 5, 2008) "Radio Frequency Analog Electronics Based on Carbon Nanotube Transistors," *Proc. Natl. Acad. Sci. USA* 105(5):1405-1409.
Kodambaka et al. (2006) "Control of Si Nanowire Growth by Oxygen," *Nano Lett.* 6(6):1292-1296.
Koide et al. (2000) "Patterned Luminescence of Organic Light-Emitting Diodes by Hot Microcontact Printing (HμCP) of Self-Assembled Monolayers," *J. Am. Chem. Soc.* 122:11266-11267.
Konagai et al. (1978) "High Efficiency GaAs Thin Film Solar Cells by Peeled Film Technology," *J. Cryst. Growth* 45:277-280.
Kong et al. (2004) "Single-Crystal Nanorings Formed by Epitaxial Self-Coating of Polar Nanobelts," *Science* 303:1348-1351.
Kong et al. (Jan. 28, 2000) "Nanotube Molecular Wires as Chemical Sensors," *Science* 287:622-625.
Kong et al. (Oct. 2003) "Structure of Indium Oxide Nanobelts," *Solid State Commun.* 128(1):1-4.
Kong et al. (Oct. 29, 1998) "Synthesis of Individual Single-Walled Carbon Nonotubes on Patterned Silicon Wafers," *Nature* 395:878-881.
Kudo et al. (Web Release Jun. 13, 2006) "A Flexible and Wearable Glucose Sensor Based on Functional Polymers with Soft-MEMS Techniques," *Biosens. Bioelectron.* 22:558-562.
Kulkarni et al. (2002) "Mesoscale Organization of Metal Nanocrystals," *Pure Appl. Chem* 74(9):1581-1591.
Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(4):2002-2004.
Kumar et al. (1994) "Patterning Self-Assembled Monolayers: Applications in Materials Science," *Langmuir* 10:1498-1511.
Kumar et al. (2002) "Thermally-Stable Low-Resistance Ti/Al/Mo/Au Multilayer Ohmic Contacts on n-GaN," *J. Appl. Phys.* 92:1712-1714.
Kumar et al. (2005) "Percolating in Finite Nanotube Networks," *Phys. Rev. Lett.*, 95, 066802.
Kuo et al. (1985) "Effect of Mismatch Strain on Band Gap in III-V Semiconductors," *J. Appl. Phys.* 57:5428-5432.
Kuykendall et al. (Aug. 2004) "Crystallographic Alignment of High Density Gallium Nitride Nanowire Arrays," *Nat. Mater.* 3:524-528.
Lacour et al. (2005) "Stretchable Interconnects for Elastic Electronic Surfaces," *Proc. IEEE* 93:1459-1467.
Lacour et al. (2010) "Flexible and Stretchable Micro-Electrodes for in Vitro and n Vivo Neural Interfaces," *Med. Biol. Eng. Comput.* 48:945-954.
Lacour et al. (Apr. 14, 2003) "Stretchable Gold Conductors on Elastomeric Substrates," *Appl. Phys. Lett.* 82(15):2404.
Lacour et al. (Apr. 2004) "Design and Performance of Thin Metal Film Interconnects for Skin-Like Electronic Circuits," *IEEE Electron. Dev. Lett.* 25(4):179-181.
Lacour et al. (Dec. 2004) "An Elastically Stretchable TFT Circuit," *IEEE Electron Dev. Lett.* 25(12):792-794.
Lacour et al. (Web Release Jul. 14, 2006) "Stiff Subcircuit Islands of Diamondlike Carbon for Stretchable Electronics," *J. Appl. Phys.* 100:014913.
Lacour et al. (Web Release May 16, 2006) "Mechanisms of Reversible Stretchability of Thin Metal Films on Elastomeric Substrates," *Appl. Phys. Lett.* 88:204103.
Laimer et al. (Mar. 1997) "Diamond Growth in a Direct-Current Low-Pressure Supersonic Plasmajet," *Diamond Relat. Mater.* 6:406-410.
Lambacher et al. (2004) "Electrical Imaging of Neuronal Activity by Multi-Transistor-Array (MTA) Recording at 7.8 μm Resolution," *Appl. Phys. A* 79:1607-1611.
Landes et al. (2002) "Some Properties of Spherical and Rod-Shaped Semiconductor and Metal Nanocrystals," *Pure Appl. Chem.* 74(9):1675-1692.
Law et al. (2004) "Semiconductor Nanowires and Nanotubes," *Ann. Rev. Mater. Res.* 34:83-122.
Law et al. (Aug. 27, 2004) "Nanoribbon Waveguides for Subwavelength Photonics Integration," *Science* 305:1269-1273.
Lawrence et al. (2008) "Bioactive Silk Protein Biomaterial Systems for Optical Devices," *Biomacromolecules* 9:1214-1220.
Lay et al. (2004) "Simple Route to Large-Scale Ordered Arrays of Liquid-Deposited Carbon Nanotubes," *Nano Lett.*, vol. 4, No. 4, pp. 603-606.
Leclercq et al. (1998) "III-V Micromachined Devices for Microsystems," *Microelectronics J.* 29:613-619.
Lecomte et al. (Apr. 2006) "Degradation Mechanism of Diethylene Glycol Units in a Terephthalate Polymer," *Polym. Degrade. Stab.* 91(4):681-689.
Lee et al. (2000) "Thin Film Transistors for Displays on Plastic Substrates," *Solid State Electron.* 44:1431-1434.
Lee et al. (2003) "High-Performance Poly-Si TFTs on Plastic Substrates Using a Nano-Structured Separation Layer Approach," *IEEE Elec. Dev. Lett.* 24:19-21.
Lee et al. (2004) "Organic Light-Emitting Diodes Formed by Soft Contact Lamination," *Proc. Natl. Acad. Sci. USA* 101(2):429-433.
Lee et al. (2005) "A Printable Form of Single-Crystalline Gallium Nitride for Flexible Optoelectronic Systems," *Small* 1:1164-1168.

(56) References Cited

OTHER PUBLICATIONS

Lee et al. (2005) "Large-Area, Selective Transfer of Microstructured Silicon (μs-Si): A Printing-Based Approach to High-Performance Thin-Film Transistors Supported on Flexible Substrates," *Adv. Mater.* 17:2332-2336.
Lee et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," *Appl. Phys. Lett.* 100:084907/1-7.
Lee et al. (Apr. 2005) "Fabrication of Stable Metallic Patterns Embedded in Poly(dimethylsiloxane) and Model Applications in Non-Planar Electronic and Lab-on-a-Chip Device Patterning," *Adv. Funct. Mater.* 15(4):557-566.
Lee et al. (Dec. 1999) "The Surface/Bulk Micromachining (SBM) Process: A New Method for Fabricating Released MEMS in Single Crystal Silicon," *J. Microelectromech. Syst.* 8(4):409-416.
Lee et al. (Feb. 2001) "Application of Carbon Nanotubes to Field Emission Displays," *Diamond and Related Mater.* 10(2):265-270.
Lee et al. (Feb. 2005) "Weave Patterned Organic Transistors on Fiber for E-Textiles," *IEEE Trans. Electron. Dev.* 52(2):269-275.
Leong et al. (2009) "Tetherless Thermobiochemicall Actuated Microgrippers," *Proc. Natl. Acad. Sci. USA* 106:703-709.
Létant et al. (Jun. 2003) "Functionalized Silicon Membranes for Selective Bio-Organisms Capture," *Nat. Mater.* 2:391-395.
Li et al. (2002) "High-Resolution Contact Printing with Dendrimers," *Nano Lett.* 2(4):347-349.
Li et al. (2003) "Ultrathin Single-Crystalline-Silicon Cantilever Resonators: Fabrication Technology and Significant Specimen Size effect on Young's Modulus," *Appl. Phys. Lett.* 83:3081-3083.
Li et al. (2004) "Electrospinning of Nanofibers: Reinventing the Wheel," *Adv. Mater.* 16(14):1151-1170.
Li et al. (2006) "Catalyst-Assisted Formation of Nanocantilever Arrays on ZnS Nanoribbons by Post-Annealing Treatment," *J. Phys. Chem. B* 110(13):6759-6762.
Li et al. (Dec. 2005) "Compliant Thin Film Patterns of Stiff Materials as Platforms for Stretchable Electronics," *J. Mater. Res.* 20(12):3274-3277.
Li et al. (Jul. 1, 2002) "ZnO Nanobelts Grown on Si Substrate," *Appl. Phys. Lett.* 81:144-146.
Lieber, C. (2001) "The Incredible Shrinking Circuit," *Sci. Am.* 285(3):58-64.
Lieber, C.M. (2003) "Nanoscale Science and Technology: Building a Big Future from Small Things," *MRS Bull.* 28:486-491.
Lim et al. (2005) "Flexible Membrane Pressure Sensor," *Sens. Act. A* 119:332-335.
Lima et al. (2007) "Creating Micro- and Nanostructures on Tubular and Spherical Surfaces," *J. Vac. Sci. Technol. B* 25(6):2412-2418.
Lin et al. (Sep. 2005) "High-Performance Carbon Nanotube Field-Effect Transistor With Tunable Polarities," *IEEE Trans. Nano* 4(5):481-489.
Linder et al. (1994) "Fabrication Technology for Wafer Through-Hole Interconnections and Three-Dimensional Stacks of Chips and Wafers," *Proc. IEEE Micro. Electro Mech. Syst.* 349-354.
Ling et al. (2004) "Thin Film Deposition, Patterning, and Printing in Organic Thin Film Transistors," *Chem. Mater.* 16:4824-4840.
Liu et al. (1999) "Controlled deposition of individual single-walled carbon nanotubes on chemically functionalized templates," *Chem. Phys. Lett.*, 303:125-129.
Long et al. (1990) "Heterostructure FETs and Bipolar Transistors," In; *Gallium Arsenide Digital Integrated Circuit Design*, McGraw-Hill, New York, pp. 58-69.
Loo et al. (2002) "Additive, Nanoscale Patterning of Metal Films with a Stamp and a Surface Chemistry Mediated Transfer Process: Applications in Plastic Electronics," *Appl. Phys. Lett.* 81:562-564.
Loo et al. (2002) "High-Resolution Transfer Printing on GaAs Surfaces Using Alkane Dithiol Monolayers," *J. Vac. Sci. Technol. B* 20(6):2853-2856.
Loo et al. (2002) "Interfacial Chemistries for Nanoscale Transfer Printing," *J. Am. Chem. Soc.* 124:7654-7655.
Loo et al. (2002) "Soft, Conformable Electrical Contacts for Organic Semiconductors: High-Resolution Plastic Circuits by Lamination," *Proc. Natl. Acad. Sci. USA* 99(16):10252-10256.
Loo et al. (2003) "Electrical Contacts to Molecular Layers by Nanotransfer Printing," *Nano Lett.* 3(7):913-917.
Lopes et al. (Sep. 2004) "Thermal Conductivity of PET/(LDPE/AI) Composites Determined by MDSC," *Polym. Test.* 23(6):637-643.
Lu et al. (Apr. 2010) "Water-Insoluble Silk Films with Silk I Structure," *Acta Biomater.* 6(4):1380-1387.
Lu et al. (Dec. 2006) "Electronic Materials-Buckling Down for Flexible Electronics," *Nat. Nanotechnol.* 1:163-164.
Lu et al. (Jul. 19, 2005) "One Dimensional Hole Gas in Germanium/Silicon Nanowire Heterostructures," *Proc. Nat. Acad. Sci. USA* 102(29):10046-10051.
Lu et al. (Nov. 2008) "Nanowire Transistor Performance Limits and Applications," *IEEE Trans Electron Dev.* 55(11):2859-2876.
Luan et al. (1992) "An Experimental Study of the Source/Drain Parasitic Resistance Effects in Amorphous Silicon Thin Film Transistors," *J. Appl. Phys.* 72:766-772.
Ma et al. (2004) "Single-Crystal CdSe Nanosaws," *J. Am. Chem. Soc.* 126(3):708-709.
Mack et al. (2006) "Mechanically Flexible Thin-Film Transistors that Use Ultrathin Ribbons of Silicon Derived from Bulk Wafers," *Appl. Phys. Lett.* 88:213101.
Madou, M. (1997) "Etch-Stop Techniques," In; *Fundamentals of Microfabrication*, CRC Press, New York, pp. 193-199.
Maikap et al. (2004) "Mechanically Strained-Si NMOSFETs," *IEEE Electron. Dev. Lett.* 25:40-42.
Maldovan et al. (2004) "Diamond-Structured Photonic Crystals," *Nature Materials* 3:593-600.
Mandlik et al. (Aug. 2006) "Fully Elastic Interconnects on Nanopatterned Elastomeric Substrates," *IEEE Electron Dev. Lett.* 27(8):650-652.
Manna et al. (Web Release May 25, 2003) "Controlled Growth of Tetrapod-Branched Inorganic Nanocrystals," *Nat. Mater.* 2:382-385.
Markovich et al. (1999) "Architectonic Quantum Dot Solids," *Acc. Chem. Res.* 32:415-423.
Marquette et al. (2004) "Conducting Elastomer Surface Texturing: A Path to Electrode Spotting Application to the Biochip Production," *Biosens. Bioelectron.* 20:197-203.
Martensson et al. (2004) "Nanowire Arrays Defined by Nanoimprint Lithography," *Nano Lett.* 4:699-702.
Martin, C.R. (1995) "Template Synthesis of Electronically Conductive Polymer Nanostructures," *Acc. Chem. Res.* 28:61-68.
Mas-Torrent et al. (2006) "Large Photoresponsivity in High-Mobility Single-Crystal Organic Field-Effect Phototransistors," *ChemPhysChem* 7:86-88.
Masuda et al. (2000) "Fabrication of Ordered Diamonds/Metal Nanocomposite Structures," *Chem. Lett.* 10:1112-1113.
Matsunaga et al. (2003) "An Improved GaAs Device Model for the Simulation of Analog Integrated Circuit," *IEEE Trans. Elect. Dev.* 50:1194-1199.
McAlpine et al. (2003) "High-Performance Nanowire Electronics and Photonics on Glass and Plastic Substrates," *Nano Lett.* 3:1531-1535.
McAlpine et al. (2005) "High-Performance Nanowire Electronics and Photonics and Nanoscale Patterning on Flexible Plastic Substrates," *Proc. IEEE* 93:1357-1363.
McCaldin et al. (1971) "Diffusivity and Solubility of Si in the Al Metallization of Integrated Circuits," *Appl. Phys. Lett.* 19:524-517.
Mehring C. et al. (2003) Inference of hand movements from local field potentials in monkey motor cortex. *Nature Neurosci.* 6, 1253-1254.
Meisel et al. (2004) "Three-Dimensional Photonic Crystals by Holographic Lithography Using the Umbrella Configuration: Symmetries and Complete Photonic Band Gaps," *Phys. Rev. B.* 70:165101:1-10.
Meitl et al. (2004) "Solution Casting and Transfer Printing Single-Walled Carbon Nanotube Films," *Nano Lett.* 4:1643-1647.
Meitl et al. (2006) "Transfer Printing by Kinetic Control of Adhesion to an Elastomeric Stamp," *Nat. Mater.* 5:33-38.

(56) References Cited

OTHER PUBLICATIONS

Meitl et al. (Web Release Feb. 22, 2007) "Stress Focusing for Controlled Fracture in Microelectromechanical Systems," *Appl. Phys. Lett.* 90:083110.
Melosh et al. (2003) "Ultrahigh-Density Nanowire Lattices and Circuits," *Science* 300:112-115.
Menard et al. (2004) "A Printable Form of Silicon for High Performance Thin Film Transistors on Plastic Substrates," *Appl. Phys. Lett.* 84:5398-5400.
Menard et al. (2004) "Improved Surface Chemistries, Thin Film Deposition Techniques, and Stamp Designs for Nanotransfer Printing," *Langmuir* 20:6871-6878.
Menard et al. (2004) "High-Performance n- and p-Type Single-Crystal Organic Transistors with Free-Space Gate Dielectrics," *Adv. Mat.* 16:2097-2101.
Menard et al. (2005) "Bendable Single Crystal Silicon Thin Film Transistors Formed by Printing on Plastic Substrates," *Appl. Phys. Lett.* 86(093507):1-3.
Menard et al. (2007) "Micro- and Nanopatterning Techniques for Organic Electronic and Optoelectronic Systems, *Chem. Rev.* 107:1117-1160.
Miao et al. (2003) "Micromachining of Three-Dimensional GaAs Membrane Structures Using High-Energy Nitrogen Implantation," *J. Micromech. Microeng.* 13:35-39.
Michalske et al. (1985) "Closure and Repropagation of Healed Cracks in Silicate Glass," *J. Am. Ceram. Soc.* 68:586-590.
Michel et al. (2001) Printing Meets Lithography: Soft Approaches to High-Resolution Printing, *IBM J. Res. Dev.* 45:697-719.
Miller et al. (2002) "Direct Printing of Polymer Microstructures on Flat and Spherical Surfaces Using a Letterpress Technique," *J. Vac. Sci. Technol. B* 20(6):2320-2327.
Milliron et al. (2004) "Colloidal Nanocrystal Heterostructures with Linear and Branched Topology," *Nature* 430:190-195.
Min, G. (Apr. 4, 2003) "Plastic Electronics and Their Packaging Technologies," *Syn. Metals*. 135:141-143.
Minev et al. (2010) "Impedance Spectroscopy on Stretchable Microelectrode Arrays," *Appl. Phys. Lett.* 97:043707.
Mirkin et al. (2001) "Emerging Methods for Micro- and Nanofabrication," *MRS Bulletin* 26(7):506-507.
Misewich et al. (May 2, 2003) "Electronically Induced Optical Emission from a Carbon Nanotube FET," *Science* 300:783-786.
Mishra et al. (2002) "AlGaN/GaN HEMTs—an Overview of Device Operation and Applications," *Proc. IEEE* 90:1022-1031.
Mitzi et al. (2004) "High-Mobility Ultrathin Semiconducting Films Prepared by Spin Coating," *Nature* 428:299-303.
Moon et al. (2002) "Ink-Jet Printing of Binders for Ceramic Components," *J. Am. Ceram. Soc.* 85:755-762.
Moore et al. (Sep. 9, 2003) "Individually Suspended Single-Walled Carbon Nanotubes in Various Surfactants," *Nano Lett.* 3(10):1379-1382.
Morales et al. (Jan. 9, 1998) "A Laser Ablation Method for the Synthesis of Crystalline Semiconductor Nanowires," *Science* 279:208-211.
Morent et al. (2007) "Adhesion Enhancement by a Dielectric Barrier Discharge of PDMS used for Flexible and Stretchable Electronics," *J. Phys. D. Appl. Phys.* 40:7392-7401.
Mori et al. (1978) "A New Etching Solution System, $H_3PO_4$—$H_2O_2$—$H_2O$, for GaAs and Its Kinetics," *J. Electrochem. Soc.* 125:1510-1514.
Morkoc et al. (1995) "High-Luminosity Blue and Blue-Green Gallium Nitride Light-Emitting Diodes," *Science* 267:51-55.
Morkved et al. (1994) "Mesoscopic Self-Assembly of Gold Islands on Diblock-Copolymer Films," *Appl. Phys. Lett.* 64:422-424.
Morra et al. (1990) "On the Aging of Oxygen Plasma-Treated Polydimthylsiloxane Surfaces," *J. Colloid Interface Sci.* 137:11-24.
Murakami et al. (2005) "Polarization Dependence of the Optical Absorption of Single-Walled Carbon Nanotubes," *Phys. Rev. Lett.*, 94, 087402.
Murphy et al. (2008) "Modification of Silk Fibroin Using Diazonium Coupling Chemistry and the Effects on hMSC Proliferation and Differentiation," *Biomaterials* 29:2829-2838.
Namazu et al. (2000) "Evaluation of Size Effect on Mechanical Properties of Single Crystal Silicon by Nanoscale Bending Test Using AFM," *J. MEMS* 9:450-459.
Nath et al. (2002) "Nanotubes of the Disulfides of Groups 4 and 5 Metals," *Pure Appl. Chem.* 74(9):1545-1552.
Nathan et al. (2000) "Amorphous Silicon Detector and Thin Film Transistor Technology for Large-Area Imaging of X-Rays," *Microelectron J.* 31:883-891.
Nathan et al. (2002) "Amorphous Silicon Technology for Large Area Digital X-Ray and Optical Imaging," *Microelectronics Reliability* 42:735-746.
Newman et al. (2004) "Introduction to Organic Thin Film Transistors and Design of n-Channel Organic Semiconductors," *Chem. Mater.* 16:4436-4451.
Nirmal et al. (1999) "Luminescence Photophysics in Semiconductor Nanocrystals," *Acc. Chem. Res.* 32:407-414.
Noda et al. (1996) "New Realization Method for Three-Dimensional Photonic Crystal in Optical Wavelength Region," *Jpn. J. Appl. Phys.* 35:L909-L912.
Nomura et al. (2004) "Room-Temperature Fabrication of Transparent Flexible Thin-Film Transistors Using Oxide Semiconductors," *Nature* 432:488-492.
Notice of Reasons for Rejection corresponding to Japanese Patent Application No. P2006-165159, Dispatched Apr. 24, 2012—includes English translation.
Notice of Reasons for Rejection corresponding to Japanese Patent Application No. P2008-514820, Dispatched May 8, 2012—includes English translation.
Notice of Reasons for Rejection corresponding to Japanese Patent Application No. P2009-546361, Dispatched Jul. 3, 2012—includes English translation.
Novoselov et al. (Oct. 22, 2004) "Electric Field Effect in Atomically Thin Carbon Films," *Science* 306:666-669.
O'Connell et al. (Jul. 26, 2002) "Bang Gap Fluorescence from Individual Single-Walled Carbon Nanotubes," *Science* 297:593-596.
O'Riordan et al. (2004) "Field Configured Assembly: Programmed Manipulation and Self-Assembly at the Mesoscale," *Nano Lett.* 4:761-765.
Odom et al. (2002) "Improved Pattern Transfer in Soft Lithography Using Composite Stamps," *Langmuir* 18(13):5314-5320.
Office Action and Response, Corresponding to Malaysian Patent Publication No. PI 20052553, Mailed Mar. 13, 2009 and Dec. 8, 2009.
Office Action and Response, Corresponding to U.S. Appl. No. 11/423,287, Mailed Feb. 13, 2008.
Office Action and Response, Corresponding to U.S. Appl. No. 11/421,654, Mailed Sep. 29, 2009.
Office Action and Response, Corresponding to U.S. Appl. No. 11/858,788, Mailed Beginning Jan. 28, 2011.
Office Action Corresponding to Chinese Patent Application No. 200780049982.1, Issued May 12, 2010.
Office action Corresponding to Korean Patent Application No. 10-2006-7010632, Completed Nov. 22, 2007.
Office Action Corresponding to U.S. Appl. No. 11/851,182, Mailed Apr. 1, 2010.
Office Action, Corresponding to Chinese Patent Application No. 200780048002.6, Issued Apr. 13, 2010.
Office Action, Corresponding to Chinese Patent Application No. 200580013574.1, Issued May 11, 2010.
Office Action, Corresponding to Taiwan Patent Application No. 095121212, Issued May 7, 2010.
Office Action, Corresponding to U.S. Appl. No. 12/513,387, Mailed May 10, 2011.
Office Actions and Responses, Corresponding to U.S. Appl. No. 11/145,542, Mailed between Apr. 5, 2007 and Dec. 23, 2008.
Office Actions and Responses, Corresponding to U.S. Appl. No. 11/981,380, Mailed Beginning Sep. 23, 2010.
Office Actions Corresponding to Chinese Patent Application No. 200480035731.4, Issued Mar. 27, 2009 and Dec. 3, 2010.

(56) References Cited

OTHER PUBLICATIONS

Office Actions, Corresponding to Chinese Patent Application No. 200580018159.5, Issued Jan. 23, 2009 and Feb. 12, 2010.
Ohzono et al. (2004) "Ordering of Microwrinkle Patterns by Compressive Strain," *Phys. Rev. B* 69(13):132202.
Ohzono et al. (Web Release Jul. 7, 2005) "Geometry-Dependent Stripe Rearrangement Processes Induced by Strain on Preordered Microwrinkle Patterns," *Langmuir* 21(16):7230-7237.
Omenetto et al. (2008) "A New Route for Silk," *Nature Photon.* 2:641-643.
Ong et al. (2004) "High-Performance Semiconducting Polythiophenes for Organic Thin-Film Transistors," *J. Am. Chem. Soc.* 126:3378-3379.
Ong et al. (2005) "Design of High-Performance Regioregular Polythiophenes for Organic Thin-Film Transistors," *Proc. IEEE* 93:1412-1419.
Origin Energy (May 2004) "Fact Sheet—Sliver Cells," www.orginenergy.com.au/sliver.
Ouyang et al. (2002) "High-Performance, Flexible Polymer Light-Emitting Diodes Fabricated by a Continuous Polymer Coating Process," *Adv. Mat.* 14:915-918.
Ouyang et al. (2008) "High Frequency Properties of Electro-Textiles for Wearable Antenna Applications," *IEEE Trans. Antennas Propag.* 56(2):381-389.
Ouyang et al. (Web Release Mar. 20, 2000) "Conversion of Some Siloxane Polymers to Silicon Oxide by UV/Ozone Photochemical Processes," *Chem. Mater.* 12(6):1591-1596.
Overholt et al. (2005) "Photodynamic Therapy for Esophageal Cancer using a 180° Windowed Esophageal Balloon," *Lasers in Surg. Med.* 14:27-33.
Pan et al. (2001) "Nanobelts of Semiconducting Oxides," *Science* 291:1947-1949.
Panev et al. (2003) "Sharp Excitation from Single InAs Quantum Dots in GaAs Nanowires," *Appl. Phys. Lett.* 83:2238-2240.
Pardo et al. (2000) "Application of Screen Printing in the Fabrication of Organic Light-Emitting Devices," *Adv. Mater.* 12(17):1249-1252.
Park et al. (1997) "Block Copolymer Lithography: Periodic Arrays of ~$10^{11}$ Holes in 1 Square Centimeter," *Science* 276:1401-1404.
Park et al. (1998) "Fabrication of Three-Dimensional Macroporous Membranes with Assemblies of Microspheres as Templates," *Chem. Mater.* 10:1745-1747.
Park et al. (Aug. 2009) "Printed Assemblies of Inorganic Light-Emitting Diodes for Deformable and Semitransparent Displays," *Science* 325:977-981.
Park et al. (Web Release Feb. 22, 2009) "Biodegradable Luminescent Porous Silicon Nanoparticles for in Vivo Applications," *Nature Mater.* 8:331-336.
Parker et al. (2009) "Biocompatible Silk Printed Optical Waveguides," *Adv. Mater.* 21:2411-2415.
Patolsky et al. (2006) "Stimulation, and Inhibition of Neuronal Signals with High-Density Nanowire Transistor Arrays," *Science* 313:1100-1104.
Patton et al. (Mar. 1998) "Effect of Diamond like Carbon Coating and Surface Topography on the Performance of Metal Evaporated Magnetic Tapes," *IEEE Trans Magn.* 34(2):575-587.
Paul et al. (Apr. 2003) "Patterning Spherical Surfaces at the Two Hundred Nanometer Scale Using Soft Lithography," *Adv. Func. Mater.* 13(4):259-263.
Pearton et al. (1999) "GaN: Processing, Defects, and Devices," *J. Appl. Phys.* 86:1-78.
Peng et al. (Mar. 2, 2000) "Shape Control of CdSe Nanocrystals," *Nature* 404:59-61.
Perry et al. (2008) "Nano- and Micropatterning of Optically Transparent, Mechanically Robust, Biocompatible Silk Fibroin Films," *Adv. Mater.* 20:3070-3072.
Piazza et al. (2005) "Protective Diamond-Like Carbon Coatings for Future Optical Storage Disks," *Diamond Relat. Mater.* 14:994-999.

Pimparkar et al. (Feb. 2007) "Current-Voltage Characteristics of Long-Channel Nanobundle Thin-Film Transistors: A 'Bottom-Up' Perspective," *IEEE Electron Dev. Lett.* 28(2):157-160.
Podzorov et al. (2005) "Hall Effect in the Accumulation Layers on the Surface of Organic Semiconductors," *Phys. Rev. lett.* 95:226601.
Pushpa et al. (2002) "Stars and Stripes. Nanoscale Misfit Dislocation Patterns on Surfaces," *Pure Appl. Chem.* 74(9):1663-1671.
Qian et al. (2006) "Scaling Effects of Wet Adhesion in Biological Attachment Systems," *Acta Biomaterialia* 2:51-58.
Quake et al (2000) "From Micro- to Nanofabrication with Soft Materials," *Science* 290:1536-1540.
Radtke et al. (Feb. 5, 2007) "Laser-Lithography on Non-Planar Surfaces," *Opt. Exp.* 15(3):1167-1174.
Raman et al. (1989) "Study of Mesa Undercuts Produced in GaAs with $H_3PO_4$-Based Etchants," *J. Electrochem. Soc.* 136:2405-2410.
Randall et al. (2005) "Permeation-driven flow in poly(dimethylsiloxane) microfluidic devices," *Proc. Nat. Acad. Sci. USA* 102(31):10813-10818.
Rao et al. (2003) "Large-scale assembly of carbon nanotubes," *Nature*, 425:36-37.
Razavi et al. (2009) "Three Dimensional Nanopillar Array Photovoltaics on Low Cost and Flexible Substrates," *Nature Materials* 8:648-653.
Razeghi et al. (1994) "High-Power Laser Diode Based on InGaAsP Alloys," *Nature* 369:631-633.
Razouk et al. (Sep. 1979) "Dependence of Interface State Density on Silicon Thermal Oxidation Process Variables," *J. Electrochem. Soc.* 126(9):1573-1581.
Reuss et al. (Jul. 2005) "Macroelectronics: Perspectives on Technology and Applications," *Proc. IEEE* 93(7):1239-1256.
Reuss et al. (Jun. 2006) "Macroelectronics," *MRS Bull.* 31:447-454.
Ribas et al. (1998) "Bulk Micromachining Characterization of 1.2 μm HEMT MMIC Technology for GaAs MEMS Design," *Mater. Sci. Eng. B* 51:267-273.
Ridley et al. (1999) "All-Inorganic Field Effect Transistors Fabricated by Printing," *Science* 286:746-749.
Roberts et al. (1979) "Looking at Rubber Adhesion," *Rubber Chem. Technol.* 52:23-42.
Roberts et al. (Mar. 2006) "Elastically Relaxed Free-Standing Strained-Silicon Nanomembranes," *Nat. Mater.* 5:388-393.
Robinson et al. (1983) "GaAs Readied for High-Speed Microcircuits," *Science* 219:275-277.
Roelkens et al. (Dec. 2005) "Integration of InP/InGaAsP Photodetectors onto Silicon-on-Insulator Waveguide Circuits," *Optics Express* 13(25):10102-10108.
Rogers et al. (1997) "Using an Elastomeric Phase Mask for Sub-100 nm Photolithography in the Optical Near Field," *Appl. Phys. Lett.* 70:2658-2660.
Rogers et al. (1998) "Generating~90 Nanometer Features Using Near Field Contact Mode Photolithography with an Elastomeric Phase Mask," *J. Vac. Sci. Technol.* 16(1):59-68.
Rogers et al. (1998) "Quantifying Distortions in Soft Lithography," *J. Vac. Sci. Technol.* 16:88-97.
Rogers et al. (1998) "Using Printing and Molding Techniques to Produce Distributed Feedback and Bragg Reflector Resonators for Plastic Lasers," *Appl. Phys. Lett.* 73:1766-1768.
Rogers et al. (1999) "Printing Process Suitable for Reel-to-Reel Production of High-Performance Organic Transistors and Circuits, *Adv. Mater.* 11(9):741-745.
Rogers et al. (2002) "Paper-Like Electronic Displays: Large-Area Rubber-Stamped Plastic Sheets of Electronics and Microencapsulated Electrophoretic Inks," *Proc. Nat. Acad. Sci. USA* 98:4835-4840.
Rogers et al. (2002) "Printed Plastic Electronics and Paperlike Displays," *J. Polym. Sci. Part A. Polym. Chem.* 40:3327-3334.
Rogers et al. (Mar. 2000) "Organic Smart Pixels and Complementary Inverter Circuits Formed on Plastic Substrates by Casting and Rubber Stamping," *IEEE Electron Dev. Lett.* 21(3):100-103.
Rogers, J.A. (2001) "Rubber Stamping for Plastic Electronics and Fiber Optics," *MRS Bulletin* 26(7):530-534.
Rogers, J.A. (2001) "Toward Paperlike Displays," *Science* 291:1502-1503.

(56) References Cited

OTHER PUBLICATIONS

Rosenblatt et al. (2002) "High Performance Electrolyte Gated Carbon Nanotube Transistors," *Nano Lett.* 2(8):869-872.
Rotkin et al. (2003) "Universal Description of Channel Conductivity for Nanotube and Nanowire Transistors," *Appl. Phys. Lett.* 83:1623-1625.
Roundy et al. (2003) "Photonic Crystal Structure with Square Symmetry within Each Layer and a Three-Dimensional Band Gap," *Appl. Phys Lett.* 82:3835-3837.
Rubehn et al. (2009) "A MEMS based Flexible Multichannel ECoG-Electrode Array," *J. Neural Eng.* 6:036003.
Ruchehoeft et al. (2000) "Optimal Strategy for Controlling Linewidth on Spherical Focal Surface Arrays," *J. Vac. Sci. Technol. B* 18(6):3185-3189.
Ryu et al. (2009) "Human Cortical Prostheses: Lost in Translation?" *Neurosurg Focus* 27(1):E5.
Samuelson et al. (2004) "Semiconductor Nanowires for Novel One-Dimensional Devices," *Physica E* 21:560-567.
Sangwal et al. (1997) "Nature of multilayer steps on the {100} cleavage planes of MgO single crystals," *Surf. Sci.*, 383:78-87.
Santin et al. (1999) "In vitro Evaluation of the Inflammatory Potential of the Silk Fibroin," *J. Biomed. Mater. Res.* 46:382-389.
Sanyal et al. (2002) "Morphology of Nanostructured Materials," *Pure Appl. Chem.* 74(9):1553-1570.
Sazonov et al. (2005) "Low-Temperature Materials and Thin-Film Transistors for Flexible Electronics," *Proc. IEEE* 93:1420-1428.
Scherlag et al. (1969) "Catheter Technique for Recording His Bundle Activity in Man," *Circulation* 39:13-18.
Schermer et al. (Web Release Apr. 28, 2005) "Thin-Film GaAs Epitaxial Lift-Off Solar Cells for Space Applications," *Prog. Photovoltaics: Res. Applic.* 13:587-596.
Schermer et al. (Web Release Jan. 19, 2006) "Photon Confinement in High-Efficiency, Thin-Film III-V Solar Cells Obtained by Epitaxial Lift-Off," *Thin Solid Films* 511-512:645-653.
Schindl et al. (2003) "Direct Stimulatory Effect of Low-Intensity 670-nm Laser Irradiation on Human Endothelial Cell Proliferation," *Br. J. Dermatol.* 148:334-336.
Schlegel et al. (2002) "Structures of quartz (1010)- and (1011)-water interfaces determined by X-ray reflectivity and atomic force microscopy of natural growth surfaces," *Geochim. Cosmochim. Acta*, vol. 66, No. 17, pp. 3037-3054.
Schmid et al. (2003) "Preparation of Metallic Films on Elastomeric Stamps and Their Application on Contact Processing and Contact Printing," *Adv. Funct. Mater.* 13:145-153.
Schmid et al. (Mar. 25, 2000) "Siloxane Polymers for High-Resolution, High-Accuracy Soft Lithography," *Macromolecules* 33(8):3042-3049.
Schmid et al. (May 11, 1998) "Light-Coupling Masks for Lensless, Sub-wavelength Optical Lithography," *Appl. Phys. Lett.* 72(19):2379-2381.
Schmidt et al. (Mar. 8, 2001) "Thin Solid Films Roll up into Nanotubes," *Nature* 410:168.
Schnable et al. (1969) "Aluminum Metallization; Advantages and Limitations for Integrated Circuit Applications," *IEEE* 57:1570-1580.
Schneider et al. (2008) "Mechanical Properties of Silicones for MEMS," *J. Micromech. Microeng.* 18:065008.
Schon et al. (1995) "Ambipolar Pentacene Field-Effect Transistors and Inverters," *Science* 287:1022-1023.
Scorzoni et al. (Oct. 4, 2004) "On the Relationship Between the Temperature Coefficient of Resistance and the Thermal Conductance of Integrated Metal Resistors," *Sens Actuators A* 116(1):137-144.
Search and Examination Report, Corresponding to Singapore Application No. 200904208-6, Mailed Dec. 17, 2010.
Search Report and Examination Report Corresponding to Singapore Patent Application No. 200901178-4, Completed Mar. 13, 2010.
Search Report and First Written Opinion, Corresponding to Singapore Patent Application No. 200902530-5, Dated Sep. 23, 2010.
Search Report and Written Opinion, Corresponding to Singapore Application No. 200901451-5, Mailed Dec. 22, 2010.
Search Report Corresponding to Singapore Patent Application No. SG 200607372-0, Mailer Oct. 17, 2007.
Search Report Corresponding to Taiwanese Patent Application No. 095121212, Completed Oct. 8, 2010.
Search Report, Corresponding to Republic of China (Taiwan) Patent Application No. 094118507, Dated Feb. 24, 2007.
Seidel et al. (2004) "High-Current Nanotube Transistors," *Nano Lett.*, vol. 4, No. 5, pp. 831-834.
Sekitani et al. (2005) "Bending Experiment on Pentacene Field-Effect Transistors on Plastic Films," *Appl. Phys. Lett.* 86:073511.
Sekitani et al. (2009) "Stretchable Active-Matrix Organic Light-Emitting Diode Display Using Printable Elastic Conductors," *Nature Mater.* 8:494-499.
Sekitani et al. (Sep. 12, 2008) "A Rubberlike Stretchable Active Matrix Using Elastic Conductors," *Science* 321:1468-1472.
Sen et al. (2002) "Nonequilibrium Processes for Generating Silicon Nanostructures in Single-Crystalline Silicon," *Pure Appl. Chem.* 74(9):1631-1641.
Serikawa et al. (May 1, 2000) "High-Mobility Poly-Si Thin Film Transistors Fabricated on Stainless-Steel Foils by Low-Temperature Processes Using Sputter-Depositions," *Jpn. J. Appl. Phys.* 39:L393-L395.
Servanti et al. (2005) "Functional Pixel Circuits for Elastic AMOLED displays," *Proc. IEEE* 93:1257-1264.
Service, R.F. (Aug. 15, 2003) "Electronic Textiles Charge Ahead," *Science* 301:909-911.
Shan et al. (2004) "From Si Source Gas Directly to Positioned, Electrically Contained Si Nanowires: The Self-Assembling 'Grow-in-Place' Approach," *Nano Lett.* 4(11):2085-2089.
Sharp et al. (2003) "Holographic Photonic Crystals with Diamond Symmetry," *Phys. Rev. B* 68:205102/1-205102/6.
Sheraw et al. (2002) "Organic Thin-Film Transistor-Driven Polymer-Dispersed Liquid Crystal Displays on Flexible Polymeric Substrates," *Appl. Phys. Lett.* 80:1088-1090.
Shetty et al. (2005) "Formation and Characterization of Silicon Films on Flexible Polymer Substrates," *Mater. Lett.* 59:872-875.
Shi et al. (2001) "Free-Standing Single Crystal Silicon Nanoribbons," *J. Am. Chem. Soc.* 123(44):11095-11096.
Shi et al. (Sep. 2000) "Synthesis of Large Areas of Highly Oriented, Very Long Silicon Nanowires," *Adv. Mater.* 12(18):1343-1345.
Shin et al. (2003) "PDMS-Based Micro PCR Chip with Parylene Coating," *J. Micromech. Microeng.* 13:768-774.
Shtein et al. (Oct. 15, 2004) "Direct Mask-Free Patterning of Molecular Organic Semiconductors Using Organic Vapor Jet Printing," *J. Appl. Phys.* 96(8):4500-4507.
Shull et al. (1998) "Axisymmetric Adhesion Tests of Soft Materials," *Macromol. Chem. Phys.* 199:489-511.
Siegel et al. (2009) "lightweight, Foldable Thermochromic Displays on Paper," *Lab Chip* 9:2775-2781.
Siegel et al. (2010) "Foldable Printed Circuit Boards on Paper Substrates," *Adv. Funct. Mater.* 20:28-35.
Siegel et al. (Web Release Feb. 7, 2007) "Microsolidics: Fabrication of Three-Dimensional Metallic Microstructures in Poly(dimethylsiloxane)," *Adv. Mater.* 19(5):727-733.
Sim et al. (1993) "An Analytical Back-Gate Bias Effect Model for Ultrathin SOI CMOS Devices," *IEEE Trans. Elec. Dev.* 40:755-765.
Sirringhaus et al. (2003) "Inkjet Printing of Functional Materials," *MRS Bull.* 28:802-806.
Sirringhaus et al. (Dec. 15, 2000) "High-Resolution Inkjet Printing of All-Polymer Transistor Circuits," *Science* 290:2123-2126.
Sirringhaus, H. (2005) "Device Physics of Solution-Processed Organic Field-Effect Transistors," *Adv. Mater.* 17:2411-2425.
Smay et al. (2002) "Colloidal Inks for Directed Assembly of 3-D Periodic Structures," *Langmuir* 18:5429-5437.
Smith et al. (2000) "Electric-Field Assisted Assembly and Alignment of Metallic Nanowires," *Appl. Phys. Lett.* 77(9):1399-1401.
Snow et al. (2003) "Random networks of carbon nanotubes as an electronic material," *Appl. Phys. Lett.*, vol. 82, No. 13, pp. 2145-2147.

(56) References Cited

OTHER PUBLICATIONS

Snow et al. (2005) "High-mobility carbon-nanotube transistors on a polymeric substrate," *Appl. Phys. Lett.*, 86, 033105.
So et al. (2008) Organic Light-Emitting Devices for Solid-State Lighting, *MRS Bull.* 33:663-669.
Sofia et al. (2001) "Functionalized Silk-Based Biomaterials for Bone Formation," *J. Biomed. Mater. Res.* 54:139-148.
Someya et al. (2005) "Conformable, Flexible, Large-Area Networks of Pressure and Thermal Sensors with Organic Transistor Active Matrixes," *Proc. Nat. Acad. Sci. USA* 102:12321-12325.
Someya et al. (2005) "Integration of Organic FETs with Organic Photodiodes for a Large Area, Flexible, and Lightweight Sheet Image Scanners," *IEEE Trans. Electron Devices* 52:2502-2511.
Someya et al. (Jul. 6, 2004) "A Large-Area, Flexible, Pressure Sensor Matrix with Organic Field-Effect Transistors for Artificial Skin Applications," *Proc. Nat. Acad. Sci. USA* 101(27):9966-9970.
Soole et al. (Mar. 1991) "InGaAs Metal-Semiconductor-Metal Photodetectors for Long Wavelength Optical Communications," *IEEE J. Quantum Electron.* 27(3):737-752.
Soong et al. (1984) "Adverse Reactions to Virgin Silk Sutures in Cataract Surgery," *Ophthalmology* 91:479-483.
Srinivasan et al. (Web Release Mar. 26, 2007) "Piezoelectric/Ultrananocrystalline Diamond Heterostructures for High-Performance Multifunctional Micro/Nanoelectromechanical Systems," *Appl. Phys. Lett.* 90:134101.
Stafford et al. (Aug. 2004) "A Buckling-Based Metrology for Measuring the Elastic Moduli of Polymeric Thin Films," *Nature Mater.* 3:545-550.
Star et al. (2004) "Nanotube Optoelectric Memory Devices," *Nano Lett.*, vol. 4, No. 9, pp. 1587-1591.
Storm et al. (Aug. 2003) "Fabrication of Solid-State Nanopores with Single-Nanometre Precision," *Nat. Mater.* 2:537-540.
Streetman et al. (2000) "Intrinsic Material," In; *Solid State Electronic Devices*, 5$^{th}$ Ed., Prentice Hall; Upper Saddle River, NJ; pp. 74-75.
Strukov et al. (2005) "CMOL FPGA: A Reconfigurable Architecture for Hybrid Digital Circuits with Two-Terminal Nanodevices," *Nanotechnology* 16:888-900.
Su et al. (2000) "Lattice-Oriented Growth of Single-Walled Carbon Nanotubes," *J. Phys. Chem. B* 104(28):6505-6508.
Sum et al. (2009) "Near-Infrared Spectroscopy for the Detection of Lipid Core Coronary Plaques," *Curr. Cardiovasc. Imag. Rep.* 2:307-315.
Sumant et al. (Apr. 2005) "Toward the Ultimate Tribological Interface: Surface Chemistry and Nanotribology of Ultrananocrystalline Diamond," *Adv. Mater.* 17(8):1039-1045.
Sun et al. (2004) "Fabricating Semiconductor Nano/Microwires and Transfer Printing Ordered Arrays of Them onto Plastic Substrates," *Nano Lett.* 4:1953-1959.
Sun et al. (2005) "Advances in Organic Field-Effect Transistors," *J. Mater. Chem.* 15:53-65.
Sun et al. (2005) "Bendable GaAs Metal-Semiconductor Field-Effect Transistors Formed with Printed GaAs Wire Arrays on Plastic Substrates," *Appl. Phys. Lett.* 87:083501.
Sun et al. (2005) "Photolithographic Route to the Fabrication of Micro/Nanowires of III-V Semiconductors," *Adv. Fuct. Mater.* 15:30-40.
Sun et al. (2007) "Controlled Buckling of Semiconductor Nanoribbons for Stretchable Electronics," *Nat. Nanotechnol.* 1:201-207.
Sun et al. (2007) "Structural Forms of Single Crystal Semiconductor Nanoribbons for High-Performance Stretchable Electronics," *J. Mater Chem.* 17:832-840.
Sun et al. (Aug. 2007) "Inorganic Semiconductors for Flexible Electronics," *Adv. Mater.* 19(15):1897-1916.
Sun et al. (Nov. 2006) "Buckled and Wavy Ribbons of GaAs for High-Performance Electronics on Elastomeric Substrates," *Adv. Mater.* 18(21):2857-2862.
Sundar et al. (2004) "Elastomeric Transistor Stamps: Reversible Probing of Charge Transport in Organic Crystals," *Science* 303:1644-1646.
Suo et al. (Feb. 22, 1999) "Mechanics of Rollable and Foldable Film-on-Foil Electronics," *Appl. Phys. Lett.* 74(8):1177-1179.
Supplementary European Search Report dated Jun. 15, 2012, corresponding to European Patent Application No. 09 71 6695.
Supplementary European Search Report, Corresponding to European Application No. 04 81 2651, Completed Oct. 19, 2010.
Supplementary European Search Report, Corresponding to European Application No. 05 75 6327, Completed Sep. 25, 2009.
Swain et al. (2004) "Curved CCD Detector Devices and Arrays for Multi-Spectral Astrophysical Application and Terrestrial Stereo Panoramic Cameras," *Proc. SPIE* 5499:281-301.
Sze et al. (1985) *Semiconductor Devices, Physics and Technology*, 2$^{nd}$ ed., Wiley, New York, pp. 190-192.
Sze, S. (1985) *Semiconductor Devices: Physics and Technology*, New York: Wiley, pp. 428-467.
Sze, S. (1988) *VLSI Technology*, Mcgraw-Hill, 327-374, 566-611.
Sze, S. (1994) *Semiconductor Sensors*, John Wiley and Sons: New York, pp. 17-95.
Takamoto et al. (Jan. 20, 1997) "Over 30% Efficient InGaP/GaAs Tandem Solar Cells," *Appl. Phys. Lett.* 70(3):381-383.
Talapin et al. (Oct. 7, 2005) "PbSe Nanocrystal Solids for n- and p-Channel Thin Film Field-Effect Transistors," *Science* 310:86-89.
Tan et al. (Apr. 12, 2004) "Performance Enhancement of InGaN Light Emitting Diodes by Laser-Lift-off and Transfer from Sapphire to Copper Substrate," *Appl. Phys. Lett.* 84(15):2757-2759.
Tanase et al. (2002) "Magnetic Trapping and Self-Assembly of Multicomponent Nanowires," *J. Appl. Phys.* 91:8549-8551.
Tang et al. (2005) "One-Dimensional Assemblies of Nanoparticles: Preparation, Properties, and Promise," *Adv. Mater.* 17:951-962.
Tao et al. (2003) "Langmuir-Blodgett Silver Nanowire Monolayers for Molecular Sensing Using Surface-Enhanced Raman Spectroscopy," *Nano Lett.* 3:1229-1233.
Tate et al. (2000) "Anodization and Microcontact Printing on Electroless Silver: Solution-Based Fabrication Procedures for Low-Voltage Electronic Systems with Organic Active Components," *Langmuir* 16:6054-6060.
Teshima et al. (2001) "Room-Temperature Deposition of High-Purity Silicon Oxide Films by RF Plasma-Enhanced CVD," *Surf. Coat. Technol.* 146-147:451-456.
Theiss et al. (1998) "PolySilicon Thin Film Transistors Fabricated at 100° C. on a Flexible Plastic Substrate," *IEDM* 98:257-260.
Thornwood et al. (Oct. 1, 1990) "Utilizing Olptical Lithography in the Sub-Micron Dimensional Regime," *IBM Tech. Disc. Bull.* 33(5):187-188.
Timko et al. (2009) "Electrical Recording from Hearts with Flexible Nanowire Device Arrays," *Nano Lett.* 9:914-918.
Toader et al. (2004) "Photonic Band Gap Architectures for Holographic Lithography," *Phy. Rev. Lett.* 043905/1-043905/4.
Toader et al. (2004) "Photonic Band Gaps Based on Tetragonal Lattices of Slanted Pores," *Phys. Rev. Lett.* 90:233901/1-233901/4.
Tong (1999) *Semiconductor Wafer Bonding: Science and Technology*, John Wiley; New York, pp. 187-221.
Trau et al. (1997) "Microscopic Patterning of Orientated Mesoscopic Silica Through Guided Growth," *Nature* 390:674-676.
Trentler et al. (1995) "Solution-Liquid-Solid Growth of Crytalline III-V Semiconductors: An Analogy to Vapor-Liquid-Solid Growth," *Science* 270:1791-1794.
Tseng et al. (Web Release Dec. 19, 2003) "Monolithic Integration of Carbon Nanotube Devices with Silicon MOS Technology" *Nano Lett.* 4(1):123-127.
Ucjikoga, S. (2002) "Low-Temperature Polycrystalline Silicon Thin-Film Transistor Technologies for System-on-Glass Displays," *MRS Bull.* 27:881.
Urruchi et al. (2000) "Etching of DLC Films Using a Low Intensity Oxygen Plasma Jet," *Diamond Relat. Mater.* 9:685-688.
Vanhollenbeke et al. (2000) "Compliant Substrate Technology: Integration of Mismatched Materials for Opto-Electronic Applications," *Prog. Cryst. Growth Charact. Mater.* 41(1-4):1-55.
Velev et al. (1997) "Porous silica via colloidal crystallization," *Nature* 389:447-448.
Vepari et al. (Aug. Sep. 2007) "Silk as a Biomaterial," *Prog. Polym. Sci.* 32(8-9):991-1007.

(56) References Cited

OTHER PUBLICATIONS

Vilan et al. (2000) "Molecular Control Over Au/GaAs Diodes," *Nature* 404:166-168.
Vinck et al. (2003) "Increased Fibroblast Proliferation Induced by Light Emitting Diode and Low Power Laser Irradiation," *Lasers Med. Sci.* 18:95-99.
Viventi et al. (Mar. 2010) "A Conformal, Bio-Interfaced Class of Silicon Electronics for Mapping Cardiac Electrophysiology," *Sci. Trans. Med.* 2(24):24ra22.
Vlasov et al. (2001) "On-Chip Natural Assembly of Silicon Photonic Bandgap Crystals," *Nature* 414:289-293.
Voss, D. (2000) "Cheap and Cheerful Circuits," *Nature* 407:442-444.
Wagner et al. (2003) "Silicon for Thin-Film Transistors," *Thin Solid Films* 430:15-19.
Wagner et al. (2005) "Electronic Skin: Architecture and Components," *Physica E* 25:326-334.
Wagner et al. (Mar. 1, 1964) "Vapor-Liquid-Solid Mechanism of Single Crystal Growth," *Appl. Phys. Lett.* 4(5):89-90.
Waksman et al.(2008) "Photopoint Photodynamic Therapy Promotes Stabilization of Atherosclerotic Plaques and Inhibits Plaque Progression," *J. Am. Coll. Cardiol.* 52:1024-1032.
Wang et al. (2003) "A Solution-Phase, Precursor Route to Polycrystalline $SnO_2$ Nanowires that can be Used for Gas Sensing under Ambient Conditions," *J. Am. Chem. Soc.* 125:16176-16177.
Wang et al. (2005) "Electronically Selective Chemical Functionalization of Carbon Nanotubes: Correlation between Raman Spectral and Electrical Responses," *J. Am. Chem. Soc.*, 127:11460-11468.
Wang et al. (2005) "Oxidation Resistant Germanium Nanowires: Bulk Synthesis, Long Chain Alkanethiol Functionalization, and Langmuir-Blodgett Assembly," *J. Am. Chem. Soc.* 127(33):11871-11875.
Wang et al. (2006) "Direct Synthesis and Characterization of CdS Nanobelts," *Appl. Phys. Lett.* 89:033102.
Wang et al. (Aug.-Sep. 2008) "In Vivo Degradation of Three-Dimensional Silk Fibroin Scaffolds," *Biomaterials* 29(24-25):3415-3428.
Waxman et al. (2009) "In vivo Validation of a Catheter-Based Near-Infrared Spectroscopy System for Detection of Lipid Core Coronary Plaques: Initial Results of the Spectacl Study," *J. Am. Coll. Cardiol. Img.* 2:858-868.
Waxman, S. (2008) "Near-Infrared Spectroscopy for Plaque Characterization," *J. Interv. Cardiol.* 21:452-458.
Weber et al. (Jan. 2004) "A Novel Low-Cost, High Efficiency Micromachined Silicon Solar Cell," *IEEE Electron Device Lett.* 25(1):37-39.
Wen et al. (Web Release Dec. 4, 2004) "Controlled Growth of Large-Area, Uniform, Vertically Aligned Arrays of $\alpha$-$Fe_2O_3$ Nanobelts and Nanowires," *J. Phys. Chem. B* 109(1):215-220.
Whang et al. (2003) "Large-Scale Hierarchical Organization of Nanowire Arrays for Integrated Nanosystems," *Nano Lett.* 3(9):1255-1259.
Williams et al. (Oct. 2006) "Growth and Properties of Nanocrystalline Diamond Films," *Phys. Stat. Sol. A* 203(13):3375-3386.
Williams et al. (Web Release Jan. 23, 2006) "Comparison of the Growth and Properties of Ultrananocrystalline Diamond and Nanocrystalline Diamond," *Diamond Relat. Mater.* 15:654-658.
Willner et al. (2002) "Functional Nanoparticle Architectures for Senoric, Optoelectronic, and Bioelectronic Applications," *Pure Appl. Chem.* 74(9):1773-1783.
Wilson et al. (2006) "ECoG Factors Underlying Multimodal Control of a Brain-Computer Interface," *IEEE Trans. Neural Syst. Rehabil. Eng.* 14:246-250.
Wind et al. (May 20, 2002) "Vertical Scaling of Carbon Nanotube-Field-Effect Transitors Using Top Gate Electrodes," *Appl. Phys. Lett.* 80(20):3871-3819.
Wise et al. (Jul. 2008) "Microelectrodes, Microelectronics, and Implantable Neural Microsystems," *Proc. IEEE* 96(7):1184-1202.

Won et al. (2004) "Effect of Mechanical and Electrical Stresses on the Performance of an a-Si:H TFT on Plastic Substrate," *J. Electrochem. Soc.* 151:G167-G170.
Wong-Riley et al. (2005) "Photobiomodulation Directly Benefits Primary Neurons Functionally Inactivated by Toxins," *J. Biol. Chem.* 280:4761-4771.
Woodburn et al. (1996) "Phototherapy of Cancer and Atheromatous Plaque with Texaphyrins," *J. Clin. Laser Med. Surg.* 14:343-348.
Wu et al. (2001) "Amorphous Silicon Crystallization and Polysilicon Thin Film Transistors on $SiO_2$ Passivated Steel Foil Substrates," *Appl. Surf. Sci* 175-176:753-758.
Wu et al. (2001) "Direct Observation of Vapor-Liquid-Solid Nanowire Growth," *J. Am. Chem. Soc.* 123(13):3165-3166.
Wu et al. (2001) "Thermal Oxide of Polycrystalline Silicon on Steel Foil as a Thin-Film Transistor Gate Dielectric," *Appl. Phys. Lett.* 78:3729-2731.
Wu et al. (2002) "Block-by-Block Growth of Single-Crystalline Si/SiGe Superlattice Nanowires," *Nano Lett.* 2(2):83-86.
Wu et al. (2002) "Growth of Au-Catalyzed Ordered GaAs Nanowire Arrays by Molecular-Beam Epitaxy," *Appl. Phys. Lett.* 81:5177-5179.
Wu et al. (2002) "Inorganic Semiconductor Nanowires: Rational Growth, Assembly, and Novel Properties," *Chem. Eur. J.* 8(6):1261-1268.
Wu et al. (2003) "Growth, Branching, and Kinking of Molecular-Beam Epitaxial (110) GaAs Nanowires," *Appl. Phys. Lett.* 83:3368-3370.
Wu et al. (Jul. 1, 2004) "Single-Crystal Metallic Nanowires and Metal/Semiconductor Nanowire Heterostructures," *Nature* 430:61-65.
Wu et al. (Nov. 2002) "Complementary Metal-Oxide-Semiconductor Thin-Film Transistor Circuits from a High-Temperature Polycrystalline Silicon Process on Steel Foil Substrates," *IEEE Trans. Electr. Dev.* 49(11):1993-2000.
Xia (1998) "Soft Lithography" *Angew. Chem. Int. Ed.* 37:551-575.
Xia et al. (1996) "Shadowed Sputtering of Gold on V-Shaped Microtrenches Etched in Silicon and Applications in Microfabrication," *Adv. Mater.* 8(9):765-768.
Xia et al. (1998) "Soft Lithography," *Annu. Rev. Mater. Sci.* 28:153-184.
Xia et al. (1999) "Unconventional Methods for Fabricating and Patterning Nanostructures," *Chem. Rev.* 99:1823-1848.
Xia et al. (2003) "One-Dimensional Nanostructures: Synthesis, Characterization and Applications," *Adv. Mater.* 15:353-389.
Xia et al. (Jul. 19, 1996) "Complex Optical Surfaces Formed by Replica Molding Against Elastomeric Masters," *Science* 273:347-349.
Xiang et al. (Mar. 25, 2006) "Ge/Si Nanowire Heterostructures as High-Performance Field-Effect Transistors," *Nature* 441:489-493.
Xiao et al. (2003) "High-mobility thin-film transistors based on aligned carbon nanotubes," *Appl. Phys. Lett.*, vol. 83, No. 1, pp. 150-152.
Xie et al. (May 2003) "Polymer-Controlled Growth of $Sb_2Se_3$ Nanoribbons Via a Hydrothermal Process," *J. Cryst. Growth* 252(4):570-574.
Xin et al. (Jun. 2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," *Biomaterials* 26(16):3123-3129.
Yang et al. (1997) "Mesoporous Silica with Micrometer-Scale Designs," *Adv. Mater.* 9:811-814.
Yang et al. (2000) "Stability of Low-Temperature Amorphous Silicon Thin Film Transistors Formed on Glass and Transparent Plastic Substrates," *J. Vac. Sci. Technol. B* 18:683-689.
Yang et al. (2002) "Creating Periodic Three-Dimensional Structures by Multibeam Interface of Visible Laser," *Chem. Mater.* 14:2831-2833.
Yang et al. (Dec. 2007) "RFID Tag and RF Structures on a Paper Substrate Using Inkjet-Printing Technology," *IEEE Trans. Microw. Theory Tech.* 55(12):2894-2901.
Yang, P. (2005) "The Chemistry and Physics of Semiconductor Nanowires," *MRS Bull.* 30:85.

(56) References Cited

OTHER PUBLICATIONS

Yanina et al. (2002) "Terraces and ledges on (001) spinel surfaces," *Surf. Sci.*, 513:L402-L412.
Yao et al. (2008) "Seeing Molecules by Eye: Surface Plasmon Resonance Imaging at Visible Wavelengths with High Spatial Resolution and Submonolayer Sensitivity," *Angew. Chem.* 47:5013-5017.
Yao et al. (2010) "Functional Nanostructured Plasmonic Materials," *Adv. Mater.* 22:1102-1110.
Yao et al. (Mar. 2000) "High-Field Effect Electrical Transport in Single-Walled Carbon Nanotubes," *Phys. Rev. Lett.* 84(13):2941-2944.
Yeager et al. (Aug. 30, 2008) "Characterization of Flexible ECoG Electrode Arrays for Chronic Recording in Awake Rats," *J. Neurosci. Methods* 173(2):279-285.
Yeh et al. (1994) "Fluidic Self-Assembly for the Integration of GaAs Light Emitting Diodes on Si Substrates," *IEEE Photon. Techn. Lett.* 6:706-708.
Yin et al. (2000) "A Soft Lithography Approach to the Fabrication of Nanostructures of Single Crystalline Silicon with Well-Defined Dimensions and Shapes," *Adv. Mater.* 12:1426-1430.
Yin et al. (2005) "Colloidal Nanocrystal Synthesis and the Organic-Inorganic Interface," *Nature* 437:664-670.
Yoon et al. (2005) "Low-Voltage Organic Field-Effect Transistors and Inverters Enabled by Ultrathin Cross-Linked Polymers as Gate Dielectrics," *J. Am. Chem. Soc.* 127:10388-10395.
Yu et al. (2000) "Silicon Nanowires: Preparation, Device Fabrication, and Transport Properties," *J. Phys. Chem. B* 104(50):11864-11870.
Yu et al. (2003) "Solution-Liquid-Solid Growth of Soluble GaAs Nanowires," *Adv. Mater.* 15:416-419.
Yu et al. (2003) "Two-Versus Three-Dimensional Quantum Confinement in Indium Phosphide Wires and Dots," *Nat. Mater.* 2:517-520.
Yu et al. (2004) "The Yield Strength of Thin Copper Films on Kapton," *J. Appl. Phys.* 95:2991-2997.
Yuan et al. (2006) "High-Speed Strained-Single-Crystal-Silicon Thin-Film Transistors on Flexible Polymers," *J. Appl. Phys.* 100:013708.
Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.
Zakhidov et al. (1998) "Carbon Structure with Three-Dimensional Periodicity at Optical Wavelengths," *Science* 282:897-901.
Zaumseil et al. (2003) "Nanoscale Organic Transistors that use Source/Drain Electrodes Supported by High Resolution Rubber Stamps," *Appl. Phys. Lett.* 82(5):793-795.
Zaumseil et al. (2003) "Three-Dimensional and Multilayer Nanostructures Formed by Nanotransfer Printing," *Nano Lett.* 3(9):1223-1227.
Zhang et al. (2001) "Electric-field-directed growth of aligned single-walled carbon nanotubes," *Appl. Phys. Lett.*, vol. 79, No. 19. pp. 3155-3157.
Zhang et al. (2005) "Low-Temperature Growth and Photoluminescence Property of ZnS Nanoribbons," *J. Phys. Chem. B* 109(39):18352-18355.
Zhang et al. (2006) "Anomalous Coiling of SiGe/Si and SiGe/Si/Cr Helical Nanobelts," *Nano Lett.* 6(7):1311-1317.
Zhang et al. (Apr. 2003) "Oxide-Assisted Growth of Semiconducting Nanowires," *Adv. Mater.* 15(7-8):635-640.
Zhang et al. (Apr. 5, 2004) "Structure and Photoiluminescence of ZnSe Nanoribbons Grown by Metal Organic Chemical Vapor Deposition," *Appl. Phys. Lett.* 84(14):2641-2643.
Zhang et al. (Feb. 9, 2006) "Electronic Transport in Nanometre-Scale Silicon-on-Insulator Membranes," *Nature* 439:703-706.
Zhao et al. (Mar. 2007) "Improved Field Emission Properties from Metal-Coated Diamond Films," *Diamond Relat Mater.* 16(3):650-653.
Zheng et al. (1998) "Sudden Cardiac Death in the United States, 1989 to 1998," *Circulation* 104, 2158-2163 (1998.

Zheng et al. (2004) "Shape-and Solder-Directed Self-Assembly to Package Semiconductor Device Segments," *Appl. Phys. Lett.* 85:3635-3637.
Zheng et al. (Aug. 31, 2004) "Sequential Shape-and-Solder-Directed Self Assembly of Functional Microsystems," *Proc. Natl. Acad. Sci. USA* 101(35):12814-12817.
Zhou et al. (2002) "An Efficient Two-Photon-Generated Photoacid Applied to Positive-Tone 3D Microfabrication," *Science* 296:1106-1109.
Zhou et al. (2004) "p-Channel, n-Channel Thin Film Transistors and p-n Diodes Based on Single Wall Carbon Nanotube Networks," *Nano Lett.* 4:2031-2035.
Zhou et al. (2005) "Band Structure, Phonon Scattering, and the Performance Limit of Single-Walled Carbon Nanotube Transistors," *Phys. Rev. Lett.* 95:146805.
Zhou et al. (2005) "Mechanism for Stamp Collapse in Soft Lithography," *Appl. Phys. Lett.* 87:251925.
Zhu et al. (2005) "Spin on Dopants for High-Performance Single Crystal Silicon Transistors on Flexible Plastic Substrates," *Appl. Phys. Lett.* 86(133507)1-3.
Zipes et al. (2006) "ACC/AHA/ESC 2006 Guidelines for Management of Patients With Ventricular Arrhythmias and the Prevention of Sudden Cardiac Death: A Report of the American College of Cardiology/American Heart Association Task Force and the European Society of Cardiology Committee for Practice Guidelines (Writing Committee to Develop Guidelines for Management of Patients With Ventricular Arrhythmias and the Prevention of Sudden Cardiac Death," *Circulation* 114:385-484.
[Authors unknown] (1996) "National Nosocomial Infections Surveillance (NNIS) Report, Data Summary from Oct. 1986-Apr. 1996, Issued May 1996. A Report from the National Nosocomial Infections Surveillance (NNIS) System," *Am. J. Infect. Control.* 24:380-388.
Anderson et al. (2009) "Clinical and Financial Outcomes Due to Methicillin Resistant *Staphylococcus aureus* Surgical Site Infection: A Multi-Center Matched Outcomes Study," PLoS One. 4(12):1-8.
Banerjee et al. (2006) "Low-Temperature Deposition of ZnO Thin Films on PET and Glass Substrates by DC-Sputtering Technique," *Thin Solid Films.* 496:112-116.
Becker et al. (2004) "Opinion of the Scientific Panel on Dietetic Products, Nutrition and Allergies on a Request from the Commission Related to the Tolerable Upper Intake Level of Silicon," *The EFSA Journal* 60:1-11.
Bettinger et al. (2010) "Biomaterial-Based Organic Electronic Devices," *Polym. Int.* 59:563-567.
Bettinger et al. (2010) "Organic Thin Film Transistors Fabricated on Resorbable Biomaterial Substrates," *Adv. Mater.* 22:651-655.
Block et al. (1998) "Association of Serum Phosphorus and Calcium X Phosphate Product with Mortality Risk in Chronic Hemodialysis Patients: A National Study," *Am. J. Kidney Dis.* 31(4):607-61.
Bramson et al. (2003) "Enabling Topical Immunization Via Microporation: A Novel Method for Pain-Free and Needle-Free Delivery of Adenovirus-Based Vaccines," *Gene Ther.* 10:251-260.
Brugger et al. (1999) "Self-Aligned 3D Shadow Mask Technique for Patterning Deeply Recessed Surfaces of Micro-Electro-Mechanical Systems Devices," *Sensors and Actuators.* 76 :329-334.
Butler et al. (2000) "In Vivo Degredation of Tungsten Embolisation Coils," *The British Journal of Radiology.* 73:601-603.
Bylander et al. (2005) "Current measurement by real-time counting of single electrons," *Nature.* 434(7031):361-364.
Campbell et al. (1999) "Dynamics of Oxidation of Aluminum Nanoclusters using Variable Charge Molecular-Dynamics Simulations on Parallel Computers," *Phys. Rev. Lett.* 82:4866-4869.
Capala et al. (2003) "Boron Neutron Capture Therapy for Glioblastoma Multiforme: Clinical Studies in Sweden," *J. Neuro-Oncol.* 62:135-144.
Capelli et al. (2011) "Integration of Silk Protein in Organic and Light Emitting Transistors," *Organic Electronics.* 12:1146-1151.
Cheng (2011) "Effects of Post-Deposition Rapid Thermal Annealing on Aluminum-Doped ZnO Thin Films Grown by Atomic Layer Deposition," *Appl. Surf. Sci.* 258:604-607.

(56) References Cited

OTHER PUBLICATIONS

Chiappini et al. (2010) "Biodegradable Porous Silicon Barcode Nanowires with Defined Geometry," *Adv. Funct. Mater.* 20:2231-2239.

Cho et al. (2009) "Characterization of the Biaxial Textures of MgO Thin Films Grown by E-Beam Evaporation," *Journal of the European Ceramic Society.* 30:481-484.

Choi et al. (2009) "The Effects of Rapid Thermal Annealing on the Performance of ZnO Thin-Film Transistors," *J. Kor. Phys. Soc.* 55:1925-1930.

Chou et al. (1996) "Imprint Lithography with 25 Nanometer Resolution," *Science.* 272(5258):85-87.

Chung et al. (2003) "Nanoscale Gap Fabrication by Carbon Nanotube-Extracted Lithography (CEL)," *Nano Lett.* 3(8):1029-1031.

Cong et al. (2010) "CNT-Based Photopatternable Nanocomposites with High Electrical Conductivity and Optical Transparency," *J. Micromech. Microeng.* 20:025002.

Costner et al. (2009) "Nanoimprint Lithography Materials Development for Semiconductor Device Fabrication," *Annu. Rev. Mater. Res.* 39:155-180.

Danckwerts (1950) "Absorption by Simultaneous Diffusion and Chemical Reaction," *Tran. Faraday Soc.* 46:300-304.

Darhuber et al. (2003) "Microfluidic Actuation by Modulation of Surface Stresses," Appl. Phys. Lett. 82(4):657-659.

Diao et al. (2010) "Reduced Low Frequency Noise in Electron Beam Evaporated MgO Magnetic Tunnel Junctions," *Appl. Phys. Lett.* 96:202506.

Dickey et al. (2008) "Fabrication of Arrays of Metal and Metal Oxide Nanotubes by Shadow Evaporation," *ACS. Nano.* 2(4):800-808.

Dickey et al. (2010) "Transistors Formed from a Single Lithography Step Using Information Encoded in Topography," *Small.* 6(18):2050-2057.

Dolan (1977) "Offset Masks for Lift-Off Photoprocessing," *Appl. Phys. Lett.* 31(5):337-339.

Egger et al. (2005) "Dynamic Shadow Mask Technique: A Universal Tool for Nanoscience," *Nano Lett.* 5(1):15-20.

Flanders (1979) "X-ray Lithography at <100 Å Linewidths Using X-Ray Masks Fabricated by Shadowing Techniques," *J. Vac. Sci. Technol.* 16(6):1615-1619.

Gu et al. (2009) "In Vitro Corrosion and Biocompatibility of Binary Magnesium Alloys," *Biomaterials.* 30:484-498.

Guo (2004) "Recent Progress in Nanoimprint Technology and its Applications," *J. Phys. D: Appl. Phys.* 37:R123-R141.

Hamer et al. (2009) "AMOLED Displays Using Transfer-Printed Integrated Circuits," In; *SID 2009 International Symposium Digest of Technical Papers.* 15:947-950.

Han et al. (2010) "Potential Dissolution and Photo-Dissolution of ZnO Thin Films," *Journal of Hazardous Materials.* 178:115-122.

Hao et al. (2002) "Comparison of the Properties for ZnO: Al Films Depositied on Polyimide and Glass Substrates," *Mater. Sci. Eng. B.* 90:50-54.

Haran et al. (Dec. 15-17, 2008) "22 nm Technology Compatible Fully Functional 0.1 μm² 6T-SRAM Cell," In; *Electron Devices Meeting, 2008. IEDM 2008. IEEE International.* San Francisco, California.

Hawkeye et al. (2007) "Glancing Angle Deposition: Fabrication, Properties, and Applications of Micro- and Nanostructured Thin Films," *J. Vac. Sci. Technol. A.* 25:1317-1335.

Hawtin et al. (1964) "The Role of In-Pore Mass Transport Resistance in the Reaction of Porous Solids with Gases," *Chemical Engineering Science.* 19:819-834.

Heo et al. (2007) "Effects of $O_2$ Ambient on the Properties of MgO Thin Films Deposited by E-Beam Evaporation," *J. Electrochem. Soc.* 154(11):J352-J356.

Hiramatsu et al. (2007) "Influence of Thermal Annealing on Microstructure of Zinc Oxide Films Deposited by Magnetron Sputtering," *Jpn. J. Appl. Phys.* 46:3319-3323.

Holdeman et al. (1985) "An Approach to Fabricating Sub-Half-Micrometer-Length Gates for GaAs Metal-Semiconductor Field-Effect Transistors," *J. Vac. Sci. Technol.* B. 3(4):956-958.

Hu et al. (2008) "Dynamic Protein Water Relationships During Beta Sheet Formation," *Macromolecules.* 41:3939-3948.

Hu et al. (2009) "Microphase Separation Controlled Beta Sheet Crystallization Kinetics in Fibrous Proteins," *Macromolecules.* 42:2079-2087.

Hu et al. (2011) "Regulation of Silk Material Structure by Temperature-Controlled Water Vapor Annealing," *Biomacromolecules.* 12:1686-1696.

Hua et al. (2004) "Polymer Imprint Lithography with Molecular-Scale Resolution," *Nano. Lett.* 4(12):2467-2471.

Hwang et al. (2008) "The Effects of the Microstructure of ZnO Films on the Electrical Performance of Their Thin Film Transistors," *Appl. Phys. Lett.* 93:222104.

Hwang et al. (Apr. 11, 2013) "Materials and Fabrication Processes for Transient and Bioresorbable High-Performance Electronics," *Adv. Funct. Mater.* e-publication.

Hwang et al. (May 17, 2013) "Materials for Bioresorbable Radio Frequency Electronics," *Advanced Materials.* e-publication.

Hwang et al. (Sep. 28, 2012) "A Physically Transient Form of Silicon Electronics, With Integrated Sensors, Actuators and Power Supply," *Science* 337(6102):1640-1644.

Iler (1973) "Effect of Adsorbed Alumina on the Solubility of Amorphous Silica in Water," *J. of Colloid Interf. Sci.* 43:399-408.

Irimia-Vladu et al. (2010) "Biocompatible and Biodegradable Materials for Organic-Field Field Transistors," *Adv. Mater.* 20:4069-4076.

Irimia-Vladu et al. (2010) "Environmentally Sustainable Organic Field Effect Transistors," *Org. Electron.* 11:1974-1990.

Javey et al. (2004) "From the Cover: Ten to 50-nm-Long Quasi-Ballistic Carbon Nanotube Devices Obtained Without Complex Lithography," *Proc. Nat. Acad. Sci. USA.* 101(37):13408-13410.

Jeon et al. (2007) "Low-Voltage Zinc-Oxide Thin-Film Transistors on a Conventional $SiO_2$ Gate Insulator Grown by Radio-Frequency Magnetron Sputtering at Room Temperature," *J. Kor. Phys. Soc.* 51:1999-2003.

Jones et al. (1987) "Preparation and Characterization of Molecule-Based Transistors with a 50-Nanometer Source-Drain Separation with Use of Shadow Deposition Techniques. Toward Faster, More Sensitive Molecule-Based Devices," *J. Am. Chem. Soc.* 109(18):5526-5528.

Kang et al. (2004) "Avoiding Cu Hillocks During the Plasma Process," *J. Electrochem. Soc.* 151(6):G391-G395.

Kim et al. (2009) "Roll-To-Roll Manufacturing of Electronics on Flexible Substrates Using Self-Aligned Imprint Lithography (SAIL)," *J. Soc. Inf. Disp.* 17(11):963-970.

Kim et al. (2010) "Dissolvable Films of Silk Fibroin for Ultrathin Conformal Bio Integrated Electronics," *Nature Materials.* 9(6):511-517.

Kim et al. (2010) "Microstructured Elastomeric Surfaces with Reversible Adhesion and Examples of Their Use in Deterministic Assembly by Transfer Printing," *Proc. Nat. Acad. Sci. USA* 107(40):17095-17100.

Kim et al. (Nov. 11, 2012) "Silk Inverse Opals," *Nature Photonics.* 6:818-823.

Köhler et al. (1999) "Direct Growth of Nanostructures by Deposition Through an Si 3N 4 Shadow Mask," *Physica E.* 4:196-200.

Kosiorek et al. (2004) "Shadow Nanosphere Lithography: Simulation and Experiment," *Nano Lett.* 4:1359-1363.

Kozicki et al. (Nov. 10, 2005) "Programmable Metallization Cell Memory Based on Ag—Ge—S and Cu—Ge—S Solid Electrolytes," In; *Non-Volatile Memory Technology Symposium 2005,* Dallas, Texas.

Kuoni et al. (2003) "Polyimide Membrane with ZnO Piezoelectric Thin Film Pressure Transducers as a Differential Pressure Liquid Flow Sensor," *J. Micromech. Microeng.* 13:S103-S107.

Kwadwo et al. (2010) "Layer-by-Layer Assembly of Charged Particles in Nonpolar Media," *Langmuir.* 26(12), 9974-9980.

Lee (2009) "Effects of Sputtering Pressure and Thickness on Properties of ZnO: Al Films Deposited on Polymer Substrates," *J. Electroceram.* 23:512-518.

(56) References Cited

OTHER PUBLICATIONS

Lee et al. (2001) "Thickness Effect on Secondary Electron Emission of MgO Layers," *Appl. Surf. Sci.* 174:62-69.
Legnani et al. (2008) "Bacterial Cellulose Membrane as Flexible Substrate for Organic Light Emitting Devices," *Thin Film Solids.* 517:1016-1020.
Levine (2005) *Molecular Reaction Dynamics.* Cambridge University Press. Cambridge, United Kingdom.
Li et al (2008) "Cellular Level Biocompatibility and Biosafety of ZnO Nanowires," *J. Phys. Chem. C.* 112:20114-20117.
Li et al. (2005) "Facile Synthesis of Silver Nanoparticles Useful for Fabrication of High-Conductivity Elements for Printed Electronics," *J. Am. Chem. Soc.* 127:3266-3267.
Li et al. (Jan. 21, 2013) "An Analytical Model of Reactive Diffusion for Transient Electronics," *Adv. Funct. Mater.* 23:3106-3114.
Lim et al. (2007) "Au Micro-Pattern Fabrication on Cellulose Paper: Comparison of µ-Contact Printing and Liftoff Techniques," *J. Micromech.Microeng.* 17:1415-1419.
Low et al. (2009) "The Biocompatibility of Porous Silicon in Tissues of the Eye," *Biomaterials.* 30(15):2873-2880.
Magda Gioia et al. (2007) "Characterization of the Mechanisms by which Gelatinase A, Neutrophil Collagenase, and Membrane-Type Metalloproteinase MMP-14 Recognize Collagen I and Enzymatically Process the Two Alpha-Chains," *J. Mol. Biol.* 368(4):1101-13.
Martinez-Boubeta et al. (2010) "Self-Assembled Multifunctional Fe/Mgo Nanospheres for Magnetic Resonance Imaging and Hyperthermia," *Nanomedicine: Nanotechnology, Biology, and Medicine.* 6:362-370.
Medina-Montes et al. (2011) "Effects of Sputtered ZnO Layers on Behavoir of Thin-Film Transistors Deposited at Room Temperature in a Nonreactive Atmosphere," *J. Electr. Mater.* 40:1461-1469.
Morita et al. (1990) "Growth of Native Oxide on a Silicon Surface," *J. Appl. Phys.* 68:1272-1281.
Naghii et al. (2011) "Comparative Effects of Daily and Weekly Boron Supplementation on Plasma Steroid Hormones and Proinflammatory Cytokines," *J. Trace Elem. Med. Bio.* 25:54-58.
Ouyang et al. (2004) "Polymer Optoelectronic Devices with High-Conductivity Poly(3,4-Ethylenedioxythiophene) Anodes," *Journal of Macromolecular Science.* 41(12)1 497-1511.
Ozisik et al. (1971) "Carbon Loss from Graphite Cylinders Exposed to Steam for Short Times," *Nuclear Science and Engineering.* 44:310-319.
Pan et al. (2010) "Design and Fabrication of Flexible Piezo-Microgenerator by Depositing ZnO Thin Films on Pet Substrates," *Sensors and Actuators A.* 159:96-104.
Pandy et al. (1998) "Experimental Investigation of High Si/Ai Selectivity During Anisotropic Etching in Tetra-Methyl Ammonium Hydroxide," *J. Vac. Sci. Technol. A.* 16(2):868-872.
Park et al. (1999) "Fabrication of Metallic Electrodes with Nanometer Separation by Electromigration," *Appl. Phys. Lett.* 75:301-303.
Park et al. (2005) "Wireless Thermal Micro-Ablation of Skin for Transdermal Drug Delivery," In; *The 13th International Conference on Solid-state Sensors, Actuators and Microsystems.* 2:1238-1241.
Park et al. (2007) "High Resolution Electrohydrodynamic Jet Printing," *Nature Materials.* 6:782-789.
Park et al. (2008) "High Aspect-Ratio Cylindrical Nanopore Arrays and Their Use for Templating Titania Nanoposts," *Adv. Mater.* 20:738-742.
Park et al. (2008) "Nanoscale Patterns of Oligonucleotides Formed by Electrohydrodynamic Jet Printing with Applications in Biosensing and Nanomaterials Assembly," *Nano Lett.* 8:4210-4216.
Peuster et al. (2001) "A Novel Approach to Temporary Stenting: Degradable Cardiovascular Stents Produced from Corrodible Metal-Results 6-18 Months After Implantation Into New Zealand White Rabbits," *Heart.* 86:563-569.
Peuster et al. (2003) "Biocompatibility of Corroding Tungsten Coils: In Vitro Assessment of Degradation Kinetics and Cytotoxicity on Human Cells." *Biomaterials.* 24:4057-4061.
Peuster et al. (2003) "Degradation of Tungsten Coils Implanted Into the Subclavian Artery of New Zealand White Rabbits is not Associated with Local or Systemic Toxicity," *Biomaterials.* 24:393-399.
Philipp et al. (1999) "Shadow Evaporation Method for Fabrication of Sub 10 nm Gaps Between Metal Electrodes," *Microelectron. Eng.* 46:157-160.
Piispanen et al. (1995) "Complex Formation Equilibria of Some Aliphatic alpha-Hydroxycarboxylic Acids. 1. The Determination of Protonation Constants and the Study of Calcium(II) and Magnesium(II) Complexes," *Acta Chemica Scandinavica.* 49:235-240.
Racz et al. (2004) "Nanofabrication Using Nanotranslated Stencil Masks and Lift Off," *J. Vac. Sci. Technol. B.* 22(1):74-76.
Rácz et al. (2007) "Characterization and Control of Unconfined Lateral Diffusion Under Stencil Masks," *J. Vac. Sci. Technol. B.* 25:857-861.
Rimstidt et al. (1980) "Kinetics of Silica-Water Reactions," *Geochim. Cosmochim. Ac.* 44:1683-1699.
Robbie et al. (1997) "Sculptured Thin Films and Glancing Angle Deposition: Growth Mechanics and Applications," *J. Vac. Sci. Technol. A.* 15(3):1460-1465.
Robbie et al. (1998) "Advanced Techniques for Glancing Angle Deposition," *J. Vac. Sci. Technol. B.* 16(3):1115-1122.
Rogers et al. (2010) "Materials and Mechanics for Stretchable Electronics," *Science.* 327:1603-1607.
Sankir et al. (2008) "Electrical and Morphological Characterization of Polyaniline/Sulfonated Poly(Arylene ether Sulfone) Composite Films," J. Mater. Sci.: Mater. El. 19(4):389-392.
Santra et al. (2010) "Silicon on Insulator Diode Temperature Sensor—A Detailed Analysis for Ultra-High Temperature Operation," *IEEE Sens. J.* 10(5):997-1003.
Schift (2008) "Nanoimprint Lithography: An Old Story in Modern Times? A Review," *J. Vac. Sci. Technol. B.* 26(2):458-480.
Seidel et al. (1990) "Anisotropic Etching of Crystalline Silicon in Alkaline Solutions," *Electrochem. Soc.* 137(11):3612-3626.
Shen et al. (2007) "Submicron Particles of SBA-15 Modified with MgO as Carriers for Controlled Drug Delivery," *Chem. Pharm. Bull.* 55(7):985-991.
Song (2007) "Control of Biodegradation of Biocompatible Magnesium Alloys," *Corrosion Science.* 49:1696-1701.
Sordan et al. (2001) "Removable Template Route to Metallic Nanowires and Nanogaps," *Appl. Phys. Lett.* 79(13):2073-2075.
Tao et al. (2010) "Gold Nanoparticle-Doped Biocompatible Silk Films as a Path to Implantable Thermo-Electrically Wireless Powering Devices," *Appl. Phys. Lett.* 97:123702.
Tao et al. (Nov. 27, 2012) "Implantable, Multifunctional, Bioresorbable Optics," *Proc. Natl. Acad. Sci. USA.* 109(48):19584-19589.
Toader et al. (2001) "Proposed Square Spiral Microfabrication Architecture for Large Three-Dimensional Photonic Band Gap Crystals," *Science.* 292(5519):1113-1136.
Tomozawa et al. (1999) "Time Dependent Diffusion Coefficient of Water Into Silica Glass at Low Temperatures," *Mater. Sci. Eng. A.* 272:114-119.
Trewyn et al. (2008) "Biocompatible Mesoporous Silica Nanoparticles with Different Morphologies for Animal Cell Membrane Penetration," *Chemical Engineering Journal.* 137:23-29.
Vazquez-Mena et al. (2008) "Metallic Nanowires by Full Wafer Stencil Lithography," *Nano Lett.* 8:3675-3682.
Vojtěch et al. (2011) "Mechanical and Corrosion Properties of Newly Developed Biodegradable Zn-Based Alloys for Bone Fixation," *Acta Biomaterialia.* 7:3515-3522.
Wang et al. (2009) "Self-Aligned Fabrication of 10 nm Wide Asymmetric Trenches for Si/SiGe Heterojunction Tunneling Field Effect Transistors Using Nanoimprint Lithography, Shadow Evaporation, and Etching," *J. Vac. Sci. Technol. B.* 27(6):2790-2794.
Weber et al. (1993) "Fabrication of Narrow Lines by Shadow-Evaporated Lift-Off Masks," *Physica Status Solidi (A).* 136(1):K41-K45.
Weimann et al. (2001) "Four-Angle Evaporation Method for the Preparation of Single Electron Tunneling Devices," *Microelectron. Eng.* 57-58:915-918.
Whitten et al. (2007) "Free Standing Carbon Nanotube Composite Bio-electrodes." *J. Biomed. Mater. Res. B.* 82:37-43.

(56) References Cited

OTHER PUBLICATIONS

Wilson (2009) "A Decade of Step and Flash Imprint Lithography," *J. Photopolym. Sci. Technol.* 22(2):147-153.
Witte (2010) "The History of Biodegradable Magnesium Implants," *Acta. Biomater.* 6:1680-1692.
Witte et al. (2008) "Degradable Biomaterials Based on Magnesium Corrosion," *Current Opinion in Solid State and Materials Science.* 12:63-72.
Won et al. (2011) "Piezoresistive Strain Sensors and Multiplexed Arrays Using Assemblies of Single-Crystalline Silicon Nanoribbons on Plastic Substrates," *IEEE T. Electron. Dev.* 58(11):4074-4078.
Wu et al. (2008) "Biomolecule-Assisted Synthesis of Water-Soluble Silver Nanoparticles and Their Biomedical Applications," *Inorg. Chem.* 47:5882-5888.
Xia et al. (1998) "Soft Lithography," *Angew. Chem. Int. Ed.* 37:550-575.
Xu et al. (2002) "Nanoditches Fabricated Using a Carbon Nanotube as a Contact Mask," *Nano Lett.* 2(10):1061-1065.
Xu et al. (2004) "Fabrication of Free-Standing Metallic Pyramidal Shells," *Nano. Lett.* 4(12):2509-2511.
Xu et al. (2005) "Approaching Zero: Using Fractured Crystals in Metrology for Replica Molding," *J. Am. Chem. Soc.* 127(3):854-855.
Xu et al. (2007) "Fabrication of Large-Area Patterned Nanostructures for Optical Applications by Nanoskiving," *Nano Lett.* 7(9):2800-2805.
Xu et al. (2008) "Nanoskiving: A New Method to Produce Arrays of Nanostructures," *Account. Chem. Res.* 41(12):1566-1577.
Yamagata et al. (2003) "Preparation of a Copoly (dl-lactic/glycolic acid)-Zinc Oxide Complex and its Utilization to Microcapsules Containing Recombinant Human Growth Hormone," *International Journal of Pharmaceuticals.* 251:133-141.
Yan et al. (2006) "Magnesium Oxide as a Candidate High-κ Gate Dielectric," *Appl. Phys. Lett.* 88:142901.
Young et al. (1997) Dietary Reference Intakes for Calcium, Phosphorus, Magnesium, Vitamin D, and Fluoride. *National Academy Press*, Washington, D.C.
Yu et al. (2004) "Triangular Profile Imprint Molds in Nanograting Fabrication," *Nano Lett.* 4(2):341-344.
Zhang et al. (2010) "Fabrication and Comparative Study of Top-Gate and Bottom-Gate ZnO TFTs with Various Insulator Layers," *J. Mater. Sci.: Mater. Electron.* 21:671-675.
Zhao et al. (2002) "Novel Nano-Column and Nano-Flower Arrays by Glancing Angle Deposition," *Nano. Lett.* 2(4):351-354.
Zhao et al. (2004) "Synthesis and Properties of a Water-Soluble Single-Walled Carbon Nanotube-Poly(m-aminobenzene Sulfonic Acid) Graft Copolymer," *Adv. Funct. Mater.* 14(1):71-76.
Zhou et al. (2003) "Simple Fabrication of Molecular Circuits by Shadow Mask Evaporation," *Nano Lett.* 3(10):1371-1374.
Zhou et al. (2006) "Dissolving Behavior and Stability of ZnO Wires in Biofluids: A Study on Biodegradability and Biocompatibility of ZnO Nanostructures," *Adv. Mater.* 18:2432-2435.
Zhou et al. (2008) "Flexible Piezotronic Strain Sensor," *Nano. Lett.* 8(9):3035-3040.
Zhu et al. (2009) "Biocompatibility of Pure Iron: In Vitro Assessment of Degradation Kinetics and Cytotoxicity on Endothelial Cells," *Materials Science and Engineering C.* 29:1589-1592.
Office Action with English Translation, Chinese Patent Application No. 2010800668164, Mar. 7, 2014, 15 pages.
International Preliminary Report on Patentability, International Patent Application No. PCT/US2012/056538, Jun. 3, 2014, 22 pages.
Notice of Reasons for Rejection with English Translation, Japanese Patent Application No. P2013-500037, May 27, 2014, 8 pages.
Extended European Search Report dated Jul. 31, 2015, corresponding to European Patent Application No. 12858625.2.
U.S. Appl. No. 11/465,317, filed Aug. 17, 2006.
U.S. Appl. No. 12/372,605, filed Feb. 17, 2009.
U.S. Appl. No. 12/522,582, filed Jul. 9, 2009.
U.S. Appl. No. 13/095,502, filed Apr. 27, 2011.
U.S. Appl. No. 14/800,363, filed Jul. 15, 2015.
U.S. Appl. No. 14/789,645, filed Jul. 1, 2015.
U.S. Appl. No. 14/251,259, filed Aug. 4, 2015.
U.S. Appl. No. 14/944,039, filed Nov. 17, 2015.
Japanese First Office Action, dated Aug. 9, 2016, in Japanese Patent Application No. P2014-544733, a related application, 6 pp.
Communication from European Patent Office, dated Oct. 6, 2016, in European Patent Application No. 12 858 625.2, a related application, 4 pp.
First Office Action in Chinese Patent Application No. 2012800687022 dated Nov. 1, 2016, a related application.
International Search Report and Written Opinion mailed Jun. 17, 2013, for International Patent Application No. PCT/US2012/056538.
Japanese Second Office Action, dated Mar. 7, 2017, in Japanese Patent Application No. P2014-544733, a related application.
Taiwanese Office Action dated Apr. 5, 2017 for Application No. 101145172, a related application (relevance in reference table).

\* cited by examiner

As-grown SWNT array

Coated w/ MG2OH; selective Joule heating (c)

Estimated grain size, ~ 25 nm (d)

(a)

(b)

RF Beacon Transmitter    Receiver Station

Front side

Back side

Received Beacon Signal at a distance of 5 meters
(Beacon Powered by <u>DC Power Supply</u>)

Received Beacon Signal at a distance of 10 cm
(Beacon Powered by <u>lab-fab Solar Cell</u>)

Before dissolution

(a)

After dissolution in DI water (20

(b)

100nm W with different width

(c)

(a)

(b)

Frequency @ 49 MHz, power of 25 %

TRANSIENT DEVICES DESIGNED TO UNDERGO PROGRAMMABLE TRANSFORMATIONS

CROSS-REFERENCE TO RELATED APPLICATIONS

This application claims the benefit of priority from U.S. Provisional Patent Application Nos. 61/565,907, filed Dec. 1, 2011, and 61/636,510, filed Apr. 20, 2012, each of which is hereby incorporated by reference in its entirety.

STATEMENT REGARDING FEDERALLY SPONSORED RESEARCH OR DEVELOPMENT

This invention was made, at least in part, with United States governmental support awarded by DARPA award no. W911NF-11-1-0254. The United States Government has certain rights in this invention.

BACKGROUND

This invention is in the field of transient devices, and relates generally to passive and active devices designed to programmably transform.

Transient devices have potential for a range of important applications. For example, eco-degradable environmental sensors avoid the need for device collection and bioresorbable medical devices that degrade and are cleared from the body avoid toxicity and inflammation. Strategically, military devices that degrade after a preselected time or upon application of a triggered stimulus avoid transferring knowledge or materials to enemies. All of these envisioned applications are important, but implementation of transient devices is dependent upon design strategies. Design strategies for transient devices must (i) support device fabrication using degradable device component materials and degradable substrates, (ii) provide for accurate control of the useful lifetime of the device, and (iii) utilize materials that are compatible with and perform adequately for a given application within a target environment.

Recently, a number of patents and publications have disclosed devices with transient properties. For example, Kim et al., "Silicon electronics on silk as a path to bioresorbable implantable devices", Appl. Phys. Lett. 95, 133701 (2009); U.S. Patent Application Publication 2011/0230747; and International Patent Application Publication WO 2008/085904 disclose biodegradable electronic devices that may include a biodegradable semiconducting material and a biodegradable substrate. Bettinger et al., "Organic thin film transistors fabricated on resorbable biomaterial substrates", Adv. Mater., 22(5), 651-655 (2010); Bettinger et al., "Biomaterial-based organic electronic devices", Poly. Int. 59(5), 563-576 (2010); and Irimai-Vladu, "Environmentally sustainable organic field effect transistors", Organic Electronics, 11, 1974-1990 (2010) disclose biodegradable electronic devices that may include a biodegradable organic conducting material and a biodegradable substrate. International Patent Application Publication WO 2008/108838 discloses biodegradable devices for delivering fluids and/or biological material to tissue. U.S. Patent Application Publication 2008/0306359 discloses ingestible devices for diagnostic and therapeutic applications. Kozicki et al., "Programmable metallization cell memory based on Ag—Ge—S and Cu—Ge—S solid electrolytes", NonVolatile Memory Technology Symposium, 83-89 (2005) discloses memory devices where metal ions within an electrolyte may be reduced or oxidized to form or remove solid metal interconnects.

SUMMARY

The invention provides transient devices, including active and passive devices that physically, chemically and/or electrically transform upon application of at least one internal and/or external stimulus. Incorporation of degradable device components, degradable substrates and/or degradable encapsulating materials each having a programmable, controllable and/or selectable degradation rate provides a means of transforming the device. In some embodiments, for example, transient devices of the invention combine degradable high performance single crystalline inorganic materials with degradable substrates. Incorporation of degradable single crystalline inorganic materials provides state-of-the-art electronic and mechanical properties (e.g., bending stiffness, Young's modulus, radius of curvature, etc.) and device attributes (e.g., flexibility, stretchability, etc.).

A remarkable feature of modern silicon is its ability to remain functionally and physically invariant, almost indefinitely for many practical purposes. Here, a silicon-based technology that offers the opposite behavior is introduced: it gradually vanishes over time, in a well-controlled, programmed manner. Devices that are 'transient' in this sense create application possibilities that cannot be addressed with conventional electronics. The present devices may be used in applications such as active implants that exist for medically useful timeframes, but then completely dissolve and disappear via resorption by the body. A set of materials, manufacturing schemes, device components and theoretical design tools for complementary metal oxide semiconductor (CMOS) electronics of this type is reported, together with different classes of sensors and actuators in addressable arrays, options for power supply and a wireless control strategy. A transient silicon device capable of delivering thermal therapy in an implantable mode as a programmable, non-antibiotic bacteriocide, and its demonstration in vitro and in vivo illustrate a system-level example of this technology.

An overarching goal in the development of nearly any new class of electronics is to achieve high performance operation in physical forms that undergo negligible change with time. Active and passive materials, device and circuit layouts and packaging strategies are each carefully formulated individually and then configured collectively to accomplish this outcome. The transient electronics technology introduced here involves similar attention to engineering design, but in the context of systems that physically disappear or transform, in whole or in part, at prescribed times and with well-defined rates. Use scenarios range from integration with living hosts (human/animal/insect/plant; on-dwelling or in-dwelling) to indoor/outdoor environments such as buildings, roadways or materiel. Enabled devices include medical monitors that fully resorb when implanted into the human body ("bio-resorbable") to avoid adverse long-term effects, or environmental monitors that dissolve when exposed to water ("eco-resorbable") to eliminate the need for collection and recovery. Other concepts involve circuits that incorporate strategic regions with timed transience, to affect controlled transformation in function.

This description presents a set of materials, modeling tools, manufacturing approaches, device designs and system level examples of transient electronics. Because this technology is based on silicon, it can exploit many modern, established aspects of device and circuit design, with operational characteristics that can match those of non-transient counterparts formed in the usual way on wafer substrates. This result, taken together with supporting technologies in sensors, actuators, power supply and wireless control, provides access to qualitatively more sophisticated capabilities than those available with recently reported forms of organic electronics in which certain constituent materials are water soluble[1-3] or simple non-transient transistors formed on bioresorbable substrates[4].

Provided herein are transient devices and methods of making and using transient devices. For example, devices of the invention are useful for ex vivo, in vitro or in vivo sensing of a parameter associated with an environment, such as a chemical composition (e.g., pH, ionic strength, presence or concentration of a biomarker, protein, carbohydrate, etc.), an electrochemical parameter (e.g., current or voltage), temperature, and/or an optical parameter (e.g., absorption, scattering, etc.).

In an aspect, a passive transient electronic device comprises a substrate, one more inorganic semiconductor components, one or more metallic conductor components or one or more inorganic semiconductor components and one or more metallic conductor components supported by the substrate, wherein the one or more inorganic semiconductor components or one or more metallic conductor components independently comprise a selectively transformable material, wherein the one or more inorganic semiconductor components or the one or more metallic conductor components have a preselected transience profile in response to an external or internal stimulus, wherein at least partial transformation of the one or more inorganic semiconductor components or the one or more metallic conductor components provides a programmable transformation of the passive transient electronic device in response to the external or internal stimulus and at a pre-selected time or at a pre-selected rate, wherein the programmable transformation provides a change of the function of the passive transient electronic device from a first condition to a second condition.

In an aspect, an actively triggered transient electronic device comprises a substrate; one or more inorganic semiconductor components, one or more metallic conductor components or one or more inorganic semiconductor components and one or more metallic conductor components supported by the substrate; wherein the one or more inorganic semiconductor components or the one or more metallic conductor components independently comprise a selectively transformable material, wherein the one or more inorganic semiconductor components or the one or more metallic conductor components have a preselected transience profile in response to an external or internal stimulus; and an actuator responsive to a user initiated external trigger signal and operably connected to the one or more inorganic semiconductor components or the one or more metallic conductor components, wherein upon the device receiving the external trigger signal the actuator directly or indirectly initiates at least partial transformation of the one or more inorganic semiconductor components or the one or more metallic conductor components in response to the internal or external stimulus, thereby providing a programmable transformation of the actively triggered transient electronic device in response to the external trigger signal, wherein the programmable transformation provides a change of the function of the actively triggered transient electronic device from a first condition to a second condition. In some embodiments, the actuator is operably connected to the one or more inorganic semiconductor components or the one or more metallic conductor components, optionally both, such that it acts directly on the one or more inorganic semiconductor components and/or the one or more metallic conductor components to initiate the at least partial transformation, for example in a manner directly causing selective removal of the one or more inorganic semiconductor components and/or the one or more metallic conductor components. In some embodiments, the actuator is operably connected to the one or more inorganic semiconductor components or the one or more metallic conductor components, optionally both, such that it acts on one or more intermediate structures positioned between the actuator and the one or more inorganic semiconductor components and/or the one or more metallic conductor components so as to initiate the at least partial transformation, for example, by selective removal of the one or more intermediate structures resulting in exposure of the inorganic semiconductor components and/or the one or more metallic conductor components to the internal or external stimulus.

In an embodiment, one or more inorganic semiconductor components or one or more metallic conductor components undergo a complete transformation or a substantially complete transformation, thereby providing the programmable transformation of the passive or active transient electronic device. The complete transformation may be characterized by a complete removal, a complete phase change or a complete chemical change of the one or more inorganic semiconductor components or the one or more metallic conductor components. A "complete transformation" occurs when 100% of a material undergoes a transformation. A "substantially complete transformation" occurs when 95% or greater than 95% (e.g., 97%, 98%, 99%, 99.5% or 99.9%) of a material undergoes a transformation, such as removal, chemical conversion, phase transition or the like. In an embodiment, for example, a material that undergoes a substantially complete transformation also undergoes a change in a physical property, such as conductivity or resistance that is greater than or equal to 95%, for example, by undergoing a decrease in conductivity or an increase in resistance greater than or equal to 95%.

In an embodiment, one or more inorganic semiconductor components or one or more metallic conductor components undergo an incomplete transformation. The incomplete transformation may be characterized by a partial removal, phase change or chemical change of at least 20%, 30%, 50% or 70% of the quantity of the inorganic semiconductor components or at least 20%, 30%, 50% or 70% of the quantity of the metallic conductor components, thereby providing the programmable transformation of the passive or active transient electronic device. The incomplete transformation may be characterized by a partial removal, phase change or chemical change of at least 20%, 30%, 50% or 70% by weight, volume or area of each of the one or more inorganic semiconductor components or at least 20%, 30%, 50% or 70% by weight, volume or area of each of the one or more metallic conductor components, thereby providing the programmable transformation of the passive transient electronic device. In an embodiment, for example, a material that undergoes a incomplete transformation also undergoes a change in a physical property, such as conductivity or resistance that is greater than or equal to 20% (or 30% for some applications or 50% for some applications or 70% for some applications), for example, by undergoing a decrease in conductivity or an increase in resistance greater than or equal to 20% (or 30% for some applications or 50% for some applications or 70% for some applications).

In an embodiment, transformation of the one or more inorganic semiconductor components or the one or more metallic conductor components occurs by a process other than bioresorption. For example, the transformation of the one or more inorganic semiconductor components or the one or more metallic conductor components may occur by a phase change, wherein at least a portion of the one or more inorganic semiconductor components or the one or more metallic conductor components undergoes at least partial sublimation or melting, thereby providing the programmable transformation of the passive transient electronic device.

In another embodiment, transformation of the one or more inorganic semiconductor components or the one or more metallic conductor components occurs via at least partial dissolution of the one or more inorganic semiconductor components or the one or more metallic conductor components in a solvent. The solvent may be an aqueous solvent or a nonaqueous solvent. An "aqueous solvent" is a liquid at 298 K that predominantly comprises water, i.e., greater than 50% v/v water, whereas a "nonaqueous solvent" is a liquid at 298 K that predominantly comprises liquid(s) other than water, i.e., less than 50% v/v water. Exemplary aqueous solvents include water, water-based solutions, bodily fluids, and the like. Exemplary nonaqueous solvents include organic solvents (e.g., alcohols, esters, ethers, alkanes, ketones) and ionic liquids.

In another embodiment, transformation of the one or more inorganic semiconductor components or the one or more metallic conductor components occurs via at least partial hydrolysis of the one or more inorganic semiconductor components or the one or more metallic conductor components.

In another embodiment, transformation of the one or more inorganic semiconductor components or the one or more metallic conductor components occurs via at least partial etching or corrosion of the one or more inorganic semiconductor components or the one or more metallic conductor components.

In another embodiment, transformation of the one or more inorganic semiconductor components or the one or more metallic conductor components occurs by a photochemical reaction wherein at least a portion of the one or more inorganic semiconductor components or the one or more metallic conductor components absorb electromagnetic radiation and undergo an at least partial chemical or physical change. In an embodiment, the photochemical reaction is a photodecomposition process.

In another embodiment, transformation of the one or more inorganic semiconductor components or the one or more metallic conductor components occurs by an electrochemical reaction. For example, the electrochemical reaction may be at least partial anodic dissolution of the one or more inorganic semiconductor components or the one or more metallic conductor components.

In another embodiment, transformation of the one or more inorganic semiconductor components or the one or more metallic conductor components occurs by a chemical or physical change wherein at least a portion of the one or more inorganic semiconductor components or the one or more metallic conductor components undergoes a decrease in conductivity greater than or equal to 50%, optionally for some embodiments greater than or equal to 75%, and optionally for some embodiments greater than or equal to 95%. In another embodiment, transformation of the one or more inorganic semiconductor components or the one or more metallic conductor components occurs by a chemical or physical change wherein at least a portion of the one or more inorganic semiconductor components or the one or more metallic conductor components is at least partially, and optionally, entirely converted into an insulator, thereby providing the programmable transformation of the passive transient electronic device.

In an aspect, the one or more inorganic semiconductor components or the one or more metallic conductor components are selectively removable and undergo a process characterized by removal, loss or other material transfer process (e.g., flaking, delamination, relocation, repositioning, etc.). In some embodiments, for example, the one or more inorganic semiconductor components or the one or more metallic conductor components undergo a process characterized by removal that is substantially uniform with respect to one or more regions of the inorganic semiconductor components or metallic conductor components, for example regions exposed to an internal or external stimulus, such as a process wherein the thickness of the inorganic semiconductor components or metallic conductor components decreases substantially uniformly (e.g., within 10%) as a function of time. In some embodiments, for example, the one or more inorganic semiconductor components or the one or more metallic conductor components undergo a process characterized by removal that is substantially nonuniform with respect to one or more regions of the inorganic semiconductor components or metallic conductor components, such as regions exposed to an internal or external stimulus, such as a process wherein the inorganic semiconductor components or metallic conductor components are preferentially (e.g., more rapidly) removed at nano-sized or micro-sized features, such as grain boundaries, defect sites, step edges, phase boundaries, etc. as a function of time In an embodiment, for example, the one or more inorganic semiconductor components or the one or more metallic conductor components undergo a process characterized by removal that is substantially nonuniform so as to generate a porous material, thereby impacting the electronic properties (e.g., conductivity, resistance, etc.) of the inorganic semiconductor components or metallic conductor components. In an embodiment, for example, the one or more inorganic semiconductor components or the one or more metallic conductor components undergo a process characterized by removal that is substantially nonuniform so as to cause flaking, for example, wherein the formation of cracks, defects and/or pores in the material result in loss of portions (e.g., flakes) of the material, thereby impacting the electronic properties (e.g., conductivity, resistance, etc.) of the inorganic semiconductor components or metallic conductor components. In an embodiment, the one or more inorganic semiconductor components or the one or more metallic conductor components undergo a process characterized by at least partial, and optionally complete, delamination and/or detachment from an underlying substrate or device component, thereby impacting the electronic properties (e.g., conductivity, resistance, etc.) of the inorganic semiconductor components or metallic conductor components.

In an embodiment, a transient electronic device has a preselected transience profile characterized by the transformation of the one or more inorganic semiconductor components or the one or more metallic conductor components occurring over a time interval selected from the range of 1 ms to 2 years, or 1 ms to 1 year, or 1 ms to 6 months, or 1 ms to 1 month, or 1 ms to 1 day, or 1 ms to 1 hour, or 1 second to 10 minutes, thereby providing the programmable transformation of the passive transient electronic device. In an embodiment, the preselected transience profile is characterized by a transformation of 0.01% to 100%, or 0.1% to 70%, or 0.5% to 50%, or 1% to 20% or 1% to 10% of the one or more inorganic semiconductor components or the one or more metallic conductor components over a time interval selected from the range of 1 ms to 2 years, or 1 ms to 1 year, or 1 ms to 6 months, or 1 ms to 1 month, or 1 ms to 1 day, or 1 ms to 1 hour, or 1 second to 10 minutes, thereby providing the programmable transformation of the passive transient electronic device. In an embodiment, the preselected transience profile is characterized by a decrease in the average thickness of the one or more inorganic semiconductor components or the one or more metallic conductor components at a rate selected over the range of 0.01 nm/day to 10 microns $s^{-1}$, or 0.1 nm/day to 1 micron $s^{-1}$, or 1 nm/day to 0.5 micron $s^{-1}$. In an embodiment, the preselected transience profile is characterized by a decrease in the mass of the one or more inorganic semiconductor components or the one or more metallic conductor components at a rate selected over the range of 0.01 nm/day to 10 microns $s^{-1}$, or 0.1 nm/day to 1 micron $s^{-1}$, or 1 nm/day to 0.5 micron $s^{-1}$. In an embodiment, the preselected transience profile is characterized by a decrease in the electrical conductivity of the one or more inorganic semiconductor components or the one or more metallic conductor components at a rate selected over the range of $10^{10}$ $S \cdot m^{-1}$ $s^{-1}$ to 1 $S \cdot m^{-1}$ $s^{-1}$, or $10^8$ $S \cdot m^{-1}$ $s^{-1}$ to 10 $S \cdot m^{-1}$ $s^{-1}$, or $10^5$ $S \cdot m^{-1}$ $s^{-1}$ to 100 $S \cdot m^{-1}$ $s^{-1}$.

In an embodiment, the device monitors the at least partial transformation of the one or more inorganic semiconductor components or the one or more metallic conductor components. For example, the device may monitor the rate of the at least partial transformation of the one or more inorganic semiconductor components or the one or more metallic conductor components providing the programmable transformation of the passive transient electronic device. Self-monitoring in devices of the invention may provide enhanced functionality, such as providing the basis for signaling to control overall device functionality or to provide signaling to a user providing measurements of the extent of the transformation, timeframe for programmable transformation or a characterization of device performance or functionality as a function of time.

A user initiated external trigger signal may directly or indirectly trigger the programmable transformation of the electronic device. For example, the user initiated external trigger signal may be an electronic signal, an optical signal, a thermal signal, a magnetic signal, acoustic signal, a mechanical signal, a chemical signal, or an electrochemical signal. In some embodiments, the user initiated external trigger signal is a user initiated application of an electric field provided to the device, a user initiated application of electromagnetic radiation provided to the device, a user initiated mechanical impact provided to the device, a user initiated flow of heat provided to the device, a user initiated flow of heat from the device or a user initiated application of an RF electric field provided to the device. The invention includes devices configured to receive a user initiated trigger signal, for example, devices having a receiver and/or microprocessor component in communication with a transmitter providing a user initiated trigger signal to the device.

The user initiated external trigger signal may be provided to the device directly by a user or indirectly via software stored on a computer-readable medium and executed by a microprocessor. The software may, for example, respond to user input data, data acquired from a component of the device, and/or a feedback loop in continuous communication with the device. The transient device may, for example, be in one-way or two-way communication with a transmitter, wherein the transmitter provides the user initiated external trigger signal to a receiver of the device operationally connected to the actuator. FIG. 131 shows a schematic of a transient device 1400 in communication with a transmitter 1412 providing a user initiated external trigger signal 1414 to a receiver 1408 of the device operationally connected to an actuator 1410. The transient device 1400 also includes a substrate 1402, one or more inorganic semiconductor components 1404 and one or more metallic conductor components 1406.

In some embodiments, a transient device includes a receiver for receiving the user initiated external trigger signal, the receiver operationally connected to the actuator so as to initiate the at least partial transformation of the one or more inorganic semiconductor components or the one or more metallic conductor components upon receiving the user initiated external trigger signal. For example, the receiver may include an antenna, an electrode, a piezoelectric element, a photoactive material, or a thermally active material for receiving the user initiated external trigger signal.

In some embodiments, the actuator comprises a processor for receiving a signal from the receiver for initiating the at least partial transformation of the one or more inorganic semiconductor components or the one or more metallic conductor components.

In some embodiments, the actuator acts directly on the one or more inorganic semiconductor components, the one or more metallic conductor components, or the substrate so as to cause the at least partial transformation. Alternatively, in some embodiments, the actuator acts indirectly on the one or more inorganic semiconductor components or the one or more metallic conductor components so as to cause the at least partial transformation.

In an embodiment, an actuator comprises a microprocessor. For example, a microprocessor may receive a user initiated external trigger signal, and software stored on a computer-readable medium within the microprocessor may analyze the user initiated external trigger signal to determine that a source of energy should be provided to a component of the device, such as electromagnetic radiation, acoustic energy, thermal energy, etc. In some embodiment, the software then provides instructions to the microprocessor to perform functions necessary to provide the energy to a device component so as to initiate an at least partial transformation of the one or more inorganic semiconductor components and/or the one or more metallic conductor components.

In some embodiments, the actuator at least partially removes one or more intermediate structures provided on the one or more inorganic semiconductor components or the one or more metallic conductor components so as to expose at least a portion of the one or more inorganic semiconductor components or at least a portion of the one or more metallic conductor components to the external or internal stimulus, thereby resulting in the at least partial transformation. The one or more intermediate structures may, for example, comprise an encapsulating material provided on the one or more inorganic semiconductor components or on the one or more metallic conductor components, wherein the actuator causes removal of at least a portion of the encapsulating material so as to expose the one or more inorganic semiconductor components or the one or more metallic conductor components to the external or internal stimulus. An encapsulating material may, for example, be an encapsulating layer restricted to the surface(s) of the one or more inorganic semiconductor components or the surface(s) of the one or more metallic conductor components, an encapsulating overlayer on the top surface of the device, or an encapsulating package surrounding the entire device.

In some embodiments, a transient device includes an overlayer at least partially encapsulating the one or more inorganic semiconductor components or the one or more metallic conductor components, where the overlayer may comprise one or more reservoirs containing a chemical agent or a biological agent. In an embodiment, an actuator comprises the overlayer having the one or more reservoirs. In an embodiment, the overlayer is a polymer layer or SiN layer. In an embodiment, the one or more reservoirs are embedded in the overlayer. For example, the one or more reservoirs of the overlayer may be ruptured in response to the external or internal stimulus, thereby resulting in release of the chemical or biological agent. In some embodiments, the one or more reservoirs of the overlayer independently have physical dimensions selected over the range of 100 nm to 10,000 µm, or 500 nm to 5,000 µm, or 1 µm to 1,000 µm. Reservoirs having these dimensions may, for example, be fabricated via photolithography or soft lithography (e.g., microtransfer printing).

In some embodiments, one or more reservoirs of the overlayer are ruptured in response to a mechanical impact, change in pressure, exposure to electromagnetic radiation, exposure to heat, or exposure to acoustic energy, thereby resulting in the release of the chemical or biological agent. For example, release may result in dispersal of the chemical agent or biological agent leading to physical contact with one or more device components, such as inorganic semiconductor components, metallic conductor components, dielectric components, encapsulating layers, substrate, etc., thereby causing selective transformation and/or selective removal of the device components in contact with the chemical agent or biological agent. Exemplary chemical or biological agents include water, a nonaqueous solvent, an aqueous solution, a biopolymer-containing solution, an acid, a base, an enzymatic solution, a PBS solution or a catalyst-containing solution.

In some embodiments, the overlayer comprises a silk material, and the chemical agent or biological agent comprises a protease containing material, such as a protease containing solution. In some embodiments, protease enzymes may be complexed with small molecule inhibitors, such as EDTA, or antibodies to shut off activity until the agent is dispersed.

In some embodiments, the actuator generates electromagnetic radiation, acoustic energy, an electric field, a magnetic field, heat, a RF signal, a voltage, a chemical change, or a biological change in response to the user initiated external trigger signal, thereby initiating the at least partial transformation. The actuator may, for example, comprise a heater, a reservoir containing a chemical agent capable of causing a chemical change or a biological change, a source of electromagnetic radiation, a source of an electric field, a source of RF energy or a source of acoustic energy. Exemplary heaters include passive heaters, resistive heaters, and active heaters.

In some embodiments, an actuator comprises an encapsulating material at least partially encapsulating one or more of the inorganic semiconductor components or the metallic conductor components, wherein the encapsulating material comprises a selectively removable material that is at least partially removed upon the device receiving the external trigger signal to expose underlying inorganic semiconductor components or metallic conductor components to the internal or external stimulus, thereby initiating the at least partial transformation. For example, the encapsulating material may be at least partially dissolved, hydrolyzed, or depolymerized by a chemical agent provided by the actuator in response to the user initiated external trigger signal to expose the underlying inorganic semiconductor components or metallic conductor components. In some embodiments, for example, a selectively removable encapsulating material is provided as an overlayer positioned on one or more inorganic semiconductor components and/or one or more metallic conductor components comprising a selectively transformable material, such that at least partial removal of the overlayer of encapsulating material exposes the underlying one or more inorganic semiconductor components and/or one or more metallic conductor components to an internal or external stimulus, such as an environmental stimulus (e.g., solvent, chemical environment, biological environment, ambient pressure, ambient temperature, ambient electromagnetic radiation, etc.), causing an at least partial transformation of the one or more inorganic semiconductor components and/or one or more metallic conductor components. In some embodiments, removal of the overlayer of encapsulating material occurs as a result of exposure to an environmental stimulus (e.g., solvent, chemical environment, biological environment, ambient pressure, ambient temperature, ambient electromagnetic radiation, etc.). In some embodiments, removal of the overlayer of encapsulating material occurs as a result of an actuator of a device acting on the overlayer of encapsulating material, for example, by releasing a chemical or biological agent capable of causing at least partial removal of the encapsulating material. In some embodiments, removal of the overlayer of encapsulating material occurs as a result of an actuator of a device acting on the overlayer of encapsulating material, for example, by providing energy (e.g., electromagnetic radiation, acoustic energy, thermal energy, mechanical energy, etc.) causing at least partial removal of the encapsulating material.

In another example, the encapsulating material may be a photosensitive material that undergoes a photochemical reaction in response to electromagnetic radiation generated by the actuator to expose the underlying inorganic semiconductor components or metallic conductor components. The actuator may, for example, be a source of the electromagnetic radiation, wherein the actuator is provided in optical communication with the encapsulating material.

In yet another example, the encapsulating material is a thermally sensitive material that undergoes a phase change or chemical change in response to heat generated by the actuator to expose the underlying inorganic semiconductor components or metallic conductor components. For example, the actuator may be a heater provided in thermal contact with the encapsulating material for providing the heat, such as a resistive heater or a passive heater responsive to absorption of electromagnetic radiation. The invention includes devices comprising a heater embedded in an overlayer comprising an encapsulating material, wherein the heater is configured to provide thermal energy, for example, in response to a user initiated trigger signal, that causes at least partial removal of the encapsulating material thereby exposing underlying inorganic semiconductor components and/or metallic conductor components comprising a selectively transformable material.

In some embodiments, the actuator comprises a counter electrode and electrolyte, wherein the electrolyte is provided in contact with the electrode and the one or more inorganic semiconductor components or the one or more metallic conductor components, wherein the user initiated external trigger signal is a voltage or RF energy provided to the counter electrode, thereby resulting in dissolution of the one or more inorganic semiconductor components or the one or more metallic conductor components. In an embodiment, for example, and the one or more inorganic semiconductor components or the one or more metallic conductor components comprise the electrodes of an electrochemical cell and are in contact with an electrolyte.

In some embodiments, upon the device receiving the user initiated external trigger signal, the actuator performs an operation selected from the group consisting of opening or closing an electronic circuit, generating heat, resisting the flow of electricity, producing electromagnetic radiation, producing acoustic energy, and dispersing a chemical agent or biological agent.

When the actuator resists the flow of electricity, the temperature of at least a portion of the device may be raised by at least 10° C., thereby initiating thermal degradation of an encapsulating material provided on the one or more inorganic semiconductor components or one or more metallic conductor components, thereby exposing at least a portion of the one or more inorganic semiconductor components or one or more metallic conductor components to the internal or external stimulus.

When the actuator produces electromagnetic radiation, it initiates photochemical degradation of an encapsulating material provided on the one or more inorganic semiconductor components or one or more metallic conductor components, thereby exposing at least a portion of the one or more inorganic semiconductor components or one or more metallic conductor components to the internal or external stimulus.

When the actuator disperses a chemical agent, the chemical agent may, for example, be selected from the group consisting of water, saline, an acid, a base, and an enzyme; wherein the actuator delivers the chemical agent to an encapsulating material provided on the one or more inorganic semiconductor components or one or more metallic conductor components, thereby initiating chemical or enzymatic degradation of the encapsulating material provided on the one or more inorganic semiconductor components or one or more metallic conductor components, thereby exposing at least a portion of the one or more inorganic semiconductor components or one or more metallic conductor components to the internal or external stimulus. As used herein, chemical agent broadly refers generally to a chemical compound or mixture of compounds (e.g. solution) capable of initiating a chemical or physical change of a material, for example, capable of causing an a least partial transformation of a semiconductor component, metallic conductor component, dielectric component, substrate and/or encapsulating material of the device.

When the actuator disperses a biological agent, the biological agent may, for example, be selected from the group consisting of a protein, a modified protein, a peptide, a modified peptide, an oligonucleotide, and a nucleotide; wherein the actuator delivers the biological agent to an encapsulating material provided on the one or more inorganic semiconductor components or one or more metallic conductor components, thereby initiating chemical or enzymatic degradation of the encapsulating material provided on the one or more inorganic semiconductor components or one or more metallic conductor components, thereby exposing at least a portion of the one or more inorganic semiconductor components or one or more metallic conductor components to the internal or external stimulus. As used herein, biological agent broadly refers generally to a biomolecule or mixture of biomolecules capable of initiating a chemical or physical change of a material, for example, capable of causing an a least partial transformation of a semiconductor component, metallic conductor component, dielectric component, substrate and/or encapsulating material of the device.

In an embodiment, the programmable transformation provides a change of the function of the transient electronic device from a first condition of operability to a second condition of inoperability. In an alternate embodiment, the programmable transformation provides a change of the function of the transient electronic device from a first condition corresponding to a first functionality to a second condition corresponding to a second functionality different from the first functionality. The functionality may, for example, be an electronic functionality. In either embodiment, the programmable transformation may provide a change from a first condition characterized by two or more inorganic semiconductor device components or metallic conductor components in electrical contact with each other to a second condition characterized by the two or more inorganic semiconductor device components or metallic conductor components not in electrical contact with each other. In some embodiments, a programmable transformation physically and/or electronically separates or isolates components of the transient device, thereby resulting in the change of the function of the transient device from the first condition to the second condition.

Incorporation of degradable or transformable materials in the present invention may also be implemented in a manner to facilitate removal, degradation and/or clearance of the transient devices and components thereof. In an embodiment, a device of the invention has a composition, geometry and/or physical dimensions such that upon at least partial degradation or transformation of the substrate the device is broken up into fragments that are efficiently processed and cleared by a subject or environment. In an embodiment, for example, the device is configured such that upon at least partial degradation or transformation of the substrate the device is broken up into fragments having lateral and thickness dimensions less than 100 microns, optionally less than 10 microns and optionally less than 1 micron, so as to facilitate processing and clearance of the device by a subject or environment.

A programmable transformation may be a pre-set programmable transformation or a real-time trigger programmable transformation. For example, a pre-set transformation may occur at an elapsed or current time programmed into a timer of a device. At the specified time, a user initiated external trigger signal that begins the transformation process may be generated. A real-time transformation may be triggered, for example, by energy applied by an external source or by a signal transmitted by an external source and received by the device. Upon receiving the signal from the external source, an actuator may initiate a transformation process.

In an embodiment, a programmable transformation may comprise complete dissolution, degradation, removal or transformation of at least one inorganic device component, at least one metallic conductor component or both. For example, a programmable transformation of one or more inorganic semiconductor components or one or more metallic conductor components occurs by a process selected from the group consisting of resorption, bioresorption, (chemical or enzymatic) hydrolysis, disintegration, de-polymerization, dissolution, sublimation, melting, etching, photodecomposition, corrosion and anodic dissolution. In an embodiment, a programmable transformation electronically isolates one or more inorganic semiconductor device components or metallic conductor components of a transient electronic device, thereby resulting in a change of the function of the transient electronic device from a first condition to a second condition. For example, the function of the transient electronic device may be transformed from: (i) a NOR gate to a NAND gate; (ii) an inverter to an isolated transistor; (iii) a resistor to a diode; (iv) a NAND gate to an inverter; (v) a NOR gate to an isolated transistor; or (vi) a NAND gate to an isolated transistor.

A transient electronic device may be a passive electronic device or an active electronic device. For example, the passive transient electronic device may be a communication system, a photonic device, a sensor, an optoelectronic device, a biomedical device, a temperature sensor, a photodetector, a photovoltaic device, a strain gauge, an imaging system, a wireless transmitter, an antenna, a nanoelectromechanical system, or a microelectromechanical system. In a particular embodiment, the passive transient electronic device is a sensor for detecting temperature, strain, pressure, electric potential, hydration state, incident electromagnetic radiation or chemical composition. In a particular embodiment, the passive transient electronic device is a communication system that is fully dissolvable when in contact with water. In a particular embodiment, the passive transient electronic device is a radio or antennae. In a particular embodiment, the passive transient electronic device is a tissue mounted biomedical device. Exemplary transient electronic devices include but are not limited to transistors, diodes, CMOS devices, MOSFET devices, photodiodes, light emitting diodes, complementary logic circuits, light sensors, temperature sensors, chemical sensors, mechanical sensors, electrical sensors, magnetic sensors, batteries, fuel cells, radios, and thermoelectric or piezoelectric energy harvesters.

In an embodiment, the passive or active transient electronic device has an average thickness less than or equal to 1000 microns, or optionally 100 microns, or optionally 10 microns.

Useful inorganic semiconductor components include, but are not limited to, flexible semiconductor structures, stretchable semiconductor structures and/or semiconductor structures capable of undergoing a change in shape so as to conform to the surface of an environment. In some embodiments, a transient electronic device may comprise a plurality of inorganic semiconductor components. In an embodiment, the inorganic semiconductor components comprise a semiconductor device such as a transistor, a transistor channel, a diode, a p-n junction, a photodiode, a light emitting diode, a laser, an electrode, an integrated electronic device, an integrated circuit, an antenna, an inductor, a resistor, a semiconductor based sensor, MESFETs, MOSFETs or combinations and/or arrays of these.

In some embodiments, the one or more inorganic semiconductor components or the one or more metallic conductor components independently comprise a nanostructured material or a microstructured material. In an embodiment, for example, the inorganic semiconductor components comprise a microstructured material or a nanostructured material such as a micro- or nano-ribbon, a micro- or nano-membrane, a micro- or nano-wire or a micro- or nano-porous material. As used herein, the term "microstructured" refers to a structure having at least one physical dimension selected over the range of 1 micron to 1000 microns and the term "nanostructured" refers to a structure having at least one physical dimension selected over the range of 10 nanometers to 1000 nanometers. In an embodiment, the invention comprises a nanostructured inorganic semiconductor component, metallic component or dielectric component comprising a microporous material having a plurality of pores with cross section dimensions selected from the range of 1 μm to 1000 μm, optionally provided in an ordered network. In an embodiment, the invention comprises a nanostructured inorganic semiconductor component, metallic component or dielectric component comprising a nanoporous material having a plurality of pores with cross section dimensions selected from the range of 1 nm to 1000 nm, optionally provided in an ordered network.

The physical dimensions and shape of the device, and components thereof, are important parameters, particularly with respect to preselection of a desired transience profile. Use of thin inorganic semiconductor components, metallic conductor components and/or dielectric components (e.g., thickness less than or equal to 100 microns, optionally thickness less than or equal to 10 microns, optionally thickness less than or equal to 1 micron, optionally thickness less than or equal to 500 nanometers, and optionally thickness less than or equal to 100 nanometers) is beneficial for providing a preselected transience for a given device application and/or providing useful mechanical properties such as a flexible or otherwise deformable device. In some embodiments, inorganic semiconductor components, metallic conductor components and/or dielectric components independently comprise one or more thin film structures, which may for example be deposited or grown by molecular epitaxy, atomic layer deposition, physical or chemical vapor deposition, or other methods known in the art. In some embodiments, one or more inorganic semiconductor components, metallic conductor components and/or dielectric components independently comprise a biocompatible, bioresorbable, bioinert or ecocompatible material. In some embodiments, at least some of, and optionally all of, the inorganic semiconductor components, metallic conductor components and/or dielectric components of the electronic device have a thickness less than or equal to 100 microns, and for some applications have a thickness less than or equal to 10 microns, and for some applications have a thickness less than or equal to 1 micron, and for some applications have a thickness less than or equal to 500 nanometers, and for some applications have a thickness less than or equal to 100 nanometers, and for some applications have a thickness less than or equal to 20 nanometers. In some embodiments, at least some of, and optionally all of, the inorganic semiconductor components, metallic conductor components and/or dielectric components of the device independently have a thickness selected from a range of 10 nm to 100 μm, optionally for some applications selected from a range of 50 nm to 10 μm, and optionally for some applications selected from a range of 100 nm to 1000 nm. In an embodiment, for example, a device of the invention comprises one or more inorganic semiconductor components each independently having a thickness selected over the range of 10 nm to 1000 nm, optionally for some applications 10 nm to 100 nm and optionally for some applications 10 nm to 30 nm. In some embodiments, at least some of, and optionally all of, the inorganic semiconductor components, metallic conductor components and/or dielectric components of the device independently have lateral physical dimensions (e.g., length, width, diameter, etc.) less than or equal to 10000 μm, and for some applications have lateral physical dimensions less than or equal to 1000 μm, and for some applications have lateral physical dimensions less than or equal to 100 μm, and for some applications have lateral physical dimensions less than or equal to 1 μm. In some embodiments, at least some of, and optionally all of, the inorganic semiconductor components, metallic conductor components and/or dielectric components of the device independently have lateral physical dimensions selected from the range of 10 nm to 10 cm, optionally for some applications selected from a range of 100 nm to 10000 µm, optionally for some applications selected from a range of 500 nm to 1000 µm, optionally for some applications selected from a range of 500 nm to 100 µm, and optionally for some applications selected from a range of 500 nm to 10 µm.

As with other components of the transient device, the physical properties of the inorganic semiconductor components, metallic conductor components and/or dielectric components (e.g., Young's modulus, net bending stiffness, toughness, conductivity, resistance, etc.) impact the performance and transience of the device. In some embodiments, for example, at least a portion, and optionally all, of the inorganic semiconductor components, metallic conductor components and/or dielectric components of the device independently have a Young's modulus less than or equal to 10 GPa, optionally for some applications less than or equal to 100 MPa, optionally for some applications less than or equal to 10 MPa. In some embodiments, for example, at least a portion, and optionally all, of the inorganic semiconductor components, metallic conductor components and/or dielectric components of the device have a Young's modulus selected over the range of 0.5 MPa and 10 GPa, and optionally for some applications selected over the range of 0.5 MPa and 100 MPa, and optionally for some applications selected over the range of 0.5 MPa and 10 MPa. In some embodiments, at least a portion, and optionally all, of the inorganic semiconductor components, metallic conductor components and/or dielectric components of the device have a net bending stiffness less than or equal to $1 \times 10^8$ GPa µm$^4$, optionally for some applications less than or equal to $5 \times 10^5$ GPa µm$^4$ and optionally for some applications less than or equal to $1 \times 10^5$ GPa µm$^4$. In some embodiments, at least a portion, and optionally all, of the inorganic semiconductor, metallic conductor components and/or dielectric components of the device have a net bending stiffness selected over the range of $0.1 \times 10^4$ GPa µm$^4$ and $1 \times 10^8$ GPa µm$^4$, and optionally for some applications between $0.1 \times 10$ GPa µm$^4$ and $5 \times 10^5$ GPa µm$^4$.

Useful materials for the inorganic semiconductor components include high quality semiconductor materials such as single crystalline semiconductor materials including pure and doped single crystalline semiconductor materials. In an embodiment, all of the inorganic semiconductor components comprise a single crystalline semiconductor material and/or a single crystalline doped semiconductor material, for example, single crystalline silicon and/or doped single crystalline silicon derived from high temperature foundry processing. Integration of single crystalline semiconductor materials into a transient device is particularly beneficial for providing devices exhibiting very good electronic properties. In an embodiment, the semiconductor components comprise a material selected from the group consisting of Si, Ge, Se, diamond, fullerenes, SiC, SiGe, SiO, SiO$_2$, SiN, AlSb, AlAs, AlIn, AlN, AlP, AlS, BN, BP, BAs, As$_2$S$_3$, GaSb, GaAs, GaN, GaP, GaSe, InSb, InAs, InN, InP, CsSe, CdS, CdSe, CdTe, Cd$_3$P$_2$, Cd$_3$As$_2$, Cd$_3$Sb$_2$, ZnO, ZnSe, ZnS, ZnTe, Zn$_3$P$_2$, Zn$_3$As$_2$, Zn$_3$Sb$_2$, ZnSiP$_2$, CuCl, PbS, PbSe, PbTe, FeO, FeS$_2$, NiO, EuO, EuS, PtSi, TlBr, CrBr$_3$, SnS, SnTe, PbI$_2$, MoS$_2$, GaSe, CuO, Cu$_2$O, HgS, HgSe, HgTe, HgI$_2$, MgS, MgSe, MgTe, CaS, CaSe, SrS, SrTe, BaS, BaSe, BaTe, SnO$_2$, TiO, TiO$_2$, Bi$_2$S$_3$, Bi$_2$O$_3$, Bi$_2$Te$_3$, BiI$_3$, UO$_2$, UO$_3$, AgGaS$_2$, PbMnTe, BaTiO$_3$, SrTiO$_3$, LiNbO$_3$, La$_2$CuO$_4$, La$_{0.7}$Ca$_{0.3}$MnO$_3$, CdZnTe, CdMnTe, CuInSe$_2$, copper indium gallium selenide (CIGS), HgCdTe, HgZnTe, HgZnSe, PbSnTe, Tl$_2$SnTe$_5$, Tl$_2$GeTe$_5$, AlGaAs, AlGaN, AlGaP, AlInAs, AlInSb, AlInP, AlInAsP, AlGaAsN, GaAsP, GaAsN, GaMnAs, GaAsSbN, GaInAs, GaInP, AlGaAsSb, AlGaAsP, AlGaInP, GaInAsP, InGaAs, InGaP, InGaN, InAsSb, InGaSb, InMnAs, InGaAsP, InGaAsN, InAlAsN, GaInNAsSb, GaInAsSbP, and any combination of these. In some embodiments, the inorganic semiconductor components include a material selected from the group consisting of Si, SiC, SiGe, SiO, SiO$_2$, SiN, and any combination of these. In some embodiments, the inorganic semiconductor components independently comprise single crystalline silicon, porous silicon and/or polycrystalline silicon. In some embodiments, the inorganic semiconductor components independently comprise a polycrystalline semiconductor material, single crystalline semiconductor material or doped polycrystalline or single crystalline semiconductor material. In some embodiments, the inorganic semiconductor component is a transformable material. Useful materials for a transformable, inorganic semiconductor component include, but are not limited to, porous silicon, polycrystalline silicon, and any combination of these.

In some embodiments, the transient device may include one or more additional device components selected from the group consisting of an electrode, a dielectric layer, a chemical or biological sensor element, a pH sensor, an optical sensor, an optical source, a temperature sensor, and a capacitive sensor. The additional device component may comprise a bioinert material, a degradable material or a transformable material. Useful bioinert materials include, but are not limited to, titanium, gold, silver, platinum, and any combination of these. Useful degradable or transformable materials include, but are not limited to, iron, magnesium, tungsten and any combination of these.

In some embodiments, electronic devices comprise one or more interconnected island and bridge structures. For example, an island structure may comprise one or more semiconductor circuit components of the transient device. A bridge structure may comprise one or more flexible and/or stretchable electrical interconnections providing electrical communication between elements, for example between different island structures. In this manner, electronic devices of the present invention may comprise stretchable electronic devices having a plurality of electrically interconnected inorganic semiconductor components comprising one or more island structures and one or more flexible and/or stretchable bridge structures providing electrical interconnection; e.g., stretchable electronic interconnects.

In some embodiments, at least a portion of the plurality of inorganic semiconductor components comprise one or more of an amplifier circuit, a multiplexing circuit, a current limiting circuit, an integrated circuit, a transistor or a transistor array. Useful multiplexing circuits include those configured to individually address each of a plurality of electrodes spatially arranged over the degradable substrate. In addition, the transient device may further comprise one or more additional device components selected from the group consisting of an electrode, a dielectric layer, a chemical or biological sensor element, a pH sensor, an optical sensor, an optical source, a temperature sensor, and a capacitive sensor. At least one of the additional device components may comprise a bioinert material or a bioresorbable material.

In some embodiments, the transient device, or components thereof, are assembled on the substrate via a printing-based or molding-based process, for example, by transfer printing, dry contact transfer printing, solution-based printing, soft lithography printing, replica molding, imprint lithography, etc. In some of these embodiments, therefore, the device, or components thereof, comprise printable semiconductor materials and/or devices. Integration of the device and substrate components via a printing-based technique is beneficial in some embodiments, as it allows for independent processing of semiconductor devices/materials and processing for the substrate. For example, the printing-based assembly approach allows semiconductor devices/materials to be processed via techniques that would not be compatible with some substrates. In some embodiments, for example, the semiconductor device/materials are first processed via high temperature processing, physical and chemical deposition processing, etching and/or aqueous processing (e.g. developing, etc.), and then subsequently assembled on the substrate via a printing-based technique. An advantage of this approach is that it avoids processing of the semiconductor device/materials on the substrate in a manner that could negatively impact the chemical and/or physical properties of the substrate, for example, by negatively impacting biocompatibility, toxicity and/or the degradation properties (e.g., degradation rate, etc.) of the transformable substrate. In some embodiments, for example, this approach allows for effective fabrication of the device without exposing the substrate to aqueous processing, for example, processing involving exposure of the transformable substrate to an etchant, a stripper or a developer.

In some embodiments, at least a portion, and optionally all, of the plurality of inorganic semiconductor components of the device is bonded to the substrate. Bonding between the device and the substrate may be achieved directly involving covalent and noncovalent bonding (e.g., Van der Waals forces, hydrogen bonding, London dispersion forces, etc.) between layers and materials. Alternatively, bonding may be achieved by incorporation of an adhesive layer provided between the device and the substrate. Useful adhesive layers for bonding comprise a polymer, an elastomer (e.g. PDMS), a prepolymer, a thin metal layer, a silk layer, etc.

In some embodiments, for example, an encapsulating material functions to encapsulate portions of, or all of, the device, thereby preventing current leakage to the local environment and/or electrical shorting of the device. In an embodiment, the encapsulating material encapsulates at least 50% of the inorganic semiconductor components and/or metallic conductor components of the device, optionally at least 90% of the inorganic semiconductor components and/or metallic conductor components of the device, and optionally all of the inorganic semiconductor components and/or metallic conductor components of the device. In an embodiment, the encapsulating material completely encapsulates the transient device.

A variety of materials are useful for the degradable substrate of the present devices. In an embodiment, the substrate comprises a selectively removable material. In an embodiment, the selectively removable material of the substrate undergoes removal by a process selected from the group consisting of resorption, bioresorption, (chemical or enzymatic) hydrolysis, disintegration, de-polymerization, dissolution, sublimation, melting, etching and corrosion. In an embodiment, the substrate comprises a biocompatible, bioresorbable or ecocompatible material. Useful materials for the substrate include, for example, a biopolymer (e.g., protein, peptide, carbohydrate, polynucleotide, etc.), a synthetic polymer, a protein, a polysaccharide, silk, poly(glycerol-sebacate) (PGS), polydioxanone, poly(lactic-co-glycolic acid) (PLGA), polylactic acid (PLA), polyvinyl alcohol (PVA), gelatin, collagen, chitosan, fibroin, hyaluronic acid, protease particles, fluorescin, rose Bangal, rhodamine, reflectin, bacteriorhodopsin, hemoglobin, porphyrin and combinations of these. Useful silk materials for bioresorbable substrates include, for example, silkworm fibroin, modified silkworm fibroin, spider silk, insect silk, recombinant silk, and any combination of these. As used herein, modified silkworm fibroin refers to a polymer composition that is derived via chemical modification of silkworm fibroin.

In some embodiments, the substrate and/or encapsulating material comprises silk, which may be in an at least partially crystalline state. For example, the silk may have a degree of crystallinity less than 55%, or selected over the range of 0 to 55%. In one embodiment, the substrate comprises a silk composite material. For example, the silk composite material may comprise silk having a plurality of nanoparticles dispersed throughout the silk material, wherein the nanoparticles comprise a conductor (e.g., metal), semiconductor material, nanotube, nanowire, nanoshell (metallic shell with a dielectric core), pigments, dyes and combinations thereof. In some embodiments, the nanoparticles comprise a material selected from the group consisting of Au, Ag, CsSe and CdTe. Typically, the nanoparticles have physical dimensions equal to or less than 1000 nm, and the nanoparticles are present in the silk material at a concentration selected from the range of 0.1 nM to 100 nM, or from the range of 0.5 nM to 50 nM, or from the range of 1 nM to 25 nM. In some embodiments, the nanoparticles absorb electromagnetic radiation, thereby generating heat that is capable of triggering selective removal of the substrate. Absorbtion of electromagnetic energy for triggering a thermal degradation process depends upon both nanoparticle concentration and the power of the applied electromagnetic energy. In an embodiment, absorption of electromagnetic radiation is plasmonic-resonance enhanced absorption.

In some embodiments, a transient substrate or encapsulating material may be transformed by exposure to high temperature. For example, the glass transition temperature of silk is ~178° C. and degradation commences at ~220° C.

In some embodiments, transformation of a substrate or encapsulating material may be facilitated or expedited by a high concentration of certain salts (e.g., lithium salts, calcium salts) that permeabilize the substrate or encapsulating material.

In some embodiments, the substrate is a material that undergoes hydrolysis in an aqueous environment at a rate equal to or greater than the hydrolysis rate of the inorganic semiconductor component or metallic conductor component at 298K. In some embodiments, the substrate is a material that undergoes hydrolysis in an aqueous environment at a rate equal to or less than the hydrolysis rate of the inorganic semiconductor component or metallic conductor component at 298K. In other embodiments, the substrate is a material that undergoes sublimation at a temperature equal to or greater than 273 K.

The physical dimensions and physical properties of the transformable substrate are important parameters for supporting a range of device functionalities and compatibility with different environments. In some embodiments, the transformable substrate has a thickness less than or equal to 10,000 µm, and optionally in some embodiments less than or equal to 1000 µm, and optionally in some embodiments less than or equal to 100 µm, and optionally in some embodiments less than or equal to 10 µm; and optionally in some embodiments less than or equal to 1 µm. Use of a thin transformable substrate (e.g., thickness less than or equal to 100 microns, optionally less than or equal to 10 microns and optionally less than or equal to 1 micron) is useful for providing a flexible, or otherwise deformable, device capable of establishing conformal contact with a wide range of environments, including environments having complex, highly contoured surfaces. In some embodiments, the transformable substrate has a thickness selected over the range of 5 nanometers and 200 μm, optionally for some embodiments selected over the range of 10 nanometers and 100 μm, optionally for some embodiments selected over the range of 100 nanometers and 10000 μm, optionally for some applications selected over the range of 1 μm and 1000 μm, and optionally for some embodiments selected over the range of 1 μm and 10 μm. In embodiments where the transformable substrate is only a few nanometers thick, a supporting substrate may be necessary or supportability may be improved by a layer-by-layer deposition technique. In some embodiments, the composition and physical properties (e.g., Young's modulus, net bending stiffness, toughness, etc.) of the transformable substrate are selected to provide sufficient structural support for the device component, while also providing an ability to achieve a high degree of conformal contact upon deployment. In some embodiments, the transformable substrate is a low modulus layer. Alternatively, the invention includes devices having a transformable substrate that is a high modulus layer. In some embodiments, for example, the transformable substrate has a Young's modulus less than or equal to 10 GPa, preferably for some applications a Young's modulus less than or equal to 100 MPa, optionally for some applications less than or equal to 10 MPa. In some embodiments, for example, the transformable substrate has a Young's modulus selected over the range of 0.5 MPa and 10 GPa, and optionally for some applications selected over the range of 0.5 MPa and 100 MPa, and optionally for some applications selected over the range of 0.5 MPa and 10 MPa. In some embodiments, for example, the transformable substrate has a net bending stiffness less than or equal to $1 \times 10^9$ GPa μm$^4$, optionally for some applications less than or equal to $1 \times 10^7$ GPa μm$^4$ and optionally for some applications less than or equal to $1 \times 10^6$ GPa μm$^4$. In some embodiments, for example, the transformable substrate has a net bending stiffness selected over the range of $0.1 \times 10^4$ GPa μm$^4$ and $1 \times 10^9$ GPa μm$^4$, and optionally for some applications between $0.1 \times 10^4$ GPa μm$^4$ and $5 \times 10^5$ GPa μm$^4$.

The invention includes transformable substrates comprising amorphous materials, crystalline materials, partially amorphous materials, partially crystalline materials or combinations thereof. In an embodiment, the transient device of the invention includes an at least partially crystalline material, wherein the extent of crystallinity of the transformable substrate is selected to provide a useful and/or preselected transformable rate for a selected environment and device application. In some embodiments, the larger the degree of crystallinity of the transformable substrate the slower the transformable rate when provided in contact with the environment. For example, the invention includes transient devices having a transformable substrate with a degree of crystallinity less than or equal to 55%, and optionally a degree of crystallinity less than or equal to 30% and optionally a degree of crystallinity less than or equal to 20%, and optionally a degree of crystallinity less than or equal to 5%. For example, the invention includes transient devices having a transformable substrate with a degree of crystallinity selected over the range of 0 to 55%, and optionally for some embodiments a degree of crystallinity selected over the range of 1 to 30%, and optionally for some a degree of crystallinity selected over the range of 5 to 20%. As used herein, 0% crystallinity refers to an entirely amorphous material and the given degree of crystallinity corresponds to the amount of a material provided in a crystalline state relative to the total amount of material. In some embodiments, for example those having a silk substrate, the degree of crystallinity refers to the beta sheet content of the silk substrate.

In some embodiments, the device includes a transformable substrate having a programmable, controllable and/or selectable transformation rate when provided in contact with an environment. The invention includes devices having transformable substrates exhibiting a range of transformation rates that are selected on the basis of an intended application, device functionality, longevity, etc. In some embodiments, for example, the transformable substrate exhibits a high transformation rate so as to provide rapid and complete transformation upon administration, for example, to facilitate conformational and/or morphological changes useful for deploying the device in a particular environment. In other embodiments, for example, the transformable substrate exhibits a low resorption rate so as to provide slow and/or incomplete degradation upon administration, for example, to provide encapsulation of electronic components of the device and/or to provide structural properties useful for deploying or removing the device.

In an embodiment, a transient electronic device comprises an inorganic semiconductor component and/or metallic conductor component comprising a material engineered to accelerate resorption, bioresorption, hydrolysis, disintegration, de-polymerization, dissolution, etching or corrosion. The engineered material may, for example, be a perforated structure. A "perforated structure" may comprise recessed features, holes, channels, cracks, or other physical defects that prevent a structure from being monolithic and contiguous within at least one major plane of the structure. In an embodiment, one or more inorganic semiconductor components or one or more metallic conductor components independently comprise one or more perforated structures. For example, the one or more perforated structures may have a porosity (or void fraction) selected from the range of 10%-80%, 20%-50% or 30%-40%. In an embodiment, the perforated structures may have a porosity greater than 20%, greater than 30%, greater than 50%, or greater than 70%. "Porosity" generally describes a ratio of the volume of all the pores in a material to the volume of the whole. As is known in the art, the porosity ratio may be expressed as a percentage.

In an embodiment, one or more perforated structures may have a plurality of recessed features or channels. In an embodiment, the recessed features or channels extend entirely through a thickness of the one or more inorganic semiconductor components or the one or more metallic conductor components. In an embodiment, the recessed features or channels extend 0.1% to 100%, or 1% to 95%, or 5% to 85%, or 10% to 75%, or 25% to 50% through a thickness of the one or more inorganic semiconductor components or the one or more metallic conductor components. In an embodiment, the recessed features or channels extend a length selected over the range 10 nm to 10 mm through a thickness of the one or more inorganic semiconductor components or the one or more metallic conductor components. In an embodiment, the recessed features or channels have lateral cross sectional dimensions selected from the range of 0.1 μm$^2$ to 10 cm$^2$, or 0.5 μm$^2$ to 5 cm$^2$, or 1 μm$^2$ to 1 cm$^2$, or 10 μm$^2$ to 0.1 cm$^2$ and vertical dimensions selected from the range of 0.01 μm to 10 mm, or 0.05 μm to 5 mm, or 0.1 μm to 1 mm, or 10 μm to 0.1 mm.

In some embodiments, a transient electronic device comprises a reservoir fabricated from a material that is susceptible to degradation when exposed to radiation of a particular wavelength. An aqueous solution or other chemical(s) in the reservoir may escape from the reservoir upon degradation of the radiation-susceptible material and interact with device components to accelerate their degradation or transformation.

The internal or external stimulus may, for example, be a change in biological environment, a change in temperature, a change in pressure, exposure to electromagnetic radiation, contact with a chemical agent, application of an electric field, application of a magnetic field, exposure to a solvent, change in pH of an external environment, change in salt concentration of an external environment, or application of an anodic voltage.

In an embodiment, the transient electronic device includes a wireless power component comprising a selectively transformable material. In an embodiment, the wireless power component is a coil, a battery, a fuel cell, an energy harvester, a solar cell, or an inductor. The energy harvester may be selected from a thermoelectric component and a piezoelectric component.

In an embodiment, the transient electronic device is a sensor, a power supply, an optoelectronic device, a nanoelectromechanical (NEM) device, or a microelectromechanical (MEM) device. When the transient electronic device is a sensor, the sensor may detect light intensity changes, light wavelength changes, temperature changes, chemical changes, mechanical changes, electrical changes, magnetic changes, and combinations thereof. When the transient device is a power supply, the power supply may be a coil, a battery, a fuel cell, or an energy harvester. The energy harvester may be selected from a thermoelectric component or a piezoelectric component.

In an embodiment, the wireless power component converts the electromagnetic energy via the photovoltaic effect, non-resonant inductive coupling, near-field mutual inductance coupling, or a combination thereof. When the wireless power component operates via the photovoltaic effect, the wireless power component may be a solar cell or solar array. When the wireless power component operates via non-resonant inductive coupling, the wireless power component may be an inductor that conducts a current in response to an alternating magnetic field. The device component being powered may be a resistor in electrical communication with the inductor. The resistor generates heat when the current is conducted through the inductor. When the wireless power component operates via near-field mutual inductance coupling, the wireless power component includes a scavenging rectifier. The scavenging rectifier absorbs radio energy through a scavenging antenna that collects ambient alternating current (AC) signals, wherein the ambient AC signals are converted into direct current (DC) by a rectifier. An input frequency of the scavenging rectifier is about 2.4 GHz. A rectified output of the scavenging rectifier is selected from the range of 1 V to 3 V.

In an embodiment, the device operates as a radio and further comprises an oscillator coupled to a transmitting antenna for transmitting a signal indicative of a state of the transient electronic device or a parameter of an environment of the transient electronic device. An output frequency of the oscillator may be about 1 GHz.

In an embodiment, a transient electronic device comprises one or more inorganic semiconductor components. In some embodiments, each of the one or more inorganic semiconductor components independently comprise a nanomembrane structure, which may for example have a thickness less than 1000 nm. In an embodiment, each of the inorganic semiconductor components independently comprise Si, Ga, GaAs, ZnO or any combination of these. In an embodiment, the one or more inorganic semiconductor components comprise ZnO.

In an embodiment, one or more inorganic semiconductor components independently comprise a semiconductor material that undergoes hydrolysis in an aqueous environment at a rate equal to or greater than $10^{-10}$ s$^{-1}$ at 298 K, or equal to or greater than $10^{-8}$ s$^{-1}$ at 298 K, or equal to or greater than $10^{-5}$ s$^{-1}$ at 298 K, or equal to or greater than $10^{-2}$ s$^{-1}$ at 298 K.

In an embodiment, the transient electronic device comprises one or more metallic conductor components, and the one or more metallic conductor components of a transient electronic device may comprise Mg, W, Fe or an alloy thereof. In a particular embodiment, the one or more metallic conductor components independently comprise an alloy of Mg with one or more additional materials selected from the group consisting of Al, Ag, Ca, Li, Mn, Si, Sn, Y, Zn, and Zr, wherein the one or more additional materials of the alloy has a concentration equal to or less than 10% by weight. In another embodiment, the one or more metallic conductor components independently comprise an alloy of Mg with one or more rare earth elements, wherein the one or more rare earth elements of the alloy has a concentration equal to or less than 10% by weight. In another embodiment, the transient electronic device includes one or more inorganic semiconductor components comprising ZnO and one or more metallic conductor components comprising Mg, Fe, W or an alloy thereof.

In an embodiment, one or more metallic conductor components independently comprise a semiconductor material that undergoes hydrolysis in an aqueous environment at a rate equal to or greater than $10^{-10}$ s$^{-1}$ at 298 K, or equal to or greater than $10^{-8}$ s$^{-1}$ at 298 K, or equal to or greater than $10^{-5}$ s$^{-1}$ at 298 K, or equal to or greater than $10^{-2}$ s$^{-1}$ at 298 K.

In an embodiment, a transient electronic device may comprise one or more dielectric components supported by the substrate, wherein the one or more dielectric components comprise a selectively removable material. In an embodiment, the selectively removable material of the one or more dielectric components may undergo removal by a process selected from the group consisting of resorption, bioresorption, hydrolysis, disintegration, de-polymerization, dissolution, sublimation, melting, etching and corrosion. In some embodiments, one or more dielectric components comprise biocompatible, bioresorbable or ecocompatible material. In some embodiments, each of the dielectric components comprises one or more thin film structures, which may for example be deposited or grown by molecular epitaxy, atomic layer deposition, physical or chemical vapor deposition, or other methods known in the art. Typically, each of the one or more dielectric components has a thickness selected over the range of 10 nm to 50 μm, or a thickness less than or equal to 100 nm or a thickness less than or equal to 10 nm.

In an embodiment, the one or more dielectric components may comprise one or more materials selected from the group consisting of $SiO_2$, MgO, silk, collagen, gelatin, PVA and PLGA. In a particular embodiment, the transient electronic device includes one or more inorganic semiconductor components selected from the group consisting of ZnO and Si, one or more metallic conductor components selected from the group consisting of Mg, Fe, W and alloys thereof and one or more dielectric components selected from the group consisting of SiO$_2$ and MgO. In another embodiment, the transient electronic device includes one or more inorganic semiconductor components comprising ZnO, one or more metallic conductor components selected from the group consisting of Mg, Fe, W and alloys thereof and one or more dielectric components comprising MgO. In an embodiment, one or more dielectric components comprise a material that undergoes hydrolysis in an aqueous environment at a rate equal to or greater than $10^{-10}$ s$^{-1}$ at 298 K, or equal to or greater than $10^{-8}$ s$^{-1}$ at 298 K, or equal to or greater than $10^{-5}$ s$^{-1}$ at 298 K, or equal to or greater than $10^{-2}$ s$^{-1}$ at 298 K.

The one or more inorganic semiconductor components, the one or more metallic conductor components or the one or more dielectric components may be assembled on the substrate by microtransfer printing.

In an embodiment, the substrate, the one or more inorganic semiconductor components, and the one or more metallic conductor components independently comprise a selectively removable material.

In an embodiment, the transient electronic device may further comprise an adhesion promoting layer disposed between the substrate and at least a portion of the metal conductor components. For example, the adhesion promoting layer may comprise a material selected from the group consisting of magnesium oxide, titanium, and combinations thereof.

The transient electronic device has a neutral mechanical plane and, in some embodiments, at least a portion, and optionally all, of the one or more inorganic semiconductor components are positioned proximate (e.g., within 10 microns, and optionally within 1 micron) to the neutral mechanical plane. A thickness of the transformable substrate may be selected so as to position at least a portion of the one or more inorganic semiconductor components proximate to the neutral mechanical plane. Embodiments having inorganic semiconductor components positioned proximate to the neutral mechanical plane are useful for applications where the device undergoes a significant change in conformation upon deployment, for example, by enhancing the structural integrity of the device when provided in a non-planar (e.g., bent, curved, convex, concave, etc.) conformation and/or in a stretched conformation.

In some embodiments, a transient device may be partially or completely encapsulated in a package material. In an embodiment, the package material comprises a pair of cross-linked silk sheets that completely encapsulate the device when edges of the sheets are laminated together. For example, the sheets may be two freestanding silk films formed by casting and peeling, which are then sealed along the edges by lamination. Generally, the sheets will have a thickness selected from the range of 1 micron to 200 microns, or from 2 microns to 100 microns, or from 5 microns to 50 microns. From a practical point of view, a film thinner than 1 micron (while freestanding) may be difficult to make and handle using some techniques, while a film thicker than 200 microns may be rigid and susceptible to cracking during handling using some techniques. Alternatively, in some embodiments, the package material may be a pre-formed hollow silk tube having a thickness selected over the range of 1 micron to 1 centimeter, optionally for some applications 5 microns to 2 millimeters, and optionally for some applications 10 microns to 50 microns. Typically, the package material has a thickness of about 20 μm per sheet.

In an embodiment, an encapsulating material at least partially encapsulates one or more inorganic semiconductor components or one or more metallic conductor components, wherein the encapsulating material comprises a selectively removable material that is at least partially removed to expose underlying inorganic semiconductor components or metallic conductor components. In an embodiment, the encapsulating material is removed in response to the external or internal stimulus.

In an embodiment, the encapsulating material is an overlayer provided on the one or more inorganic semiconductor components or provided on the one or more metallic conductor components; wherein the overlayer has a thickness selected over the range of 10 nm to 10 mm, or 20 nm to 1 mm, or 50 nm to 0.1 mm. The encapsulating material may be provided directly on the one or more inorganic semiconductor components or the one or more metallic conductor components or indirectly with one or more intermediate structures/layers between the encapsulating material and the one or more inorganic semiconductor components or the one or more metallic conductor components.

In an embodiment, the encapsulating material has a preselected transience profile different than the preselected transience profile of the one or more inorganic semiconductor components or the one or more metallic conductor components. For example, in an embodiment, the transience profile may be at least one order of magnitude larger than that of the one or more inorganic semiconductor components or the one or more metallic conductor components.

In an embodiment, the transience profile may be characterized by the removal of the encapsulating material occurring over a time interval selected from the range of 1 ms to 2 years, or 1 ms to 1 year, or 1 ms to 6 months, or 1 ms to 1 month, or 1 ms to 1 day, or 1 ms to 1 hour, or 1 second to 10 minutes, thereby exposing the underlying inorganic semiconductor components or metallic conductor components. For example, the transience profile may be characterized by the removal of 0.01% to 100%, or 0.1% to 70%, or 0.5% to 50%, or 1% to 20% or 1% to 10% of the encapsulating material over a time interval selected from the range of 1 ms to 2 years, or 1 ms to 1 year, or 1 ms to 6 months, or 1 ms to 1 month, or 1 ms to 1 day, or 1 ms to 1 hour, or 1 second to 10 minutes, thereby exposing the underlying inorganic semiconductor components or metallic conductor components. In an embodiment, the transience profile may be characterized by a decrease in the average thickness of the encapsulating material at a rate selected over the range of 0.01 nm/day to 10 microns s$^{-1}$, or 0.1 nm/day to 1 micron s$^{-1}$, or 1 nm/day to 0.5 micron s$^{-1}$.

In an embodiment, the encapsulating material comprises a material selected from the group consisting of MgO, silk, collagen, gelatin, PLGA, polyvinylalcohol (PVA), PLA, SiO$_2$, polyanhydrides (polyesters), polyhydroxyalkanoates (PHAs) and polyphosphates. In an embodiment, the encapsulating material comprises silk, where the silk may be in an at least partially crystalline state. For example, the silk may have a degree of crystallinity less than 55%, or selected over the range of 1 to 55%. In an embodiment, an encapsulating material comprises a pair of cross-linked silk sheets that completely encapsulate the transient electronic device when edges of the sheets are laminated together.

In some embodiments, the encapsulating material comprises a silk composite material. The silk composite material may comprise silk having a plurality of nanoparticles dispersed throughout the silk, wherein each of the nanoparticles independently comprise a conductor or semiconductor material. For example, each of the nanoparticles may independently comprise a material selected from the group consisting of Au, Ag, CsSe and CdTe. Typically, the nanoparticles have physical dimensions equal to or less than 1000 nm, and the nanoparticles are present in the silk at a concentration selected from the range of 0.1 nM to 100 nM. In some embodiments, the nanoparticles absorb electromagnetic radiation, thereby generating heat that is capable of causing selective removal of the encapsulating material. For example, the absorbtion of electromagnetic radiation may be plasmonic-resonance enhanced absorption.

In some embodiments, the encapsulating material is a material that undergoes hydrolysis in an aqueous environment at a rate equal to or greater than $10^{-10}$ s$^{-1}$ at 298 K, or equal to or greater than $10^{-8}$ s$^{-1}$ at 298 K, or equal to or greater than $10^{-5}$ s$^{-1}$ at 298 K, or equal to or greater than $10^{-2}$ s$^{-1}$ at 298 K. In other embodiments, the encapsulating material is a material that undergoes sublimation at a temperature equal to or greater than 273 K. For example, the sublimable encapsulating material may be a material selected from the group consisting of $CO_2$, $I_3$, naphthalene, ammonium chloride, iron chloride, aluminum chloride, melamine, nickelocene, camphor, and caffeine.

In some embodiments, the encapsulating material is a composite material comprising a plurality of sublimable fibers provided in a nonsublimable material, wherein sublimation of the sublimable fibers results in selective removal of the encapsulating material. The composite material may, for example, be solution casted, electrospun or spin casted material.

The time for the thickness of selectively removable materials to reach zero is given by:

$$t_c = \frac{4\rho_m M(H_2O)}{kw_0 M(m)} \frac{\sqrt{\frac{kh_0^2}{D}}}{\tanh\sqrt{\frac{kh_0^2}{D}}}$$

where $t_c$ is the critical time, $\rho_m$ is the mass density of the material, $M(H_2O)$ is the molar mass of water, $M(m)$ is the molar mass of the material, $h_0$ is the initial thickness of the material, D is the diffusivity of water, k is the reaction constant for the dissolution reaction, and $w_0$ is the initial concentration of water, wherein k has a value selected from the range of $10^5$ to $10^{-10}$ s$^{-1}$, or from the range of $10^3$ to $10^{-7}$ s$^{-1}$, or from the range of $10^2$ to $10^{-4}$ s$^{-1}$, or from the range of 10 to $10^{-2}$ s$^{-1}$.

In an embodiment, the physical properties of the transient device (e.g., Young's modulus, net bending stiffness, toughness, etc.) provide rigidity for the device to be self-supporting, while also being capable of achieving a high degree of conformal contact with an environment. In an embodiment, the substrate, the device having one or more inorganic semiconductor components, and the one or more metallic conductor components provide a net bending stiffness of the transient device of less than $1 \times 10^9$ GPa µm$^4$, or a net bending stiffness selected from a range of $0.1 \times 10^4$ GPa µm$^4$ to $1 \times 10^8$ GPa µm$^4$, optionally $1 \times 10^5$ GPa µm$^4$ to $1 \times 10^8$ GPa µm$^4$. In some embodiments, the substrate, the inorganic semiconductor components and the one or more metallic conductor components each independently comprise a transformable material.

In an embodiment, the transient device, and/or components thereof, are at least partially optically transparent with respect to visible and/or infrared electromagnetic radiation. In an embodiment, for example, the transient device, substrate, inorganic semiconductor components and/or metallic conductor components exhibit a percentage transmission for light in the visible region of the electromagnetic spectrum equal to or greater than 70% and equal to or greater than 90% for some applications. At least partially optically transparent devices are useful for visualizing and/or imaging the device during administration and/or use. In addition, devices of the invention that are at least partially optically transparent are useful for coupling electromagnetic radiation into and/or out of the device. The invention includes, for example, devices having an LED or laser array component for illuminating an environment or optical sensing, wherein the device is capable of transmitting light from the device component through other components of the device, such as the substrate.

In some biological environments, such as an in vivo biological environment, the degradation of the substrate occurs via enzymatic degradation, for example, via protease mediated degradation. In addition, degradation occurs in some embodiments from the surfaces of the bioresorbable substrate that are exposed to the biological environment having degradation enzymes present, such as at the interface with a tissue and/or biological fluid. Accordingly, certain parameters of the degradable substrate may be selected to effectively control the degradation rate. In an embodiment, the chemical composition, physical state and/or thickness of the degradable substrate is selected so as to control the degradation rate. In an embodiment, for example, the degradable substrate comprises a biopolymer exhibiting a useful degradation rate for a selected biological environment.

In some specific embodiments, transient devices of the invention do not include a substrate component. In an embodiment, for example, the transient devices of the invention initially includes a substrate component, which is selectively removed during deployment and/or operation such that the device makes a transition to a transient device not having a substrate. An embodiment of this aspect includes a transient device for biomedical applications, wherein contact with a biological environment, such as contact with a tissue or cell in vivo, results in loss of the substrate via bioresoprtion.

Devices of some aspects are useful generally for in vivo biomedical applications including sensing, actuating, imaging and/or delivery of therapeutic agents to a local biological environment. In an embodiment, for example, devices of the invention are useful for making electrophysiology measurements of a target tissue in a biological environment or for electrophysically actuating a target tissue in a biological environment, where the biological environment may be an in vivo biological environment, and where the target tissue may be selected from, but not limited to, heart tissue, brain tissue, muscle tissue, nerve tissue, epithelial tissue and vascular tissue.

The geometry and/or morphology of the substrate are other characteristics important to establishing the functional capabilities of the present devices. In an embodiment, the substrate is a continuous layer having approximately uniform thickness (e.g., thicknesses within 10% of average thickness of the layer). Alternatively, the invention includes devices having a substrate comprising a discontinuous layer and/or a layer having a nonuniform thickness profile. The invention includes transient devices having additional substrates and/or layers, for example, for partial or full encapsulation and/or electronic isolation of device components (e.g., semiconductors, metallic conductor components, dielectrics, etc.).

The physical dimensions, composition and geometry of metallic conductor components are important parameters of electronic devices of the invention. In an embodiment, metallic conductor components are metal films, for example thin (e.g., thickness<100 microns) metal films. Use of thin metallic conductor components (e.g., thickness less than or equal to 100 microns, optionally less than or equal to 10 microns and optionally less than or equal to 1 micron) is useful for providing a flexible, or otherwise deformable, device. In some embodiments, one or more metallic conductor components comprise one or more thin film structures, which may for example be deposited or grown by molecular epitaxy, atomic layer deposition, physical or chemical vapor deposition, or other methods known in the art. In some embodiments, metallic conductor components comprise a biocompatible, bioresorbable or ecocompatible material. In an embodiment, at least a portion, and optionally all of, the metallic conductor components comprise a biocompatible metal, such as titanium, gold, silver, platinum, and any combination of these. In an embodiment, at least a portion, and optionally all of, the metallic conductor components comprise a transformable metal, such as of iron, magnesium, tungsten and any combination of these. In an embodiment, each of the metallic conductor components has a thickness less than or equal to 10 microns, and optionally each of the metallic conductor components has a thickness less than or equal to 1 micron, and optionally each of the metallic conductor components has a thickness less than or equal to 500 nanometers, and optionally each of the metallic conductor components has a thickness less than or equal to 100 nm, and optionally each of the metallic conductor components has a thickness less than or equal to 20 nm. In an embodiment, each of the metallic conductor components has a thickness selected over the range of 10 nanometers to 100 microns, and optionally a thickness selected over the range of 100 nanometers to 1 micron, and optionally a thickness selected over the range of 100 nanometers to 500 nanometers. In an embodiment, each of the metallic conductor components has lateral dimensions less than or equal to 10000 microns, and optionally lateral dimensions less than or equal to 1000 microns, and optionally lateral dimensions less than or equal to 100 microns, and optionally lateral dimensions less than or equal to 10 microns. In an embodiment, metallic conductor components in an array are separated from adjacent metallic conductor components by a distance greater than or equal to 10 microns, and optionally a distance greater than 100 microns. In an embodiment, adjacent metallic conductor components are separated from each other by a distance selected from the range of 10 microns to 10 millimeters, and optionally the range of 10 microns to 1000 microns, and optionally the range of 10 to 100 microns.

Degradation of the substrate is useful for deploying, or otherwise positioning, manipulating and/or interfacing the transient device (e.g., a surface, a portion and/or component thereof) in a given environment. In some embodiments, for example, the transient device is brought into conformal contact with an environment by a process involving degradation or transformation of the substrate, for example, wherein a degradation process brings the transient device in contact (e.g., physical, electrical, thermal, etc.) with the environment, and optionally wherein the degradation process causes conformal and/or morphological changes to the transient device that assist in interfacing the device with the environment. In some embodiments, the device is deployed in, or otherwise positioned, manipulated and/or interfaced with, an environment via a process involving complete degradation or transformation of the substrate, for example, so as to provide the transient device in physical contact, electrical contact or optical communication with an environment. In some embodiments of this aspect, therefore, the degradable or transformable layer functions as a sacrificial layer during deployment so as to facilitate interfacing the transient device with the environment. Alternatively, in other embodiments, the device is deployed in, or otherwise positioned, manipulated and/or interfaced with, an environment via a process involving partial, but not complete, degradation or transformation of the substrate, for example, so as to provide the transient device in physical contact, electrical contact or optical communication with an environment. In some embodiments of this aspect, therefore, the degradable or transformable layer functions as a partial sacrificial layer during deployment but remains as a structural and/or functional component of the device during use. In some embodiments, for example, partial or complete degradation or transformation of the substrate provides a means of selectively adjusting and/or manipulating the physical dimensions, conformation, morphology and/or shape of the transient device so as to facilitate establishing conformal contact with an environment. In some embodiments, partial or complete degradation or transformation of the substrate provides a means of selectively adjusting the chemical composition of the transient device so as to establish conformal contact with an environment in a compatible manner, such as in a manner suppressing undesirable immune response and/or inflammation.

Methods, disclosed herein, of making and using transient electronic devices may be implemented to produce or utilize all embodiments of the transient electronic devices disclosed herein.

In an aspect, a method of using a passive transient electronic device comprises: providing the passive transient electronic device comprising: a substrate; one or more inorganic semiconductor components, one or more metallic conductor components or one or more inorganic semiconductor components and one or more metallic conductor components supported by the substrate; wherein the one or more inorganic semiconductor components or one or more metallic conductor components independently comprise a selectively transformable material, wherein the one or more inorganic semiconductor components or the one or more metallic conductor components have a preselected transience profile in response to an external or internal stimulus; wherein at least partial transformation of the one or more inorganic semiconductor components or the one or more metallic conductor components provides a programmable transformation of the passive transient electronic device in response to the external or internal stimulus and at a preselected time or at a pre-selected rate, wherein the programmable transformation provides a change of the function of the passive transient electronic device from a first condition to a second condition; and exposing the passive transient device to the external or internal stimulus, thereby programmably transforming the passive transient electronic device.

In an aspect, a method of using an actively triggered transient electronic device, comprises: providing the actively triggered transient electronic device comprising: a substrate; one or more inorganic semiconductor components, one or more metallic conductor components or one or more inorganic semiconductor components and one or more metallic conductor components supported by the substrate;

wherein the one or more inorganic semiconductor components or the one or more metallic conductor components independently comprise a selectively transformable material, wherein the one or more inorganic semiconductor components or the one or more metallic conductor components have a preselected transience profile in response to an external or internal stimulus; and an actuator responsive to a user initiated external trigger signal and operably connected to the one or more inorganic semiconductor components or the one or more metallic conductor components, wherein upon the device receiving the external trigger signal the actuator directly or indirectly initiates at least partial transformation of the one or more inorganic semiconductor components or the one or more metallic conductor components in response to the internal or external stimulus, thereby providing a programmable transformation of the actively triggered transient electronic device in response to the external trigger signal, wherein the programmable transformation provides a change of the function of the actively triggered transient electronic device from a first condition to a second condition; and exposing the actively triggered transient electronic device to the external or internal stimulus, thereby programmably transforming the actively triggered transient electronic device.

In an aspect, a method of making a transient electronic device comprises the steps of: providing a device substrate; providing on the device substrate one or more inorganic semiconductor components, one or more metallic conductor components or one or more inorganic semiconductor components and one or more metallic conductor components; wherein the one or more inorganic semiconductor components or one or more metallic conductor components independently comprise a selectively transformable material, wherein the one or more inorganic semiconductor components or the one or more metallic conductor components have a preselected transience profile in response to an external or internal stimulus; thereby generating the transient electronic device; wherein at least partial transformation of the one or more inorganic semiconductor components or the one or more metallic conductor components provides a programmable transformation of the passive transient electronic device in response to the external or internal stimulus and at a pre-selected time or at a pre-selected rate, wherein the programmable transformation provides a change in function of the passive transient electronic device from a first condition to a second condition.

In an embodiment, the selectively transformable material is selected from the group consisting of Mg, W, Fe, an alloy of Mg with one or more additional materials selected from the group consisting of Al, Ag, Ca, Li, Mn, Si, Sn, Y, Zn, and Zr, wherein the one or more additional materials of the alloy has a concentration equal to or less than 10% by weight, and an alloy of Mg with one or more rare earth elements, wherein the one or more rare earth elements of the alloy has a concentration equal to or less than 10% by weight.

In an embodiment, the selectively transformable material is selected from the group consisting of Si, Ga, GaAs, and ZnO.

In some fabrication processes, the step of providing on the device substrate the one or more inorganic semiconductor components, one or more metallic conductor components or one or more inorganic semiconductor components and one or more metallic conductor components comprises: fabricating an assembly of device components on a fabrication substrate, wherein the assembly of device components comprises one or more single crystalline inorganic semiconductor structures, one or more dielectric structures or one or more metallic conductor structures; and transferring at least a portion of the assembly of device components from the fabrication substrate to the device substrate. In an embodiment, the device components on the fabrication substrate comprise single crystalline Si, Ga or GaAs. In another embodiment, the device components on the fabrication substrate comprise $SiO_2$.

In an embodiment, a method of making a transient electronic device further comprises a step of providing the one or more inorganic semiconductor components or one or more metallic conductor components comprising the selectively transformable material on the device substrate having the assembly of device components. For example, in an embodiment, the step of providing the one or more inorganic semiconductor components or one or more metallic conductor components comprising the selectively transformable material on the device substrate having the assembly of device components is carried out using a solution processing technique. In another embodiment, the step of providing the one or more inorganic semiconductor components or one or more metallic conductor components comprising the selectively transformable material on the device substrate having the assembly of device components is carried out using electrohydrodynamic printing.

In some embodiments, the step of fabricating the assembly of device components on a fabrication substrate is carried out at a semiconductor foundry. The fabrication substrate may, for example, be a semiconductor wafer substrate, a glass plate-type substrate, or a silicon-on-insulator substrate. In some embodiments, the step of fabricating the assembly of device components on a fabrication substrate is carried out using one or more high temperature deposition techniques selected from the group consisting of chemical vapor deposition, physical vapor deposition, epitaxial growth, atomic layer deposition, electrochemical deposition, and molecular beam epitaxy. The step of fabricating the assembly of device components on a fabrication substrate may be carried out under clean room conditions according to recognized standards, such as US FED STD 209E, ISO 14644-1, or BS 5295 cleanroom standards. Embodiments of the invention using foundry processing are beneficial for accessing high quality semiconductor and dielectric materials, such as single crystalline silicon and $SiO_2$, in useful device formats and layouts. In some embodiments, for example, methods of the invention includes a hybrid processes involving some processing steps carried out in a foundry (e.g., fabrication of high quality single crystalline silicon and $SiO_2$ device elements in a specific devise design) and other processing steps carried out using non-foundry techniques, such as solution phase processing. This hybrid approach leverages access to the high quality materials produced via foundry based techniques with flexibility for integration of a range of selectively transformable materials allowed by non-foundry techniques.

In some embodiments, the step of fabricating the assembly of device components on a fabrication substrate is carried out using one or more high temperature doping techniques and/or one or more high temperature annealing techniques. In some embodiments, the step of fabricating the assembly of device components on the fabrication substrate comprises generating a fully processed primitive or circuit element supported by the fabrication substrate.

In some embodiments, the step of fabricating the assembly of device components on a fabrication substrate is carried out using a photolithography or etching technique.

In some embodiments, the step of fabricating the assembly of device components on a fabrication substrate comprises generating one or more structures selected form the group consisting of: one or more single crystalline silicon semiconductor structures on the fabrication substrate each independently having a thickness less than or equal to 1 micron; one or more $SiO_2$ structures on the fabrication substrate each independently having a thickness less than or equal to 1 micron; and one or more metallic structures on the fabrication substrate each independently having a thickness less than or equal to 5 microns. In an embodiment, the step of fabricating the assembly of device components on a fabrication substrate comprises (1) laterally defining one or more single crystalline silicon semiconductor structures supported by the fabrication substrate, for example via photolithography and etching processing; (2) depositing one or more metallic structures on the fabrication substrate, for example via chemical or physical deposition; and (3) growing one or more $SiO_2$ structures.

In an embodiment, a method of making a transient electronic device further comprises a step of replacing at least a portion of the one or more single crystalline inorganic semiconductor structures, the one or more metallic conductor structures or the one or more dielectric structures with the selectively transformable material. For example, in an embodiment, the step of replacing at least a portion of the one or more single crystalline inorganic semiconductor structures, the one or more metallic conductor structures or the one or more dielectric structures with the selectively transformable material is not carried out at a semiconductor foundry.

In some embodiments, the step of replacing at least a portion of the one or more single crystalline inorganic semiconductor structures, the one or more metallic conductor structures or the one or more dielectric structures with the selectively transformable material is carried out using solution processing. In other embodiments, the step of replacing at least a portion of the one or more single crystalline inorganic semiconductor structures, the one or more metallic conductor structures or the one or more dielectric structures with the selectively transformable material is carried out using electrohydrodynamic printing.

In an embodiment, the method of making a transient electronic device comprises the step of replacing at least a portion of the one or more metallic conductor structures with the one or more selectively transformable metallic conductor materials.

In some embodiments, the one or more metallic conductor structures are replaced with a selectively transformable metal selected from the group consisting of Mg, W, Fe, an alloy of Mg with one or more additional materials selected from the group consisting of Al, Ag, Ca, Li, Mn, Si, Sn, Y, Zn, and Zr, wherein the one or more additional materials of the alloy has a concentration equal to or less than 10% by weight, and an alloy of Mg with one or more rare earth elements, wherein the one or more rare earth elements of the alloy has a concentration equal to or less than 10% by weight.

In an embodiment, the method of making a transient electronic device comprises the step of replacing at least a portion of the one or more metallic conductor structures comprising Au or Al with the selectively transformable material.

In some embodiments, a method of making a transient electronic device further comprises a step of releasing at least a portion of the assembly of device components from the fabrication substrate. For example, the step of releasing at least a portion of the assembly of device components from the fabrication substrate may be carried out by at least partially undercutting the one or more single crystalline inorganic semiconductor structures, the one or more dielectric structures and the one or more metallic conductor structures. Undercutting may be achieved via etching underneath the one or more single crystalline inorganic semiconductor structures, the one or more dielectric structures and the one or more metallic conductor structures.

In an embodiment, the fabrication substrate is a silicon-on-insulator substrate, and the method comprises at least partially etching a buried oxide layer of the silicon-on-insulator substrate, thereby at least partially undercutting the one or more single crystalline inorganic semiconductor structures, the one or more dielectric structures and the one or more metallic conductor structures.

In an embodiment, the step of releasing at least a portion of the assembly of device components from the fabrication substrate is carried out by microtransfer printing, which lifts off at least a portion of the one or more single crystalline inorganic semiconductor structures, the one or more dielectric structures and the one or more metallic conductor structures from the fabrication substrate. In some embodiments, the microtransfer printing fractures one or more anchors connecting the one or more single crystalline inorganic semiconductor structures, the one or more dielectric structures and the one or more metallic conductor structures to the fabrication substrate, thereby providing the liftoff.

In an embodiment, the microtransfer printing is dry transfer contact printing. The microtransfer printing technique may comprise: contacting at least a portion of the one or more single crystalline inorganic semiconductor structures, the one or more dielectric structures and the one or more metallic conductor structures with a contact surface of a conformal transfer device, wherein at least a portion of the one or more single crystalline inorganic semiconductor structures, the one or more dielectric structures and the one or more metallic conductor structures are adhered to the contact surface; and moving the conformal transfer device having the portion of the one or more single crystalline inorganic semiconductor structures, the one or more dielectric structures and the one or more metallic conductor structures adhered to the contact surface, thereby providing the liftoff.

In some embodiments, the microtransfer printing technique further comprises: contacting a receiving surface of the device substrate with the at least a portion of the one or more single crystalline inorganic semiconductor structures, the one or more dielectric structures and the one or more metallic conductor structures adhered to the contact surface; and separating the contact surface of conformal transfer device and the one or more single crystalline inorganic semiconductor structures, the one or more dielectric structures and the one or more metallic conductor structures, thereby transferring the one or more single crystalline inorganic semiconductor structures, the one or more dielectric structures and the one or more metallic conductor structures to the receiving surface of the device substrate. In some embodiments, the conformal transfer device is an elastomeric stamp.

In some embodiments, a method of making a transient electronic device further comprises the step of providing an actuator responsive to a user initiated external trigger signal and operably connected to the one or more inorganic semiconductor components or the one or more metallic conductor components, wherein upon the device receiving the external trigger signal the actuator directly or indirectly initiates the at least partial transformation of the one or more inorganic semiconductor components or the one or more metallic conductor components in response to the internal or external stimulus, thereby providing the programmable transformation of the transient electronic device in response to the external trigger signal.

In some embodiments, a method of making a transient electronic device further comprises the step of providing a receiver for receiving the user initiated external trigger signal, the receiver operationally connected to the actuator so as to initiate the at least partial transformation of the one or more inorganic semiconductor components or the one or more metallic conductor components in response to the user initiated external trigger signal. For example, the actuator may be in one-way or two-way communication with a transmitter, wherein the transmitter provides the user initiated external trigger signal to a receiver of the device operationally connected to the actuator.

In some embodiments, a method of making a transient electronic device further comprises providing an encapsulating material at least partially encapsulating the one or more of the inorganic semiconductor components or the one or more of the metallic conductor components. For example, the step of providing the encapsulating material at least partially encapsulating the one or more of the inorganic semiconductor components or the one or more of the metallic conductor components is carried out using solution processing or is carried out using spin casting or spin coating.

In some embodiments, the encapsulating material comprises a selectively removable material. Exemplary encapsulating materials include a material selected from the group consisting of MgO, silk, collagen, gelatin, PLGA, polyvinylalcohol (PVA), PLA, $SiO_2$, polyanhydrides (polyesters), polyhydroxyalkanoates (PHAs) and polyphosphates. In an embodiment, the encapsulating material comprises silk.

In some embodiments, the device substrate comprises a selectively removable material. For example, the device substrate may comprise a biocompatible, bioresorbable or ecocompatible material. In an embodiment, the device substrate comprises a polymer, or a material selected from the group consisting of silk, collagen, gelatin, PLGA, polyvinylalcohol (PVA), PLA, MgO, $SiO_2$, polyanhydrides (polyesters), polyhydroxyalkanoates (PHAs) and polyphosphates. In an embodiment, the device substrate comprises silk.

In some embodiments, a method of making a transient electronic device further comprises the step of determining the preselected transience profile and selecting the composition and physical dimensions of the one or more inorganic semiconductor components or the one or more metallic conductor components to provide the preselected transience profile.

In some embodiments, a method of making a transient electronic device further comprises a step of selecting a thickness or morphology of the one or more inorganic semiconductor components or the one or more metallic conductor components to provide the preselected transience profile.

In some embodiments, each of the one or more inorganic semiconductor components or the one or more metallic conductor components independently comprise a selectively transformable material.

"Spatially arranged over the degradable substrate" as used herein, refers to a distribution of elements (e.g. device components) over the surface area of a substrate such that each element is located at a different position. Inter-element spacing can be uniform or variable. In some embodiments, the elements are spatially arranged in a regular array pattern with equal inter-element spacing, for example in a 2D array. In some embodiments, the elements are spatially arranged in a line (e.g., a 1D array). Useful spatial arrangements include regular and irregular distributions of elements.

In some embodiments, the geometry of transient devices may be used to provide stretchability, flexibility, conformability and/or compressibility. In an embodiment, the devices may exploit inorganic semiconductor materials configured into structural shapes that can geometrically accommodate large mechanical deformations without imparting significant strain in the materials themselves. For example, bridges connecting rigid device islands may be wavy, buckled, serpentine or meandering as further described in U.S. patent application Ser. No. 11/851,182 (U.S. Pub. No. 2008/0157235); U.S. patent application Ser. No. 12/405,475 (U.S. Pub. No. 2010/059863); and U.S. patent application Ser. No. 12/398,811 (U.S. Pub. No. 2010/0002402), each of which is hereby incorporated by reference.

In an embodiment, devices disclosed herein comprise one or more stretchable components, such as disclosed in U.S. patent application Ser. No. 11/851,182 and/or U.S. patent application Ser. No. 12/405,475 and/or U.S. patent application Ser. No. 12/398,811, and are made by one or more of the processes disclosed therein. U.S. patent application Ser. No. 11/851,182; U.S. patent application Ser. No. 12/405,475; and U.S. patent application Ser. No. 12/398,811, which are hereby incorporated by reference.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE FIGURES

FIG. 7. Image of a bent demonstration platform for transient electronics, on a silk substrate. The flat state appears in FIG. 3a.

transfer curves measured from disintegrating transistors (left), current-voltage (I-V) curves of disintegrating transistors (middle) and I-V characteristics of disintegrating diodes (right).

FIG. 13A-B. Length-normalized change in resistance of a dissolving serpentine trace of Mg in water, encapsulated with a, PLGA, and b, Collagen.

Figure 14:
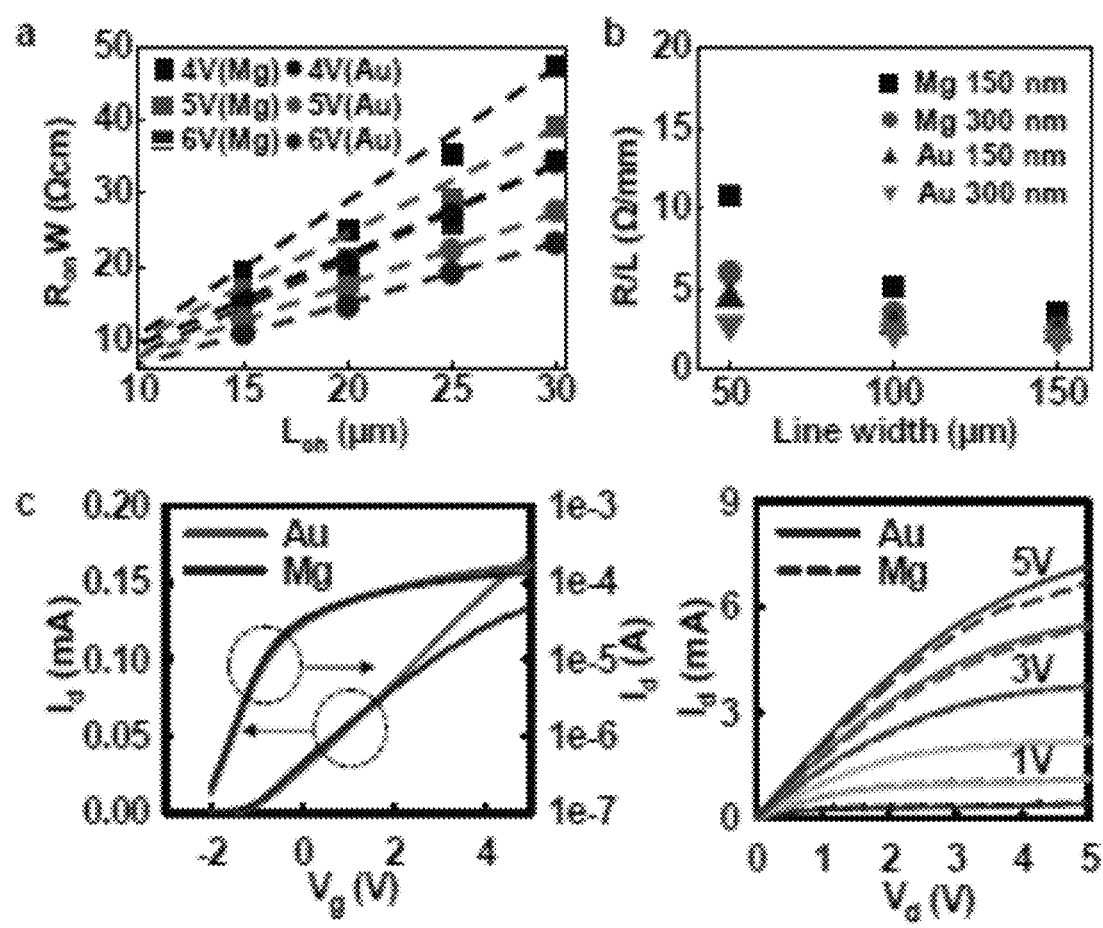
Figure 15:
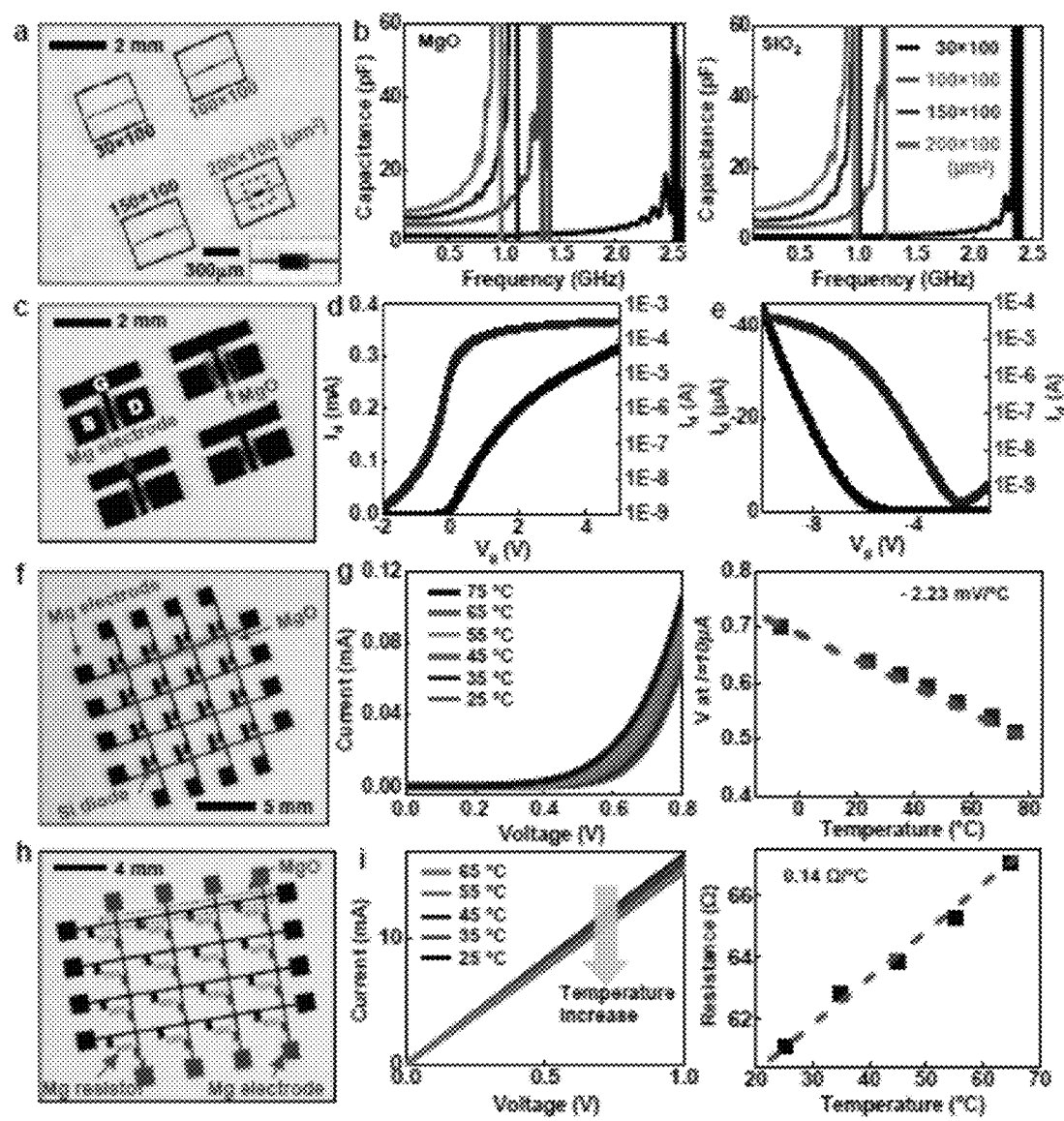

FIG. 14A-C. a, Comparison of Mg and Au source/drain electrodes in n-type MOSFETs, evaluated by their width-normalized resistance as a function of channel length at gate voltages of 4V, 5V, and 6V. b, Measured resistances of Mg and Au traces for multiple line widths, each for two different thicknesses, 150 nm, and 300 nm, respectively. c, Transfer curves (left), and I-V characteristics (right) from MOSFETs that use Mg and Au source/drain electrodes.

FIG. 15A-I. a, Images of transient capacitors with different sizes. The area of overlap of the two Mg electrodes is 30×100 µm (black), 100×100 µm (red), 150×100 µm (blue), 200×100 µm (purple). b, Measured capacitances using MgO (left) and $SiO_2$ (right) dielectrics. c, Image of n-channel transient MOSFETs, consisting of Mg source, drain, gate electrodes, MgO gate dielectrics and Si NM active layers. d, Linear (black) and log scale (blue) transfer curves of a representative MOSFETs shown in c. e, Linear (black) and log scale (blue) transfer curves of a p-channel transient MOSFET shown in the left frame of FIG. 5c. The channel length (L), and width (W) are 20 µm and 600 µm, respectively. The threshold voltage, mobility and on/off ratio are −6 V, 100±10 $cm^2/V \cdot s$ and ~$10^5$, respectively. f, Image of an interconnected 4×4 array of temperature sensors based on Si NM diodes. g, I-V characteristics of a temperature sensor at different temperatures (left). Voltages applied to a temperature sensor to yield an output current of 10 µA, at different temperatures. The voltage-temperature slope from the resulting calibration curve is ~−2.23 mV/° C. (right). h, Image of 4×4 array of temperature sensors that use Mg resistors, Mg interconnects, and MgO as an interlayer dielectric. i, I-V characteristics of a representative temperature sensor shown in h (left). Measured dependence of the resistance of a Mg temperature sensor on temperature (right). As the temperature increases, the resistance increases with the slope of ~0.14Ω/° C.

FIG. 16A-D. a, Image of solar cells that use ~3 µm thick Si plates and Mg interconnects (left). Current density and power measured from a representative device as a function of voltage (right). b, Experimental (symbol) and analytical (line) results of fractional change in resistance of a silicon resistor as a function of applied tensile (red), and compressive strain (blue). c, I-V characteristics of a representative pixel shown in the right frame of FIG. 5e. Dark (red) and Bright (blue) indicate the states of a light source on and off, respectively. d, Various images obtained using the 8×8 array of transient photodetectors, operated in a mode in which the object is scanned and a collection of recorded images is combined to improve the effect resolution. Each inset shows the original object pattern. A simple optics set-up containing an object, a diffusive light source, a plano-convex lens, and a separate data acquisition program were used. The distance between the lens and source image was 98 millimeters. In certain cases, an overscanning procedure was used to remove the effects of malfunctioning pixels.

FIG. 17A-D. Individual pixel layouts of various sensors, a, Temperature sensor based on Si diode (left), Mg resistor (right), b, Si solar cell, c, Si strain sensor, d, Si photodiode. Insets show electrical schematic diagrams of each sensor.

Figure 18:
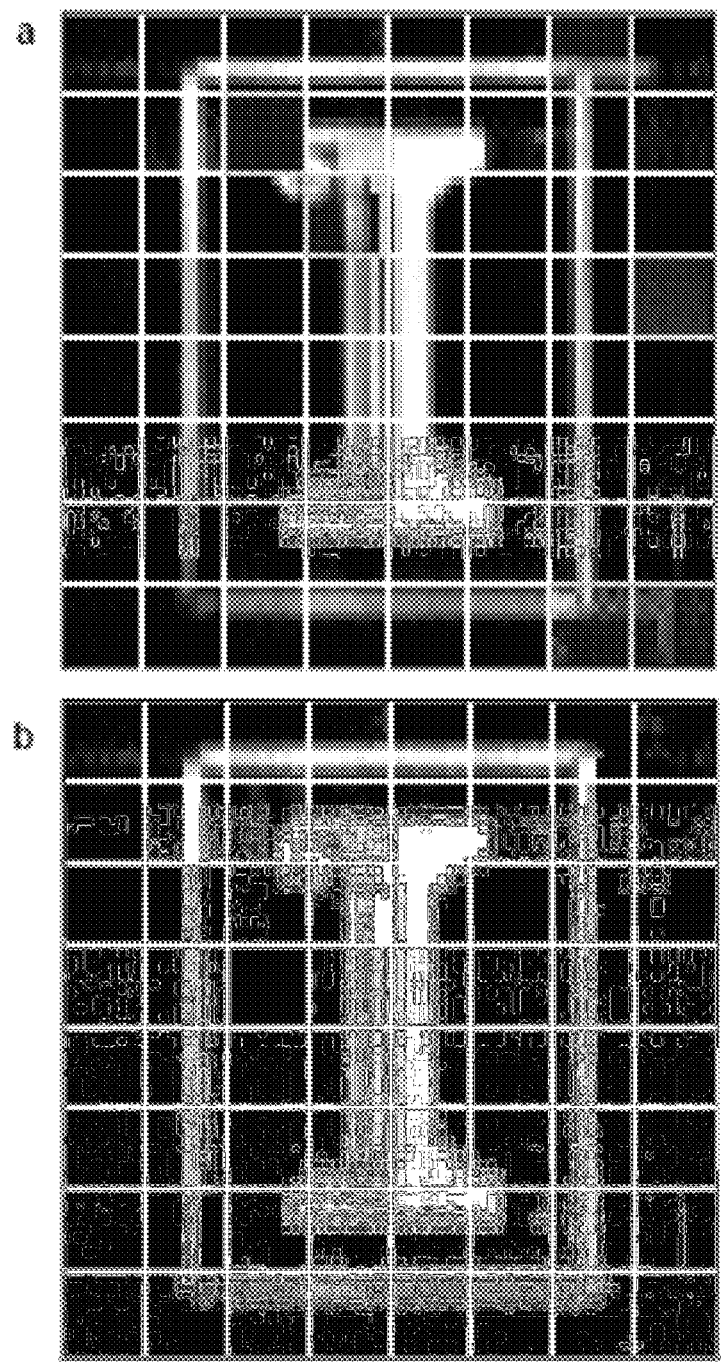
Figure 19:
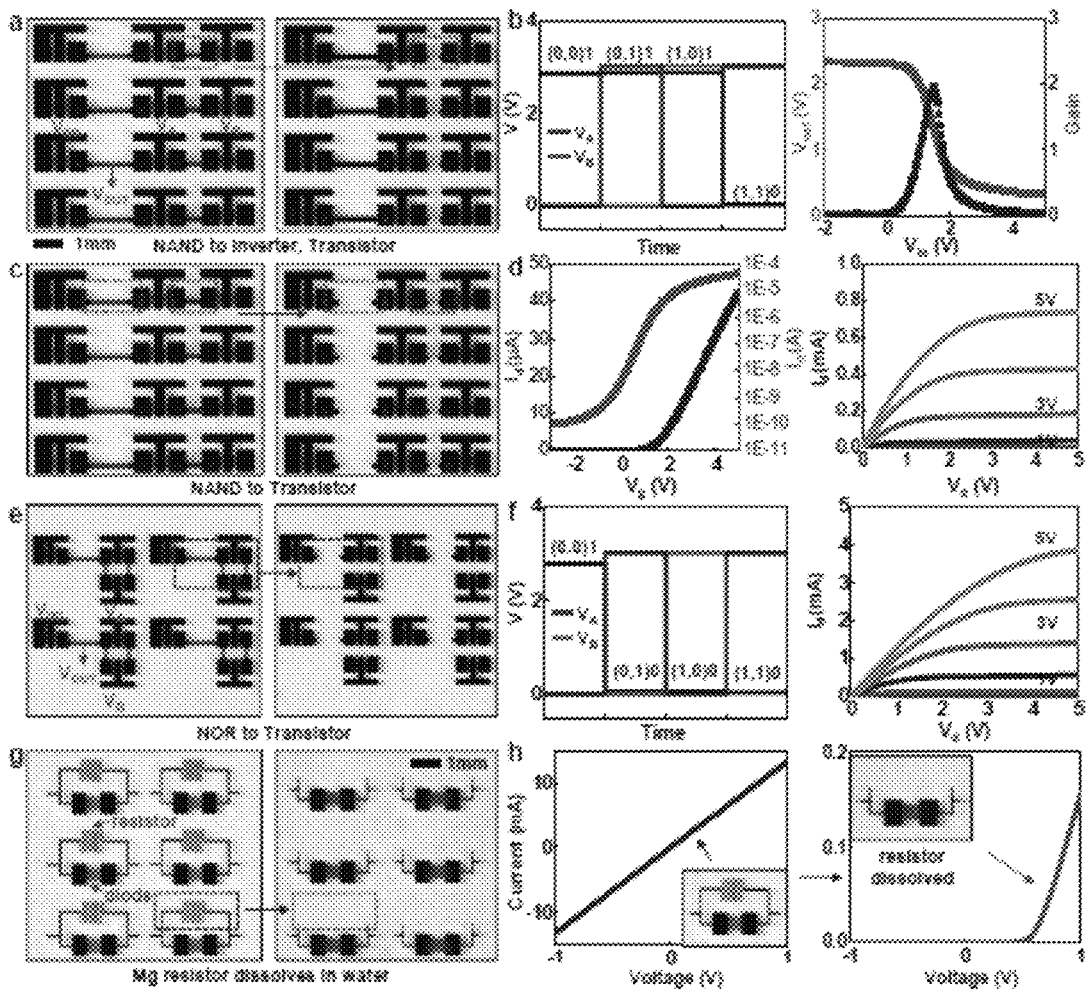

FIG. 18A-B. a, Image showing an uncorrected, normalized image captured by the transient camera. The red highlighted regions correspond to malfunctioning pixels. Their effects could be removed by overscanning. b, The result of this overscanning process.

FIG. 19A-H. Images and electrical characterization of transient electronic circuits before and after controlled transformation in function. a, Images of transformation from a NAND gate (left) to an inverter and transistor (right) by dissolution of a strategic Mg interconnect. b, Electrical characterization of a NAND gate with $V_A$ and $V_B$ indicating input voltages (left) and the voltage transfer characteristics of an inverter after transformation (right). c, Images of transformation from a NAND gate (left) to isolated transistors (right) by dissolution of a strategic Mg interconnect. d, Linear and log scale plots of the transfer curve (left) and current-voltage characteristics (right) of a resulting transistor after transformation. e, Images of transformation from a NOR gate (left) to individual transistors (right) by dissolution of a strategic Mg interconnect. f, Output voltage characteristics of the NOR gate (left) and I-V characteristic of a transistor after transformation. g, Image of a functional change from a Mg resistor (left) to a Si diode (right) by dissolution of the Mg resistor. h, I-V characteristic of a Mg resistor (left) and a Si diode (right).

Figure 20:
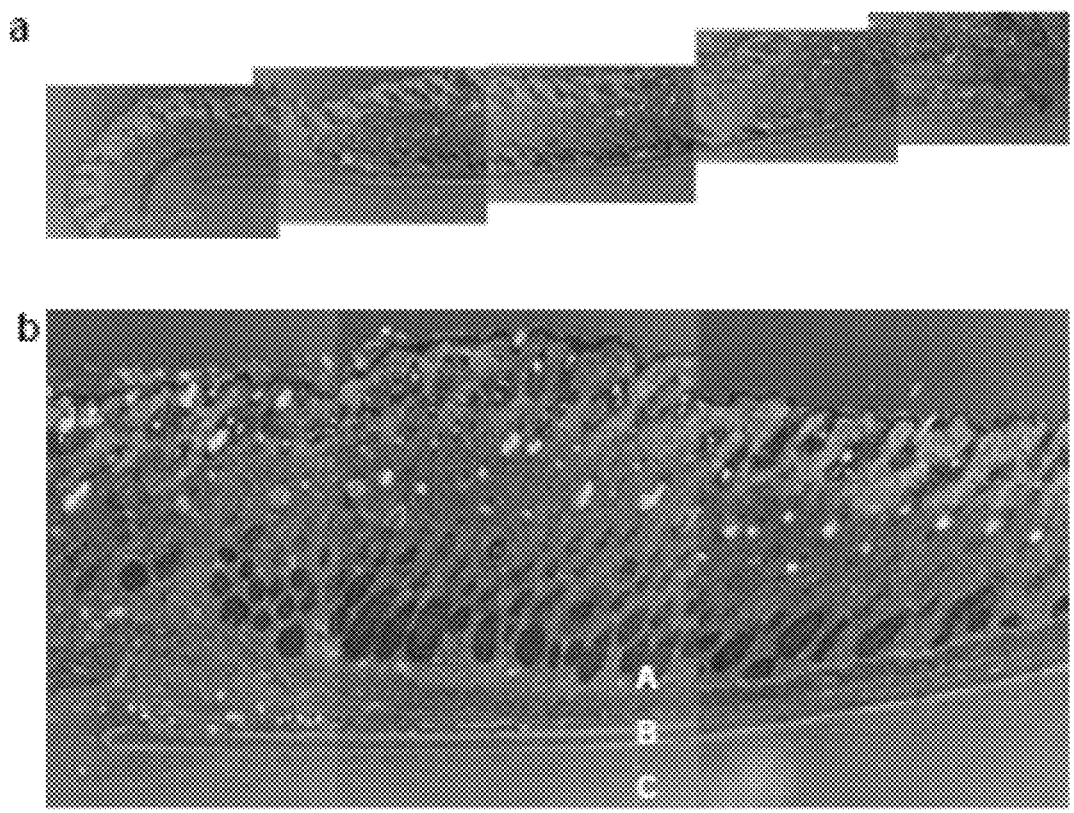

FIG. 20A-B. Additional histological analysis of biocompatibility. This example corresponds to a silk device, after implantation for 2 weeks. a, and b show composite collections of images at low and high magnification. (A, subcutaneous tissue; B, silk film; C, muscle layer)

Figure 21:
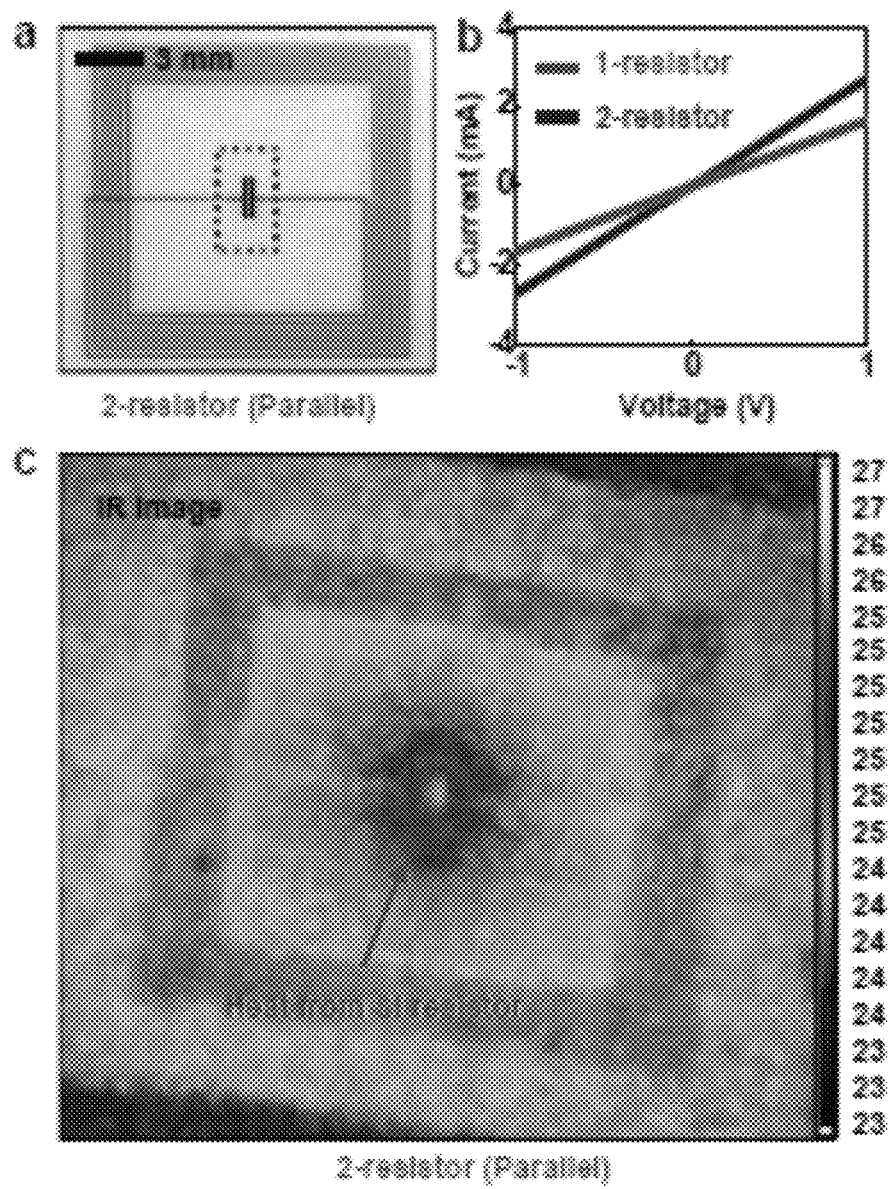

FIG. 21A-C. a, Image of wireless power coil integrated with two silicon resistors in parallel. b, I-V characteristics of the silicon resistors. c, Infrared (IR) image of heating coils powered wirelessly through inductive coupling, with 2 resistors.

Figure 22:
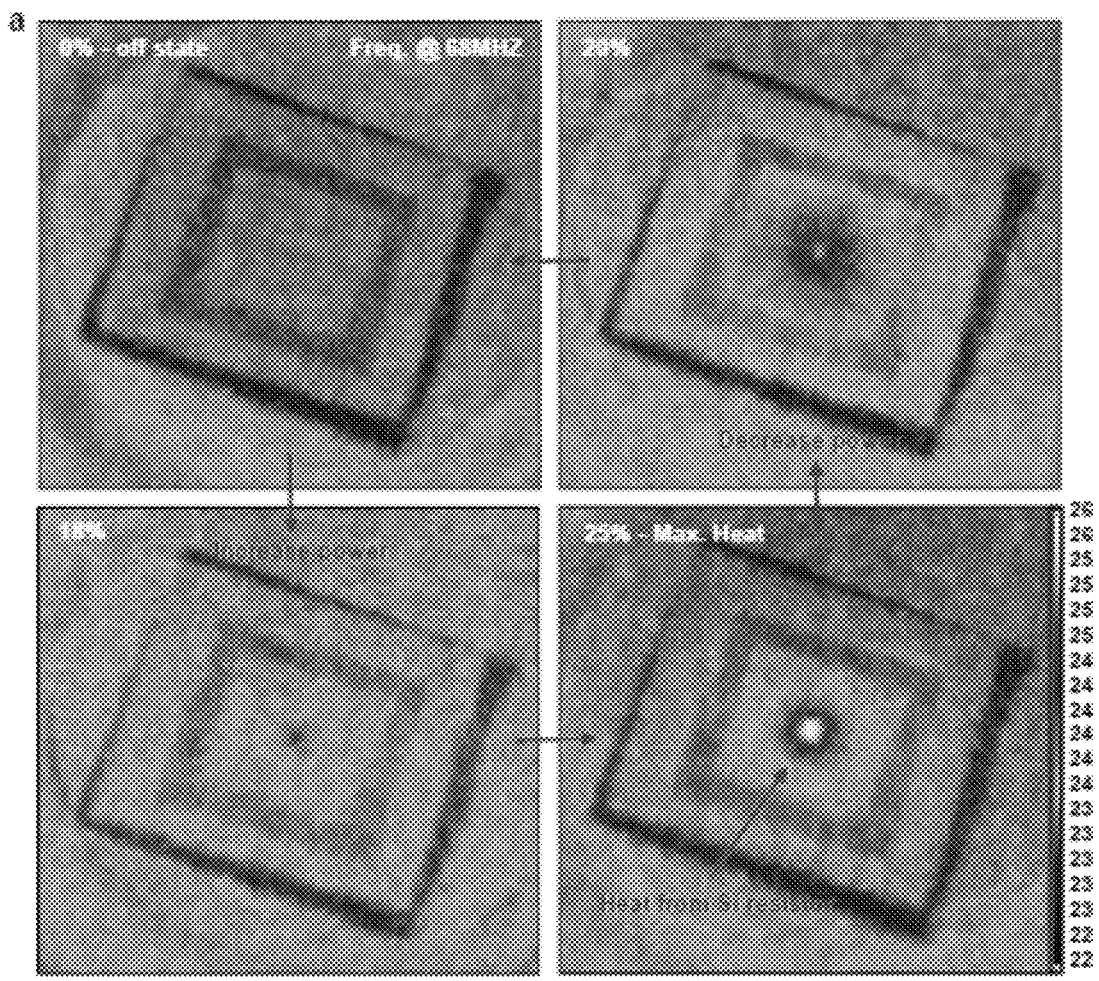

FIG. 22. Infrared image of a heater driven inductively at a frequency of 68 MHz using different input powers: 0% (top-left), 18% (bottom-left), 20% (top-right), and 25% (bottom-right).

Figure 23:
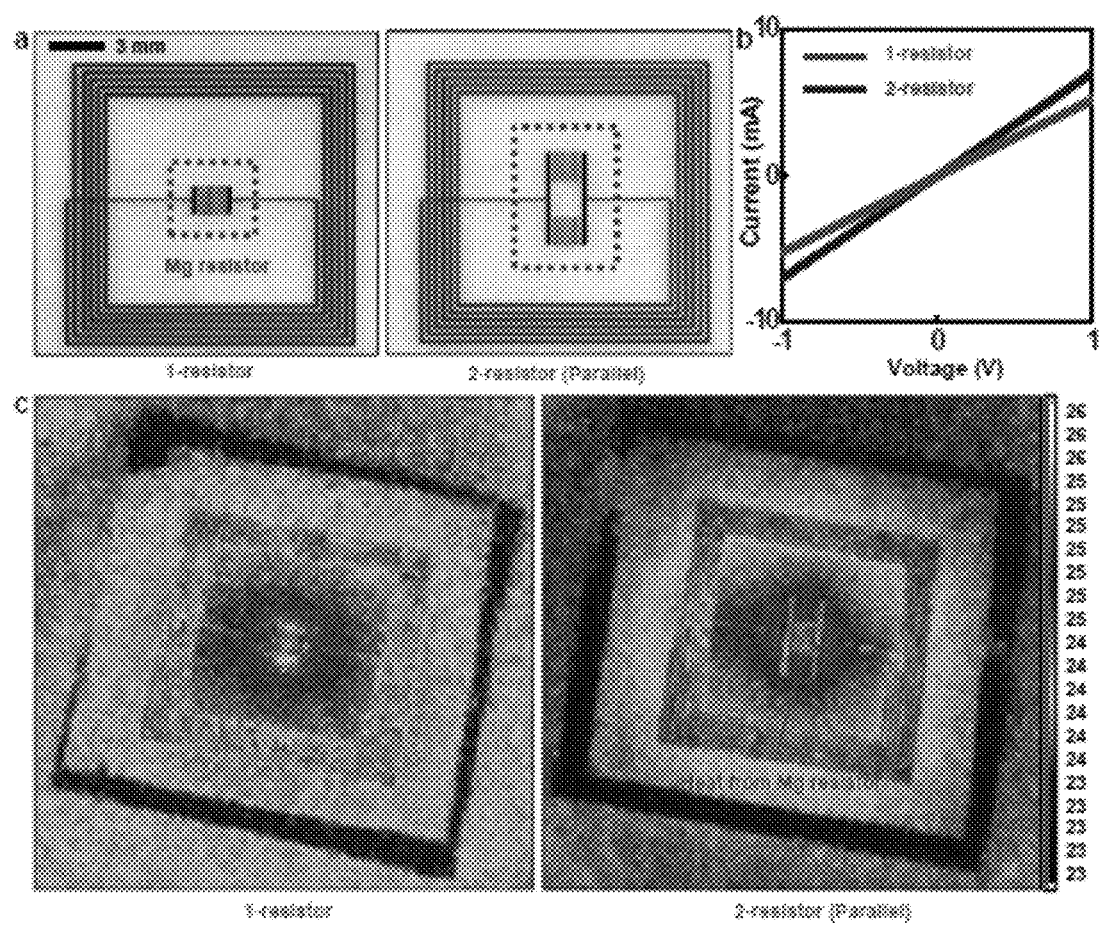
Figure 24:
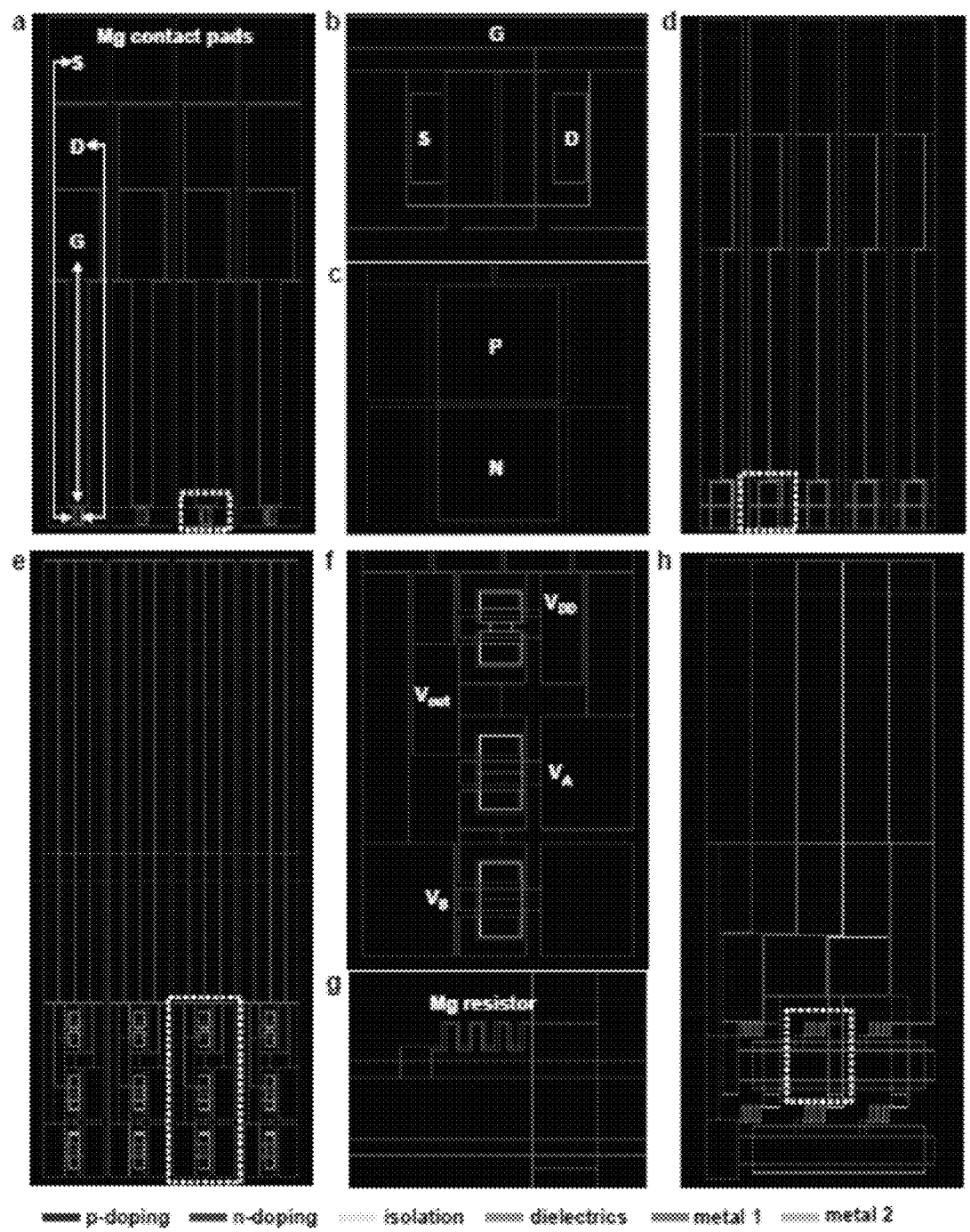

FIG. 23A-C. a, Demonstration of a Mg resistor integrated with an inductive coil: 1-resistor (left) and 2-resistor (right). b, Measured I-V characteristics of a Mg resistor. c, IR images of coils with different number of Mg resistors: 1 resistor (left) and 2 resistors (right).

FIG. 24A-H. Layouts of transient devices used for device-level studies. a, n-channel MOSFETs, b, Individual n-channel MOSFET, corresponding to the dashed white box in (a), c, Individual Si diodes, corresponding to the dashed white box in (d), d, Si diodes, e, NAND gates, f, Individual NAND gate, corresponding to the dashed white box in (e), g, Individual Mg resistor, corresponding to the dashed white box in (h), h, Mg resistors.

Figure 25:
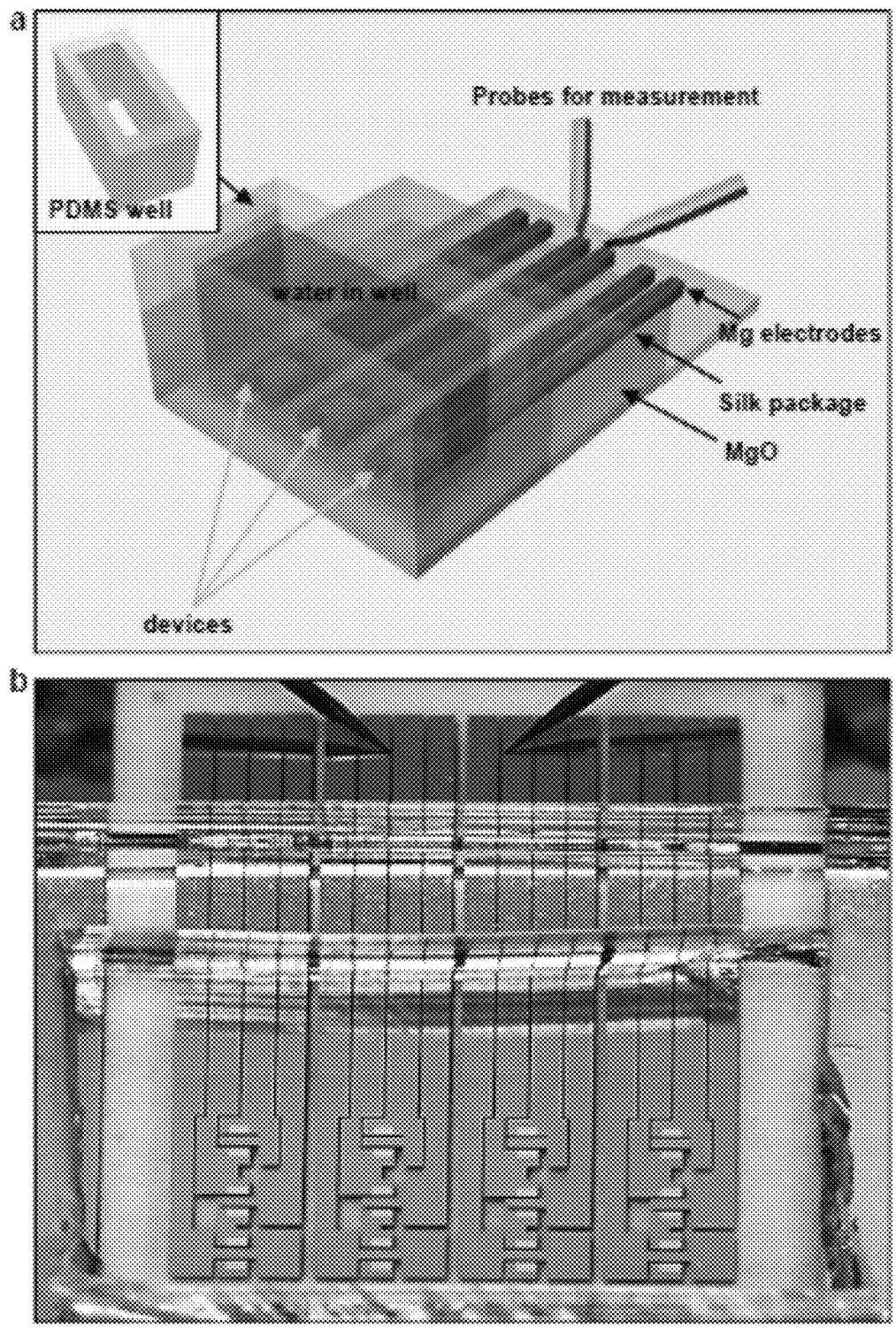

FIG. 25A-B. Structures for device-level studies of transience. a, Schematic illustration, showing the PDMS well and the remote probing pads, b, Top-view picture of an array of devices under test.

FIG. 26A-D. Studies of transience and tunability of transience at the device level. a, Linear (left) and log scale (right) transfer curves measured from a transient n-channel MOSFET, corresponding to the device shown in FIG. 4f, as a function of time after immersion in water. The data show dual kinetics in transience: negligible change in properties for the first ~4 days, followed by rapid decay. The thicknesses of the MgO and silk encapsulation layers determine the first timescale; the thickness of the Mg electrodes defines the second. b, Time dependent changes in current (left) and current-voltage characteristics of silicon diodes (right). The overall transient behaviors are similar to those of the MOSFET. The inset shows an image of an array of devices. c, Output voltage characteristics of a logic gate (NAND) measured under similar conditions, and with input voltages of 0 V. The inset shows an image of an array of devices. d, Measurements of length-normalized resistance and fractional changes of resistance in Mg traces as functions of time. The inset shows an array of resistors.

FIG. 27A-D. In vitro tests of bacterial inhibition provided by a transient, wireless thermal therapy device. a, Images of three different transient devices, each beneath agar and with a primary coil for wireless power delivery—an isolated, serpentine Mg resistor (left), an isolated Mg RF inductive coil (middle), an interconnected resistor and coil (coil+resistor, right). b, Magnified view of a resistor (left), a coil (middle) and a heater (right). c, Infrared images of agar plate with devices inductively powered at a frequency of 80 MHz. The resistor (left) and coil (middle) show negligible heating, as expected. The integrated device (right) shows a peak temperature of ~50° C. at the location of the resistor. d, Images of bacteria after incubation. The results show no bacteria clearance for the cases of the resistor (left) and coil (middle). The integrated device indicates bacteria clearance at a region corresponding to the resistor and hottest core zone (right).

Figure 28:
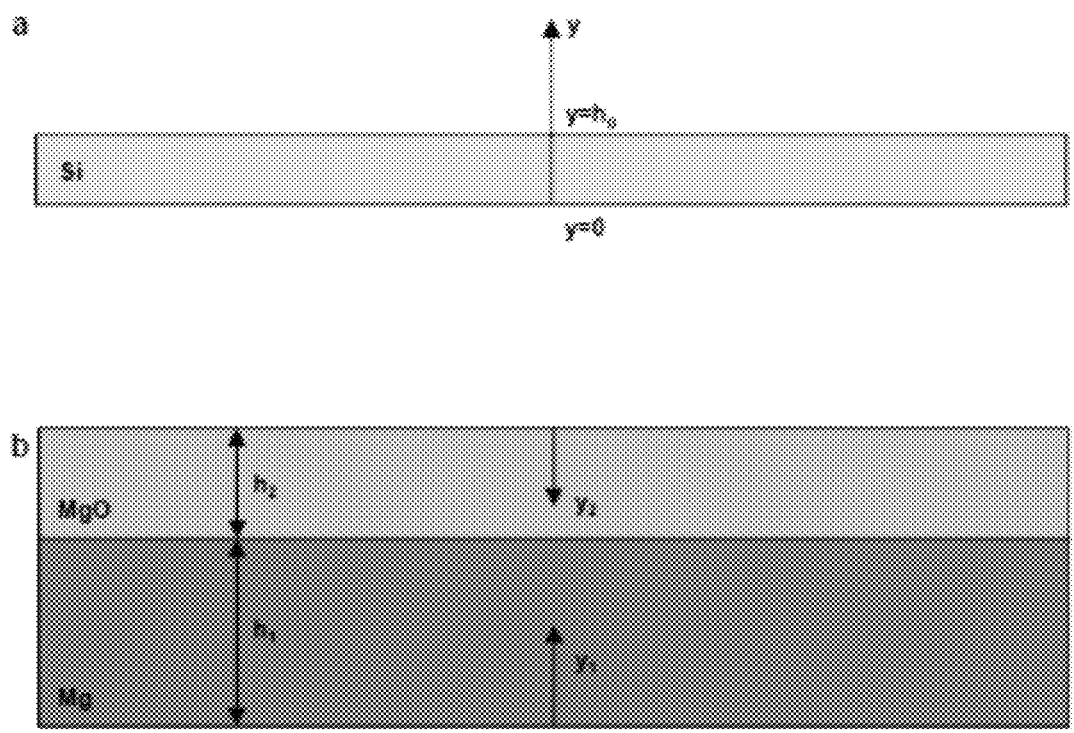

FIG. 28A-B. Schematic illustration for the theoretical models used to capture the kinetics of dissolution, a, Single layer, and b, Double layer.

FIG. 29A-F. AFM images and line profiles collected at various stages of dissolution of different thicknesses of $SiO_2$ films deposited by plasma enhanced chemical vapor deposition (PECVD): a and b, 35 nm, c and d, 70 nm, e and f, 100 nm.

Figure 30:
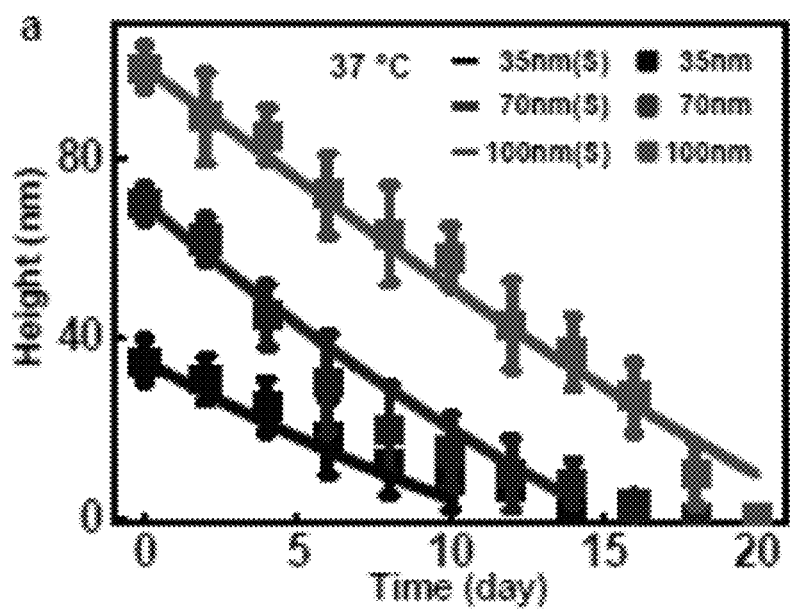

FIG. 30. Experimental results (symbols) and theoretical predictions (lines) for the time dependent dissolution of Si NMs with different thicknesses, 35 nm (black), 70 nm (blue), 100 nm (red) in PBS at 37° C. The calculations presented here use time dependent reaction rate constants.

FIG. 31A-F. (a)-(f) Scanning electron micrographs of a ZnO nanorod, collected at various times during water dissolution.

Figure 32:
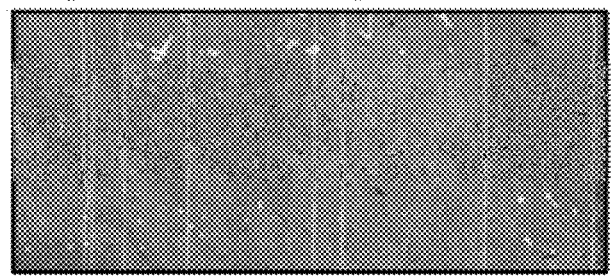
Figure 32:
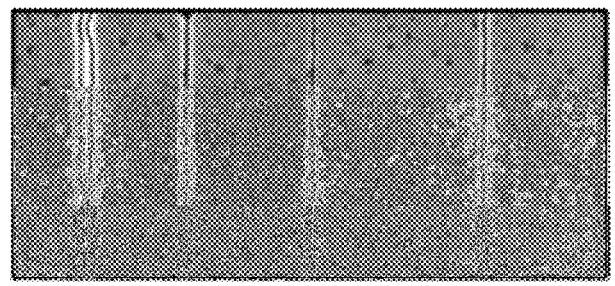

FIG. 32. Atomic force micrographs of selective, thermocapillary flows in a thin film of a molecular glass (MG2OH) on an array of carbon nanotubes. Selective Joule heating in the metallic tubes induces thermocapillary flows in the overlying glass, at low temperatures with gradients of a few degrees per micron.

Figure 33:
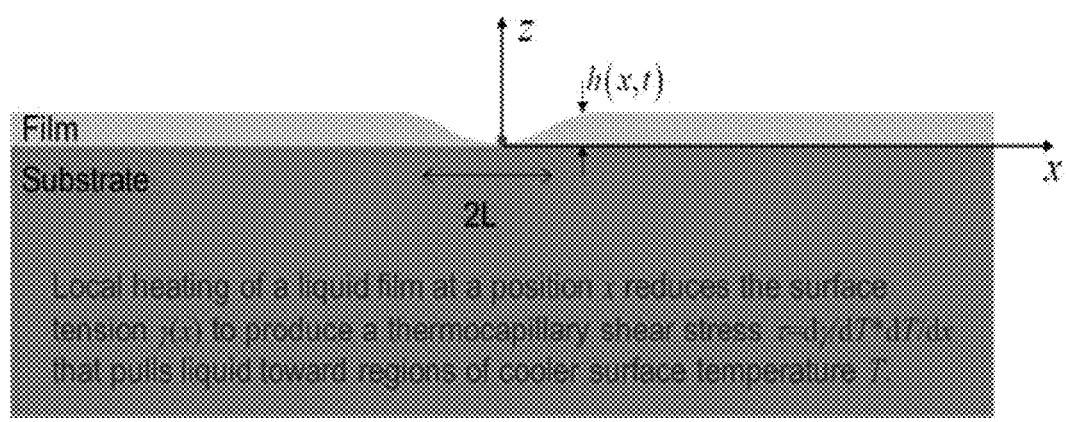

FIG. 33. A schematic diagram of the thermocapillary model for triggered transience.

Figure 34:
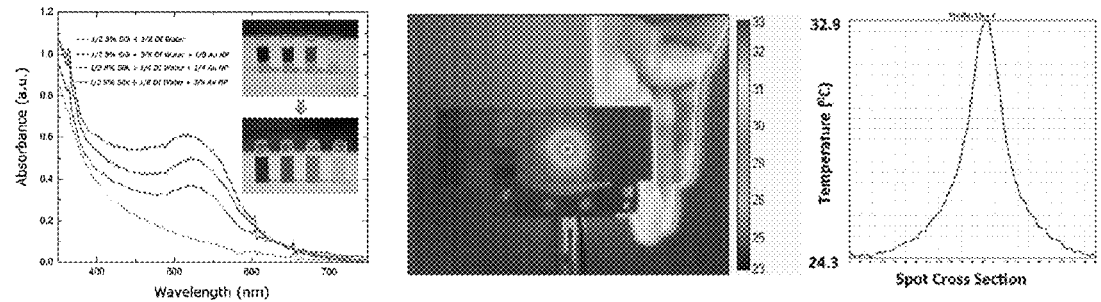

FIG. 34. (left-to-right) Absorption spectra in Au—NP silk solutions and images of bulk samples for different AuNP concentrations. Thermal image of a AuNP-silk film (2 μm thick) spin-cast on a glass slide when illuminated by a green (532 nm) laser pointer and corresponding measured thermal profile (data acquired with a FLIR SC-600 thermal imager).

Figure 35:
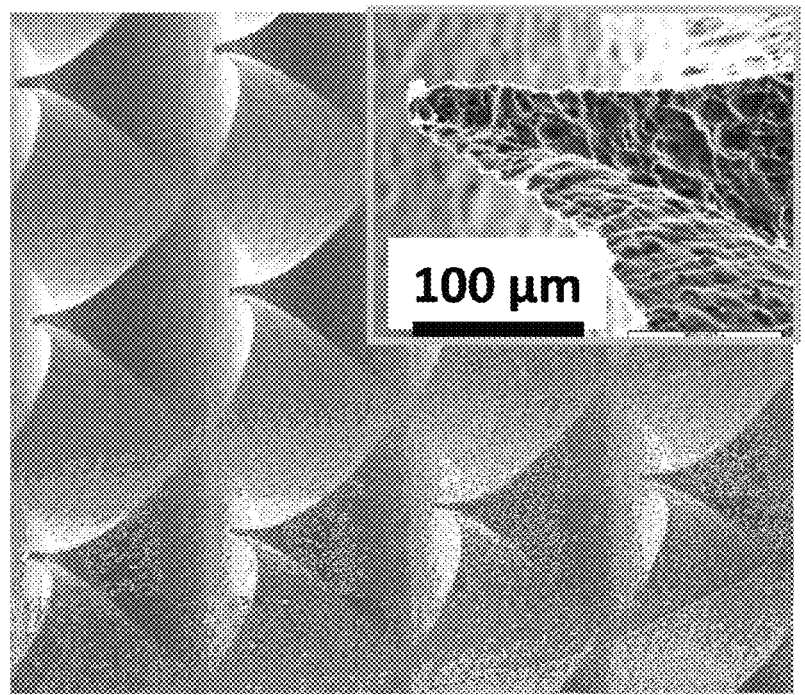

FIG. 35. Microneedles in silk and inset showing micropockets molded into the needles to load additional drug doses.

Figure 36:
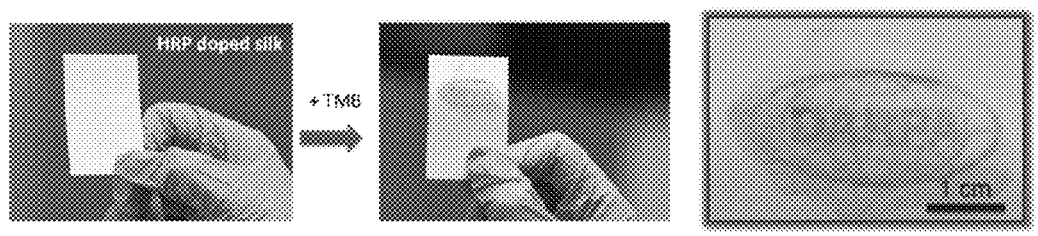

FIG. 36. Example of printed silk doped with enzymes (HRP). The exposure to TMB causes the peroxidase to undergo a colorimetric reaction and reveal the printed pattern.

Figure 37:
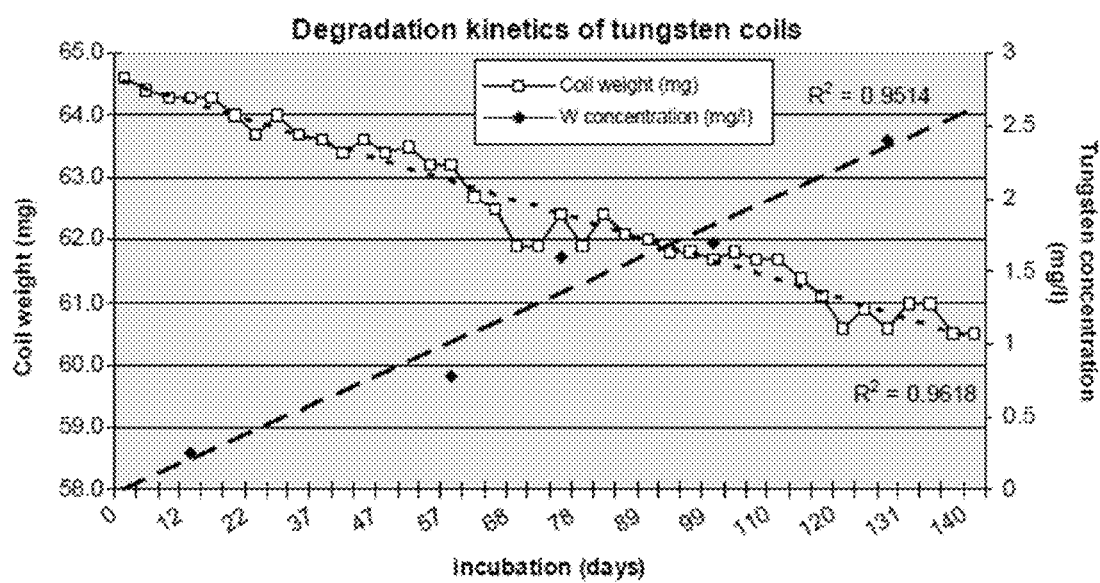

FIG. 37. In vitro degradation of tungsten embolization coils.

Figure 38:
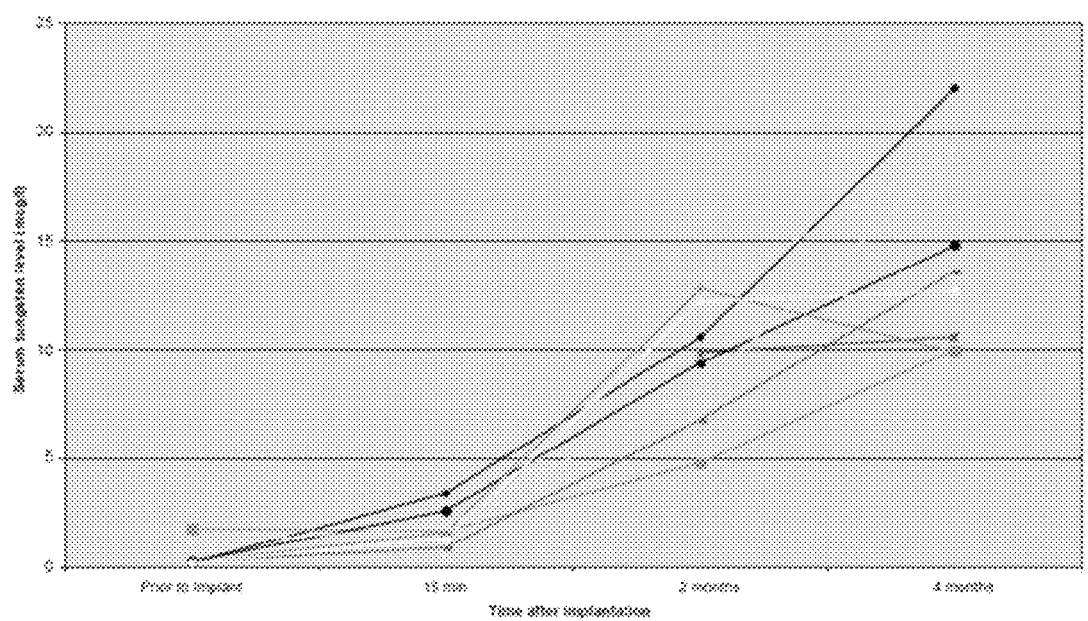

FIG. 38. Serum tungsten levels in rabbits with implanted embolization coils.

FIG. 39A-D. (a)-(d) Hydrogen evolution (as a measure of degradation) during degradation of various binary magnesium alloys.

Figure 40:
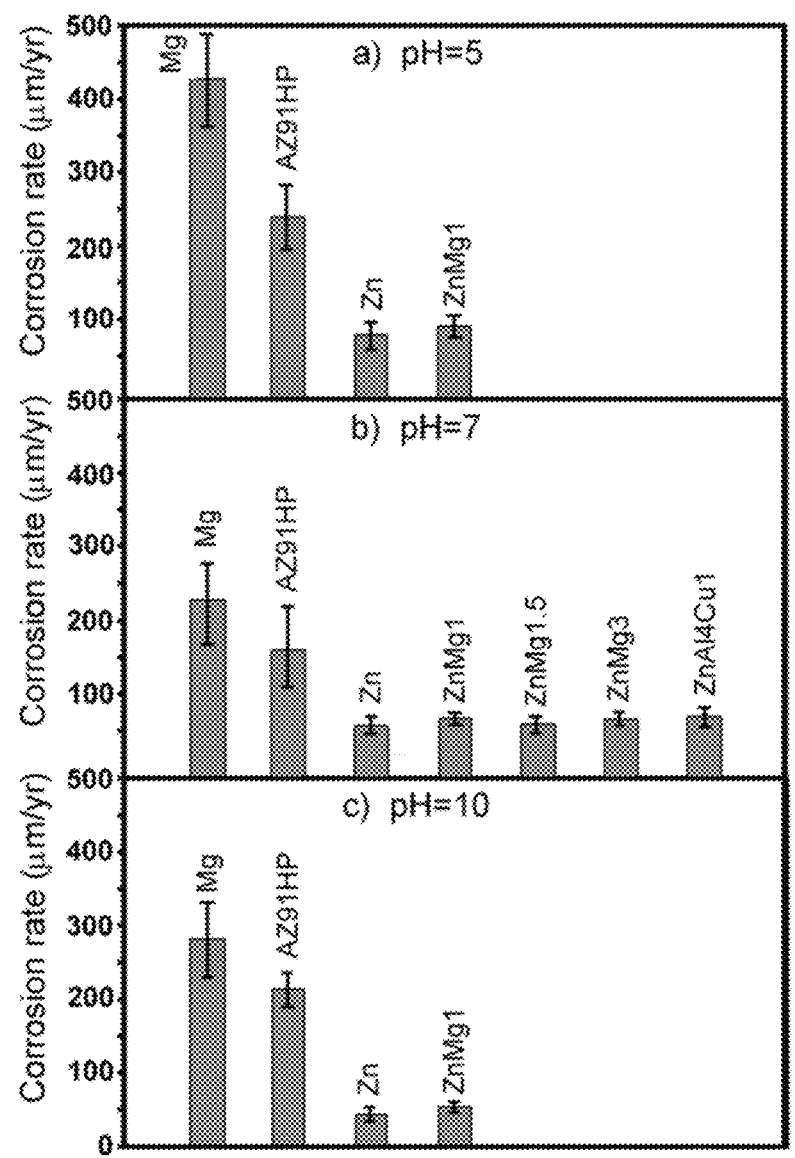

FIG. 40. Comparison of corrosion rates for Mg and Zn alloys at different pH.

Figure 41:
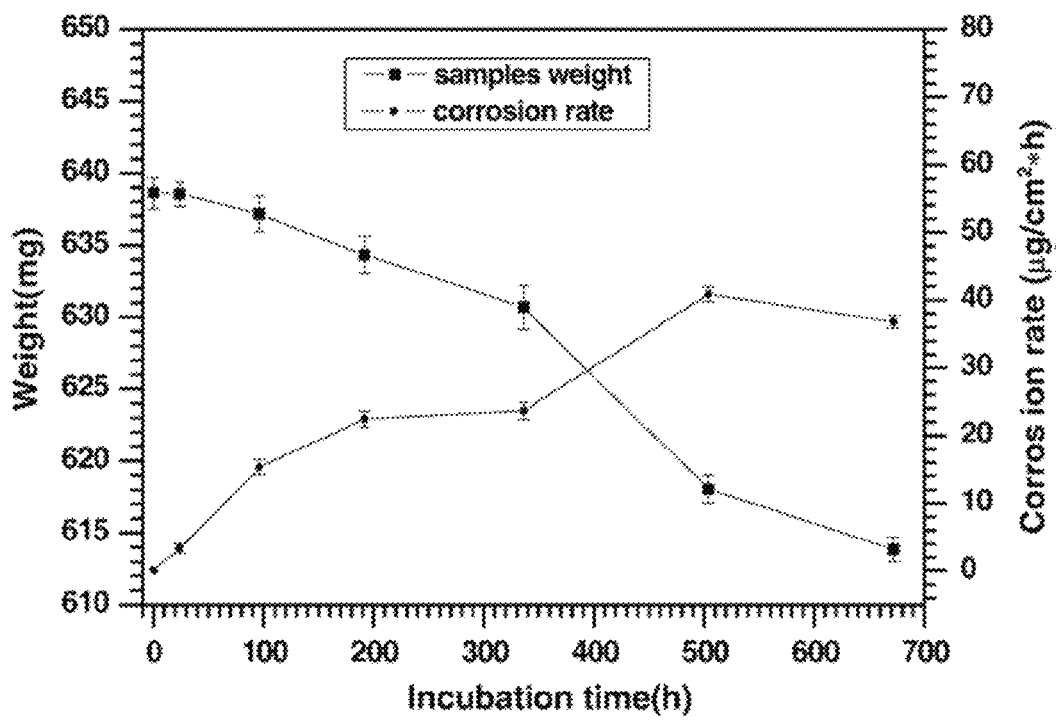

FIG. 41. Degradation rate and solution iron concentration during in vitro degradation tests of iron (Fe).

Figure 42:
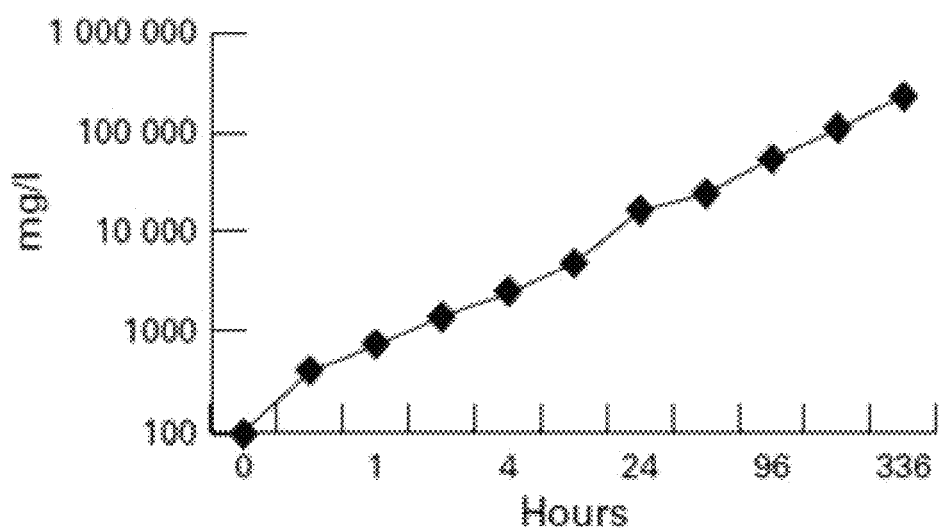

FIG. 42. Accumulation of iron in the electrolyte in relation to time.

Figure 43:
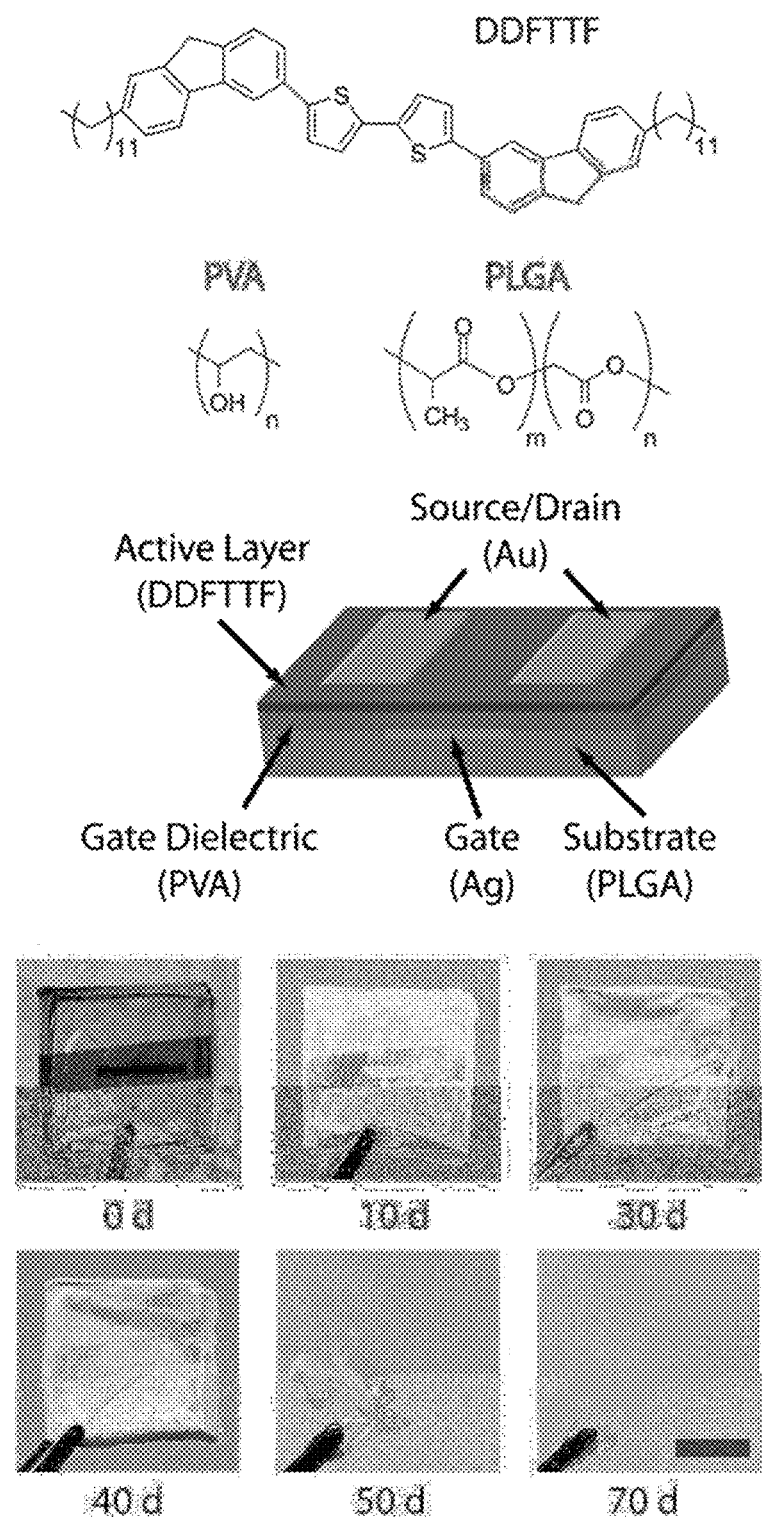

FIG. 43. Chemical structures, device geometry, and degradation test of PVA and PLGA.

Figure 44:
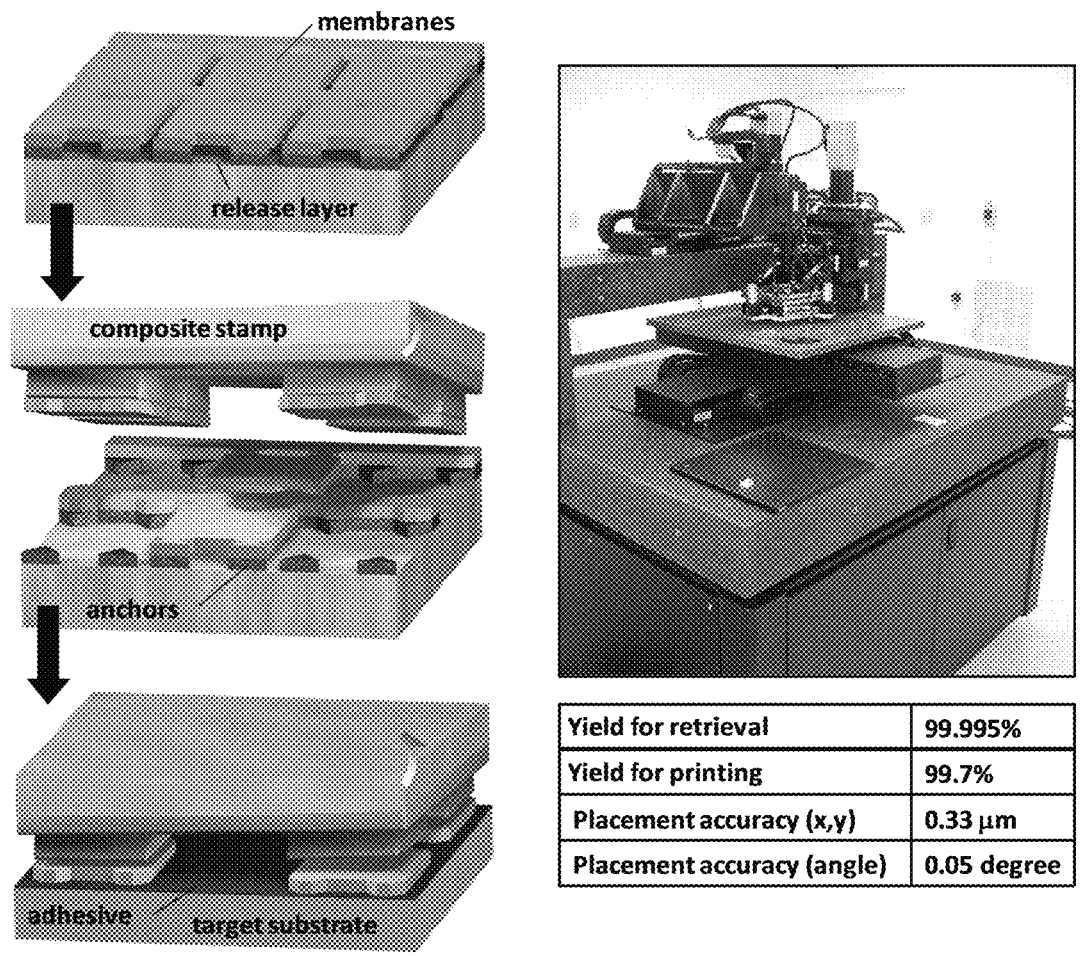

FIG. 44. Schematic illustration of microtransfer printing of silicon membranes derived from a wafer source (left) and picture of a representative custom, automated tool for this purpose (right). The table in the lower right provides performance specifications.

Figure 45:
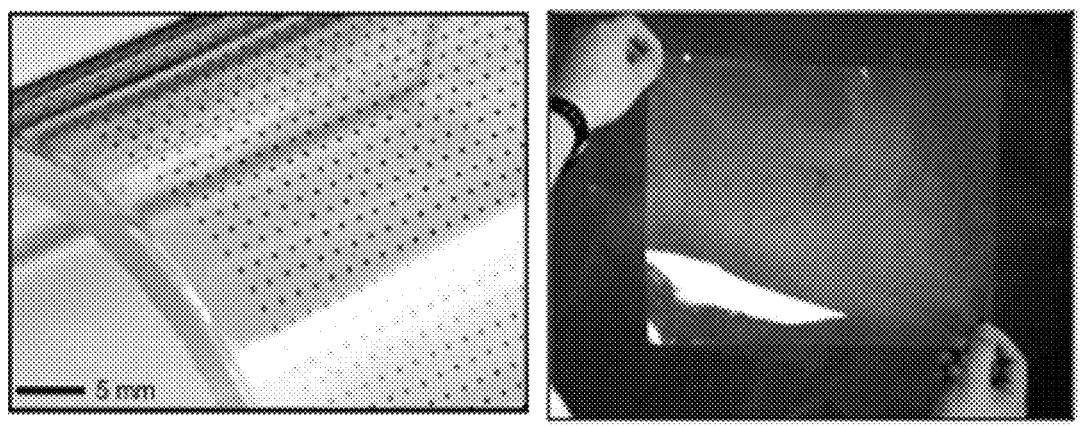

FIG. 45. Array of semiconductor nanomembranes assembled by μTP into a sparse array on a plastic substrate (left) and free-standing 8"×11" sheet of silk (right).

Figure 46:
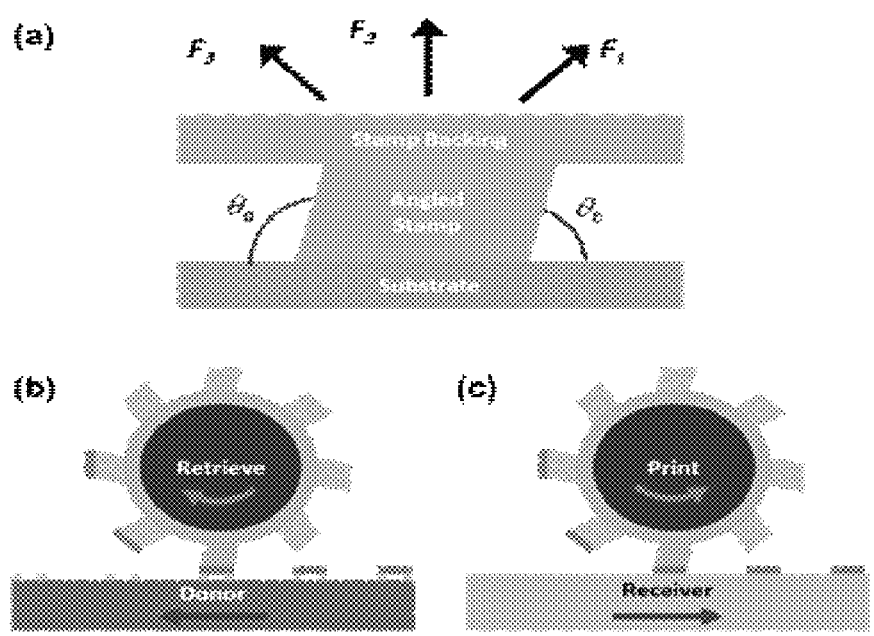

FIG. 46A-C. Schematic illustrations of the pulling direction dependent adhesion of an angled stamp on a substrate (a) and its implementation to μTP for high speed operation, in a roller printing mode in retrieve mode (b) and print mode (c). Simultaneous retrieving on one side and printing on the other is possible.

Figure 47:
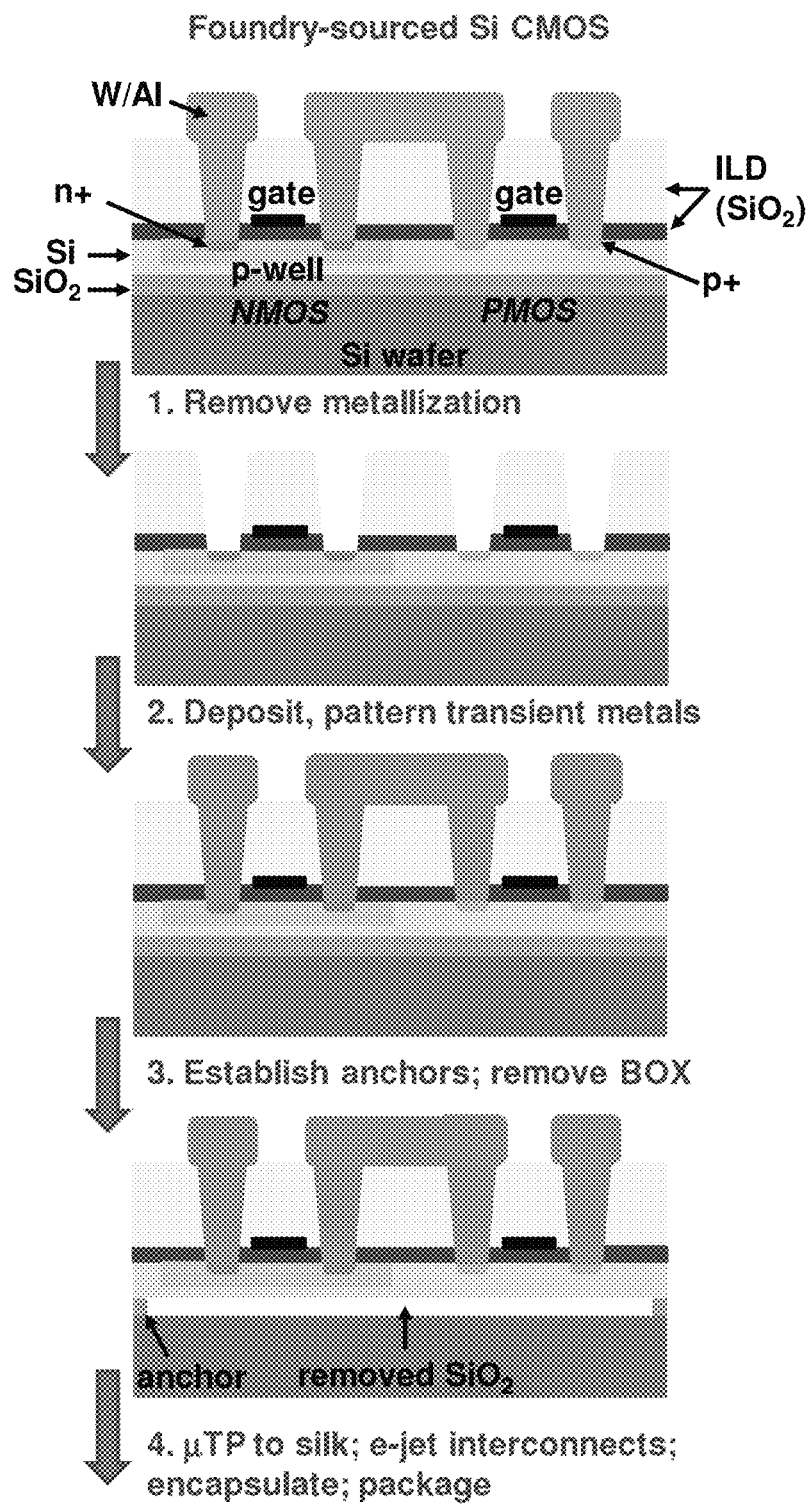

FIG. 47. Process flow for converting foundry-sourced Si CMOS into component building blocks for resorbable electronics.

Figure 48:
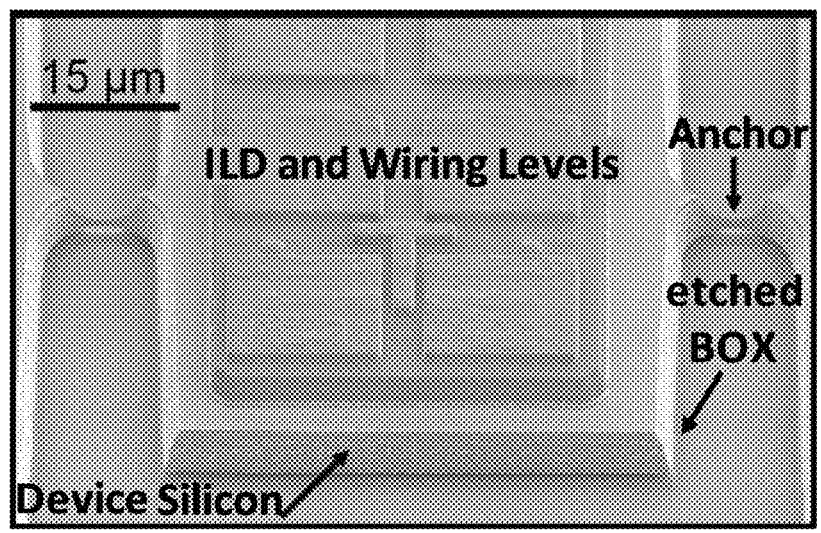

FIG. 48. Example of Si CMOS (non-resorbable) prepared for μTP.

Figure 49:
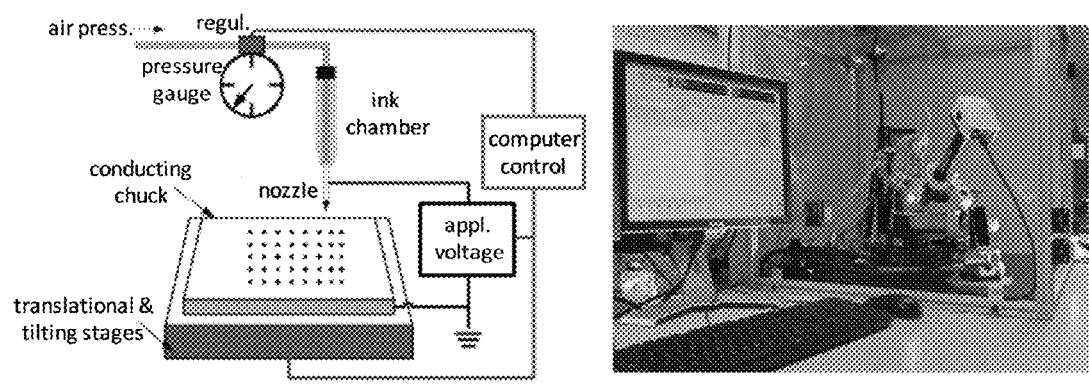

FIG. 49. Schematic illustration of key components (left), solid form representation (middle) and actual image (right) of a custom-built high resolution e-jet printing system.

Figure 50:
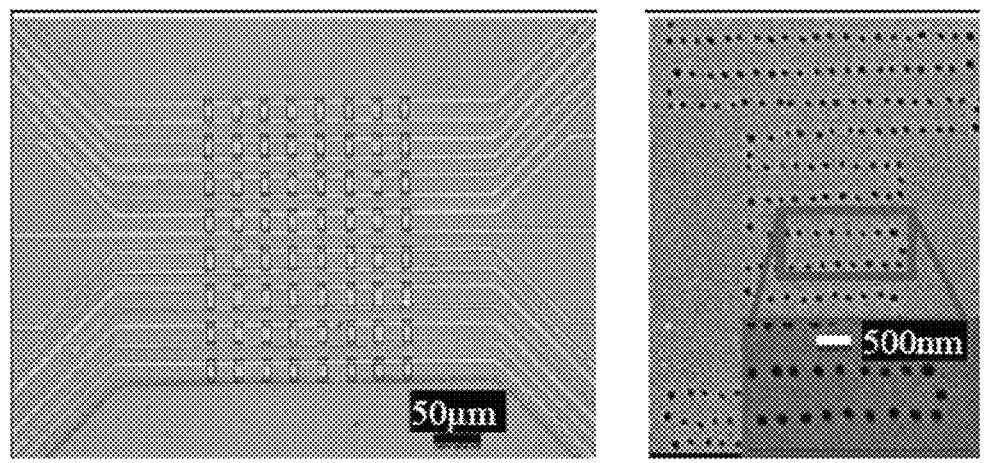

FIG. 50. Representative patterns printed by e-jet, showing capabilities for forming circuit-like arrangements of conductive lines (left) and sub-micron resolution (right).

Figure 51:
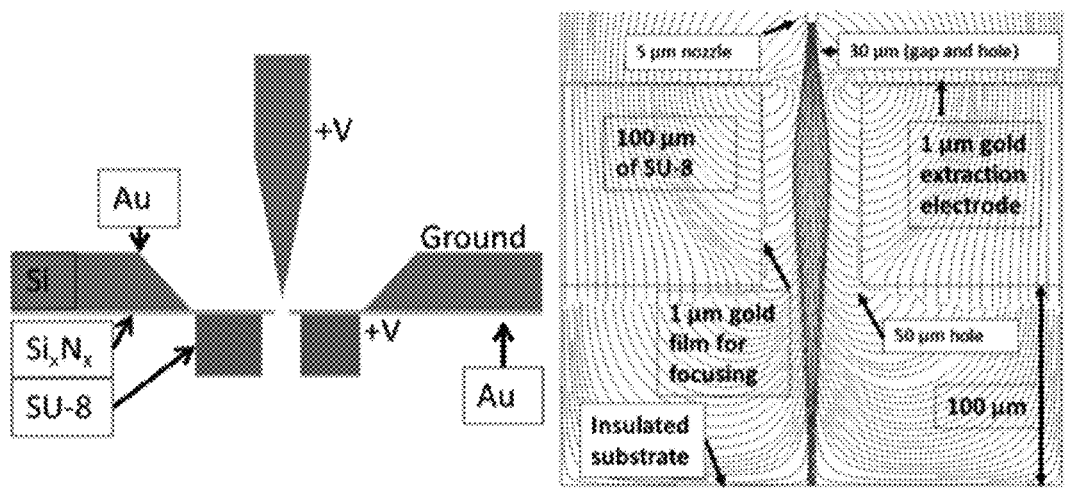

FIG. 51. Schematic illustration (left) and electrostatics modeling (right) of an e-jet printing nozzle with an integrated, concentric ring counterelectrode. This arrangement has the potential to eliminate effects of the substrate on the printing process. (SU8 is a photopatternable epoxy.)

Figure 52:
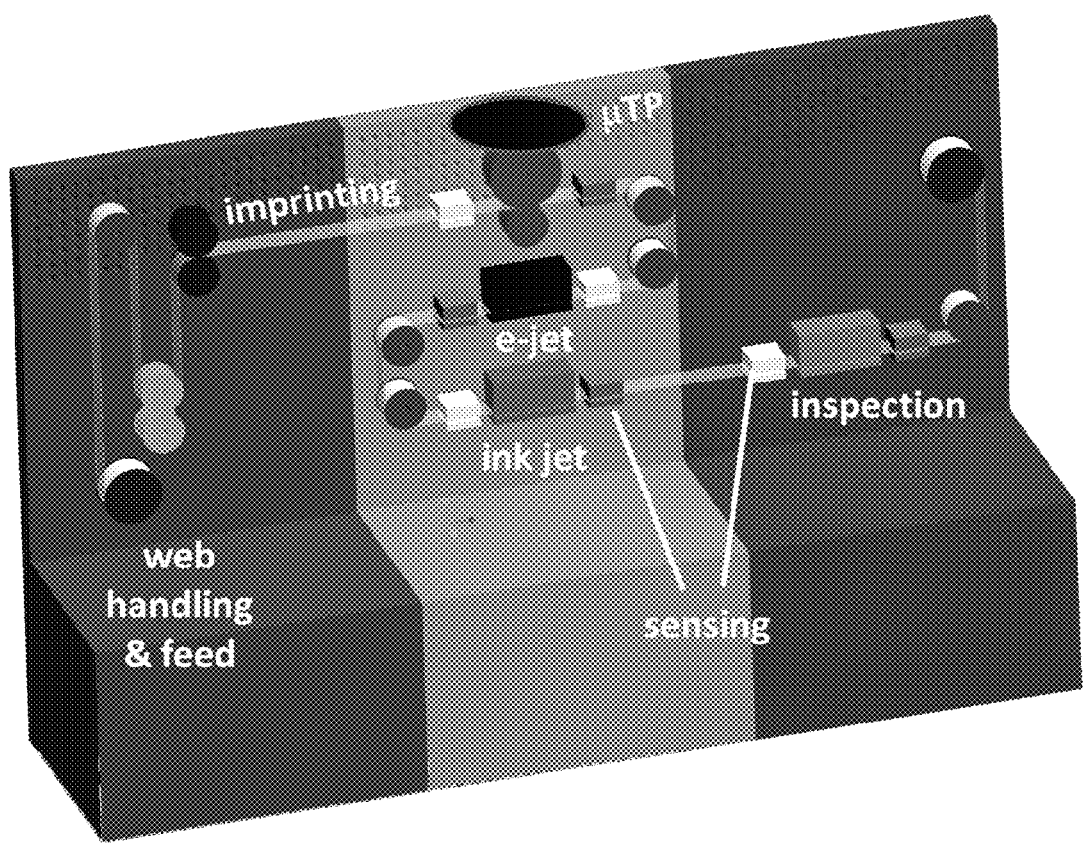

FIG. 52. Schematic illustration of a complete manufacturing flow for resorbable electronics, involving embossed relief features for registration, μTP for delivery of modified foundry-based devices, with e-jet for fine contact and interconnects, and ink jet for coarse features. Components for sensing (optical) and inspection (electrical test structures) provide routes for feedback on the processes.

Figure 53:
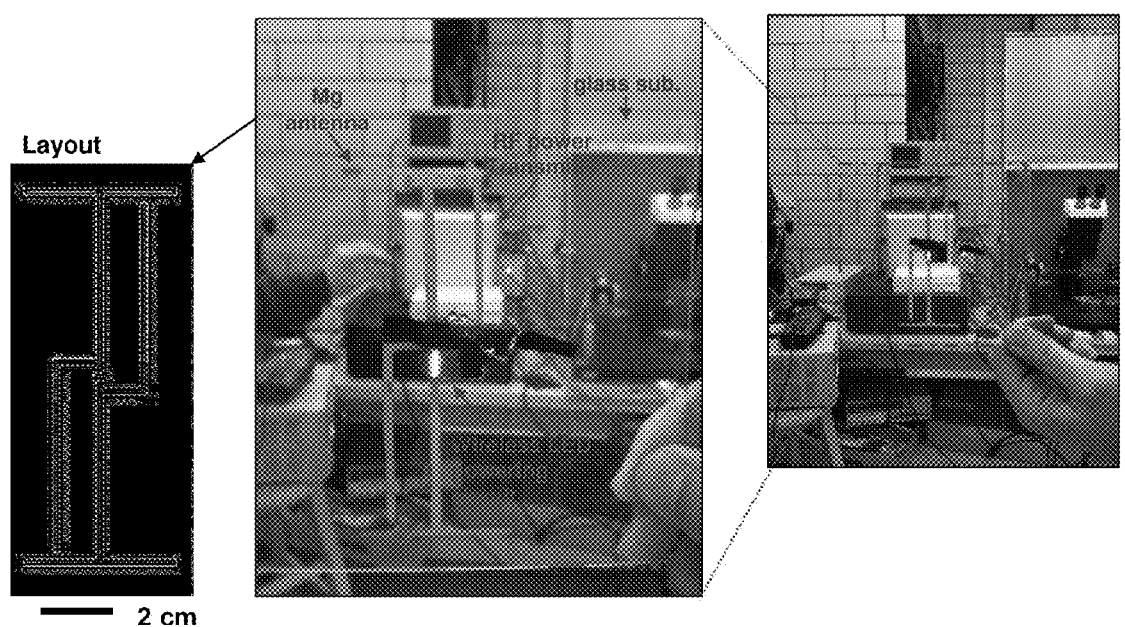

FIG. 53. Demonstration of transient antenna remotely powering an LED.

Figure 54:
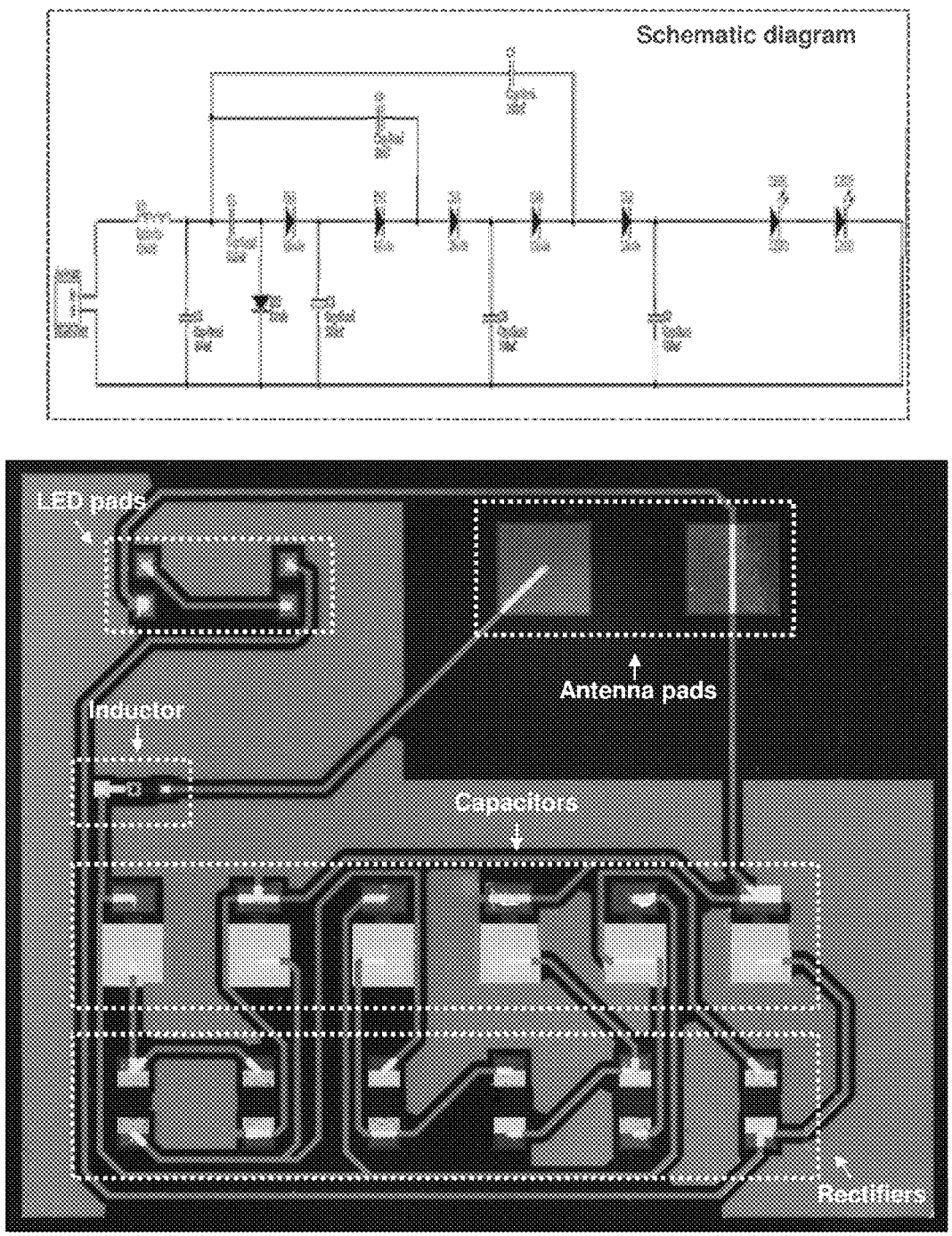

FIG. 54. Schematic of transient RF power scavenger.

Figure 55:
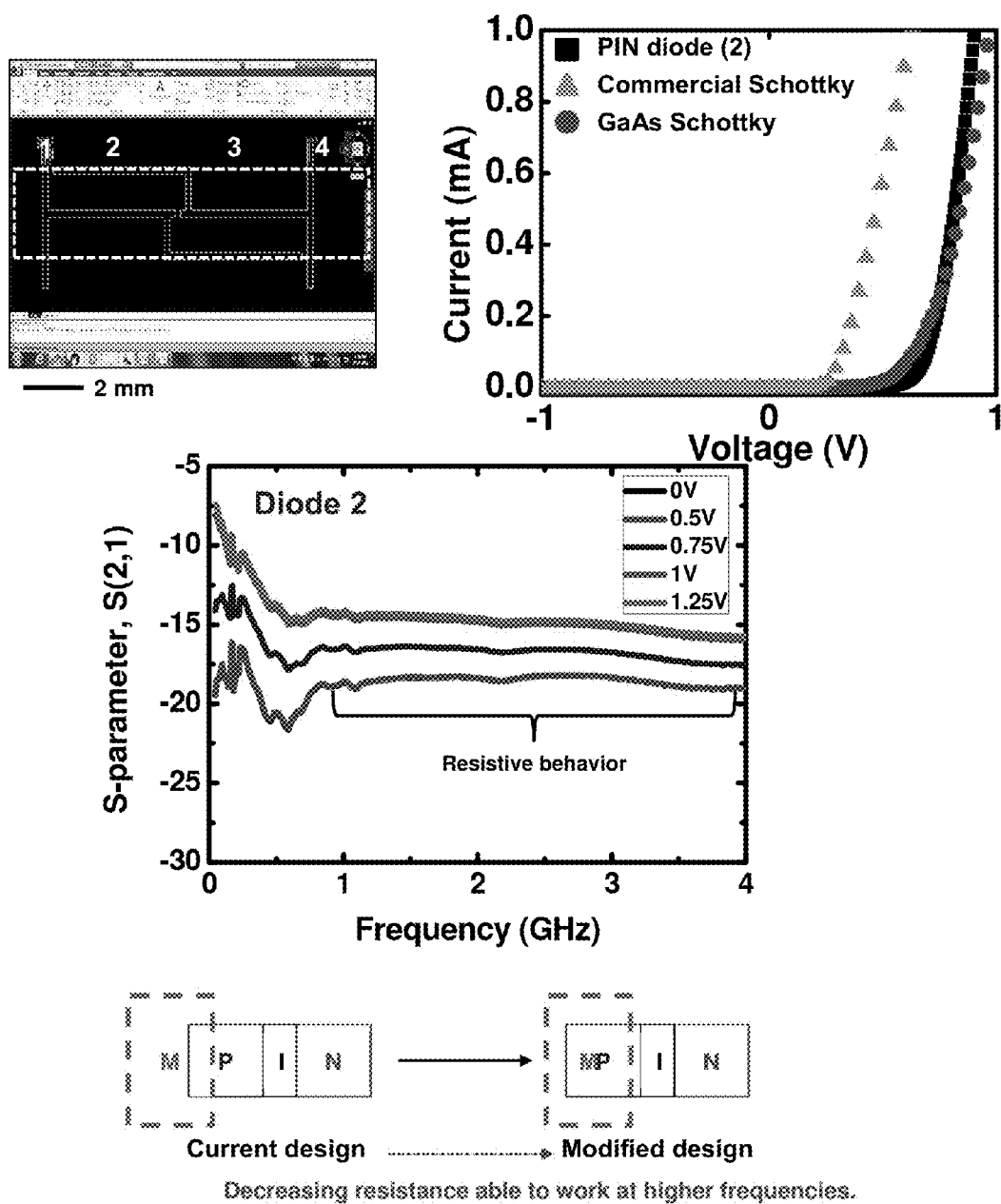

FIG. 55. Schematic illustration and performance data for Si rectifiers (PIN diodes).

Figure 56:
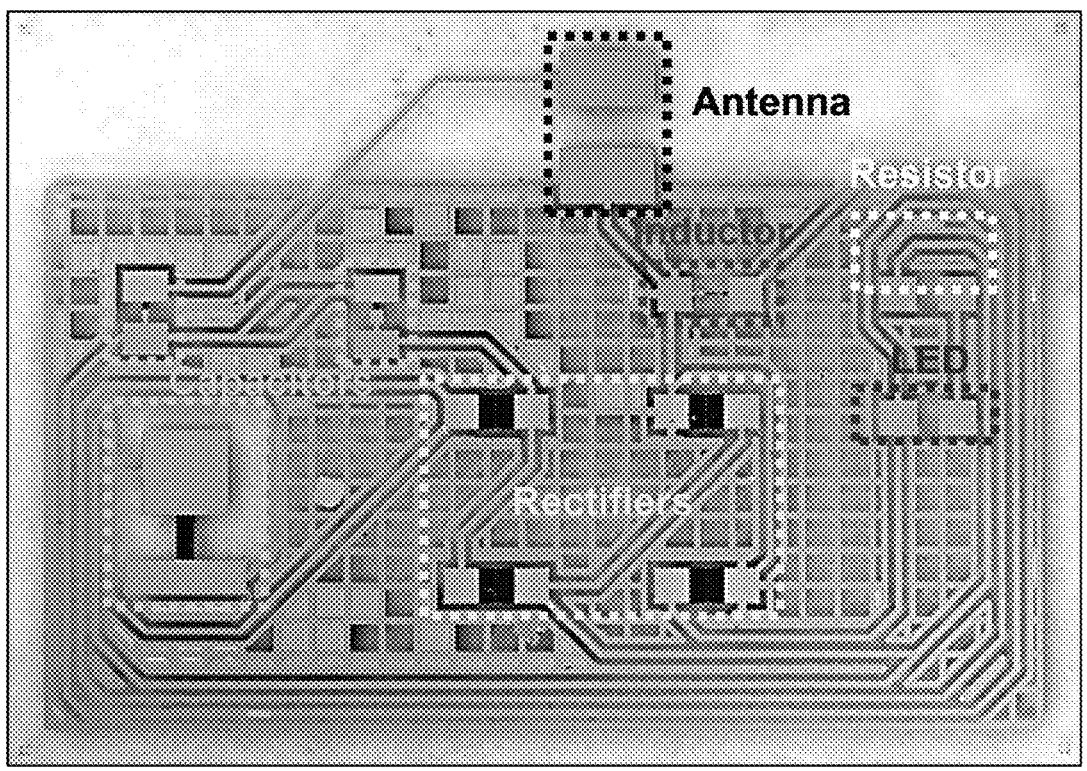

FIG. 56. Example of a full wave rectifier.

Figure 57:
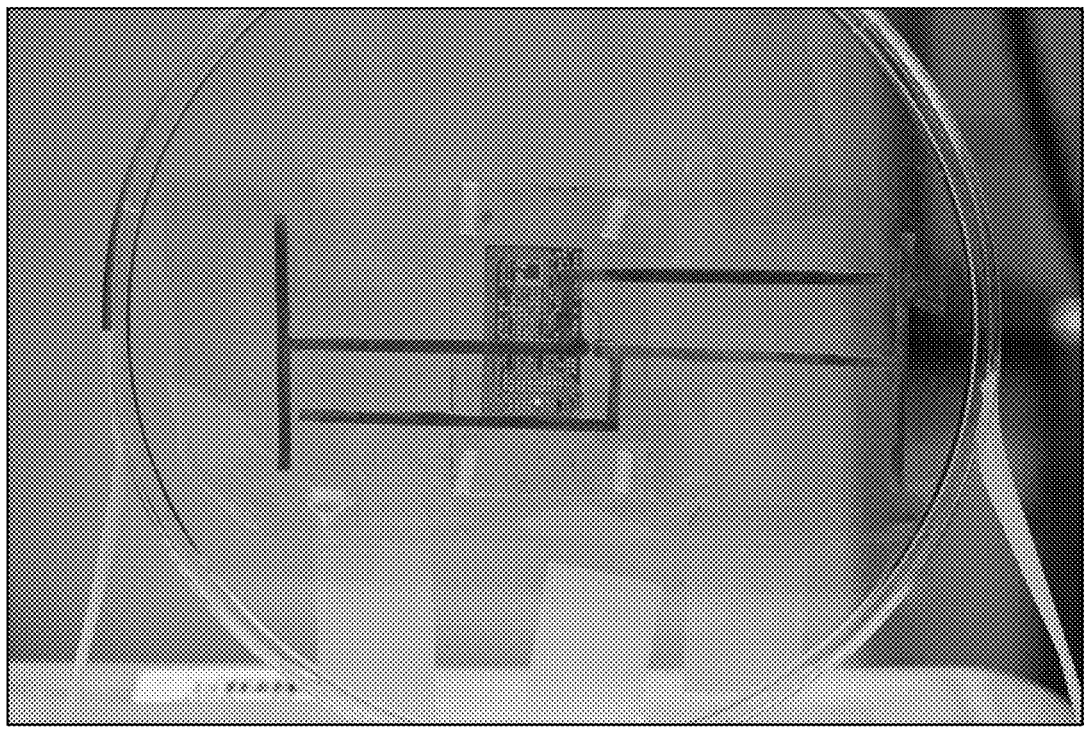

FIG. 57. Example of a fully transient RF scavenging system.

Figure 58A:
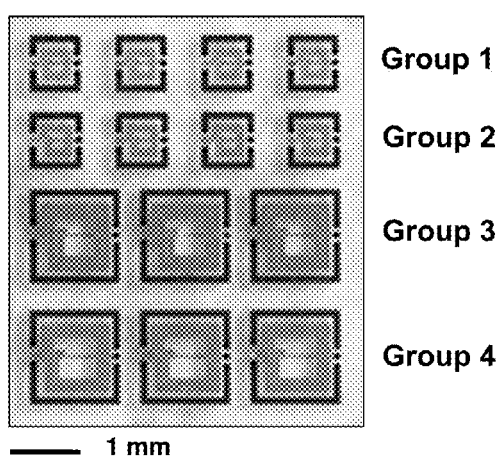
Figure 58B:
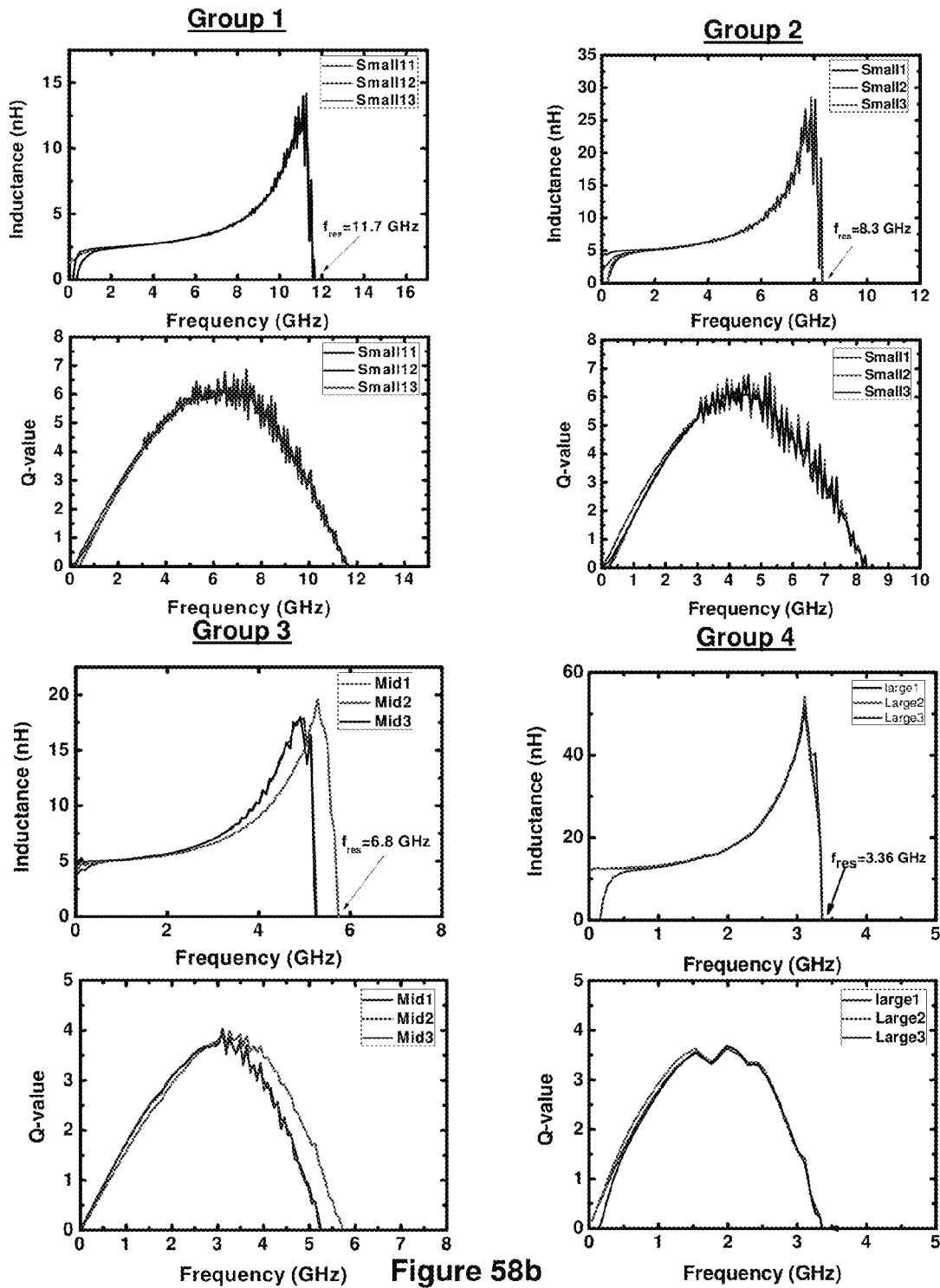

FIG. 58A-B. Mg inductors (a) and their corresponding performance data (b).

FIG. 59A-E. Mg capacitors (a) and their performance data (b)-(e).

FIG. 60A-D. Examples (a) and schematics (b)-(c) of Colpitts oscillators with passive transient components, and (d) harmonics graph showing oscillation from Colpitt circuit.

Figure 61:
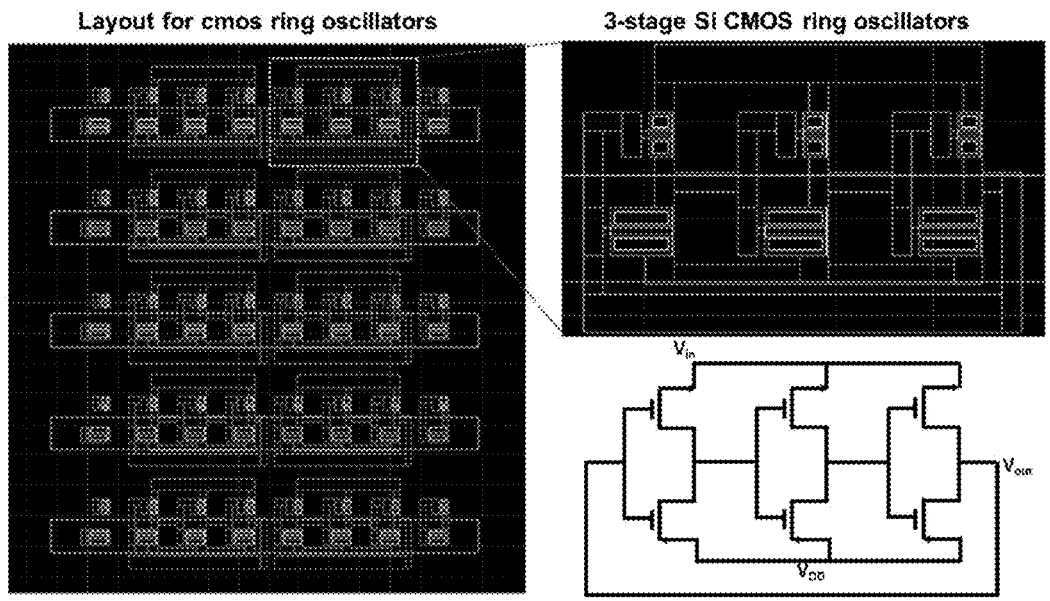

FIG. 61. Design for a fully transient radio including a Si CMOS ring oscillator.

Figure 62:
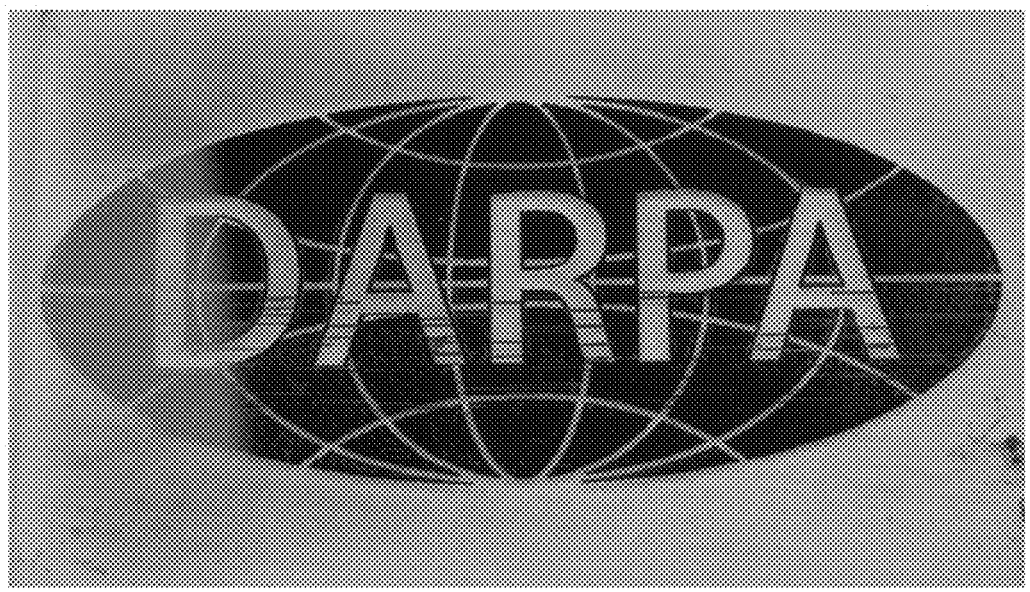

FIG. 62. Example of patterning Mg by e-jet printing.

FIG. 63A-B. Transient electronics. The substrate and the passives are water soluble; the active devices use a disintegrating design. a) Image of the device after integrating the actives (left) and forming the passives and interconnects (right). b) Sequence of images showing the system dissolving in water.

Figure 64:
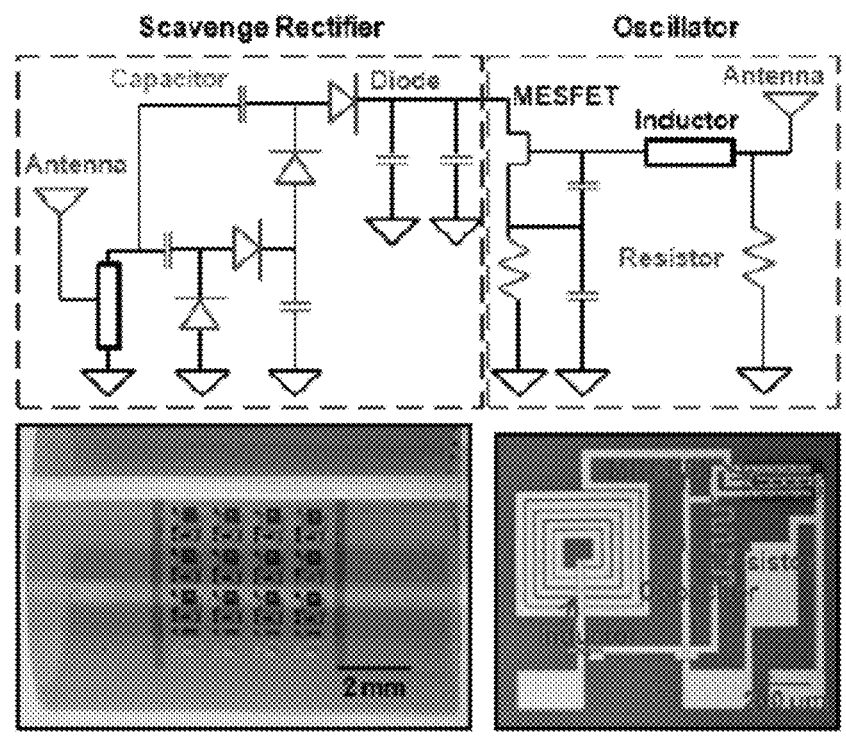

FIG. 64. Radio demonstration vehicle. Circuit diagram for a radio device that consists of a scavenging rectifier (left) and a transmitting oscillator (right). The bottom frames show pictures of physical realization of this circuit in a 'plastic RF' technology.

Figure 65:
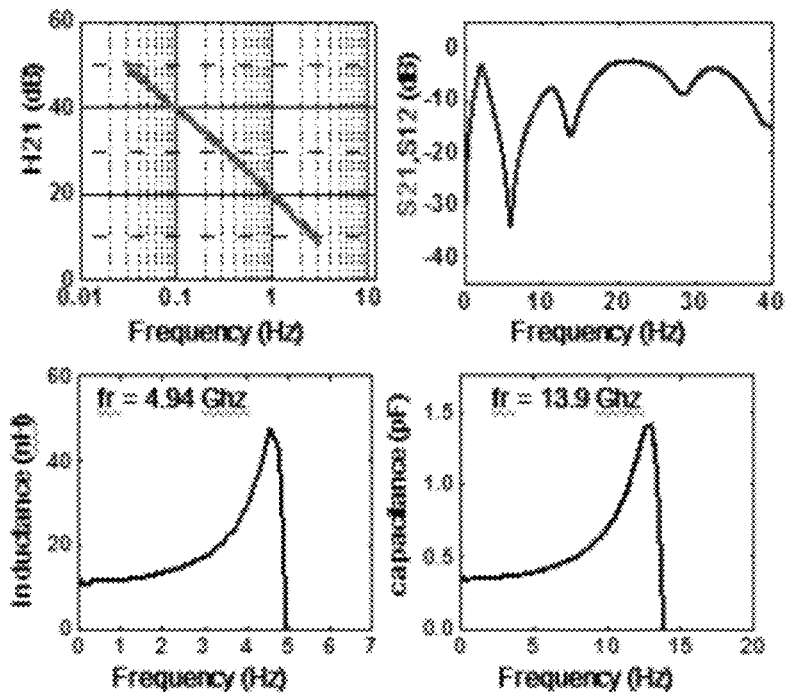

FIG. 65. Active and passive 'plastic RF' components. Clockwise from top left: small signal gain in a GaAs MESFET, scattering parameters for an LC oscillator, and frequency responses in capacitors, and inductors. All devices have sub-micron thicknesses, and are built on thin sheets of polyimide.

FIG. 66A-B. Bio-resorbable electronics built with Si MOSFETs on thin, silk substrates. a) Water dissolution of a piece of silicon-on-silk electronics. b) In vivo evaluation of a similar device implanted under the skin.

Figure 67:
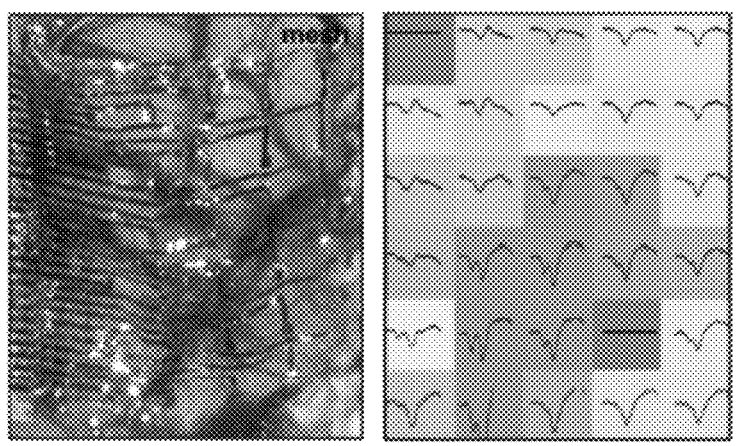

FIG. 67. In-vivo electrocorticography (ECoG) with an ultrathin, mesh electrode array on a resorbable silk substrate. Left: picture of the device, conformally wrapped onto the surface of the brain, after dissolution of the silk. Right: ECoG from the visual cortex of a cat. The intimate electrode/tissue contact provides unmatched measurement fidelity.

Figure 68:
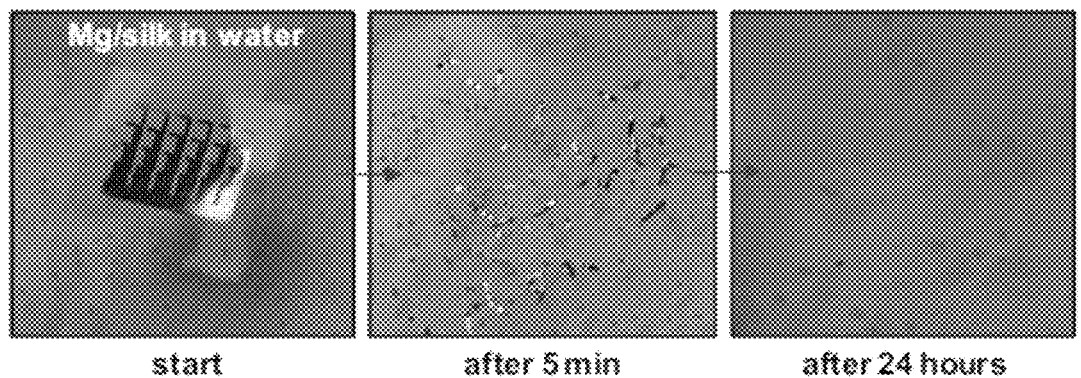

FIG. 68. Water-soluble ECoG device built using magnesium electrodes patterned on a film of silk. The sequence of images, from left to right, illustrates dissolution of the system by water.

Figure 69:
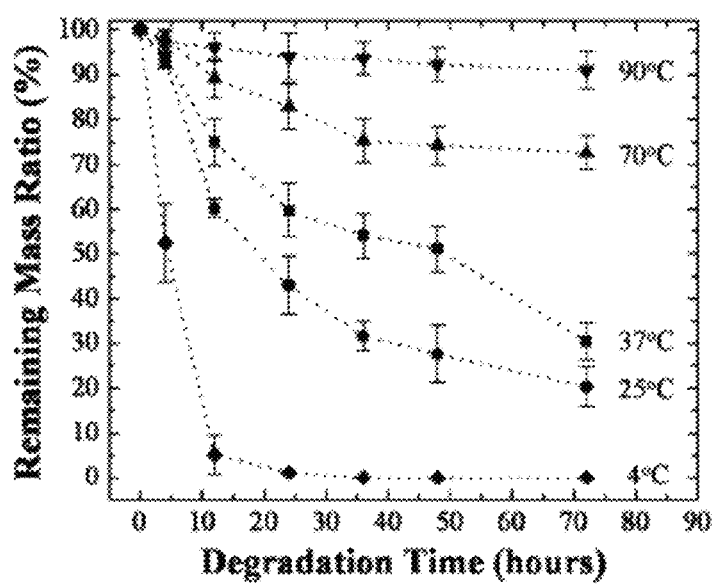

FIG. 69. Enzymatic degradation of silk films by protease XIV under standard reaction conditions at 37° C. The temperatures on the right side of the Figure indicate the temperatures used to anneal the films to control crystalline content [4° C., 25° C., 37° C., 70° C., 95° C.].

Figure 70:
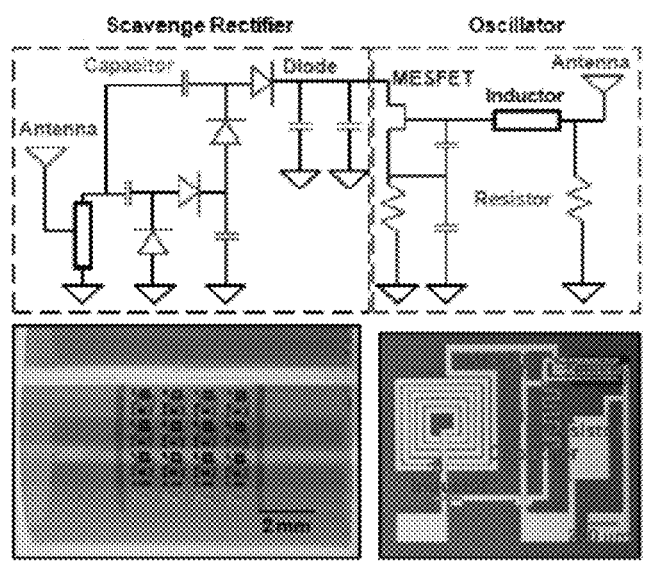

FIG. 70. Radio demonstration vehicle. Circuit diagram for a radio device that consists of a scavenging rectifier (left) and a transmitting oscillator (right). The bottom frames show pictures of physical realization of this circuit in a 'plastic RF' technology.

Figure 71:
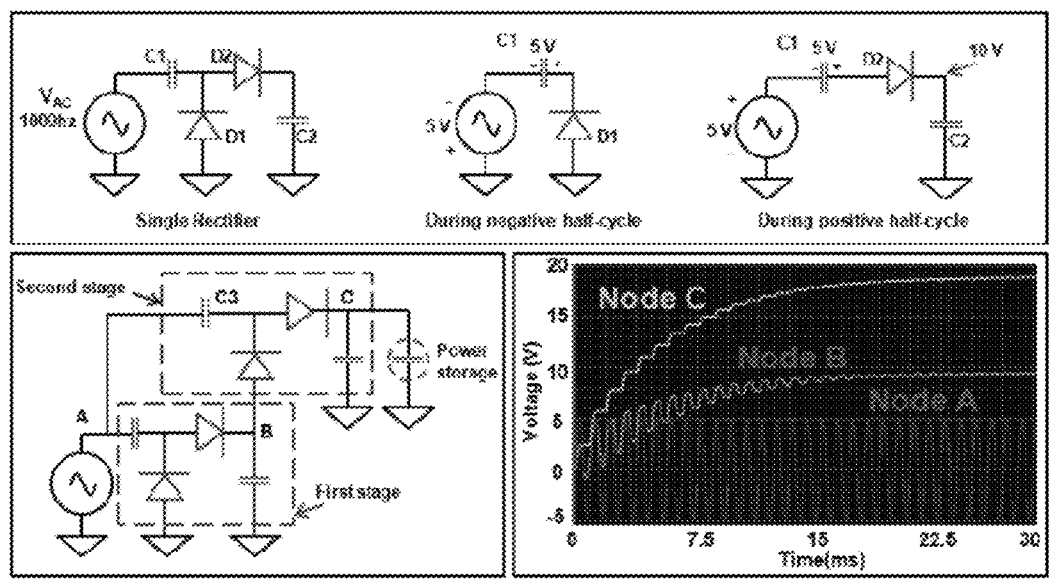

FIG. 71. Scavenging Rectifier. The top frame shows the single stage rectifier circuit diagram and voltage of nodes during half-cycle of AC input. The bottom frames show the two stage rectifier with voltage simulation results at each stage output nodes, indicating the change of voltage from AC to DC.

Figure 72:
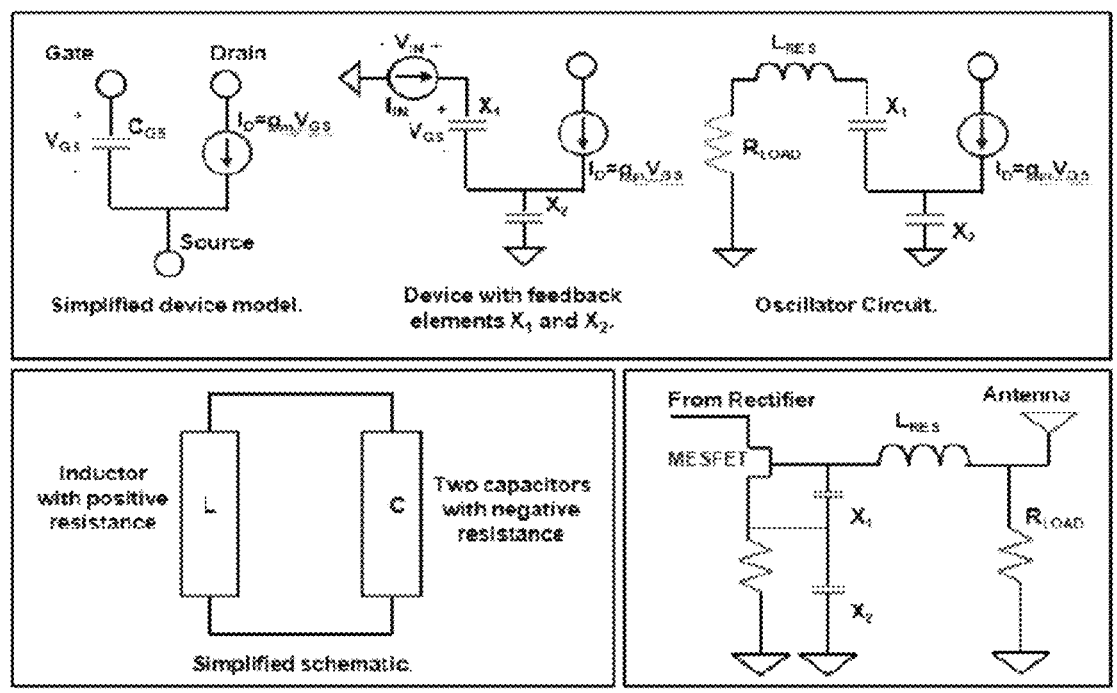

FIG. 72. Transmitter. The top frame shows the procedure for designing microwave oscillators using a simplified model for the active device. Bottom frames show simplified black box schematics of the oscillator (left), and final circuitry of the radio frequency signal transmitter (right).

Figure 73:
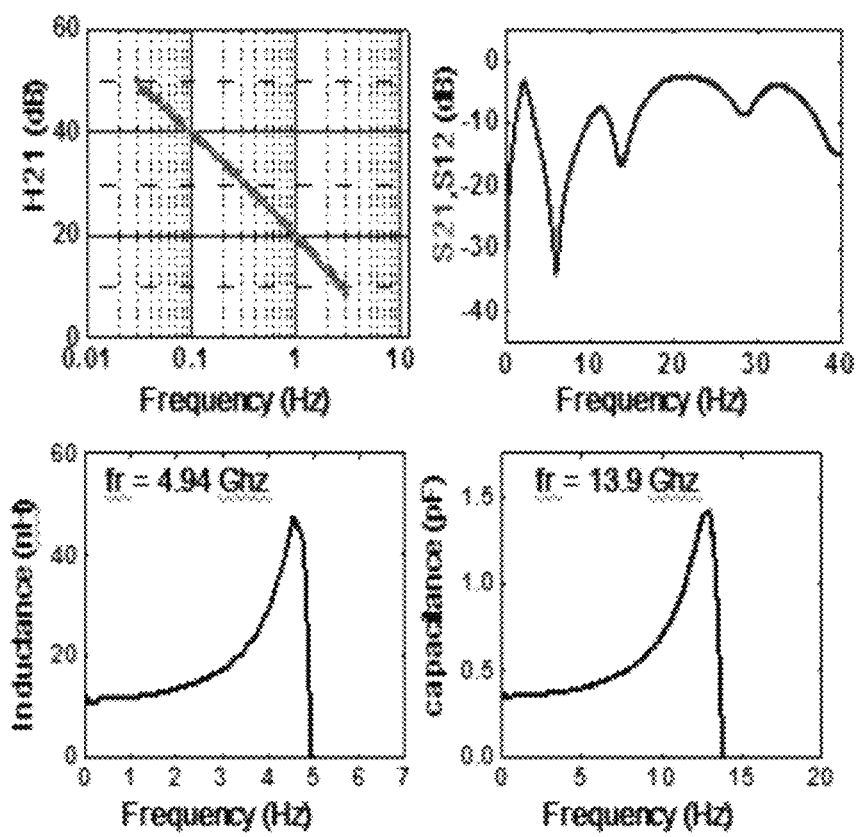

FIG. 73. Active and passive 'plastic RF' components. Clockwise from top left: small signal gain in a GaAs MESFET, scattering parameters for an LC oscillator, and frequency responses in capacitors, and inductors. All devices have submicron thicknesses, and are built on thin sheets of polyimide.

Figure 74:
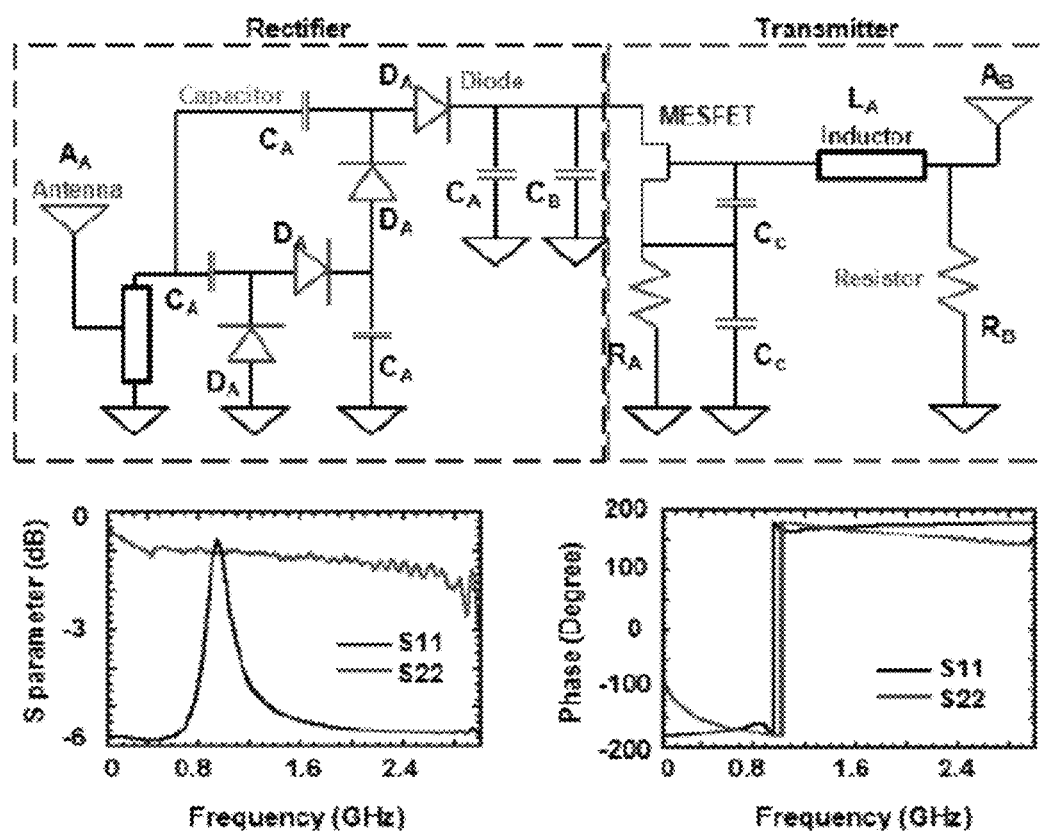

FIG. 74. Radio demonstration vehicle. Circuit diagram for a radio device that consists of a scavenging rectifier (left) and a transmitting oscillator (right). The bottom frames show the simulation result of transmitter where the transmitting frequency is at 1 GHz.

Figure 75:
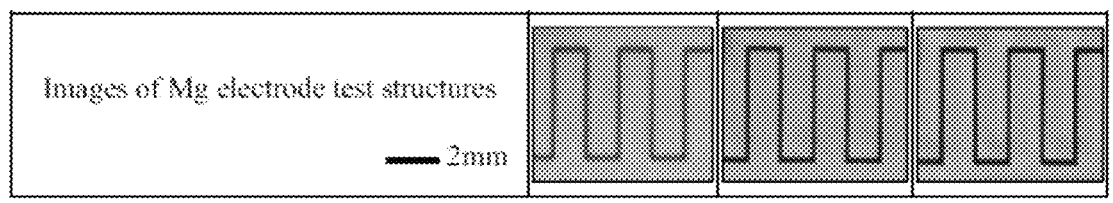
Figure 75:
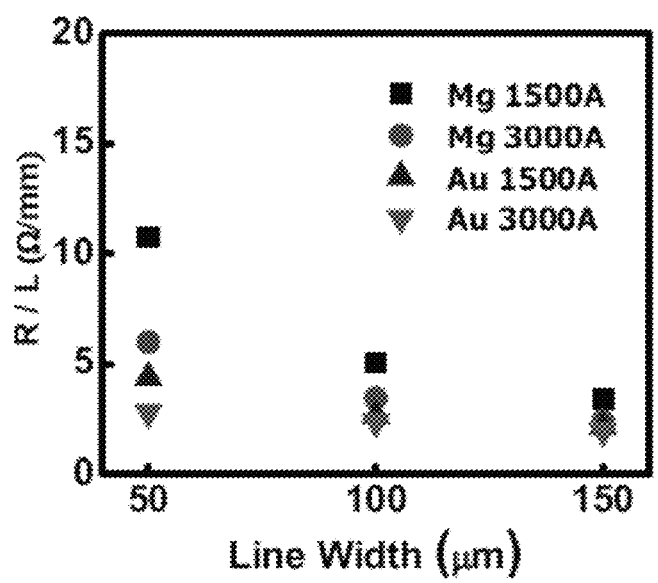

FIG. 75. Resistance/Length. Comparison of resistance/length (R/L) measured from Mg and Au test structure electrodes with different film thicknesses and widths, on glass substrate.

Figure 76:
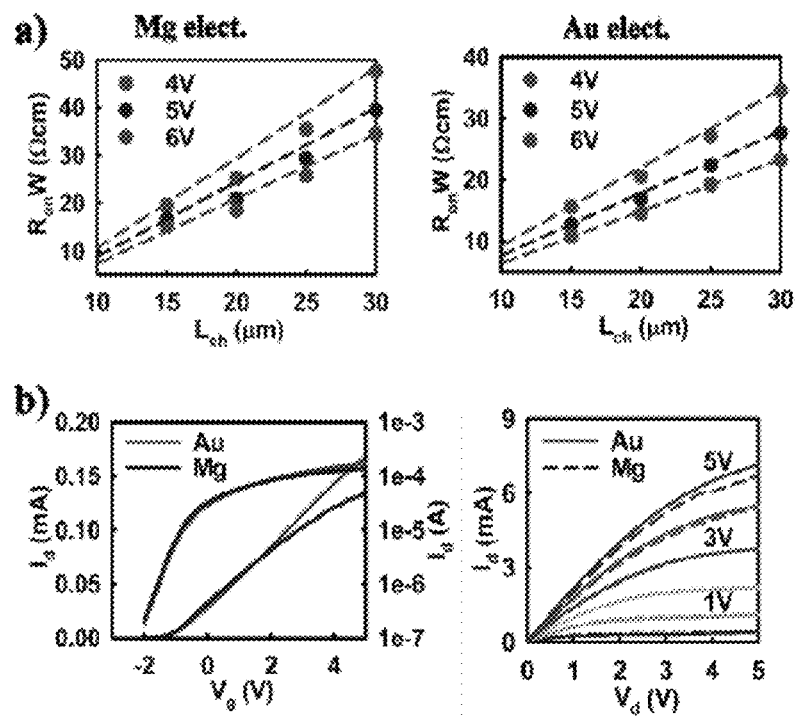

FIG. 76A-B. Mg based transistors. (a) Width-normalized ON resistance as a function of channel length at different gate voltages. (b) Transfer curves and Current-Voltage curves of transistor.

Figure 77:
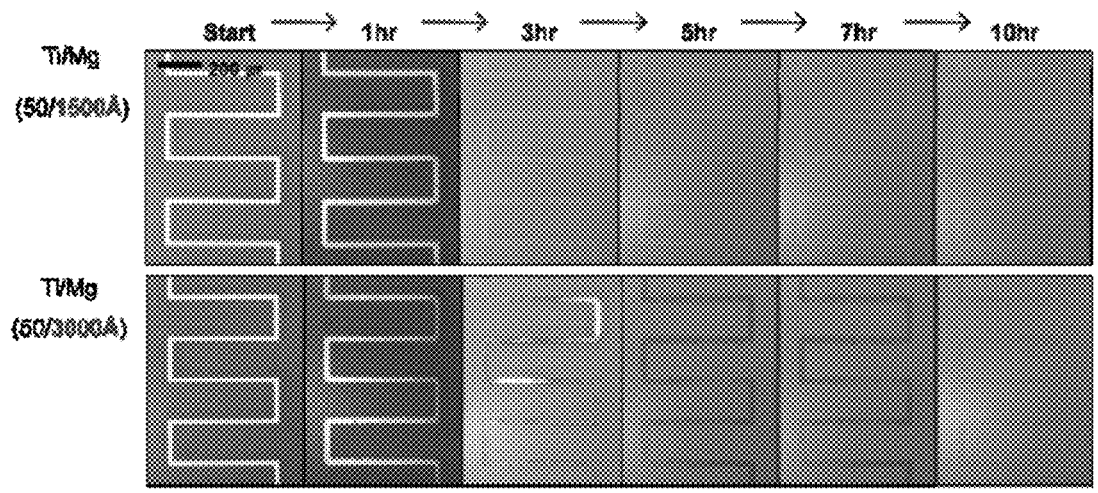

FIG. 77. Rates for Mg dissolution in Water. Mg fully dissolves in water after 3 hrs (1500 Å), and 10 hrs (3000 Å). Only Ti remains.

Figure 78:
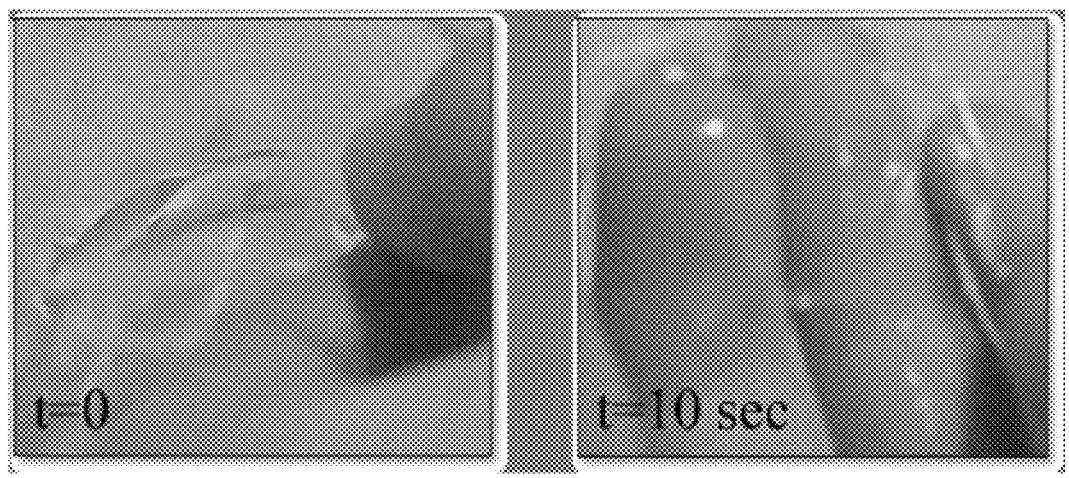

FIG. 78. Rapid dissolution of a film of amorphous silk. 0 sec (left), 10 sec (right).

Figure 79:
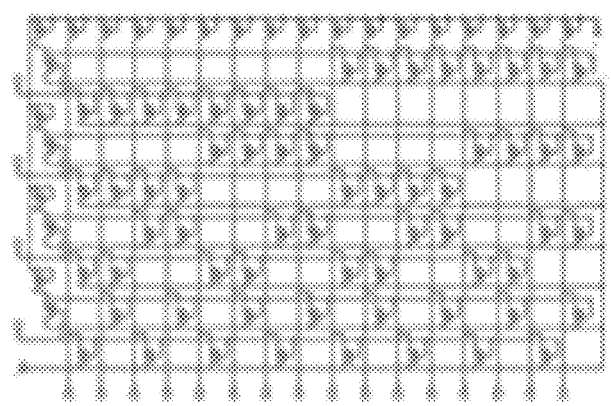

FIG. 79. Circuit diagram for a digital 4 bit row decoder.

Figure 80:
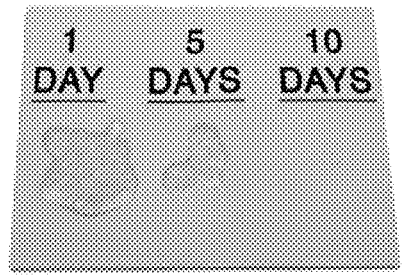

FIG. 80. Image of a 'disappearing' wax that vanishes by sublimation at room temperature. Thin films and sheets of this material serve as platforms for electronics that offer a completely dry form of transience.

Figure 81:
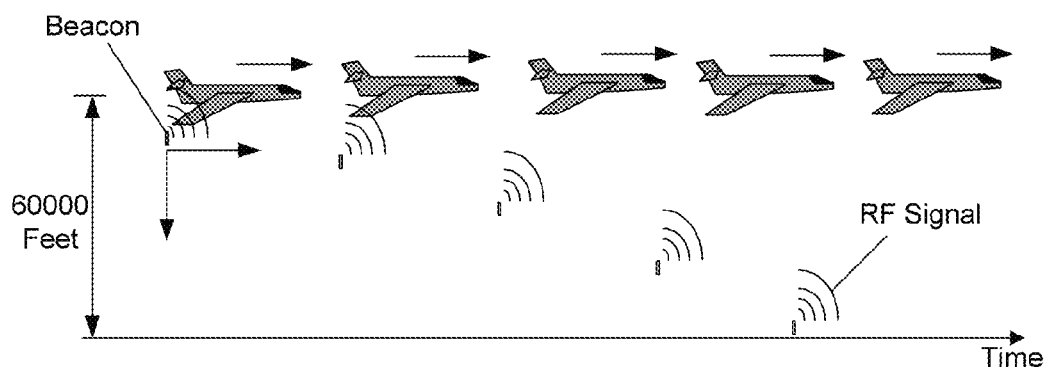

FIG. 81. Mode of use for a transient RF beacon device.

Figure 82:
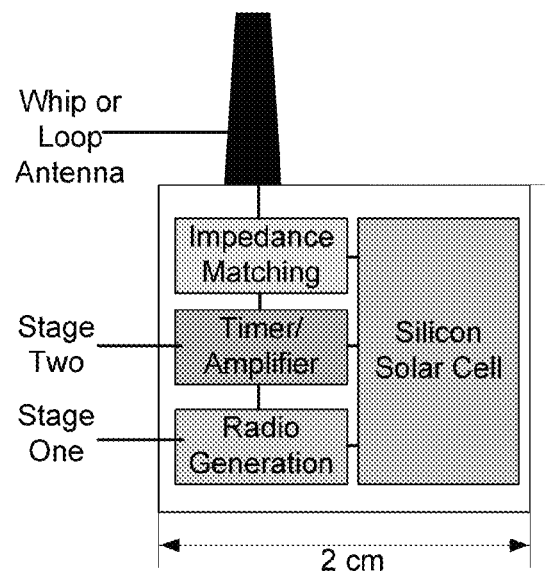

FIG. 82. Schematic diagram of a transient RF beacon.

Figure 83:
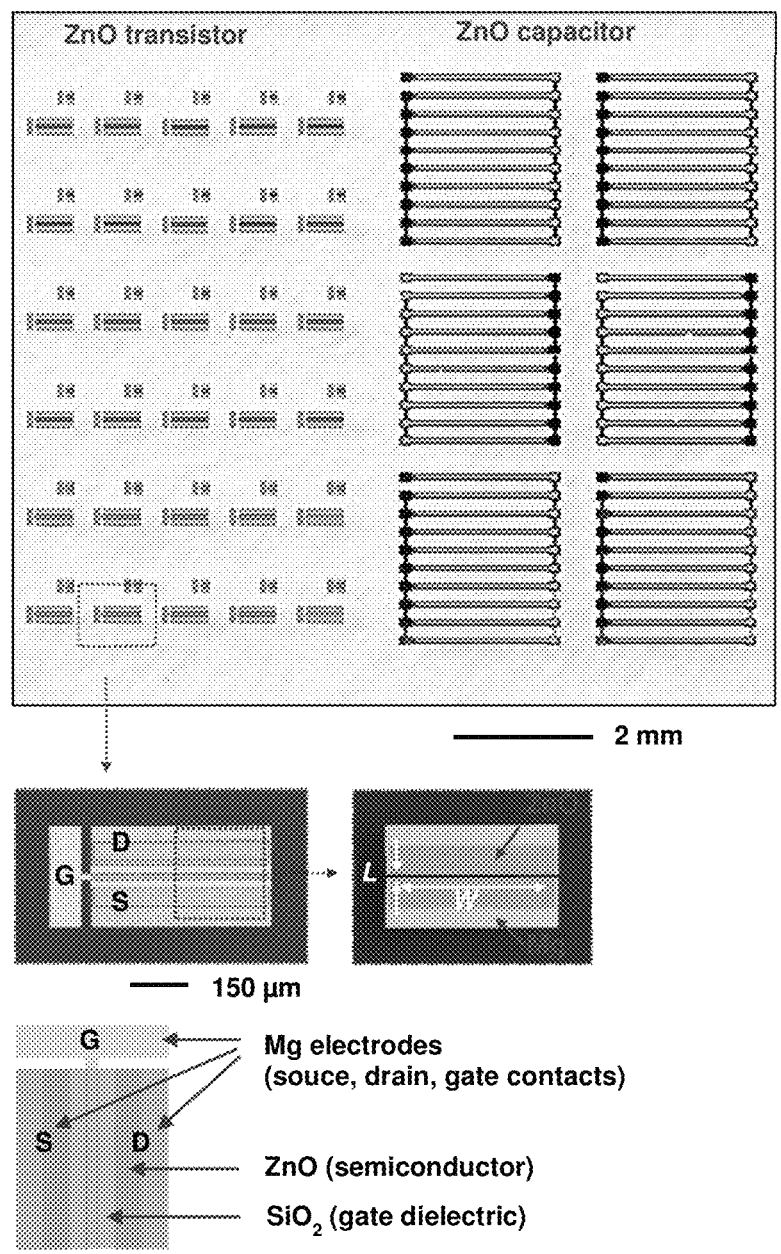

FIG. 83. Schematic diagrams of ZnO thin film transistor and capacitor arrays and components.

Figure 84:
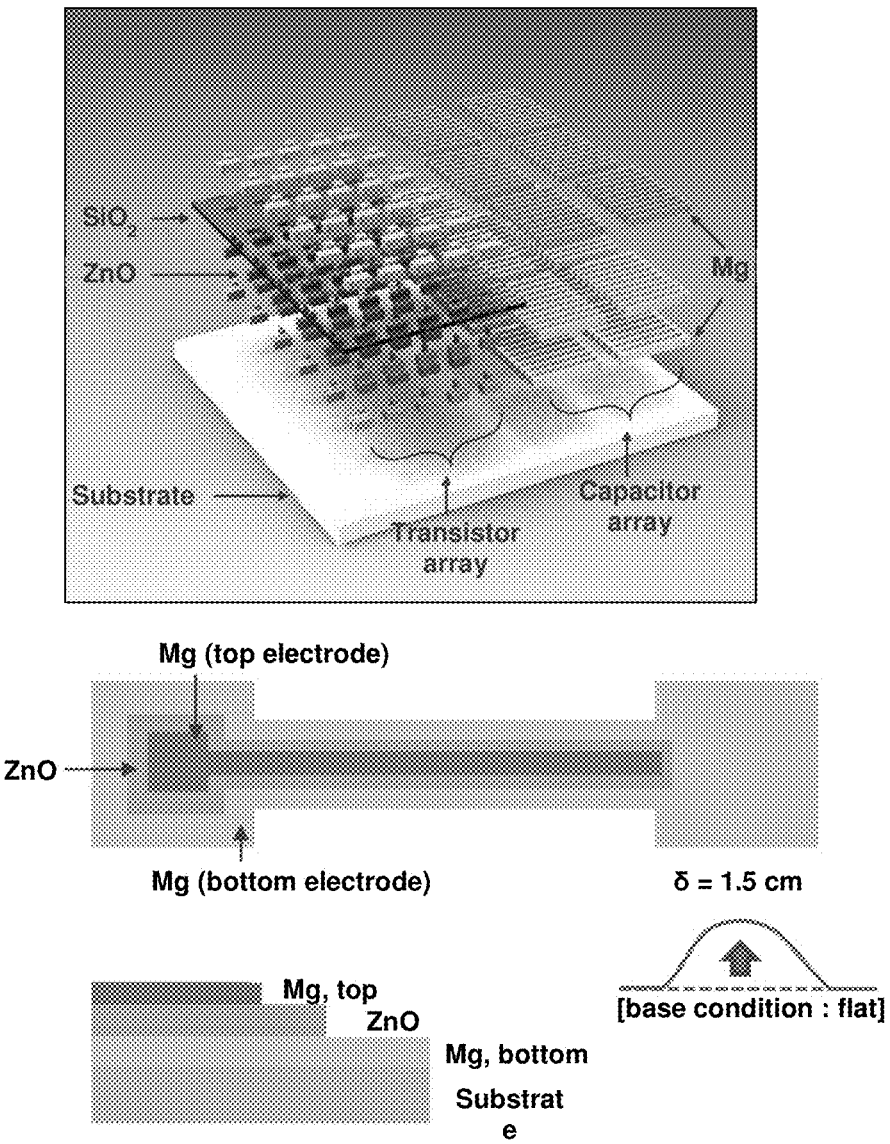

FIG. 84. Schematic diagrams of ZnO thin film transistor and capacitor arrays and components.

FIG. 85A-D. Plots and micrographs showing ZnO film properties. (a) Powder X-ray diffraction plot and crystal structure of ZnO, (b) Voltage versus displacement curves for ZnO films, (c) Electron micrograph of ZnO film, (d) Time versus bias curve for ZnO film.

Figure 86:
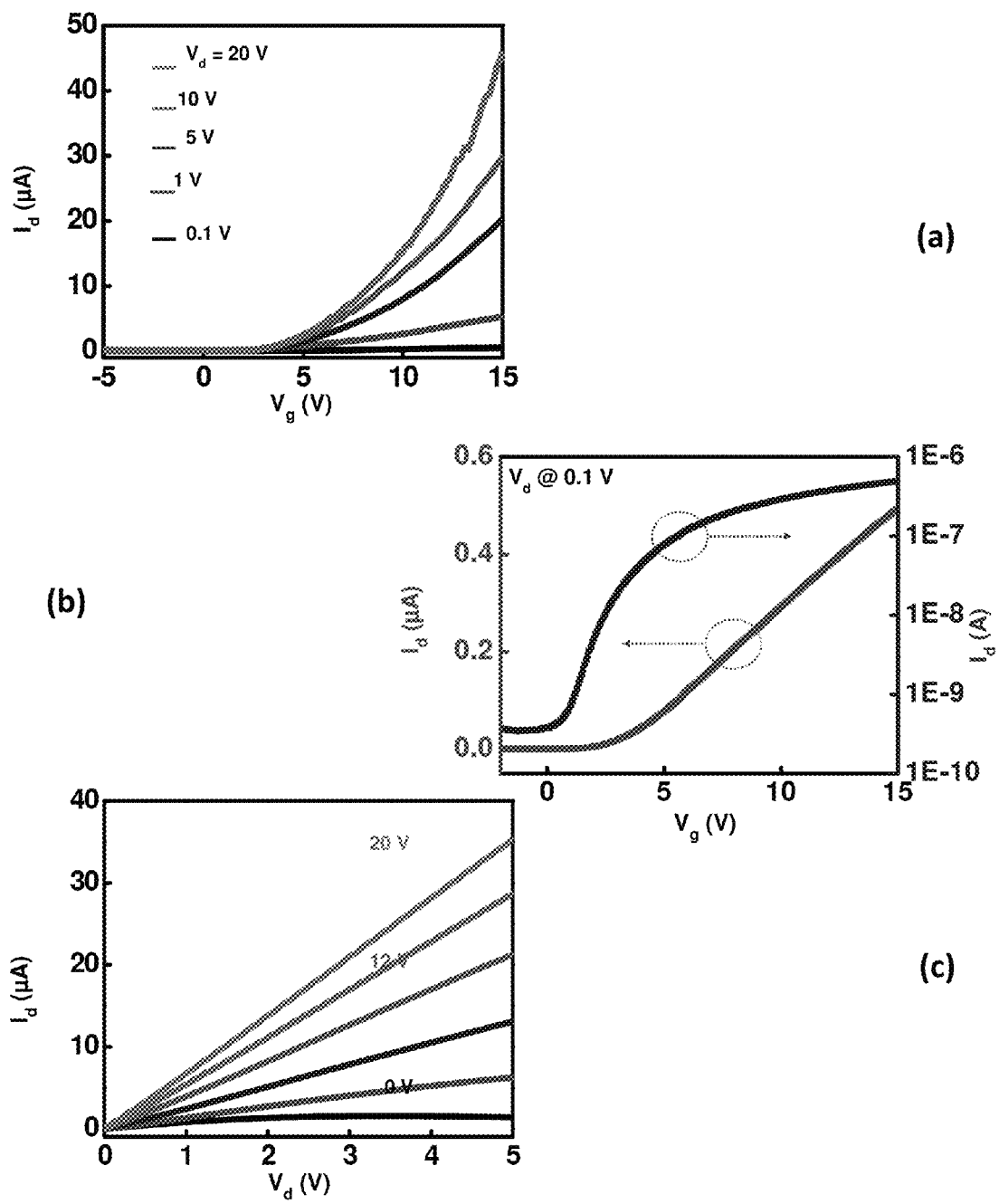

FIG. 86A-C. (a)-(c) Current versus voltage plots for ZnO transistors. On/off ratio$>$~$10^3$, $V_{th}$ (threshold voltage)~$2$V, Mobility ~1 cm$^2$/V·s.

Figure 87:
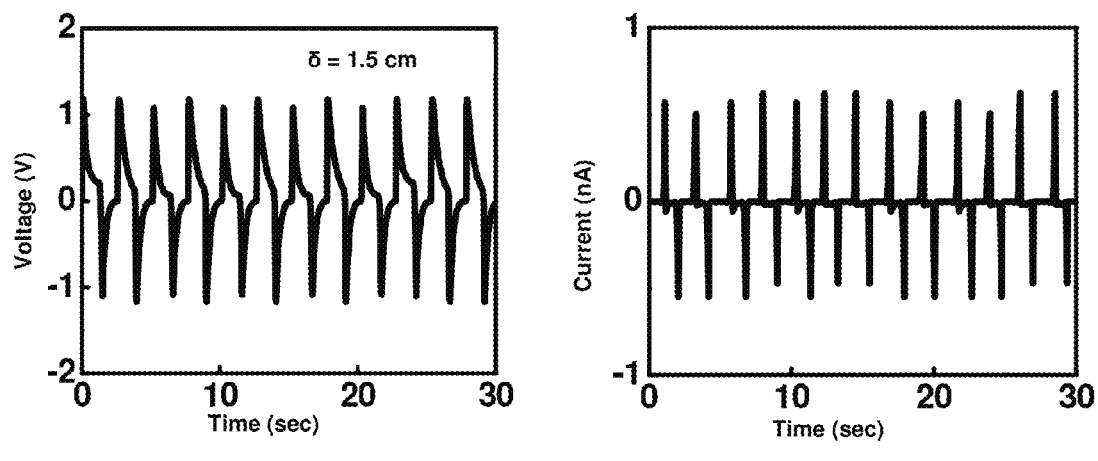
Figure 87:
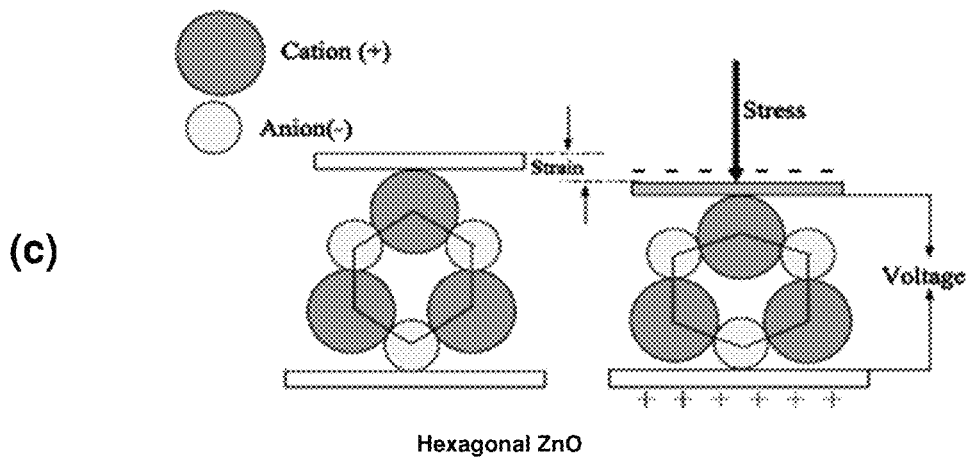

FIG. 87A-C. (a) Time versus voltage and (b) time versus current plots for ZnO energy harvesters under stress and strain as shown schematically in (c). P=I×V=6 nW, Power density=0.15 μW/cm$^2$, Strain Rate=1.5 cm/sec.

Figure 88:
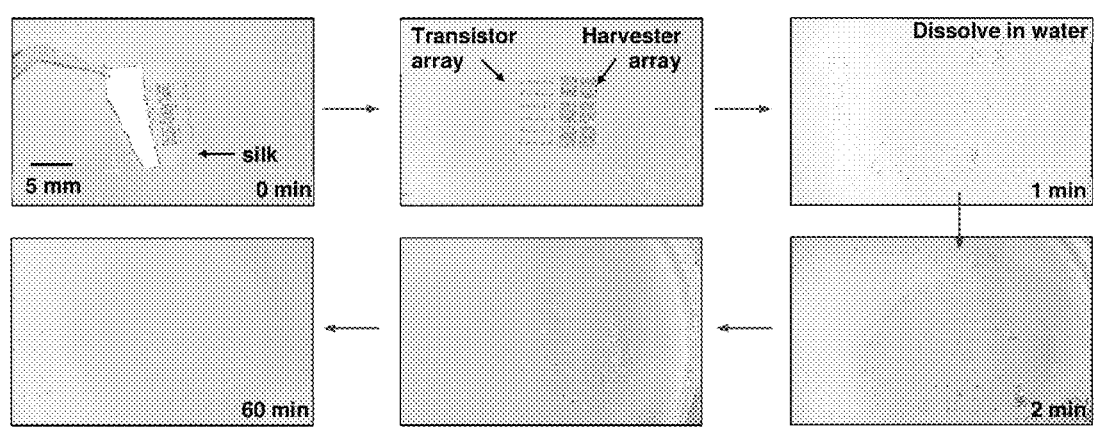

FIG. 88. Photographic time lapse of ZnO transistor arrays and energy harvester arrays on silk substrates dissolving in water.

FIG. 89A-C. Plots showing performance of (a) a ZnO transistor during transience. Performance is measured as (b) mobility over time and (c) current versus voltage.

Figure 90:
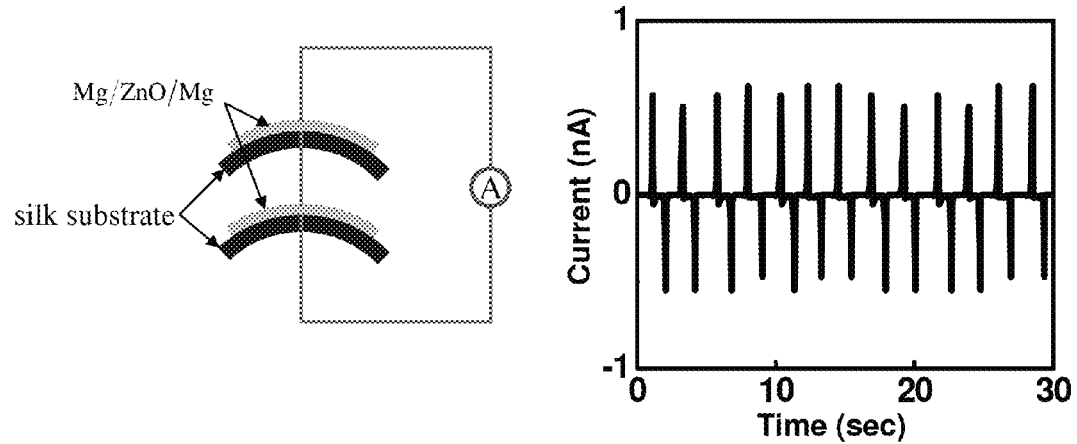

FIG. 90. Model of current from a ZnO energy harvester with Mg contacts on a silk substrate.

Figure 91:
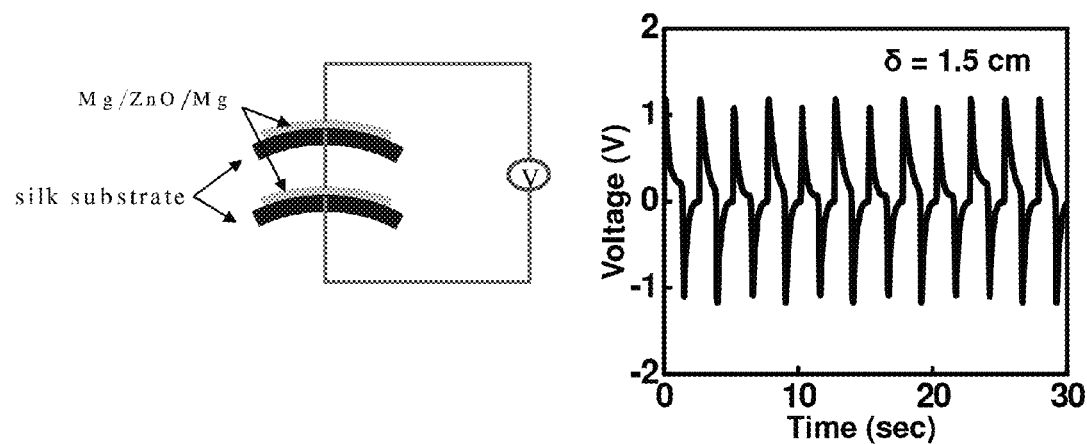

FIG. 91. Model of voltage from a ZnO energy harvester with Mg contacts on a silk substrate.

FIG. 92A-B. Schematic diagram of (a) the electrochemical measurement set up and (b) a plot of current versus voltage for Fe, Al and Cu.

Figure 93:
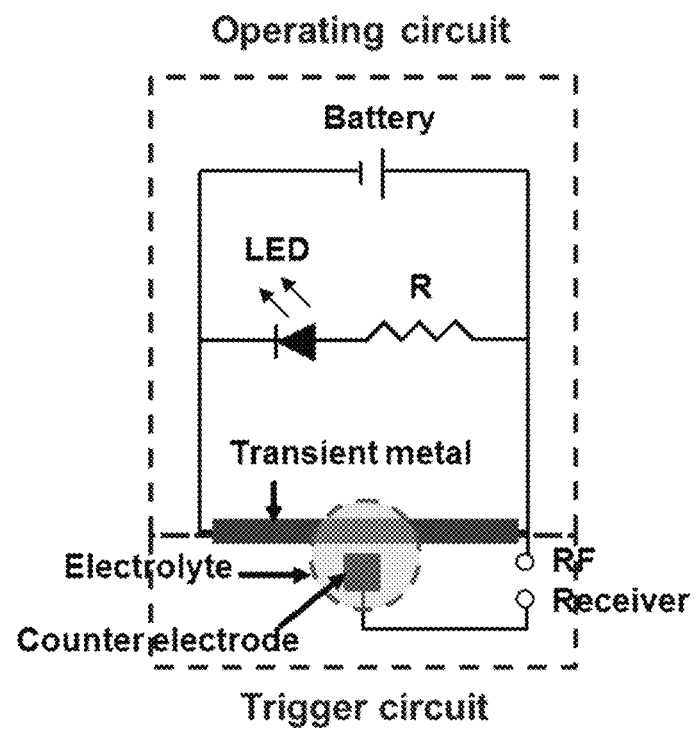
Figure 93:
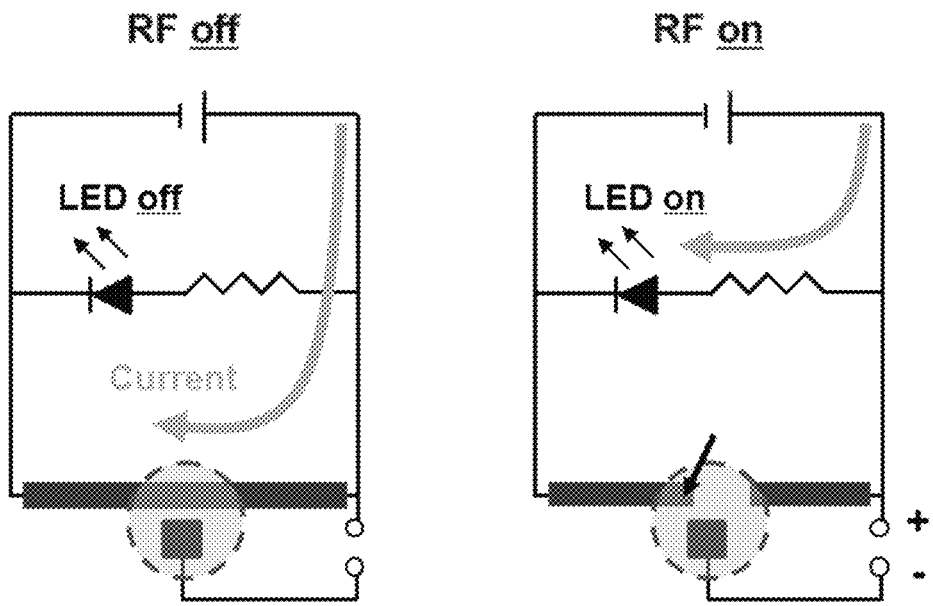

FIG. 93. Schematic diagram of a circuit demonstration wherein anodic dissolution of a first current path via electrochemistry triggers current to travel a secondary current path that lights an LED.

Figure 94:
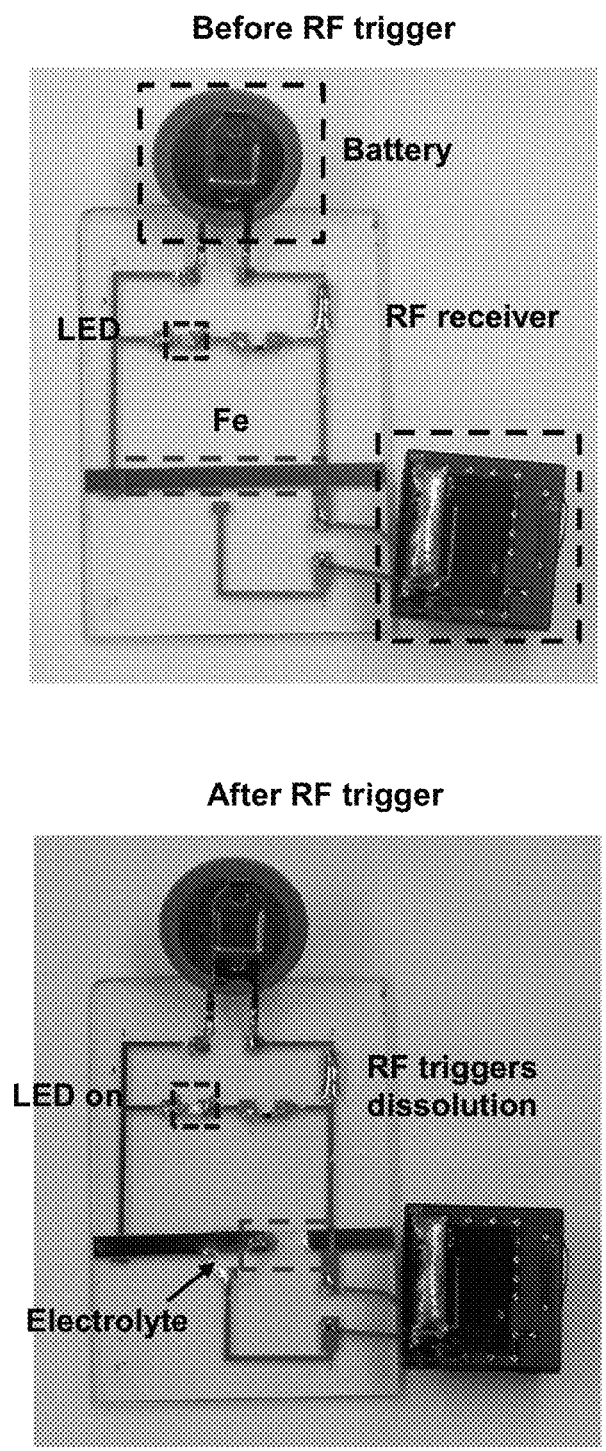

FIG. 94. Photographs of the device described schematically in FIG. 93 before (a) and after (b) anodic dissolution.

Figure 95:
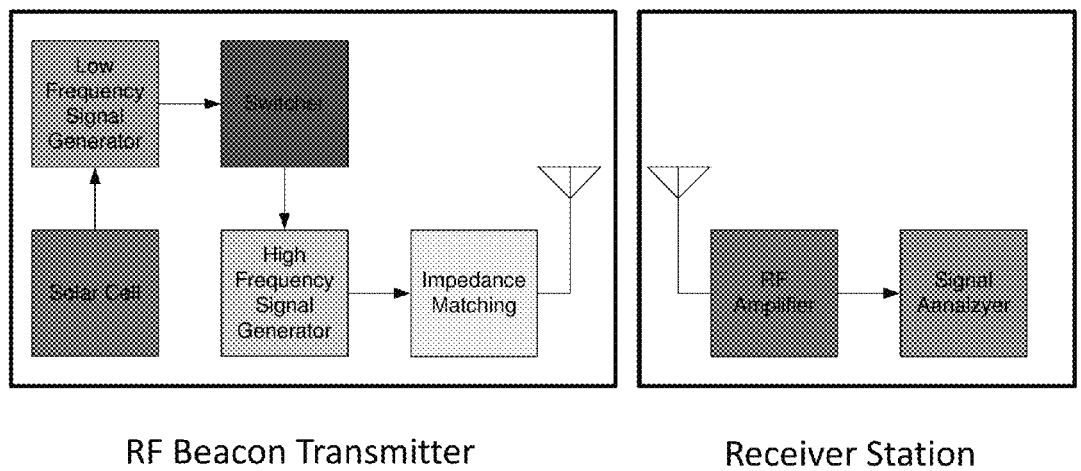

FIG. 95. Schematic diagram of a transient RF beacon.

FIG. 96A-D. Schematic diagram of a transient dual-sided printed circuit board showing (a) the front side, (b) the back side, and (c-d) the alignment of the front side and the back side.

Figure 97A:
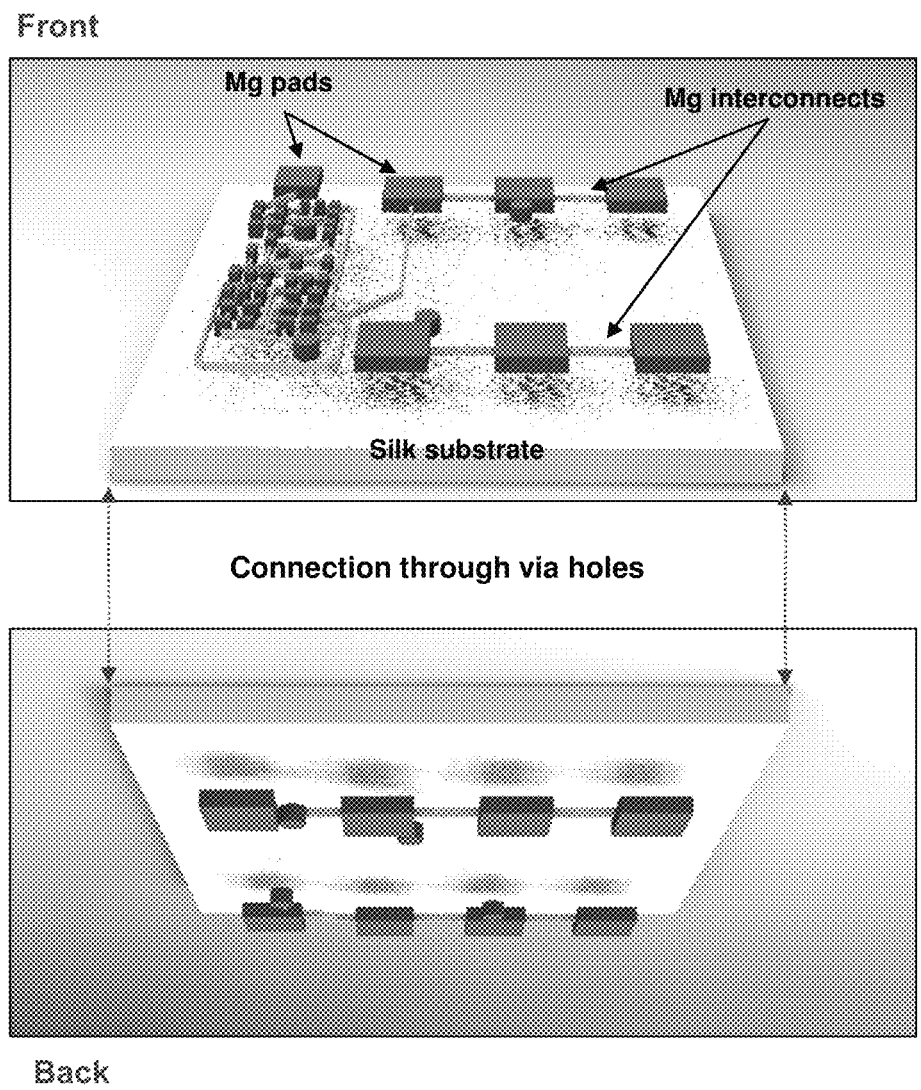
Figure 97B:
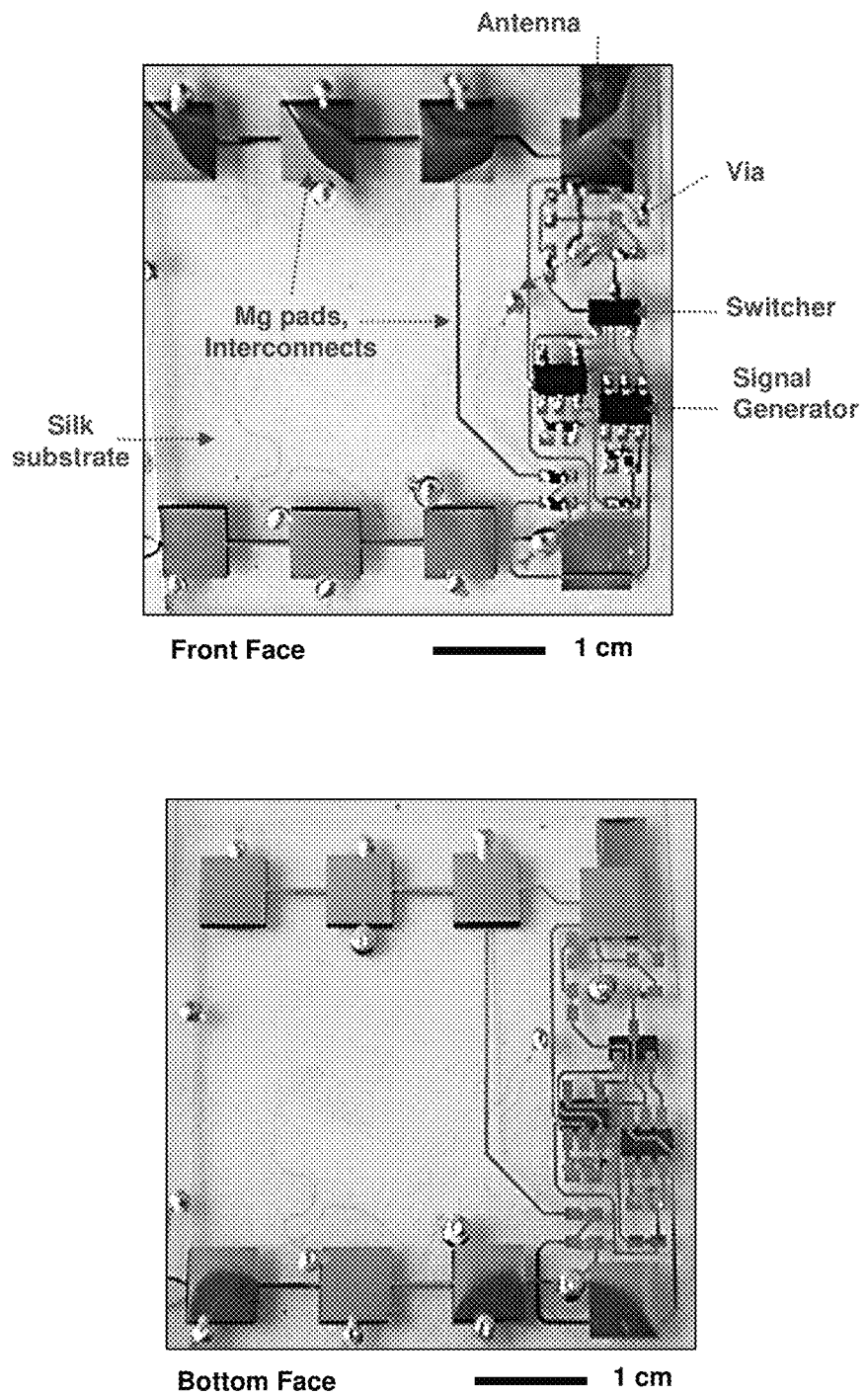

FIG. 97A-B. (a) Schematic diagram of a dual-sided solar powered RF beacon and (b) photographs of the dual-sided solar powered RF beacon.

Figure 98:
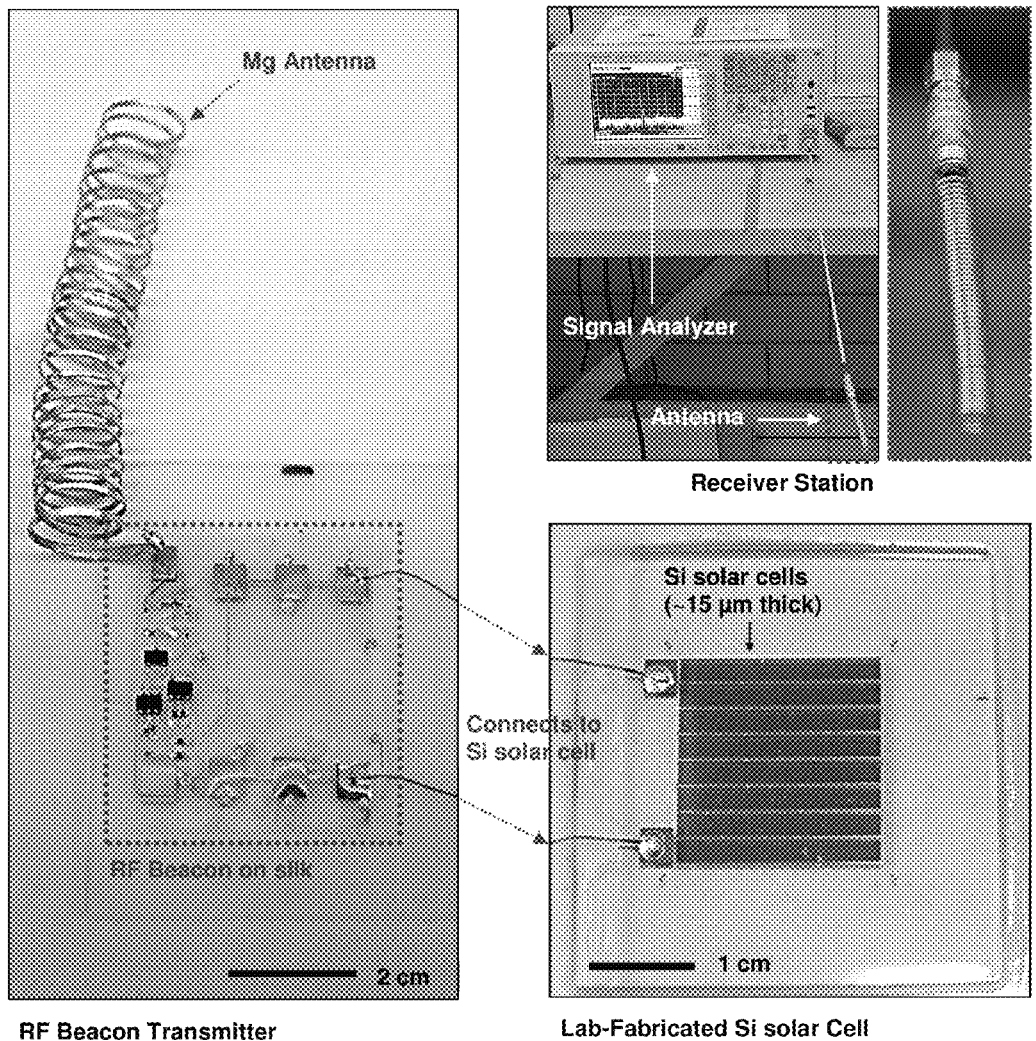

FIG. 98. Photograph of the solar powered RF beacon attached to a Mg antenna that communicates with an antenna of a signal analyzer.

FIG. 99A-C. (a) A solar cell having a thickness of about 3 μm and (b) a plot for the solar cell showing current and power versus voltage. For comparison, figure (c) shows a plot of current versus voltage for the ~15 μm thick solar cell used in the beacon of FIG. 98.

Figure 100:
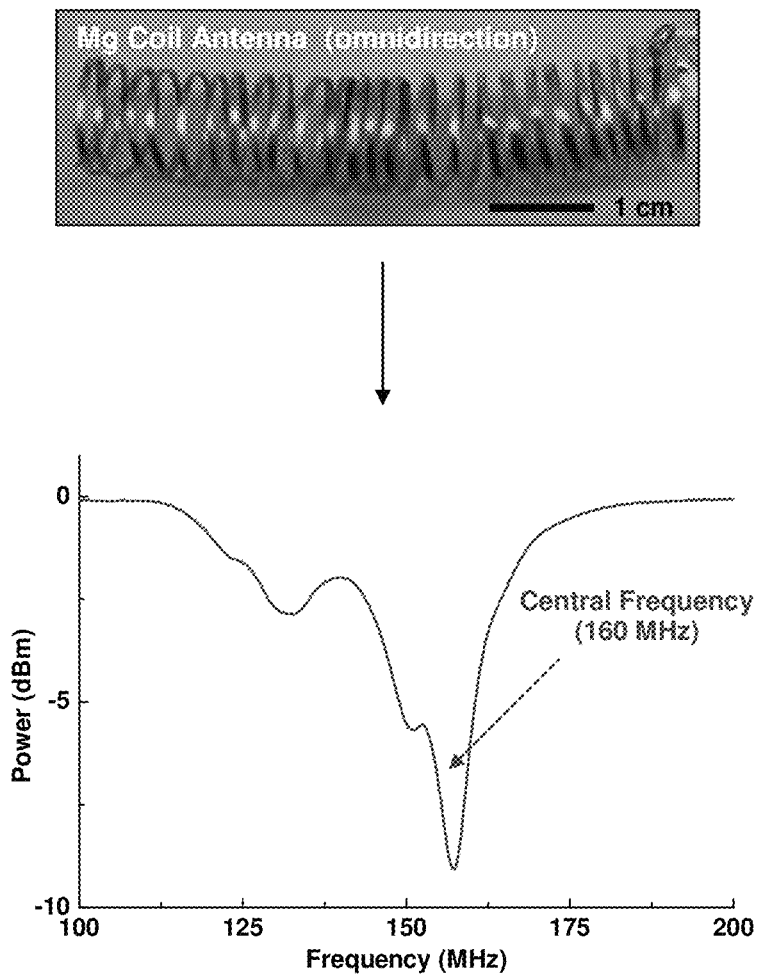

FIG. 100. Omnidirectional Mg coil antenna having a central frequency at 160 MHz.

Figure 101A:
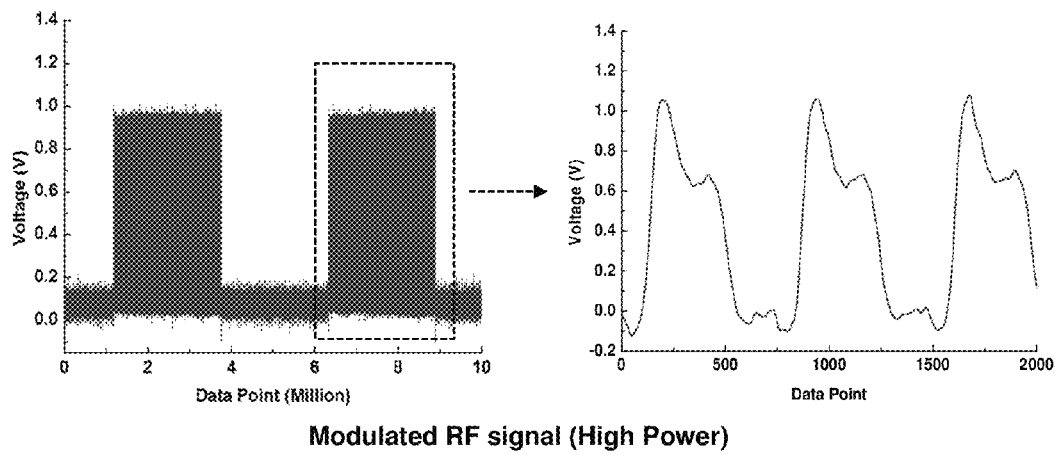
Figure 101B:
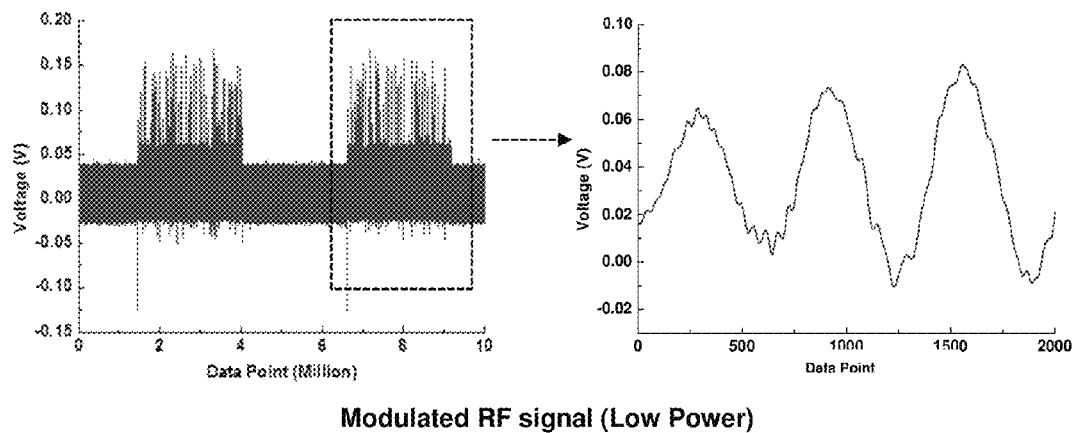

FIG. 101A-B. Graphs of beacon signal output when the device is powered by (a) a DC power supply at high power and (b) a transient solar cell at lower power.

Figure 102A:
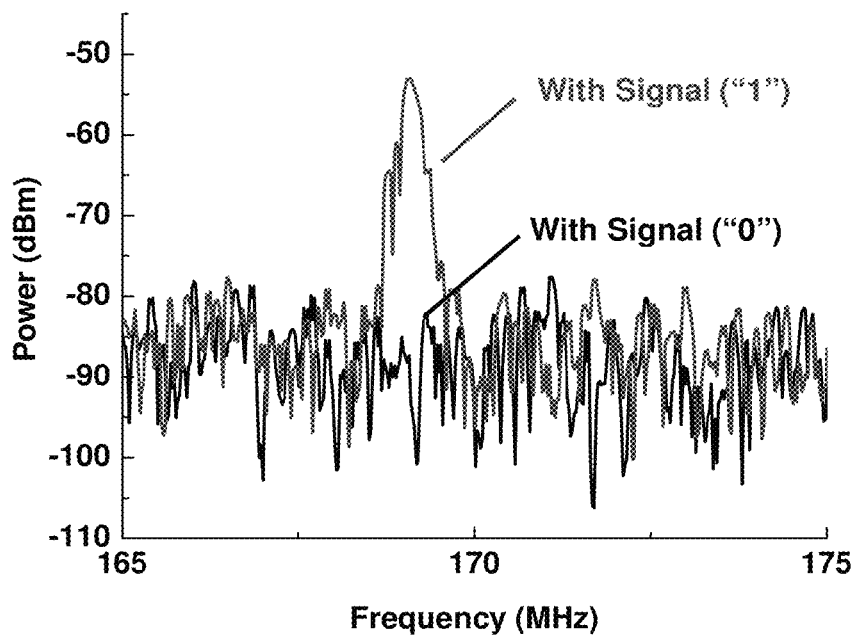
Figure 102B:
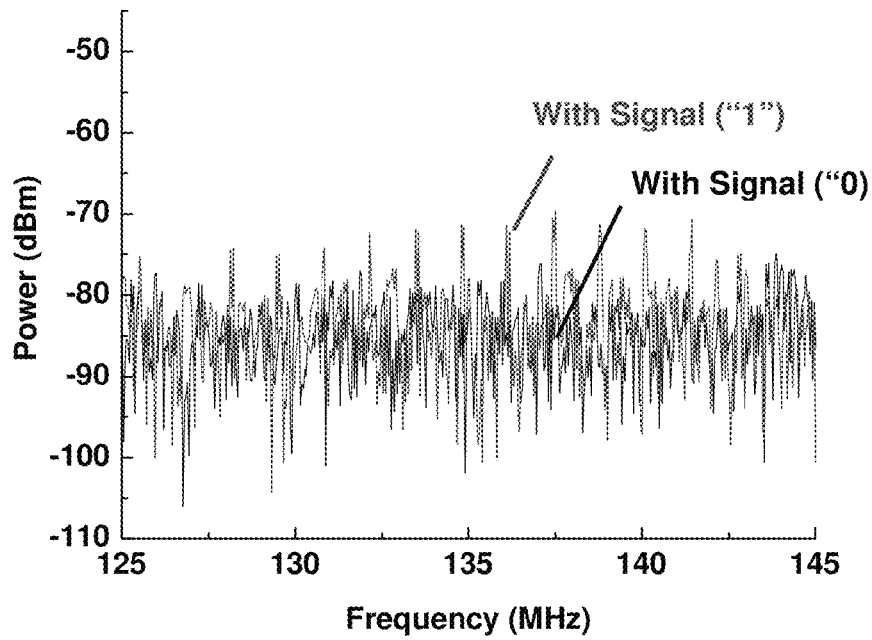

FIG. 102A-B. Graphs showing the signal received by the receiver from the beacon (a) at a distance of 5 meters when powered by a DC power supply and (b) at a distance of 10 cm when powered by a transient solar cell.

Figure 103:
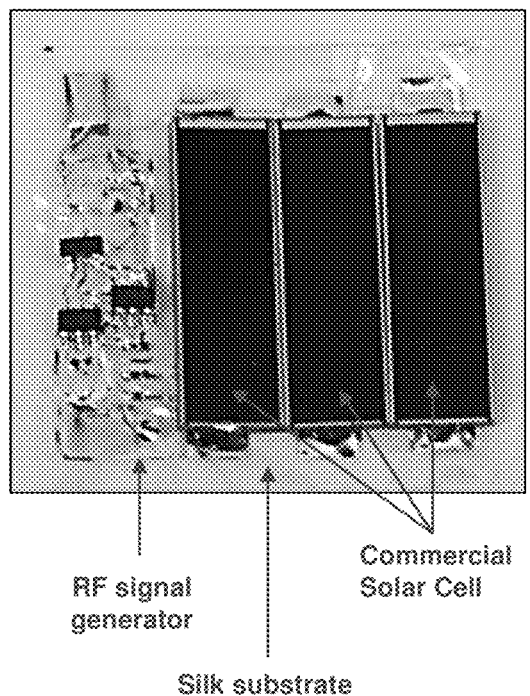

FIG. 103. Photograph of a transient RF beacon transmitter on a silk substrate using commercial solar cells.

Figure 104:
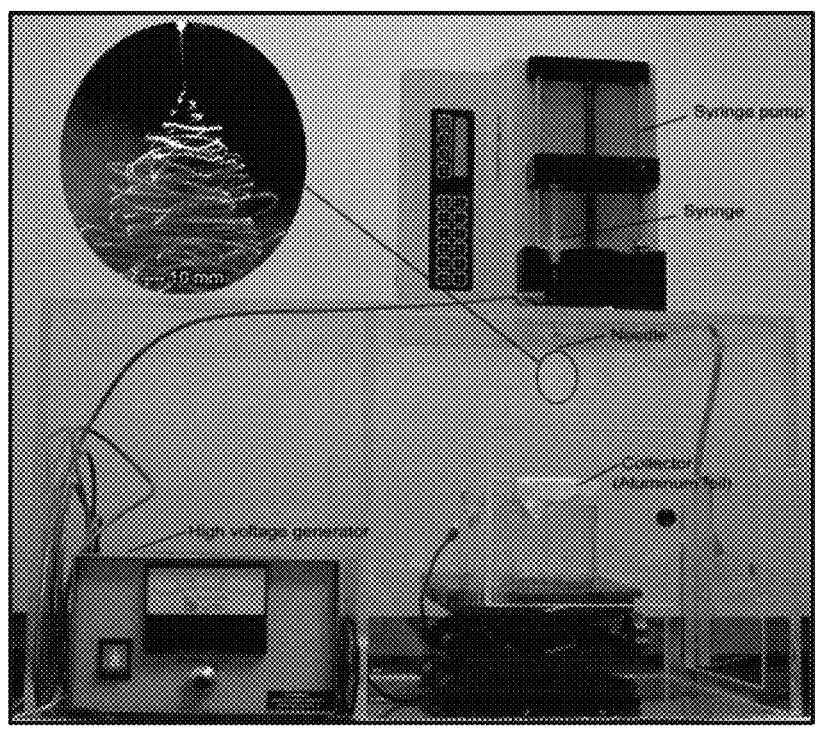

FIG. 104. Photograph of an electrospinning apparatus for generating sublimable materials for use in transient devices.

Figure 105A:
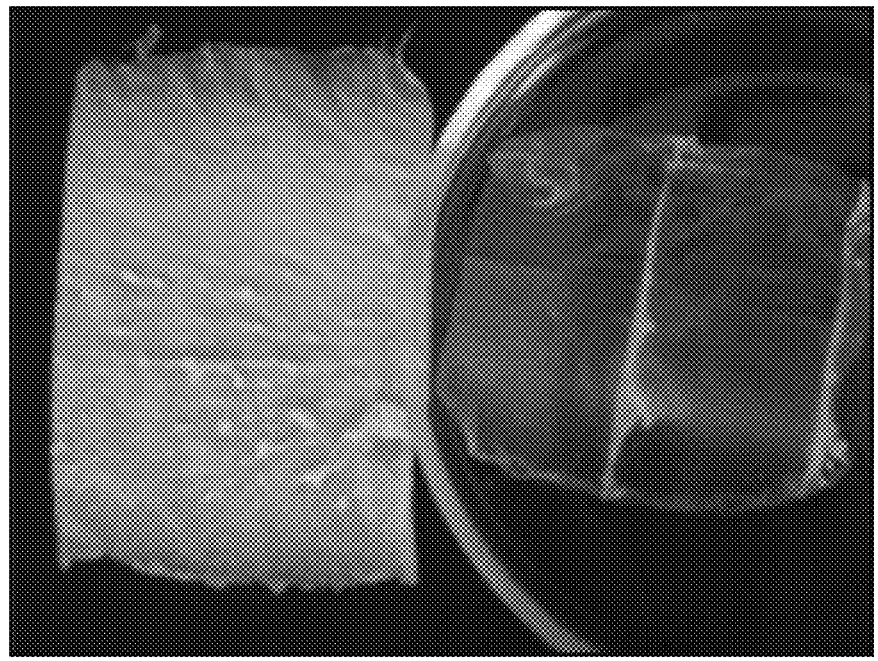
Figure 105B:
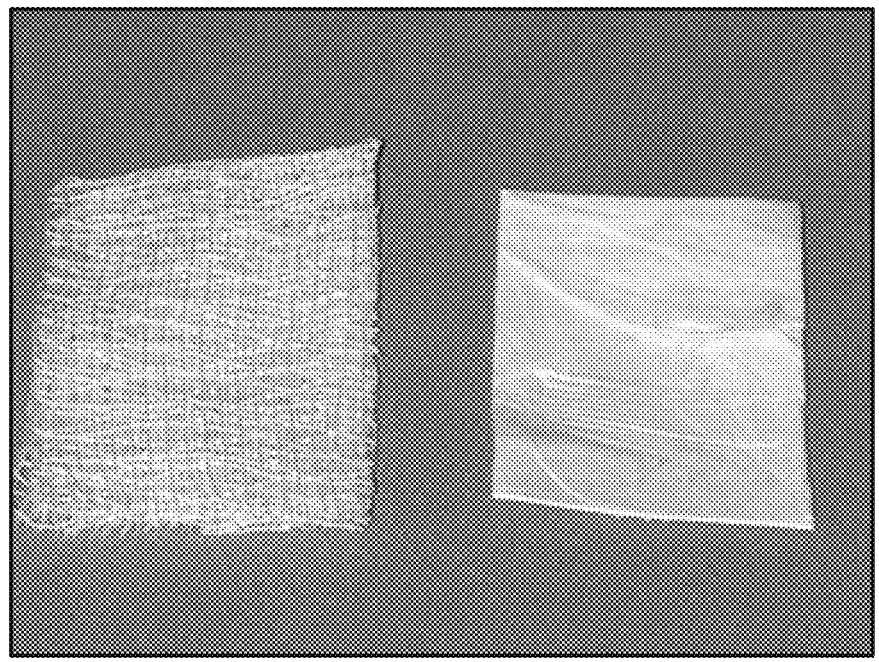

FIG. 105A-B. Photographs of (a) left: dry electrospun PVA mat and right: hydrated electrospun PVA mat and (b) left: cotton gauze and right: electrospun bovine fibrinogen mat.

Figure 106A:
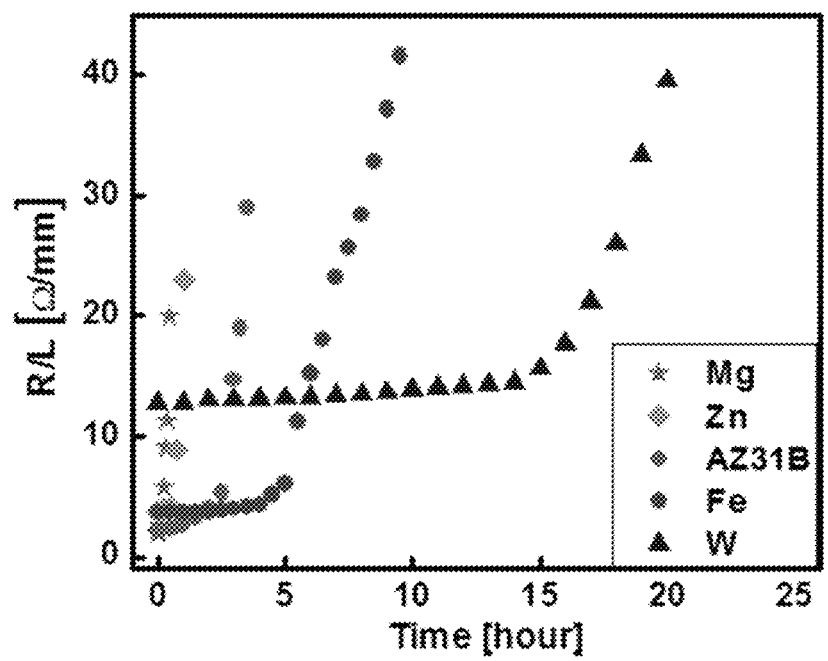
Figure 106B:
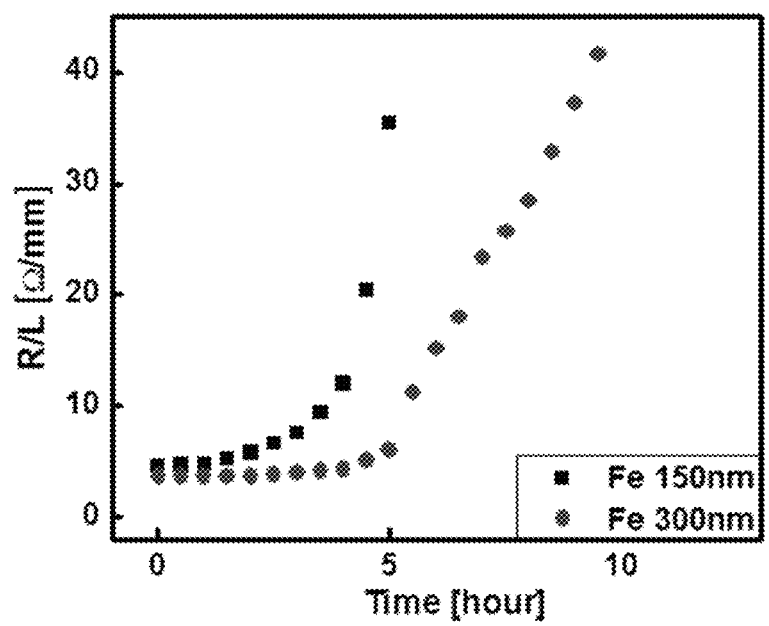

FIG. 106A-B. Plot s showing the approximate time for electrical opens to appear in metal lines for (a) various metals deposited at a thickness of 300 nm and (b) for Fe having thicknesses of 150 nm and 300 nm.

Figure 107A:
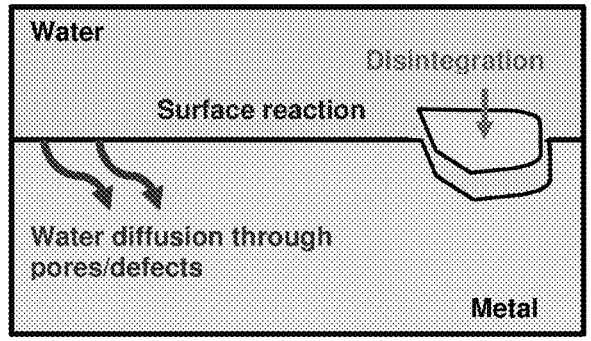
Figure 107B:
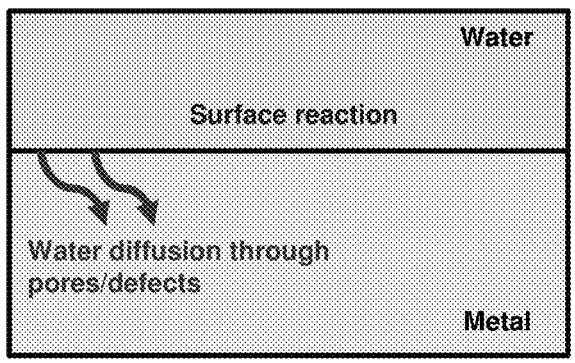
Figure 107C:
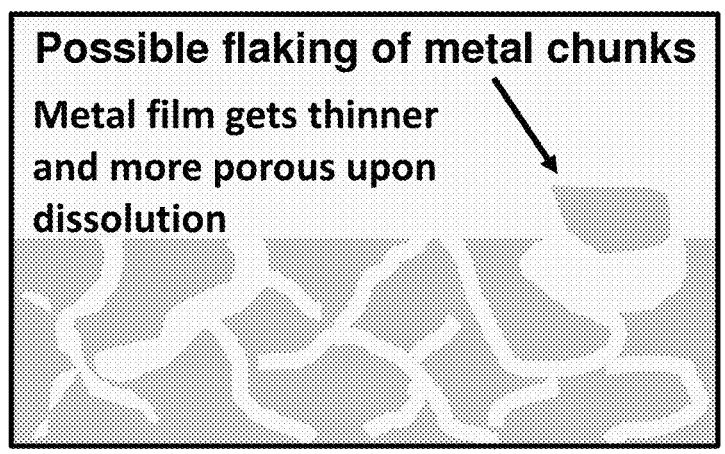

FIG. 107A-C. Schematic diagram of dissolution mechanisms (a) involving disintegration/flaking of metal chunks into water and (b) involving dissolution rather than disintegration/flaking. FIG. 107(c) shows that the metal gets thinner and more porous upon dissolution.

Figure 108:
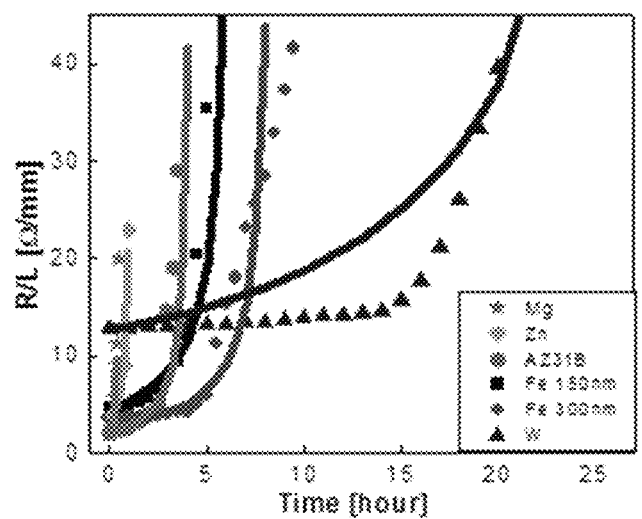

FIG. 108. Plots of theoretical and experimental results showing metal dissolution over time in accordance with FIG. 107(b).

FIG. 109A-E. Photographs showing (a) initial dissolution of tungsten traces followed by (b) disintegration/flaking of tungsten traces at later times, as well as examples of tungsten delamination (FIG. 109(c)), tungsten delamination and cracking (FIG. 109(d)), and tungsten flaking in PBS solution (FIG. 109(e)).

FIG. 110A-C. Photographs of 100 nm W films before dissolution in DI water (a) and after 20 hours of dissolution (b). FIG. 110(c) shows the dissolution behavior of a 100 nm W film of different widths.

FIG. 111A-C. Micrographs of an AZ31B film before dissolution (a) and after 2 hours of dissolution in DI water (b). FIG. 111(c) shows the dissolution behavior of 300 nm AZ31B Mg alloy in DI water and PBS solution.

FIG. 112A-C. Micrographs of a Zn film before dissolution (a) and after 2 hours of dissolution in DI water (b). FIG. 112(c) shows the dissolution behavior of 300 nm Zn in DI water and PBS solution.

FIG. 113A-C. Micrographs of an Fe film with coarse/dense grains (a) that corrode faster than the finer grains of (b). FIG. 112(c) shows the dissolution behavior of 150 nm Fe in DI water and PBS solution.

FIG. 114A-D. (a)-(d) Plots summarizing metal dissolution data in DI water (pH 6.8) and in phosphate buffer solution (pH 7.4).

Figure 115:
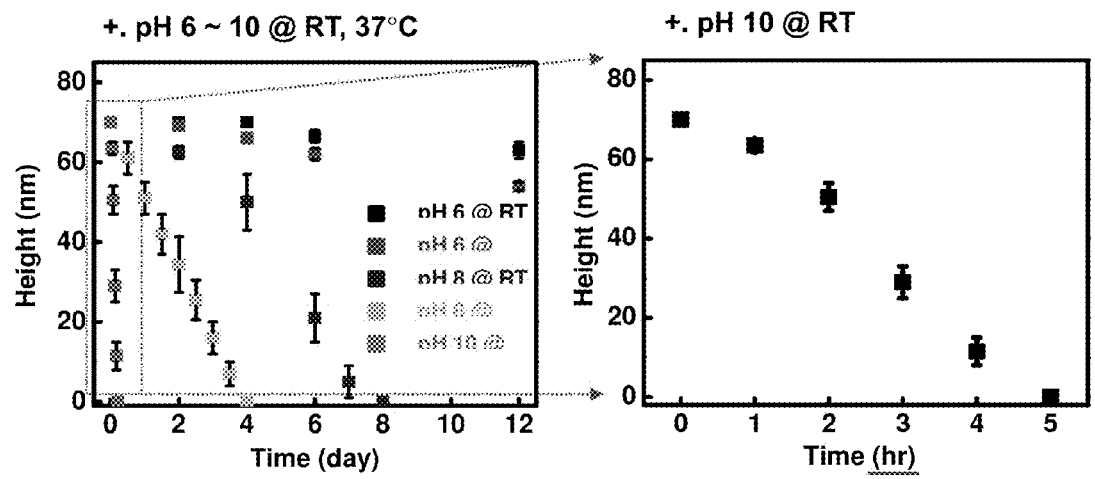

FIG. 115. Plot of the dissolution properties of Si in PBS.

Figure 116A:
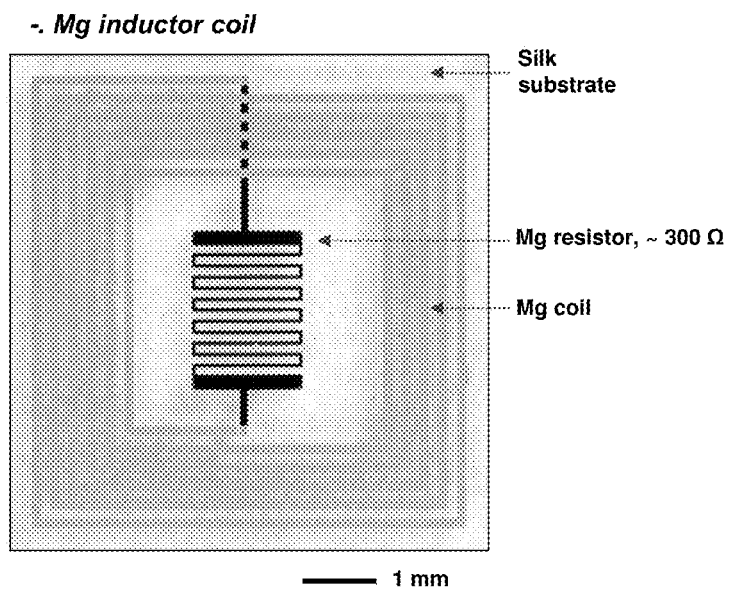
Figure 116B:
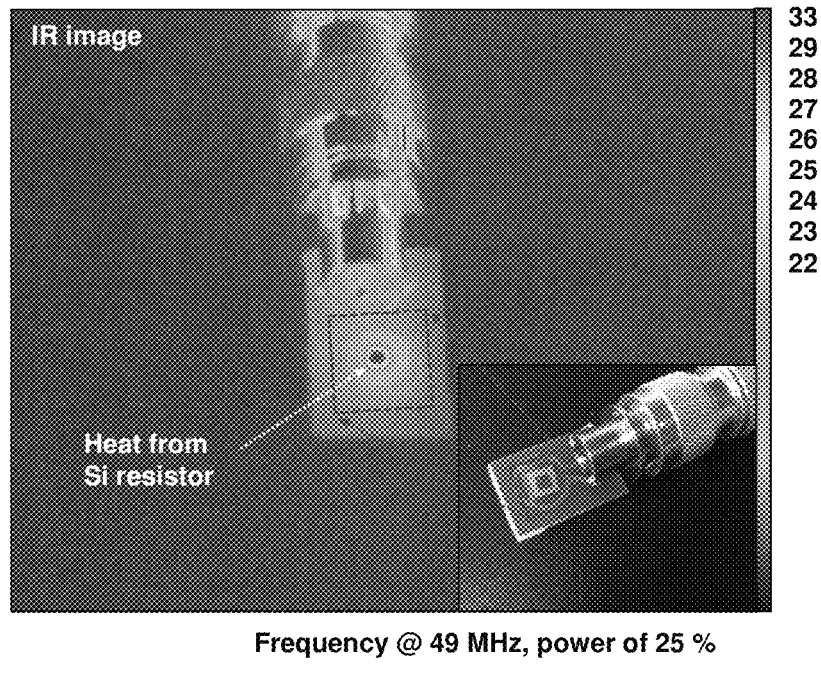

FIG. 116A-B. (a) Photograph and (b) infrared image of a transient thermal therapy device having a Mg inductor coil and a Mg resistor on a silk substrate.

Figure 117:
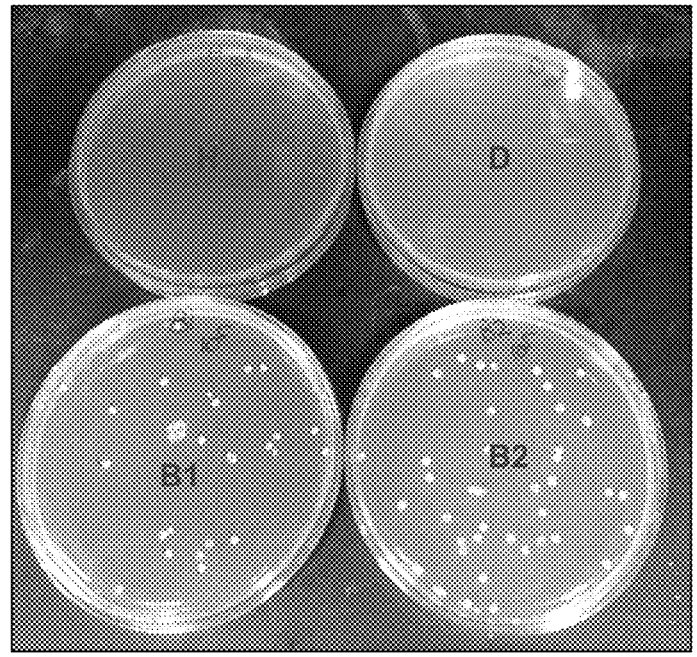

FIG. 117. Photograph of in vitro evaluations of bacterial cultures. (H) no implant, no injection of healthy tissue, (D) device implanted, (B1 and B2) bacteria injected.

FIG. 118A-C. (a)-(c) Schematic diagram of fully formed transient MOSFETS and integrated circuits.

Figure 119:
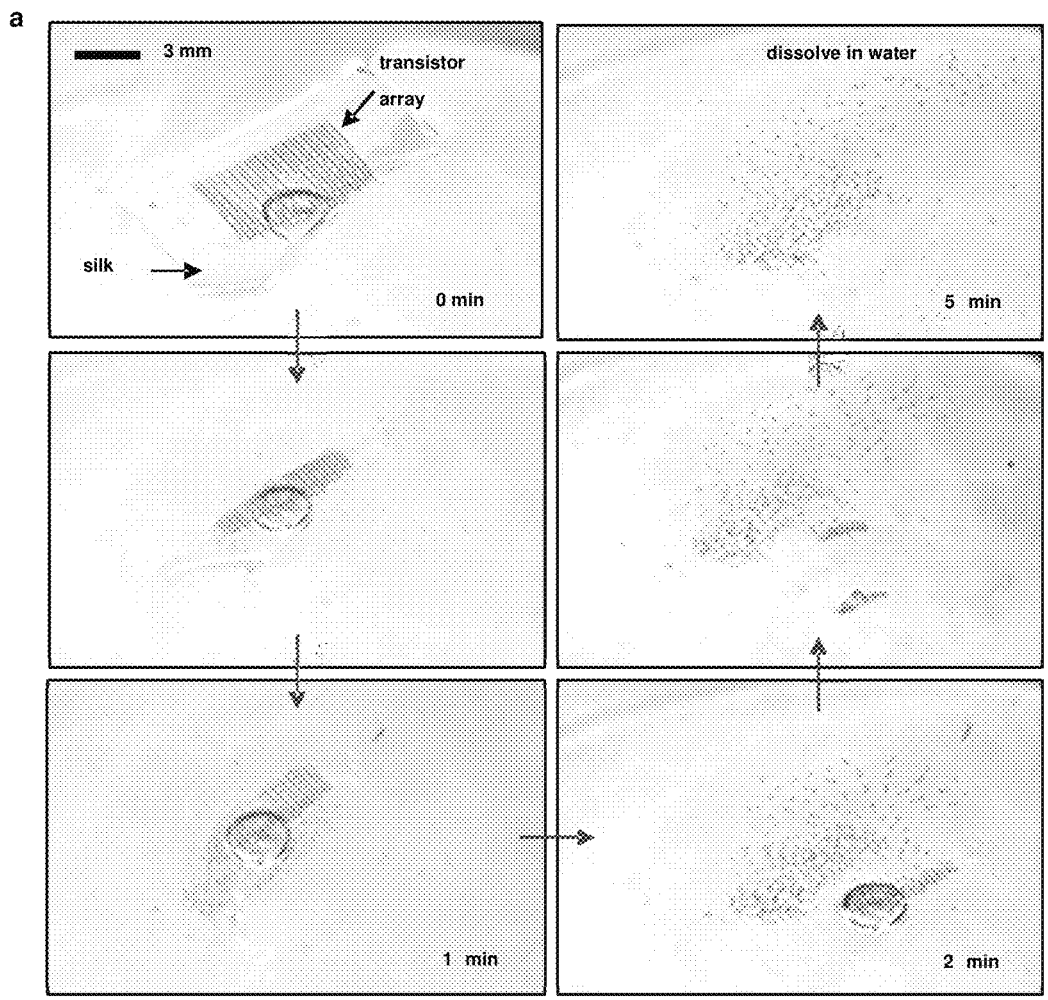

FIG. 119. Photographs showing a time lapse of the dissolution of fully formed transient MOSFETS and integrated circuits.

FIGS. 120A-G and I-J. (a)-(g) and (i)-(j) Photographs and performance plots of fully formed transient MOSFETS and integrated circuits.

FIG. 121A-H. Photographs and performance plots of transient RF electronics: (a-b) rectifiers, (c-d) capacitors, (e-f) inductors, and (g-h) resistors.

FIG. 122A-E. (a)-(e) Photographs and performance plots of transient RF electronics: 3-stage cMOS ring oscillators.

Figure 123:
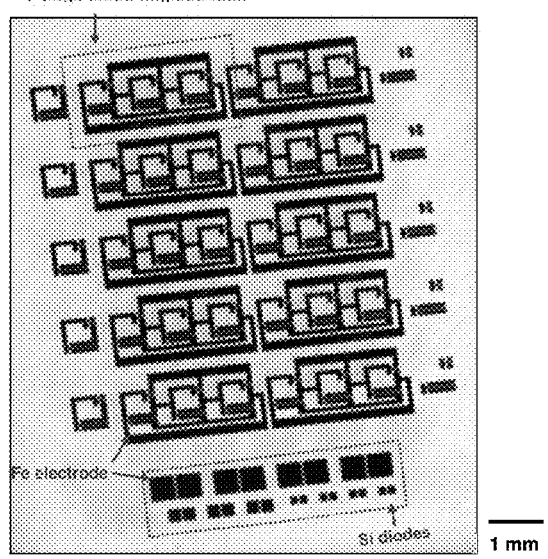

FIG. 123. Photographs of Fe electrode cMOS oscillators.

Figure 124:
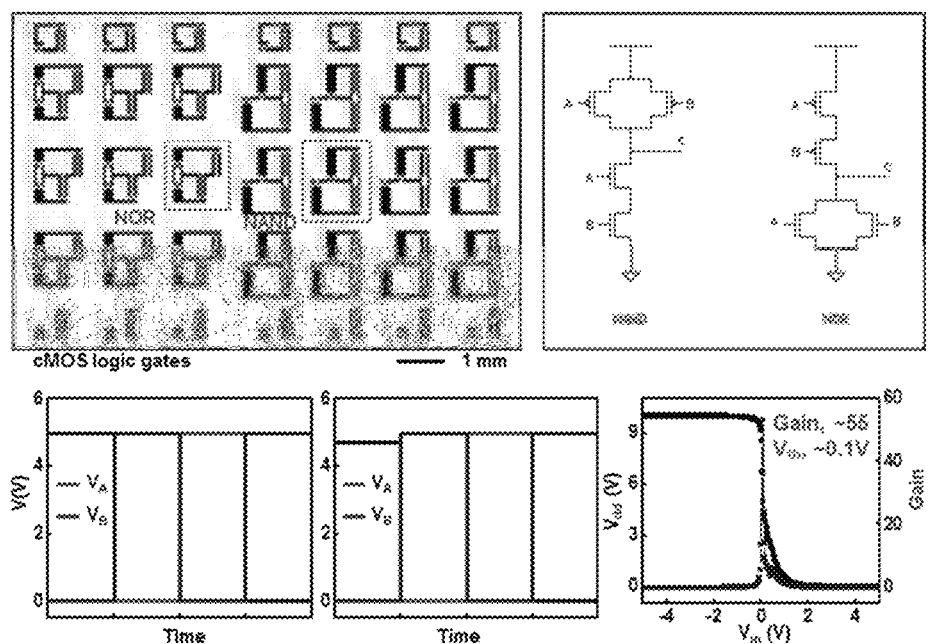

FIG. 124. Photographs, schematics and plots relating to Fe electrode cMOS logic circuits (NAND, NOR).

Figure 125:
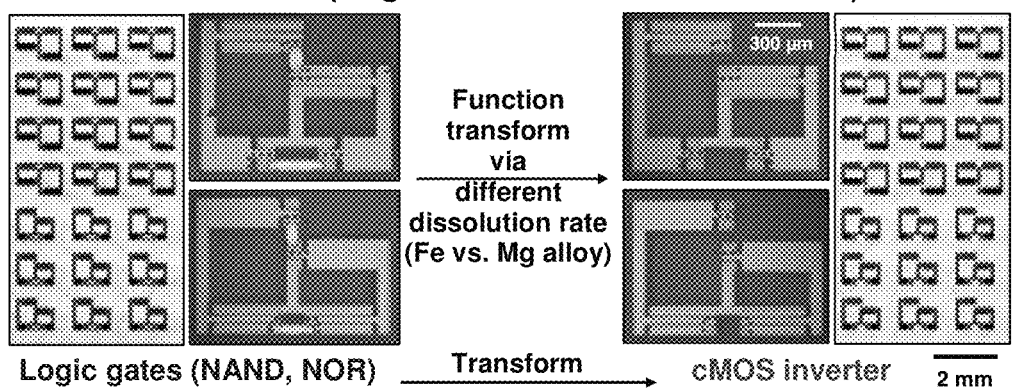

FIG. 125. Photographs of logic circuit transformation (logic circuits to cMOS inverter).

Figure 126:
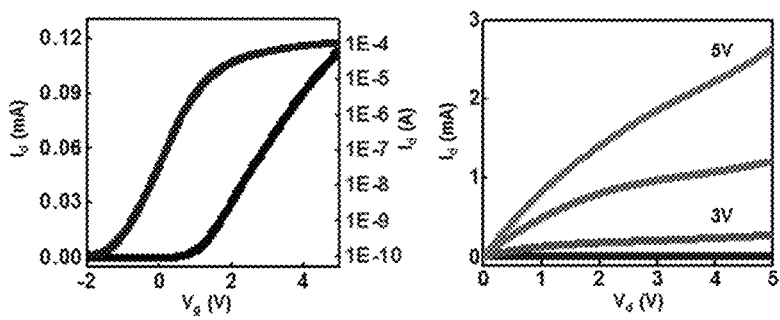

FIG. 126. Plots showing the performance of Mg alloy (AZ31B, Al 3%, ZN 1%) TFTs.

FIG. 127A-C. (a)-(c) Photographs, performance plots, and time lapse dissolution studies of transient RF electronics having antennas.

FIG. 128A-F. (a)-(f) Schematics, photographs, and time lapse dissolution studies of a transient RF device incorporating components from FIGS. 115-117.

Figure 129A:
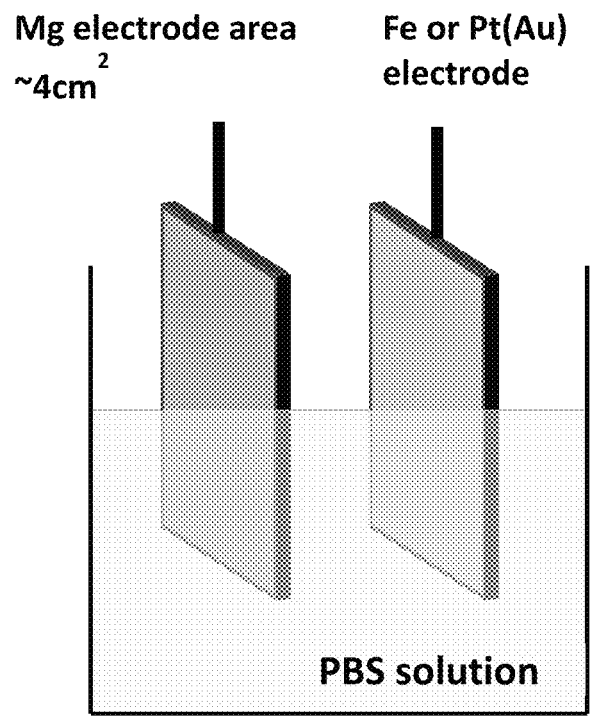
Figure 129B:
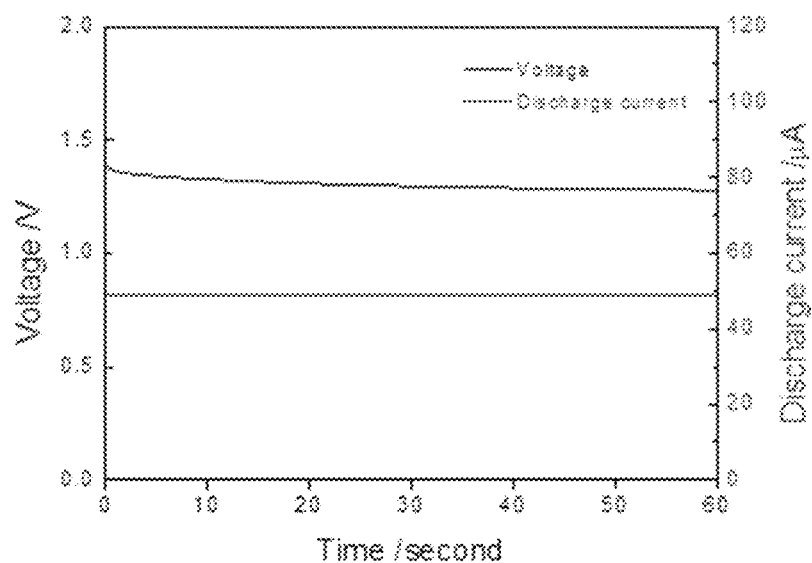
Figure 129C:
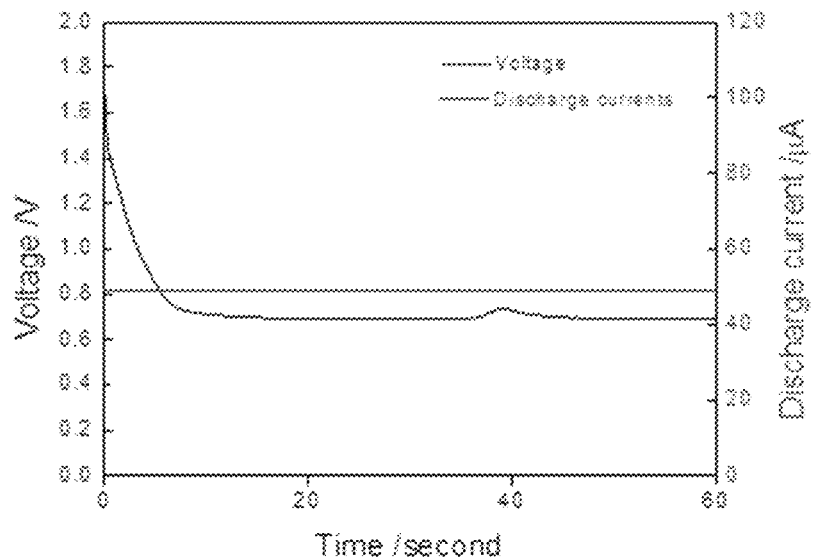

FIG. 129A-C. Schematic of the electrochemical transient power supply (a) and performance plots showing voltage and discharge current over time for the metal couples (b)-(c).

Figure 130A:
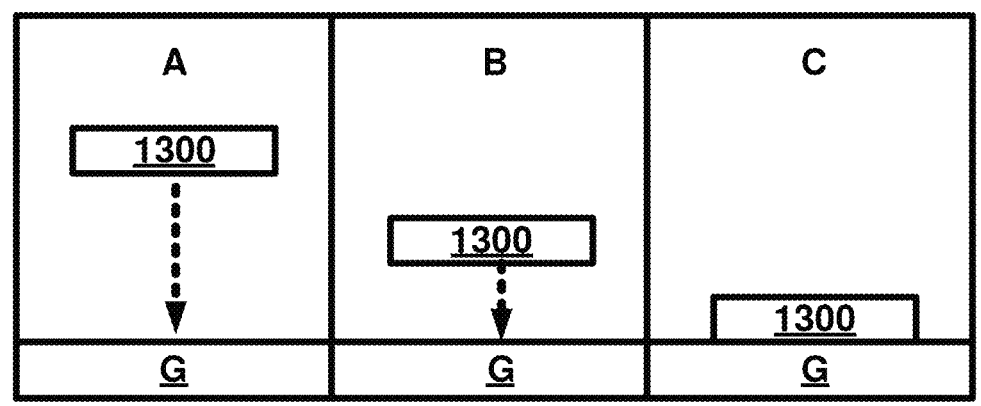
Figure 130B:
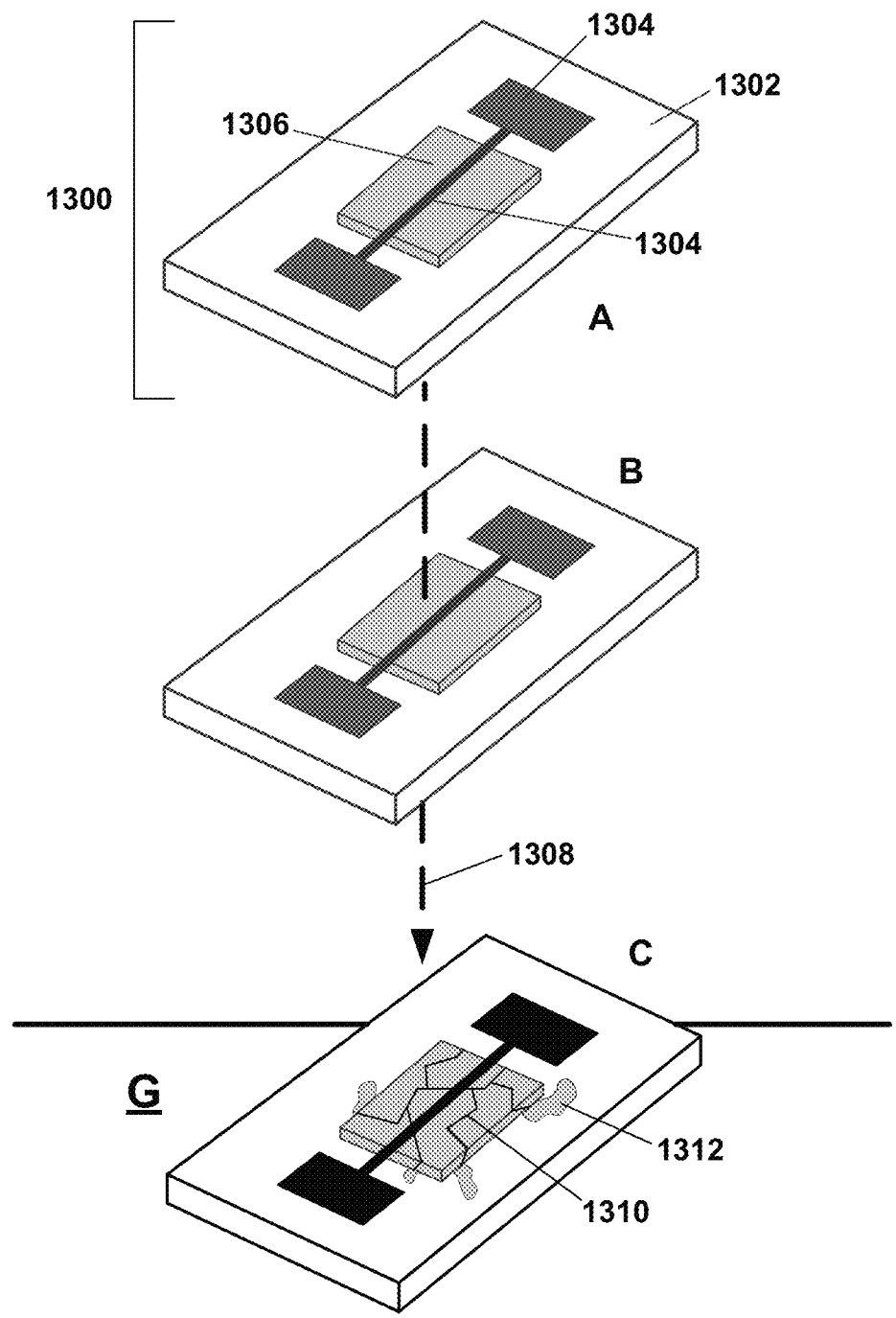

FIG. 130A-B. (a)-(b) Time lapse schematic diagrams of a transient device falling toward ground and releasing a transforming liquid upon impact with the ground.

Figure 131:
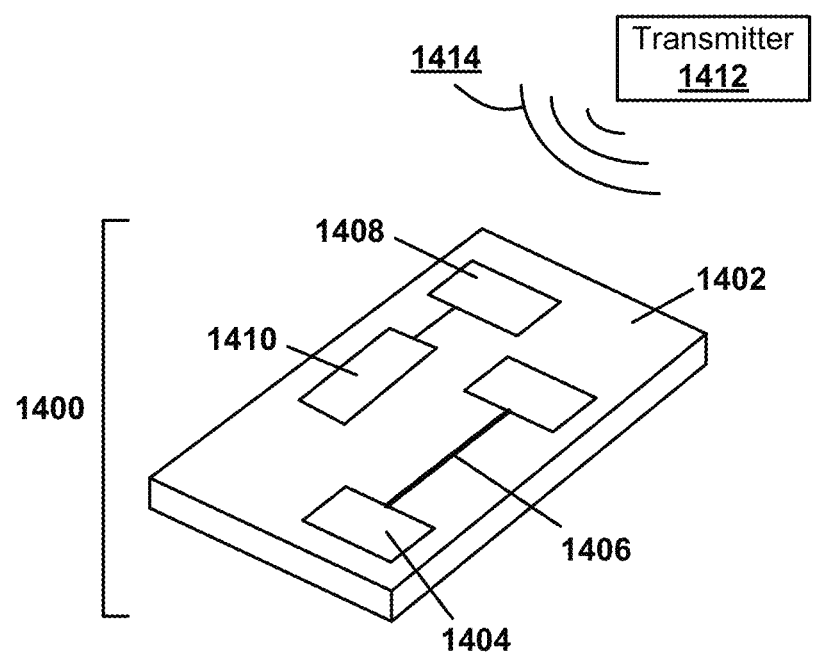

FIG. 131. Schematic of a transient device having an antenna for receiving a signal from a remote transmitter.

DETAILED DESCRIPTION

In general, the terms and phrases used herein have their art-recognized meaning, which can be found by reference to standard texts, journal references and contexts known to those skilled in the art. The following definitions are provided to clarify their specific use in the context of the invention.

"Functional layer" refers to a layer that imparts some functionality to the device. For example, the functional layer may contain semiconductor components, metallic components, dielectric components, optical components, piezoelectric components, etc. Alternatively, the functional layer may comprise multiple layers, such as multiple semiconductor layers, metallic layers or dielectric layers separated by support layers. The functional layer may comprise a plurality of patterned elements, such as interconnects running between electrodes or islands. The functional layer may be heterogeneous or may have one or more properties that are inhomogeneous. "Inhomogeneous property" refers to a physical parameter that can spatially vary, thereby effecting the position of the neutral mechanical plane within a multilayer device.

"Structural layer" refers to a layer that imparts structural functionality, for example by supporting, securing and/or encapsulating device components. The invention includes transient devices having one or more structural layers, such as encapsulating layers, embedding layers, adhesive layers and/or substrate layers.

"Semiconductor" refers to any material that is an insulator at a very low temperature, but which has an appreciable electrical conductivity at a temperature of about 300 Kelvin. In the present description, use of the term semiconductor is intended to be consistent with use of this term in the art of microelectronics and electronic devices. Useful semiconductors include those comprising elemental semiconductors, such as silicon, germanium and diamond, and compound semiconductors, such as group IV compound semiconductors such as SiC and SiGe, group III-V semiconductors such as AlSb, AlAs, AlN, AlP, BN, BP, BAs, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors such as CuCl, group IV-VI semiconductors such as PbS, PbTe, and SnS, layer semiconductors such as $PbI_2$, $MoS_2$, and GaSe, oxide semiconductors such as CuO and $Cu_2O$. The term semiconductor includes intrinsic semiconductors and extrinsic semiconductors that are doped with one or more selected materials, including semiconductors having p-type doping materials and n-type doping materials, to provide beneficial electronic properties useful for a given application or device. The term semiconductor includes composite materials comprising a mixture of semiconductors and/or dopants. Specific semiconductor materials useful for some embodiments include, but are not limited to, Si, Ge, Se, diamond, fullerenes, SiC, SiGe, SiO, $SiO_2$, SiN, AlSb, AlAs, AlIn, AlN, AlP, AIS, BN, BP, BAs, $As_2S_3$, GaSb, GaAs, GaN, GaP, GaSe, InSb, InAs, InN, InP, CsSe, CdS, CdSe, CdTe, $Cd_3P_2$, $Cd_3As_2$, $Cd_3Sb_2$, ZnO, ZnSe, ZnS, ZnTe, $Zn_3P_2$, $Zn_3As_2$, $Zn_3Sb_2$, $ZnSiP_2$, CuCl, PbS, PbSe, PbTe, FeO, $FeS_2$, NiO, EuO, EuS, PtSi, TlBr, $CrBr_3$, SnS, SnTe, $PbI_2$, $MoS_2$, GaSe, CuO, $Cu_2O$, HgS, HgSe, HgTe, $HgI_2$, MgS, MgSe, MgTe, CaS, CaSe, SrS, SrTe, BaS, BaSe, BaTe, $SnO_2$, TiO, $TiO_2$, $Bi_2S_3$, $Bi_2O_3$, $Bi_2Te_3$, $BiI_3$, $UO_2$, $UO_3$, $AgGaS_2$, PbMnTe, $BaTiO_3$, $SrTiO_3$, $LiNbO_3$, $La_2CuO_4$, $La_{0.7}Ca_{0.3}MnO_3$, CdZnTe, CdMnTe, $CuInSe_2$, copper indium gallium selenide (CIGS), HgCdTe, HgZnTe, HgZnSe, PbSnTe, $Tl_2SnTe_5$, $Tl_2GeTe_5$, AlGaAs, AlGaN, AlGaP, AlInAs, AlInSb, AlInP, AlInAsP, AlGaAsN, GaAsP, GaAsN, GaMnAs, GaAsSbN, GaInAs, GaInP, AlGaAsSb, AlGaAsP, AlGaInP, GaInAsP, InGaAs, InGaP, InGaN, InAsSb, InGaSb, InMnAs, InGaAsP, InGaAsN, InAlAsN, GaInNAsSb, GaInAsSbP, and any combination of these. Porous silicon semiconductor materials are useful for aspects described herein. Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

A "semiconductor component" broadly refers to any semiconductor material, composition or structure, and expressly includes high quality single crystalline and polycrystalline semiconductors, semiconductor materials fabricated via high temperature processing, doped semiconductor materials, inorganic semiconductors, and composite semiconductor materials.

A "component" is used broadly to refer to an individual part of a device. An "interconnect" is one example of a component, and refers to an electrically conducting structure capable of establishing an electrical connection with another component or between components. In particular, an interconnect may establish electrical contact between components that are separate. Depending on the desired device specifications, operation, and application, an interconnect is made from a suitable material. Suitable conductive materials include semiconductors and metallic conductors.

Other components include, but are not limited to, thin film transistors (TFTs), transistors, diodes, electrodes, integrated circuits, circuit elements, control elements, photovoltaic elements, photovoltaic elements (e.g. solar cell), sensors, light emitting elements, actuators, piezoelectric elements, receivers, transmitters, microprocessors, transducers, islands, bridges and combinations thereof. Components may be connected to one or more contact pads as known in the art, such as by metal evaporation, wire bonding, and application of solids or conductive pastes, for example. Electronic devices of the invention may comprise one or more components, optionally provided in an interconnected configuration.

"Neutral mechanical plane" (NMP) refers to an imaginary plane existing in the lateral, b, and longitudinal, l, directions of a device. The NMP is less susceptible to bending stress than other planes of the device that lie at more extreme positions along the vertical, h, axis of the device and/or within more bendable layers of the device. Thus, the position of the NMP is determined by both the thickness of the device and the materials forming the layer(s) of the device. In an embodiment, a device of the invention includes one or more inorganic semiconductor components, one or more metallic conductor components or one or more inorganic semiconductor components and one or more metallic conductor components provided coincident with, or proximate to, the neutral mechanical plane of the device.

"Coincident" refers to the relative position of two or more objects, planes or surfaces, for example a surface such as a neutral mechanical plane that is positioned within or is adjacent to a layer, such as a functional layer, substrate layer, or other layer. In an embodiment, a neutral mechanical plane is positioned to correspond to the most strain-sensitive layer or material within the layer.

"Proximate" refers to the relative position of two or more objects, planes or surfaces, for example a neutral mechanical plane that closely follows the position of a layer, such as a functional layer, substrate layer, or other layer while still providing desired conformability without an adverse impact on the strain-sensitive material physical properties. "Strain-sensitive" refers to a material that fractures or is otherwise impaired in response to a relatively low level of strain. In general, a layer having a high strain sensitivity, and consequently being prone to being the first layer to fracture, is located in the functional layer, such as a functional layer containing a relatively brittle semiconductor or other strain-sensitive device element. A neutral mechanical plane that is proximate to a layer need not be constrained within that layer, but may be positioned proximate or sufficiently near to provide a functional benefit of reducing the strain on the strain-sensitive device element when the device is conformed to a tissue surface. In some embodiments, proximate to refers to a position of a first element within 100 microns of a second element, or optionally within 10 microns for some embodiments, or optionally within 1 microns for some embodiments.

"Electronic device" generally refers to a device incorporating a plurality of components, and includes large area electronics, printed wire boards, integrated circuits, component arrays, biological and/or chemical sensors, physical sensors (e.g., temperature, strain, etc.), nanoelectromechanical systems, microelectromechanical systems, photovoltaic devices, communication systems, medical devices, optical devices and electro-optic devices.

"Sensing" refers to detecting the presence, absence, amount, magnitude or intensity of a physical and/or chemical property. Useful electronic device components for sensing include, but are not limited to electrode elements, chemical or biological sensor elements, pH sensors, temperature sensors, strain sensors, mechanical sensors, position sensors, optical sensors and capacitive sensors.

"Actuating" refers to stimulating, controlling, or otherwise affecting an structure, material or device component, such as one or more inorganic semiconductor components, one or more metallic conductor components or an encapsulating material or layer. In an embodiment, actuating refers to a process in which a structure or materials is selectively transformed, for example, so as to undergo a chemical or physical change such as removal, loss or displacement of a material or structure. Useful electronic device components for actuating include, but are not limited to, electrode elements, electromagnetic radiation emitting elements, light emitting diodes, lasers, magnetic elements, acoustic elements, piezoelectric elements, chemical elements, biological elements, and heating elements.

An "actuator" is a device component that directly or indirectly initiates at least partial transformation of a transient electronic device in response to a user initiated external trigger signal, for example by initiating an at least partial transformation of a selectively transformable material of a transient electronic device. For example, an actuator may initiate at least partial transformation of a transient device by absorbing energy supplied to the device and utilizing or converting that energy to affect the at least partial transformation. For example, an actuator may initiate at least partial transformation of a transient device by exposing a device component comprising selectively transformable material to an internal or external stimulus resulting an at least partial transformation. For example, an actuator may initiate at least partial transformation of a transient device by supplying energy (e.g., thermal, electromagnetic radiation, acoustic, RF energy, etc.) to an intermediate material or device component which affects the transformation, such as supplying energy to an encapsulating material, inorganic semiconductor components, or metallic conductor components. Thus, the actuator may comprise a single component or multiple components that alone or in combination facilitate transformation of the transient electronic device. In some embodiments, an actuator of the invention is directly or indirectly provided in one way to two communication with a transmitter, for example, via one or more receiver device components.

A "user initiated trigger signal" includes any action, other than the mere placement of a transient device in a particular environment, by which a person may start or initiate a programmable transformation of a transient device. Exemplary "user initiated trigger signals" include providing real-time user input data to the device or a transmitter in communication with the device (e.g., pressing a button, flipping a switch, setting a timer, etc.), providing at least one non-ambient external source of energy directly or indirectly to the device (e.g., an electric field, a magnetic field, acoustic energy, pressure, strain, heat, light, mechanical energy, etc.), and/or programming software to execute computer-readable instructions, which may be based on data received from the device, for example data from a feedback loop. In an embodiment, the user initiated external trigger signal is an electronic signal, an optical signal, a thermal signal, a magnetic signal, a mechanical signal, a chemical signal, acoustic signal or an electrochemical signal. In an embodiment, the invention provides a transient electronic device configured to receive a user initiated trigger signal, for example, a user initiated trigger signal provided by a transmitter and received by a receiver component of the device.

A "non-ambient external source of energy" includes energy having a magnitude at least 10% greater, or at least 25% greater, or at least 50% greater than the magnitude of ubiquitous energy of the same form found in the environment in which a transient device is located.

The terms "directly and indirectly" describe the actions or physical positions of one component relative to another component. For example, a component that "directly" acts upon or touches another component does so without intervention from an intermediary. Contrarily, a component that "indirectly" acts upon or touches another component does so through an intermediary (e.g., a third component).

"Island" refers to a relatively rigid component of an electronic device comprising a plurality of semiconductor components. "Bridge" refers to structures interconnecting two or more islands or one island to another component. Specific bridge structures include semiconductor and metallic interconnects. In an embodiment, a transient device of the invention comprises one or more semiconductor-containing island structures, such as transistors, electrical circuits or integrated circuits, electrically connected via one or more bridge structures comprising electrical interconnects.

"Encapsulate" refers to the orientation of one structure such that it is at least partially, and in some cases completely, surrounded by one or more other structures, such as a substrate, adhesive layer or encapsulating layer. "Partially encapsulated" refers to the orientation of one structure such that it is partially surrounded by one or more other structures, for example, wherein 30%, or optionally 50% or optionally 90%, of the external surfaces of the structure is surrounded by one or more structures.

"Completely encapsulated" refers to the orientation of one structure such that it is completely surrounded by one or more other structures. The invention includes transient devices having partially or completely encapsulated inorganic semiconductor components, metallic conductor components and/or dielectric components, for example, via incorporation a polymer encapsulant, such as biopolymer, silk, a silk composite, or an elastomer encapsulant.

"Barrier layer" refers to a component spatially separating two or more other components or spatially separating a component from a structure, material, fluid or environment external to the device. In one embodiment, a barrier layer encapsulates one or more components. In some embodiments, a barrier layer separates one or more components from an aqueous solution, a biological tissue or both. The invention includes device having one or more barrier layers, for example, one or more barrier layers positioned at the interface of the device with an external environment.

A barrier layer(s), and optionally a sacrificial layer on a substrate, may be etched to produce a "mesh structure", where at least a portion of the barrier layer(s), and optionally the sacrificial layer on a substrate, is removed. For example a portion of the barrier layer(s) disposed approximately 10 nanometers or more from an inorganic semiconductor component or additional component is removed. Removal of at least a portion of the barrier layer(s), and optionally the sacrificial layer on the substrate, may produce (i) one or more holes within the barrier layer(s) and/or (ii) electrical components, which are physically joined by a barrier layer(s) at a proximal end and physically separated at a distal end. In one embodiment, a mesh structure may be disposed upon a contiguous substrate, which provides structural support for the device during deployment into an environment.

"Contiguous" refers to materials or layers that are touching or connected throughout in an unbroken sequence. In one embodiment, a contiguous layer of an implantable biomedical device has not been etched to remove a substantial portion (e.g., 10% or more) of the originally provided material or layer.

"Active circuit" and "active circuitry" refer to one or more components configured for performing a specific function. Useful active circuits include, but are not limited to, amplifier circuits, multiplexing circuits, current limiting circuits, integrated circuits, transistors and transistor arrays. The present invention includes devices wherein the one or more inorganic semiconductor components, one or more metallic conductor components and/or one or more dielectric components comprise an active circuit or plurality of active circuits.

"Substrate" refers to a material, layer or other structure having a surface, such as a receiving surface, that is capable of supporting one or more components or devices. A component that is "bonded" to the substrate refers to a component that is in physical contact with the substrate and unable to substantially move relative to the substrate surface to which it is bonded. Unbounded components or portions of a component, in contrast, are capable of substantial movement relative to the substrate. In an embodiment, the invention provides devices wherein one or more inorganic semiconductor components, one or more metallic conductor components and/or one or more dielectric components are directly or indirectly bonded to the substrate, for example, via an "Substrate" refers to a material, layer or other structure having a surface, such as a receiving surface, that is capable of supporting one or more components or devices. A component that is "bonded" to the substrate refers to a component that is in physical contact with the substrate and unable to substantially move relative to the substrate surface to which it is bonded. Unbounded components or portions of a component, in contrast, are capable of substantial movement relative to the substrate. In an embodiment, the invention provides devices wherein one or more inorganic semiconductor components, one or more metallic conductor components and/or one or more dielectric components are directly or indirectly bonded to the substrate, for example, via an adhesive layer or via an adhesion layer.

A "selectively transformable material" is a material that undergoes a physical change and/or a chemical change under pre-selected and/or predetermined conditions, such as conditions of time, pressure, temperature, chemical or biological composition, and/or electromagnetic radiation. Selectively transformable materials useful for some device applications undergo a physical transformation, such as a phase change including melting, sublimation, etc., optionally at a preselected time or at a preselected rate or in response to a preselected set of conditions or change in conditions. Selectively transformable materials useful for some device applications undergo a chemical transformation, such as decomposition, disintegration, dissolution, hydrolysis, resorption, bioresporption, photodecomposition, depolymerization, etching, or corrosion, optionally at a preselected time or at a preselected rate or in response to a preselected set of conditions or change in conditions. The pre-selected condition(s) may occur naturally, for example, provided by conditions of a device environment (e.g., ambient temperature, pressure, chemical or biological environment, natural electromagnetic radiation, etc.) or may occur via artificial condition(s) provided to, or within, a transient electronic device, such as a user or device initiated temperature, pressure, chemical or biological environment, electromagnetic radiation, magnetic conditions, mechanical strain, or electronic conditions. When the selectively transformable material of a transient electronic device is exposed to the condition(s) that initiate transformation of the material, the selectively transformable material may be substantially completely or completely transformed at a "pre-selected time" or a "pre-selected rate". Devices of the invention include selectively transformable materials that undergo a complete transformation, substantially complete transformation or an incomplete transformation. A selectively transformable material that is "substantially completely" transformed is 95% transformed, or 98% transformed, or 99% transformed, or 99.9% transformed, or 99.99% transformed, but not completely (i.e., 100%) transformed. In some embodiments, a selectively transformable material undergoes a chemical change resulting in a change in a physical, chemical, electronic or optoelectronic property, optionally at a pre-selected time or at a pre-selected rate. In an embodiment, for example, a selectively transformable material undergoes a chemical or physical change resulting in a change of a first composition characterized by a conducting or semiconducting material to a second composition characterized as an insulator. In some embodiments, a selectively transformable material is a selectively removable material.

A "selectively removable material" is a material that is physically and/or chemically removed under pre-selected or predetermined conditions such as conditions of time, pressure, temperature, chemical or biological composition, and/or electromagnetic radiation. In an embodiment, for example, a selectively removable material is removed via a processes selected from the group consisting of decomposition, disintegration, dissolution, hydrolysis, resorption, bioresporption, photodecomposition, and depolymerization, optionally at a preselected time or at a preselected rate or in response to a preselected set of conditions or change in conditions. In an embodiment, for example, a selectively removable material is removed by undergoing a phase change, such as melting or sublimation, resulting in loss or relocation of the material, optionally at a preselected time or at a preselected rate or in response to a preselected set of conditions or change in conditions. The pre-selected condition(s) may occur naturally, for example, provided by conditions of a device environment (e.g., ambient temperature, pressure, chemical or biological environment, natural electromagnetic radiation, etc.) or may occur via artificial condition(s) provided to, or within, a transient electronic device, such as a user or device initiated temperature, pressure, chemical or biological environment, electromagnetic radiation, electronic conditions. When the selectively removable material of a transient electronic device is exposed to the condition(s) that initiate removal of the material, the selectively removable material may be substantially completely, completely removed or incompletely removed at a "pre-selected time" or a "pre-selected rate". A selectively removable material that is "substantially completely" removed is 95% removed, or 98% removed, or 99% removed, or 99.9% removed, or 99.99% removed, but not completely (i.e., 100%) removed.

A "pre-selected time" refers to an elapsed time from an initial time, $t_0$. For example, a pre-selected time may refer to an elapsed time from a component/device fabrication or deployment, to a critical time, $t_c$, for example, when the thickness of a selectively removable material exposed to a pre-selected condition(s) reaches zero, or substantially zero (10% or less of initial thickness, 5% or less of initial thickness, 1% or less of initial thickness) or when a property (e.g. conductance or resistivity) of a selectively removable material reaches a threshold value; e.g., a decrease in conductivity equal to 50%, optionally for some applications 80%, and optionally for some applications 95% or alternatively when conductivity equals 0. In an embodiment, the preselected time may be calculated according to:

$$t_c = \frac{4\rho_m M(H_2O)}{kw_0 M(m)} \frac{\sqrt{\frac{kh_0^2}{D}}}{\tanh\sqrt{\frac{kh_0^2}{D}}};$$

where $t_c$ is the critical time, $\rho_m$ is the mass density of the material, $M(H_2O)$ is the molar mass of water, $M(m)$ is the molar mass of the material, $h_0$ is the initial thickness of the material, D is the diffusivity of water, k is the reaction constant for the dissolution reaction, and $w_0$ is the initial concentration of water.

A "pre-selected rate" refers to an amount of selectively removable material removed from a device or component per unit time. The pre-selected rate may be reported as an average rate (over the lifetime of the device or component) or an instantaneous rate. When a rate type is not specified, an average rate is assumed.

A "programmable transformation" refers to a pre-selected or predetermined physical, chemical and/or electrical change within a transient electronic device that provides a change of the function of the device from a first condition to a second condition. A programmable transformation may be pre-set at the time of component/device fabrication or deployment or a real-time triggered programmable transformation controlled by a transmitter that provides a signal received by the device.

A "transience profile" describes a change in physical parameters or properties (e.g., thickness, conductivity, resistance, mass, porosity, etc.) of a material as a function of time, e.g., thickness gained/lost over time. A transience profile may be characterized by a rate, for example, the rate of change of the physical dimensions (e.g., thickness) or physical properties (e.g., mass, conductivity, porosity, resistance, etc.) of a selectively transformable material. The invention includes selectively transformable materials having a transience profile characterized by a rate of change of the physical dimensions (e.g., thickness) or physical properties (e.g., mass, conductivity, etc.) that is constant or varies as a function of time.

"Degradable" refers to material that is susceptible to being chemically and/or physically broken down into smaller segments. Degradable materials may, for example, be decomposed, resorbed, dissolved, absorbed, corroded, de-polymerized and/or disintegrated. In some embodiments, the invention provides degradable devices.

"Bioresorbable" refers to a material that is susceptible to being chemically broken down into lower molecular weight chemical moieties by reagents that are naturally present in a biological environment. In an in-vivo application, the chemical moieties may be assimilated into human or animal tissue. A bioresorbable material that is "substantially completely" resorbed is highly resorbed (e.g., 95% resorbed, or 98% resorbed, or 99% resorbed, or 99.9% resorbed, or 99.99% resorbed), but not completely (i.e., 100%) resorbed. In some embodiments, the invention provides bioresorbable devices.

"Biocompatible" refers to a material that does not elicit an immunological rejection or detrimental effect when it is disposed within an in-vivo biological environment. For example, a biological marker indicative of an immune response changes less than 10%, or less than 20%, or less than 25%, or less than 40%, or less than 50% from a baseline value when a biocompatible material is implanted into a human or animal. In some embodiments, the invention provides biocompatible devices.

"Bioinert" refers to a material that does not elicit an immune response from a human or animal when it is disposed within an in-vivo biological environment. For example, a biological marker indicative of an immune response remains substantially constant (plus or minus 5% of a baseline value) when a bioinert material is implanted into a human or animal. In some embodiments, the invention provides bioinert devices.

"Ecocompatible" refers to a material that is environmentally benign in that it may be degraded or decomposed into one or more compounds that occur naturally in the environment. In some embodiments, the invention provides ecocompatible devices.

"Nanostructured material" and "microstructured material" refer to materials having one or more nanometer-sized and micrometer-sized, respectively, physical dimensions (e.g., thickness) or features such as recessed or relief features, such as one or more nanometer-sized and micrometer-sized channels, voids, pores, pillars, etc. The relief features or recessed features of a nanostructured material have at least one physical dimension selected from the range of 1-1000 nm, while the relief features or recessed features of a microstructured material have at least one physical dimension selected from the range of 1-1000 µm. Nanostructured and microstructured materials include, for example, thin films (e.g., microfilms and nanofilms), porous materials, patterns of recessed features, patterns of relief features, materials having abrasive or rough surfaces, and the like. A nanofilm structure is also an example of a nanostructured material and a microfilm structure is an example of a microstructured material. In an embodiment, the invention provides device comprising one or more nanostructured or microstructured inorganic semiconductor components, one or more nanostructured or microstructured metallic conductor components, one or more nanostructured or microstructured dielectric components, one or more nanostructured or microstructured encapsulating layers and/or one or more nanostructured or microstructured substrate layers.

A "nanomembrane" is a structure having a thickness selected from the range of 1-1000 nm or alternatively for some applications a thickness selected from the range of 1-100 nm, for example provided in the form of a ribbon, cylinder or platelet. In some embodiments, a nanoribbon is a semiconductor, dielectric or metallic conductor structure of an electronic device. In some embodiments, a nanoribbon has a thickness less than 1000 nm and optionally less than 100 nm. In some embodiments, a nanoribbon has ratio of thickness to a lateral dimension (e.g., length or width) selected from the range of 0.1 to 0.0001.

"Dielectric" refers to a non-conducting or insulating material. In an embodiment, an inorganic dielectric comprises a dielectric material substantially free of carbon. Specific examples of inorganic dielectric materials include, but are not limited to, silicon nitride, silicon dioxide, silk, silk composite, elastomers and polymers.

"Polymer" refers to a macromolecule composed of repeating structural units connected by covalent chemical bonds or the polymerization product of one or more monomers, often characterized by a high molecular weight. The term polymer includes homopolymers, or polymers consisting essentially of a single repeating monomer subunit. The term polymer also includes copolymers, or polymers consisting essentially of two or more monomer subunits, such as random, block, alternating, segmented, grafted, tapered and other copolymers. Useful polymers include organic polymers or inorganic polymers that may be in amorphous, semi-amorphous, crystalline or partially crystalline states. Crosslinked polymers having linked monomer chains are particularly useful for some applications. Polymers useable in the methods, devices and components include, but are not limited to, plastics, elastomers, thermoplastic elastomers, elastoplastics, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate), polymethylpentene, polyphenylene oxides and polyphenylene sulfides, polyphthalamide, polypropylene, polyurethanes, styrenic resins, sulfone-based resins, vinyl-based resins, rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin or any combinations of these.

"Elastomeric stamp" and "elastomeric transfer device" are used interchangeably and refer to an elastomeric material having a surface that can receive as well as transfer a material. Exemplary conformal transfer devices useful in some methods of the invention include elastomeric transfer devices such as elastomeric stamps, molds and masks. The transfer device affects and/or facilitates material transfer from a donor material to a receiver material. In an embodiment, a method of the invention uses a conformal transfer device, such as an elastomeric transfer device (e.g. elastomeric stamp) in a microtransfer printing process, for example, to transfer one or more single crystalline inorganic semiconductor structures, one or more dielectric structures and/or one or more metallic conductor structures from a fabrication substrate to a device substrate.

"Elastomer" refers to a polymeric material which can be stretched or deformed and returned to its original shape without substantial permanent deformation. Elastomers commonly undergo substantially elastic deformations. Useful elastomers include those comprising polymers, copolymers, composite materials or mixtures of polymers and copolymers. Elastomeric layer refers to a layer comprising at least one elastomer. Elastomeric layers may also include dopants and other non-elastomeric materials. Useful elastomers include, but are not limited to, thermoplastic elastomers, styrenic materials, olefinic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. In some embodiments, an elastomeric stamp comprises an elastomer. Exemplary elastomers include, but are not limited to silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly(phenyl methyl siloxane), silicon modified elastomers, thermoplastic elastomers, styrenic materials, olefinic materials, polyolefin, polyurethane thermoplastic elastomers, polyamides, synthetic rubbers, polyisobutylene, poly(styrene-butadiene-styrene), polyurethanes, polychloroprene and silicones. In an embodiment, a polymer is an elastomer.

"Conformable" refers to a device, material or substrate which has a bending stiffness that is sufficiently low to allow the device, material or substrate to adopt any desired contour profile, for example a contour profile allowing for conformal contact with a surface having a pattern of relief features. In certain embodiments, a desired contour profile is that of a tissue in a biological environment.

"Conformal contact" refers to contact established between a device and a receiving surface. In one aspect, conformal contact involves a macroscopic adaptation of one or more surfaces (e.g., contact surfaces) of a device to the overall shape of a surface. In another aspect, conformal contact involves a microscopic adaptation of one or more surfaces (e.g., contact surfaces) of a device to a surface resulting in an intimate contact substantially free of voids. In an embodiment, conformal contact involves adaptation of a contact surface(s) of the device to a receiving surface(s) such that intimate contact is achieved, for example, wherein less than 20% of the surface area of a contact surface of the device does not physically contact the receiving surface, or optionally less than 10% of a contact surface of the device does not physically contact the receiving surface, or optionally less than 5% of a contact surface of the device does not physically contact the receiving surface. In an embodiment, a method of the invention comprises establishing conformal contact between a conformal transfer device and one or more single crystalline inorganic semiconductor structures, one or more dielectric structures and/or one or more metallic conductor structures, for example, in a microtransfer printing process, such as dry transfer contact printing.

"Young's modulus" is a mechanical property of a material, device or layer which refers to the ratio of stress to strain for a given substance. Young's modulus may be provided by the expression:

$$E = \frac{\text{(stress)}}{\text{(strain)}} = \left(\frac{L_0}{\Delta L}\right)\left(\frac{F}{A}\right), \tag{I}$$

where E is Young's modulus, $L_0$ is the equilibrium length, $\Delta L$ is the length change under the applied stress, F is the force applied, and A is the area over which the force is applied. Young's modulus may also be expressed in terms of Lame constants via the equation:

$$E = \frac{\mu(3\lambda + 2\mu)}{\lambda + \mu}, \tag{II}$$

where $\lambda$ and $\mu$ are Lame constants. High Young's modulus (or "high modulus") and low Young's modulus (or "low modulus") are relative descriptors of the magnitude of Young's modulus in a given material, layer or device. In some embodiments, a high Young's modulus is larger than a low Young's modulus, preferably about 10 times larger for some applications, more preferably about 100 times larger for other applications, and even more preferably about 1000 times larger for yet other applications. In an embodiment, a low modulus layer has a Young's modulus less than 100 MPa, optionally less than 10 MPa, and optionally a Young's modulus selected from the range of 0.1 MPa to 50 MPa. In an embodiment, a high modulus layer has a Young's modulus greater than 100 MPa, optionally greater than 10 GPa, and optionally a Young's modulus selected from the range of 1 GPa to 100 GPa. In an embodiment, a device of the invention has one or more components, such as substrate, encapsulating layer, inorganic semiconductor structures, dielectric structures and/or metallic conductor structures, having a low Young's modulus. In an embodiment, a device of the invention has an overall low Young's modulus.

"Inhomogeneous Young's modulus" refers to a material having a Young's modulus that spatially varies (e.g., changes with surface location). A material having an inhomogeneous Young's modulus may optionally be described in terms of a "bulk" or "average" Young's modulus for the entire material.

"Low modulus" refers to materials having a Young's modulus less than or equal to 10 MPa, less than or equal to 5 MPa or less than or equal to 1 MPa.

"Bending stiffness" is a mechanical property of a material, device or layer describing the resistance of the material, device or layer to an applied bending moment. Generally, bending stiffness is defined as the product of the modulus and area moment of inertia of the material, device or layer. A material having an inhomogeneous bending stiffness may optionally be described in terms of a "bulk" or "average" bending stiffness for the entire layer of material.

Transient devices and methods of making and using the devices will now be described with reference to the figures. For clarity, multiple items within a figure may not be labeled and the figures may not be drawn to scale.

Figure 1:
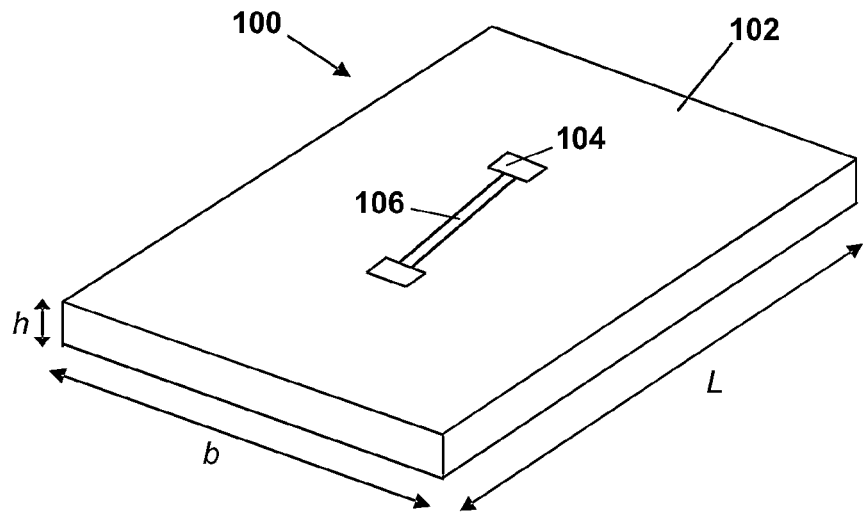
FIG. 1 provides an exemplary schematic of a transient device.

FIG. 1 shows a top perspective view of a transient device 100 having physical dimensions including a vertical dimension or height, h, a lateral dimension or width, b, and a longitudinal dimension or length, L. Transient device 100 may have any regular or irregular shape, but will often be in the form of a square or rectangular parallelogram. Transient device 100 comprises a degradable substrate 102 upon which one or more device components 104, 106 are disposed. In some embodiments, device component 106 is an interconnect that joins two or more other device components 104 in physical and/or electrical communication with one another. Optionally, one or more device components 104, 106 may be partially or completely encapsulated by an encapsulating material (not shown). Transient device 100 may be powered or actuated remotely (e.g., wirelessly), or via physical connection to a power source (not shown).

Figure 2:
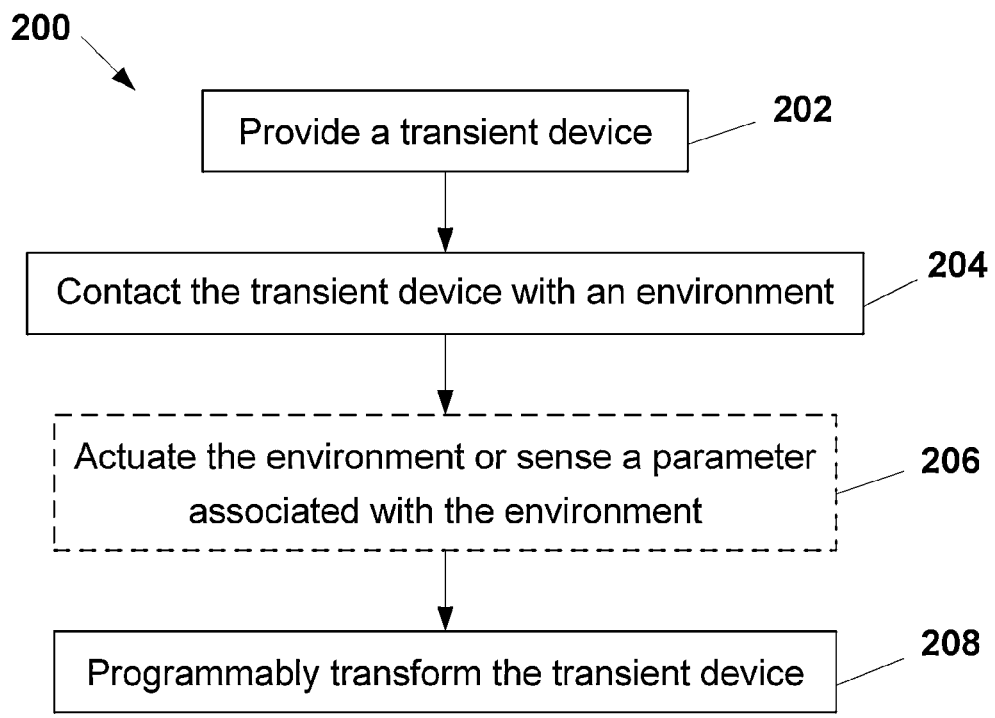
FIG. 2 provides a flowchart illustrating exemplary steps for using a transient device of certain embodiments of the invention.

FIG. 2 provides a flowchart 200 illustrating exemplary steps for using transient device 100. In steps 202 and 204, a user provides a transient device that is contacted with an environment. In optional step 206, transient device 100 actuates the environment or senses a parameter associated with the environment. Finally, the transient device is programmably transformed, in step 208, by at least one internal and/or external stimulus.

In some embodiments, implantable biomedical devices advantageously utilize silk as a bioresorbable substrate. Silk is biocompatible, FDA-approved, optically transparent, mechanically robust (high mechanical modulus and toughness), and flexible in thin film form. It is also compatible with aqueous processing, which preserves sensitive electronic functions, and amenable to chemical and biological functionalization. The presence of diverse amino acid side chains facilitates coupling chemistry for functionalizing silks. Silk is also water soluble with programmable rates of proteolytic biodegradation (yielding non-inflammatory amino acids) over a range from minutes to hours to years.

Some other natural polymers that exhibit properties similar to or analogous to silk include, but are not limited to, chitosan, collagen, gelatin, agarose, chitin, polyhydroxyalkanoates, pullan, starch (amylose amylopectin), cellulose, hyaluronic acid, or any combination of these.

Silk may be obtained from various natural sources, for example, from the silkworm *Bombyx mori* or from the spider *Nephila clavipes*. Silk solutions used in accordance with embodiments of the present invention may be obtained, for example, from a solution containing a dissolved silkworm silk (e.g. from *Bombyx mori*), a dissolved spider silk (e.g. from *Nephila clavipes*), or from a solution containing a recombinant silk, such as from bacteria, yeast, mammalian cells, transgenic animals, or transgenic plants.

In an embodiment, the silk of the bioresorbable substrate may be silk fibroin protein, which consists of layers of antiparallel beta sheets and has a primary structure consisting mainly of the recurrent amino acid sequence (Gly-Ser-Gly-Ala-Gly-Ala)$_n$. Fibroin is known to arrange itself in three structures, called silk I, II, and III. Silk I is the natural, amorphous form of fibroin, as emitted from the *Bombyx mori* silk glands. Silk II refers to the crystalline arrangement of fibroin molecules in spun silk, which has greater strength. Silk III is formed principally in solutions of fibroin at an interface (i.e. air-water interface, water-oil interface, etc.). In the disclosed transient devices, silk I, II and/or III may be used.

Silk substrates may be prepared from material derived from *Bombyx mori* cocoons, according to published procedures. See, Sofia, S., McCarthy, M. B., Gronowicz, G. & Kaplan, D. L. Functionalized silk-based biomaterials for bone formation. J. Biomed. Mater. Res. 54, 139-148 (2001); Perry, H., Gopinath, A., Kaplan, D. L., Negro, L. D. & Omenetto, F. G. Nano- and micropatterning of optically transparent, mechanically robust, biocompatible silk fibroin films. Adv. Mater. 20, 3070-3072 (2008); and WO 2008/108838. Briefly, boiling the cocoons in a 0.02 M aqueous solution of sodium carbonate for 60 minutes removed sericin, a water-soluble glycoprotein that binds fibroin filaments in the cocoon but which can induce undesirable immunological responses. An aqueous solution of lithium bromide at 60° C. solubilized the silk fibroin fibers and subsequent dialysis removed the lithium bromide. Centrifugation followed by microfiltration eliminated particulates to yield solutions of 8-10% silk fibroin with minimal contaminants.

Using an alternate method, silk solutions may be prepared using organic solvents, as described in WO 2008/108838 which is hereby incorporated by reference in its entirety. Use of organic solvents in the preparation of silk materials can alter the biocompatibility and physical properties of silk materials. For example, immersion of silk films in organic solvents, such as methanol, may cause dehydration of the hydrated or swollen structure, leading to crystallization and, thus, loss of solubility in water. Further, the use of organic solvents can render the silk material less degradable.

As noted above, the presence of organic solvents, as compared to aqueous solvents, in the silk solution, may generate silk substrates with more crystalline structures, as compared to amorphous structures. This phenomenon may be used to control, for example, the rate of bioresorption or degradation of the silk. Accordingly, depending on the desired resorption or degradation rate, the silk solution may be prepared using any suitable ratio of aqueous:organic solution, for example, 100% aqueous, about 80% aqueous, about 60% aqueous, about 50% aqueous, about 40% aqueous, about 20% aqueous, or about 10% aqueous.

Additional techniques may be used to control the degradation rate of the silk substrate. For example, the rate at which degradation occurs may be tailored by altering: substrate material, substrate thickness, crosslinking, the extent of inter-chain hydrogen bonding or Van der Waals forces, and/or molecular alignment (e.g., via mono-axial or bi-axial stretching, spinning into fiber, and/or weaving).

Additional bioresorbable polymers including, but not limited to, a biopolymer, a synthetic polymer, a protein, a polysaccharide, poly(glycerol-sebacate) (PGS), polydioxanone, poly(lactic-co-glycolic acid) (PLGA), polylactic acid (PLA), collagen, chitosan, or any combination of these, may be used alone as the degradable substrate or may be added to the silk solution to generate composite silk substrates. In one embodiment, a substrate comprises from about 50 to about 99.99 parts by volume (vol %) silk protein solution and from about 0.01 to about 50 vol % additional polymer.

In some aspects, transient devices described herein may be used for drug delivery. In one embodiment, one or more therapeutic agents may be encapsulated within the substrate material as a liquid, a gel, a dispersed solid, or any other appropriate physical form, to be administered to a patient upon degradation of the substrate. To form these therapeutically enhanced substrate materials, the degradable polymer solution may be mixed with one or more therapeutic agents, and optionally a pharmaceutically acceptable carrier, prior to forming the substrate. Any pharmaceutical carrier that does not dissolve the degradable material may be used.

In some embodiments, transient devices of the invention are used to administer, deliver and/or activate a therapeutic agent provided to a subject. In an embodiment of this aspect, the degradable substrate is a multifunctional component that releases a therapeutic agent upon administration to a biological environment and/or contact with a target tissue. The invention includes, for example, degradable substrates having embedded therapeutic agents, such as drugs (e.g., small molecule therapeutics), nanoparticles and/or biomolecules, such as proteins, peptides, oligonucleotides (e.g., DNA or RNA), etc. This aspect of the present invention may be useful for a range of therapeutic applications including controlled release of therapeutic agents and/or targeted administration of therapeutic agents to a selected tissue type. Release of the therapeutic agent in these embodiments may occur by processes mediated by resorption of the degradable substrate in contact with a target tissue. The invention includes implantable devices and systems wherein the electronic device component mediates release of therapeutic agent from the degradable substrate via thermal means, for example by local heating of components of the implantable device, such as the degradable substrate. The invention includes implantable devices and systems wherein the electronic device component mediates release of therapeutic agent from the degradable substrate via processes driven by generation and control of local electric fields, such as electrophoresis processes for the release of proteins or peptides. The invention includes implantable devices and systems wherein the electronic device component mediates release and/or activation of a therapeutic agent from the degradable substrate via processes driven by absorption of electromagnetic radiation. In an embodiment, the implantable device includes an electronic device component, such as a laser or LED array, capable of optically activating a therapeutic agent during and/or upon release from the degradable substrate. This aspect of the invention is useful for therapeutic applications including phototherapy.

Therapeutic agents that may be used in conjunction with the devices described herein include, but are not limited to: small molecules; proteins; peptides; nucleotides; nucleic acids; carbohydrates; simple sugars; cells; genes; anti-thrombotics; anti-metabolics; anticoagulants; antimitotics; fibrinolytics; anti-inflammatory steroids; monoclonal antibodies; vitamins; sedatives; steroids; hypnotics; antiinfectives, such as antibiotics and antiviral agents; chemotherapeutic agents (i.e., anticancer agents); prostaglandins, radiopharmaceuticals, anti-rejection agents; analgesics; anti-inflammatory agents; hormones, such as steroids; growth factors (inhibitors and promoters), such as epidermal growth factor, fibroblast growth factor, platelet-derived growth factor, insulin-like growth factor, transforming growth factors, and vascular endothelial growth factor; anti-angiogenic proteins such as endostatin; polysaccharides; glycoproteins; lipoproteins; and any combination of these.

For example, a therapeutic agent circulating through an in-vivo biological environment may be activated when it receives electromagnetic radiation from a biomedical device implanted at a therapeutic site. In particular, energy within the ultraviolet and visible regions of the electromagnetic spectrum may be useful.

The invention may be further understood by the following non-limiting examples.

Example 1

Figure 7:
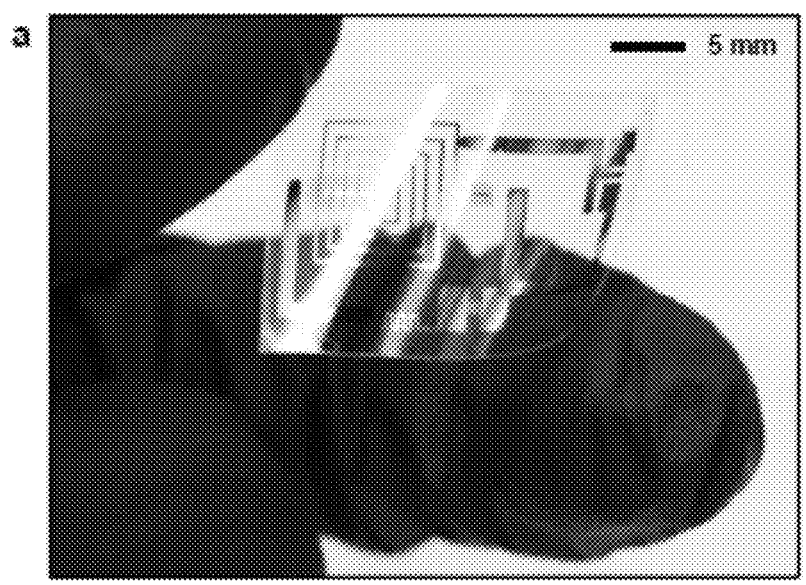

FIGS. 3a, 3b and 7 provide images and schematic diagrams of a demonstration platform for the technology. All of the components shown here, ranging from the inductors, capacitors, resistors, diodes, transistors, interconnects and crossovers, to the substrate and encapsulation layers disappear completely, through reactive dissolution by hydrolysis, as illustrated in the time sequence of images in FIG. 3c. This example of transient electronics uses magnesium (Mg) for the conductors, magnesium oxide (MgO) and silicon dioxide ($SiO_2$) for the dielectrics, monocrystalline silicon (Si) NMs for the semiconductors, and silk (not only water soluble but also enzymatically degradable[4,5]), for the substrate and packaging material. The fabrication involves a combination of transfer printing (Si NMs) (automated manufacturing tools based on this transfer printing process are presently used in pilot line production of high efficiency photovoltaic modules that incorporate large-scale arrays of microscale, multijunction solar cells)[6], physical vapour deposition through fine-line stencil masks (Mg, MgO, $SiO_2$) and solution casting (silk). As adhesion promoters for Mg, MgO was used in certain cases and ultrathin layers of titanium in others. Device fabrication was possible without the titanium, although with somewhat lower yields.

The chemical reactions responsible for dissolution of each material appear in FIG. 3d. The Si NMs and layers of $SiO_2$ are particularly important, due to their important roles in high performance transistors, diodes, photodetectors, solar cells, temperature sensors, strain gauges and other semiconductor devices, as described subsequently. For both, hydrolysis forms ortho-silicic acid ($Si(OH)_4$), whose water solubility is ~0.10 g/L at room temperature, as determined from studies of nanoporous silicon matrices[7-9]. The NM geometry is important because it enables high performance devices and planar architectures, minimizes the amount of material that must be consumed during the transient step, and provides mechanics and processing options that are favorable for heterogeneous integration onto substrates such as silk[4]. The second characteristic allows access to high rates of transience while avoiding solubility limits and potentially adverse biological responses, for applications where biocompatibility is important. A typical transistor described here involves less than ~1 µg of Si, which can be dissolved as $Si(OH)_4$ in as little as 30 µL of water (or bio-fluid)[9]. Straightforward reductions in the dimensions of the devices could decrease even further the required amount of Si. For example, the mass of Si in the active region of a modern MOSFET built on an ultrathin silicon-on-insulator (SOI) wafer is ~10 fg, which corresponds to solubility in as little as ~300 fL[10].

Figure 8:
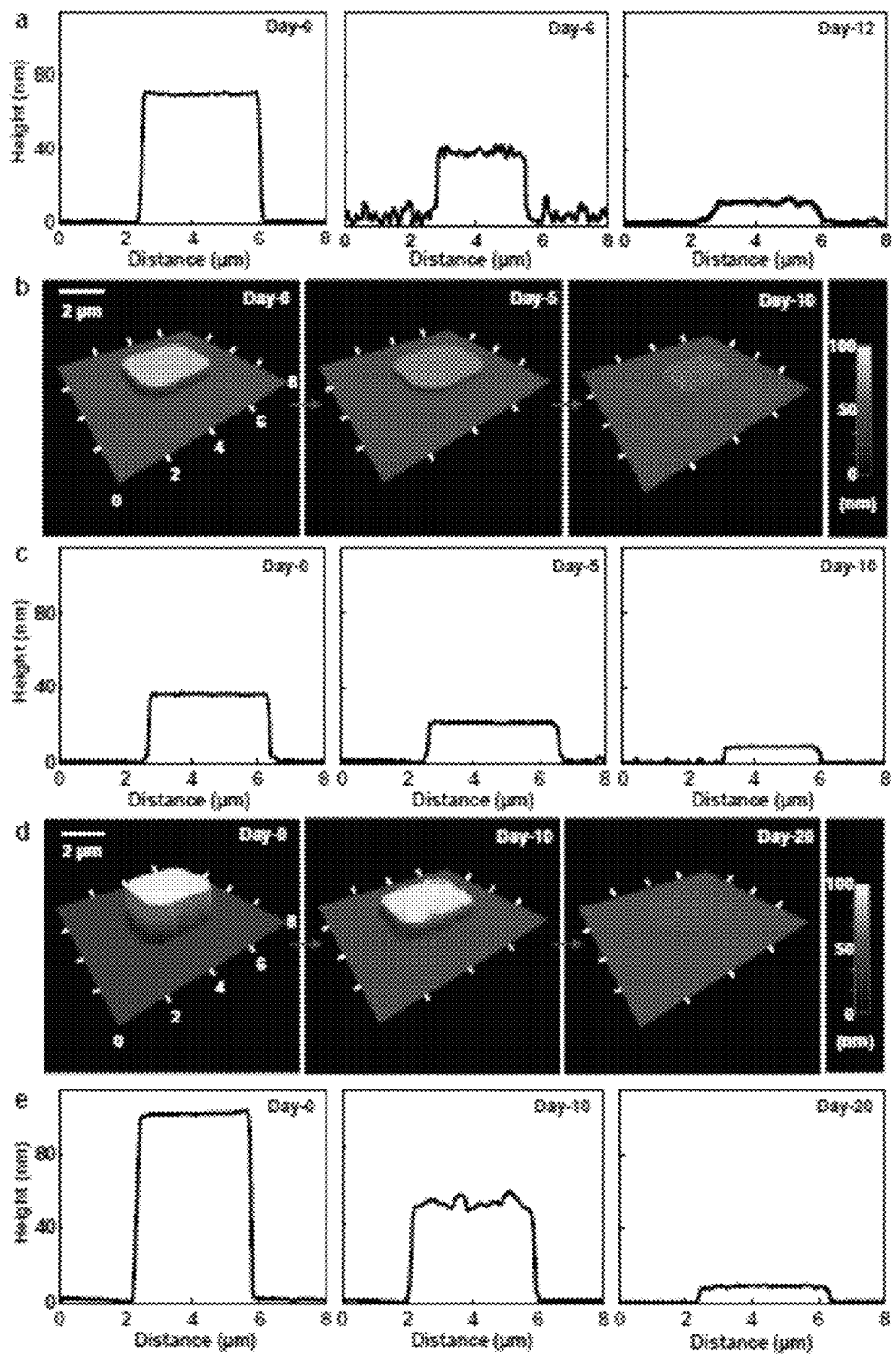
FIG. 8A-E. Surface topography associated with Si NMs at various states of dissolution in PBS, evaluated using atomic force microscopy (AFM) for three different initial thicknesses. a, 70 nm, b and c, 30 nm, d and e, 100 nm.
Figure 9:
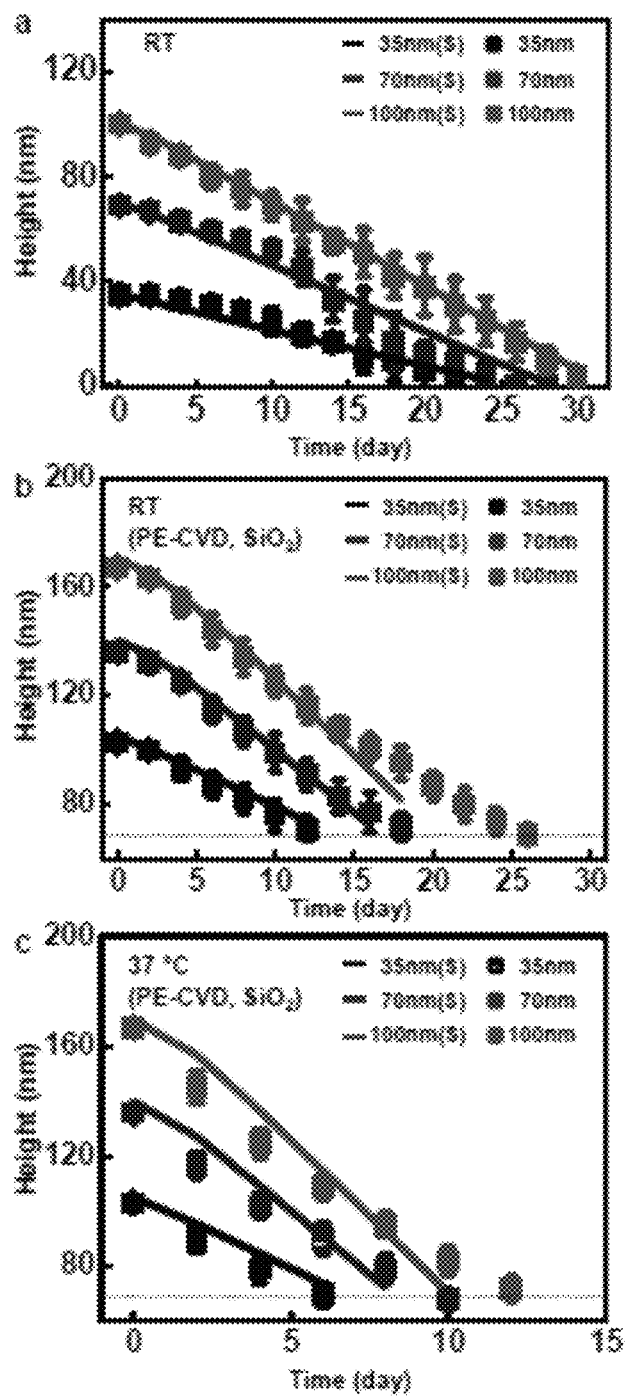
FIG. 9A-C. Time dependent change in the thicknesses of thin layers of transient electronic materials in PBS. a, Si NM at room temperature, b, PECVD $SiO_2$ at room temperature, c, PECVD $SiO_2$ at 37° C.

FIG. 4a presents atomic force micrographs of a Si NM (3×3 μm) with thickness of 70 nm, collected at different stages of dissolution in phosphate buffer solution (PBS; pH of 7.4) at a physiologically relevant temperature (37° C.), to simulate transience by bioresorption (See FIG. 8 for Si NMs with different thicknesses). The kinetics can be captured analytically using models of reactive diffusion (FIG. 4b) in which the rate limiting step is defined by diffusion of water and hydroxide ions into the Si and reaction throughout the thickness direction y, according to $$D\frac{\partial^2 w}{\partial y^2} - kw = \frac{\partial w}{\partial t},$$ 11-13 where D and k are the diffusivity for water and the reaction constant between silicon and PBS, respectively, and w is the concentration of water. Upon dissolution, the following equilibrium is formulated: $Si+4H_2O \leftrightarrow Si(OH)_4 + 2H_2$, where the neutral ortho-silicic acid leaves the silicon surface by diffusion. In this model, for times, t, before complete physical disappearance, the thickness of the Si NM (h) decreases in an approximately linear fashion with t, according to $$h = h_0 - \alpha\sqrt{kDt}\tan h\sqrt{kh_0^2/D},$$ (1)

where $h_0$ is initial thickness, $\alpha = [M(Si)/M(H_2O)]w_0/(4\rho_{Si})$, $M(H_2O)$ and $M(Si)$ are the molar masses of water and silicon, respectively, $w_0$ is the initial water concentration, and $\rho_{Si} = 2.329$ g/cm³ is the mass density of Si. This expression captures the experimental observations for $h_0 = 35$, 70 and 100 nm at body temperature (37° C.) (FIG. 4c) for $k = 5.0 \times 10^{-6}$ s⁻¹ and $D = 4.5 \times 10^{-16}$ cm²/s and at room temperature (25° C., FIG. 9a) when $k = 2.8 \times 10^{-6}$ s⁻¹ and $D = 3.4 \times 10^{-16}$ cm²/s, consistent with Arrhenius scaling[14]. The critical time for the thickness to reach zero is approximately given by $t_c = (\alpha \tan h\sqrt{kh_0^2/D})^{-1}h_0/\sqrt{kD}$. The results are t=14, 16 and 19 days for $h_0 = 35$, 70 and 100 nm, respectively, at body temperature, consistent with experiment. Models that include time dependent reaction rate constants can capture additional features.

Figure 3:
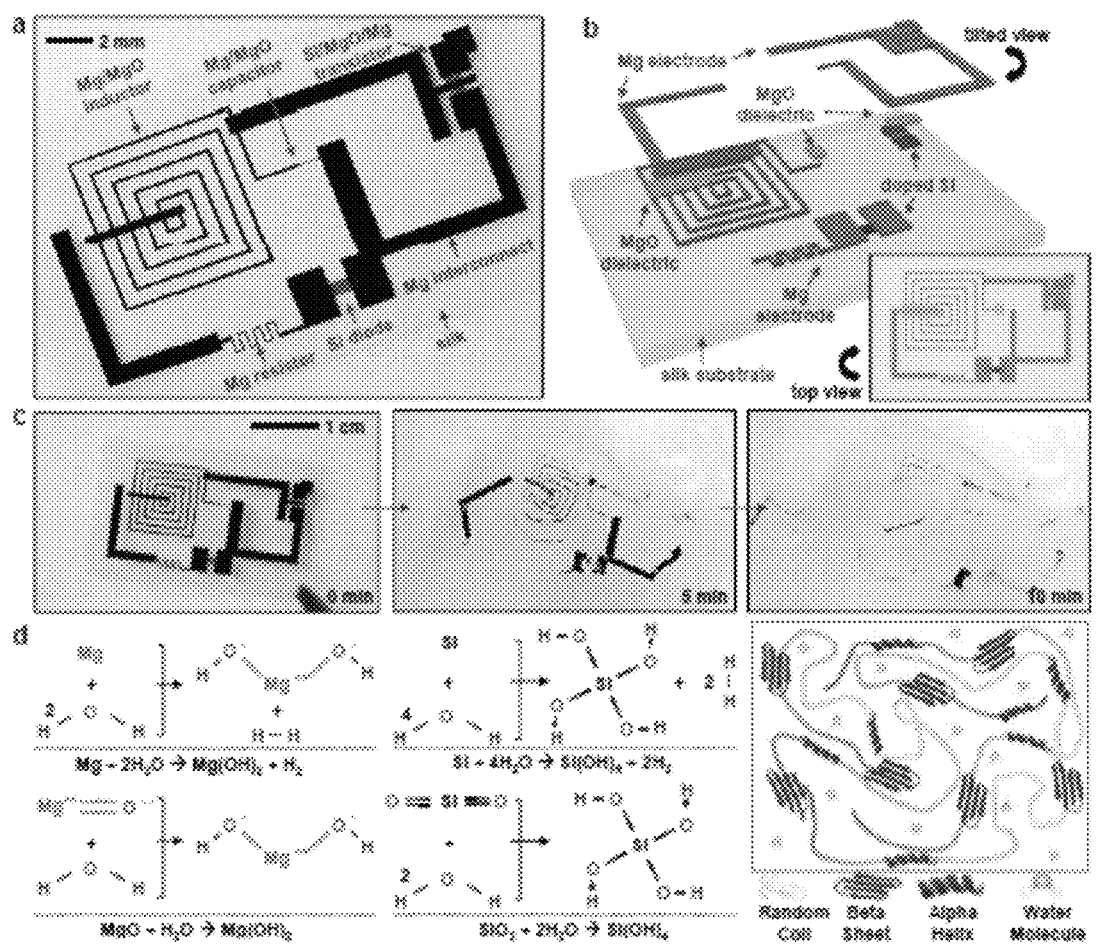
FIG. 3A-D. Demonstration platform for transient electronics, with key materials, device structures, and reaction mechanisms. a, Image of a transient electronic platform that includes all essential materials and several representative device components—transistors, diodes, inductors, capacitors and resistors, with interconnects and interlayer dielectrics, all on a thin silk substrate. b, Exploded view schematic illustration of this device, with a top view in the lower right inset. All of the materials—silicon nanomembranes (Si NMs; semiconductor) and thin films of magnesium (Mg, conductor), magnesium oxide (MgO, dielectric), silicon dioxide ($SiO_2$, dielectric) and silk (substrate and packaging material)—are transient, in the sense that they disappear by hydrolysis and/or simple dissolution in water. c, Images showing the time sequence of this type of physical transience, induced by complete immersion in water. d, Chemical reactions for each of the constituent materials with water. For Si and for $SiO_2$, reaction yields silicic acid, $Si(OH)_4$; Mg and MgO yield $Mg(OH)_2$. Silk dissolves directly, at rates that decrease with increasing beta sheet content (i.e. crystallinity).

Similar calculations quantitatively capture related behaviors in other materials for transient electronics, including those in FIG. 3. FIG. 4d presents an example of a meander trace of Mg (150 nm) on a thin film of MgO (10 nm; adhesion promoter), in which the measured changes in resistance correlate well to those expected based on computed changes in thickness (FIG. 4e, FIGS. 10a and b, and see Example 2 for details), where the resistance is given by $R_0 \times (h/h_0)^{-1}$, and $R_0$ is the initial resistance. (Other examples appear in FIG. 11.) This result connects a key electrical property to models of reactive diffusion, thereby suggesting the capacity to use such analytics in conjunction with established circuit simulators as a comprehensive design approach for transient electronics. Experimental validation of these models allows their predictive use in assessing the behavior of integrated devices comprised of these materials.

Figure 4:
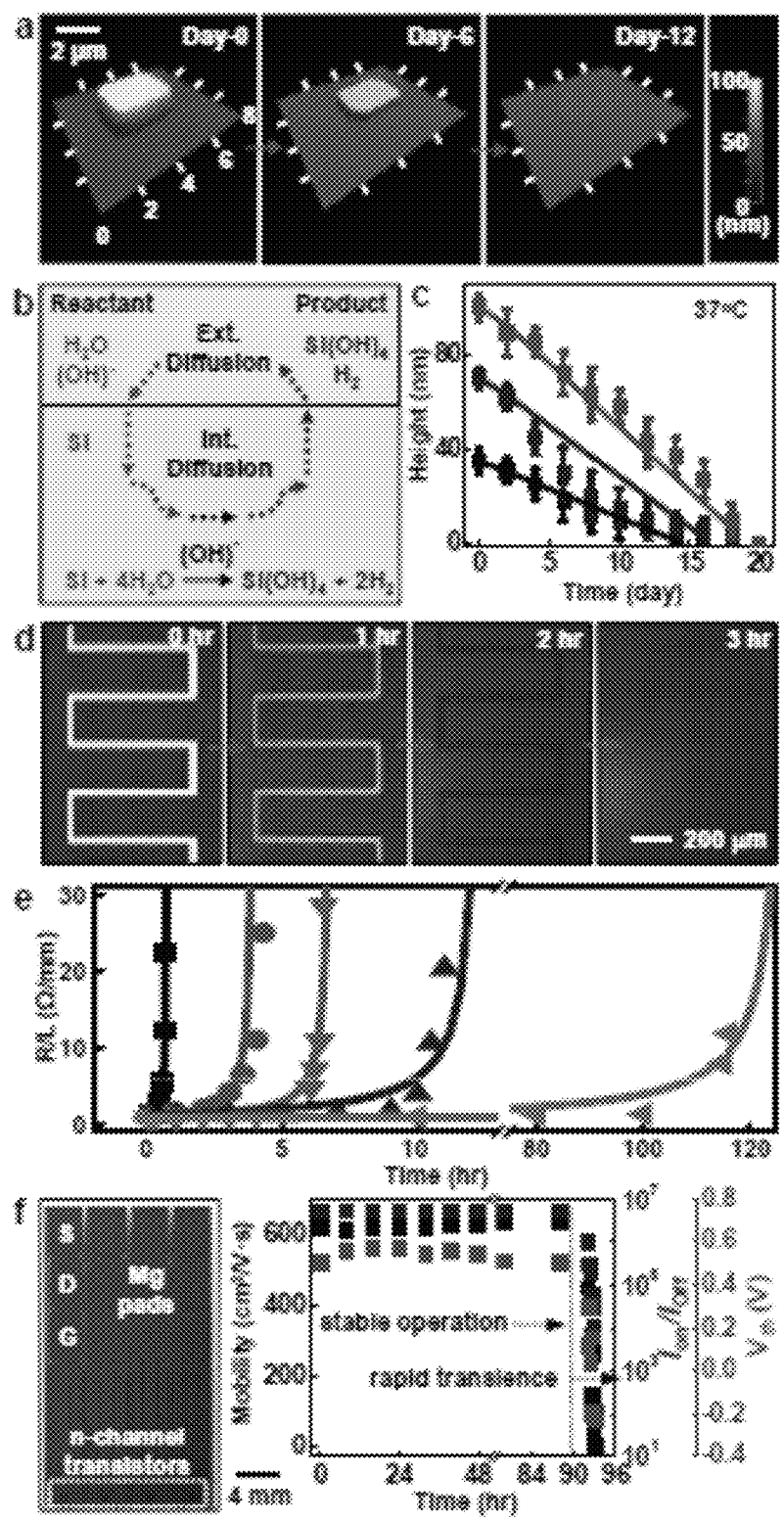
FIG. 4A-F. Experimental studies of transient electronic materials, devices and corresponding theoretical analysis. a, Atomic force microscope (AFM) topographical images of a single crystalline silicon nanomembrane (Si NM; initial dimensions: 3 µm×3 µm×70 nm), at various stages of dissolution by hydrolysis in phosphate buffered saline (PBS). b, Diagram of the processes of hydrolysis and diffusion used in theoretical models of transience in silicon. Similar models apply to the other transient materials. c, Experimental results (symbols) and simulations (lines) for the time dependent dissolution of Si NMs with different thicknesses, 35 nm (black), 70 nm (blue), 100 nm (red) in PBS at 37° C. d, Optical microscope images of the dissolution of a serpentine trace of Mg (150 nm thick) trace on top of a layer of MgO (10 nm thick). e, Experimental (symbols) and simulation (lines) results showing the ability to tune the dissolution time of similar traces of Mg (300 nm thick) by use of encapsulation layers of different materials and thicknesses. Here, measurements of length-normalized resistance show that the transience times increase progressively with encapsulation layers of MgO (400 nm, red; 800 nm, blue) and silk (condition i, cyan; condition ii, purple). With these simple schemes, the transience times can be adjusted in a range from minutes to several days or longer. Contemplated timeframes for transience are short term (minutes to days), mid term (days to weeks) and long term (weeks to months or years). Silk packaging strategies can further extend these times. f, Measurements of transience at the device-level with n-channel transistors encapsulated with MgO and crystallized silk. The transience shows dual kinetics, involving time-independent operation for several days, followed by rapid degradation. Transience in the encapsulation layers and the Mg electrodes define the first and second timescales. The materials for the encapsulation layers and their thicknesses can, in this way, define the transience time in a way that is decoupled from device operation.
Figure 10:
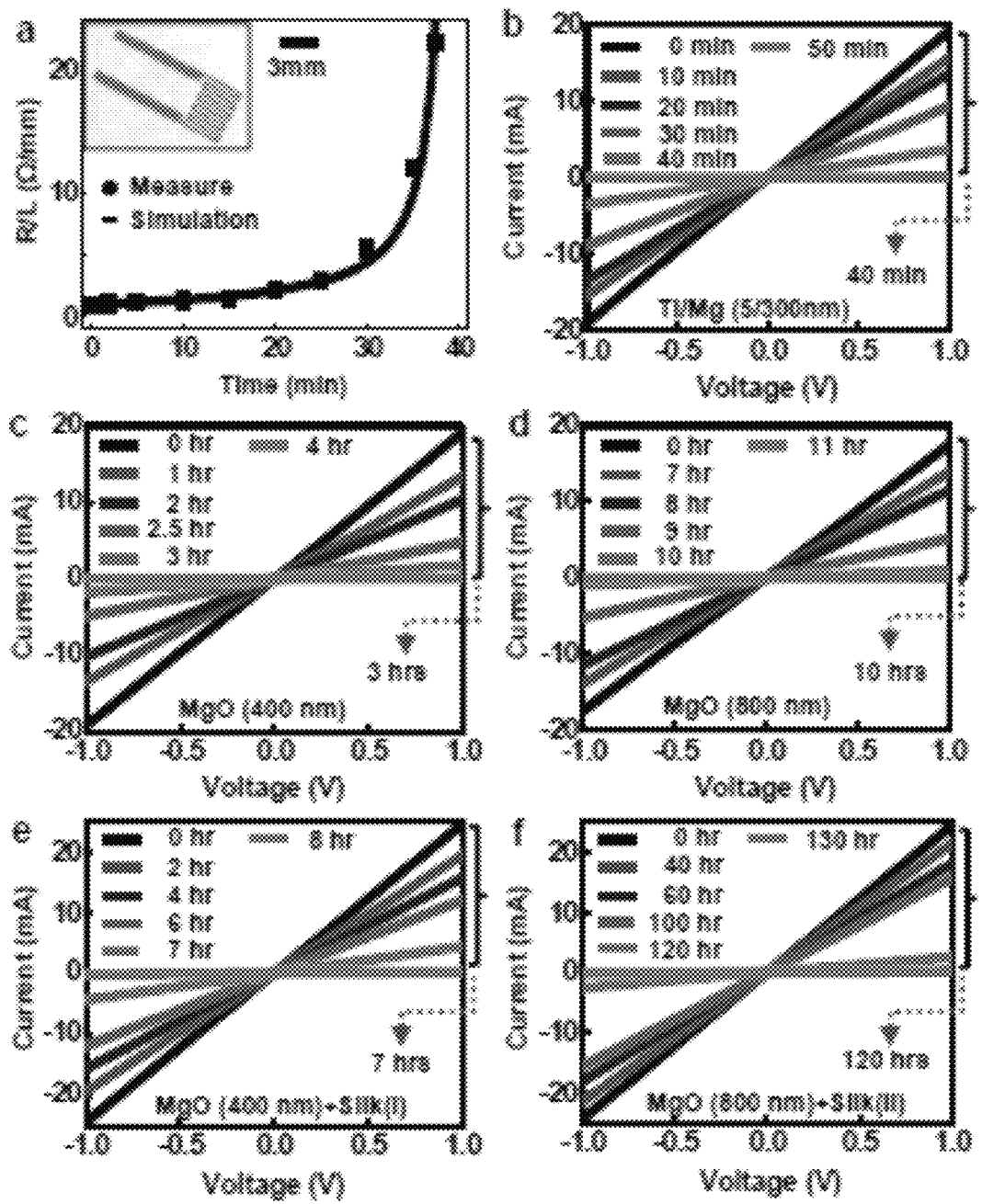
FIG. 10A-F. Change of current-voltage characteristics of a serpentine trace of Mg encapsulated with various materials during dissolution in water: a, Experimental (symbol) and analytical results (line) for the length-normalized resistance change of Mg trace (300 nm), as a function of time. The inset shows the image of Mg trace, b, Ti/Mg (5/300 nm), c, Ti/Mg/MgO (5/300/400 nm), d, Ti/Mg/MgO (5/300/800 nm), e, Ti/Mg/MgO/silk (i) (5/300/400 nm/50 µm), f, Ti/Mg/MgO/silk (ii) (5/300/800 nm/50 µm)
Figure 11:
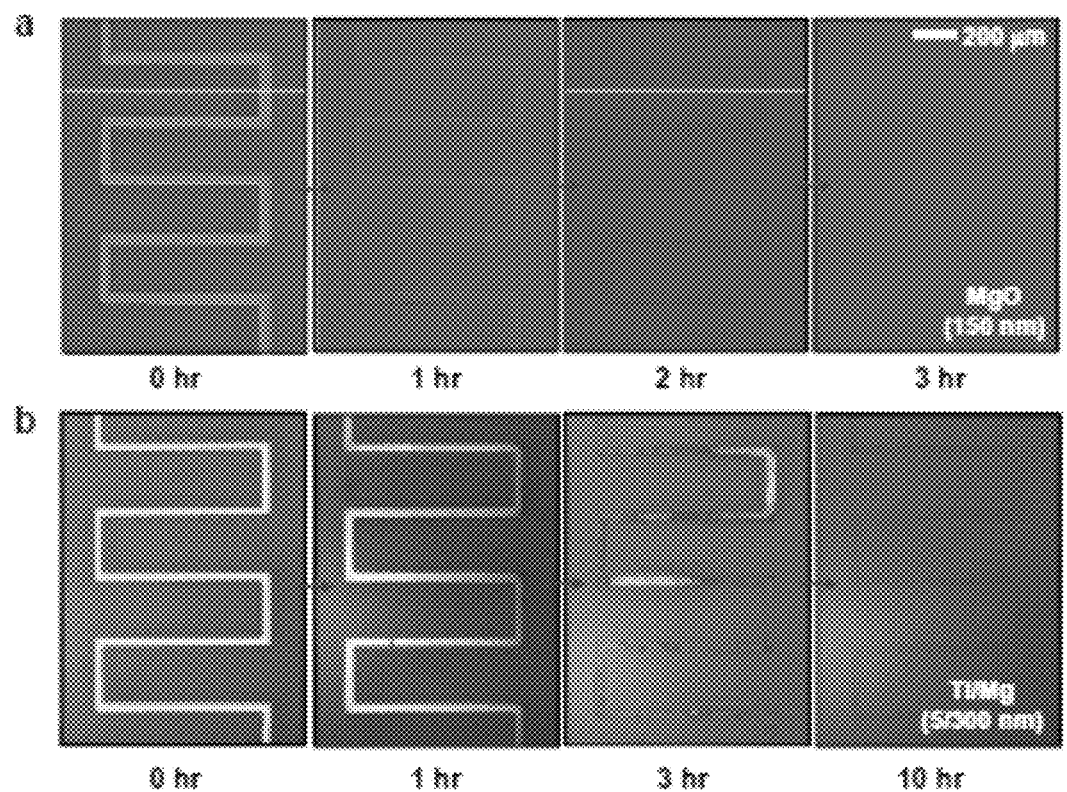
FIG. 11A-B. Time dependent dissolution of transient electronic materials in water. a, MgO (150 nm) and b, Mg (300 nm), with a 5 nm layer of Ti as an adhesion promoter.
Figure 12:
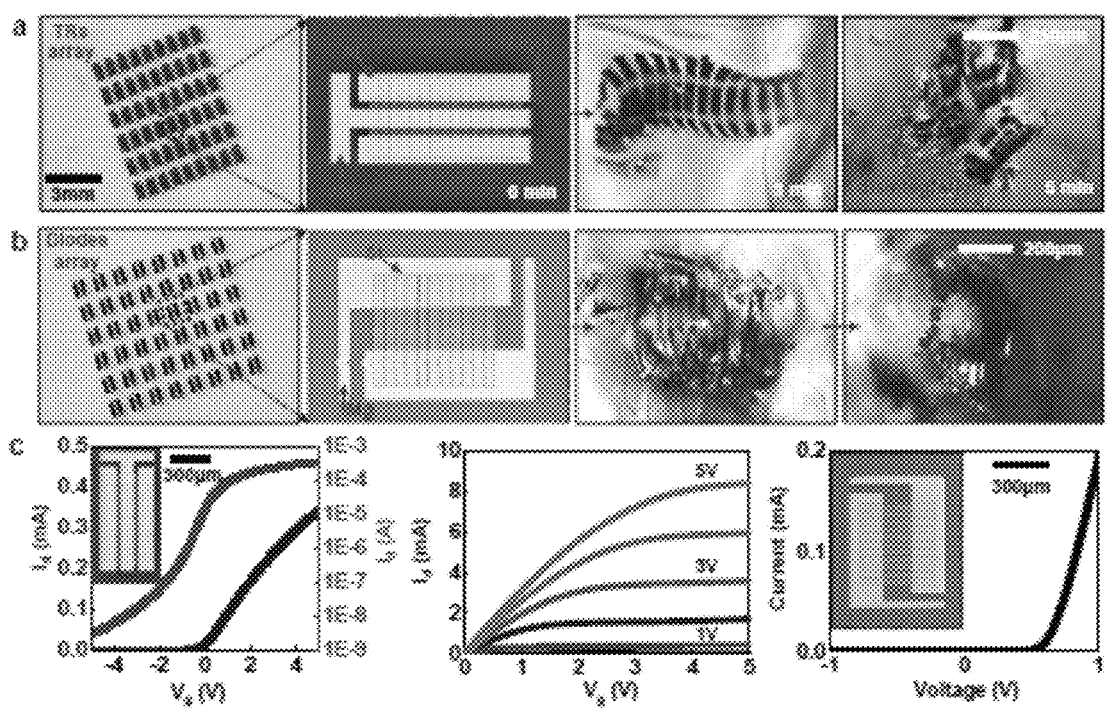
FIG. 12A-C. Image and electrical characterization of transient electronic devices designed to disintegrate, as a means to accelerate the rate of transience. a, Image of a 6×9 array of silicon transistors (first frame). Each transistor uses arrays of Si nanoribbons for the active channel regions (second frame). These nanoribbon disintegrate into individual pieces in the early stages of dissolution, as shown in the third (3 min) and fourth (5 min) frames. b, Images of a 6×8 array of silicon diodes fabricated with Si nanoribbons before (first and second frame) and after (third and fourth frame) dissolution. c, Linear (blue) and log scale (red)
Figure 13:
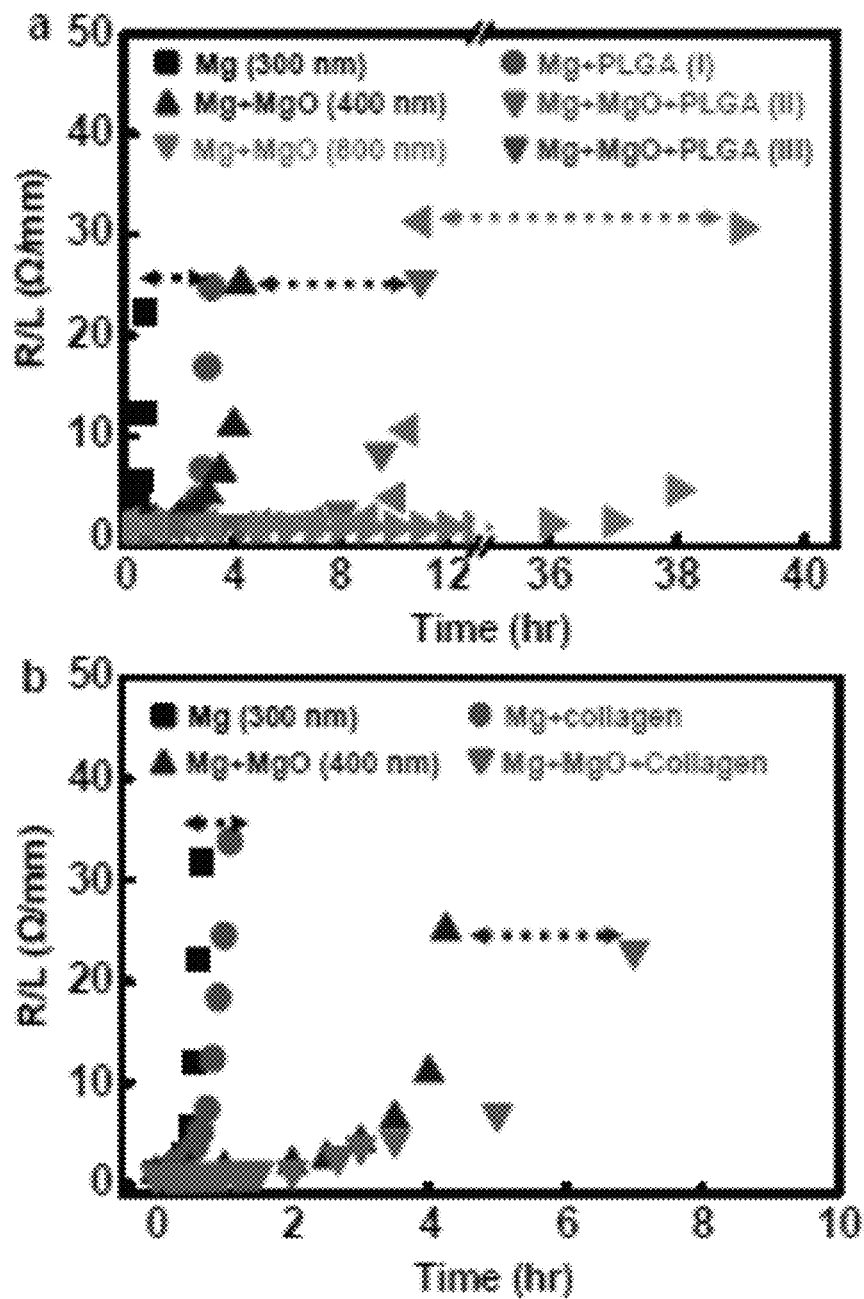

The predictive use of these models highlights the importance of NMs and thin film device designs. In particular, $t_c$ for a piece of silicon with dimensions comparable to those of a diced integrated circuit (~12 mm×~12 mm×~700 μm) is estimated to be more than ~600 years, and would require nearly ~8 L of water to avoid solubility limits[9]. By comparison, $t_c$ for a Si NM with similar lateral dimensions and a thickness of 35 nm is less than ~10 days, and can occur in as little as ~0.4 mL of water. The timescales for NM-based electronic components can be extended, in controlled amounts, by adding transient encapsulating layers and packaging materials; they can be reduced by decreasing the critical dimensions or by physically structuring the materials in a way that accelerates dissolution by disintegration (FIG. 12). FIGS. 4e and 10 show results of measured transience in a serpentine resistor of Mg, encapsulated with different thicknesses of MgO, and with combinations of MgO and overcoats of silk. Corresponding modeling results are also shown (See Example 2 for details), all of which agree well with experiments and general expectation. Silk is attractive for this purpose because its solubility in water can be programmed, over several orders of magnitude, through control of crystallinity[5,15]. Other biodegradable polymers can also be used, as shown in FIG. 13. Studies of transience at the device level are also important. FIG. 4f shows examples of metal oxide semiconductor field effect transistors (MOSFETs) formed with Si NMs, $SiO_2$ dielectrics and Mg electrodes, with encapsulating layers of MgO and crystallized silk. The devices, which are described in detail next and in Example 2, show two-stage kinetics in their functional transience. In particular, immersion in water for up to ~90 hours causes negligible change in key device characteristics, such as mobility, on/off current ratio ($I_{on}/I_{off}$) and threshold voltage ($V_{th}$). Functional degradation occurs in a relatively narrow time interval following this period of stable operation. The encapsulation layers define the first timescale; the Mg electrodes define the second. These behaviors are consistent with expectation based on separate experimental and theoretical studies of the constituent materials. The results are important because they demonstrate that encapsulation layers, which do not provide active roles in the devices, can be exploited to define the transience time in a way that is decoupled from system or device level function. Although different device types require Si NMs with different thicknesses, the results of FIG. 4 indicate that the Mg and the encapsulation layers play the dominant roles in determining the timescales for transience in function, for practical cases explored here. (Due to the operational mode of transience in the cases presented here, long-term storage should involve a dry environment).

Figure 5:
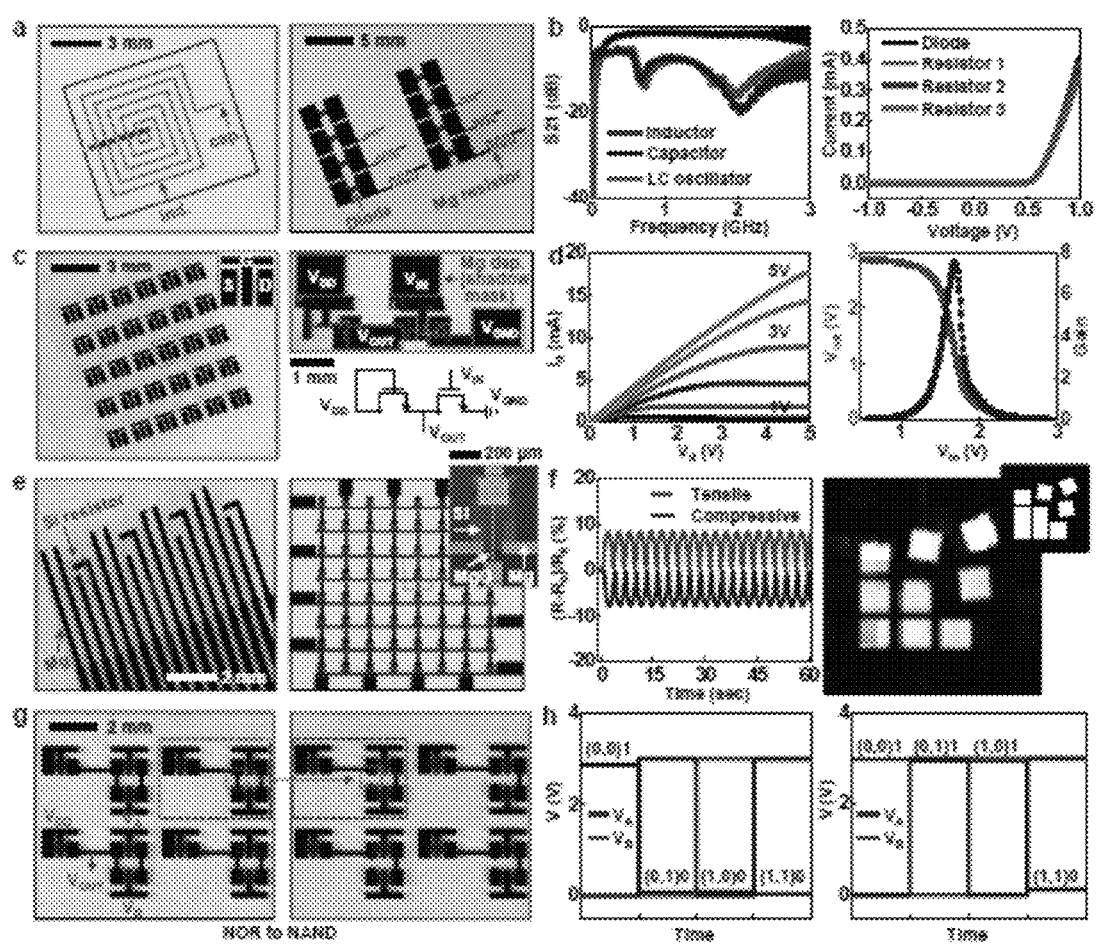
FIG. 5A-H. Images and electrical properties of transient electronic components, circuits and sensors, including simple integrated circuits and sensor arrays. a, Image of an LC (inductor-capacitor) oscillator fabricated with Mg electrodes and MgO dielectric layers (left) and silicon diodes with serpentine Mg resistors (right). b, Measurements of the S21 scattering parameter of an inductor (blue), capacitor (black), and LC oscillator (red) at frequencies up to 3 GHz (left). Current-voltage (I-V) characteristics of silicon diodes connected to three different Mg resistors (right). c, Images of an array of p-channel (left) metal-oxide semiconductor field effect transistors (MOSFETs) and a logic gate (inverter; right) comprised of n-channel MOSFETs. Each MOSFET consists of Mg source, drain, gate electrodes, MgO gate dielectrics and Si NM semiconductors. The inverter uses Mg for interconnects, and Au for source, drain, gate electrodes, in a circuit configuration shown in the diagram. d, I-V characteristics of a representative n-channel MOSFET (left, channel length (L) and width (W) are 20 µm and 900 µm, respectively). The threshold voltage, mobility and on/off ratio are −0.2 V, 660 $cm^2/V \cdot s$, and $>10^5$, respectively. Transfer characteristic for the inverter (right, L and W are 20 µm and 700 µm for input transistor and 500 µm and 40 µm for load transistor, respectively). The voltage gain is ~8. e, Image of a collection of strain sensors based on Si NM resistors (left) and addressable array of Si NM photodetectors with blocking diodes. In both cases, Mg serves as contact and interconnection electrodes and MgO as dielectric layers. f, Fractional change in resistance of a representative strain gauge as a function of time during cyclic loading (left). Bending induces tensile (red) and compressive (blue) strains, uniaxially up to ~0.2%. Image of a logo collected with the photodetector array (right). Inset shows the logo design. g, Images of logic gates in which controlled transience affects functional transformation, in this case from NOR (left) to NAND (right) operation, by selective dissolution of an unencapsulated Mg interconnect. h, Output voltage characteristics of the circuits before (NOR, left) and after (NAND, right) transformation. $V_a$ and $V_b$ represent voltage inputs.

These materials, fabrication techniques and modeling tools can yield component devices for almost any type of transient electronic system, in CMOS designs. FIG. 5 presents several examples, including additional details on MOSFETs likes those in FIG. 4, where both n- and p-channel operation is possible, where Mg electrodes (thickness ~250 nm) serve as the source, drain and gate; MgO and/or $SiO_2$ provide the gate dielectrics (thicknesses between 100 and 150 nm); and Si NMs (thickness 300 nm) act as the semiconductor. The resulting electrical properties for a typical n-channel device with L=20 μm and W=900 μm, include saturation and linear regime mobilities of 560 cm²/Vs and 660 cm²/Vs, respectively, on/off ratios of >10⁵, subthreshold slopes of 160 mV/dec (at $V_d=0.1$ V) and width-normalized current outputs of 0.34 mA/mm (at $V_g=5$ V). These properties, as well as those of similar p-channel devices, compare favorably to the performance of counterparts with similar critical dimensions formed on SOI wafers. The properties of the devices are believed to scale in the usual way with device dimensions that approach those found in state-of-the-art integrated circuits. (For the range of channel lengths investigated, contact resistances do not limit performance. See FIG. 14.)

Figure 16:
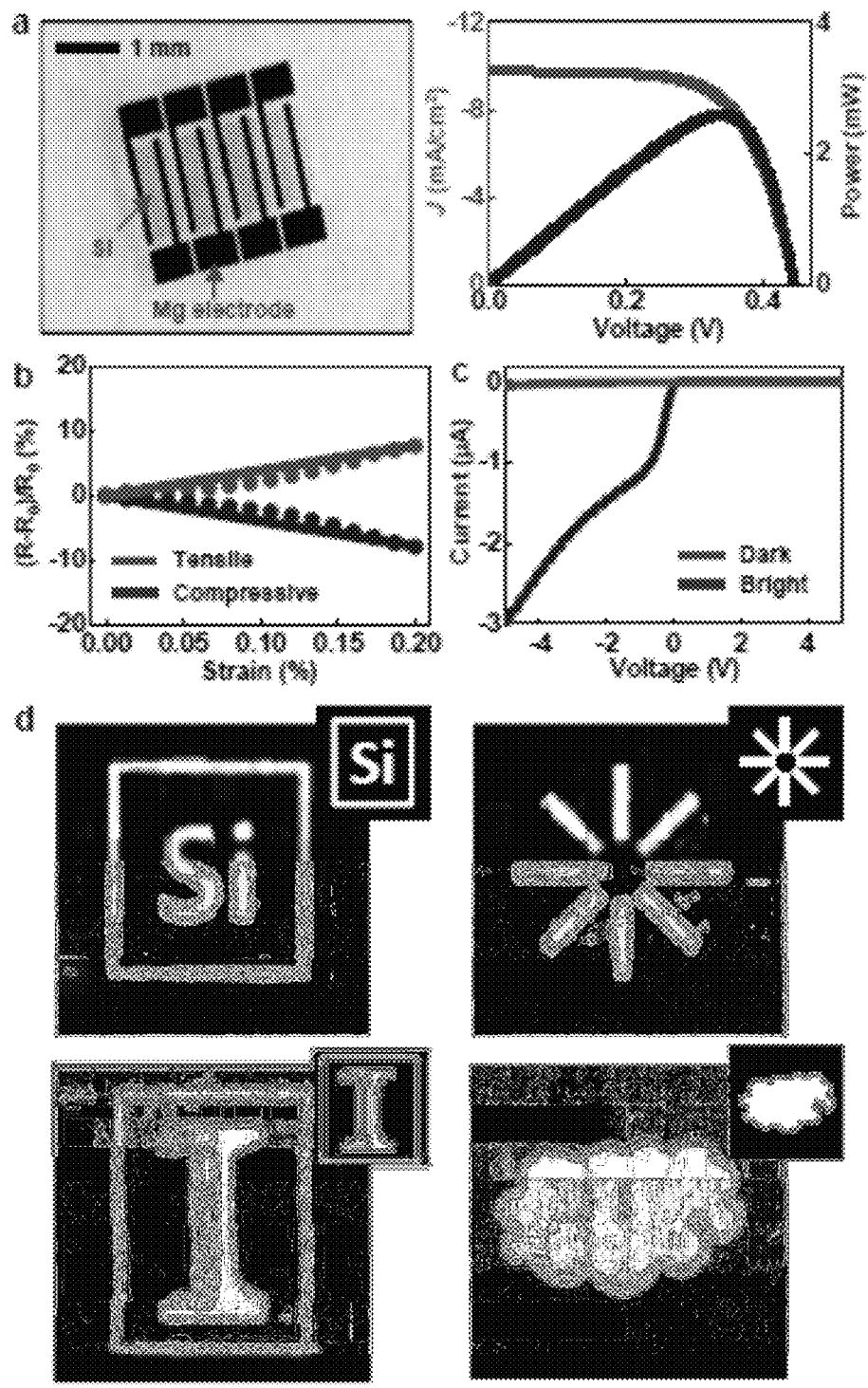
Figure 17:
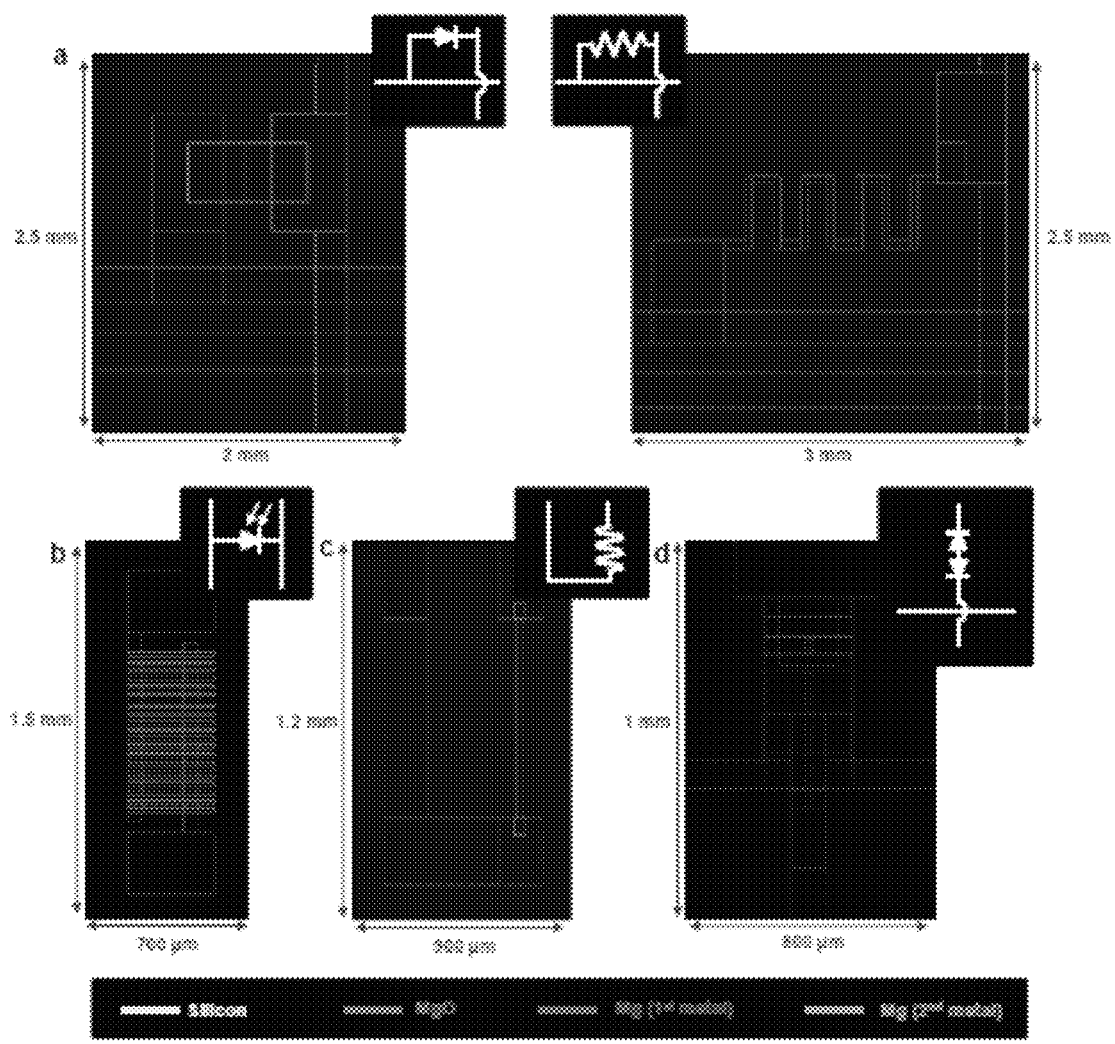

In addition to MOSFETs, many other classes of semiconductor devices and passive components are possible. Images and electrical characteristics of some examples appear in FIG. 5, FIG. 15, and FIG. 16. The resistors and diodes can serve as temperature sensors; the latter can also be used in photodetectors and solar cells, as shown in FIG. 5 and FIG. 16. The Si NM diode and Mg resistive temperature sensors show sensitivities of −2.23 mV/° C. (change in voltage for a given current output) and 0.23%/° C. (percentage change in resistance) both of which are consistent with the behavior of conventional, non-transient devices[16]. With current designs and standard measurement systems, changes in temperature of 0.004~0.007° C. can be resolved. Ultrathin silicon solar cells (~3 μm thick) provide fill factors of 66% and overall power conversion efficiencies of ~3%, even without light trapping structures, backside reflectors or anti-reflection coatings. Doped Si NMs with Mg contacts can serve as strain gauges (FIG. 5e, left), with gauge factors of nearly ~40 (FIG. 5f, left, and FIG. 16b), comparable to those of state-of-the art devices[17]. The technologies and fabrication schemes presented here are sufficiently well developed to enable functional, interconnected arrays of sensors. As an example, a transient digital imaging device was built, including collections of Si NM photodiodes with blocking diodes for passive matrix addressing (FIG. 5e, right), capable of capturing pictures when operated in a scanned mode (FIG. 5f, right, and FIG. 16d). (See more details on device dimensions in FIG. 17.) The yield here is >90% (i.e. 58 out of 64 pixels were fully functional. See FIG. 18). Many other possibilities can be realized.

The transience times of various elements in an integrated system can be the same or different. The latter can be achieved by use of varied thicknesses and/or stack compositions, or even via combination with non-transient materials. The last possibility is shown in a logic gate (inverter) in the right hand frames of FIGS. 5c and 5d, where a non-transient metal (Au) serves as source, drain and gate electrodes for two transistors joined by transient Mg interconnects. In this case, transience in the Mg converts the system from an inverter to two isolated transistors. Variable dissolution rates in purely transient systems can be similarly exploited to transform function over time. Disappearance of Mg shunt resistors or interconnects in systems that are otherwise encapsulated in MgO can affect the functional addition or subtraction, respectively, of selected components in a transient integrated circuit. FIGS. 5g and 5h illustrate the latter possibility, in a Si NM MOSFET logic gate that transforms from NOR to NAND operation due to disappearance of an interconnect. Examples of transient shunts appear in FIG. 19, where the effects are to change function from a resistor to a diode, from a NAND gate to an inverter, and from a NOR gate to independent transistors.

This broad variety of device components, sensors and actuators enables integrated systems with useful levels of functionality. One option for power supply is to exploit silicon solar cells such as those shown in FIG. 16a. Another uses inductors and capacitors like those in FIGS. 3a, 5a and 15 as wireless antennas for near-field mutual inductance coupling to a separately powered, external primary coil. A compelling application of transient electronic systems is in implantable devices[4], made possible by the bio-compatibility of the constituent materials introduced here (FIG. 3). In particular, Mg is already used as structural material in certain types of intravascular stents[18]. Silk is approved for use in sutures, and tissue engineering[5]. A 1 μg transient Si NM device dissolved in 3 L of blood plasma yields a concentration of 0.33 μg/L, which falls below physiological concentrations[19]. The boron and phosphorous doping needed to achieve n and p channel MOSFETs with Si NMs represent concentrations of ~1 ng/L for phosphorous and ~11 pg/L for boron, both of which are well below physiological levels (400 mg/L for phosphorous, 24 mg/L for boron in blood), even at minimum volumes necessary to avoid solubility limits for Si (90 μg/L for phosphorous and 1 μg/L for boron in 0.03 mL). The total amounts of phosphorous (~3 ng) and boron (~33 pg) are orders of magnitude smaller than the suggested daily intake (~1500 mg for phosphorous and 1~13 mg for boron) from a normal diet[20-23].

Figure 6:
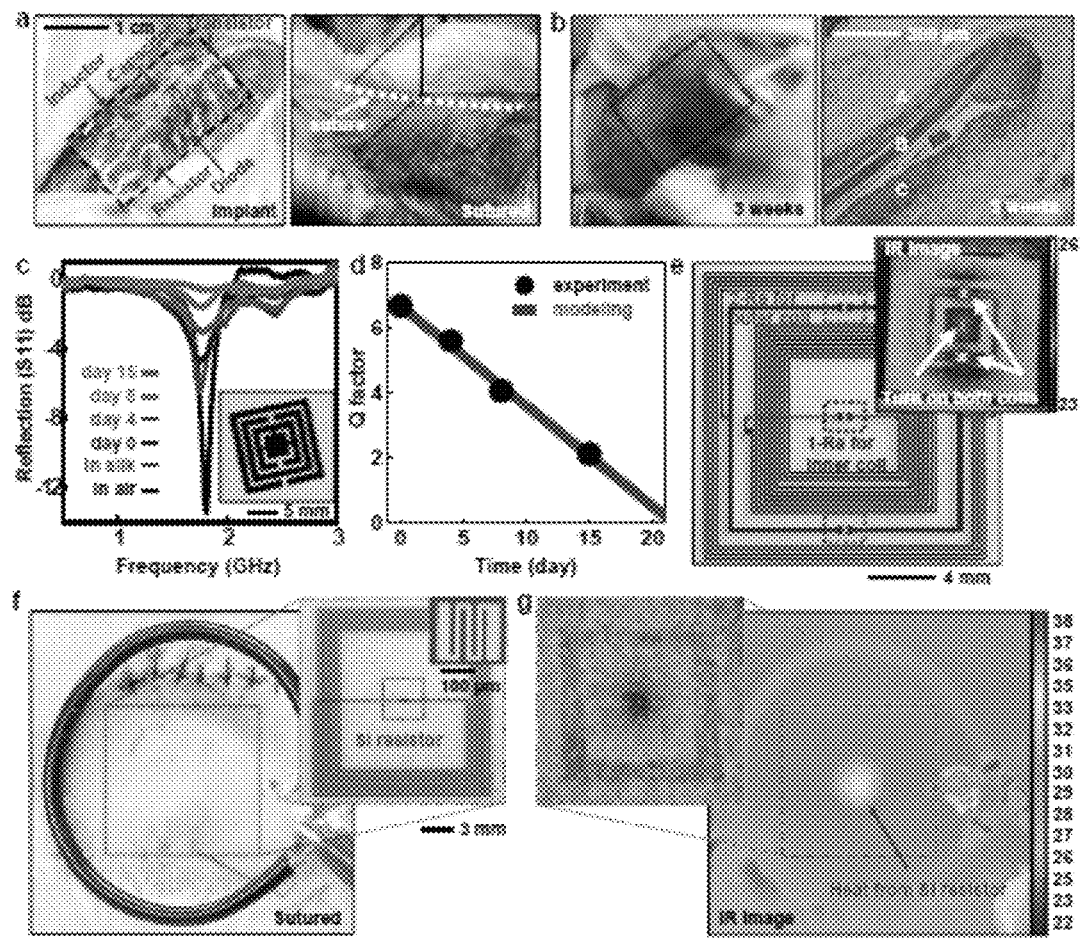
FIG. 6A-G. In vivo evaluations and example of a transient bio-resorbable device for thermal therapy. a, Images of implanted (left) and sutured (right) demonstration platform for transient electronics in the sub-dermal dorsal region of a BALB-c mouse. b, Implant site after 3 weeks (left). Histological section of tissue at the implant site, excised after 3 weeks showing a partially resorbed region of the silk film (right). (A, subcutaneous tissue; B, silk film; C, muscle layer) c, Resonant responses of an implanted, transient RF metamaterial structure before and after placement in a silk package, immediately after implantation, and at several time intervals thereafter. d, Measured and calculated Q factor for the metamaterial. The results indicate transience dominated by diffusion of bio-fluids through the silk package. e, Transient wireless device for thermal therapy, consisting of two resistors (red outline) connected to a first wireless coil (70 MHz; outer coil) and a second resistor (blue outline) connected to a second, independently addressable, wireless coil (140 MHz; inner coil). Inset shows thermal image of this device coupled with a primary coil operating at two frequencies, to drive both the inner and outer coils simultaneously. f, Primary coil next to a sutured implant site for a transient thermal therapy device. Inset shows the image of a device. g, Thermal image collected while wirelessly powering the device through the skin; the results show a hot spot (5° C. above background) at the expected location, with magnified view in the inset.

To demonstrate bio-resorption and bio-compatibility, a series of in vivo experiments were conducted. Various representative transient devices (e.g. FIG. 3 and others) were fabricated, sealed in silk packages, sterilized with ethylene oxide, and then implanted in the sub-dermal region of BALB/c mice in accordance with Institutional Animal Care and Use Committee (IACUC) protocols. FIG. 6a shows the case of the demonstration platform presented in FIG. 3. Examination after 3 weeks (FIG. 6b, left) revealed only faint residues, with evidence of slow reintegration into the sub-dermal layers along with apparent revascularization. The histological section presented in FIG. 6b (right) shows the subdermal layer (A), the silk film (B) and the muscle layer (C), and absence of any inflammatory reaction. The data of FIG. 6b are representative of standard animal evaluations of bioresorbable materials or devices, following established protocols with multiple animals (N=3), each followed to a 3 week time point. Additional historical analysis appears in FIG. 20. Furthermore, the literature provides strong evidence for the biocompatibility of the constituent materials in the transient electronic systems. Silk is approved for clinical use in resorbable surgical sutures and soft tissue scaffolds. Porous silicon and silica nanoparticles are well established as viable candidates for bioresorbable drug delivery applications.[8,24] MgO has been used as coatings for these and related structures,[25] as well as for iron-based nanoparticle contrast agents for magnetic resonance imaging[26]. Mg and Mg alloys have been demonstrated in biodegradable stents. The amounts of material utilized or envisioned for transient electronic constructs are orders of magnitudes lower than those experimentally proven to have acceptable biocompatibility and, in certain cases, established roles in clinical use.

Inductive coils of Mg combined with resistive microheaters of doped Si NMs, integrated on silk substrates and housed in silk packages, provide transient thermal therapy systems for potential use in infection mitigation and disease management, where localized heating can facilitate bacterial suppression and provide localized pain relief[27-29]. A transient electronic bacteriocidal appliqué that can be delivered to the external surfaces of medical implant devices, such as permanent pacemakers, implantable defibrillators, mechanical circulatory support devices or artificial hips and knees is an example of a transient thermal therapy system. The aim is to control surgical site infections[30,31], with a viable, effective, non-antibiotic, programmable bacteriocide that disappears as the patient moves beyond the period of greatest risk, to rid the patient of unnecessary device burden. FIG. 6c, d show the case of a metamaterial RF antenna, as a generalized component building block for such a device, for which transience can be monitored continuously after implantation, in a wireless mode using a network analyzer. The data indicate transient behavior associated with slow diffusion of biofluids through the edges of the silk package, with a measured Q factor that has time dependence consistent with theoretical models. See Example 2 for details. FIG.

6e shows an image of a device formed on glass that includes two coils with different resonance frequencies (~70 MHz and ~140 MHz) and three separate heaters. Wirelessly operating either or both of these coils with appropriate frequencies and power levels applied to a separate primary coil enables full control of the system, as illustrated in the thermal images in the inset. (See FIGS. 21, 22 and 23 for other examples.) Incorporating additional coils and heaters can allow full control over more complex temperature distributions. Similar approaches can be used for spatially and temporally programmed electrical stimulation. To demonstrate in vivo functionality, a single-coil, single-heater, fully transient version of this device was implanted under the skin of a Sprague-Dawley rat (FIG. 6f). Inductive coupling through the skin generates a localized temperature increase of $\Delta T$ ~5° C. (FIG. 6g), coincident with the position of the heater. The complete device is transient, with a timescale of 15 days. The fifteen day timescale was chosen to provide robust functionality during the most critical period, i.e. the first few days after an operation, to sterilize and maintain asepsis at the wound site. The device is no longer needed after this time. Fifteen days represents a conservative estimate of the required duration for efficacy, after which the device disappears to eliminate any long-term burden associated with additional exogenous implant material. The silk package determines the transience time, which is adjustable via control of the degree of crystallinity in the silk.

The concepts reported here establish a comprehensive baseline of materials, modeling approaches, manufacturing schemes and device designs for transient electronic systems, sensors, actuators and power supply. The Si nanomembranes (NMs), with or without $SiO_2$, are important elements because their use immediately enables sophisticated semiconductor components with both active and passive functionality. For the dielectrics and conductors, additional possibilities range from collagen to poly(lactic-co-glycolic acid) and from iron to zinc, respectively. Alternative modes of transience include absorption, corrosion, de-polymerization and others. The rates for these processes could, conceivably, be adjustable in real-time, triggered, and/or sensitive to the properties of the surrounding environment, determined by chemical or biological events, or changes in temperature, pressure, or light.

Methods Summary

Fabrication of Devices

Doped single crystalline silicon nanomembranes (NMs) were prepared from silicon-on-insulator (SOI) wafers (top silicon thickness ~300 nm, p-type, SOITEC, France). Undercut etching of the buried oxide with hydrofluoric acid (HF, 49% Electronic grade, ScienceLab, USA) formed isolated silicon NMs that were then transfer printed onto silk film substrates. Gate and interlayer dielectrics (MgO or $SiO_2$), as well as electrodes and interconnects (Mg) were deposited by electron-beam evaporation through high resolution stencil masks. For the latter, MgO layers served as an adhesion promoter, except for the Mg/Si contacts needed for the transistors, where Mg was either deposited directly or, for improved yields and adhesion strength, with a 5 nm layer of Ti. Additional details on fabrication processes appear in Example 2.

Preparation of Substrates, Encapsulation Layers and Packages

B. mori silkworm cocoons were cut and boiled in a 0.02 M $Na_2CO_3$ solution to extract the glue-like sericin proteins. The remaining silk fibroin was rinsed in Milli-Q water and dissolved in a LiBr solution at 60° C. for 4 h and then dialyzed with distilled water using dialysis cassettes for a couple of days to remove LiBr. After centrifugation and filtration to remove insoluble remnants, the silk solution was diluted to 5 to 7 wt with ion-free distilled water and cast onto silicon substrates or glass slides to form ~20 μm thick films and kept drying out in air to form silk films.

Silk Fibroin Packaging Scheme

Two ~100 μm silk fibroin films, cut into areas of ~5 cm×5 cm, were cross-linked via lamination at 120° C. for 60 s, to achieve maximum β-sheet crystallinity and complete adhesion of the silk layers. The films were stacked, and then one edge was sealed by re-lamination with 10 μL of ~6% silk fibroin solution as an adhesion layer. The silk substrate for the functional device was left uncrosslinked, and placed in between the two cross-linked films. Finally, the other three sides were sealed by the same method, fully encapsulating the sample in between the two films. Excess film was trimmed from the edges to minimize the size of the encapsulated sample for implantation.

Transience and Tunability in Transience at the Device Level

Various transient devices, including n-channel MOSFETs, diodes, logic gates (NAND) and Mg resistors were fabricated using procedures and materials described above. MgO (400 nm thick) and crystallized silk (70 μm thick) served as encapsulation layers, deposited uniformly over the devices as barriers to water. Details appear in Example 2.

Animal Model Evaluations

Female BALB/c mice (6-8 weeks old) and female albino Sprague-Dawley rats were anesthetized with an intraperitoneal injection of a ketamine/xylazine mix. The depth of anesthesia was monitored by palpebral and withdrawal reflexes to confirm that the animal had reached "stage 3" of anesthesia. The back was shaved and cleaned at the incision site with 70% ethanol, followed by a betadine surgical scrub. Once stage 3 was confirmed, a small longitudinal incision was made through the skin and the sterile implants (ethylene oxide sterilized) were inserted. The incision was closed with a Dexon 5-0 suture. The animal was monitored until ambulatory and given a dose of analgesia (Buprenorphine subcutaneously) as soon as surgery was completed.

Transient Electronic Systems with Wireless Power Supply for Thermal Therapy.

The device includes silicon resistors, inductive coils and interconnection lines, formed on a silk substrate, with a separate silk package. Transfer printing of doped silicon NMs was followed by deposition and patterning of a first metal layer (Ti/Mg, 5/250 nm), an interlayer dielectric (MgO, 400 nm) and a second metal layer (Ti/Mg, 10/800 nm). The device was then packaged with silk, as described previously. The coupling frequency for wireless power transmission was ~70 MHz.

REFERENCES

[1] Bettinger, C. J. & Bao, Z. Organic thin-film transistors fabricated on resorbable, biomaterial substrates. *Adv. Mater.* 22, 651-655 (2010).

[2] Irimia-Vladu, M. et al. Biocompatible and biodegradable materials for organic field-effect transistors. *Adv. Funct. Mater.* 20, 4069-4076 (2010).

[3] Legnani, C. et al, Bacterial cellulose membrane as flexible substrate for organic light emitting devices. *Thin Solid Films* 517, 1016-1020 (2008).

[4] Kim, D.-H. et al. Dissolvable films of silk fibroin for ultrathin, conformal bio-integrated electronics. *Nature Mater.* 9, 511-517 (2010).

[5] Wang, Y. et al. In vivo degradation of three-dimensional silk fibroin scaffolds. *Biomaterials* 29, 3415-3428 (2008).

[6] Hamer, J. W., Cok, R. S., Parrett, G. J., Winters, D. & Primerano, B. AMOLED Displays Using Transfer-Printed Integrated Circuits. *SID Symposium Digest of Technical Papers* 40, 947-950 (2009).

[7] Low, S. P. & Voelcker, N. H. The biocompatibility of porous silicon in tissues of the eye. *Biomaterials* 30, 2873-2880 (2009).

[8] Park, J.-H. et al. Biodegradable luminescent porous silicon nanoparticles for in vivo applications. *Nature Mater.* 8, 331-336 (2009).

[9] Iler, R. K. Effect of adsorbed alumina on the solubility of amorphous silica in water. *J. of Colloid Interf. Sci.* 43, 399-408 (1973).

[10] Haran, B. S. et al. 22 nm technology compatible fully functional 0.1 $\mu m^2$ 6T-SRAM cell. *Electron devices meeting, 2008. IEDM 2008. IEEE International* 1-4 (2008).

[11] Danckwerts, P. V. Absorption by simultaneous diffusion and chemical reaction. *Tran. Faraday Soc.* 46, 300-304 (1950).

[12] Hawtin, P & Murdoch, R. The role of in-pore mass transport resistance in the reaction of porous solids with gases. *Chemical Engineering Science* 19, 819-834 (1964).

[13] Ozisik, M. N. & Nordwall, H. J. Carbon loss from graphite cylinders exposed to steam for short Times. *Nuclear Science and Engineering* 44, 310-319 (1971).

[14] Levine, R. D. *Molecular Reaction Dynamics*. Cambridge University Press, Cambridge (2005).

[15] Hu, X. et al. Regulation of silk material structure by temperature-controlled water vapor annealing. *Biomacromolecules* 12, 1686-1696 (2011).

[16] Santra, S., Guha, P. K., Ali, S. Z., Haneef, I. & Udrea, F. Silicon on insulator diode temperature Sensor—a detailed analysis for ultra-high temperature operation. *IEEE Sens. J.* 10, 997-1003 (2010).

[17] Won, S. M. et al. Piezoresistive strain sensors and multiplexed arrays using assemblies of single-crystalline silicon nanoribbons on plastic substrates. *IEEE T. Electron Dev.* 58, 4074-4078 (2011).

[18] Witte, F. The history of biodegradable magnesium implants. *Acta Biomater.* 6, 1680-1692 (2010).

[19] Becker, W. et al. Opinion of the scientific panel on dietetic products, nutrition and allergies on a request from the commission related to the tolerable upper intake level of silicon. *The EFSA Journal* 60, 1-11 (2004).

[20] Naghii, M. R., Mofid, M., Asgari, A. R., Hedayati, M. & Daneshpour, M.-S. Comparative effects of daily and weekly boron supplementation on plasma steroid hormones and proinflammatory cytokines. *J. Trace. Elem. Med. Bio.* 25, 54-58 (2011).

[21] Capala, J. et al. Boron neutron capture therapy for glioblastoma multiforme: clinical studies in Sweden. *J. Neuro-Oncol.* 62, 135-144 (2003).

[22] Block, G. A., Hulbert-Shearon, T. E., Levin, N. W. & Port, F. K. Association of serum phosphorus and calcium 3 phosphate product with mortality risk in chronic hemodialysis patients: a national study. *Am J Kidney Dis.* 31, 607-617 (1998).

[23] Young, V. R. et al. *Dietary Reference Intakes for Calcium, Phosphorus, Magnesium, Vitamin D, and Fluoride*. National Academy Press, Washington, D.C. (1997).

[24] Trewyn, B. G. et al. Biocompatible mesoporous silica nanoparticles with different morphologies for animal cell membrane penetration. *Chemical Engineering Journal* 137, 23-29 (2008).

[25] Shen, S. et al. Submicron particles of SBA-15 modified with MgO as carriers for controlled drug delivery. *Chem. Pharm. Bull.* 55 (7), 985-991 (2007).

[26] Martinez-Boubeta, C. et al. Self-assembled multifunctional Fe/MgO nanospheres for magnetic resonance imaging and hyperthermia. *Nanomedicine: NBM* 6, 362-370 (2010).

[27] Tao, H. et al. Gold nanoparticle-doped biocompatible silk films as a path to implantable thermo-electrically wireless powering devices. *Appl. Phys. Lett.* 97, 123702 (2010).

[28] Bramson, J. et al. Enabling topical immunization via microporation: a novel method for pain-free and needle-free delivery of adenovirus-based vaccines. *Gene Ther.* 10, 251-260 (2003).

[29] Park, J.-W. et al. Wireless thermal micro-ablation of skin for transdermal drug delivery. *The 13th International Conference on Solid-state Sensors, Actuators and Microsystems* 2, 1238-1241 (2005).

[30] National Nosocomial Infections Surveillance (NNIS) report, data summary from October 1986-April 1996, issued May 1996. A report from the National Nosocomial Infections Surveillance (NNIS) System. *Am. J. Infect. Control* 24, 380-388 (1996).

[31] Anderson, D. J. et al. Clinical and financial outcomes due to methicillin resistant *Staphylococcus aureus* surgical site infection: a multi-center matched outcomes study. *PLoS One* 4, 1-8 (2009).

Example 2

Fabrication Process

Single crystalline silicon nanomembranes (thickness ~300 nm, p-type) were fabricated from silicon-on-insulator (SOI, SOITEC, France) wafers to form active areas of semiconductor devices. High temperature diffusion of phosphorous (~950° C.) and boron (~1,000° C.) dopants defined highly doped regions for source and drain electrodes for transistors and for n and p type areas of diodes, photodetectors and solar cells. The lateral dimensions of the doped Si NMs were defined by reactive ion etching (RIE) with sulfur hexafluoride ($SF_6$) gas. To release the silicon from the SOI, the buried oxide was removed by wet etching with hydrofluoric acid (HF, 49% Electronic grade, ScienceLab, USA). Individual Si NMs formed by this process were transfer printed to a spin cast film of silk on a silicon wafer (as a temporary 'carrier' substrate). Various metal and dielectric layers were then deposited using electron beam (ebeam) evaporation through patterned polyimide shadow masks, to complete the devices and interconnections between them.

Functional Transformation Via Transience

Functional transformation by transience involved dissolution of certain metal interconnects on timescales shorter than those associated with other parts of the system. This behavior was achieved by encapsulating all regions of a circuit with a layer of MgO, except those associated with selected interconnects. The fabrication processes involved doped Si NMs in transistors with gate dielectric layers of MgO (150 nm) or SiO$_2$ and source, drain, and gate electrodes of Mg (250 nm). Although not required, the use of thin layers of Ti to promote adhesion improved the yields. A typical thickness of Ti was 5 nm. Interconnect lines between logic gates that used such transistors were formed by depositing Mg (150 nm) on top of thin adhesion promoting layers of MgO (10 nm). The metal traces were extended beyond the edges of the adhesion layer to ensure effective electrical contact to the transistor electrodes. A final encapsulation layer (MgO, 400 nm) was deposited in a suitable pattern, as described above. All patterning and deposition steps were performed with polyimide shadow masks and electron beam evaporation.

Disintegrating Transistor

Instead of a single Si NM, arrays of narrow Si nanoribbons (NRs) can be used, as a way to accelerate transience through a process of disintegration that can enhance diffusive mass transport. The fabrication in this case began with doped arrays of Si nanoribbons defined using procedures described in previous sections. Here, however, the buried oxide was only partially removed from beneath the Si NRs, although completely removed in the intervening regions. Next, patterning a layer of photoresist (AZ 5214) formed structures (i.e. anchor bars; 10 µm×50 µm, 1.5 µm thick) that tethered the Si NRs to their lithographically defined locations during a second etching step to complete the removal of the buried oxide. Next, the arrays of Si NRs were transfer printed onto a separate silicon substrate coated with a layer of silk. Evaporation of MgO (150 nm) on selected areas through a polyimide shadow mask defined gate dielectrics and adhesion promoting layers. Finally, source, drain, and gate electrodes (Ti/Mg, 5/200 nm) were defined by a similar procedure, to complete the devices.

Dissolution Test of Silicon

A series of dissolution tests of Si NMs were performed to study the detailed kinetics of the process. The test structures for this purpose were arrays of NMs in 3×3 µm square geometries, formed on SOI wafers by photolithography and RIE. Thicknesses of 35 nm, 70 nm, and 100 nm were investigated. The samples were placed into 50 mL of 1.0 M phosphate buffered saline (PBS, pH 7.4, Sigma-Aldrich, USA) at either room temperature or temperatures close to those of the human body (37° C.). The samples were removed from the PBS solution every two days to measure the height of Si NMs by atomic force microscopy (AFM, Asylum Research MFP-3D, USA). The PBS solution was replaced every other day.

High Resolution Stencil Masks

The sensitivity of silk to solvents and processes typically used in photolithography motivated the use of high resolution shadow masking techniques for patterning metals and dielectrics. The required stencil masks were made from uniform polyimide (PI) films (12.5 µm, Kapton, Dupont, USA), with openings etched in desired geometries. The fabrication process began with attachment of such a film onto a glass slide coated with 10:1 poly(dimethylsiloxane) (monomer:catalyst, by weight) (PDMS, Sylgard 184, Dow Corning, USA). A metal layer (Cr/Au, 10/150 nm) was deposited by electron beam evaporation, patterned using photolithography and etched with wet etchant. The metal served as a hard mask during dry etching through the PI films by RIE with oxygen (O$_2$) gas. After etching, the metal mask was removed by wet etching, and the patterned PI films were carefully peeled away to form high resolution stencil masks.

Encapsulation

Several different encapsulation layers were used to control the dissolution rate. Test structures used to study this process involved traces of Mg (300 nm) on glass slides. Parts of the traces were coated with various encapsulating materials: MgO (400 nm or 800 nm), silk, PLGA (poly (lactic-co-glycolic acid) 85:15, Mw 50,000-70,000, Sigma-Aldrich, USA) or collagen film (Devro, USA). For silk encapsulation, several cycles of coating and treatment were repeated: dipping the samples into a silk solution, drying at 65° C., treating with methanol to increase beta sheet content and then drying. Multiple coating and subsequent methanol treatments were used to increase the total thickness of the silk films. PLGA was coated by placing PDMS enclosed around the area to be coated and the internal volume was filled with a PLGA solution. The solution was allowed to evaporate, leaving only PLGA as an encapsulating layer. Collagen films were attached to glass edges using a concentrated solution of PLGA, which was then allowed to dry, leaving a solid but flexible, adhesive layer between the collagen and glass. The results are shown in FIG. 13.

Studies of Transience and Tunability of Transience at the Device Level

In addition to the dissolution rate of transient materials, the behavior at the device level was studied and strategies to control the transience were demonstrated. In particular, several different transient devices were first constructed, including n-channel MOSFETs, silicon diodes, logic gates (NAND) and Mg resistors. The fabrication, except for the Mg resistors, started with high temperature doping processes for the Si NMs (300 nm thick), as described in previous sections. Transfer printed Si NMs of this type served as the semiconductor layers. Layers of SiO$_2$ (100 nm thick) deposited by PECVD served as the gate dielectrics for the individual MOSFETs and those that were used in the NAND gates. Similar layers, but with 400 nm thickness, provided interlayer dielectrics. The electrodes consisted of Mg (300 or 400 nm thick) deposited by electron beam evaporation. The device layouts appear in FIG. 24.

Figure 26:
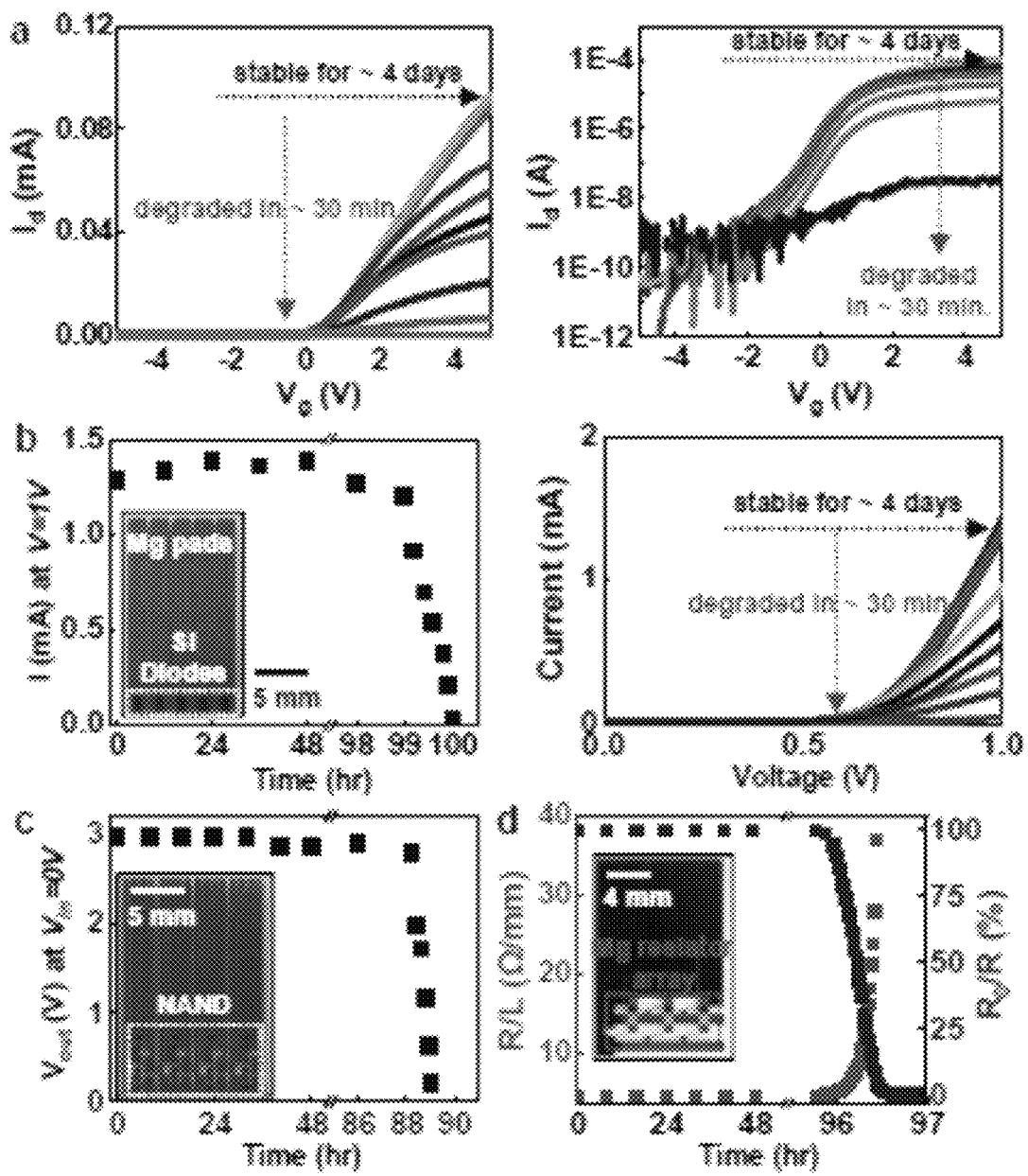

Encapsulation layers of MgO (400 nm thick) and crystallized silk (approximately 70 µm thick) provided transient barriers to water. In all device cases, system configurations allowed continuous probing of electrical properties through remotely located electrode pads that connected to the devices, submerged in water contained in a removable well made of PDMS, as in FIG. 25. The results, summarized in FIG. 26, show kinetics with two distinct timescales: the first, and longest, corresponds to transience in the encapsulation layers; the second is due to the dissolution of active layers in the devices, where disappearance of Mg occurs first. These behaviors illustrate transience at the device level. The outcomes also demonstrate the ability to define transience times with materials (i.e. encapsulation layers) that do not play active roles in device operation. In this manner, transience time can be engineered in a manner that is independent of electrical function.

In Vivo Studies of Transience in an Implantable RF Metamaterial Antenna

To study transience in vivo, a metamaterial antenna was built with overall dimensions ~1.35 cm×1.35 cm (made of 400 nm Mg and coated with 600 nm MgO as the protection layer), with a designed resonant frequency at ~1.8 GHz, on an untreated/water-dissolvable silk film (~50 µm thick) encapsulated in a pocket-like container (of ~2 cm×2 cm big and ~100 µm thick on each side) of silk treated to be water insoluble and sealed along the edges via hot embossing using a few silk drops as an adhesive. Upon implantation under the skin of a female albino Sprague-Dawley rat, this construction prevents direct contact between the device and the surrounding tissues. Transience in this case is defined mainly by diffusion of bio-fluids through edges of the silk pocket. The antenna was examined by measuring the resonant responses with a network analyzer (HP 8753D) before and after the encapsulation process and prior to implantation. In vivo responses were recorded on day 0 (right after the implantation), day 4, day 8 and day 15 (when the resonance of the antenna was barely detectable), as shown in FIG. 6c. The device was retrieved thereafter, showing resorption into the tissue matrix with signs of faint and disconnected Mg traces.

Figure 27:
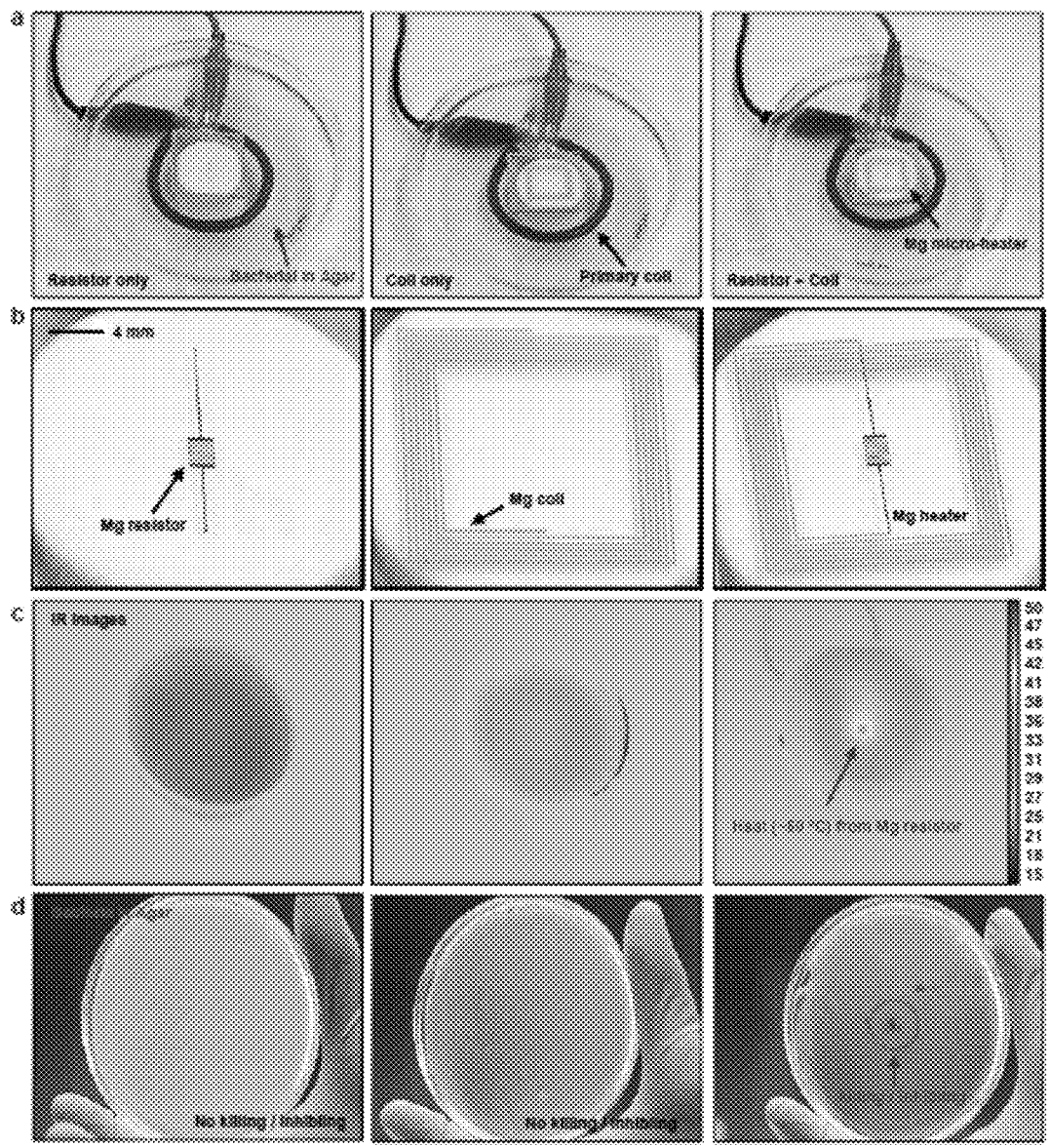

In Vitro Tests of Bacterial Inhibition Provided by a Transient, Wireless Thermal Therapy Device The devices were placed beneath a ~3 mm thick agar plate loaded with *Escherichia coli* bacteria (ATCC 25922, American Type Culture Collection, Manassas Va.). The bacteria was reconstituted and expanded according to the provided instructions, and the liquid cultures were grown for 18-24 hours to an optical density ($OD_{600}$) of 0.8 (corresponding to a viable count of ~$10^7$ CFU/mL). Three different device structures were separately examined. The first two were controls, and consisted of Mg resistors and Mg RF inductive coils, both in isolation. The third was the fully functional device (i.e. Mg resistor connected to a Mg RF inductive coil). In all three cases, wireless power was applied at 80 MHz by an external RF supply with a separately located primary coil (1 turn, diameter=5 cm, 12 AWG), at an input of ~33 dBm (i.e. 2 watts). The temperature profile of the bacterial-loaded agar plate was monitored in real time using a thermal camera (FLIR SC645, FLIR Inc.). The images showed negligible heating in the cases of the control samples, and heating to ~50° C. in the center of the plate (corresponding to the heater position) for the functional device. After ~30 minutes of heating, the agar plates were placed in a 37° C. incubator overnight to allow lawn growth. Visual inspection showed local absence of bacteria in the heated region induced by the device, and no noticeable change for the controls. The results are shown in FIG. 27.

Models of Dissolution

Single Layer (Silicon or Magnesium) Dissolution

Figure 29:
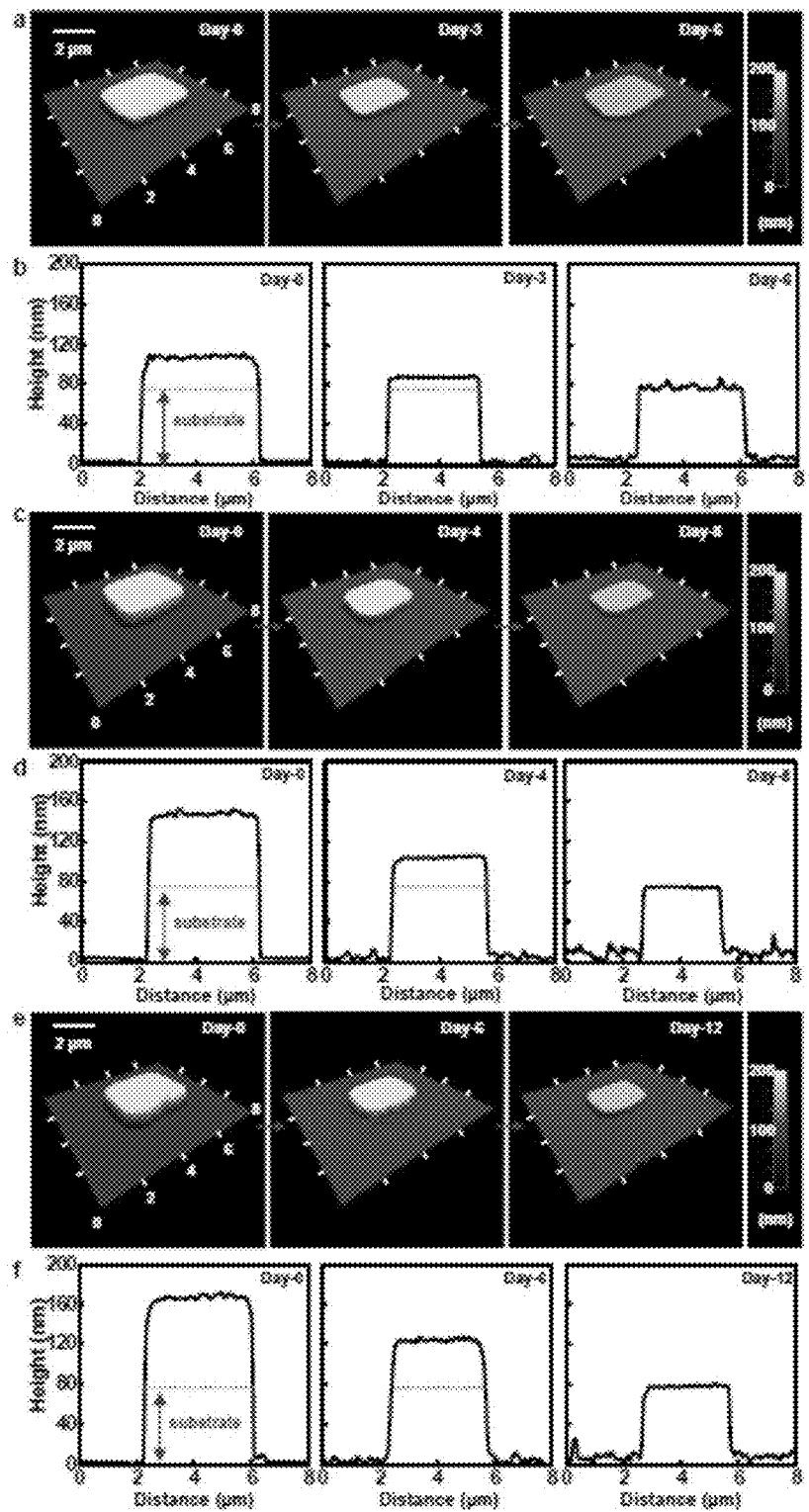

Si may have a thin layer of native $SiO_2$ (a few nanometers thick). Its effect on the dissolution of Si is accounted for via a model of double layer ($SiO_2$/Si) dissolution given in the next section. The reaction constant and diffusivity for $SiO_2$ are obtained from the experiments for PE-CVD $SiO_2$ shown in FIG. 9 as k=$1.5 \times 10^{-6}$ $s^{-1}$, D=$1.0 \times 10^{-16}$ $cm^2/s$ at room temperature (FIG. 9b) and k=$3.0 \times 10^{-6}$ $s^{-1}$ and D=$2.0 \times 10^{-16}$ $cm^2/s$ at body temperature (FIG. 9c)$^{1-3}$. The related AFM study is shown in FIG. 29. The results (e.g., the critical time for complete dissolution of Si) given by the model of double layer dissolution are the same as that without the thin $SiO_2$ layer. This suggests that the effect of a thin $SiO_2$ layer is negligible.

The boundary conditions (FIG. 28a) for the reactive diffusion Equation (1) are constant water concentration $w|_{y=h_0}=w_0$ at the water/Si interface and zero water flux $\partial w/\partial y|_{y=0}=0$ at the bottom surface of Si. The initial condition is zero water concentration $w|_{t=0}=0$ ($0 \le y < h_0$). The solution was obtained by the method of separation of variables as $$w(y,t) = w_0 \left\{ \frac{\cosh\frac{ky^2}{D}}{\cosh\frac{kh_0^2}{D}} + \right. \tag{S1}$$

-continued $$\left. 2\sum_{n=1}^{\infty} \frac{(-1)^n \left(n-\frac{1}{2}\right)\pi}{\frac{kh_0^2}{D} + \left(n-\frac{1}{2}\right)^2 \pi^2} e^{-\frac{Dt}{h_0^2}\left[\frac{kh_0^2}{D}+\left(n-\frac{1}{2}\right)^2\pi^2\right]} \cos\left[\left(n-\frac{1}{2}\right)\pi\frac{y}{h_0}\right] \right\}.$$

Its product with the reaction constant k gives the mass of water in Si (per unit volume), which in turn gives the mass of dissolved Si (per unit volume) to be [kwM(Si)]/[4M($H_2O$)] since four water molecules react with one Si atom. Its integration over both the thickness direction y and time t gives the net Si during dissolution as $$\frac{h}{h_0} = f\left(\frac{Dt}{h_0^2}, \frac{kh_0^2}{D}, \frac{w_0}{\rho_{Si}}\right) = 1 - \frac{w_0 M(Si)}{4\rho_{Si}M(H_2O)} \frac{kh_0^2}{D} \tag{S2}$$

$$\left[\frac{Dt}{h_0^2} \cdot \frac{\tanh\sqrt{\frac{kh_0^2}{D}}}{\sqrt{\frac{kh_0^2}{D}}} - 2\sum_{n=1}^{\infty} \frac{1-e^{-\frac{Dt}{h_0^2}\left[\frac{kh_0^2}{D}+\left(n-\frac{1}{2}\right)^2\pi^2\right]}}{\left[\frac{kh_0^2}{D}+\left(n-\frac{1}{2}\right)^2\pi^2\right]^2}\right].$$

For k and D in the present study, the summation on the left hand side of the above equation is negligible, which leads to Eq. (1).

Equation (1) is modified for Mg since two water molecules react with one

Mg atom, 
$$\frac{h}{h_0} = 1 - \frac{w_0 M(Mg)}{2\rho_{Mg}M(H_2O)} \frac{kh_0^2}{D} \tag{S3}$$

$$\left[\frac{Dt}{h_0^2} \cdot \frac{\tanh\sqrt{\frac{kh_0^2}{D}}}{\sqrt{\frac{kh_0^2}{D}}} - 2\sum_{n=1}^{\infty} \frac{1-e^{-\frac{Dt}{h_0^2}\left[\frac{kh_0^2}{D}+\left(n-\frac{1}{2}\right)^2\pi^2\right]}}{\left[\frac{kh_0^2}{D}+\left(n-\frac{1}{2}\right)^2\pi^2\right]^2}\right],$$

where $\rho_{Mg}$=1.738 g·$cm^{-3}$ is the mass density of Mg. For Mg initial thickness $h_0$=300 nm and initial resistance (per unit length) $R_0$=1.06 Ω/mm, the resistance (per unit length) R=$R_0(h/h_0)^{-1}$ in FIG. 4e agrees well with the experiments for the reaction constant k=$1.2 \times 10^{-3}$ $s^{-1}$ and diffusivity D=$6.0 \times 10^{-12}$ $cm^2/s$. Here k and D for Mg are much larger than those for Si because the water-Mg reaction is much faster (hours to dissolve Mg versus weeks to dissolve Si). Equation (2) gives the critical time for the complete dissolution of Mg $t_c$=38.4 min, which agrees well with 40 min for open circuit in experiments.

Double Layer (MgO/Mg) Dissolution

The local coordinate systems for the Mg and MgO layers, denoted by subscripts 1 and 2, respectively, are shown in FIG. 28b. For Mg, the reactive diffusion equation with zero water flux condition at the bottom surface and initial condition are $$\begin{cases} D_1 \frac{\partial^2 w_1}{\partial y_1^2} - k_1 w_1 = \frac{\partial w_1}{\partial t} & (0 \le y_1 \le h_1) \\ \frac{\partial w_1}{\partial y_1}\bigg|_{y_1=0} = 0 \\ w_1|_{t=0} = 0 & (0 \le y_1 \le h_1). \end{cases} \tag{S4}$$

For MgO, the governing equation with constant water concentration at the water/MgO interface and initial condition are $$\begin{cases} D_2 \dfrac{\partial^2 w_2}{\partial y_2^2} - k_2 w_2 = \dfrac{\partial w_2}{\partial t} & (0 \le y_2 \le h_2) \\ w_2 |_{y_2=0} = w_0 \\ w_2 |_{t=0} = 0 & (0 \le y_2 \le h_2). \end{cases} \quad (S5)$$

The continuity of the concentration and flux of water molecules across the MgO/Mg interface requires $$w_1 |_{y_1=h_1} = w_2 |_{y_2=h_2}$$

and $$D_1 \dfrac{\partial w_1}{\partial y_1}\bigg|_{y_1=h_1} = -D_2 \dfrac{\partial w_2}{\partial y_2}\bigg|_{y_2=h_2}.$$

The solution of Eqs. (S4) and (S5) is obtained by the method of separation of variables as $$w_1 = w_0 \left( E \cosh\sqrt{\dfrac{k_1 y_1^2}{D_1}} + \sum_{n=1}^{\infty} C_n e^{-\lambda_n t} \sin\sqrt{\dfrac{\lambda_n - k_2}{D_2} h_2^2} \cos\sqrt{\dfrac{\lambda_n - k_1}{D_1} y_1^2} \right) \quad (S6)$$

$$(0 \le y_1 \le h_1)$$

$$w_2 = w_0 \left( F \sinh\sqrt{\dfrac{k_2 y_2^2}{D_2}} + \cosh\sqrt{\dfrac{k_2 y_2^2}{D_2}} + \sum_{n=1}^{\infty} C_n e^{-\lambda_n t} \cos\sqrt{\dfrac{\lambda_n - k_1}{D_1} h_1^2} \sin\sqrt{\dfrac{\lambda_n - k_2}{D_2} y_2^2} \right)$$

$$(0 \le y_2 \le h_2),$$

where the constants E and F are given by $$E = \dfrac{1}{\sqrt{\dfrac{D_1 k_1}{D_2 k_2}} \sinh\sqrt{\dfrac{k_1 h_1^2}{D_1}} \sinh\sqrt{\dfrac{k_2 h_2^2}{D_2}} + \cosh\sqrt{\dfrac{k_1 h_1^2}{D_1}} \cosh\sqrt{\dfrac{k_2 h_2^2}{D_2}}}, \quad (S7)$$

$$F = \dfrac{\sqrt{\dfrac{D_1 k_1}{D_2 k_2}} \left[ \tanh\sqrt{\dfrac{k_1 h_1^2}{D_1}} + \tanh\sqrt{\dfrac{k_2 h_2^2}{D_2}} \right]}{\sqrt{\dfrac{D_1 k_1}{D_2 k_2}} \tanh\sqrt{\dfrac{k_1 h_1^2}{D_1}} \tanh\sqrt{\dfrac{k_2 h_2^2}{D_2}} + 1}$$

the eigenvalue $\lambda_n$ (n=1, 2, 3, . . . ) is determined from the following equation $$\tan\sqrt{\dfrac{\lambda - k_1}{D_1} h_1^2} \tan\sqrt{\dfrac{\lambda - k_2}{D_2} h_2^2} = \sqrt{\dfrac{D_2}{D_1} \dfrac{\lambda - k_2}{\lambda - k_1}}, \quad (S8)$$

and $C_n$ is given by $$C_n = \dfrac{-\dfrac{2}{\lambda_n}\sqrt{(\lambda_n - k_2)D_2}\cos\sqrt{\dfrac{\lambda_n - k_1}{D_1} h_1^2}}{h_1 \sin^2\sqrt{\dfrac{\lambda_n - k_2}{D_2} h_2^2}\left[1 + \dfrac{\sin\left(2\sqrt{\dfrac{\lambda_n - k_1}{D_1} h_1^2}\right)}{2\sqrt{\dfrac{\lambda_n - k_1}{D_1} h_1^2}}\right] + h_2 \cos^2\sqrt{\dfrac{\lambda_n - k_1}{D_1} h_1^2}\left[1 - \dfrac{\sin\left(2\sqrt{\dfrac{\lambda_n - k_2}{D_2} h_2^2}\right)}{2\sqrt{\dfrac{\lambda_n - k_2}{D_2} h_2^2}}\right]}. \quad (S9)$$

The resistance R is given analytically by $$R = \dfrac{R_0}{1 - \dfrac{k_1 w_0 M(\text{Mg})}{2\rho_{Mg} M(H_2O)} \left[ \dfrac{\sin\sqrt{\dfrac{k_1 h_1^2}{D_1}}}{\sqrt{\dfrac{k_1 h_1^2}{D_1}}} Et + \sum_{n=1}^{\infty} \dfrac{C_n}{\lambda_n}(1 - e^{-\lambda_n t}) \dfrac{\sin\sqrt{\dfrac{\lambda_n - k_1}{D_1}}}{\sqrt{\dfrac{\lambda_n - k_1}{D_1} h_1^2}} \sin\sqrt{\dfrac{\lambda_n - k_2}{D_2} h_2^2} \right]}. \quad (S10)$$

The above resistance (per unit length) agrees well with experiments for the thickness of MgO encapsulation of 400/800 nm, which has the initial resistance (per unit length) of 1.04/1.15 Ω/mm, respectively. The reaction constant and diffusivity for MgO are $k_2$=5.0×10$^{-4}$ s$^{-1}$ and $D_2$=4.9×10$^{-13}$ cm$^2$/s, while the values for Mg have been determined in FIG. 4e as $k_1$=1.2×10$^{-3}$ s$^{-1}$ and $D_1$=6.0×10$^{-12}$ cm$^2$/s.

The critical time $t_c$ for open circuit is reached when the resistance in Eq. (S10) approaches infinity, which gives $$\dfrac{\sinh\sqrt{\dfrac{k_1 h_1^2}{D_1}}}{\sqrt{\dfrac{k_1 h_1^2}{D_1}}} Et_c + \sum_{n=1}^{\infty} \dfrac{C_n}{\lambda_n}(1 - e^{-\lambda_n t_c}) \sin\sqrt{\dfrac{\lambda_n - k_2}{D_2} h_2^2} \dfrac{\sin\sqrt{\dfrac{\lambda_n - k_1}{D_1} h_1^2}}{\sqrt{\dfrac{\lambda_n - k_1}{D_1} h_1^2}} = \dfrac{2\rho_{Mg} M(H_2O)}{k_1 w_0 M(\text{Mg})}. \quad (S11)$$

For reaction constants and diffusivities in the present study, the summation on the left hand side of the above equation is negligible, which leads to $$t_c = \frac{2\rho_{Mg} M(H_2O)}{k_1 w_0 EM(Mg)} \frac{\sqrt{\frac{k_1 h_1^2}{D_1}}}{\sinh\sqrt{\frac{k_1 h_1^2}{D_1}}}. \tag{S12}$$

It gives the critical time of 3.5 and 13 hours for the thickness of MgO encapsulation of 400 and 800 nm, respectively, which agrees reasonably well with experiments in FIG. 4e.

Silk overcoats provide a barrier for water to diffuse into MgO/Mg layers, and the effective diffusion is controlled by the percentage $\phi$ of the maximum crystallinity $c_{max}$ that can be achieved in the silk. The crystallinity of silk is then obtained as $c=\phi \times c_{max}$. The boundary condition of constant concentration at the water/MgO interface $w_2|_{y_2=0}=w_0$ in Eq. (S5) is replaced by $w_2|_{y_2=0}=w_0(1-\phi)$. The resistance then obtained for two silk overcoats agrees well with experiments for $\phi$ of 45.0% and 89.8%, respectively, as shown in FIG. 4e.

Models of Dissolution with Time-Dependent Reaction Rate Constants

In many cases, the reaction constants for the net reactions can decrease as time elapses. When this reaction constant takes a general form of k(t), the solution of equation of reactive diffusion is obtained as $$\frac{w}{w_0} = \frac{\cosh\left[\frac{y}{h_0}\sqrt{\frac{k(t)h_0^2}{D}}\right]}{\cosh\sqrt{\frac{k(t)h_0^2}{D}}} + \tag{S13}$$

$$\sum_{n=1}^{\infty} \frac{2(-1)^n}{\left(n-\frac{1}{2}\right)\pi} \left\{ e^{-\int_0^t \chi_n(\tau)d\tau} \left[1 + \int_0^t k(\eta) e^{\int_0^\eta \chi_n(\tau)d\tau} d\eta\right] - \frac{k(t)}{\chi_n(t)} \right\}$$

$$\cos\left[\left(n-\frac{1}{2}\right)\pi\frac{y}{h_0}\right],$$

where $\chi_n(t)=k(t)+(2n-1)^2\pi^2 D/(4h_0^2)$. For small $k(t)h_0^2/D$, as in experiments, the above solution can be simplified to $$\frac{w}{w_0} \approx 1 + \frac{1}{2}\frac{k(t)h_0^2}{D}\left(\frac{y^2}{h_0^2} - 1\right). \tag{S14}$$

Similar to Eq. (S2), the thickness of a Si NM can be obtained as $$\frac{h}{h_0} = 1 - \alpha \int_0^t \left[k(t) - \frac{1}{3}\frac{k^2(t)h_0^2}{D}\right] dt. \tag{S15}$$

For the reaction constant to be exponential decay as $k(t)=k_0 e^{-t/\tau}$ leads to the normalized thickness of Si NM $$\frac{h}{h_0} = 1 - \alpha \tau k_0 \left[1 - \frac{k_0 h_0^2}{6D} - e^{-t/\tau} + \frac{k_0 h_0^2}{6D} e^{-2t/\tau}\right]. \tag{S16}$$

For $k_0=7.9\times10^{-6}$ s$^{-1}$ and $\tau=23$ day, FIG. 30 shows a good agreement between predictions from Eq. (S16) and experimental measurements. Compared to the reaction constant k of $5.0\times10^{-6}$ s$^{-1}$ chosen to be independent of the time, the parameters of k(t) are reasonable because k is between the initial reaction constant $k_0$ and the reaction constant of $3.3\times10^{-6}$ s$^{-1}$ at day 20.

Models for In Vivo Transience of an Implantable RF Metamaterial Antenna

The Q factor is related to the inductive reactance $X_L$ and resistance $R_L$ of inductors by $Q=X_L/R_L$. Neglecting small changes in $X_L$, the Q factor normalized by its initial value can be readily obtained from the thickness of the inductors and the model of double layer dissolution, with crystallinity of $97.0 c_{max}\%$.

REFERENCES

[1] Tomozawa, M. & Davis, K. M. Time dependent diffusion coefficient of water into silica glass at low temperatures. *Mater. Sci. Eng. A* 272, 114-119 (1999).
[2] Rimstidt, J. D. & Barnes, H. L. The kinetics of silica-water reactions. *Geochim. Cosmochim. Ac.* 44, 1683-1699 (1980).
[3] Morita, M., Ohmi, T., Hasegawa, E., Kawakami, M. & Ohwada, M. Growth of native oxide on a silicon surface. *J. Appl. Phys.* 68, 1272-1281 (1990).

Example 3

Recent work by the inventors establishes a new, silicon-based electronics technology that can, in a controlled manner, gradually vanish over time[1]. Devices that are 'transient' in this sense create application possibilities that cannot be addressed with conventional electronics, such as active implants that exist for medically useful timeframes, but then completely dissolve and disappear via resorption by the body, or field-deployable beacons that disappear to avoid recovery. The inventors have demonstrated a set of materials, components, theoretical design tools and manufacturing approaches for a complementary metal oxide semiconductor (CMOS) electronics of this type, together with different classes of sensors and actuators, options for power supply and a wireless control strategy. A transient silicon device capable of delivering thermal therapy in an implantable mode to address challenges in surgical site infections caused by antibiotic-resistant bacteria and its demonstration in animal models illustrate a system-level example of this technology [1]. Fully transient RF scavenging devices, and partially transient radio transmitters prove the ability to realize basic building blocks of relevance to many military applications [2].

Figure 31:
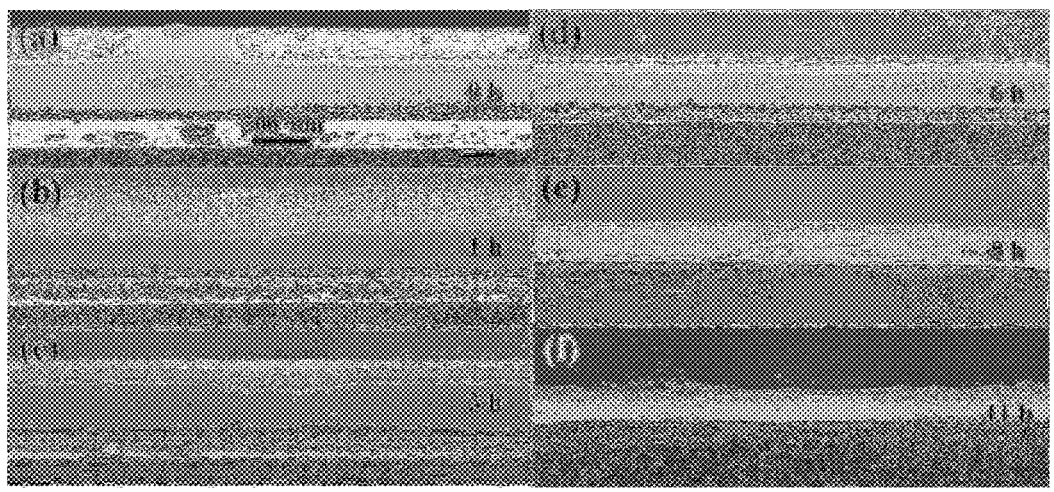

The transient electronics technology base described above lacks two critical capabilities: (1) routes to piezoelectric and optoelectronic components, and (2) low power schemes for programmed, or 'triggered', transience. The present devices address these two issues. For the first, ZnO is used as a water soluble semiconductor, in which hydrolysis affects transience. The large, direct bandgap and strong piezoelectric response of ZnO make it a useful complement to Si, for applications in mechanical energy harvesters, light emitting diodes and transparent conductors. Previous studies demonstrate that ZnO is water soluble [3,4] and biocompatible [5], and that it can be used in a variety of semiconductor devices. FIG. 31 shows scanning electron micrographs of a ZnO nanorod collected at various times during water dissolution [adapted from 3]. The present example focuses on integration of ZnO with other water-soluble materials (e.g. Mg, MgO, Si, SiO$_2$, silk) to yield components that are fully transient.

Two components are pursued. The first is a thin film transistor (TFT). Past work has demonstrated transparent TFTs, using ZnO deposited in one of three ways: molecular beam epitaxy, sputtering, and sol-gel/solution methods. The electrical and semiconducting properties of ZnO (mobility, resistivity, carrier concentration etc.) depend on the microstructure, especially grain size [6]. Grain size can be engineered by deposition at an elevated temperature [7], through grain growth during an annealing process [8,9], or by adjusting sputtering pressure [10,11]. The annealing process can also aid in dopant activation [12]. Electrical properties can also be adjusted by adding $O_2$ during sputtering [13], though TFTs can still be fabricated by sputtering in Ar only.

Flexible ZnO TFTs can be formed on plastic substrates by sputtering at room temperature followed by low temperature annealing, or no annealing at all [14,15]. Both top gate and bottom gate TFTs of this type are possible, although latter designs are more common [13]. Exploiting this layout provides a highly doped, transfer printed silicon nanomembrane as the gate electrode, and a layer of $SiO_2$ deposited by PECVD as the gate dielectric. Low temperature sputtering of ZnO without annealing forms the channel, and Mg source and drain electrodes are deposited using methods developed for transient silicon devices. Typical etching methods for patterning ZnO are incompatible with silk, but two strategies avoid this constraint: (1) all additive processing, directly on silk, using precision shadow masks, and (2) complete fabrication on silicon substrates, in releasable formats that are compatible with transfer printing to silk, as a final step.

Electrical properties are measured before and during transience due to immersion in water. The properties of ZnO TFTs reported in the literature vary widely. On/off ratios are generally between $10^3$ and $10^5$. Device mobilities are highly dependent on microstructure, channel geometry, and processing conditions. Reported values lie between 0.02 $cm^2$/(Vs) and 4 $cm^2$/(Vs). Because development of transient ZnO devices involves many new challenges, targets for performance of the present devices lie between bounding values reported for non-transient versions: $10^3$ for on/off ratio and 0.1 $cm^2$/(Vs) for mobility.

The second class of device described here is a mechanical energy harvesting component that exploits previous work on ZnO as an environmentally friendly alternative to PZT. Strain sensors and energy harvesting devices based on ZnO often use nanostructures (i.e. nanowires) to achieve improved integration with flexible substrates [16]. The present techniques for realizing similar mechanics with thin films offer more scalable routes to high performance, with reduced complexity and improved compatibility with established thin film device architectures and processing approaches.

ZnO films have been used as pressure sensors on PI [17] and as cantilevered microgenerators on PET [18]. The microgenerator involves a ZnO layer between two metal contacts, which in the present case are formed using Mg. Targets for performance include open circuit voltages of −1 V and total output powers of 0.250N, consistent with ranges for ZnO thin film devices in non-transient forms reported in the literature. As with the TFTs, device characteristics are measured and the transient behaviors explored.

For triggered transience in these and other systems, the inventors explore two different schemes (1) electrically or optically induced thermocapillary effects which, when implemented at the nanoscale, provide a low power means to induce flows in thin films, and (2) enzymatically induced degradation of silk. In the first approach, the temperature dependence in the surface tension and wetting characteristics lead to mass transport at rates and along directions defined by temperature gradients (rather than changes in temperature). Such phenomena have been used previously to move liquid droplets on surfaces, in a programmed manner in which thermal gradients as small as a few degrees per millimeter are sufficient [19].

Recent work by the inventors shows that this same physics can enable meaningful flows in thin films of molecular glasses, at temperature gradients of a few degrees per micron. FIG. 32 shows atomic force micrographs of selective, thermocapillary flows in a thin film of a molecular glass ($Mg_2OH$) on an array of carbon nanotubes. Selective Joule heating in the metallic tubes induces thermocapillary flows in the overlying glass, at low temperatures with gradients of a few degrees per micron. In strategic layouts, implemented with narrow electrodes that provide local Joule heating, such flows can be designed to induce electrical openings in conducting traces. The result can alter or eliminate function in an integrated circuit, for example. Alternatively, these flows can expose underlying materials to a surrounding environment that affects transience in the overall system.

The fundamental mechanisms of this process are important to establishing a clear engineering design approach for its use in triggered transience. FIG. 33 shows a schematic diagram of an initial model that can capture the essential physics. Here, local heating of a film reduces the surface tension γ which for most materials is linear with respect to the local temperature T. The non-uniform temperature produces a thermocapillary shear stress τ proportional to the gradient of surface tension, which pulls liquid or viscous solid toward regions of cooler surface temperature. The governing equation derived from the Navier-Stokes equation is $$\frac{\partial h}{\partial t} + \frac{\partial}{\partial x}\left[\frac{\tau h^2}{2\mu} + \frac{h^3}{3\mu}\frac{\partial}{\partial x}(\gamma \nabla^2 h)\right] = 0,$$

where h(x,y,t) is the position and temperature dependent thickness of liquid or viscous film, t is time, and μ is the shear viscosity. This equation, together with the appropriate initial and boundary conditions, can be solved numerically to determine the time-dependent film thickness, which is critical to the triggered transience. An analytical solution will also be established for the long-time behavior, which can provide scaling laws, useful for engineering design. For example, it can be shown that the heat power $Q_0$, thermal conductivity $k_f$ and initial thickness $H_f$ of the film, ambient temperature $T_0$, and coefficients $\gamma_0$ and $\gamma_1$ in surface tension ($\gamma = \gamma_0 + \gamma_1 T$) appear in a single combination $$\frac{Q_0}{k_f H_f (\gamma_0/\gamma_1 + T_0)}$$

to control the process.

In additional to Joule heating, optically induced heating in silk doped with gold nanoparticles is explored, in forms ranging from conformal coatings [20] to bulk films [21] to 3D photonic crystals [22]. In these materials, plasmonic-resonances enhance the absorption of light, in ways that can affect the bulk material (through heat-induced modification of the silk crystalline matrix) and the interfaces between doped silk substrates and devices. The latter provides a route to triggering device disintegration with light. Heat localization can be obtained by selective doping of different areas or different layer(s) and/or focusing of incident light.

Selection of Dopants:

Both semiconductors (such as CdSe and CdTe) and metals (such as Au and Ag) are candidates for dopants. Metals with strong plasmonic resonances are preferred. Gold is widely used for photo-thermal applications and is a good choice for implantation applications due to its biocompatibility. Silver nanoparticles, however, generate much more heat (10 times higher) than gold nanoparticles due to stronger plasmon resonances, and therefore might be a good option for non-implantable applications (for example, skin mounted devices).

Shape and Wavelength:

Solid spherical nanoparticles (NPs) show plasmon resonances, for Ag—NPs and Au—NPs, that lie at ~400 nm and 530 nm, respectively, for representative sizes, with wavelengths that shift with size in predictable ways. For example, for implantable applications, it is possible to shift the plasmon resonance to the red (650-900 nm), to take advantage of the low tissue absorption and the associated improved penetration.

For non-implantable applications, either Ag— or Au— NPs can be used to remotely generate heat with blue or green light. The generated heat Q, and local temperature increase $\Delta T$ can be analytically calculated by the following equations:

$$Q = \frac{\omega}{8\pi} E_0^2 \left| \frac{3\varepsilon_0}{2\varepsilon_0 + \varepsilon_{NP}} \right|^2 \operatorname{Im}(\varepsilon_{NP}) \quad (1)$$

where $E_0$ is the amplitude of the incident radiation, and $\varepsilon_{NP}$ and $\varepsilon_0$ are the dielectric constants of the NP and surrounding medium, respectively.

$$\Delta T(r) = \frac{V_{NP} Q}{4\pi k_0 r} \quad (2)$$

where r is the distance from the center of a NP, $k_0$ is the thermal conductivity of the surrounding medium, and $V_{NP}$ is the NP volume.

By combining (1) and (2), it is possible to show that the maximum temperature increase is given by (occurs at $r=R_{NP}$, surface of the NP):

$$\Delta T_{max}(I_0) = \frac{R_{NP}^2}{3k_0} \frac{\omega}{8\pi} \left| \frac{3\varepsilon_0}{2\varepsilon_0 + \varepsilon_{NP}} \right|^2 \operatorname{Im}(\varepsilon_{NP}) \frac{8\pi \cdot I_0}{c\sqrt{\varepsilon_0}} \quad (3)$$

where $I_0$ is the light intensity, and the temperature increase is proportional to the second power of the NP radius, i.e. $\Delta T_{max} \propto R_{NP}^2$, when the NP radius is much smaller than the incident wavelength. For instance, a portable laser pointer with an output power of 15 mW at ~532 nm and a spot size of ~1 mm (without focusing) corresponds to a light flux of $I_0=1.91$ W/cm$^2$.

TABLE 1

Estimated values for generated power and temperature increase with some commercial Au NPs in aqueous media.

| Particle size (nm) | Concentration (particles per mL) | Molar Particle Concentration (nM) | Temperature Increase (° C.) |
|---|---|---|---|
| 5 | $5 \times 10^{13}$ | 83.3 | 62.18 |
| 10 | $5.7 \times 10^{12}$ | 9.5 | 28.36 |
| 15.2★ | $1.4 \times 10^{12}$ | 2.3 | 15.67 |
| 20.3 | $7 \times 10^{11}$ | 1.15 | 13.93 |
| 30.7 | $2 \times 10^{11}$ | 0.33 | 8.96 |
| 40.3 | $9 \times 10^{10}$ | 0.15 | 7.16 |
| 59.4 | $2.6 \times 10^{10}$ | 0.043 | 4.66 |
| 100 | $5.6 \times 10^{9}$ | 0.0093 | 2.79 |

★Au-NPs produced and used for Au-NPs doped silk experiments.

The most straightforward way to transience via silk is to physically alter the silk film on which the electronic/metal components are built. Based on previous work on laser machining/cutting of silk, the required temperatures are ~200° C. The inventors successfully machined a silk+AuNP film with a focused laser pointer with an output of 10 mW. With thermocapillary effects, it is possible to alter dissolvable materials such as Mg, MgO, Si, SiO2 with temperature increases of just a few degrees. These values can be achieved assuming a NP doped silk device ($7 \times 10^{12}$ particles per mL, concentrated from $1.4 \times 10^{12}$ particles per mL, with a diameter of ~15 nm by centrifuge) and a laser pointer of ~50 mW (beam diameter: ~1 mm), which corresponds to a light flux of 6.4 W/cm$^2$. Ignoring beam divergence, the local temperature increase is estimated to be ~200° C., which should be sufficient to break down the device. Besides altering the NP concentration, silk films could be imprinted with microlens arrays to increase the fluence and accelerate transience. Triggering degradation from a standoff position by illuminating with a laser at a distance might also be possible. FIG. 34 shows, from left-to-right, absorption spectra in Au—NP silk solutions and images of bulk samples for different AuNP concentrations, a thermal image of a AuNP-silk film (2 m thick) spin-cast on a glass slide when illuminated by a green (532 nm) laser pointer, and a corresponding measured thermal profile (data acquired with a FLIR SC-600 thermal imager).

In addition to thermal mechanisms, biological modifications to trigger transience are explored. Specifically, modifications of silk to induce rapid loss of silk material integrity, upon exposure to (1) saliva—protease activated digestion and (2) ambient light and temperature activated digestion, and other potential mechanisms such as changes in pH, salt, electric fields, pressure are mentioned. In all cases, the schemes involve silk micro/nanoparticles, fibers, sponges, gels or other components as building blocks for functional silk materials. These pieces are surface functionalized with silk-binding peptides or with silk-elastin copolymers binding peptides that also have a linker (trigger) domain (susceptible to environmental inputs as triggers). The silk pieces coated with these 'linkers' provide the sites in the materials (weak links or susceptible links) for rapid activation, resulting in the rapid loss of the bulk material integrity. This could occur, for example, in two ways: (a) by bridging the silk pieces with trifunctional linkers that self-assemble, coat, and bridge the components (e.g, two silk binding domains for binding and to bridge the susceptible linker); or (b) by using silk-elastin block copolymers to drive transitions from environmental triggers. Certain aspects of these strategies have been shown to work, such as materials fabrication from building blocks and bifunctional linker designs. This work focuses on optimization for kinetics to control the rate of material dissolution depending on the environment inputs.

The component designs may involve complex structures formed using molding approaches such as those used in recent microneedle studies. (FIG. 35 shows microneedles in silk and an inset showing microvesicles molded into the needles to load additional drug doses.) Alternatively, particles can be generated by milling or via phase separation, sonication (energy), lipid templates and other modes. Gels can be formed via pH, electric field or related techniques. Microfibers can be generated by selective chemical digestion of native silk fibers. All of these building blocks or pieces can be considered as material substrates needed for the present transient devices.

As an approach to functionalization, silk block copolymer systems, and extensions to triblock designs (e.g., silk-linker-silk), are exploited. The bifunctional linkers promote particle-to-particle binding to hold the system together. The linker (trigger) domain in the center can include a peptide selective to salivary proteases, to promote the rapid loss of material integrity upon exposure to saliva. Diblock systems function in many formats and can be used to self-assemble coatings on silk materials, and matrix metalloproteinase (MMP) sensitive linkers have been designed into silk. In another approach, silk-elastin copolymers can be used as the linkers to provide an extended set of possible triggers. First, temperature-driven triggers—e.g., phase change of the materials from extended to contracted forms upon a change in temperature (e.g., inverse temperature transition) can be generated. An example is to control transitions based on changes in temperature. The design of these types of peptides can be extended to respond to a range of temperature, so that the material undergoes a change in structure upon reaching a critical temperature (this can be programmed to drive the transition at a temperature near freezing to a temperature near boiling) dictated by the amino acids sequence substitutions in the elastin block. Further, such designs can be extended to an array of environmental inputs that will trigger a change in material structure, from pH, salt, pressure, electric fields and others (Table 2). Since these transitions can also result in compaction of the material (e.g., reduction in size), such changes are coupled with the rapid release of sequestered digestive enzymes (e.g., triggered release of protease XIV or chymotrypsin).

TABLE 2

| Silk block $(GAGAGS)_2$ Elastin block $(GVGVP)_4(GXGVP)(GVGVP)_3$ | |
|---|---|
| X | Stimuli |
| Any amino acids except proline | Temperature, ionic strength |
| Glutamate, Lysine | pH |
| Cysteine, Methionine | Redox |
| Tyrosine, Phenylalanine & Trptophan | Pressure |
| Lysine (NMeN) | Reduction-oxidation |
| $_L$-3,4-dihydroxyphenylalanine | Adhesion |
| $_L$-p-phenylazo-phenylalanine | Light |
| RGYSLG | Phospho/dephosphorylation |

The largest challenge is accessibility of the linker sites once assembled into a bulk silk material. This feature must be determined, to control the kinetics of dissolution or compaction/release. With a range of processing controls, as well as possible additions of bulk peptides in these linker sites, this challenge can be addressed. Using these tools, modified silk solutions are prepared and silk films are generated that can be dissolved upon exposure to salivary proteases, and that are otherwise stable (undissolvable in water, for instance). FIG. 36 shows an example of printed silk doped with enzymes (HRP). Exposure to TMB causes the peroxidase to undergo a colorimetric reaction and reveal a printed pattern.

Additionally, the ability to silk inks with a commercial inkjet printer (Fuji Dimatix) has been demonstrated. Commercial inkjet printers and/or micronozzle high-resolution inkjet printing systems can be used to manufacture AuNP-silk patterns on the micro- and nanoscale. The printed patterns are illuminated and thermally monitored, suitable for interfacing to transient metals and oxides. The goal is to define micron- and sub-micron scale heating patterns that act as local trigger points for degradation upon exposure to a light source of the appropriate wavelength and appropriate power. These results serve as the technical underpinning for different types of functional transient substrates based on dopants beyond Au—NP, such as nanoshells, quantum dots, nanotubes, enzymes, functionalized/modified silks, etc.

REFERENCES

1. S.-W. Hwang et al, "A Physically Transient Form of Silicon Electronics, With Integrated Sensors, Actuators and Power Supply," submitted.
2. J. A. Rogers, F. Omenetto, Y. Huang et al, unpublished.
3. J. Zhou et al, Adv. Mater. 18, 2432-2435 (2006).
4. J. Han et al, J. Hazard. Mater. 178, 115-122 (2010).
5. Z. Li et al, J. Phys. Chem. C 112, 20114-20117 (2008).
6. Hwang, B-I. et al, Appl. Phys. Lett. 93, 222104 (2008)
7. Hao, X-T. et al, Mater. Sci. Eng. B. 90 50-54 (2002).
8. Hiramatsu, T. et al, Jpn. J. Appl. Phys. 46, 3319-3323 (2007).
9. Park, C. J. et al, J. Kor. Phys. Soc. 55, 1925-1930 (2009).
10. Lee, J-H. J. Electroceram. 23, 512-518 (2009).
11. Medina-Montes, M. I. et al, J. Electr. Mater. 40, 1461-1469 (2011).
12. Cheng, Y-C. Appl. Surf. Sci. 258, 604-607 (2011).
13. Zhang, X. et al, J. Mater. Sci.: Mater. Electron. 21, 671-675 (2010).
14. Banerjee, A. N. et al, Thin Solid Films 496 112-116 (2006).
15. Jeon, H. et al, J. Kor. Phys. Soc. 51, 1999-2003 (2007).
16. Zhou, J. et al, Nano Lett. 8, 3035-3040 (2008).
17. Kuoni, A. et al, J. Micromech. Microeng. 13, S103-S107 (2003).
18. Pan, C. T. et al, Sens. Act. A: Phys. 159, 96-104 (2010).
19. A. A. Darhuber et al, Appl. Phys. Lett. 82, 657-659 (2003).
20. Hu Tao et al. "Silk thermoelectric chips", Applied Physics Letters, 97 (12), 123702, 2010
21. Hu Tao et al., "Implantable Multifunctional Biocompatible Optics," in review
22. S. Kim et al., "Silk opals", in review Example 4

Materials for Transient Electronics

Materials are clearly essential components of a degradable electronics technology, as are degradation times that span a desired range, e.g. between minutes to months. The individual materials as well as their collective integration into devices and circuits define the overall degradation times. For example, even though Mg films with ~0.5 mm thicknesses undergo complete hydrolysis at room temperature in a few tens of minutes, Mg traces coated with highly crystalline silk require much longer times. This example outlines materials and layer architectures that provide desired behaviors.

Transient Conductors.

Mg is used as a starting point because Mg has been used as a structural material for resorbable intravascular stents. Alloys of Mg, for which small quantities (general≤10% by weight) Al, Ag, Ca, Li, Mn, Si, Sn, Y, Zn, Zr, and rare earth elements [2] yield, mostly ternary systems. The electrical properties and the resorption rates of these alloys are explored. For instance, in one studied example, magnesium-aluminum-zinc alloys have bulk resistivities almost double that of pure Mg (with 3% aluminum, 1% zinc), but both the bulk and thin film dissolution rates are significantly slower (by as much as 4 times at physiologically and environmentally relevant ranges of pH). In general, higher aluminum concentrations slow the bulk degradation rate (e.g. AZ61 or AZ91). Slow resorption can be particularly important for device classes that demand continuous contact between electrodes in resorbable system with biological systems (e.g. bio-resorbable electrophysiological monitors) or an aqueous sensing environments (e.g. eco-resorbable sensors). For such purposes, W is of interest due to its previous use in resorbable embolization coils. Here, W exhibits resorption rates (to form tungstic acid, as a result of hydrolysis) that are much lower than those of Mg or its alloys, as shown in published studies in FIG. 37. FIG. 37 shows in vitro degradation of tungsten embolization coils [7]. FIG. 38 shows serum tungsten levels in rabbits with implanted embolization coils [6]. In vivo studies of W embolization coils indicate increased levels of serum tungsten during resorption but without any adverse biological response [6]. The bulk resistivity of W is very similar to Mg (5×10-8 Ωm vs 4.4×10-8 Ωm). Combinations of W, for example as capping layers, with Mg form additional engineering design options.

A third metal is Fe, which has, like Mg, received interest as a biodegradable material for stents. Iron resorbs in water by first oxidizing and then dissolving to either $Fe^{2+}$ or $Fe^{3+}$, depending on the pH. In vitro testing indicates degradation rates in Fe that are much lower than those for Mg. On the other hand, in vivo degradation rates are much lower than the rates predicted by in vitro studies [8]. This difference has been attributed to passivation of the iron surface by some insoluble compound, such as iron phosphide which could form from reaction with phosphate ions in the body. Combinations of Mg, Mg alloys, W and Fe may provide the necessary capabilities for conductors in degradable electronics.

Transient Dielectrics.

For gate dielectrics in MOSFETs and interlayer dielectrics in integrated circuits, $SiO_2$ and MgO have strong potential to satisfy all requirements, as shown by studies of degradation rates and kinetics in these systems, with comparisons to modeling. These materials in single layers, or in multilayer configurations with metals such as W and bio-organic polymers such as silk, can be used as encapsulants to control overall resorption rates. Water permeation rates for different stack designs are measured.

Magnesium Alloys.

Magnesium alloys are being researched solutions to the two perceived flaws with pure magnesium stents: poor mechanical strength and rapid loss of that strength due to fast corrosion [1]. Magnesium alloys come in many different varieties, though all have several traits in common. Alloying elements are added in small quantities (general≤10% by weight), most alloys are ternary, and none have been evaluated on their electrical properties. Tested elements include: Al, Ag, Ca, Li, Mn, Si, Sn, Y, Zn, Zr, and rare earth elements [2]. Magnesium-aluminum-zinc alloys are some of the more common alloys studied.

Figure 39:
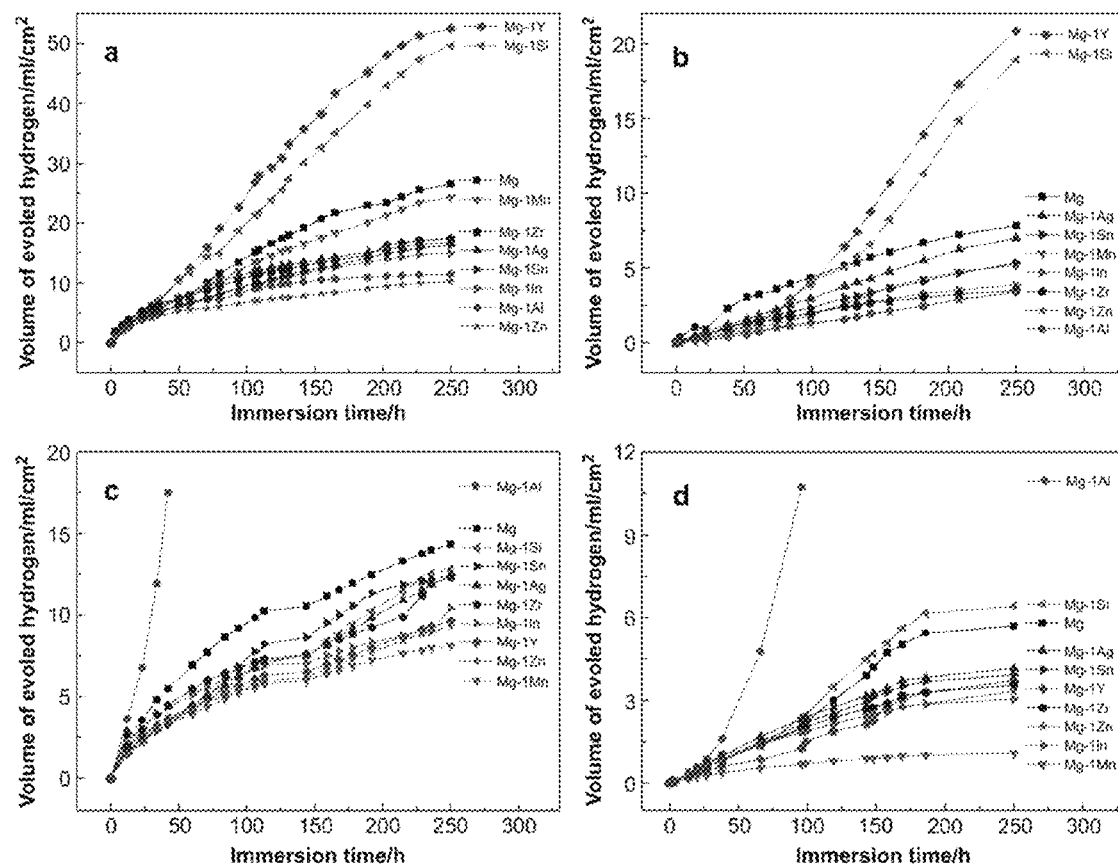

The bulk resistivity of AZ31B (3% aluminum, 1% zinc) is almost double that of pure magnesium, but both the bulk and thin film dissolution rates are significantly slower. Higher aluminum concentrations slow the bulk degradation rate (e.g. AZ61 or AZ91). FIG. 39 shows hydrogen evolution (as a measure of degradation) during degradation of various binary magnesium alloys [3]. FIG. 40 shows comparisons of corrosion rates for Mg and Zn alloys at different pH [4].

Tungsten.

Tungsten is usually overlooked for biomedical implant applications in favor of titanium and other lightweight metals. However, tungsten is still used as one possible material choice for an embolization coil. As an embolization coil, tungsten has proven to be degradable and the degradation rate is much slower than that of magnesium, for similar volumes of material. Tungsten is eventually converted into tungstic acid.

Tungsten is naturally present in humans in small quantities (<200 ng/mL) [5]. Serum tungsten levels have been monitored in vivo, in animals and humans, as tungsten embolization coils degrade; though the levels of serum tungsten increased dramatically, no biological response and no inflammatory response were detected at the site of implantation [6]. However, tungstic acid has been identified as an epileptogenic material, only when applied directly to the brain.

The electrical properties of tungsten compare favorably to magnesium. The bulk resistivity of tungsten is very similar to magnesium ($5\times10^{-8}$ Ωm vs $4.4\times10^{-8}$ Ωm), so replacing or capping magnesium with small amounts of tungsten should not significantly impact device performance. FIG. 37 shows in vitro degradation of tungsten embolization coils. FIG. 38 shows serum tungsten levels in rabbits with implanted embolization coils.

Iron.

Like magnesium, iron has also received interest as a biodegradable stent material. The structural properties of iron exceed those of magnesium, and are much closer to SS316, the non-degradable standard in stents. Iron degrades by first oxidizing, then dissolving to either $Fe^{2+}$ or $Fe^{3+}$ by reacting with water, where the ion formed depends on the pH of the environment. Iron is extremely common within the body, and is important for many biological processes. In vitro testing has shown degradation rates that are slower than magnesium. However, in vivo degradation rates far exceed the rates predicted by in vitro studies [8]. This has been attributed to passivation of the iron surface by some compound other than iron oxide. Iron phosphide is one possible candidate; phosphate ions are readily present in the body, and iron phosphide is insoluble in water, which may explain the dramatically reduced degradation rate. FIG. 41 shows degradation rate [8] and solution iron concentration [9] during in vitro degradation tests of iron (Fe). FIG. 42 shows accumulation of iron in the electrolyte in relation to time.

Collagen/Gelatin.

The triple helix structure of collagen gives it its strength and chemical resistance. As a protein, collagen shares characteristics with silk fibroin. Collagen degrades enzymatically into gelatin and shorter strands. Collagenase separates the three strands and breaks them into pieces. Gelatinase and other protein-dissolving enzymes can become involved as the fragments get smaller and smaller [10].

Collagen is generally only soluble in strongly acidic or basic solutions, and only in small amounts. This chemical resistance should make it more tolerable to standard processing, but two critical flaws emerge when photolithography is involved. First, the surface roughness of manufactured collagen films is quite high, making spin-coating photoresist difficult. Furthermore, collagen films will deform at high temperatures as bound water molecules are driven off. Also, collagen will attempt to swell in some photoresist developers (TMAH based, highly basic). Separating the collagen from the developer by an insulating oxide layer is impossible due to the surface roughness of the films. As a result, gelatin is a more likely candidate for a substrate material, though its overall lifetime will greatly decrease.

Gelatin can be easily dissolved, spin cast, and blended with other polymers. Like collagen, gelatin is insoluble in acetone, and glassy gelatin (dried so all bound water is evaporated) is stable up to 200° C. However, like collagen, gelatin is susceptible to swelling in basic solutions, such as TMAH. Gelatin can be partially protected by an oxide layer with some success, but the low temperature deposition may limit the oxide layer to a low quality and ultimately ineffective protective layer.

Polyvinyl Alcohol (PVA).

Its degradable nature has been leveraged for eco-friendly product packaging, and its high dielectric constant ($\in_r$~10) has made it an often used gate dielectric material for organic electronics [11]. However, PVA's properties are highly dependent on water content, which can be influenced by humidity and other environmental changes. It is also highly permeable to water. These instabilities have limited its use as an effective packaging material, and other polymers (like PLGA) are chosen over PVA as substrate materials for organic electronics.

Poly(Lactic-Co-Glycolic Acid) (PLGA).

PLGA is a commonly used polymer where biodegradation is important or necessary. Its versatility allows for many different applications, from nanoparticle drug delivery to biodegradable stents and stent coatings. The properties of PLGA can be varied by changing molecular weight and the ratio of lactic acid to glycolic acid. PLGA dissolves slowly in water, and fairly quickly in solvents like acetone. The acetone solubility makes it an ineffective substrate for liftoff-based photolithography. In addition, magnesium films evaporated onto PLGA diffuse into or are dissolved by PLGA within minutes; this phenomenon is not observed when a titanium adhesion layer is used.

Previous work [11] using PLGA substrates use active cooling during deposition and non-reactive metals (silver or gold). FIG. 43 provides chemical structures, device geometry, and degradation tests of PVA and PLGA [11]. It is not known if other biodegradable metals will experience similar degradation when deposited directly onto PLGA, though complexation between PLGA and magnesium [12] and zinc oxide [13] suggest that this phenomenon is expected for similarly reactive metals.

REFERENCES

1. Guangling Song. Corrosion Science. 49 (2007) 1696-1701
2. Frank Witte, Norbert Hort, Carla Vogt, Smadar Cohen, Karl Ulrich Kainer, Regine Willumeit, and Frank Feyerabend. Current Opinion in Solid State and Materials Science. 12 (2008) 63-72
3. X. N. Gu, Y. F. Zheng, Y. Cheng, S. P. Zhong, T. F. Xi. Biomaterials. 30 (2009) 484-498
4. D. Vojtech, J. Kubasek, J. Serak, P. Novak. Acta Biomaterialia. 7 (2011) 3515-3522
5. T. J. Butler, R. W. Jackson, J. Y. Robson, R. J. T. Owen, H. T. Delves, C. E. Sieniawska, and J. D. G. Rose. The British Journal of Radiology. 73 (2000) 601-603
6. Matthias Peuster, Christoph Fink, Peter Wohlsein, Michael Brugmann, Alexander Gunther, Volker Kaese, Matthias Niemeyer, Heinz Haferkamp, and Christian v. Schnakenburg. Biomaterials 24 (2003) 393-399
7. Matthias Peuster, Christoph Fink, Christian von Schnakenburg. Biomaterials 24 (2003) 4057-4061
8. Shengfa Zhu, Nan Huang, L[1] Xu, Yu Zhang, Hengquan Liu, Hong Sun, and Yongxiang Leng. Materials Science and Engineering C. 29 (2009) 1589-1592
9. Matthias Peuster, Peter Wohlsein, Michael Brugmann, M. Ehlerding, K. Seidler, Christoph Fink, H. Brauer, A. Fischer, and G. Hausdorf. Heart. 86 (2001) 563-569
10. Magda Gioia, Susanna Monaco, Giovanni Francesco Fasciglione, Anna Coletti, Andrea Modesti, Stefano Marini, and Massimo Coletta. J. Mol. Biol. 368 (2007) 1101-1113
11. Christopher J. Bettinger and Zhenan Bao. Adv. Mater. 22 (2010) 651
12. Juha Piispanen and Lauri H. J. Lajunen. Acta Chemica Scandinavica. 49 (1995) 235-240
13. Yutaka Yamagata, Masafumi Misaki, Tomofumi Kurokawa, Keiko Taira, Shigeyuki Takada. International Journal of Pharmaceutics. 251 (2003) 133-141

Example 5

Manufacturing

Low cost manufacturing is an essential requirement for a realistic degradable electronics technology, due to the intrinsically finite operational (and physical) lifetimes. Processes used in the semiconductor industry are not applicable because many degradable materials are incompatible with established solvents, photoresists, developers, exposure techniques and etching methods. A manufacturing strategy developed here involves two main steps (1) transfer printing, to allow manufacturing with Si NMs and, ultimately, partially formed device sub-components obtained through existing foundry sources, with degradable substrates, and (2) electrohydrodynamic jet (e-jet) printing to establish degradable interconnects between these devices, and encapsulants/packages for functional systems.

Microtransfer Printing.

Micro transfer printing (µTP) [1] techniques are used, with targeted implementation in high speed, roll-to-roll manufacturing modes. The µTP process uses soft, elastomeric stamps to lift solid material micro/nanostructures fabricated from a source substrate, in an 'inking' step, and then to place the materials down onto a target substrate, in a 'printing' step. With optimized strategies for controlling the strength of adhesion at the stamp surface (i.e. strong and weak in the inking and printing steps, respectively) the entire procedure can be automated to enable high yields (>99.9%) and placement accuracy (<1 micron). FIG. 44 provides a schematic illustration of the process and a picture of a representative tool.

Materials and integration strategies based on µTP that allow high performance electronic and optoelectronic systems to be built on unusual substrates, including slabs of rubber, have been demonstrated. The core strategy relies on 'inks' including inorganic semiconductor nanoribbons/ membranes/wires created in well-aligned array formats on source wafers of silicon, gallium arsenide or indium phosphide[1,2]. This type of strategy can be used with Si NMs to form resorbable electronics. A key feature of this process is that Si NMs formed in close-packed layouts on silicon wafers can be retrieved and delivered to target substrates in areal coverages that match system requirements. This capability is essential for efficient materials utilization, and low cost. To highlight this point, FIG. 45 (left) shows an example of a sparse array of semiconductor elements printed in this manner onto a flexible sheet of plastic.

Fundamental and engineering knowledge for use of μTP in a high-speed, continuous, roller printing mode specifically for degradable electronics is developed. In particular, the physics of soft, van der Waals adhesion in which the bonding strength depends on the direction of forces applied at the interface between a specially designed stamp and a source substrate are explored. The illustration in FIG. 46a shows a single relief feature in such a stamp, and its natively asymmetric contact angles ($\theta_a$ and $\theta_b$). Since $\theta_a$ is larger than $\theta_b$, a crack at the stamp-substrate interface will initiate preferentially from the right corner when the stamp is pulled in the vertical direction with a force $F_2$. Pulling at an angle to the left will accelerate crack initiation from the right corner, thereby resulting in reduced pull-off force ($F_3 < F_2$). Crack formation is inhibited when the stamp is pulled at an angle to the right, leading to increased pull-off force ($F_1 > F_2$). In this way, three different pulling directions cause three different pull-off forces ($F_1 > F_2 > F_3$).

This approach is attractive for two reasons. First, the angled geometry enables enhanced pull-off forces. This physics is important when large forces are needed to retrieve materials/devices in the inking step of μTP. Second, direction-dependent adhesion can be exploited in thin stamps wrapped around cylindrical supports, to enable high-speed operation in a continuous, roller printing mode. FIGS. 46b and c provide illustrations. Here, the design allows high adhesion ($F_1$) for retrieval, during appropriate rotational and translational motion of the roller stamp and the source substrate, respectively (FIG. 46b). For the opposite direction, the adhesion physics facilitates printing with a correspondingly low adhesion ($F_3$) (FIG. 46c). As described, a scheme in which the roller stamp retrieves devices/structures on one side and delivers them to a target substrate on the other side, continuously, can be implemented. Periodically indexing the source substrate in a direction orthogonal to the rolling direction, and translating it back to its starting point will allow the inking process to occur in different regions, until all of the material on the source is consumed. Fresh source substrates can be inserted, as needed.

Understanding the fundamental aspects of both the direction dependence and the overall strength of adhesion is critically important to allowing their engineered use for present purposes. The key physics can be analyzed by a mechanics model of interfacial delamination. A post of height h is subject to a vertical pull-off force F and a shear displacement u imposed at the bottom of the post via the post/substrate interface. The asymmetric pull-off force F results in a bending moment $Fh\cot\theta_a$ on the post. The shear displacement u gives a shear strain $\gamma = u/(h+0.421 L)$ in the post,[23] which in turn results in a bending moment $\mu\gamma hL^2$ due to shear, where the shear modulus of the post is $\mu = E/3$, E is the Young's modulus, and the post is treated as incompressible. The net bending moment on the post is $M = Fh\cot\theta_a + \mu\gamma hL^2$. Either of two infinitesimal edge cracks at the different corners of the post/substrate contact interface may propagate and lead to delamination. The corresponding stress intensity factors can be obtained analytically in terms of F and the bending moment $M$.[24] For the limit of vanishing crack length, the crack tip energy release rates, normalized by EL, are given analytically in terms of F and M, or equivalently, F and the shear strain $\gamma$ $$\frac{G_{1,2}}{EL} = 0.113\left(\frac{F}{EL^2}\right)^2 + \qquad (1)$$
$$\frac{h^2}{L^2}\left[0.470\left(\frac{F}{EL^2}\cot\theta_a\right)^2 + 0.0522\gamma^2 - 0.313\frac{F}{EL^2}\gamma\cot\theta_a\right],$$
$$\pm\frac{h}{L}\frac{F}{EL^2}\left(0.279\frac{F}{EL^2}\cot\theta_a - 0.0928\gamma\right)$$

where the subscripts 1 and 2 denote the crack tips at the left and right corners of the post/substrate interface, respectively, where the large elastic match between the post (PDMS) and substrate for an interface crack tip has been accounted for.[25] For negative shear ($\gamma < 0$, FIG. 46c) or relatively small shear in the positive direction $$\gamma \le 3\frac{F}{EL^2}\cot\theta_a,$$

the left crack tip has a larger energy release rate than the right one. The opposite holds for when $$\gamma > 3\frac{F}{EL^2}\cot\theta_a.$$

Crack propagation starts once the left or right crack tip energy release rates in Equation (1) reach the interfacial fracture toughness $\Gamma_0$. This condition gives analytically the critical pull-off force $$\frac{F}{EL^2} = f\left(\frac{h}{L}\gamma, \frac{h}{L}\cot\theta_a, \frac{\Gamma_0}{EL}\right), \qquad (2)$$

which depends upon the normalized shear strain $(h/L)\gamma$, contact angle $(h/L)\cot\theta_a$, and interfacial fracture toughness $\Gamma_0/(EL)$. This equation provides a clear point of connection to experimental measurements. These types of models serve to guide not only engineering implementations of roller stamps, but also optimization of the material and relief geometries for further increased $F_1$ and reduced $F_3$. For example, adding re-entrant features of relief to the angled post structures can lead to dramatically enhanced adhesion, by shifting of points of stress concentration away from the edges and into the interior of the contacting area. These effects, along with the influence of viscoelasticity are explored, in combined scientific and engineering studies.

From Silicon Foundry Devices to Resorbable Electronics.

Although schemes that use Si NMs derived from wafers and assembled by μTP provide feasible routes to resorbable electronics, they are non-ideal, for two reasons: (1) they require device processing and critical features to be defined on the resorbable substrate and (2) they are unable to exploit established infrastructure for manufacturing of silicon integrated circuits. The first influences the performance and levels of sophistication in function that can be achieved, due to the severe constraints in processing options imposed by requirements for compatibility with the resorbable substrate. The second substantially increases the cost, and also the environmental impact, due to the need for establishment of separate foundry networks specifically configured for resorbable devices. The present methods address these two limitations, by developing routes to convert specially designed, foundry-processed wafers into sources of component building blocks for resorbable systems. µTP is used as a means to manipulate not just Si NMs, but fully processed primitives or small circuit elements derived from foundry-processed wafers.

The key challenge is to adapt foundry-compatible layouts and available materials sets for present purposes. Although preliminary findings establish Si and $SiO_2$ as biocompatible and environmentally friendly resorbable electronic materials, no other components in commercial integrated circuits have such characteristics. One solution is to source from foundries integrated circuits and primitives on ultrathin body silicon-on-insulator (SOI) substrates, in layouts with reduced complexity and configurations suited for µTP. A modest number of additional steps, capable of being performed outside of the foundry, replace the metallization layers with resorbable conductors, such as Mg. FIG. 47 schematically illustrates a process flow. Here, the layout allows access to metallization throughout the stack, for its removal and subsequent replacement with resorbable conductors; lateral definition of the silicon, the doped regions, the gate dielectrics and the interlayer dielectrics (ILDs) are unaltered, in order to capitalize on foundry capabilities. Schemes for this material exchange must be developed, along with routes for removing the buried oxide (BOX) on the SOI substrate to prepare the components for µTP. The first can be accomplished using a combination of wet and drying etching techniques. As an alternative, heavily doped layers of polycrystalline silicon can replace the metallization completely, thereby eliminating the need for removal. Addressing the second challenge requires careful study of the fracture mechanics of strategic structures (i.e. anchors) that tether the components to the underlying wafer after removal of the BOX. Enhanced adhesion enabled by the angled stamp designs relax requirements. FIG. 48 provides an SEM image of one type of anchor design, in a non-resorbable Si CMOS block formed on SOI and then released by etching the BOX.

Electrohydrodynamic (e-Jet) Printing.

Schemes for interconnecting the resorbable components are required for functional systems. The resolution must be sufficiently high to allow small contacting pads on the individual components, for efficient utilization of the area of the source wafers. Methods that use electric fields to create fluid flows at the tips of high resolution nozzles, due to its additive nature and compatibility with a wide range of material inks and substrates, are pursued. Previous work demonstrates that this physics provides a resolution in droplet generation and printing that extends into the deep sub-micron range (~100 nm), which exceeds by more than 100 times the best resolution possible with conventional ink jet technologies [3]. FIG. 49 shows a custom-built e-jet printer, with a schematic illustration of the key components, including an ink chamber, controlled pressure supply, metal-coated glass nozzle tip, substrate, and positioning stages. The back pressure, the standoff height, and the applied voltage between the conducting nozzle tip and substrate define the printing conditions. Associated electric fields cause mobile ions in the ink to accumulate near the surface at the tip of the nozzle. The mutual Coulombic repulsion between the ions introduces a tangential stress on the liquid surface that, along with the electrostatic attraction to the substrate, deforms the meniscus into a Taylor cone shape as described in [3]. When the electrostatic stress overpowers the surface tension between the liquid and the interior surface of the nozzle tip, droplets eject from the tip of the cone. References [7-9] detail the development of the e-jet process including novel sensing techniques, machine design, and printing capability.

These features make e-jet a potentially powerful complement to µTP for manufacturing resorbable electronics. Two key shortcomings in the science and engineering aspects of e-jet must, however, be overcome to enable its use for this application: (1) sensitivity of resolution and droplet placement on the local electrical characteristics of the substrate, and (2) absence of designs for multiple, parallel nozzles that can be implemented in a continuous, roller printing mode. The first issue leads to challenges in the reliable formation of interconnect lines between resorbable components delivered to insulating substrates by µTP. In particular, the spatial variation in local electronic properties of the target surface (i.e. metal, dielectric, semiconductor) leads to changes in electric field profiles and, therefore, droplet sizes and trajectories, in ways that can be difficult to accommodate. FIG. 50 shows representative patterns printed by e-jet, showing capabilities for forming circuit-like arrangements of conductive lines (left) and sub-micron resolution (right). One solution is coupled electromagnetic and flow models for e-jet nozzles that incorporate, into the nozzle assembly itself, a ring-shaped counterelectrode. The result is a system in which all of the driving electric fields are defined in a way that is decoupled from the substrate. Inductive current sensing provides a means to establish feedback control over the printing process. FIG. 51 shows a schematic illustration (left) and electrostatics modeling (right) of an e-jet printing nozzle with an integrated, concentric ring counterelectrode. This arrangement has the potential to eliminate effects of the substrate on the printing process.

The second shortcoming is addressed by extending the simulation capabilities from the work above, to understand electrostatic coupling between adjacent nozzles in linear arrays. The ability to accommodate some degree of substrate misalignment by individually moving each nozzle unit on a separate adjustment micro-platform is incorporated into the design. An analogy would be a test pattern sequence used by a conventional ink-jet printer to adjust print cartridge calibration. 10-20 different nozzles are incorporated in an overall print head, in a linear arrangement, capable of precision translation with respect to the direction of motion of the underlying substrate. Sufficient intelligence is locally embedded into each unit so that it acts as an autonomous entity, calibrating itself by communicating with the web handling system and µTP module without external assistance.

An important perspective on this manufacturing flow is that the critical device dimensions and, in many cases, the most demanding interconnects will be formed at the level of the foundry-sourced components. This circumstance reduces demands on throughput and resolution required of the e-jet system, although even here feature sizes below those achievable with conventional ink jet printing are necessary to cost effectively utilize the foundry components, by allowing the use of small contact pads. It is noted, however, that in commercial manufacturing, it is likely that e-jet will be used strategically with other methods, such as ink jet and screen printing, to form an optimal balance of resolution, throughput and registration accuracy. An integrated processing line, involving µTP, e-jet and ink jet, with an initial step of imprinting (conventional, thermal embossing) to define registration marks appears in FIG. 52. In this sequence, only the patterns formed by e-jet and ink jet require registration. Here, optical pattern recognition systems use a combination of structures formed by μTP and the relief defined by the embossing step.

Example 6

A transient antenna was demonstrated using a Mg antenna (2 μm thick) on glass to wirelessly power an LED. The Mg antenna was integrated with commercial inductors, capacitors, and diodes (rectifiers) on a circuit board. As shown in FIG. 53, the circuit worked at a distance of about 3 meters (or about 10 feet) to power the LED.

A transient RF power scavenger system was produced according to the schematic diagram and layout shown in FIG. 54. The RF power receiver system included an inductor, capacitors, and rectifiers fabricated on SOI wafers. The circuit contained cascaded diodes as rectifiers and capacitors to accumulate charge. Antennae were fabricated on silk substrates and integrated onto the SOI substrate. The inductor was used for impedance matching. Commercial LEDs were used for verifying circuit performance. Table 1 shows component specifications, materials and dimensions. FIG. 57 shows an example of a fully transient RF scavenging system.

TABLE 2

Transient RF power scavenger component specifications, materials, and dimensions.

| | Target specs. | Materials | Dimensions |
|---|---|---|---|
| Inductor | 3 nH, 2 GHz | Electrodes: Mg<br>Dielectrics: SiO2 | Turns: 3,<br>Line width: 20 μm<br>Spacing: 20 μm<br>$D_{in}$: 200 μm<br>$D_{out}$: 440 μm |
| | One inductor carries out Impedance matching between antenna and rectifier circuit. | | |
| Capacitor | 3 nF | Electrodes: Mg<br>Dielectrics: MgO | Area: 2 mm × 2 mm |
| | Six capacitors store charge from the rectifiers. | | |
| Rectifier | Si based diodes | Single crystal silicon | Intrinsic region <10 μm |
| | 6 diode-based rectifiers form a voltage multiplier with the six capacitors, which achieves higher DC voltage (8 V) output from an AC input (1.5 Vpp) to power two LED in series. | | |
| Antenna | 915 MHz | Mg | ~.4 cm × 5.5 cm<br>~.10 cm × 4 cm |

Fabricated Si rectifiers (PIN diodes) were found to be comparable to commercial and GaAs Schottky diodes. The PIN diodes worked up to ~300 MHz. The lower operating frequency is caused by p-N series resistance (due to distance from metal to junction). It was possible to modify the design of the metal contact pads to decrease this effect and achieve higher operating frequencies, as shown in FIG. 55. FIG. 56 shows a full wave rectifier.

A transient radio was produced using Mg inductors (Mg/SiO$_2$/Mg; 250 nm/800 n m/3 μm) having resonant frequencies and Q-factors in the range of about 3 GHz to about 12 GHz and about 4 to about 6.5. Table 2 provides specifications for four different Mg inductors, and FIG. 58 shows Mg inductors (a) and their corresponding performance data (b).

TABLE 2

Mg inductor specifications.

| | Group 1 | Group 2 | Group 3 | Group 4 |
|---|---|---|---|---|
| Resonant Frequency | 11.7 GHz | 8.3 GHz | 6.8 GHz | 3.38 GHz |
| Inductance | 14 nH | 27 nH | 19 nH | 53 nH |
| Q-factor | 6 | 6.5 | 3.9 | 3.8 |

Figure 59A:
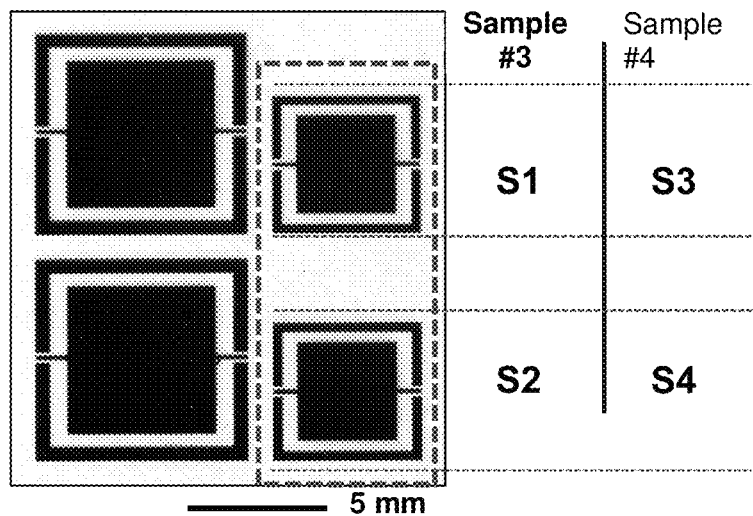
Figure 59B:
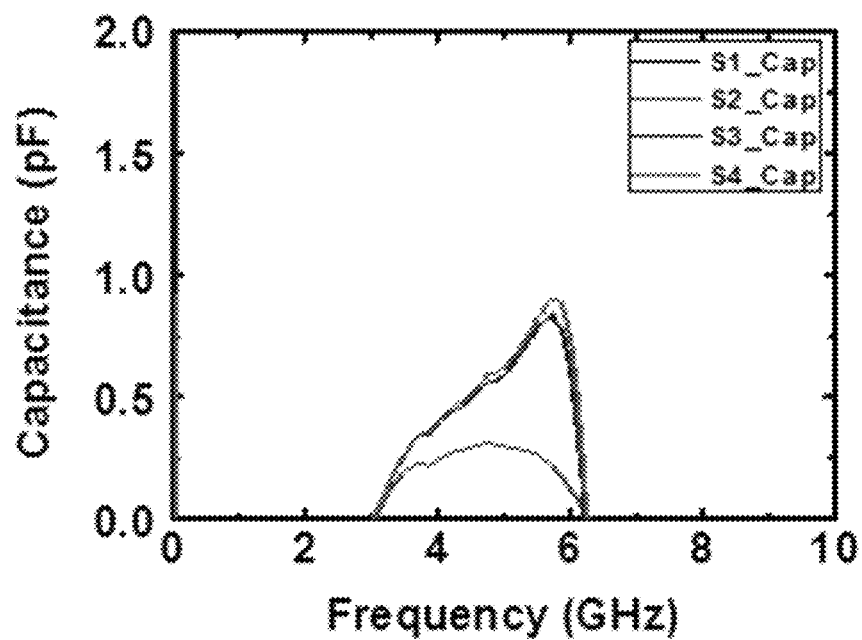
Figure 59C:
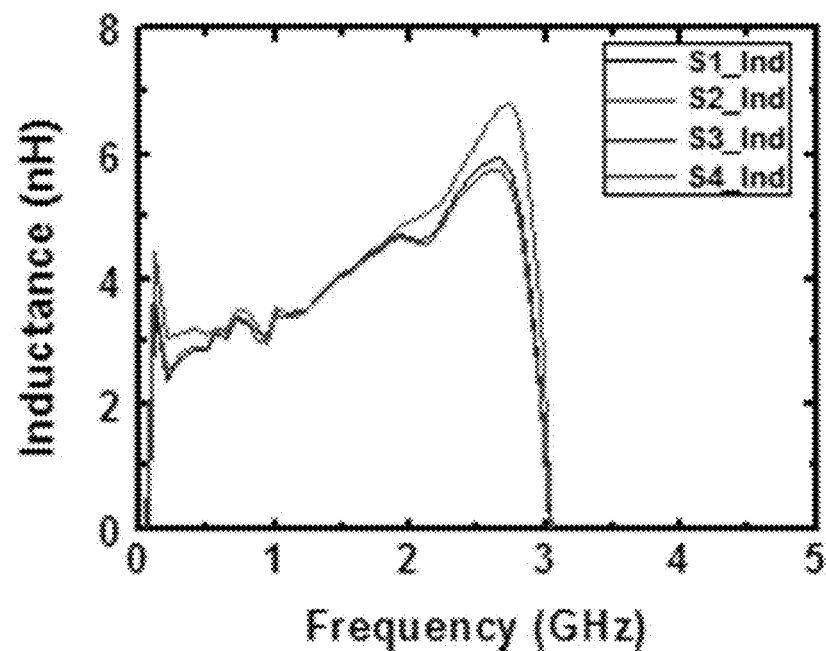
Figure 59D:
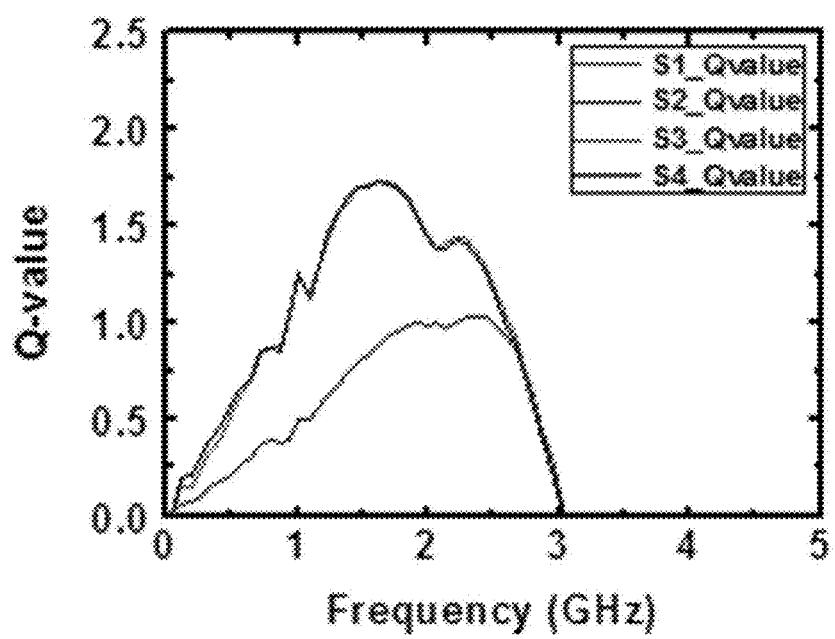
Figure 59E:
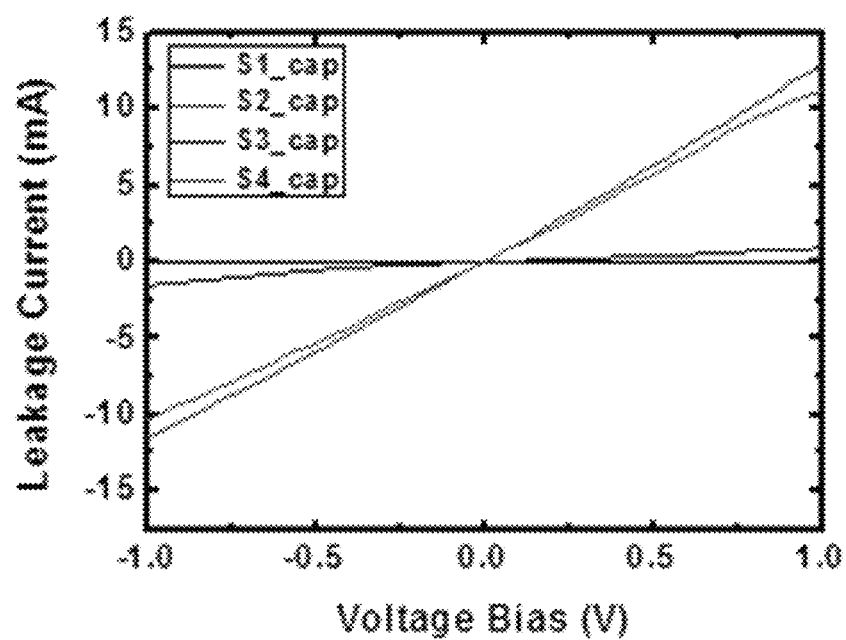
Figure 60A:
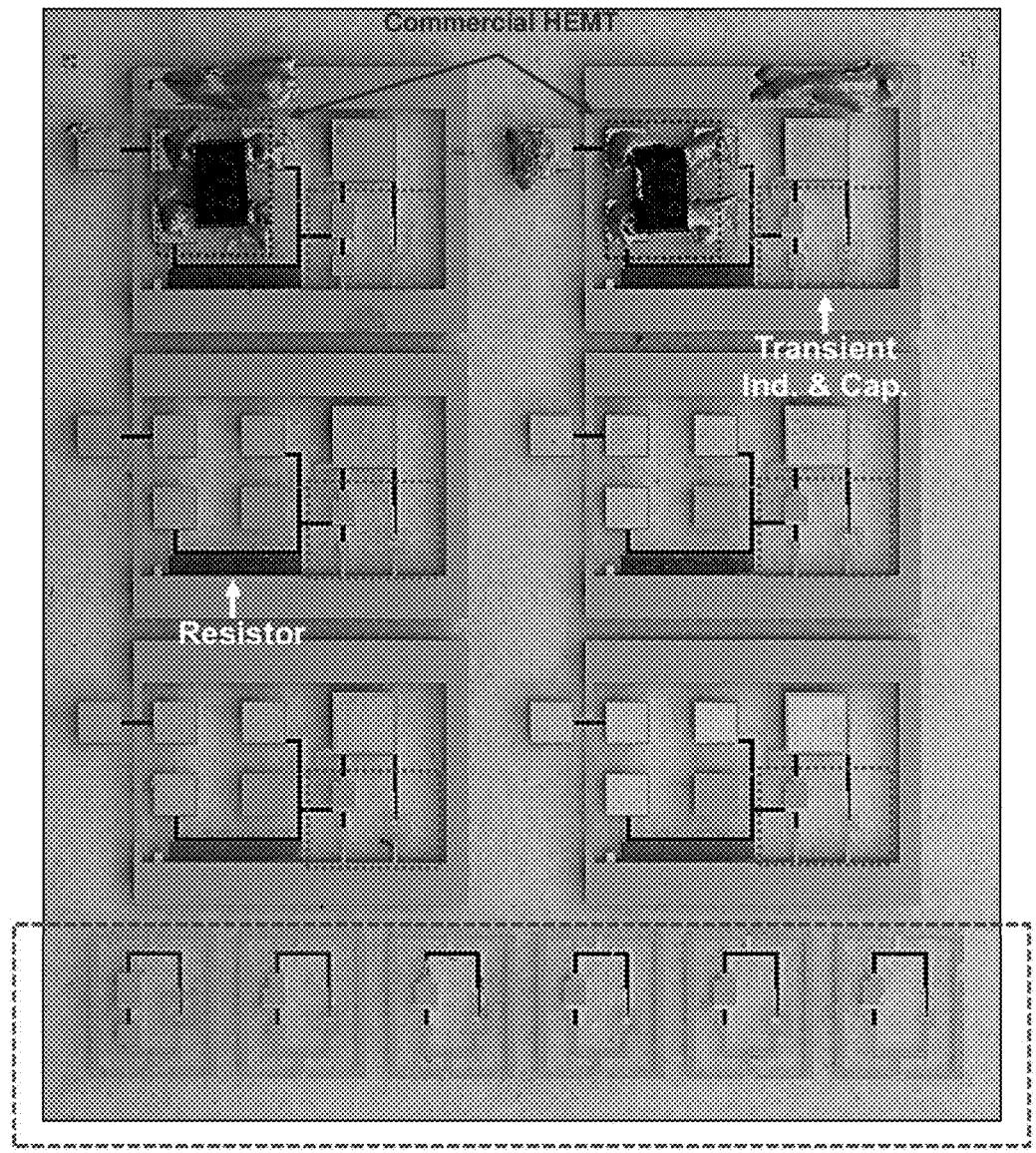
Figure 60B:
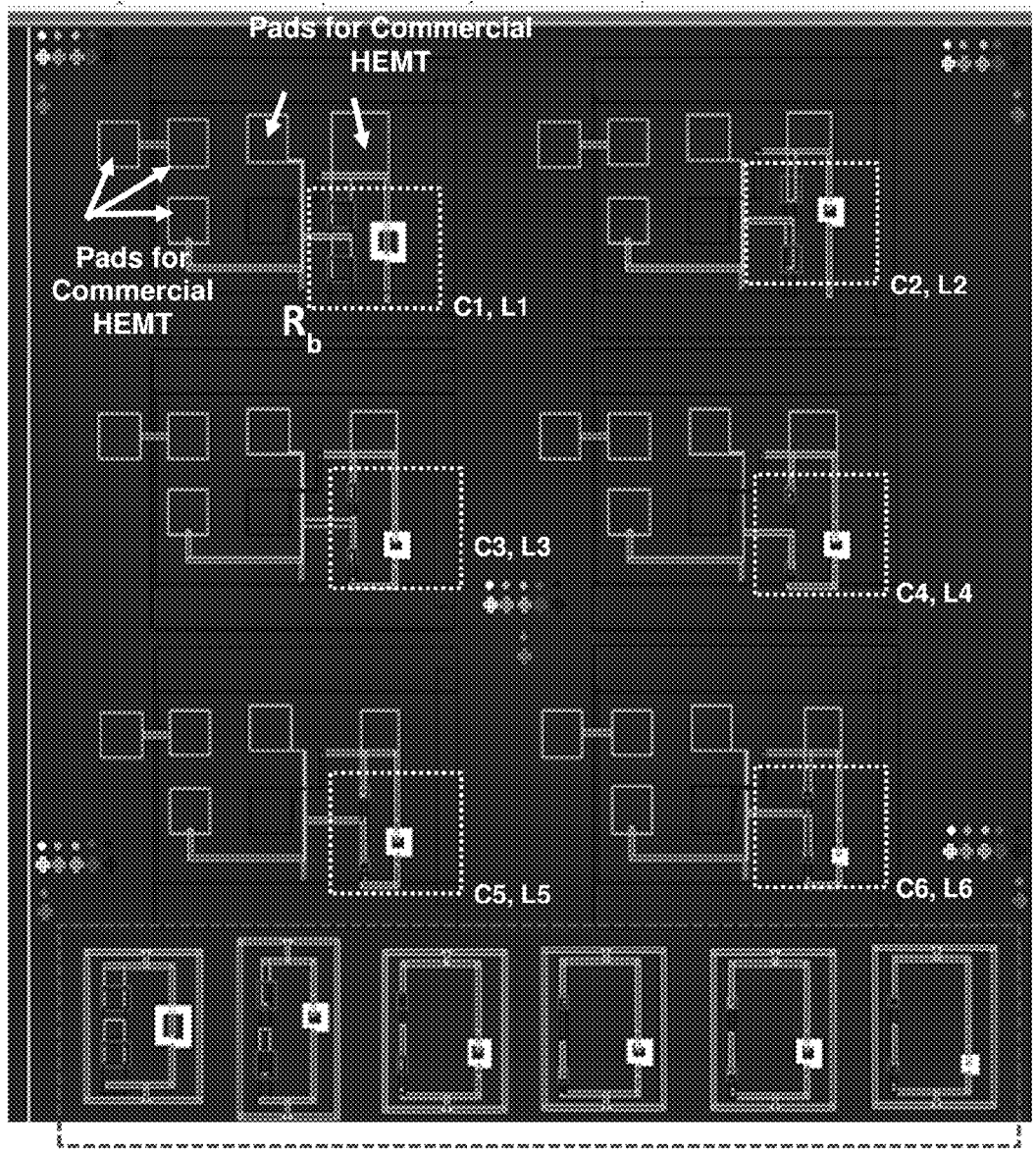
Figure 60C:
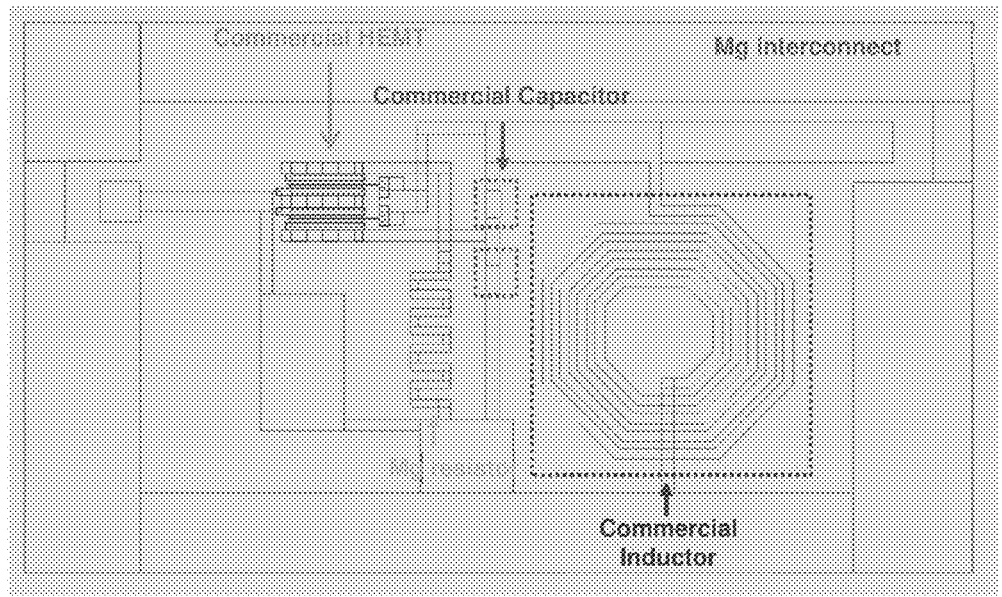
Figure 60D:
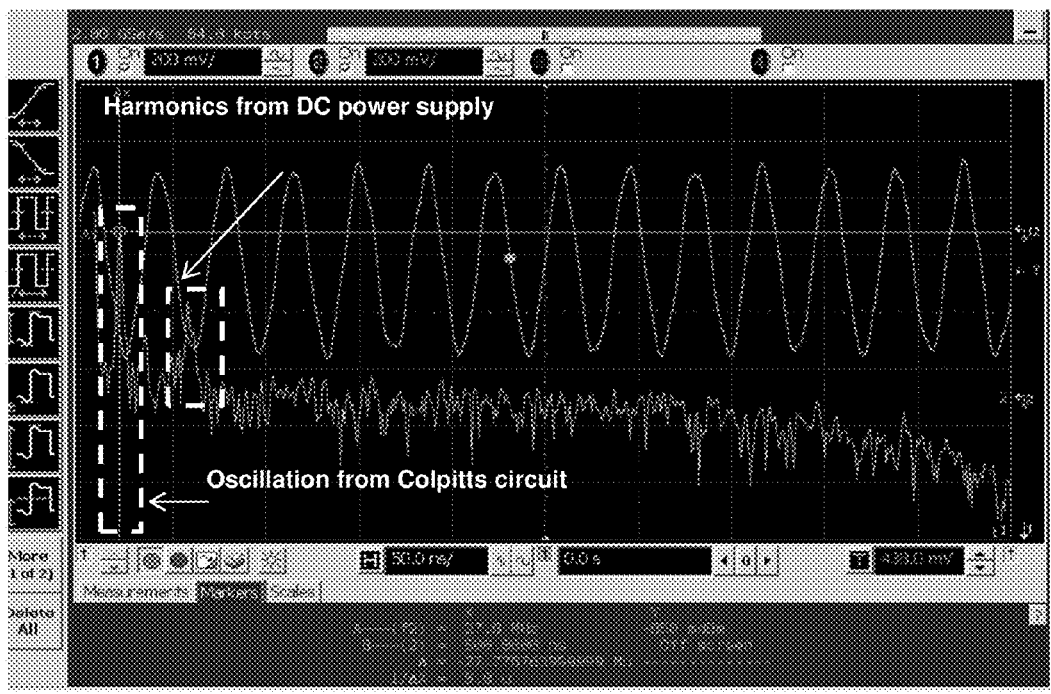

The transient radio also used Mg capacitors (Mg/MgO/Mg; 250 nm/200 nm/500 nm) shown in FIG. 59a. FIGS. 59(b)-(e) show the performance data of the Mg capacitors. Samples S2 and S4 showed leakage current and displayed inductance, instead of capacitance. They work at lower frequency, but act as large resistors at higher frequencies due to the leakage current. The final circuit used SiO$_2$ in place of MgO to allow for a thicker dielectric layer to reduce leakage at high frequencies. Table 3 shows component specifications, materials, and dimensions.

TABLE 3

Transient Mg capacitor component specifications, materials, and dimensions.

| | Target specs. | Achieved | Materials | Dimensions |
|---|---|---|---|---|
| Transistor | Gm: >20 mS | ~16 mS | GaAs<br>InGaAs/GaAs | Ch. width: 200 μm<br>Gate length: 0.8 μm |
| | The high-Gm transistor is used to compensate the energy loss in the LC tank | | | |
| Capacitor | 1-10 pF<br>1 μF | 2.3 pF@<br>2 GHz | Electrodes:<br>Mg, Au<br>Dielectrics:<br>MgO, SiN | Area: 20 μm × 100 μm |
| | Small capacitor is the component of the LC tank to determine the working freq.<br>Large capacitor is used for decoupling the noise from DC power. | | | |
| Inductor | 5-20 nH,<br>Q: >8 | 11.1 nH,<br>4.7@<br>2.75 GHz | Electrodes:<br>Mg, Au<br>Dielectrics:<br>MgO, SiO$_2$ | Turns: 4.5,<br>Line width: 27 μm<br>Spacing: 20 μm<br>$D_{out}$: 630 μm<br>$D_{in}$: 255 μm |
| | Inductor is the component of the LC tank to determine the working freq. The RF loss in the LC tank is mainly from the inductor. We need high quality factor to make the circuit oscillating. | | | |

FIG. 60 shows examples (a), schematics (b)-(c), and performance data (d) of Colpitts oscillators with passive transient components (interconnects and resistors). The passive components were integrated into commercial HEMTs with LC resonators having six different frequencies. The frequency design should be matched to the maximum quality factor of the inductor. In FIG. 60d, the oscillation frequency is 28 MHz, $V_{pp}$ is 0.65 V, and $V_{dd}$ is 2 V.

FIG. 61 shows a design for a fully transient radio including a Si CMOS ring oscillator.

FIG. 62 shows an example of patterning Mg by e-jet printing.

Example 7

Transient electronics can be broadly defined as a new class of device that has the ability to physically disappear at some programmed rate, via a number of possible mechanisms including resorption, dissolution, absorption, corrosion, hydrolysis, depolymerization, or disintegration. The mode and rate of this transience can be pre-set, adjustable in real time, triggered, and/or sensitive to the properties of the deployment environment, such as chemical or biological events, temperature, pressure, or light. Deployment scenarios range from integration with living hosts (human/animal/insect/plant/seed; on-dwelling or in-dwelling) to conventional indoor/outdoor environments such as buildings, roadways, materiel, etc. Examples include implanted medical devices that are fully resorbed by the human body ("bio-resorbable"), and communications systems that dissolve when placed in water ("eco-resorbable"). Transient electronics promise a number of revolutionary and meaningful military capabilities, including covert ISR, simplified diagnosis and treatment of battlefield injuries, improved health monitoring, mission specific human performance augmentation, and numerous applications for Special Operations forces.

To achieve transient electronics, key technological breakthroughs are required across the entire electronics production process, from starting materials to components to finished product. Specifically, innovations must occur in the following critical areas:

1. Materials that exhibit a useful combination of transience over operationally relevant timescales, and the physical characteristics (e.g., electrical conductivity, dielectric properties, moduli) required for construction and performance of high quality electronic devices;
2. Manufacturing and assembly processes for components and devices commensurate with new transient materials and designs. This includes novel means to incorporate, enable, program, control, or enhance transience in complex electronic architectures;
3. Design tools and performance models. This includes design strategies, novel component designs, and design tradeoffs to compensate for potentially degraded/compromised performance of electronics constructed from transient vs. conventional materials; and
4. Layout tools for global circuit board performance using transient components.

Figure 63:
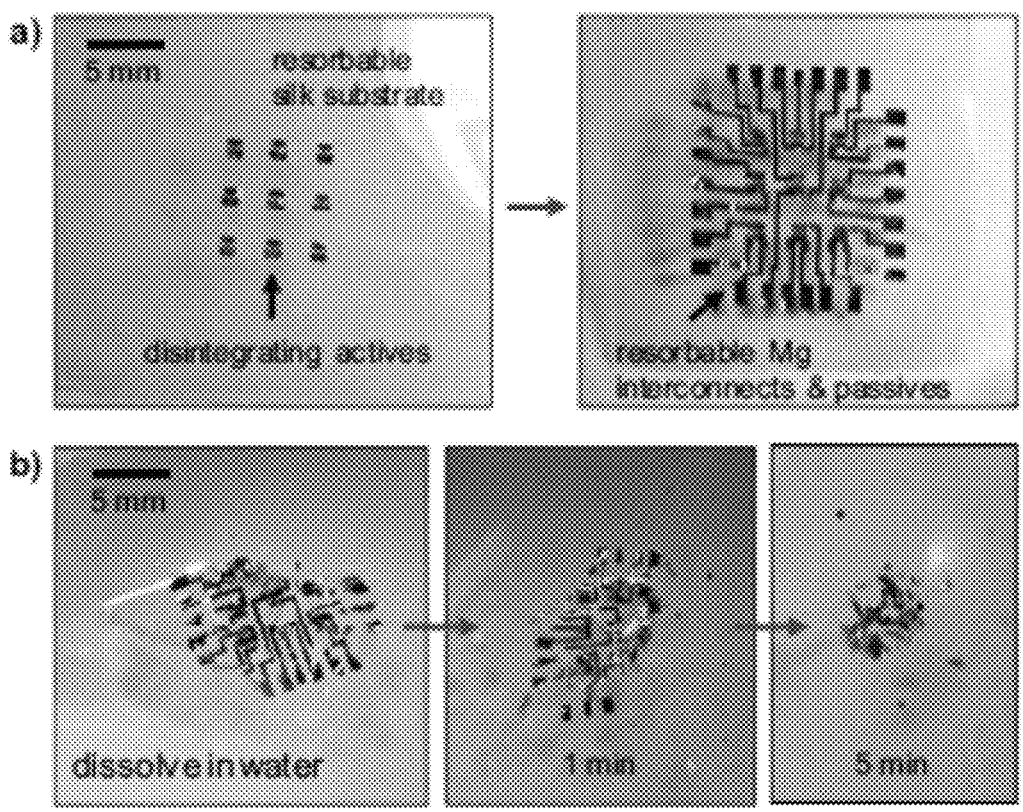

A simple radio, powered by RF scavenging (e.g., witricity), that disappears upon exposure to water is developed. This completely transient device comprises fully resorbable passive components (resistors, capacitors, inductors and antenna) and two active components (a MESFET for the radio, and a diode for the scavenger) that disintegrate in water. The active components feature a novel segmented design that utilizes resorbable interconnects, and the entire radio is constructed on a resorbable substrate. Furthermore, to demonstrate expanded functionality, the basic RF pickup coil in the radio is replaced with an environmentally sensitive coil to create a water-dissolvable sensor/radio. This device is used to detect changes in temperature, hydration state, and chemical concentration, and broadcast the results. Such a device may monitor and report its own transience. An example of water soluble electronics is shown in FIG. 63. The radio design builds upon recent work in bioresorbable electronics for monitoring electrical processes in vivo.

Radios are an ideal choice since: (1) communications are central to military operations; (2) they serve as an enabling technology which can be coupled to virtually any device to provide information input and output; and (3) with appropriate design, they can intrinsically function as an integrated sensor and reporter. Power is a critical aspect of all transient electronic devices. RF scavenging obviates the need for on-board power and thus development of a transient battery or power source. Finally, the principles, development strategy/pathways, process flow, tools, and basic electronic components developed for the resorbable radio are readily generalizable and provide fundamental and practical insight into the development of transient electronics of arbitrary complexity.

The goal of the program is to develop materials and manufacturing techniques for transient electronics. A water soluble radio provides the demonstration vehicle. The technical approach builds on recently developed 'silicon on silk' and 'plastic RF' electronics technologies. Water soluble passive components such as resistors, capacitors, inductors and antennas, using silk based materials for dielectrics and substrates, and magnesium for interconnect and metallization are developed. For semiconductor devices such as transistors and diodes, silicon and gallium arsenide are used in segmented layouts with magnesium interconnects and silk substrates, to achieve devices that disintegrate into small, insoluble pieces upon immersion in water. Performance characteristics are determined using conventional procedures. FIG. 64 shows a circuit schematic of the radio device and its physical realization in a flexible, plastic RF technology. The system consists of two functional parts: a module that scavenges RF power from the ambient (left) and a component that transmits a continuous RF signal, using power from the scavenger (right). The scavenger module connects to a resonant antenna. A high speed GaAs Schottky diode yields a positive averaged signal by removing negative swings in voltage. Capacitors, directly connected to ground, serve as elements for filtering and power storage. The output of this module connects to an oscillator in the RF transmitter component of the system. The frequency of transmission depends on the resonant frequency of an inductor and two capacitors that serve as a simple LC oscillator. Attenuation of the signal in this oscillator due to resistive losses is compensated by a GaAs MESFET amplifier. This system is an ultrathin, 'plastic RF' technology, as shown in FIG. 64. FIG. 65 presents the characteristics of certain individual elements for this system, including a representative MESFET and collection of passives, all on a thin sheet of polyimide, showing good RF response to several GHz. Table 4 summarizes building block components.

TABLE 4

Building block components for water-soluble radio.

| Components | Key Materials (in all cases, silk substrate) | Role in Circuit | Mode of Transience | Target Metrics |
|---|---|---|---|---|
| Inductor | Dielectric (Silk), Metal (Mg) | Frequency resonator | Resorb | $f_R$ = 5 GHz (for 11.1 nF) Q factor = 5 |
| Capacitor | Dielectric (Silk), Metal (Mg) | Frequency resonator, filter | Resorb | $f_R$ = 1 GHz (for 0.8 pF) |
| Resistor | Metal (Mg) | Impedance matching | Resorb | 5 Ω to 10 MΩ |
| Diode | Semiconductor (Si), Metal (Mg) | Rectifier | Disintegrate | 100:1 rectification $V_t$ = 0.5 V |
| MESFET | Semiconductor (GaAs), Metal (Ni, Au, Mg) | Amplifier | Disintegrate | $f_T$ = 2 GHz $V_t$ = 0.2 V On/off ratio = ~$10^5$ |
| Transmitting Antenna | Metal (Mg) | Transmitter | Resorb | Length = 14 cm (for 1 GHz) |
| Scavenging Antenna | Metal (Mg) | Scavenger | Resorb | Length = 10 cm (for 1.5 GHz) |

Background

The inventors' recent work provides a first demonstration of the concept of transient electronic systems, as bioresorbable devices for monitoring electrical processes in the brain and other parts of the body. These results represent the simplest embodiment of this form of technology, where the supporting substrate is the only component of the system that is transient. FIG. 66a shows a first example: an array of ultrathin, silicon metal oxide semiconductor field effect transistors (Si MOSFETs) built on a thin sheet of silk fibroin derived from silkworm cocoons.[1] Silk is water soluble and bioresorbable, with dissolution rates that can be adjusted between seconds and months, depending on the processing conditions. Preliminary in vivo testing of this 'silicon on silk' technology shows that the substrate resorbs over time, leaving just the Si MOSFETs; no inflammation, swelling or other adverse responses were observed (FIG. 66b).

This type of design was exploited in a neural electrode array capable of intimate integration with the highly convoluted surface of the brain, for high fidelity electrocorticography (ECoG).[2] The device consists of an array of ultrathin electrodes in an interconnected, open mesh layout, supported by a thin sheet of silk. The silk provides mechanical robustness for handling and mounting onto the surface of the brain. The ultrathin mesh design offers extremely low bending stiffness and ability to conform to curvilinear surfaces. Washing with saline solution dissolves the silk and initiates a spontaneous wrapping process, driven by capillarity. FIG. 67 summarizes in vivo neural monitoring experiments performed on a feline animal model with this type of device. The background colors for representative ECoG signals measured at each electrode point illustrate the magnitude of the zero lag cross correlation between the evoked response and an average of all the responses from the entire array. The results indicate physiologically relevant data with high signal to noise ratios for more than 90% of the electrodes. Detailed comparative studies indicate that this device outperforms all alternative monitoring technologies, due to the low impedance, intimate electrode tissue contact that forms upon dissolution of the silk.

The addition of other water soluble, bioresorbable materials onto silk substrates are explored. As one example, structures consisting of patterned thin films of magnesium as metallization on silk are provided. FIG. 68 shows images of a device of this type, with magnesium features in the geometry of the ECoG device of FIG. 67. In this example, the entire system dissolves in water, and resorbs in the body over time. These two materials—silk and magnesium— provide a starting point for the transient electronics technology presented here.

Materials:

For this study, electronic components are fabricated using three basic resorbable materials: Mg (electrical conductor), silk fibroin (dielectric and substrate), and poly(vinyl alcohol) (alternative dielectric or substrate). This choice of materials offers a high degree of versatility in the design, construction, and performance of electronic devices, and provides compatibility with a broad range of environments. Importantly, Mg, [3] silk, [1,2,4] and PVA are all biocompatible, bioresorbable, non-immunogenic, and, in low doses, non-toxic, and thus are ideal for transient devices that are integrated with living hosts. Mg has a high electrical conductivity ($2.3 \times 10^5$ S/cm, approximately ½ that of Au), is mechanically robust, and readily processable using vapor phase deposition, all key characteristics for electronic device manufacturing. This is in contrast to the best organic conductors (such as PEDOT:PSS; Clevios™), which exhibit far lower (up to $10^3$ S/cm) and significantly temperature dependent electrical conductivities; the resorption and toxicity profile of this class of materials has not been definitively established. Non-resorbable Si and GaAs are used for the active electronic components, since these are the only known classes of materials that offer the necessary performance, in established device designs.

Silk is an extremely attractive material for transient electronics since its dissolution rate is readily and controllably tunable, from instantaneous to years, via variation of the degree of crystallinity (β sheet content) introduced during material processing, FIG. 69. [3] Thus silk can serve as both an intrinsically transient material and an overcoat or encapsulant to control the kinetics of other resorbable materials (e.g., Mg). This offers the possibility of creating layered structures that function as an "internal clock," timer, or "switch" (e.g., analogies to time release capsules and drug formulations) for programmable transience. Importantly, silk dissolution itself is mediated by chemical and biochemical processes such as enzymatic degradation, thus enabling integrated sensing/reporting devices, "self destruct" (i.e., triggered transience) mechanisms, and actively controlled systems.

Additionally, silk fibroin possesses favorable technological properties when interfaced with microelectronic structures. In previously unpublished results[13], silk has been used as a replacement for traditional inorganic oxide layers such as $SiO_2$ or PMMA. Capacitors and other devices have been manufactured on a glass/ITO substrate by stacking 400 nm thick silk layers as the gate dielectric, n- and p-type organic semiconductors (N,N'-ditridecylperylene-3,4,9,10-tetracarboxylic diimide (P13), and α,ω-dihexyl-quaterthiophene (DH4T) respectively), and gold gate and source electrodes. Both P13 and DH4T are well known and extensively researched materials and provide an ideal benchmark for the electronic performance of silk. The measured silk dielectric constant in the device configuration is $\varepsilon_s=6$, making it suitable for this work.

Alternative materials are also explored. Pure materials, material combinations, and patterning strategies are investigated to achieve controlled tunable transience over a broad temporal range. Material structures are fabricated with form factors (size, thickness, geometry, aspect ratio) found in electronic components, and their resorption kinetics in water will be quantified over conditions (e.g., temperature, salinity, light intensity) representative of typical deployment environments. In addition, strategies for more sophisticated temporal control, such as time sequenced resorption, exploitation of multiple transience mechanisms, inhibition/promotion, triggering, acceleration/deceleration, and destructive chemical reactions, are explored in the context of device operation.

Manufacturing:

Fabrication of transient electronics is extremely challenging, due to the intrinsic incompatibility of the materials with water based procedures that are used in conventional semiconductor device processing. In addition, the most interesting classes of semiconductor materials (e.g. Si, GaAs and others) cannot be deposited, doped or etched under conditions that do not degrade silk, synthetic polymers and the other transient electronic materials contemplated in this work. The inventors have, however, developed collections of unusual patterning and integration approaches that can be adapted for transient electronics, to overcome limitations of conventional processes. The three essential methods are:

1) Microtransfer Printing—

In recent years, the inventors have developed printing like methods[5, 7] for deterministic assembly of nanoscale inorganic semiconductor materials onto substrates of interest, ranging from sheets of plastic[8] and slabs of rubber[9] to films of silk.[1,2]. In this process, nanoribbons/membranes formed by lithographic processing of semiconductor wafers are 'inked' onto the surfaces of soft stamps, and then contact 'printed' into configurations and layouts that match device requirements. In this work, this technique is adapted for printing GaAs MESFETs and Si RF diodes onto silk substrates.

2) Precision Shadow Masking—

Advanced forms of soft lithography for patterning evaporated materials (e.g. metals, dielectrics) in a completely 'dry' process have been developed.[10] Here, ultrathin, conformal stencil masks placed into contact with a substrate of interest can enable resolution of a few microns. In this work, this method is used to pattern features of Mg for all passive components, interconnects and wiring for segmented actives.

3) Electrohydrodynamic Jet Printing—

Ultrahigh resolution forms of inkjet printing that use electrohydrodynamic effects have been invented. Here, nanoscale, conducting nozzles deliver fluid jets to a target substrate upon application of an electrical bias. Wide ranging classes of inks can be printed in this manner, with resolution that approaches—100 nm, more than two orders of magnitude better than that achievable with conventional ink jet methods[11,12]. In this work, this technique is extended for use with solutions of silk, to pattern dielectric layers in high frequency capacitors and inductors. The same method is used to coat selectively different regions of an integrated system, as a means to control relative rates of dissolution.

Characterization:

All passive and active components are characterized fully, using parameter and vector network analyzers and standard probe station equipment. Key parameters are determined, to assess performance against target metrics. Functionality of the radios and scavenger systems are evaluated using conventional means.

RF Circuitry Description

FIG. 70 shows a circuit schematic of the radio device and its physical realization in a flexible, plastic RF technology. The system consists of two functional parts: a module that scavenges RF power from the ambient (left) and a component that transmits a continuous RF signal, using power from the scavenger (right).

Scavenge Rectifier

Radio signals represent a source of power for operating certain classes of devices whose power demands are modest. The scavenger module does captures this ambient radio energy by collecting alternating current signals (AC) over a certain band of frequencies using antenna and then converting to direct current signals (DC) by passing through a high frequency, half-wave rectifier. The transmission line between antenna and rectifier matches the input impedance to eliminate signal reflections between them.

FIG. 71 shows a circuit schematic of the rectifier, showing the change of signal as it passes through each node. The simulation in this example uses a ±5 V alternating voltage source, representing the signal from the antenna, 1000 pF capacitors, and D1N4449 Schottky diodes. During a negative half cycle of the input AC, the forward biased D1 charges the C1 to +5V. As the input enters into a positive half cycle, reverse and forward biased D1 and D2, respectively, cause the upper node of C2 to swing to +10V, where it remains as it charges C2. As long as the charge dissipation times of the capacitors are longer than the input cycle time, the output from this single rectifier stays at DC 10V. The simulation indicates 9.3V, due to the voltage drop by the diodes. For some circuitry, it is possible to double the output DC voltage by adding one more identical rectifier, as the second stage in the figure, where C3 is charged to 15V and the output voltage at node C is 20V. The large capacitor at the rectifier output serve as elements for power storage.

Transmitter

The frequency of transmission depends on the resonant frequency of an inductor and two capacitors that serve as a simple LC oscillator. Attenuation of the signal in this oscillator due to resistive losses is compensated by a GaAs MESFET amplifier which serves as a small signal negative resistance device. FIG. 72 shows the procedure for designing the oscillator starting with simple equivalent circuit of MESFET. The input impedance, VIN/IIN, of the device with feedback elements X1 and X2 equals $$ZIN = j(X1+X2) - gmX1X2 \quad (1)$$

where gm is the trans-conductance of the MESFET. The oscillator uses two capacitors for X1 and X2 resulting in negative real part of input impedance. As long as this negative real part is 50% larger than any resistive losses of the LC oscillating system, the signal starts oscillating. The addition of resonating inductor make the net reactance looking into the gate of the feedback loaded transistor equal to zero at only one frequency, so the oscillation frequency occurs there by following equation.

$$fo = \frac{1}{2\Pi \sqrt{L \times \frac{C1 \times C2}{(C1+C2)}}} \quad (2)$$

The resistor next to the inductor is designed to match the impedance between the oscillator and the transmitting antenna.

The inventors demonstrated this system in an ultrathin, 'plastic RF' technology, as shown in FIG. 70. FIG. 73 represents the characteristics of certain individual elements for this system, including a representative MESFET and collection of passives, all on a thin sheet of polyimide, showing good response to several GHz. FIG. 74 shows a circuit diagram for a radio device that consists of a scavenging rectifier (left) and a transmitting oscillator (right). The bottom frames show the simulation result of transmitter where the transmitting frequency is at 1 GHz.

Radio Circuitry Specification

| Rectifier Components | | | |
| --- | --- | --- | --- |
| Name | Components | Value | Role in Circuit |
| $A_A$ | Antenna | — | Scavenge RF signal |
| $C_A$ | Capacitor | 47 pF | Rectifier components |
| $D_A$ | Schottky diode | — | Rectifier components |
| $C_B$ | Capacitor | 1 µF | Power storage |

| Rectifier Specification | |
| --- | --- |
| Input frequency | 2.4 GHz |
| Rectified output | 1-3 V |

| Transmitter Components | | | |
|---|---|---|---|
| Name | Components | Value | Role in Circuit |
| $C_c$ | Capacitor | 4.56 pF | LC resonator |
| $R_A$ | Resistor | 1 kΩ | Source bias |
| $R_B$ | Resistor | 16 Ω | Matching network |
| $L_A$ | Inductor | 11.1 nH | LC resonator |
| $A_B$ | Antenna | — | Transmit RF signal |
| MESFET | Active device | — | Amplifier |

| Transmitter Specification | |
|---|---|
| Output frequency | 1 GHz |

Preliminary Data on Mg Interconnects

The feasibility of using Magnesium for metallization and interconnect was explored, through a combination of literature studies and preliminary experiments. Table 5 summarizes literature values for the resistivity and native oxide thickness for Magnesium (Mg), Aluminum (Al), and Copper (Cu), which show that these materials have similar properties [14,15]. In addition, as a dielectric material, Magnesium Oxide (MgO) could be useful for the passive components. [16-20]. MgO is a high-k dielectric (MgO, k~9.7), and can be deposited by e-beam evaporation, which is compatible with the high resolution shadow masking techniques used in this work.

TABLE 5

| Resistivity and Thickness of native oxide, compared to Al and Cu | | | |
|---|---|---|---|
|  | Mg | Al | Cu |
| Resistivity (Ω · m) | $4.42 \times 10^{-8}$ | $2.82 \times 10^{-8}$ | $1.68 \times 10^{-8}$ |
| Thickness of native oxide | ~25 Å | 35~40 Å | 10~15 Å |

Simple experiments were performed to further support feasibility of Mg. Table 6 shows resistance/length measured on Mg lines with different widths (50/100/150 μm) and thicknesses (1500/3000 Å) on a glass substrate. FIG. 75 shows a plot of the values in Table 6.

TABLE 6

| Resistance/Length, Compared to Au Electrodes | | | | |
|---|---|---|---|---|
|  |  | Width (μm) | | |
|  | Thickness (Å) | 50 | 100 | 150 |
| Mg | 1500 | 10.777 | 5.098 | 3.441 |
|  | 3000 | 6.013 | 3.449 | 2.409 |
| Au | 1500 | 4.399 | 2.671 | 2.177 |
|  | 3000 | 2.805 | 2.377 | 1.964 |

Mg Electrodes for Si Transistors

N-type silicon metal oxide semiconductor field effect transistors (n-Si MOSFETs) with Mg electrodes were fabricated to compare to otherwise identical devices with Au electrodes. FIG. 76a presents width-normalized resistance of the device in the ON-state ($R_{on}$) as a function of the channel length at different gate voltages showing that Mg and Au have similar transistor contact resistances. FIG. 76b shows typical transfer curves in linear and semi-log scales (left), and full current-voltage curves (right). The threshold voltage is near −1 V, and ON/OFF ratios are ~$10^3$. These DC measurements of representative devices suggest that Mg can be used in high performance Si MOSFETs. FIG. 76c shows an image of an array of transistors on a glass substrate.

Rates for Mg Dissolution in Water

To explore the rates for Mg dissolution in water, test structures of Mg on glass were patterned. FIG. 77 shows that traces of Mg fully dissolve in water after 3 hrs (Ti/Mg, 50/1500 Å), and 10 hrs (Ti/Mg, 50/3000 Å), depending on the thickness. (The faint patterns that remain after complete dissolution of Mg correspond to ultrathin layers of Ti as an adhesion promoter.) The dissolution process involves the reaction of Mg with water to form magnesium hydroxide and hydrogen gas, according to: $Mg+2H_2O \rightarrow Mg(OH)_2+H_2$.

Different Candidate Interconnect Materials

Although the data provided above indicate that Mg is well suited for the present purposes, it might not be the only material that can be used. Table 7 presents different candidate interconnect materials based on their water solubility/dissolvability.[21-30].

TABLE 7

| Water-Soluble Conductors | | | | |
|---|---|---|---|---|
| Class | Material | Conductivity (S/cm) | Water soluble/ dissolvable | Processibility |
| Organic | PEDOT:PSS | up to 1 | Dissolvable | Solution processing |
|  | PANI/BPS-35 | up to 0.053 | Dissolvable | Solution processing |
| Inorganic | Mg | $2.26 \times 10^5$ | Dissolvable | Lift-off, Shadow masking |
| Nano-material | SWNT-PABS | 0.0056 | Soluble | Solution processing |
|  | SWNT with DNA binder | 306 | Soluble (limited) | Solution processing |
|  | SWNT with chitosan binder | 290 | Soluble (limited) | Solution processing |
|  | SWNT/SU-8 | 0.275 | Soluble | Lithography |
|  | Carbon black/ alumina | up to 0.2849 | Soluble | Solution processing |
|  | Silver nanowires | Up to $1.17 \times 10^4$ | Soluble | Solution processing |
|  | Silver nanoparticles | Up to $4 \times 10^4$ | Soluble | Solution processing |

Tunable Silk Dissolution

Rate for silk dissolution is determined by crystallinity (e.g. beta-sheet formation), and processing parameters that allow tuning of crystallinity, including:
1. Solvent (e.g. water, methanol, hexafluoroisopropanol)
2. Temperature, thermal history (e.g. annealing)
3. Strain, stress Parameters 1 or 2 are used to tune the dissolution rate, to achieve timescales for dissolution ranging from ~1 s to 1 year. Previous work shows, for example, fast dissolution occurs in less than 10 s for amorphous silk films, and as slow as about 1 year for highly crystalline silk films.[31]. FIG. 78 shows the rapid dissolution of a film of amorphous silk: 0 sec (left), 10 sec (right).

REFERENCES

1. D. H. Kim, Y. S. Kim, J. Amsden, B. Panilaitis, D. L. Kaplan, F. G. Omenetto, M. R. Zakin and J. A. Rogers, "Silicon Electronics on Silk as a Path to Bioresorbable, Implantable Devices," *Applied Physics Letters* 95, 133701 (2009).

2. D. H. Kim, J. Viventi, J. J. Amsden, J. Xiao, L. Vigeland, Y. S. Kim, J. A. Blanco, B. Panilaitis, E. S. Frechette, D. Contreras, D. L. Kaplan, F. G. Omenetto, Y. Huang, K. C. Hwang, M. R. Zakin, B. Litt and J. A. Rogers, "Dissolvable Films of Silk Fibroin for Ultrathin Conformal Bio Integrated Electronics," Nature Materials 9, 511 517 (2010).
3. X. Gu, Y. Zheng, Y. Cheng, S. Zhong, and T. Xi, "In vitro corrosion and biocompatibility of binary magnesium alloys," Biomaterials 30, 484 498 (2009).
4. Hu X, Kaplan D, Cebe P. Dynamic protein water relationships during beta sheet formation. Macromolecules 2008; 41:3939 3948; Hu X, Lu Q, Kaplan D L, Cebe P. Microphase separation controlled beta Sheet crystallization kinetics in fibrous proteins. Macromolecules 2009; 42:2079-2087
5. M. A. Meitl, Z. T. Zhu, V. Kumar, K. J. Lee, X. Feng, Y. Y. Huang, I. Adesida, R. G. Nuzzo and J. A. Rogers, "Transfer Printing by Kinetic Control of Adhesion to an Elastomeric Stamp," Nature Materials 5(1), 33 38 (2006).
6. J. H. Ahn, H. S. Kim, K. J. Lee, S. Jeon, S. J. Kang, Y. Sun, R. G. Nuzzo and J. A. Rogers, "Heterogeneous Three Dimensional Electronics Using Printed Semiconductor Nanomaterials," Science 314, 1754 1757 (2006).
7. S. Kim, J. Wu, A. Carlson, S. H. Jin, A. Kovalsky, P. Glass, Z. Liu, N. Ahmed, S. L. Elgan, W. Chen, P. M. Ferreira, M. Sitti, Y. Huang and J. A. Rogers, "Microstructured Elastomeric Surfaces with Reversible Adhesion and Examples of Their Use in Deterministic Assembly by Transfer Printing," Proceedings of the National Academy of Sciences USA 107(40), 17095-17100 (2010).
8. J. Viventi, D. H. Kim, J. D. Moss, Y. S. Kim, J. A. Blanco, N. Annetta, A. Hicks, J. Xiao, Y. Huang, D. J. Callans, J. A. Rogers and B. Litt, "A Conformal, Bio Interfaced Class of Silicon Electronics for Mapping Cardiac Electrophysiology," Science Translational Medicine 2:24ra22. DOI:10.1126/scitranslmed.3000738 (2010).
9. J. A. Rogers, T. Someya, Y. Huang, "Materials and Mechanics for Stretchable Electronics," Science 327, 1603 1607 (2010).
10. M. D. Dickey, K. J. Russell, D. J. Lipomi, V. Narayanamurti, and G. M. Whitesides, "Transistors formed from a single lithography step using information encoded in topography," Small 6, 2050 2057 (2010), and references therein.
11. J. U. Park, M. Hardy, S. J. Kang, K. Barton, K. Adair, D. K. Mukhopadhyay, C. Y. Lee, M. S. Strano, A. G. Alleyne, J. G. Georgiadis, P. M. Ferreira and J. A. Rogers, "High Resolution Electrohydrodynamic Jet Printing," Nature Materials 6, 782 789 (2007).
12. J. U. Park, J. H. Lee, U. Paik, Y. Lu and J. A. Rogers, "Nanoscale Patterns of Oligonucleotides Formed by Electrohydrodynamic Jet Printing with Applications in Biosensing and Nanomaterials Assembly," Nano Letters 8(12), 4210 4216 (2008).
13. R. Capelli, J. J. Amsden, G. Generali, S. Toffanin, V. Benfenati, M. Muccini, D. L. Kaplan, F. G. Omenetto and R. Zamboni, "Integration of silk protein in organic and light emitting transistors," in review
14. Tsung-Kuei Kang, Wei-Yang Chou, "Avoiding Cu Hillocks during the Plasma Process," Journal of the Electrochemical Society 151(6), G391-G395 (2004)
15. Timothy Campbell, Rajiv K. Kalia, Aiichiro Nakano, Priya Vashishta, Shuji Ogata, and Stephen Rodgers, "Dynamics of Oxidation of Aluminum Nanoclusters using Variable Charge Molecular-Dynamics Simulations on Parallel Computers," Phy. Rev. Let. 82(24), 4866-4869 (1999).
16. Jung-Min Cho, Kyoung-Ho Lee, Chae II Cheon, Nam In Cho, Jeong Seog Kim, "Characterization of the biaxial textures of MgO thin films grown by E-beam evaporation," Journal of the European Ceramic Society 30, 481-484 (2010).
17. Z. Diao, J. F. Feng, H. Kurt, G. Feng, and J. M. D. Coey, "Reduced low frequency noise in electron beam evaporated MgO magnetic tunnel junctions," Applied Physics Letters 96, 202506 (2010).
18. Tae Wook Heo, Sung Hwan Moon, Sun Young Park, Jae Hyuk Kim, Hyeong Joon Kim, "Effects of $O_2$ Ambient on the Properties of MgO Thin Films Deposited by E-Beam Evaporation," Journal of The Electrochemical Society 154(11), J352-J356 (2007).
19. Jeonghee Leea, Taewon Jeong, SeGi Yu, Sunghwan Jin, Jungna Heo, Whikun Yi, D. Jeonb and J. M. Kim, "Thickness effect on secondary electron emission of MgO layers," Applied Surface Science 174, 62-69 (2001).
20. L. Yan, C. M. Lopez, R. P. Shrestha, E. A. Irene, A. A. Suvorova, and M. Saunders, "Magnesium oxide as a candidate high-gate dielectric," Applied Physics Letters 88, 142901 (2006).
21. Ciro Chiappini, Xuewu Liu, Jean Raymond Fakhoury, Mauro Ferrari, "Biodegradable Porous Silicon Barcode Nanowires with Defined Geometry," Advanced Functional Materials 20(14), 2231-2239 (2010).
22. Hailin Cong, Lingfei Hong, Ryan S Harake and Tingrui Pan, "CNT-based photopatternable nanocomposites with high electrical conductivity and optical transparency," Journal of Micromechanics and Microengineering 20(2), 025002 (2010).
23. H G Lim, G Y Cho, Jaehwan Kim and K S Kang, "Au micro-pattern fabrication on cellulose paper: comparison of mu-contact printing and liftoff techniques," Journal of Micromechanics and Microengineering 17(8), 1415-1419 (2007).
24. Nurdan D. Sankir, Mehmet Sankir and Richard O. Claus, "Electrical and morphological characterization of polyaniline/sulfonated poly(arylene ether sulfone) composite films," Journal of Materials Science-Materials in Electronics 19(4), 389-392 (2008).
25. Kwadwo E. Tettey, Michael Q. Yee and Daeyeon Lee, "Layer-by-Layer Assembly of Charged Particles in Nonpolar Media," Langmuir 26(12), 9974-9980 (2010).
26. Whitten P G, Gestos A A, Spinks G M, Gilmore K J, Wallace G G, "Free standing carbon nanotube composite bio-electrodes." Journal of Biomedical Materials Research Part B-Applied Biomaterials 82B(1), 37-43 (2007).
27. Jianyong Ouyang, Chi-Wei Chu, Fang-Chung Chen, Qianfei Xu, and Yang Yang, "Polymer Optoelectronic Devices with High-Conductivity Poly(3,4-Ethylenedioxythiophene) Anodes," Journal of Macromolecular science 41(12), 1497-1511 (2004).
28. Bin Zhao, Hui Hu, and Robert C. Haddon, "Synthesis and Properties of a Water-Soluble Single-Walled Carbon Nanotube-Poly(m-aminobenzene sulfonic acid) Graft Copolymer," Adv. Funct. Mater. 14(1), 71-76 (2004).
29. Yuning Li, Yiliang Wu, and Beng S. Ong, "Facile Synthesis of Silver Nanoparticles Useful for Fabrication of High-Conductivity Elements for Printed Electronics," J. AM. CHEM. SOC. 127, 3266-3267 (2005).
30. Qingzhi Wu, Huaqiang Cao, Qiuying Luan, Jiyong Zhang, Zhao Wang, Jamie H. Warner and Andrew A. R.

Watt, "Biomolecule-Assisted Synthesis of Water-Soluble Silver Nanoparticles and Their Biomedical Applications," Inorganic Chemistry 47, 5882-5888 (2008).

31. Y. Wang, D. D. Rudym, A. Walsh, L. Abrahamsen, H.-J. Kim, H. S. Kim, C. Kirker-Head, D. L. Kaplan, "In vivo degradation of three-dimensional silk fibroin scaffolds," Biomaterials 29, 3415-3428 (2008).

Example 8

Historically, development of every new class of electronics has involved efforts to achieve operation in forms that undergo negligible change with time. The technology described here has an opposite goal: to create electronic systems that physically disappear into the surrounding environment in a benign way, at prescribed times and with well-defined rates. Enabled devices include medical monitors that fully resorb when implanted into the human body ('bio-resorbable') to avoid adverse long-term effects, and environmental monitors that dissolve when exposed to water ('eco-resorbable') to eliminate the need for collection and recovery. Other concepts involve 'compostable' circuits, to facilitate disposal.

Work described in this Example provides a scientific and engineering base of knowledge on materials, manufacturing strategies and modeling tools for this sort of technology, which is referred to as resorbable electronics. The targets in performance, reliability in operation and scalability in integration are comparable to those of established silicon integrated circuits. This technology will produce:

A complete set of materials—semiconductors, conductors, interlayer dielectrics, substrates and encapsulation layers—and device designs for resorbable electronics. An emphasis will be on materials that are (1) resorbable by dissolution or hydrolysis, (2) biologically compatible and environmentally benign and (3) capable of performance comparable to that of conventional silicon integrated circuits.

Manufacturing strategies matched to these materials, with the ability to meet requirements in throughput, resolution and cost for realistic applications. The resorbable nature of the devices, and their associated cost considerations, demand fabrication approaches that are much different than those used in the established semiconductor industry.

Analytical and computational models for resorption at the material, device and systems levels. In resorbable electronics, such models will provide computer-aided design (CAD) tools with roles conceptually similar to those currently used for circuit design in conventional technologies.

These three components combine basic scientific studies with inventive engineering efforts, to set the foundational knowledge for a practical technology. Successful outcomes will enable unique device applications in areas ranging from sensor/actuator appliques that mitigate effects of surgical site infections and then bio-resorb, to radio-enabled water monitors that eco-resorb eliminating waste. The commercial opportunities associated with these and other systems define an important set of broader impacts. The sustainable manufacturing approaches, the associated reductions in resource consumption and elimination of hazardous waste streams constitute additional features with notable global significance.

Stretchable Electronics:

Traditional semiconductor technologies involve components and integrated systems formed on the planar surfaces of brittle wafer substrates. Recent work demonstrates that combined strategies in materials, mechanics and manufacturing enable new possibilities, including devices that can stretch, fold, bend and twist with linear elastic response, and wrap curvilinear surfaces [1]. The core ideas exploit micro/nanodevices assembled on rubber substrates, and interconnected by deformable thin, narrow structures formed by controlled non-linear buckling processes [2]. These investigations yielded the first hemispherical electronic 'eyeball' camera, in which device components are in ultrathin, square geometries, and the interconnects adopt serpentine, non-coplanar layouts [3]. This arrangement can accommodate deformations at levels of strain that approach 100%. Here, mechanical engineering design in the structure plays a role as prominent as that of circuit/optics design in traditional systems. The yields are sufficiently high to enable fabrication of epidermal electronics and surgical components with modes of functionality and soft, 'tissue-like' construction that are impossible to achieve using any other technology.

Incorporating variability, ecological and biological resorption and biomaterials into a manufacturable semiconductor technology that offers high performance and robust operational characteristics is clearly a high-risk proposition. With this risk, however, comes the potential for transformative impact, through the creation of new application possibilities for electronics, new modes for efficient manufacturing and elimination of the classes of waste streams that are associated with current electronics technologies. Furthermore, many of the underlying ideas have applicability beyond systems that offer electronic functionality. For example, bio-resorbability in functional materials, scaffolds and chemical delivery systems has relevance to many areas of biomedical science, interventional medicine, and regenerative technology. Eco-resorbability in structural elements and mechanical systems and means for efficient manufacturing of them have the potential to address many challenges in sustainable development.

Bio/eco-resorbable electronic systems are much different than any semiconductor technology that exists today. In some cases, resorbable applications rely on capabilities that cannot be achieved in any other way. In others, resorbable devices reproduce existing functions, but with product life-cycles that eliminate waste streams and reintegrate in the environment. As an example of the former possibility, consider a bio-resorbable electronic bacteriocidal appliqué that is delivered to the external surfaces of medical implant devices, such as permanent pacemakers, implantable defibrillators, mechanical circulatory support devices or artificial hips and knees. Such a device could be configured to eliminate surgical site infections (SSI) through the delivery of pulses of heat in a spatio-temporally controlled manner via radio frequency coupling and sensory feedback. Over one or two weeks, the device would disappear by bio-resorption, as the patient moves beyond the period of greatest risk, to rid the patient of unnecessary device burden. This type of function would address a significant clinical problem: SSI is the second most common form of healthcare-associated infection, responsible for 17% of all health-acquired infection [1,2]. The associated cost is enormous, both in terms of patient morbidity, mortality and dollars. A recent study examining post-surgical discharge patient costs found an eight-week cost average of $1773 for patients without SSI versus $5155 for patients with SSI [3]. Costs escalate even further if a patient has a resistant organism associated with the SSI. Anderson et al found that in the case of SSI associated with a resistant *staphylococcus*, i.e. methicillin-resistant *staphylococcus aureus* (MRSA), typical charges averaged $60,000 versus $20,000 for patients with antibiotic sensitive *staph* [4].

The latter possibility is a problem of increasing urgency, driven by disposal of end-of-life consumer electronics. In recent years, the United States alone has generated tens of millions of tons of electronic waste annually, with a re-use/recycle rate in the range of only ten percent, leaving the rest to enter into the municipal waste stream. This burden is prominent in all developed countries, but most worrisome is its rate of growth in developing countries—a 2010 report forecasts that the global generation of obsolete personal computers in developing countries will exceed that of developed regions in the coming decade. By 2030, discarded computers from developing regions are predicted to total 400-700 million units, twice that of developed regions at 200-300 million units with recycling costs in excess of 50 B$/yr. An eco-resorbable electronics technology of the sort described here has the potential to alleviate, at least partly, some of the adverse economic and environmental impacts of these trends.

Background Work—

Figure 66:
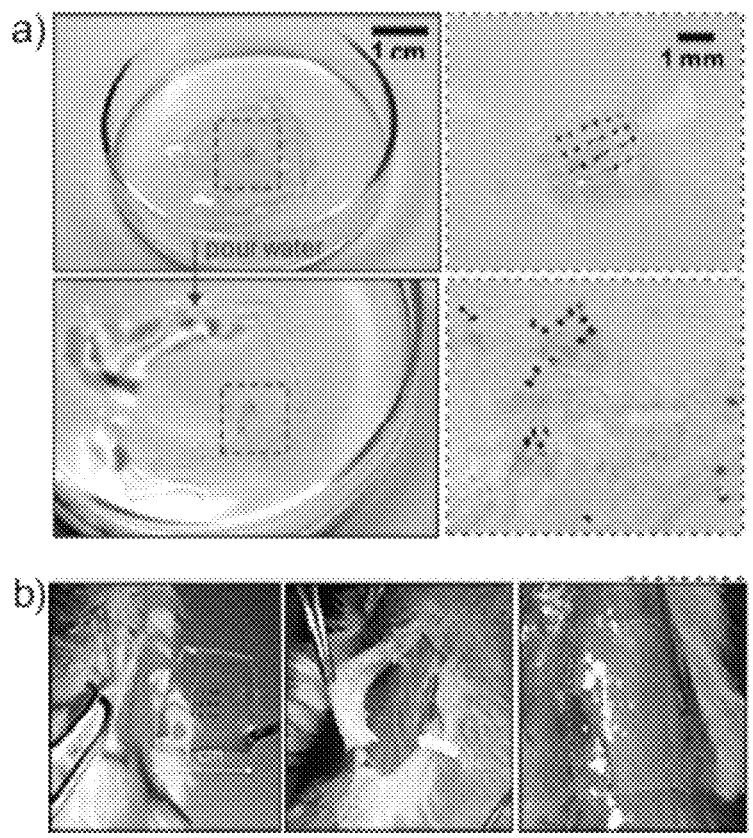

Certain ideas for resorbable electronics originated with work on the use of water soluble, bio-compatible films of silk as substrates for silicon metal oxide semiconductor field effect transistors (S1-MOSFETs) and functional neural electrode arrays (Kim, D.-H. et al. Dissolvable films of silk fibroin for ultrathin, conformal bio-integrated electronics. Nature Mater. 9, 511-517 (2010)). Such systems embody an incomplete form of resorption, where the supporting substrate, which does not have an active role in the device operation, is the only component that disappears. FIG. 66 shows images of the first example: an array of Si MOSFETs built on a thin sheet of silk fibroin derived from silkworm cocoons. Silk is water soluble and bio-resorbable, with dissolution rates that can be adjusted between seconds and months, depending on the processing conditions. Preliminary in vivo testing of this 'silicon-on-silk' technology shows that the substrate resorbs over time, leaving just the Si MOSFETs, without inflammation, swelling or other adverse responses.

The second example provides probes for electrocorticography (ECoG) in ultrathin, open mesh layouts that spontaneously conform to the moist, curvilinear surface of the brain. Because the devices themselves are difficult or impossible to manipulate due to their exceptionally low bending stiffnesses, sheets of silk were used as temporary mechanical supports. Washing with saline solution after mounting on the brain dissolves the silk and initiates a spontaneous wrapping process for the remaining electronics, driven by capillarity. In-vivo neural monitoring experiments performed on feline animal models demonstrate the utility of this design. Detailed comparative studies indicate that this type of device outperforms all alternative monitoring technologies, due to the low-impedance, intimate electrode-tissue contact that forms upon dissolution of the silk.

Additional recent work from other groups describes forms of organic and bio-organic electronics in which certain constituent layers are water soluble. (1. Bettinger, C. J. & Bao, Z. Organic thin-film transistors fabricated on resorbable, biomaterial substrates. *Adv. Mater.* 22, 651-655 (2010). 2. Irimia-Vladu, M. et al. Biocompatible and biodegradable materials for organic field-effect transistors. *Adv. Funct. Mater.* 20, 4069-4076 (2010). 3. Legnani, C. et al. Bacterial cellulose membrane as flexible substrate for organic light emitting devices. *Thin Solid Films* 517, 1016-1020 (2008).) Although some of these materials are potentially complementary to those described here, the modest performance and uncertain reliability of devices enabled by them will prevent many applications of interest, as discussed below.

A set of functional materials that can be used with silk platforms and packages to yield fully transient forms of electronics, with exceptionally high performance, are described. For the electrodes and interconnects, thin films of Mg represent an excellent choice, due to spontaneous reaction with water to form $Mg(OH)_2$, which is environmentally and biological benign. (Mg is used as a structural material in certain kinds of resorbable intravascular stents. Witte, F. The history of biodegradable magnesium implants. *Acta Biomater.* 6, 1680-1692 (2010).) In addition, Mg offers high electrical conductivity ($2.3 \times 10^5$ S/cm, approximately ½ that of Au), it is mechanically robust, and readily processible using vapor phase deposition. Because hydrolysis of Mg involves MgO as an intermediate, this oxide becomes a natural option for an interlayer dielectric.

For the semiconductor, silicon itself is an interesting candidate because it undergoes hydrolysis to form ortho silicic acid: $Si(OH)_4$. (J. D. Rimstidt, H. L. Barnes, *Geochim. Cosmochim. Ac.* 44, 1683 (1980).) A challenge is that the rates for the associated reactions are exceptionally small: using literature parameters for diffusion and rate constants (H. Seidel, L. Csepregi, A. Neuberger, H. Baumgartel, *J. Electrochem. Soc.* 137, 3612 (1990)), one can estimate that a piece of silicon with dimensions comparable to those of a diced integrated circuit (~12 mm×~12 mm×~700 μm) will require more than ~600 years to dissolve and nearly ~8 L of water to avoid solubility limits. A key insight, however, is that devices such as MOSFETs can operate well with silicon in extremely thin forms, due to the interfacial nature of charge transport. A nanomembrane of silicon (Si NM) with lateral dimensions similar to those of the integrated circuit considered above but with a thickness of 35 nm will dissolve in ~10 days, in as little as ~0.4 mL of water. Experimental results support this conclusion. Silicon in this form can, therefore, be used as a resorbable semiconductor. Just as important, thin $SiO_2$ is resorbable via similar chemistry, thereby providing an excellent gate dielectric for use in Si NM MOSFETs. Furthermore, both Si and $SiO_2$ are bio and eco-compatible; use of porous silicon bodies as drug delivery vehicles provides evidence of the former. (1. Park, J.-H. et al. Biodegradable luminescent porous silicon nanoparticles for in vivo applications. Nature Mater. 8, 331-336 (2009). 2. Trewyn, B. G. et al. Biocompatible mesoporous silica nanoparticles with different morphologies for animal cell membrane penetration. *Chemical Engineering Journal* 137, 23-29 (2008).)

Collectively deploying all of these materials with silk as a substrate and an encapsulant yields integrated circuits that are fully resorbable, with rates that can be adjusted by selection of thicknesses and compositions of the various device layers. FIG. 3c shows a demonstration platform that includes a diverse range of active and passive components, including Si NM MOSFETs, Mg/MgO/Mg capacitors, Mg inductors, and Si NM diodes, all on a thin film of silk. In MOSFETs with Mg electrodes (thickness ~250 nm) for the source, drain and gate; MgO and/or $SiO_2$ for the gate dielectric (thicknesses between 100 and 150 nm); and Si NMs (thickness 300 nm) as the semiconductor, excellent properties are possible, including saturation and linear regime mobilities of 560 $cm^2$/Vs and 660 $cm^2$/Vs, respectively, on/off ratios of $>10^5$, subthreshold slopes of 160 mV/dec (at Vd=0.1 V) and width-normalized current outputs of 0.34 mA/mm (at Vg=5 V). These characteristics compare favorably to those of counterparts with similar critical dimensions formed on silicon wafers. Combining multiple such devices provides a route to integrated circuits.

A set of interrelated scientific issues underpin resorbable electronics, and the multiple applications that this new class of technology can support. This Example describes materials and material interfaces, device and circuit engineering, manufacturing techniques and predictive theoretical modeling. Combining this knowledge allows for functional demonstration vehicles, as a key step toward establishing a path for scalable production of these components. The outcome is a complete base of science and engineering knowledge for resorbable electronics, with an emphasis on bio- and eco-resorbable devices that disappear completely, due to molecular level dissolution or chemical reaction. The following sub-sections describe the three enabling components: materials, manufacturing and modeling.

Materials for Resorbable Electronics

Research on materials is essential to the development of a resorbable electronics technology. The semiconductors, conductors, gate dielectrics, interlayer dielectrics, encapsulation layers and substrates serve as a baseline for the described efforts. One significant finding is that doped and undoped Si NMs chemically transform in a biologically and environmentally benign manner, by hydrolysis. Embodiments of the invention described here exploits this fact to develop other classes of materials for a complete bio/eco-resorbable electronics technology. This work addresses the fundamental aspects of advanced materials for conductors, dielectrics to enable control over their resorption times, where practical applications can demand times that range between a few minutes and several months. The first phase of research focuses on understanding and controlling the individual materials and their interfaces. In a second phase, their collective integration in patterned multilayer configurations, to define overall resorption times of the resulting structures, is explored. Throughout this time, the work interfaces closely with efforts in manufacturing to develop devices and circuits with desired behaviors.

Resorbable Conductors—

Mg is used as a starting point. Past efforts in Mg as a structural material for resorbable intravascular stents provide motivation for exploring alloys of Mg, for which small quantities (general ~10% by weight) Al, Ag, Ca, Li, Mn, Si, Sn, Y, Zn, Zr, and rare earth elements [2] yield, mostly ternary systems. The electrical properties and the resorption rates of these alloys are examined, through combined electrical, chemical and morphological studies. For instance, in one studied example, magnesium-aluminum-zinc alloys have bulk resistivities almost double that of pure Mg (with 3% aluminum, 1% zinc), but both the bulk and thin film dissolution rates are significantly slower (by as much as 4 times at physiologically and environmentally relevant ranges of pH). In general, higher aluminum concentrations slow the bulk degradation rate (e.g. AZ61 or AZ91). Slow resorption can be particularly important for device classes that demand continuous contact between electrodes in biological systems (e.g. bio-resorbable electrophysiological monitors) or aqueous sensing environments (e.g. eco-resorbable sensors). For such purposes, W could be interesting, due to its previous use in resorbable embolization coils. Here, W exhibits resorption rates (to form tungstic acid, as a result of hydrolysis) that are much lower than those of Mg or its alloys, as shown in published studies. In vivo studies of W embolization coils indicate increased levels of serum tungsten during resorption but without any adverse biological response [6]. The bulk resistivity of W is very similar to Mg ($5\times10^{-8}$ $\Omega$m vs $4.4\times10^{-8}$ $\Omega$m). Combinations of W, for example as capping layers, with Mg are possible as additional engineering design options.

A third metal is Fe, which has, like Mg, received interest as a biodegradable material for stents. Iron resorbs in water by first oxidizing and then dissolving to either $Fe^{2+}$ or $Fe^{3+}$, depending on the pH. In vitro testing indicates degradation rates in Fe that are much lower than those for Mg. On the other hand, in vivo degradation rates are much lower than the rates predicted by in vitro studies [8]. This difference has been attributed to passivation of the iron surface by some insoluble compound, such as iron phosphide which could form from reaction with phosphate ions in the body. Some combination of Mg, Mg alloys, W and Fe likely provides all of the necessary capabilities for conductors in resorbable electronics.

Resorbable Dielectrics—

For gate dielectrics in MOSFETs and interlayer dielectrics in integrated circuits, $SiO_2$ and MgO have strong potential to satisfy all requirements. Detailed studies of resorption rates and kinetics in these systems, with comparisons to modeling, provide important information. To enable additive processing using the techniques described below, sol-gel routes to organically modified silica materials and their ability to serve not only as interlayer dielectrics, but also potentially as gate insulators, are explored. These materials in single layers, or in multilayer configurations with metals such as W and bio-polymers such as silk, can be used as encapsulants to control overall resorption rates. These options are explored, with an emphasis on measuring water permeation rates for different stack designs, with high resolution electron microscopy studies of the morphologies and interfaces.

Resorbable, Functional Substrates and Coatings

Rationale for Materials Selection—

Organic and bio-organic materials that are compatible with the metals, dielectrics and semiconductors described above represent excellent candidates for substrates and encapsulants. Silk is a biomaterial that is uniquely suited for ressorbable electronics, due to its favorable combination of biological, physical and electronic properties, and its compatibility with advanced manufacturing. Silk is a widely available commodity textile that can be purified and manufactured cost-effectively as thin, smooth flexible sheets with simple water-based processing. The native surface chemistry and smooth morphology of silk allows for strong adhesion of metals (e.g., gold, iron, others) with further simple modification possibilities (e.g., carbodimmide, streptavidin-biotin coupling, diazonium reactions, as well as control of casting temperature and humidity) to optimize interfaces. Silks form tough, strong materials due to the hydrophobic nature of the protein and its self-assembly into physically crosslinked networks. By controlling the density of crosslinks, the films can be formulated to dissolve at controlled rates (from minutes to years), and can be designed to incorporate and stabilize biomolecules and other targets of interest for sensing. Alternatives such as collagen, PLGA, and PLA each offer only some subset of these features. As examples, collagens are prone to denaturation, they tend to swell upon hydration and they fail to achieve robust interfaces with metals. PLGAs have similar disadvantages, and they also must be processed in organic solvents, thereby removing certain processing options as well as the ability to combine with biologically active compounds. Other less commonly studied options including chitosan/chitin, polyhydroxyalkanoates, polycaprolactone (PCL) and keratin are challenging to process and offer limited ability to control the material properties and, consequently, their degradation/resorbability.

Silk Film Formulation and Resorption Studies—

The liquid-solid transition occurring during silk film formation, and the associated silk protein self-assembly, crystallization, processing chemistry, and methods are of fundamental importance for resorbable device fabrication. Silk materials are enzymatically degraded providing predictable lifetimes and control of material fate. Thus silk can serve as both an intrinsically resorbable substrate material or as an overcoat or encapsulant to control the kinetics of other resorbable materials (e.g., Mg). This offers the possibility of creating layered structures that function as an "internal clock," timer, or "switch" (e.g., in analogy to time-release capsules and drug formulations) for programmable resorbability.

This work establishes the knowledge base to develop silk substrates for resorbable electronic devices. In particular, different modalities to post-process silk films and silk coatings to control their rate of resorption (either in the presence of water or enzymes) are explored. The dissolution rate (instantaneous to years) of such materials is controlled through the degree of crystallinity ($\beta$-sheet content) introduced during material processing [3]. These fundamental studies yield a set of processing parameters for material substrate fabrication. The experimental approach includes the preparation and characterization of silk solutions which are used to form films and coatings, which are then post-processed to control the end crystalline state of the film/coating, thereby determining its resorbability rate.

There is a largely unexplored relationship between assembly and resorbability for silk films and coatings. To unravel this relationship, the current approach involves varying silk solution formulations by adjusting parameters in the fibroin extraction process (variation of boil times, pH, and processing temperature) and subsequent generation of water-based silk solutions with varying degrees of concentration. Systematic analysis of the generated silk sheets elucidates the role of post-processing temperature, of additional solvents (e.g. methanol, HFIP), of the environmental humidity range (which determines the dry film's water content, in turn correlated to its $\beta$-sheet content) and of the stress and strain imposed on the silk film during its formation (which also induces $\beta$-sheet formation). Structural assessments of the films are carried out with a cadre of diagnostics (e.g. AFM, FTIR, X-ray and cryo-TEM). These studies inform the appropriate parameter combinations needed to generate suitable substrates for electronic interfaces and to obtain predefined and controllable resorption rates of the substrate materials.

These bioresorbable substrates are also evaluated from an electrical and electrical interface standpoint. Measurements of the different films are carried out to determine baseline parameters, such as the dielectric constant, breakdown threshold, and resistivity. Interface properties are particularly important for electronic device assembly. The interface properties between differently formulated films and Mg, and MgO are studied, along with their thermal properties (thermal conductivity, interface Kaptiza resistance), or bulk properties (levels of ionic impurities and their mobility, water uptake, and gas/liquid permeability to name a few).

Functionalized Resorbable Materials—

Modifications of the substrate through the addition of dopants to the silk solution will further compound these studies. This extra degree of freedom offers options to modulate the physical parameters of the substrates (for example enhancing conductivity or entraining therapeutics for bio-integration). The effect of biochemical dopants embedded in the silk system related to the ambient environment and material parameters (e.g. elasticity, degradation, interfaces, water content) and their effect on resorption rates and interfaces with Mg and MgO are evaluated. Silks are doped with biologically relevant dyes (fluorescin, rose Bengal, rhodamine), protein-based bio-dopants (reflectin, bacteriorhodopsin, hemoglobin, porphyrin), or chemically modified (GFP, azobenzene). The doped resorbable substrates are prepared and assessed using the same processing and diagnostics described above. Results are directly compared to the findings obtained with undoped films under the same processing conditions.

Manufacturing Methods for Resorbable Electronics

Low cost manufacturing is an essential requirement for a realistic resorbable electronics technology, due to the intrinsically finite operational (and physical) lifetimes. Processes used in the semiconductor industry are not applicable because of their incompatible cost structures and because many resorbable materials are incompatible with established solvents, photoresists, developers, exposure techniques and etching methods. This work develops a manufacturing strategy that involves two main steps (1) transfer printing, to allow manufacturing with Si NMs and, ultimately, integration of partially formed device sub-components obtained through existing foundry sources, with resorbable substrates, and (2) electrohydrodynamic jet (e-jet) printing to establish resorbable interconnects, interlayer dielectrics and encapsulants/packages for functional systems. The first phase focuses on the separate development of these two capabilities. The second phase involves their integration with one another and with more conventional methods into a continuous manufacturing process, demonstrated at a small scale in demonstration test vehicles described below.

Microtransfer Printing—

For the first step, micro transfer printing ($\mu$TP)[1] techniques are used with a goal of implementing them in high speed, roll-to-roll manufacturing modes. The $\mu$TP process uses soft, elastomeric stamps to lift solid material micro/nanostructures fabricated from a source substrate, in an 'inking' step, and then to place them down onto a target substrate, in a 'printing' step. With optimized strategies for controlling the strength of adhesion at the stamp surface (i.e. strong and weak in the inking and printing steps, respectively) the entire procedure can be automated to enable high yields (>99.9%) and placement accuracy (<1 $\mu$m). FIG. 45 provides images of representative printing results, and a large sheet of silk as a resorbable receiving substrate for this process. Work described above and shown in FIG. 3c illustrates how this type of strategy can be used with Si NMs to fabricate resorbable electronics. A key feature of this process is that Si NMs formed in close-packed layouts on silicon wafers can be retrieved and delivered to target substrates in areal coverages that match system requirements. This capability is essential for efficient materials utilization, and low cost.

This work develops new fundamental and engineering knowledge for use of $\mu$TP in a high-speed, continuous, roller printing mode. In particular, the physics of soft, van der Waals adhesion in which the bonding strength depends on the direction of forces applied at the interface between a specially designed stamp with angled relief and a source substrate are explored. This approach is attractive for two reasons. First, angled geometries enable enhanced pull-off forces. This physics is important when large forces are needed to retrieve materials/devices in the inking step of $\mu$TP, as will be the case for the CMOS structures described in the next section. Second, direction-dependent adhesion can be exploited in thin stamps wrapped around cylindrical supports, to enable high-speed operation in a continuous, roller printing mode. A scheme in which the roller stamp retrieves devices/structures on one side and delivers them to the target substrate on the other side, continuously is possible. Periodically indexing the source substrate in a direction orthogonal to the rolling direction, and translating it back to its starting point allows the inking process to occur in different regions, until all of the material on the source is consumed. Fresh source substrates can be inserted, as needed.

Understanding the fundamental aspects of both the direction dependence and the overall strength of adhesion is critically important to allowing their engineered use for present purposes. The key physics are analyzed by a mechanics model of interfacial delamination, where the asymmetric pull-off force results in a bending moment that creates interfacial shear that drives crack formation. By evaluating the conditions, it is possible to derive analytically the critical pull-off forces, for connection to experimental measurements with substrates of silk in different formulations. These types of models serve to guide not only engineering implementations of roller stamps, but also optimization of the material and relief geometries and choice of silk. For the stamp, adding re-entrant features of relief to the angled post structures can lead to dramatically enhanced adhesion, by shifting of points of stress concentration away from the edges and into the interior of the contacting area. These effects, along with the influence of viscoelasticity, physical crosslinking, and related parameters in both the stamp and the receiving silk substrates are explored, in combined scientific and engineering studies.

From Silicon Foundry Devices to Resorbable Electronics—

Although schemes that use Si NMs derived from wafers and assembled by µTP provide feasible routes to resorbable electronics, per results presented above, they are non-ideal, for two reasons: (1) they require device processing and critical features to be defined on the resorbable substrate and (2) they are unable to exploit established infrastructure for manufacturing of silicon integrated circuits. The first influences the performance and levels of sophistication in function that can be achieved, due to the severe constraints in processing options imposed by requirements for compatibility with the silk substrate. The second substantially increases the cost, and also the environmental impact, due to the need for establishment of separate foundry networks specifically configured for resorbable devices. This work addresses these two limitations by providing routes to convert specially designed, foundry-processed wafers into sources of component building blocks for resorbable systems. µTP is used as a means to manipulate not just Si NMs, but fully processed primitives or small circuit elements derived from foundry-processed wafers.

The key challenge is to adapt foundry-compatible layouts and available material sets for present purposes. Although preliminary findings establish Si and $SiO_2$ as biocompatible and environmentally friendly resorbable, no other materials in commercial integrated circuits have such characteristics. One solution is to source from foundries integrated circuits and primitives on ultrathin body silicon-on-insulator (SOI) substrates, in layouts with reduced complexity and configurations suited for µTP. A modest number of additional steps, capable of being performed outside of the foundry, replace the metallization layers with resorbable conductors, such as Mg. Here, layouts allow access to metallization throughout the stack, its removal and subsequent replacement with resorbable conductors; lateral definition of the silicon, the doped regions, the gate dielectrics and the interlayer dielectrics are unaltered, in order to capitalize on foundry capabilities. Schemes for this material exchange are developed, along with routes for removing the buried oxide (BOX) on the SOI substrate to prepare the components for µTP. The first can be accomplished using a combination of wet and drying etching techniques. Addressing the second challenge requires careful study of the fracture mechanics of strategic structures (i.e. anchors) that tether the components to the underlying wafer after removal of the BOX. Enhanced adhesion enabled by the angled stamp designs and suitably processed silk substrates relaxes requirements. FIG. 48 provides an SEM image of one type of anchor design, on a non-resorbable Si CMOS block formed on SOI and then released by etching the BOX.

Electrohydrodynamic (e-Jet) Printing—

Schemes for interconnecting and selectively encapsulating the sort of resorbable components described in the previous section are required for functional systems. The resolution must be sufficiently high to allow small contacting pads on the individual components, for efficient utilization of the area of the source wafers (for resorbable CMOS, or for Si NMs). Printing methods that use electrohydrodynamic effects to create fluid flows at the tips of high resolution nozzles, due to its additive nature and compatibility with a wide range of material inks and substrates, are pursued. Most important, previous work demonstrates that this physics provides a resolution in droplet generation and printing that extends into the deep sub-micron range (~100 nm), which exceeds by more than 100 times the best resolution possible with conventional ink jet technologies [3]. These features make this method, referred to as e-jet, a potentially powerful complement to µTP for manufacturing of resorbable electronics. Two key shortcomings in the science and engineering aspects must, however, be overcome (1) the resolution and droplet placement can depend on the local electrical characteristics of the substrate, and (2) the throughput is limited, due to the absence of systems that can accommodate use of multiple, parallel nozzles in a continuous, roller printing mode. The first issue leads to challenges in the reliable formation of interconnect lines between resorbable components delivered to an insulating substrate, such as silk, by µTP. In particular, the spatial variation in local electronic properties of the target surface (i.e. metal, dielectric, semiconductor) induces changes in electric field profiles and, therefore, droplet sizes and trajectories, in ways that can be difficult to accommodate. One solution is to develop coupled electromagnetic and flow models for e-jet nozzles that incorporate, into the nozzle assembly itself, a ring-shaped counterelectrode. The result is a system in which all of the driving electric fields are defined in a way that is decoupled from the substrate. Inductive current sensing provides a means to establish feedback control over the printing process.

The second shortcoming is addressed by extending the simulation capabilities that emerge from the work above, to understand electrostatic coupling between adjacent nozzles in linear arrays. The simulation should incorporate the ability to accommodate some degree of substrate misalignment by individually moving each nozzle unit on a separate adjustment micro-platform. An analogy would be a test pattern sequence used by a conventional ink-jet printer to adjust print cartridge calibration. 10-20 different nozzles are incorporated in an overall print head, in a linear arrangement, capable of precision translation with respect to the direction of motion of the underlying substrate. At droplet generation rates that currently extend to 50 kHz, this multinozzle arrangement provides the required throughput. A challenge is to locally embed sufficient intelligence into each unit so that it acts as an autonomous entity, calibrating itself by communicating with the web handling system and µTP module without external assistance. Feedback strategies based on current sensing, described above, and monitoring systems in the µTP tool are developed. An important perspective on this manufacturing flow is that the critical device dimensions and, in many cases, the most demanding features are formed at the level of the foundry-sourced components. This circumstance reduces demands on throughput and resolution required of the e-jet system, although even here feature sizes below those achievable with conventional ink jet printing are necessary to cost effectively utilize the foundry components, by allowing the use of small contact pads.

However, in eventual commercial manufacturing, it is likely that e-jet will be used strategically with other methods, such as ink jet and screen printing, to form an optimal balance of resolution, throughput and registration accuracy. An integrated processing line, involving µTP, e-jet and ink jet, with an initial step of imprinting (conventional, thermal embossing) to define registration marks is envisioned. As outlined above, the established compatibility of silk with these other modalities represents a critical consideration of its use in this way. In this sequence, only the patterns formed by e-jet and ink jet require registration. Here, optical pattern recognition systems use a combination of structures formed by µTP and the relief defined by the embossing step. The initial phases of work focus on the µTP and e-jet modules. In parallel, the use of e-jet in additive (e.g. silk, solgel materials) and subtractive (e.g. Mg, W) patterning modes with the materials are established. Integration focuses on building the circuit test vehicles described below.

Computational Design Tools for Resorbable Electronics

Analytical and computational models are needed to establish a base of scientific knowledge and engineering capabilities for resorbable electronics. Circuit design tools used for conventional electronics capture only part of the operational aspects; a complementary set of resorption design tools are necessary. Analytical and computational models for resorption at the material, device and system levels, with direct connection to experimental results based on the materials, device designs and manufactured structures are described above. The first phase focuses on establishment and experimental verification of the models, based on single layer studies of the various materials outlined above. Next, multilayer stacks of these materials, and their interactions with one another are studied. Final models capture resorption at the functional device and system levels, in test vehicles, manufactured with the techniques described above.

Modeling of Resorbable Materials—

Analytical studies of the kinetics of resorption use models of reactive diffusion. Equation (1) illustrates the model and some results for diffusion of water and hydroxide ions into the Si. The rate limiting step is defined by the diffusion of water, hydroxide ions and other liquids into the materials for resorbale electronics (e.g., Si, SiO, MgO, Fe, Mg and Mg alloys with small additions of Al, Ag, Ca, Li, Mn, Si, Sn, Y, Zn, Zr) and reaction throughout the thickness direction y, according to $$D\frac{\partial^2 w}{\partial y^2} - kw = \frac{\partial w}{\partial t}, \quad (1)$$

where D and k are the diffusivity for water (or other liquid) and the reaction constant between the materials for resorbable electronics and phosphate buffer solution, respectively, and w is the concentration of water. Upon dissolution of Si, the following equilibrium will be established: $Si+4H_2O \leftrightarrow Si(OH)_4+2H_2$, where the neutral ortho-silicic acid will leave the silicon surface by diffusion. In this model, the thickness h of the Si nanomembrane, normalized by its initial thickness ($h_0$), will depend on the normalized time $Dt/h_0^2$ and reaction constant $kh_0^2$ as well as the molar masses of water $M(H_2O)$ and silicon $M(Si)$, the initial water concentration $w_0$, and mass density $\rho_{Si}$ of Si. This will give the scaling law for the dissolution of Si nanomembrane in water, i.e., $$\frac{h}{h_0} = f\left(\frac{Dt}{h_0^2}, \frac{kh_0^2}{D}, \frac{w_0}{\rho_{Si}}\right), \quad (2)$$

where f is a non-dimensional function, and takes the form $$f(\xi, \eta, \zeta) = 1 - \frac{M(Si)}{4M(H_2O)}\eta\zeta\left\{\xi\left[\frac{\tanh\sqrt{\eta}}{\sqrt{\eta}} - 2\sum_{n=1}^{\infty}\frac{1-e^{-\xi\left[\eta+\left(n-\frac{1}{2}\right)^2\pi^2\right]}}{\left[\eta+\left(n-\frac{1}{2}\right)^2\pi^2\right]^2}\right]\right\}. \quad (3)$$

FIG. 4(c) shows that the preliminary modeling results (curves) for the initial thickness $h_0$=35, 70 and 100 nm of Si NMs at body temperature (37° C.), which agree well with the experimental results (shown by the points). The analytical model leads to accurate prediction of the time for complete dissolution of materials. Such an approach may be extended to other materials for resorbable electronics.

Models of dissolution with time-dependent reaction rate constants are also developed. In many cases, the reaction constant for the net reactions can decrease as time elapses, and takes a general form of k(t). The solution of the equation of reactive diffusion is obtained as $$\frac{w}{w_0} = \frac{\cosh\left[\frac{y}{h_0}\sqrt{\frac{k(t)h_0^2}{D}}\right]}{\cosh\sqrt{\frac{k(t)h_0^2}{D}}} + \quad (4)$$

$$\sum_{n=1}^{\infty}\frac{2(-1)^n}{\left(n-\frac{1}{2}\right)\pi}\left\{e^{-\int_0^t \chi_n(\tau)d\tau}\left[1+\int_0^t k(\eta)e^{\int_0^\eta \chi_n(\tau)d\tau}d\eta\right] - \frac{k(t)}{\chi_n(t)}\right\}$$

$$\cos\left[\left(n-\frac{1}{2}\right)\pi\frac{y}{h_0}\right],$$

where $\chi_n(t)=k(t)+(2n-1)^2\pi^2 D/(4h_0^2)$. The thickness of a Si nanomembrane can be obtained as $$\frac{h}{h_0} = 1 - \alpha\int_0^t \left[k(t) - \frac{1}{3}\frac{k^2(t)h_0^2}{D}\right]dt. \quad (5)$$

One simple example is the electrical resistance R, which is related to its initial value $R_0$ and the ratio of current to initial thickness $h/h_0$ by $R=R_0(h/h_0)^{-1}$. FIG. 4(e) shows that the modeling results (curves) for the resistance change agree well with the experiments (shown by points). Similar analytical frameworks can capture related behaviors in other materials (e.g., Fe, and Mg alloys) for resorbable electronics. Computational models are developed for the dissolution of alloys since dissolution involves the reactive diffusion of multiple elements. The reactive diffusion equation (1) now becomes $D\nabla^2 w - kw = \partial w/\partial t$ for each element, where $\nabla^2$ is the Laplace operator. This equation is solved numerically, and coupled with those for other elements via the continuity conditions across the interfaces in alloys. In addition, the effect of W capping layers may be studied via the numerical analysis.

For resorbable dielectrics and semiconductors, the modeling work focuses on the rate of resorption, such as the critical time $t_c$ for the thickness to reach zero. For Si NMs, this is obtained analytically as $$t_c = \frac{4\rho_{Si} M(H_2O)}{k w_0 M(Si)} \frac{\sqrt{\frac{k h_0^2}{D}}}{\tanh\sqrt{\frac{k h_0^2}{D}}}. \quad (4)$$

The results are $t_c$=14, 16 and 19 days for $h_0$=35, 70 and 100 nm, respectively, at the body temperature T=37° C.

Modeling of Resorbable Components and Devices—

For resorbable components such as interconnects of Mg, the modeling focuses on the electrical properties and the resorption rates, as illustrated by the dissolution of MgO/Mg double layers. For Mg, the reactive diffusion equation is imposed with zero water flux condition at the bottom surface. For MgO, the reactive equation is imposed with constant water concentration at water/MgO interface. Across the MgO/Mg interface the concentration and flux of water molecules are continuous. The coupled reactive diffusive equations for Mg and MgO are solved analytically, and so is the resistance R of the double-layer device. The results of the resistance (per unit length) agree well with experiments for the thickness of MgO encapsulation of 400/800 nm, which has the initial resistance (per unit length) of 1.04/1.15 Ω/mm, respectively. Computational models are also developed to solve the coupled reactive diffusive equations, particularly for the complex geometries of the components and devices, including the multi-layer stack of materials for devices.

The critical time $t_c$ for open circuit is reached when the resistance approaches infinity. For the MgO/Mg double layer, this critical time is obtained analytically, and gives 3.5 and 13 hours for the thickness of MgO encapsulation of 400 and 800 nm, respectively, which agrees reasonably well with experiments. For multi-layer materials with complex geometries as in components and devices, computational models are developed and a wide variety components and devices are evaluated. Computational models also give the scaling laws for the dissolution of devices. The predictive use of these models highlights the importance of nanomembrane and thin film device designs.

The effect of stress state (e.g., residual or internal stress) may affect the dissolution of devices. This is because the continuous dissolution of materials and devices change their stress state, which in turn affect the dissolution rate. This can be calculated through the coupled stress-diffusion equation, which is implemented through the finite element program ABAQUS via its user subroutine.

Metal oxide semiconductor field effect transistors (MOSFETs) formed with Si NMs, $SiO_2$ dielectrics and Mg electrodes, with encapsulating layers of MgO and crystallized silk are also studied. The experiments on the devices show two-stage kinetics in their functional transience. In particular, immersion in water for up to ~90 hours causes negligible change in key device characteristics, such as mobility, on/off current ratio ($I_{on}/I_{off}$) and threshold voltage ($V_{th}$). Functional degradation occurs in a relatively narrow time interval following this period of stable operation. The encapsulation layers define the first timescale; the Mg electrodes define the second. These behaviors are studied in detail by the analytical and computational models, which are important to demonstrate that encapsulation layers, which do not provide active roles in the devices, can be exploited to define the transience time in a way that is decoupled from system or device level function. Although different device types require Si NMs with different thicknesses, the Mg and the encapsulation layers play dominant roles in determining the timescales for transience in function, for practical cases explored here.

Modeling of Resorbable Electronic Systems—

The analytical and computational models for resorbable materials and devices are integrated at the system level to provide CAD tools for the design, fabrication and operation of resorbable electronics, similar to those currently used for circuit design in conventional electronics. A computational (or analytical) module is developed for each type of device. Each module includes the interactions between stress and diffusion. All modules are integrated and coupled together to predict the key behavior and properties at the system level, including (1) the time dependence of key properties (e.g., electrical resistance) at the device and system levels and (2) the critical time for the dissolution of each device and that of the entire system. The critical time can be actively controlled by using the encapsulation layer for devices, such as silk, which is attractive for this purpose because its solubility in water can be programmed, over several orders of magnitude, through control of crystallinity.

Research on Integrated Demonstration Vehicles

The focus of this work is on development of scientific knowledge and engineering concepts for diverse classes of resorbable electronics. Two specific, integrated demonstration vehicles are pursued: one in digital and one in analog electronics. The former is a four bit row decoder, incorporating eighty eight transistors, in four inverters and a NOR array with the output of the inverter serving as one of the inputs for the NOR gate. (See FIG. 79 for the circuit diagram.) The latter is a set of 7 stage CMOS ring oscillators, with operating frequencies from 100 kHz to 100 MHz, corresponding to radio frequency operation from the VLF to the VHF bands. These two circuit demonstrators are built using the materials, manufacturing approaches and resorbable construction models described above. Both circuit level electronic properties, and resorption behaviors are studied quantitatively, and compared to theoretical expectation.

Example 9

This Example establishes a new, silicon-based electronics technology that can, in a controlled manner, gradually vanish over time [1]. Devices that are 'transient' in this sense create application possibilities that cannot be addressed with conventional electronics, such as active implants that exist for medically useful timeframes, but then completely dissolve and disappear via resorption by the body, or field-deployable beacons that disappear to avoid recovery. Recent work has demonstrated a comprehensive set of materials, components, theoretical design tools and manufacturing approaches for complementary metal oxide semiconductor (CMOS) electronics of this type, together with multiple different classes of sensors and actuators, two options for power supply and a wireless control strategy. A transient silicon device capable of delivering thermal therapy in an implantable mode to address challenges in surgical site infections caused by antibiotic-resistant bacteria and its demonstration in animal models illustrate a system-level example of this technology [1]. Fully transient RF scavenging devices, and partially transient radio transmitters prove the ability to realize basic building blocks of relevance to many military applications [2].

This work builds on previous results on transient electronics with the goals of expanding (a) the materials and fabrication toolbox for designing systems with all components transient (and/or disintegrable), (b) the ability to do higher levels of integration (i.e. beyond a few discrete component circuits) (c) the possible mechanisms for triggering transience, especially for large area systems/circuits and non-aqueous conditions. The activities involve (1) development of ZnO as a transient semiconductor complement to Si, and silk composites as functional substrates, (2) establishment of a foundry-based route to highly integrated Si transient electronics, (3) exploratory efforts on several new mechanisms for controlling and triggering transience and (4) a working demonstration device consisting of an RF beacon capable of pulsed transmission during a fall from an aircraft at high altitude.

ZnO as a Transient Semiconductor

The transient electronics technology base described above lacks two critical capabilities: (1) routes to piezoelectric and optoelectronic components, and (2) low power schemes for programmed, or 'triggered', transience. This work addresses these two issues. The use of ZnO as a water soluble semiconductor, in which hydrolysis affects transience, is explored. The large, direct bandgap and strong piezoelectric response of ZnO make it a useful complement to Si, for applications in mechanical energy harvesters, light emitting diodes and transparent conductors. Previous studies demonstrate that ZnO is water soluble [3,4] and biocompatible [5], and that it can be used in a variety of semiconductor devices. Efforts here focus on integration of ZnO with other water-soluble materials (e.g. Mg, MgO, Si, $SiO_2$, silk) to yield components that are fully transient.

Two components are pursued. The first is a thin film transistor (TFT). Past work has demonstrated transparent TFTs, using ZnO deposited in one of three ways: molecular beam epitaxy, sputtering, or sol-gel/solution methods. The electrical and semiconducting properties of ZnO (mobility, resistivity, carrier concentration, etc.) depend on the microstructure, especially grain size [6]. Grain size can be engineered by deposition at an elevated temperature [7], through grain growth during an annealing process [8,9], or by adjusting sputtering pressure [10,11]. The annealing process can also aid in dopant activation [12]. Electrical properties can also be adjusted by adding $O_2$ during sputtering [13], though TFTs can still be fabricated by sputtering in Ar only.

Flexible ZnO TFTs can be formed on plastic substrates by sputtering at room temperature followed by low temperature annealing, or no annealing at all [14,15]. Both top gate and bottom gate TFTs of this type are possible, although latter designs are more common [13]. This layout is exploited, with a highly doped, transfer printed silicon nanomembrane as the gate electrode, and a layer of $SiO_2$ deposited by PECVD as the gate dielectric. Low temperature sputtering of ZnO without annealing forms the channel, and Mg source and drain electrodes are deposited using methods developed for transient silicon devices. Typical etching methods for patterning ZnO are incompatible with silk; two strategies that avoid this constraint are pursued: (1) all additive processing, directly on silk, using precision shadow masks, and (2) complete fabrication on silicon substrates, in releasable formats that are compatible with transfer printing to silk, as a final step.

Electrical properties are measured before and during transience due to immersion in water. The properties of ZnO TFTs reported in the literature vary widely. On/off ratios are generally between $10^3$ and $10^5$. Device mobilities are highly dependent on microstructure, channel geometry, and processing conditions. Reported values lie between 0.02 $cm^2$/(Vs) and 4 $cm^2$/(Vs). Because development of transient ZnO devices involves many new challenges, targets for performance lie between bounding values reported for non-transient versions: $10^4$ for on/off ratio and 0.5 $cm^2$/(Vs) for mobility.

Silk Composites for Triggered Transience

Transience in silk is based on the physical crosslinks existing within silk's crystalline structure. To add more versatility in terms of control and modes of dissolution, silk composites to enable different modalities of transience are explored. A materials toolkit to be interfaced with the transient electronic building blocks is developed. The key components of this kit to complement silk are:

Collagen/Gelatin, Hyaluronic Acid—polymers (medically relevant) for blending with silk that form stable and robust blends based on prior studies (usually at around 20 wt %, significant fraction). This also generates more flexible silk substrates.

Stable Protease Particles—proteases to degrade silk and collagen/gelatin can be sequestered in silk micropockets and nanopockets using established protocols, while the enzymes are also complexed with small molecule inhibitors or antibodies to shut off activity until released. Release of active enzyme can be achieved by heat or pressure. For example, upon local heating the enzymes can be activated due to the decoupling of the enzyme to the inhibitor. Similarly, for hyaluronic acid, then hyaluronidase would be released as opposed to a protease.

Protease Inhibitors—inhibitors such as EDTA or antibodies can be coupled to the silk materials locally, to provide more stable regions in the matrices where needed, while other regions are left to be exposed to the enzymes (upon their release) for rapid degradation of the matrices. This is a tunable feature to control degradation in selected regions of the material.

Elastin Copolymers—responsive to temperature, pH, pressure and other external factors, can be used to result in coascervation of the elastin, and thus the release of components, such as the degrading enzymes.

Proteases Responsive to Changes in Heat or pH—thermophilic enzymes, pH tolerant enzymes, antibody-bound enzymes activated at specific temperatures.

A set of test materials is generated and evaluated for function and different modes of transience as outlined below.

CMOS Foundry Approach to Transient Circuits

Previously demonstrated classes of transient electronic devices exploited thin sheets of silicon etched from wafers and then assembled onto substrates of interest (i.e. silk) by transfer printing. Here, fabrication of key elements of the devices (e.g. source, drain and gate electrodes, and gate dielectrics, for transistors) and interconnections between them must be performed on the transient substrate. This approach is well suited for demonstrating the concepts and studying the kinetics of transience, but it cannot be used to form systems with high levels of integration or sophisticated function.

This work overcomes these limitations by developing foundry-compatible manufacturing processes, as a practical pathway to transient electronics for realistic applications. Successful development enables arbitrary levels of integration and complexity in function, in a scheme that builds on established manufacturing infrastructure for silicon integrated circuits. The two main challenges are to form foundry CMOS in configurations that (1) use only transient materials, and (2) enable ultrathin, 'releasable' forms needed for transfer printing and interconnection on transient substrates. For the first, modified circuit/device layouts that use doped poly-Si in place of conventional metallization for contacts, vias and interconnects are developed. An alternative is to use tungsten, which is transient in water to form tungstic acid, not only for the vias but also for the contacts and interconnects. For the second challenge, silicon on insulator (SOI) technology is exploited, to allow release of ultrathin active devices and circuits from the underlying handle wafer, in small-scale chiplets that are compatible with transfer printing. Keys to success are the development of etching chemistries and barrier layers that protect the active devices during release and 'breakaway' tether structures (i.e. anchors) that hold the microdevices to the underlying wafer but fracture during the retrieval step in transfer printing.

Triggered Transience

In the course of this work, alternate means to induce transience in the relevant substrates and devices are explored to identifying low power schemes for programmed, or 'triggered', transience and to induce transience when no suitable environmental conditions exist (e.g. lack of water to induce hydrolysis).

Electrically Induced Transience by Thermocapillarity

For triggered transience in these and other systems, thermocapillary effects that, when implemented at the nanoscale, provide a low power means to induce flows in thin films may be exploited. Here, temperature dependence in the surface tension and wetting characteristics lead to mass transport at rates and along directions defined by temperature gradients (rather than changes in temperature). Such phenomena have been used previously to move liquid droplets on surfaces, in a programmed manner in which thermal gradients as small as a few degrees per millimeter are sufficient [24]. Recent work shows that this same physics can enable meaningful flows in thin films of molecular glasses, at temperature gradients of a few degrees per micron (FIG. 32). In strategic layouts, implemented with narrow electrodes that provide local Joule heating, such flows can be designed to induce electrical openings in conducting traces. The result can alter or eliminate function in an integrated circuit, for example. Alternatively, such flows can expose underlying materials to a surrounding environment that affects transience in the overall system.

The fundamental mechanisms of this process are important to establishing a clear engineering design approach for its use in triggered transience. FIG. 33 shows a schematic diagram of a model that can capture the essential physics. Here, local heating of a film reduces the surface tension $\gamma$ which for most materials is linear with respect to the local temperature T. The non-uniform temperature produces a thermocapillary shear stress $\tau$ proportional to the gradient of surface tension, which pulls liquid or viscous solid toward regions of cooler surface temperature. The governing equation derived from the Navier-Stokes equation is $$\frac{\partial h}{\partial t} + \frac{\partial}{\partial x}\left[\frac{\tau h^2}{2\mu} + \frac{h^3}{3\mu}\frac{\partial}{\partial x}(\gamma \nabla^2 h)\right] = 0,$$

where h(x,y,t) is the position and temperature dependence of thickness of liquid or viscous film, t is time, and $\mu$ is the shear viscosity. This equation, together with the appropriate initial and boundary conditions, can be solved numerically to determine the time-dependent film thickness, which is critical to the triggered transience. An analytical solution is also established for the long-time behavior, which can provide scaling laws, useful for engineering design. For example, it can be shown that the heat power $Q_0$, thermal conductivity $k_f$ and initial thickness $H_f$ of the film, ambient temperature $T_0$, and coefficients $\gamma_0$ and $\gamma_1$ in surface tension ($\gamma = \gamma_0 + \gamma_1 \tau$) appear in a single combination $$\frac{Q_0}{k_f H_f (\gamma_0/\gamma_1 + T_0)}$$

to control the process.

Optically Induced Transience

Optically induced transience is explored as a trigger mechanism for the programmable dissolution of substrates and devices. The work is based on using doped silks and silk inks to incorporate the needed triggering mechanisms.

Silks are doped with optical absorbers. For example, nanoparticle-doped silks are used as trigger mechanisms. Recently, the use of gold nanoparticle (Au—NP)-doped silk solutions which were reformed into several formats ranging from conformal coatings [25] to bulk films [26] to 3D photonic crystals [27] were explored (FIG. 34).

Specifically, the optical trigger is envisioned to occur through the plasmonic-resonance enhanced absorption of light. Transience mechanisms affecting the bulk material (through heat-induced modification of the silk crystalline matrix) and the interfaces between doped silk substrates and patterned on-board devices are explored with the end goal of being able to trigger device disintegration with light.

The goal is to develop transient devices (including both in vivo and in vitro, i.e., skin mounted and implanted ones) by fabricating (fully or partially) dissolvable components on doped silk protein substrates and to control the degradation and/or destruction of devices using photo-thermal effects triggered by optical illumination. Heat localization can be obtained by selective doping of different areas or different layer(s) of the materials and/or by focusing of incident light. Triggering degradation from a standoff position (e.g. laser targeting) is also possible and the parameters for this mode of triggered transience are explored.

Options for dopants: Both semiconductor (such as CdSe and CdTe) and metal (Au and Ag) nanoparticles are candidates for dopants. Metals are generally better with 1) many mobile electrons and 2) much lower optical quantum yield. Gold is currently mostly the used material for photo-thermal applications and probably a better choice for implantation applications given its biocompatibility. However, it is noted that silver nanoparticles generate much more heat (10 times higher) than gold ones under plasmon resonance and might be a good option for non-implantable cases (for example, skin mounted transient devices).

The plasmon resonance for Ag—NPs and Au—NPs is at ~400 nm and 530 nm, respectively. Due to the high absorption of tissue at those wavelengths, various nanostructures have been developed to shift the plasmon resonance to the red (650-900 nm), to take advantage of the low tissue absorption and the associated deeper penetration of the light.

For non-implantable applications, either Ag— or Au— NPs may be used and heat generated remotely with blue or green light. The generated heat Q, and local temperature increase AT can be analytically calculated by the following equations:

$$Q = \frac{\omega}{8\pi} E_0^2 \left| \frac{3\varepsilon_0}{2\varepsilon_0 + \varepsilon_{NP}} \right|^2 \text{Im}(\varepsilon_{NP}) \quad [1]$$

where $E_0$ is the amplitude of the incident radiation, and $\varepsilon_{NP}$ and $\varepsilon_0$ are the dielectric constants of the NP and surrounding medium, respectively.

$$\Delta T(r) = \frac{V_{NP} Q}{4\pi k_0 r} \quad [2]$$

where r is the distance from the center of a NP, $k_0$ is the thermal conductivity of the surrounding medium, and $V_{NP}$ is the NP volume. Combining [1] and [2], the maximum temperature increase is given by (occurs at $r=R_{NP}$, surface of the NP):

$$\Delta T_{max}(I_0) = \frac{R_{NP}^2}{3k_0} \frac{\omega}{8\pi} \left| \frac{3\varepsilon_0}{2\varepsilon_0 + \varepsilon_{NP}} \right|^2 \text{Im}(\varepsilon_{NP}) \frac{8\pi \cdot I_0}{c\sqrt{\varepsilon_0}} \quad [3]$$

where $I_0$ is the light intensity, and the temperature increase is proportional to the second power of the NP radius, i.e. $\Delta T_{max} \propto R_{NP}^2$, when the NP radius is much smaller than the incident wavelength. For instance, a portable laser pointer with an output power of 15 mW at ~532 nm and the spot size is ~1 mm (without focusing), which corresponds to a light flux of $I_0 = 1.91$ W/cm$^2$.

Absorber concentration and wavelength/absorber combinations (optimally matching resonant absorption peaks of the dopant to the wavelength of the light source) are varied to explore this mechanism. (See Table 8 overview of generated power and temperature differential in the case of Au—NP). Temperature increases in excess of 100 degrees C. with portable (e.g. laser pointer) light sources are estimated.

TABLE 8

| Particle size (nm) | Concentration (particles per mL) | Molar Particle Concentration (nM) | Temperature Increase (° C.) |
|---|---|---|---|
| 5 | 5 × 10$^{13}$ | 83.3 | 62.18 |
| 10 | 5.7 × 10$^{12}$ | 9.5 | 28.36 |
| 15.2* | 1.4 × 10$^{12}$ | 2.3 | 15.67 |
| 20.3 | 7 × 10$^{11}$ | 1.15 | 13.93 |
| 30.7 | 2 × 10$^{11}$ | 0.33 | 8.96 |
| 40.3 | 9 × 10$^{10}$ | 0.15 | 7.16 |
| 59.4 | 2.6 × 10$^{10}$ | 0.043 | 4.66 |
| 100 | 5.6 × 10$^{9}$ | 0.0093 | 2.79 |

*Au-NPs produced and used for Au-NPs doped silk experiments.

Additional concepts include the use of thermal activation coupled with thermocapillarity effects to destroy the circuits by directing light to thermally induce enzyme filled pockets contained in the transient substrate to burst.

Transience by Sublimation

Previous work demonstrated transience by hydrolysis. Certain use scenarios require transience in a completely dry environment. Here, the devices must disappear into a 'dust-like' form over time. One embodiment replaces silk substrates and encapsulants with solid materials that sublimate at room temperature. Certain waxes offer this characteristic. See FIG. 80. The utility of such materials for a mode of completely dry transience is explored in which sublimation leaves behind only ultrathin devices and interconnects. Layouts and layer thicknesses are engineered to lead to spontaneous fracture and disintegration upon transience of the substrate, thereby rendering the dust format.

Transience by Mechanical Impact

Impact-triggered transience can be relevant for certain types of mechanically induced transience activation options (e.g., bending, chewing, etc.).

Silk can be blended with a high content of collagen (gelatin) or hyaluronic acid to generate integrated and stable materials that provide excellent mechanical and performance characteristics. The stable protease pockets (micro or nano, or even core shell electrospun systems) can be blended into the materials as part of the fabrication process, and upon mechanical disruption, would be ruptured and release the enzymes for functional degradation of the substrate, with the reaction rate being dependent upon enzyme type, concentration, state of activation and substrate surface area. The enzymes initially target the more labile components, such as the gelatin and hyaluronic acid (hyaluronidase), while thereby opening up the silk structure for access by additional proteases (e.g., chymotrypsin or protease XIV). Similarly, elastin copolymers used to link silk domains into functional materials, would be susceptible to physical impact, resulting in materials contraction and release of enzymes (as in drug delivery modes used with elastin) to activate the degradation process. All of the above options can also be approached as coatings on silk tiles or pieces, to provide more rapid break up of larger materials, followed by slower degradation of the entire structure.

In another embodiment, one or more pockets or reservoirs may be lithographically patterned into the substrate, and a transforming liquid or material may be enclosed in the pocket or reservoir. FIG. 130 schematically illustrates a form of transience by mechanical impact utilizing this modality. FIG. 130(a) generally shows a transient device 1300 falling toward the ground, G, along the dashed arrow at an initial time, A, a later time, B, and upon impact with the ground, C. These same timeframes are shown in more detail in FIG. 130(b), wherein transient device 1300 includes a substrate 1302, one or more inorganic semiconductor components 1304, one or more metallic conductor components 1304, and an actuator 1306 in the form of a pocket or reservoir. Upon impact with ground, G, the pocket or reservoir 1306 forms cracks 1310, or is otherwise breached or ruptured, allowing contents to escape, for example as puddles of liquid 1312. The liquid may, for example, be water, PBS solution, an enzymatic solution, an acid, a base, a non-aqueous solvent or combinations of these.

RF Beacon Demonstrator Device

A transient demonstrator device consisting of a beacon equipped with RF transmission capabilities, designed to fall from an aircraft at an altitude of ~60,000 ft (FIG. 81) is described. The beacon sends a modulated RF pulsed signal every ~1 s to the aircraft during its fall. The aircraft uses state-of-the-art receiver systems to capture the signal.

The requirements of the device drive the choice of transient technologies. The time for falling is between 1000 and 2000 s, depending on the details. The transmission power can be estimated using the Friis free-path transmission equation [19]. If the receiver on the aircraft has a sensitivity of −150 dBm [20], the receiver antenna is directional with a gain of 20 dBi, the transmit antenna on the beacon is omnidirectional with a directional gain of 0 dBi, the transmission range is 60,000 feet and the carrier frequency is 433 MHz, then transmit power of the beacon can be as small as $1 \times 10^{-9}$ W. In reality, the required power must overcome practical constraints of diffraction and atmospheric absorption. A conservative estimate, based on RF transmitters used to monitor the migration of birds, is for an output power of 10 mW with a transmission range up to 10 km [21]. At a distance of 60,000 feet, a transmitter output power of −30 mW may be needed. Assuming that the pulse width generated by the beacon is 20 ms, the total energy consumed during the fall is ~30 mJ. This power can be provided by a cell battery or a solar cell. A cell battery has a typical capacity of 15 mAh at a $1.3 \times 1.3$ cm² area. A silicon-based solar cell with ~20% efficiency can generate 100 mW/cm² from direct sunlight [22]. Both options are pursued.

The beacon design (2×2 cm) exploits a two stage structure (FIG. 82). The first stage generates a high frequency radio signal (30 MHz to 433 MHz), and the second stage modulates and amplifies this signal. The resulting signal is transmitted by a whip or loop antenna [23] after passing through an impedance matching circuit. The illustration in FIG. 82 shows the solar cell power option. The demonstration devices involve an assembly of commercial components on a transient substrate and with transient interconnects, i.e. a 'transient printed circuit board', together with a transient antenna.

In summary, the outcomes of this work: specify and qualify deposition approaches for ZnO, in a manner that is compatible with other, previously demonstrated, transient materials; construct and demonstrate ZnO transient electronic components, including diodes and transistors, and compare transient behaviors to theoretical models; construct and demonstrate structures for controlled thermocapillarity in thin films of molecular glasses; implement thermocapillary triggers for transience in a device structure; compare behavior to theory; implement thermocapillary triggers for transience in fully transient structures that include both ZnO and Si components; develop circuit/device layouts for CMOS foundry fabrication; prototype designs using Si processes; demonstrate small-scale chiplets compatible w/ transfer printing; implement optically triggered transience with silk+Au—NP substrates with integrated devices; demonstrate optical triggers for substrate degradation; demonstrate optically triggered degradation of devices; demonstrate the manufacturing of silk/protease compounds in free-standing film formats; demonstrate manufacturing and characterization of silk substrates for transient electronics containing micropockets; demonstrate the integration of electronic devices on the composite substrates manufactured; perform test and validation of silk-composite transient modalities and times, specifically impact transience; integrate devices on substrates for impact driven transience; demonstrate impact triggered transience; design and prototype RF Beacon devices; manufacture RF beacons on resorbable substrates; demonstrate Si solar cell and battery interfaces; acquire subliming wax and perform material assessment; manufacture transient electronic components on subliming wax; and demonstrate transience by sublimation.

Example 10

Water Soluble ZnO TFTs and Energy Harvesters

Figure 85:
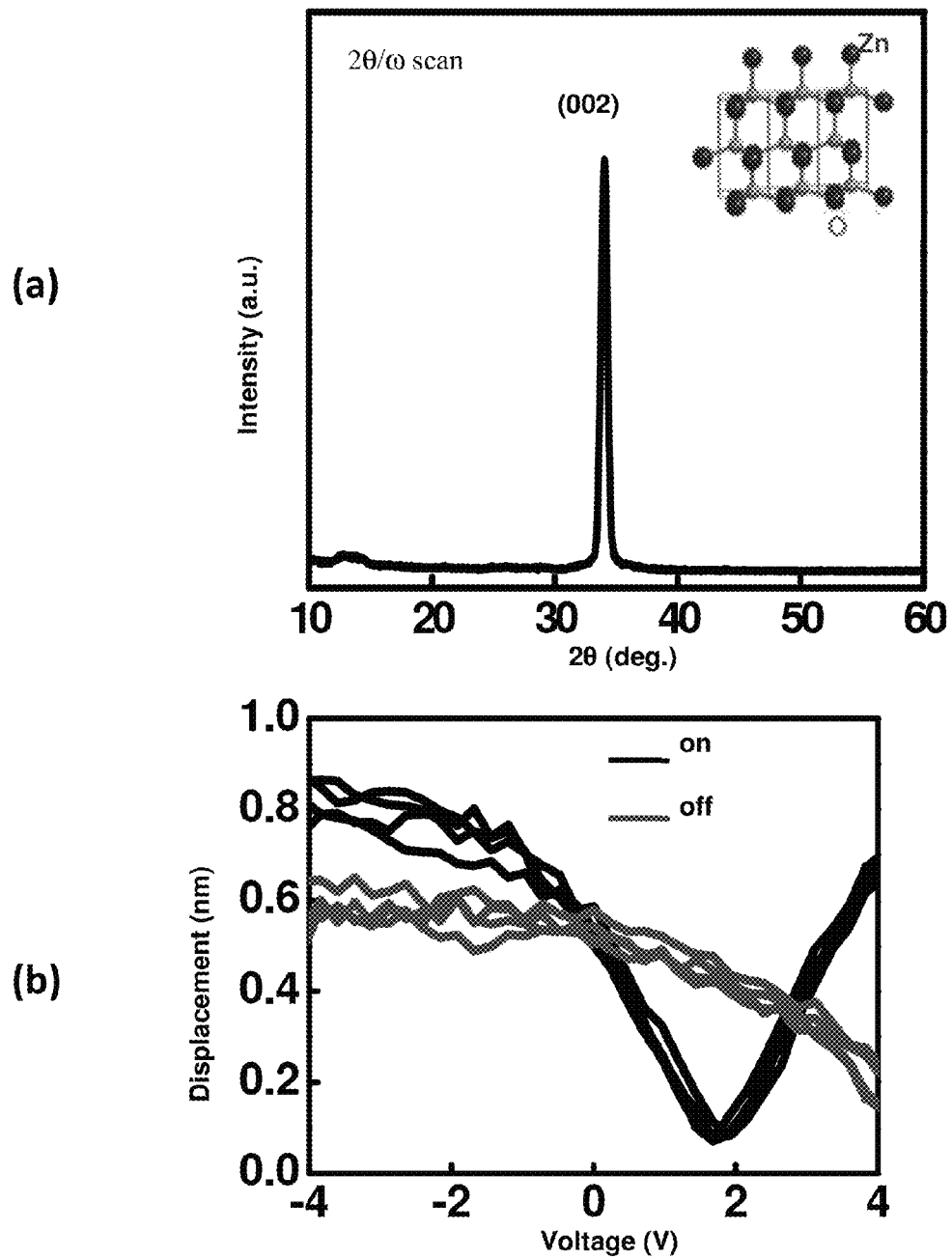
Figure 85:
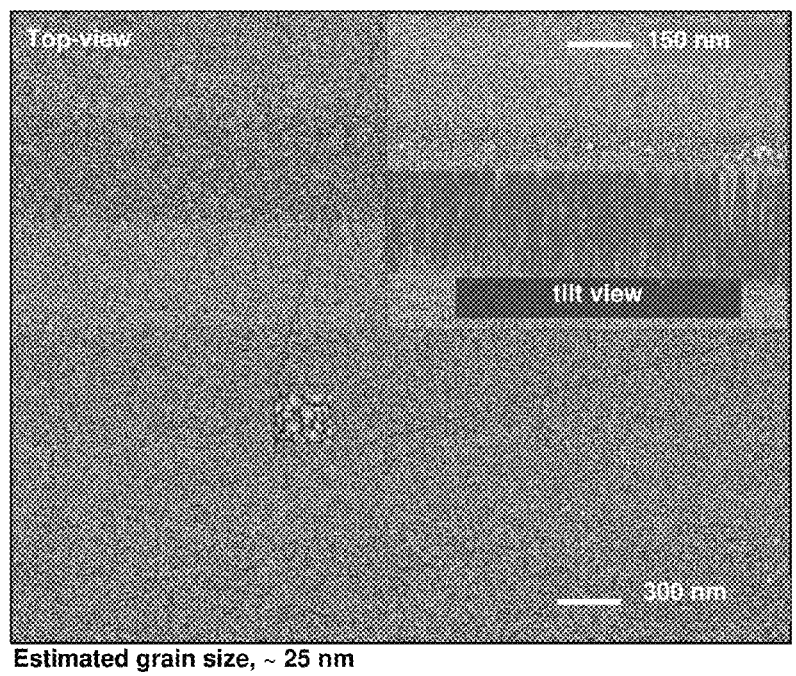
Figure 85:
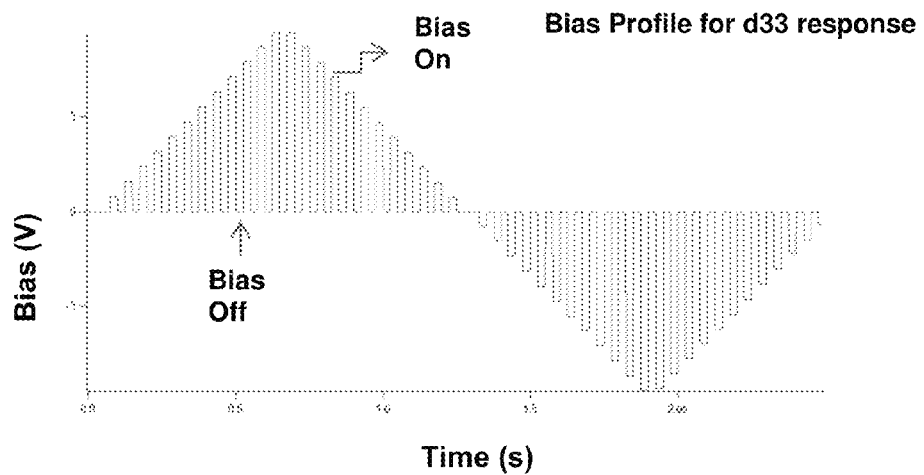
Figure 89:
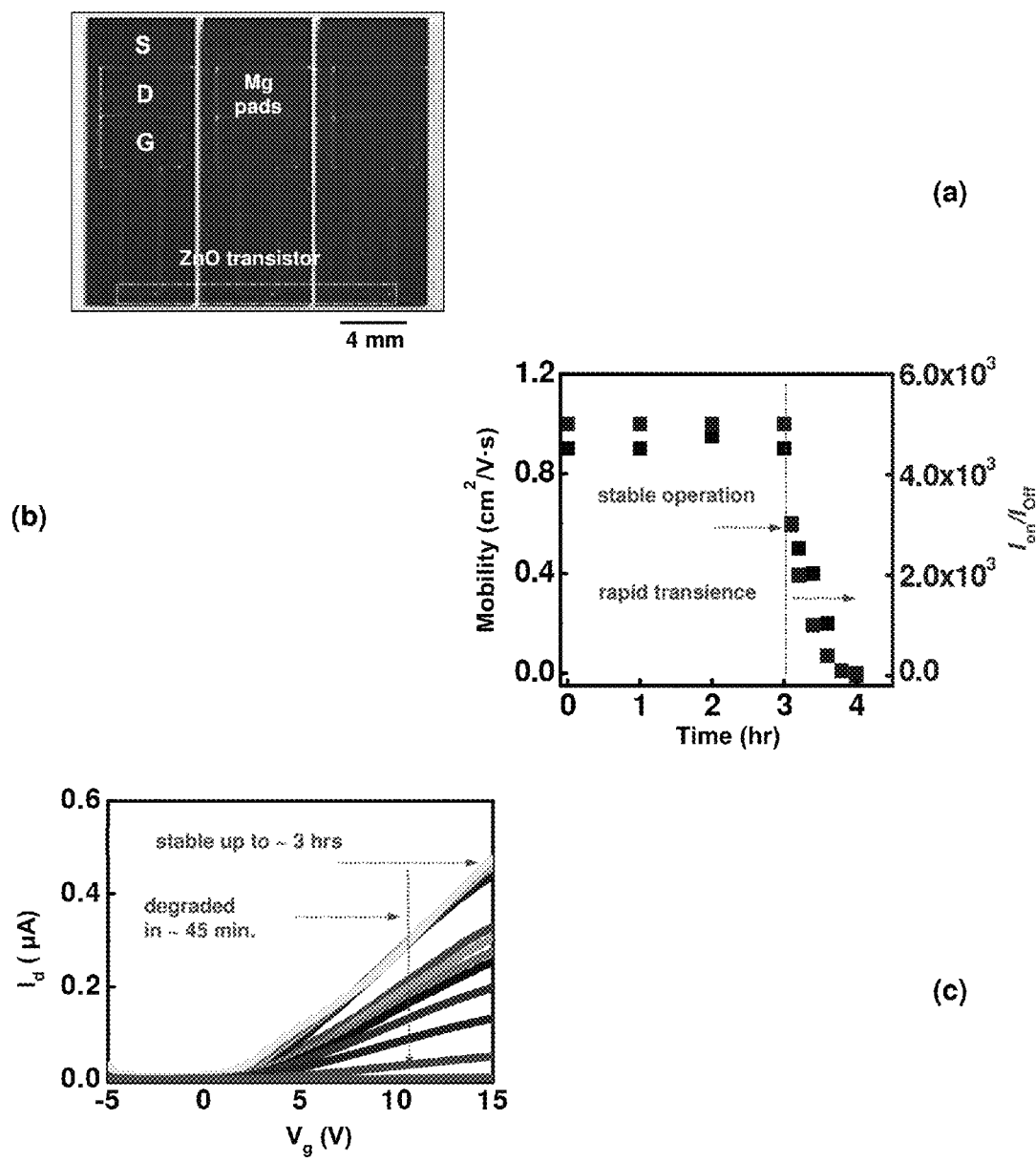

The Example demonstrates water soluble ZnO thin film transistors (TFTs), capacitors and energy harvesters. FIGS. 83 and 84 show schematic diagrams of ZnO thin film transistor and capacitor arrays and components. The transistors contain Mg source, drain and gate electrodes, a $SiO_2$ gate dielectric and ZnO semiconductors. The capacitors include a substrate having a bottom Mg electrode disposed thereon, a ZnO semiconductor disposed on the bottom Mg electrode, and a top Mg electrode disposed on the ZnO layer. FIG. 85 shows plots and micrographs of ZnO film properties. For example, a powder X-ray diffraction plot and crystal structure representation of ZnO (FIG. 85(*a*)), a voltage versus displacement curve for ZnO films when power is on and off (FIG. 85(*b*)), an electron micrograph of a ZnO film (FIG. 85(*c*)), and a time versus bias curve for a ZnO film (FIG. 85(*d*)) are shown. The estimated grain size of the ZnO film is about 25 nm. Additional electrical characterization of the ZnO transistors is provided in the current versus voltage plots of FIG. 86, which show on/off ratio>~$10^3$, $V_{th}$, (threshold voltage)~2V, Mobility ~1 cm²/V·s. For the ZnO energy harvesters under stress/strain (FIG. 87(*c*)), time versus voltage (FIG. 87(*a*)) and current (FIG. 87(*b*)) plots show P=I×V=6 nW, Power density=0.15 µW/cm², and Strain Rate=1.5 cm/sec. Photographic time lapses of ZnO transistor arrays and energy harvester arrays on silk substrates dissolving in water over the course of one hour are shown in FIG. 88. FIG. 89 shows plots of performance of a ZnO transistor (FIG. 89(*a*)) during transience. Performance is measured as mobility over time (FIG. 89(*b*)) and current versus voltage (FIG. 89(*c*)). FIG. 90 shows a model of current from a ZnO energy harvester with Mg contacts on a silk substrate:

$$I = 4\pi^2 (-\bar{e}) \frac{A_{ZnO}}{T} \frac{\overline{EI}_{silk}(y_{ZnO} - y_{neutral})}{\overline{EI}_{comp} L_{silk}} \sqrt{\frac{\delta_{max}}{L_{silk}}} \sin\left(\frac{2\pi t}{T}\right)$$

where $\bar{e}$ – the effective piezoelectric constant $T$ – the period of the loading and the current $$A_{ZnO} = \frac{n_{ZnO}}{2}(w_{ZnO,1} l_{ZnO,1} + w_{ZnO,2} l_{ZnO,2}) -$$

the area of the ribbons for each group $w_{ZnO,1}, l_{ZnO,1}, w_{ZnO,2} l_{ZnO,2}$ – the inplane sizes of the ribbons $n_{ZnO}$ – the number of the ribbons For $\bar{e}$=−0.45 C/m² (the same order with its value from the material library), the maximum current from theory equals the experimental result, $I_{max}$=0.55 nA. FIG. 91 shows a model of voltage from a ZnO energy harvester with Mg contacts on a silk substrate:

$$V = 4\pi \frac{(-\bar{e})}{\bar{k}} \frac{\overline{EI}_{silk} t_{ZnO}(y_{ZnO} - y_{neutral})}{\overline{EI}_{comp} L_{silk} \sqrt{1 + (t_{ZnO}T)^2 / (\pi A_{ZnO} R \bar{k})^2}}$$

-continued $$\sqrt{\frac{\delta_{max}}{L_{silk}}} \left[ e^{-\frac{2t_{ZnO}}{A_{ZnO}R\overline{k}}t} \sin\theta + \sin\left(\frac{2\pi t}{T} - \theta\right) \right]$$

where $T$ – the period of the laoding and the voltage $\overline{k}$ – the dielectric constant $R$ – the resistence of the voltmeter For $\overline{k}=9.86\times10^{-11}$ C/(V·m) (from the material library) and $R=5\times10^9\Omega$, the maximum voltage from theory equals the experimental results, $V_{max}=1.14$ V.

Electrically Triggered Transience:
RF Induced Electrochemistry

Figure 92:
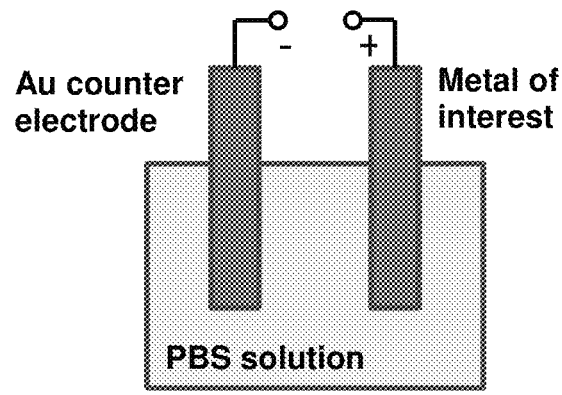
Figure 92:
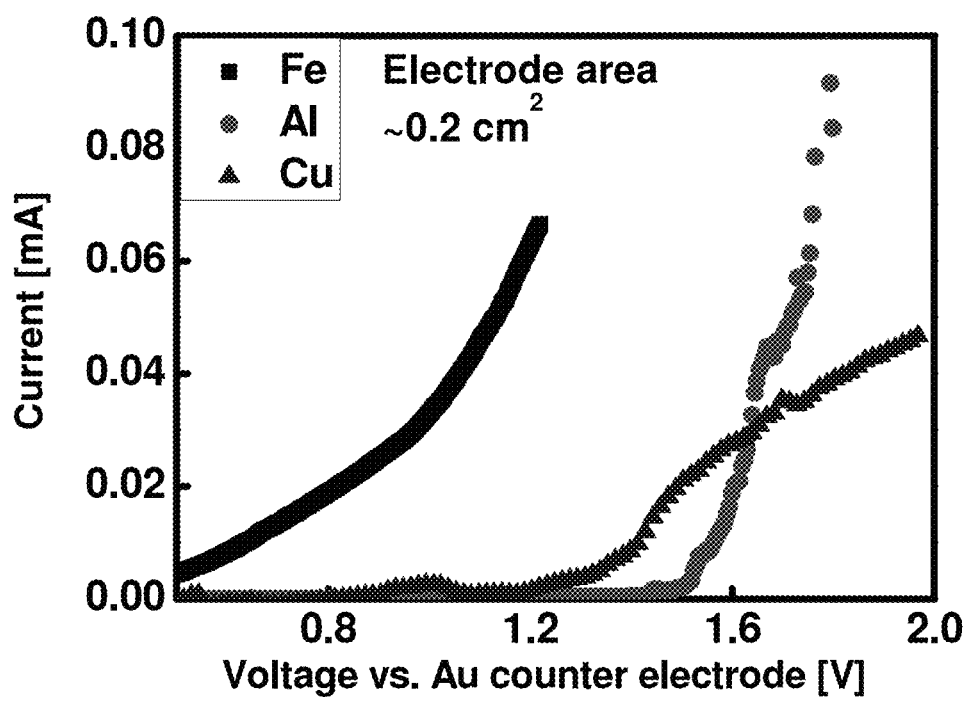

FIG. 92 shows a schematic diagram of an electrochemical measurement set up (FIG. 92(a)) and a plot of current versus voltage for Fe, Al and Cu having an electrode area of about 0.2 cm$^2$ (FIG. 92(b)). Electrochemical studies of Fe, Al and Cu showed that dissolution rates can be significantly expedited upon applying anodic voltage. Table 9 shows estimated dissolution times for Fe, Al and Cu. It should be noted, however, that Al and Cu exhibited non-uniform dissolution.

TABLE 9

|  | Fe | Al | Cu |
| --- | --- | --- | --- |
| Estimated average current [mA] at 2 V of metal with 0.2 cm$^2$ area | 0.3 | 0.10 | 0.05 |
| Estimated dissolution time [hour] at 2 V of metal with 100 nm thickness and 0.2 cm$^2$ area | 0.2 | 1.5 | 2 |

FIG. 93 shows schematic diagrams of a circuit demonstration wherein anodic dissolution of a first current path via electrochemistry triggers current to travel a secondary current path that lights an LED. FIG. 94 shows photographs of the device described schematically in FIG. 93 before (FIG. 94(a)) and after (FIG. 94(b)) anodic dissolution. The dissolution response occurs in 4 seconds when the selectively removable metal is 50 μm wide and 50 nm thick.

Solar Powered RF Beacon and Transient PCBs

FIG. 95 shows a schematic diagram of a transient RF beacon including a solar cell, a low frequency signal generator, a switcher, a high frequency signal generator, and an impedance matching unit. The signal transmitted by the beacon is received at a receiver station including an RF amplifier and a signal analyzer. The entire beacon transmitter is based on transient interconnects (Mg) and substrate (silk fibroin film), and power is provided by silicon-based solar cells. A high frequency signal (160 MHz) is modulated by a low frequency signal (1 Hz). The receiver station contains a high gain antenna and a state-of-the-art RF amplifier that can detect very small signals. The beacon transmitter contains a miniaturized coil antenna (whip antenna).

Figure 96A:
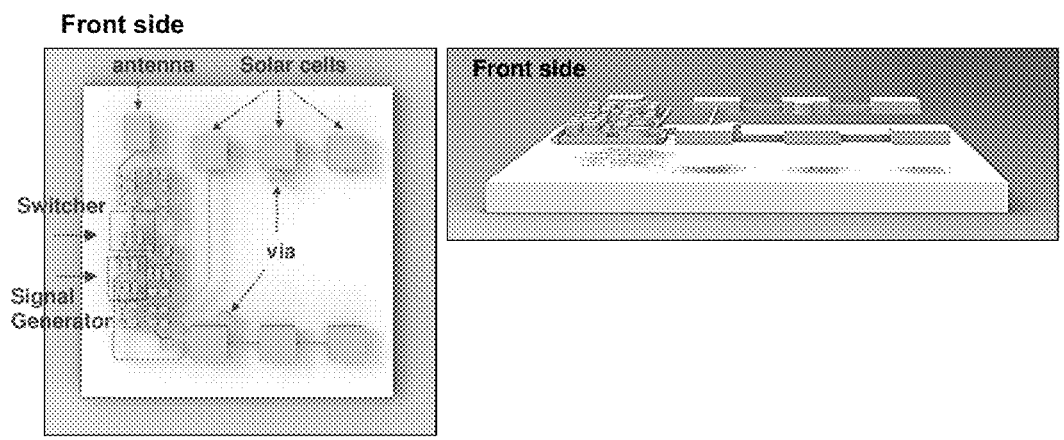
Figure 96B:
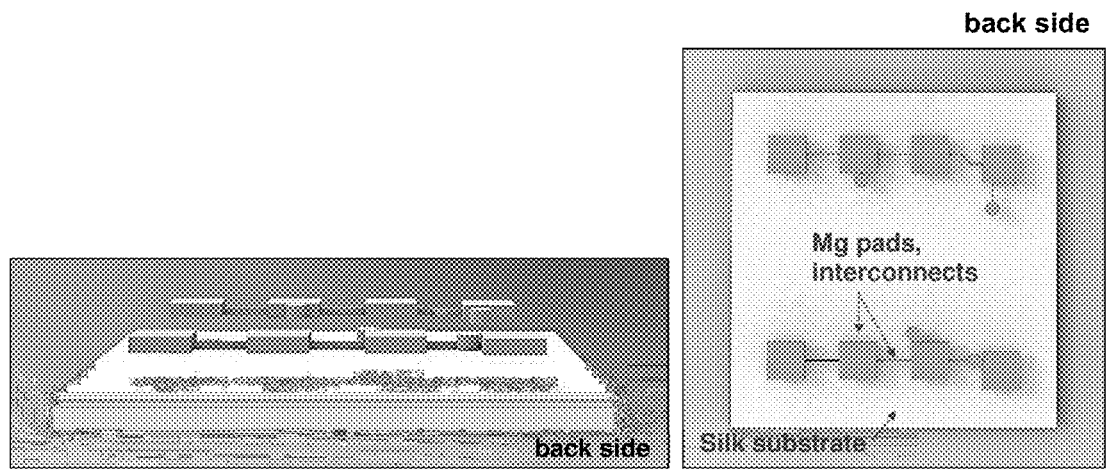
Figure 96C:
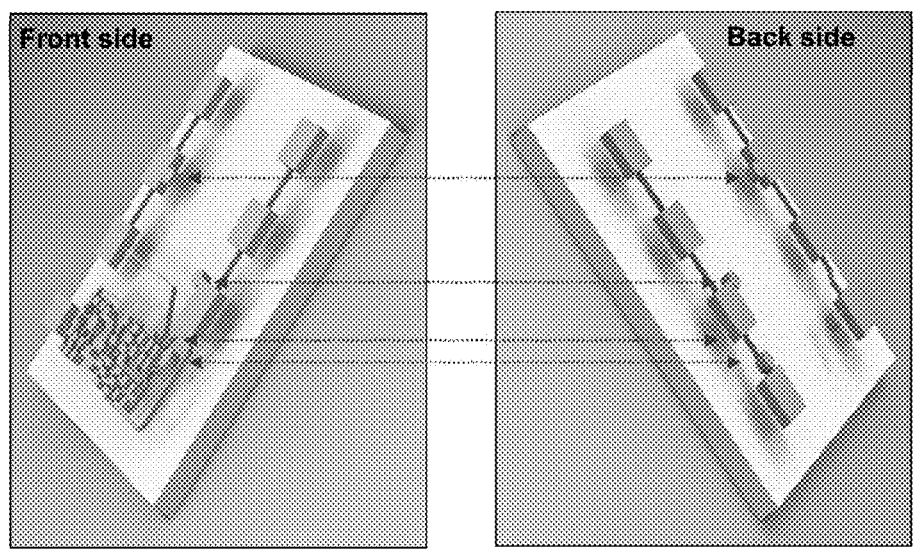
Figure 96D:
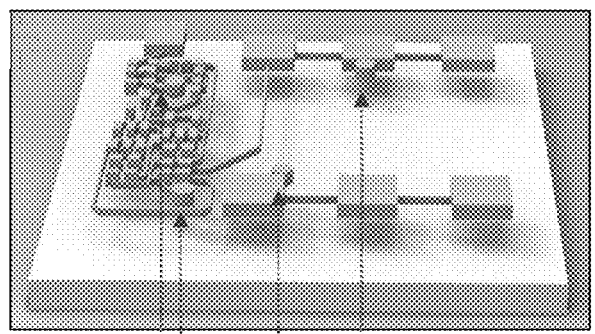
Figure 96D:
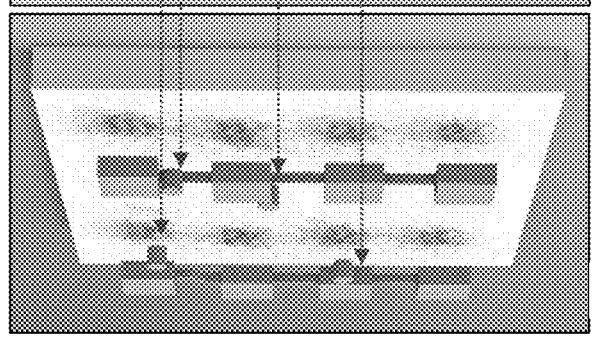

FIG. 96 shows a schematic diagram of a transient dual-sided printed circuit board showing the front side (FIG. 96(a)), the back side (FIG. 96(b)), and the alignment of the front side and the back side (FIGS. 96(c-d)). In a first step, Mg is deposited through a shadow mask on a silk substrate. Holes are then punched through the via pads, and the front and back components are connected with silver paste. FIG. 97 shows a schematic diagram of a dual-sided solar powered RF beacon (FIG. 97(a)) and photographs of the dual-sided solar powered RF beacon (FIG. 97(b)). FIG. 98 shows photographs of the solar powered RF beacon attached to a Mg antenna that communicates with an antenna of a signal analyzer of a receiver station through an antenna.

Figure 99:
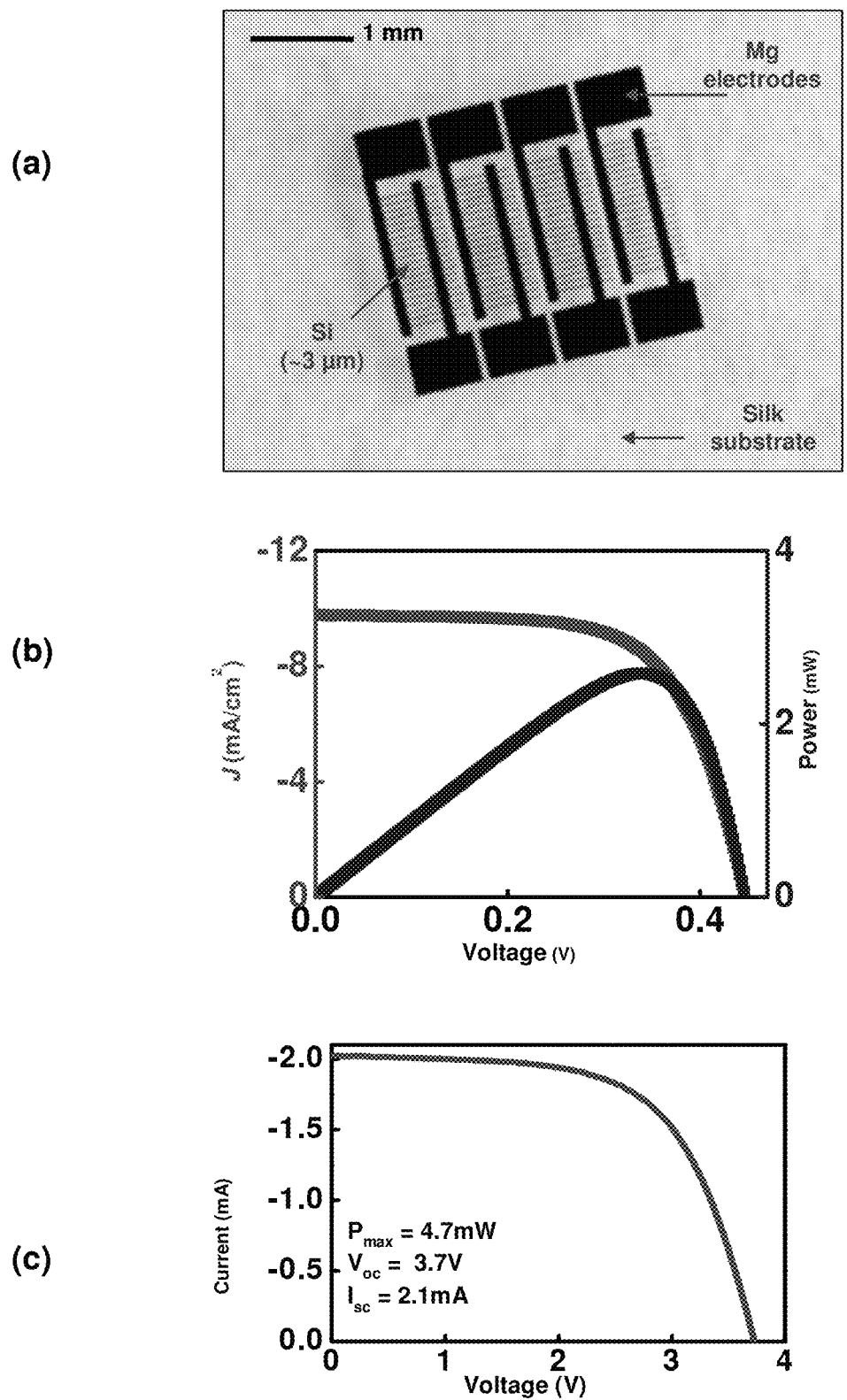

FIG. 99 shows a solar cell having a thickness of about 3 μm (FIG. 99(a)) and a plot showing current and power versus voltage for the solar cell (FIG. 99(b)). For comparison, FIG. 99(c) shows a plot of current versus voltage for the ~15 μm thick solar cell used in the beacon of FIG. 98. The results demonstrate the possibility of thinner Si solar cells (~3 μm) for integration with transient RF beacon transmitters.

FIG. 100 shows an omnidirectional Mg coil antenna having a central frequency at 160 MHz for use in solar powered RF beacons. FIG. 101 provides graphs of beacon signal output when the device is powered by a DC power supply at high power (FIG. 101(a)) and a transient solar cell at lower power (FIG. 101(b)). FIG. 102 provides graphs of the signal received by the receiver from the beacon at a distance of 5 meters when powered by a DC power supply (FIG. 102(a)) and at a distance of 10 cm when powered by a transient solar cell (FIG. 102(b)). FIG. 103 is a photograph of a transient RF beacon transmitter on a silk substrate using commercial solar cells.

Non-Aqueous Transient Materials

FIG. 80 shows a time lapse photograph of sublimable wax over the course of 10 days. Transient devices incorporating sublimable wax may be fabricated by melting the solid form of the wax at about 80° C., then cooling it to room temperature or spin casting the wax from an organic solvent, such as hexanes, and drying the spun wax for a few hours. Using the melting method, it is possible to make any type of shape and thickness may be controlled. However, the wax tends to crumble into fine pieces and break easily. Further, the physical vapor deposition of metals is not possible due to the extremely high vapor pressure. Using the spin casting method, the resulting films disappear quickly, e.g., within about 24 hours. The thin geometry makes the substrate too fragile to handle and a separate support is desirable. In addition, the films tend to exhibit micro/nano porosity. FIG. 104 shows a photograph of an electrospinning apparatus for generating sublimable materials for use in transient devices.

Sublimable materials include, without limitation, dry ice ($CO_2$), naphthalene ($C_{10}H_8$), ammonium chloride ($NH_4Cl$), iron chloride ($FeCl_3$), aluminum chloride ($AlCl_3$), melamine ($C_3H_6N_6$), nickelocene, camphor ($C_{10}H_{16}O$), caffeine ($C_8H_{10}N_4O_2$), and other organic crystals, and disappearing wax. These materials may be used individually, in combination with each other, and/or in composites that incorporate small molecule, sublimable materials as fibers in mats that provide structural support.

FIG. 105 provides photographs of exemplary electrospun materials. FIG. 105(a), left, shows a dry electrospun PVA mat and, right, a hydrated electrospun PVA mat. FIG. 105(b), left, shows a cotton gauze and, right, an electrospun bovine fibrinogen mat.

Dissolution Kinetics of Transient Metals

The dissolution kinetics of transient metals were studied. Transient metals are degradable in a biological environment (pH 6-8), such as the human body, neutral water, seawater, and the like, as well as bioresorbable, environmentally benign and compatible with electronic devices.

FIG. 106 shows plots of the approximate time for electrical opens to appear in metal lines for various metals (Mg, Zn, AZ31B (a Mg alloy containing Al: 3%, Zn: 1%), Fe and W) deposited at a thickness of 300 nm (FIG. 106(a)) and for Fe having thicknesses of 150 nm and 300 nm (FIG. 106(b)). Table 10 summarizes the results:

TABLE 10

| | R/L (at 20 Ω/mm) | | | | |
|---|---|---|---|---|---|
| | Mg | Zn | AZ31B | Fe | W |
| Time (hour) | 0.5 | 1 | 3 | 7 | 15 |

FIG. 107 provides schematic diagrams of dissolution mechanisms. FIG. 107(a) involves water diffusion through pores and defects of a metal and disintegration or flaking of metal chunks that break from the surface. In addition, FIG. 107(c) shows that the metal gets thinner and more porous upon dissolution. In a typical dissolution mechanism, metals react with water according to the reactions:

$$Mg + 2H_2O \rightarrow Mg(OH)_2 + H_2$$

$$4Fe + 6H_2O + 3O_2 \rightarrow 4Fe(OH)_3$$

$$Zn + H_2O \rightarrow Zn(OH)_2 + H_2$$

$$2W + 2H_2O + 3O_2 \rightarrow 2H_2WO_4$$

FIG. 107(b) illustrates a mechanism involving dissolution without disintegration. This reactive diffusion model involves surface reactions and water diffusion into metal, defined by two constant parameters, k (reaction) and D (diffusion). The model does not incorporate disintegration/flaking.

A general dissolution phenomenon is characterized by dissolution that is not necessarily uniform. In studies of metals patterned on glass with a 5 nm adhesion layer of Ti or Cr, changes in resistance over time come from both thickness and porosity changes. Because film quality can be influenced by deposition conditions, the conditions were held constant for each metal.

FIG. 108 plots theoretical and experimental results showing metal dissolution over time in accordance with FIG. 107(b). The model fits faster dissolution metals (Mg, Zn and Mg alloys, but deviates for slower dissolution metals (W, Fe (300 nm)). Disintegration/flaking is likely to occur right after dissolution starts for the fast dissolution metals providing similar kinetics through the whole dissolution time, and therefore using constant k and D would not introduce significant deviation for theoretical estimates.

Figure 109:
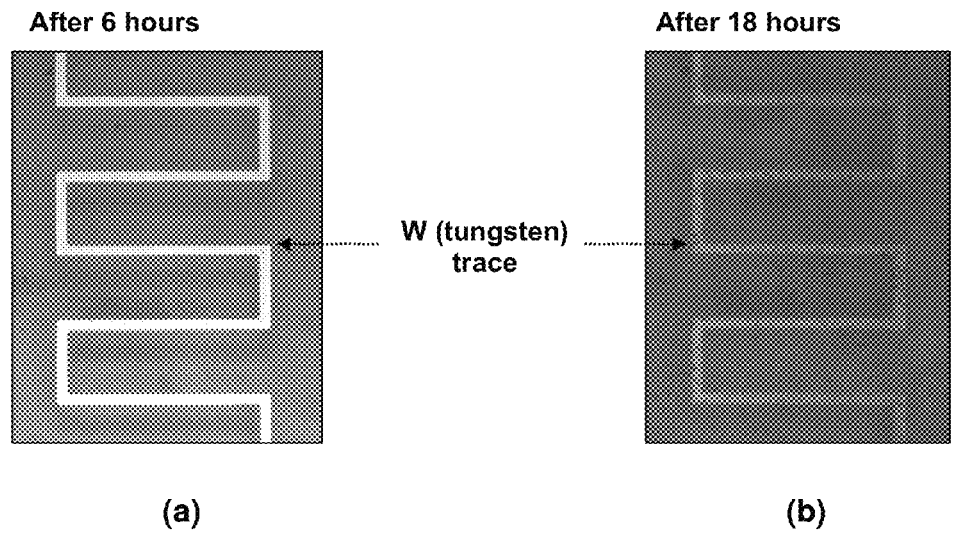
Figure 109:
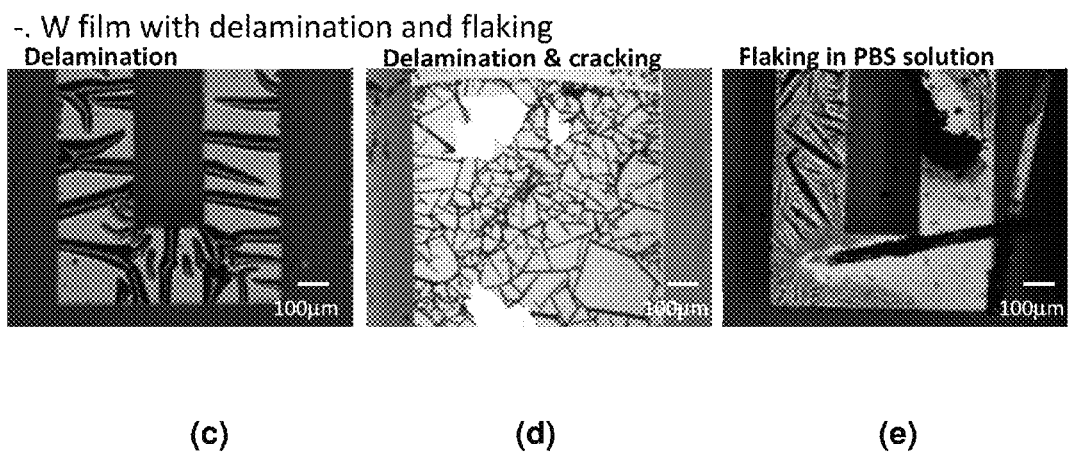

Although delamination has a higher probability of occurring in thicker films, especially when they are subjected to longer immersion times, flaking was only observed for thin (100 nm) tungsten films, possibly due to compressive residual stress developed during the sputtering process. It is possible that the dissolution kinetics of tungsten might differ between the initial and later stages. For example, tungsten may uniformly dissolve at the initial stage, with disintegration/flaking becoming significant at the later stage. Using constant parameters k and D to fit experimental data at the later stage would over-estimate dissolution rates at the initial stage. FIG. 109 provides photographs showing initial dissolution of tungsten traces with uniform surface morphology during the first 6 hours (FIG. 109(a)) followed by non-uniform surface morphology suggesting disintegration/flaking of tungsten traces becoming significant at later times, e.g., 18 hours, (FIG. 109(b)), as well as examples of tungsten delamination (FIG. 109(c)), tungsten delamination and cracking (FIG. 109(d)), and tungsten flaking in PBS solution (FIG. 109(e)). It was possible to reduce residual stress by increasing the sputtering Ar pressure, changing to different substrates (glass to Si), and using a Cr adhesion layer to promote the stable alpha W phase with a better lattice match (both BCC phases).

Figure 110:
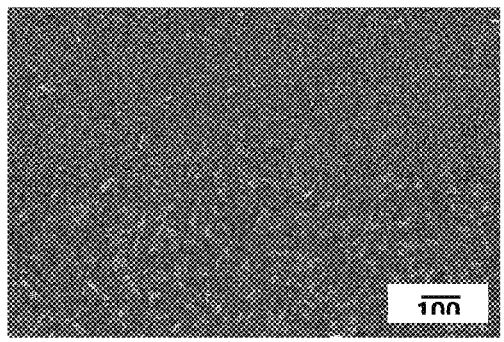
Figure 110:
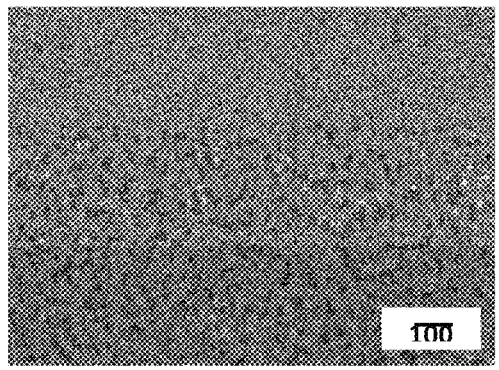
Figure 110:
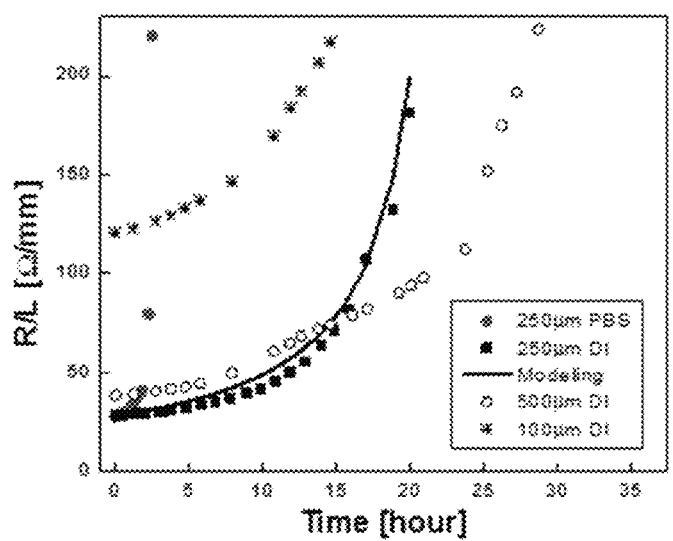

FIG. 110 shows photographs of 100 nm W films before dissolution in DI water (FIG. 100(a)) and after 20 hours of dissolution (FIG. 110(b)). Tungsten dissolved in DI water with good behavior, and much faster in PBS solution with flaking of the thin film. A dense W thin film became a porous network after dissolution. XPS did not show WO3 formation on the surface during dissolution. FIG. 110(c) shows the dissolution behavior of a 100 nm W film of different widths.

Figure 111:
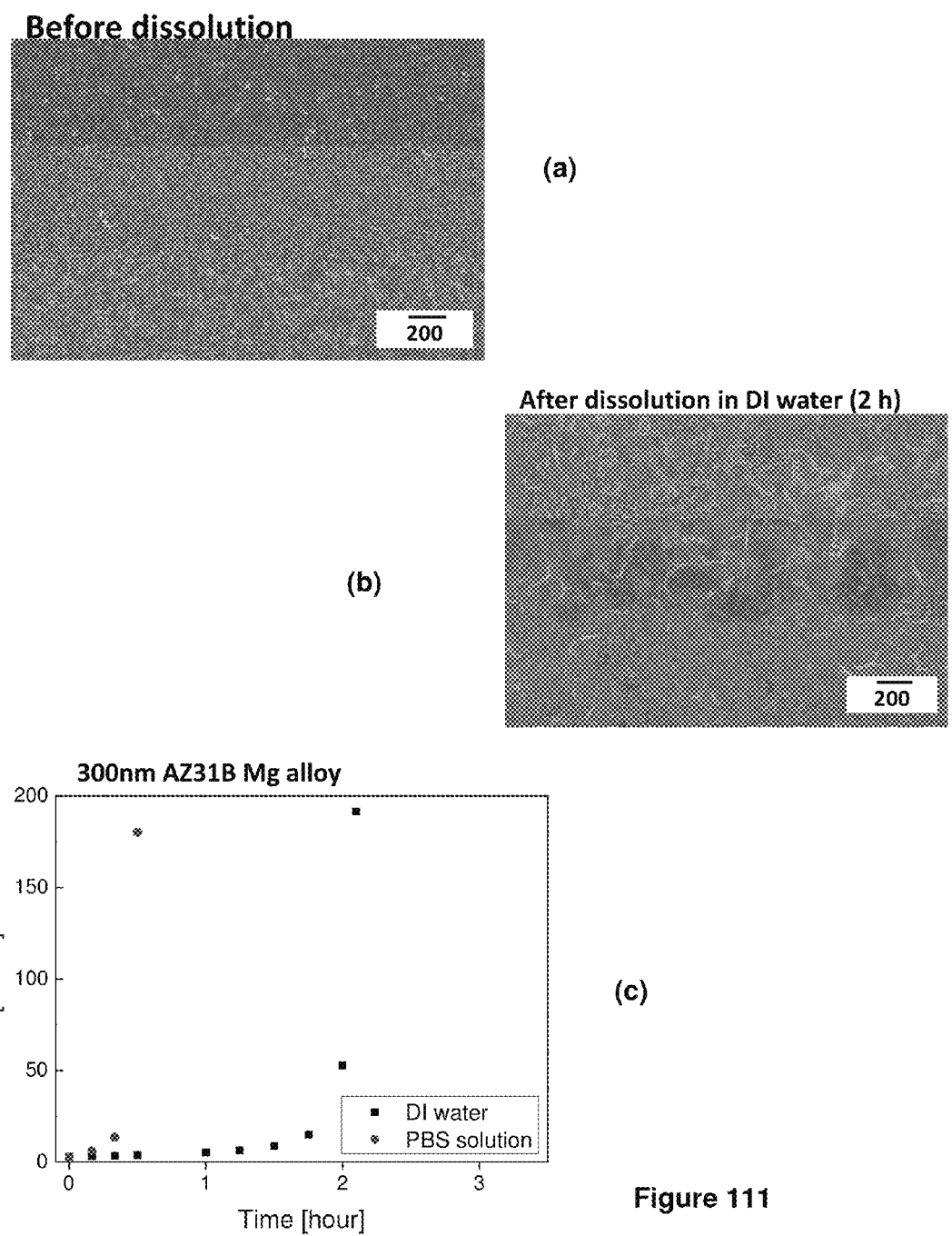

The dissolution of AZ31B was observed to be non-uniform. AZ31B eventually fully dissolved, with dissolution being much faster in PBS solution. XPS results showed MgO/Mg(OH)$_2$ on the surface exposed to solution. FIG. 111 shows an AZ31B film before dissolution (FIG. 111(a)) and after 2 hours of dissolution in DI water (FIG. 111(b)). FIG. 111(c) shows the dissolution behavior of 300 nm AZ31B Mg alloy in DI water and PBS solution.

Figure 112:
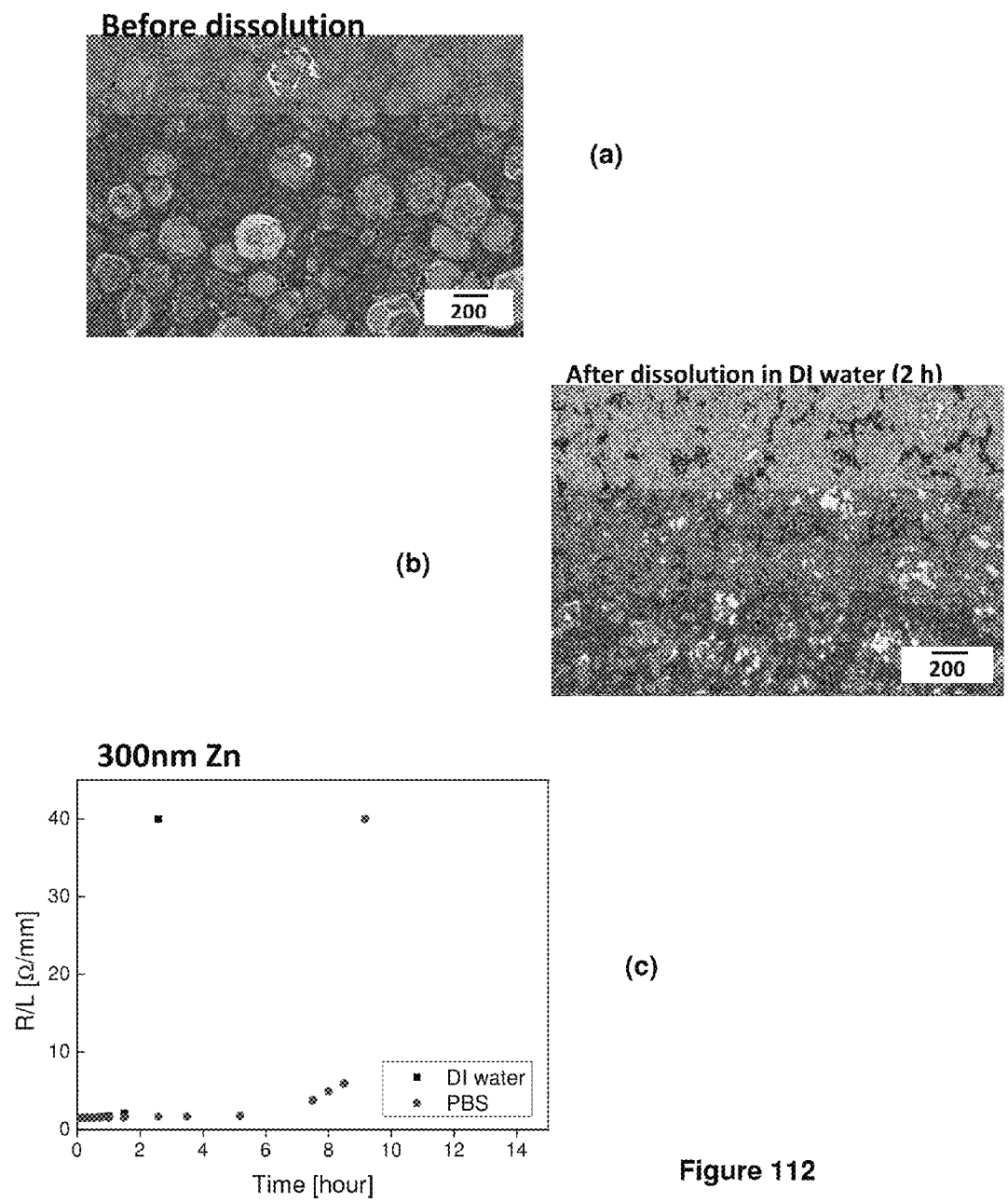

The dissolution of Zn was observed to be non-uniform. Zn eventually fully dissolved, with dissolution being faster in DI water because the formation of phosphates slows down dissolution. XPS could not be performed on Zn due to low vapor pressure. FIG. 112 shows an Zn film before dissolution (FIG. 112(a)) and after 2 hours of dissolution in DI water (FIG. 112(b)). FIG. 112(c) shows the dissolution behavior of 300 nm Zn in DI water and PBS solution.

Figure 113:
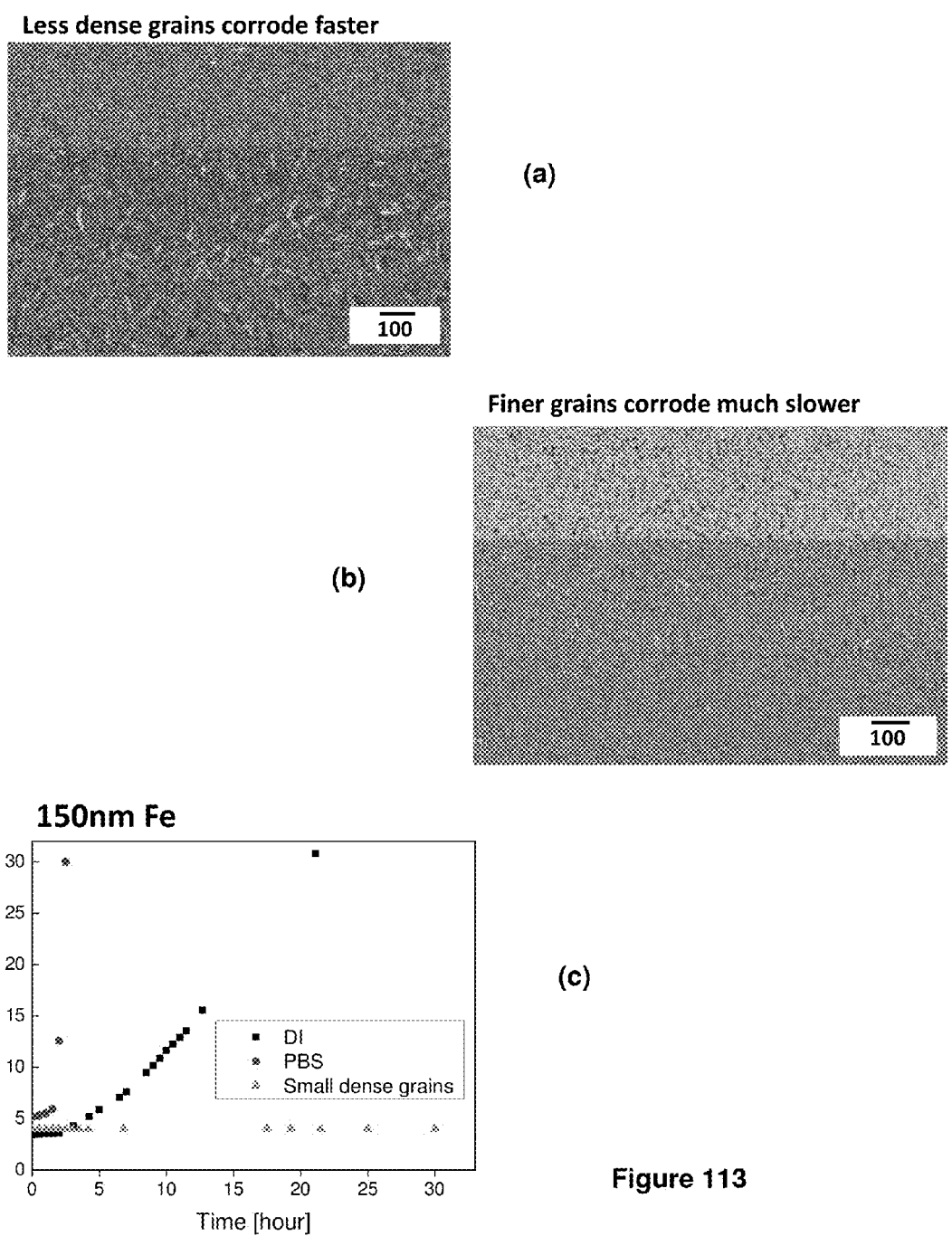

The dissolution of Fe was observed to be non-uniform. Fe began rusting at some locations and the rust products did not fully dissolve up to several days. Fe dissolution is very sensitive to deposition conditions with thin forms having smaller/denser grains showing no resistance change after several days. Fe dissolves faster in PBS solution. XPS showed surface products associated with rust, Fe$_2$O$_3$/Fe(OH)$_3$. FIG. 113 shows an Fe film with coarse/dense grains (FIG. 112(a)) that corrode faster than the finer grains of FIG. 112(b). FIG. 112(c) shows the dissolution behavior of 150 nm Fe in DI water and PBS solution.

Figure 114:
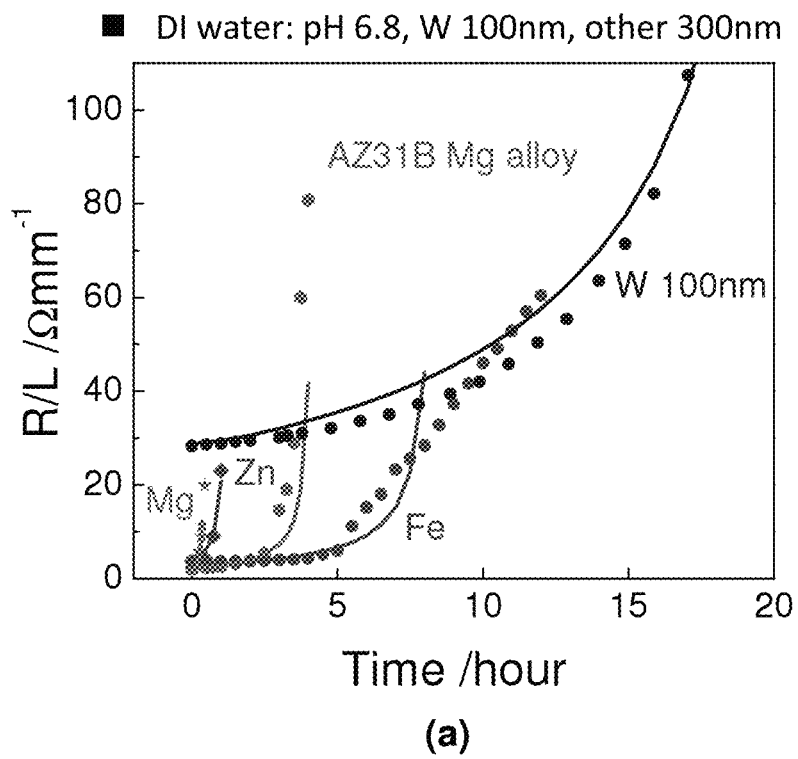
Figure 114:
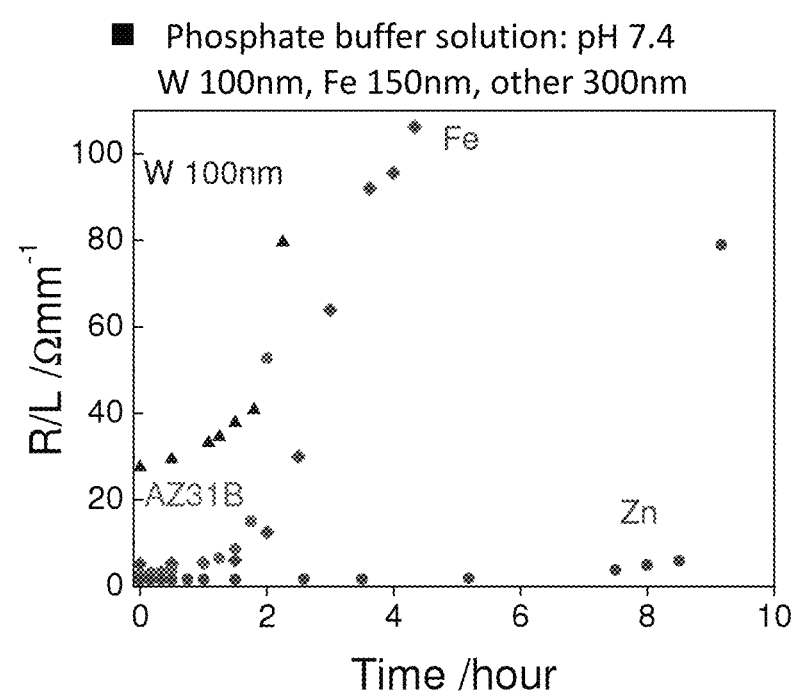
Figure 114:
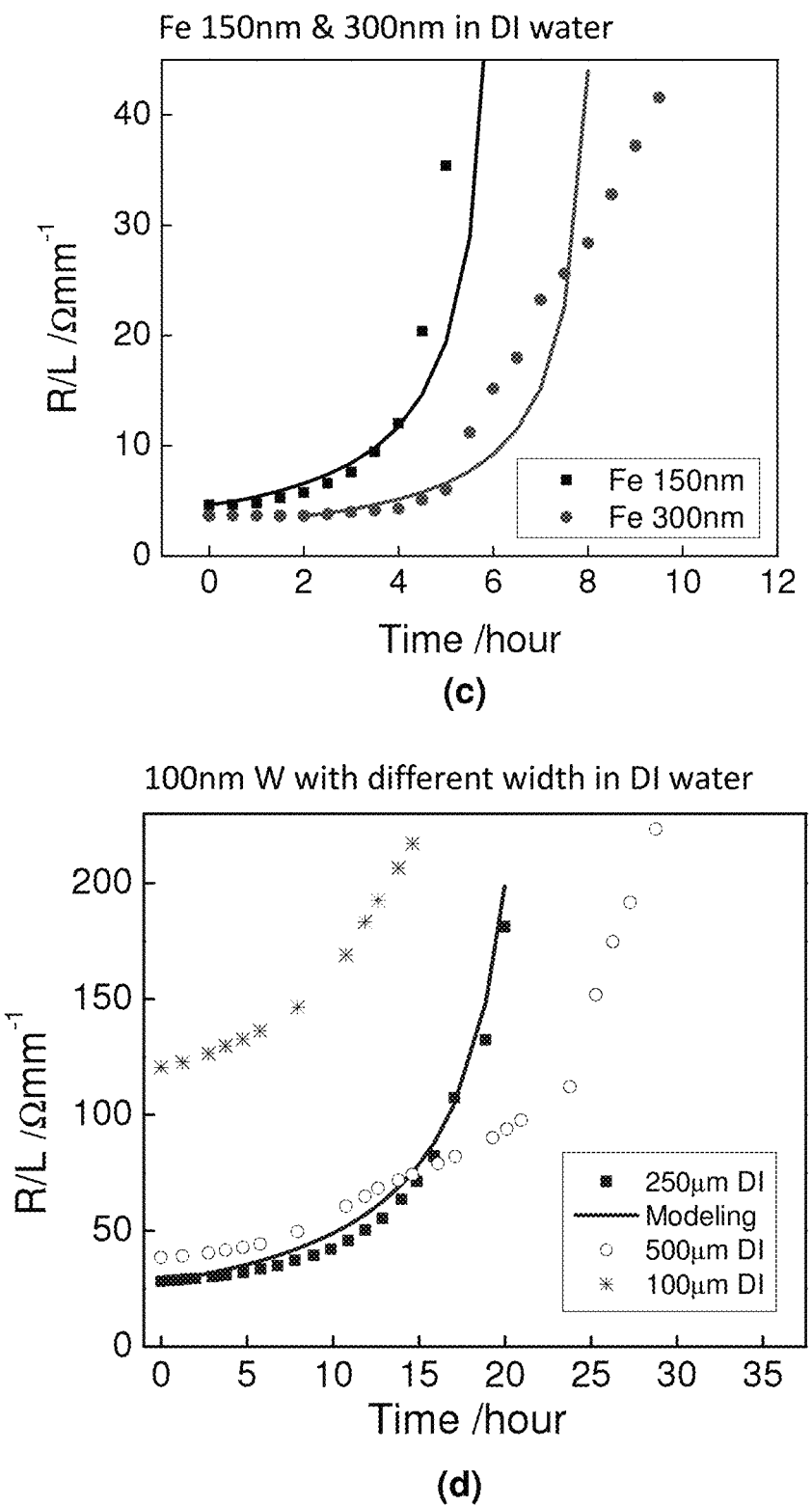

FIG. 114 summarizes metal dissolution data in DI water (pH 6.8) and in phosphate buffer solution (pH 7.4). For comparison, the dissolution properties of Si in PBS are shown in FIG. 115, and summarized in Table 11.

TABLE 11

| | pH 6 @ RT | pH 6 @ 37° C. | pH 8 @ RT | pH 8 @ 37° C. | pH 10 @RT |
|---|---|---|---|---|---|
| Diss. rate | 0.6 nm/day | 1.3 nm/day | 8 nm/day | 17.5 nm/day | 14 nm/hour |

** Dissolution rate in pH 7.4 - - - 4.5 nm/day (37° C.), 2 nm/day (RT)

Transient Devices in Thermal Therapy

Transient devices may be implanted at a surgical site to administer thermal therapy to counter bacterial infection. FIG. 116 shows a photograph (FIG. 116(a)) and infrared image (FIG. 116(b)) of a transient thermal therapy device having a Mg inductor coil and a Mg resistor (~300Ω) on a silk substrate. At 49 MHz, the device operates at about 25% power. This device was implanted in mouse models with no sign of infection after one week.

FIG. 117 shows a photograph of in vitro evaluations of bacterial cultures. Tissues were weighed (70-80 mg for each sample) and homogenized in DPBS (2.5-3 mL) and diluted 10$^5$, 10$^6$ and 10$^7$ times. 50 µL of each dilution was used to plate 2 TSB agar plates. After 24 hours of incubation at 37° C., colonies on the plates were counted and listed in Table 12, where (H) contained no implant, and no injection of healthy tissue, (D) contained the implanted device, and (B1 and B2) were injected with bacteria:

TABLE 12

| samples | dilution | | |
|---|---|---|---|
| | $10^5$ | $10^6$ | $10^7$ |
| H | 0 | 0 | 0 |
| D | 0 | 0 | 0 |
| B1 | 25.5 | 3.5 | 0 |
| B2 | 36.5 | 4 | 1 |

No bacterium was observed on H or D.

Summary of Earlier Work

Figure 118:
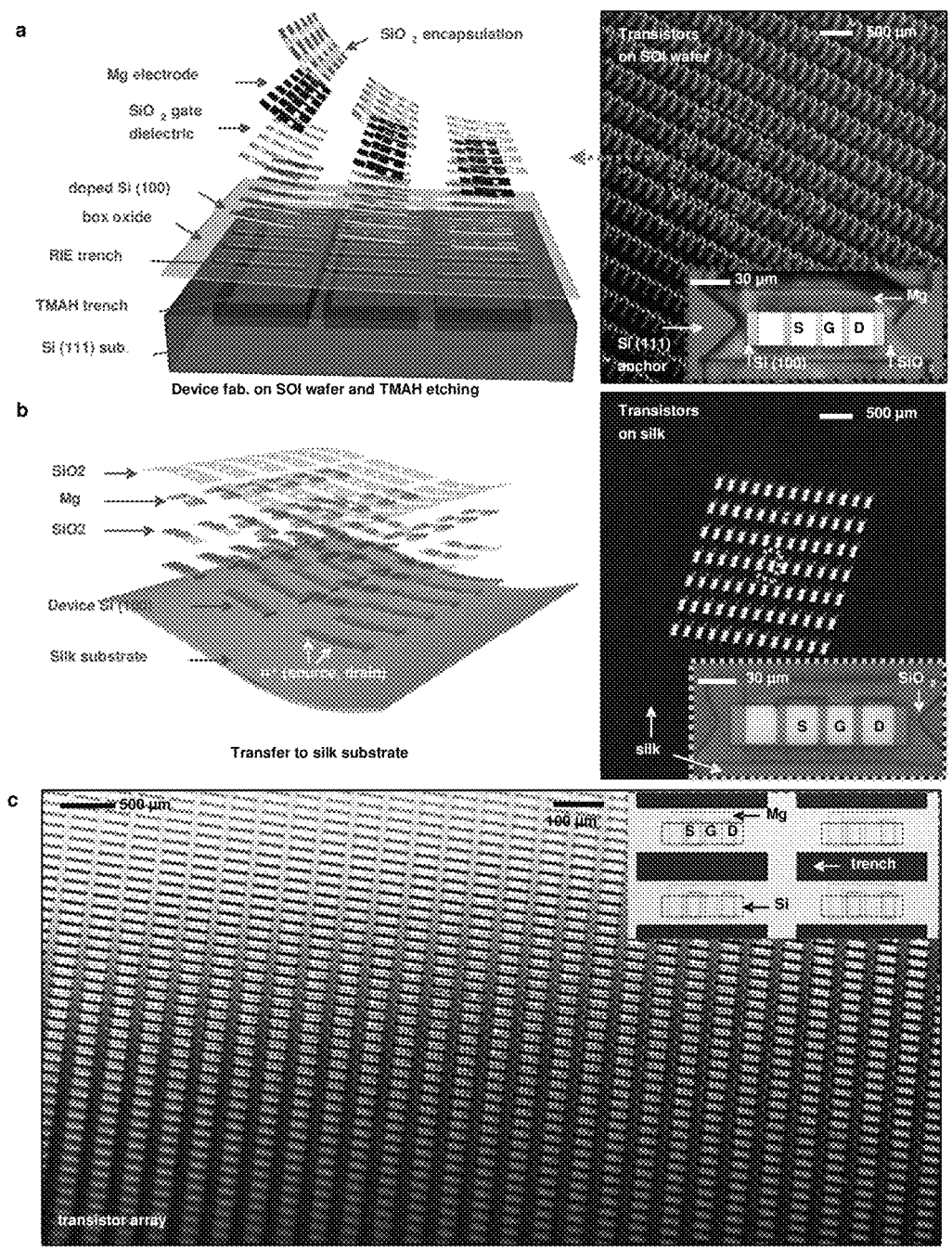
Figure 120:
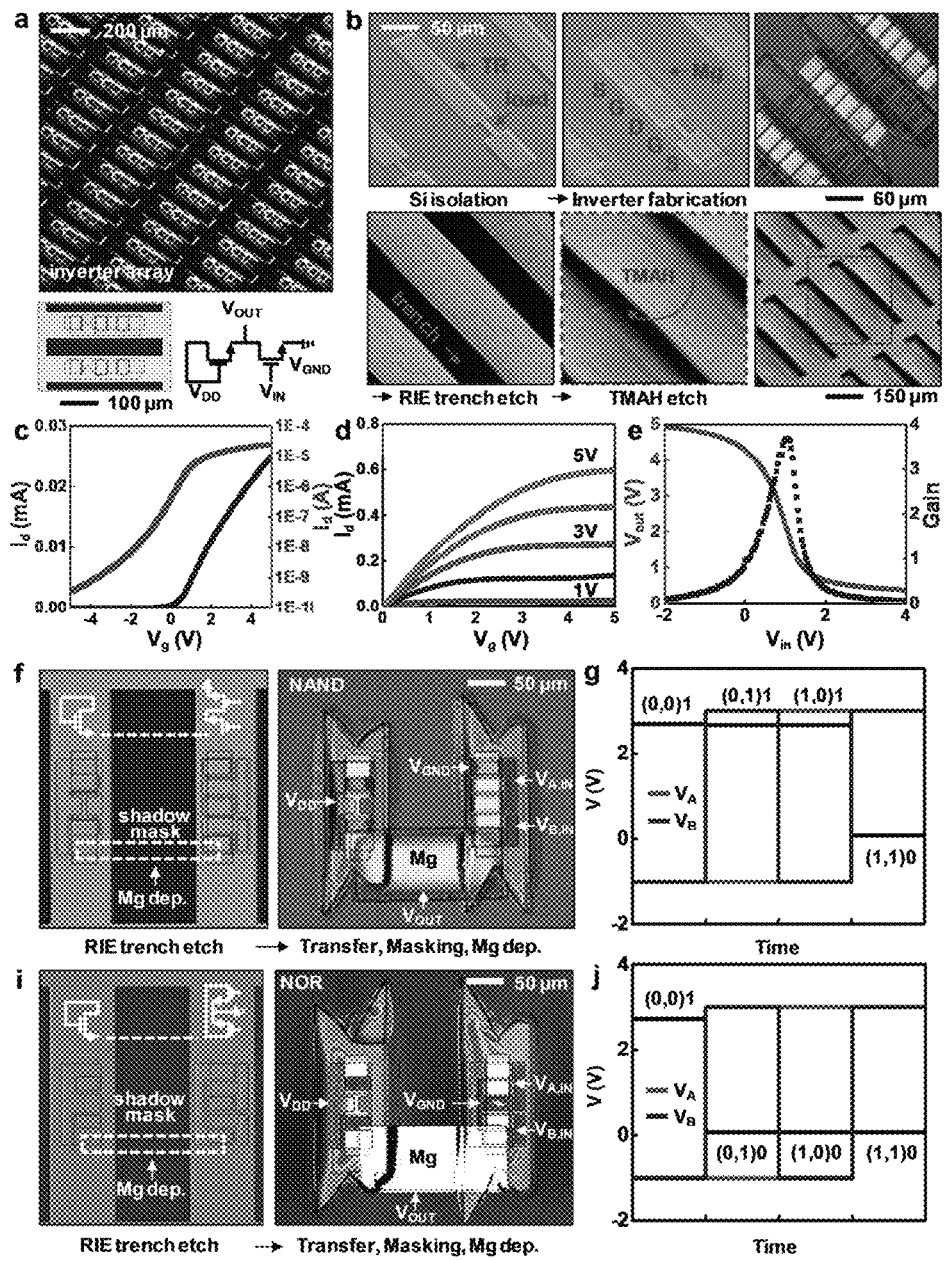
Figure 121:
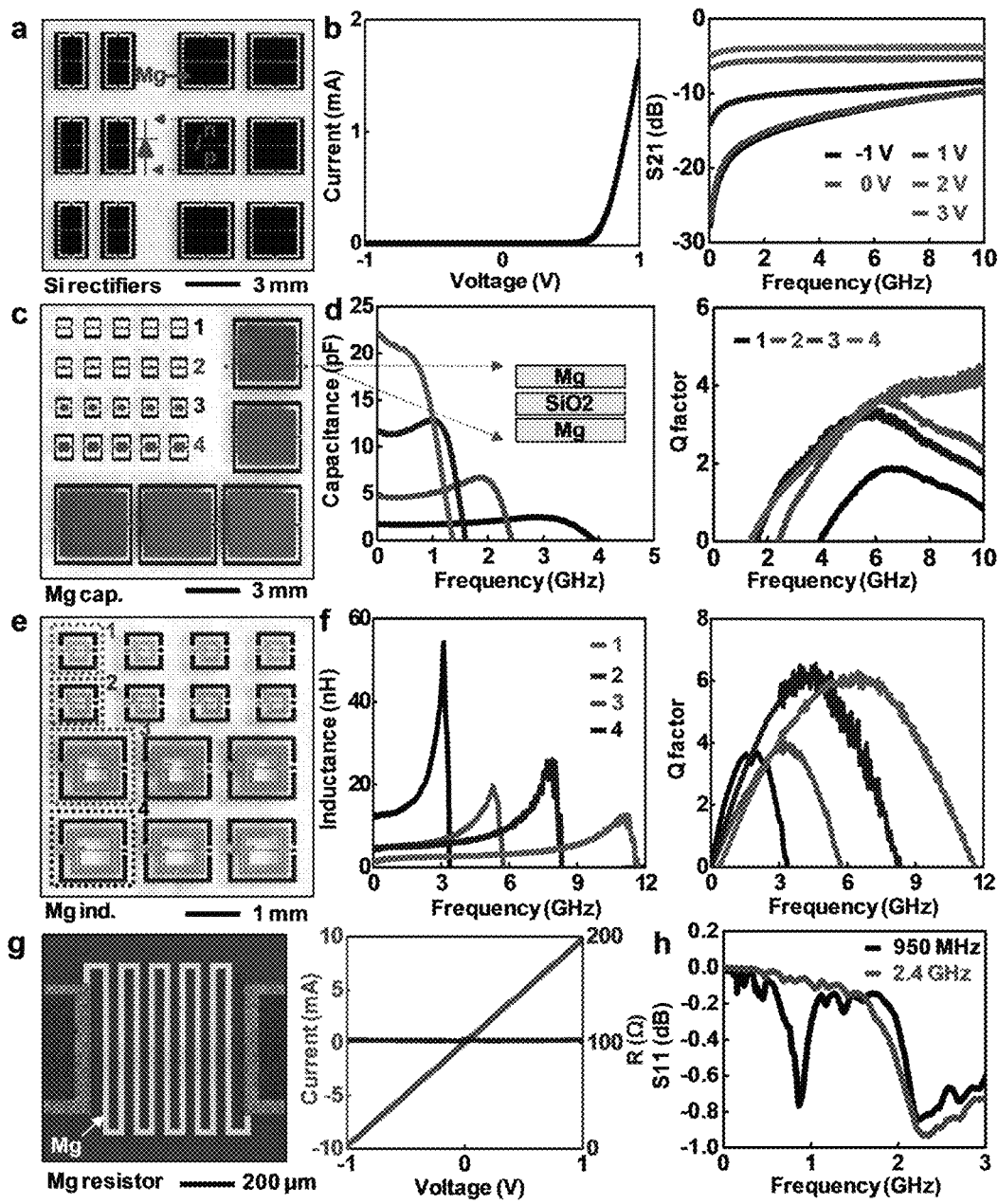
Figure 122:
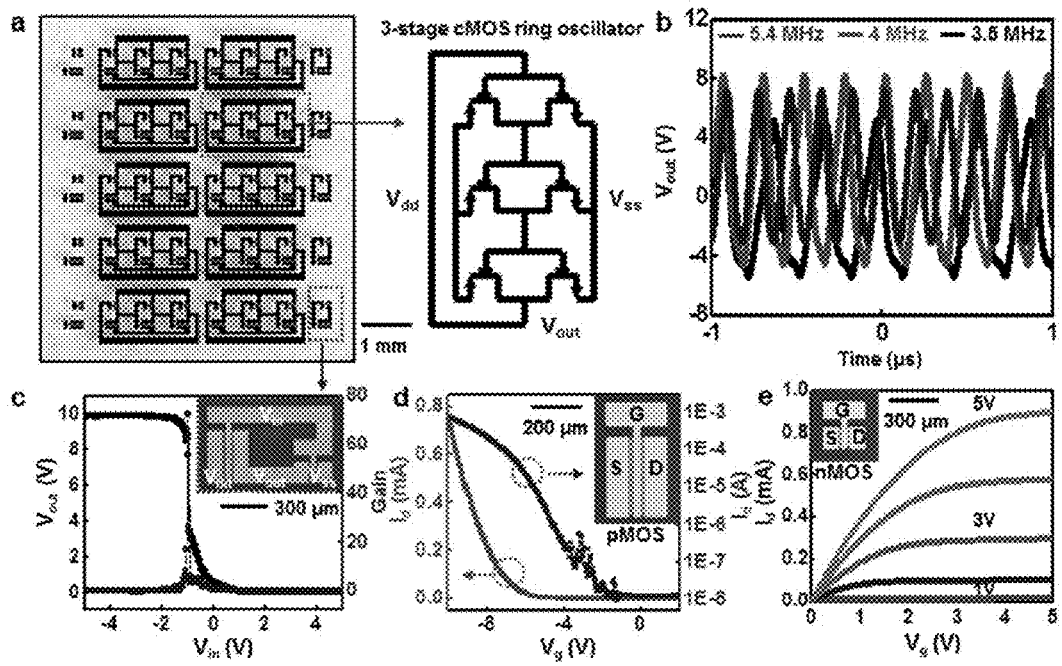
Figure 127:
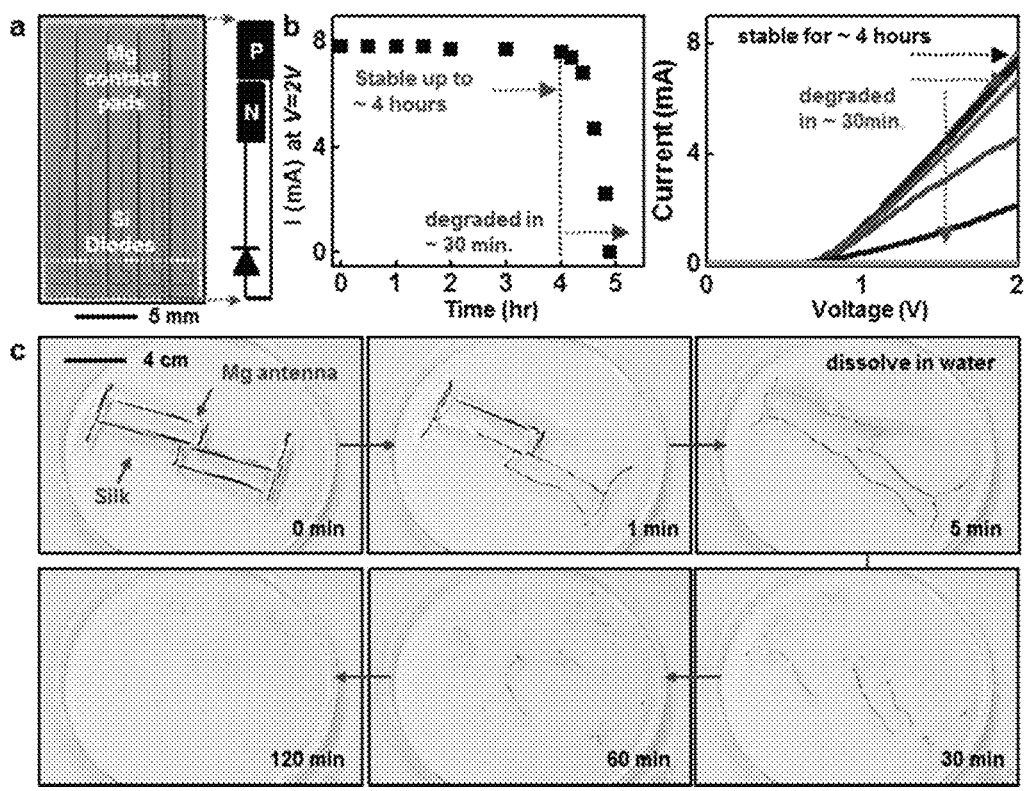
Figure 128:
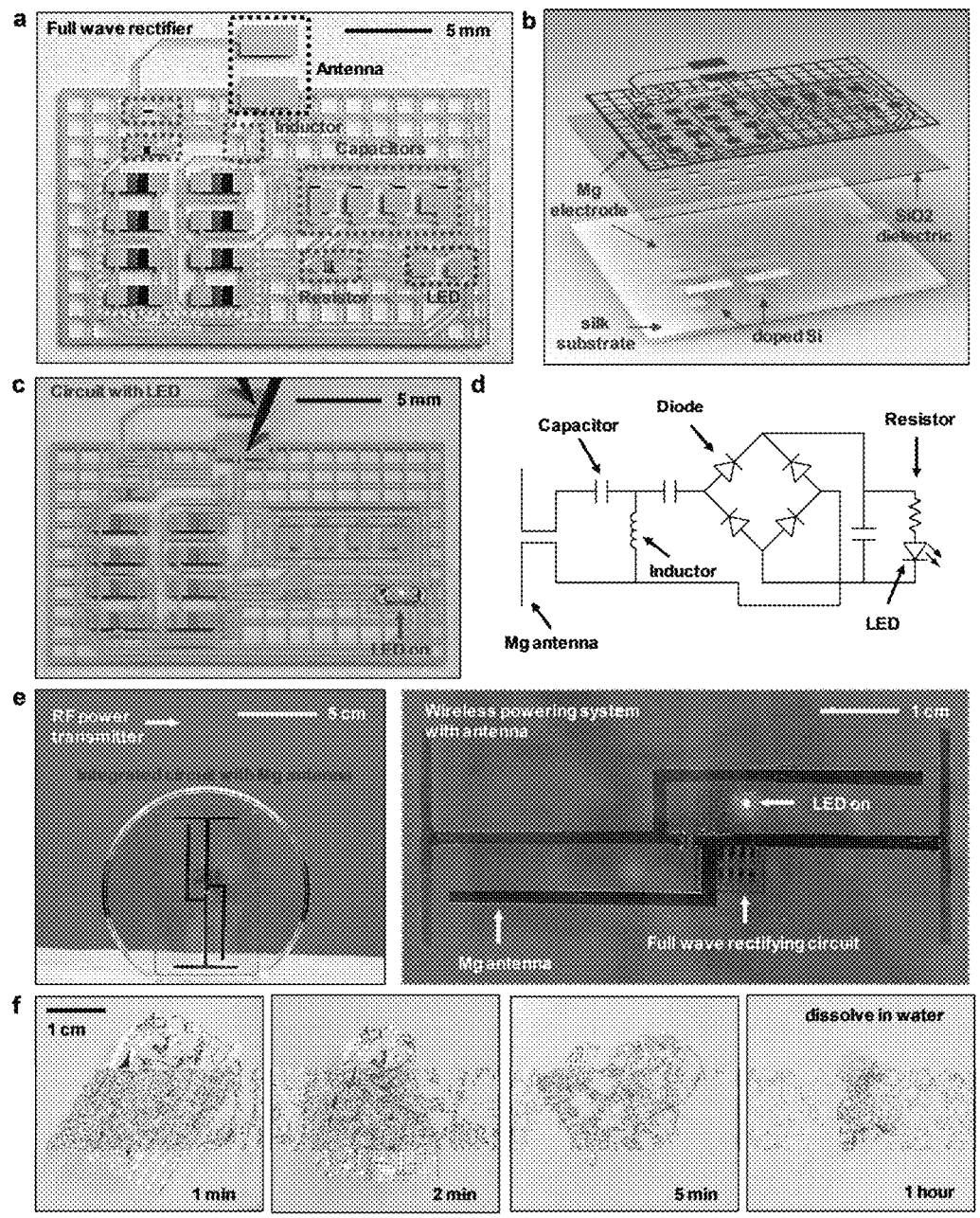

FIG. 118 provides a schematic diagram of fully formed transient MOSFETS and integrated circuits on silk substrates. FIG. 119 provides photographs showing a time lapse of the dissolution of the fully formed transient MOSFETS and integrated circuits of FIG. 118. FIG. 120 provides photographs and performance plots of fully formed transient MOSFETS and integrated circuits. In particular, nmos inverter arrays and logic gates were fabricated using photolithography and electrically characterized. FIG. 121 provides photographs and performance plots of transient RF electronics: (a-b) rectifiers, (c-d) capacitors, (e-f) inductors, and (g-h) resistors. FIG. 122 provides photographs and performance plots of transient RF electronics in the form of 3-stage cMOS ring oscillators. FIG. 123 provides photographs of Fe electrode cMOS oscillators. FIG. 124 provides photographs, schematics and plots relating to Fe electrode cMOS logic circuits (NAND, NOR). FIG. 125 provides photographs of logic circuit transformation (logic circuits to cMOS inverter). FIG. 126 provides plots showing the performance of Mg alloy (AZ31B, Al 3%, ZN 1%) TFTs. FIG. 127 provides photographs, performance plots, and time lapse dissolution studies of transient RF electronics having antennas. FIG. 128 provides schematics, photographs, and time lapse dissolution studies of a transient RF device incorporating components from FIGS. 121-127.

Example 11

This Example discloses an electrochemical transient power supply. In an embodiment of the electrochemical transient power supply, Mg—Fe or Mg—Pt(Au) metal couples form a transient battery upon Mg dissolution to form an in-situ micro-heater. FIG. 129 shows a schematic of the electrochemical transient power supply (FIG. 129(a)) and performance plots showing voltage and discharge current over time for the metal couples (FIGS. 129(b)-(c)).

STATEMENTS REGARDING INCORPORATION BY REFERENCE AND VARIATIONS

All references cited throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

U.S. Provisional Application No. 61/565,907, filed Dec. 1, 2011, and Appendices A and B, submitted herewith, are each hereby incorporated by reference in their entireties.

The following references relate generally to flexible and/or stretchable semiconductor materials and devices and are each hereby incorporated by reference in its entirety: U.S. patent application Ser. No. 12/778,588, filed on May 12, 2010, PCT International Application No. PCT/US05/19354, filed Jun. 2, 2005 and published under No. WO2005/122285 on Dec. 22, 2005, U.S. Provisional Patent Application No. 61/313,397, filed Mar. 12, 2010, U.S. patent application Ser. No. 11/851,182, filed Sep. 6, 2007 and published under No. 2008/0157235 on Jul. 3, 2008, and PCT International Application No. PCT/US07/77759, filed Sep. 6, 2007 and published under No. WO2008/030960 on Mar. 13, 2008.

The following references relate generally to bioresorbable substrates and methods of making bioresorbable substrates and are each hereby incorporated by reference in its entirety: PCT Patent Application PCT/US03/19968 filed Jun. 24, 2003, PCT Patent Application PCT/US04/000255 filed Jan. 7, 2004, PCT Patent Application PCT/US04/11199 filed Apr. 12, 2004, PCT Patent Application PCT/US05/20844 filed Jun. 13, 2005, and PCT Patent Application PCT/US06/029826 filed Jul. 28, 2006.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, and method steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individually or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

The following references relate generally to fabrication methods, structures and systems for making electronic devices, and are hereby incorporated by reference to the extent not inconsistent with the disclosure in this application.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

cally include the values provided as endpoint values of the range. As used herein, ranges specifically include all the integer values of the range. For example, a range of 1 to 100 specifically includes the end point values of 1 and 100. It will be understood that any subranges or individual values in a range or subrange that are included in the description herein can be excluded from the claims herein.

As used herein, "comprising" is synonymous and can be used interchangeably with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" can be replaced with either of the other two terms. The invention illustratively described herein suitably

| Our Docket No. | Application No. | Filing Date | Publication No. | Publication Date | Patent No. | Issue Date |
|---|---|---|---|---|---|---|
| 18-04 | 11/115,954 | Apr. 27, 2005 | 2005/0238967 | Oct. 27, 2005 | 7,195,733 | Mar. 27, 2007 |
| 38-04A | 11/145,574 | Jun. 2, 2005 | 2009/0294803 | Dec. 3, 2009 | 7,622,367 | Nov. 24, 2009 |
| 38-04B | 11/145,542 | Jun. 2, 2005 | 2006/0038182 | Feb. 23, 2006 | 7,557,367 | Jul. 7, 2009 |
| 43-06 | 11/421,654 | Jun. 1, 2006 | 2007/0032089 | Feb. 8, 2007 | 7,799,699 | Sep. 21, 2010 |
| 41-06 | 11/423,192 | Jun. 9, 2006 | 2009/0199960 | Aug. 13, 2009 | 7,943,491 | May 17, 2011 |
| 38-04C | 11/423,287 | Jun. 9, 2006 | 2006/0286785 | Dec. 21, 2006 | 7,521,292 | Apr. 21, 2009 |
| 25-06 | 11/465,317 | Aug. 17, 2006 | — | — | — | — |
| 134-06 | 11/851,182 | Sep. 6, 2007 | 2008/0157235 | Jul. 3, 2008 | — | — |
| 151-06 | 11/585,788 | Sep. 20, 2007 | 2008/0108171 | May 8, 2008 | 7,932,123 | Apr. 26, 2011 |
| 216-06 | 11/981,380 | Oct. 31, 2007 | 2010/0283069 | Nov. 11, 2010 | 7,972,875 | Jul. 5, 2011 |
| 213-07 | 12/398,811 | Mar. 5, 2009 | 2010/0002402 | Jan. 7, 2010 | — | — |
| 38-04D | 12/405,475 | Mar. 17, 2009 | 2010/0059863 | Mar. 11, 2010 | 8,198,621 | Jun. 12, 2012 |
| 170-07 | 12/418,071 | Apr. 3, 2009 | 2010/0052112 | Mar. 4, 2010 | — | — |
| 60-09 | 12/778,588 | May 12, 2010 | 2010/0317132 | Dec. 16, 2010 | — | — |
| 19-10 | 12/916,934 | Nov. 1, 2010 | 2012/0105528 | May 03, 2012 | — | — |
| 126-09 | 12/968,637 | Dec. 15, 2010 | 2012/0157804 | Jun. 21, 2012 | — | — |
| 137-05 | 11/675,659 | Feb. 16, 2007 | 2008/0055581 | Mar. 6, 2008 | — | — |
| 15-10 | 12/892,001 | Sep. 28, 2010 | 2011/0230747 | Sep. 22, 2011 | — | — |
| 71-07 | 12/669,287 | Jan. 15, 2010 | 2011/0187798 | Aug. 04, 2011 | — | — |
| 145-03 | 11/001,689 | Dec. 1, 2004 | 2006/0286488 | Dec. 21, 2006 | 7,704,684 | Apr. 27, 2010 |
| 38-04A1 | 12/564,566 | Sep. 22, 2009 | 2010/0072577 | Mar. 25, 2010 | 7,982,296 | Jul. 19, 2011 |
| 43-06A | 12/844,492 | Jul. 27, 2010 | 2010/0289124 | Nov. 18, 2010 | 8,039,847 | Oct. 18, 2011 |
| 90-06 | 11/782,799 | Jul. 25, 2007 | 2008/0212102 | Sep. 4, 2008 | 7,705,280 | Apr. 27, 2010 |
| 118-08 | 12/996,924 | Dec. 8, 2010 | 2011/0147715 | Jun. 23, 2011 | — | — |
| 3-10 | 12/947,120 | Nov. 16, 2010 | 2011/0170225 | Jul. 14, 2011 | — | — |
| 116-07 | 12/372,605 | Feb. 17, 2009 | — | — | — | — |
| 134-06B | 13/441,598 | Apr. 6, 2012 | — | — | — | — |
| 38-04E | 13/441,618 | Apr. 6, 2012 | — | — | — | — |
| 28-11 | 13/472,165 | May 15, 2012 | — | — | — | — |
| 7-11 | 13/486,726 | Jun. 1, 2012 | — | — | — | — |
| 84-11 | 13/549,291 | Jul. 13, 2012 | — | — | — | — |
| 25-06A | 13/596,343 | Aug. 28, 2012 | — | — | — | — |

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are now described. Nothing herein is to be construed as an admission that the invention is not entitled to antedate such disclosure by virtue of prior invention.

Whenever a range is given in the specification, for example, a range of integers, a temperature range, a time range, a composition range, or concentration range, all intermediate ranges and subranges, as well as all individual values included in the ranges given are intended to be included in the disclosure. As used herein, ranges specifican be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the invention has been specifically disclosed by preferred embodiments and optional features, modification and variation of the concepts herein disclosed can be resorted to by those skilled in the art, and that such modifications and variations are considered to be within the scope of this invention as defined by the appended claims.

What is claimed is:

1. An actively triggered transient electronic device comprising:
   a substrate;
   one or more inorganic components supported by said substrate; wherein said one or more inorganic components independently comprise a selectively transformable material, wherein said one or more inorganic components have a preselected transience profile in response to an external or internal stimulus;
   a silk overcoat provided on at least a portion of said one or more inorganic components; and
   an actuator responsive to a user initiated external trigger signal and operably connected to said one or more inorganic components, wherein upon said device receiving said external trigger signal said actuator at least partially removes said silk overcoat so as to expose at least a portion of said one or more inorganic components to said external or internal stimulus, thereby providing a programmable transformation of the actively triggered transient electronic device in response to said external trigger signal, wherein said programmable transformation provides a change in function of the actively triggered transient electronic device from a first condition to a second condition.

2. The device of claim 1, wherein said user initiated external trigger signal is an electronic signal, an optical signal, a thermal signal, a magnetic signal, a mechanical signal, a chemical signal, an acoustic signal or an electrochemical signal.

3. The device of claim 1, wherein said actuator generates electromagnetic radiation, acoustic energy, an electric field, a magnetic field, heat, a RF signal, a voltage, a chemical change, or a biological change in response to said user initiated external trigger signal, thereby initiating said at least partial transformation.

4. The device of claim 1, wherein said actuator comprises a heater, a reservoir containing a chemical agent capable of causing a chemical change or a biological change, a source of electromagnetic radiation, a source of an electric field, a source of RF energy or a source of acoustic energy.

5. The device of claim 1, wherein said actuator comprises an encapsulating material at least partially encapsulating one or more of said inorganic components, wherein said encapsulating material comprises a selectively removable material that is at least partially removed upon said device receiving said external trigger signal to expose said one or more partially encapsulated inorganic components to said internal or external stimulus, thereby initiating said at least partial transformation.

6. The device of claim 1, wherein said programmable transformation of the actively triggered transient electronic device of said one or more inorganic components occurs:
   (i) by a phase change, wherein at least a portion of said one or more inorganic components undergoes at least partial sublimation or melting;
   (ii) via at least partial dissolution of one or more inorganic components in a solvent;
   (iii) via at least partial hydrolysis of said one or more inorganic components;
   (iv) via at least partial etching or corrosion of said one or more inorganic components;
   (v) by a photochemical reaction wherein at least a portion of said one or more inorganic components absorbs electromagnetic radiation and undergoes an at least partial chemical or physical change;
   (vi) by an electrochemical reaction; or
   (vii) by a chemical or physical change wherein at least a portion of said one or more inorganic components is converted to an insulator;
   thereby providing said programmable transformation of the transient electronic device.

7. The device of claim 1, wherein said preselected transience profile is characterized by a transformation of 0.01% to 100% of said one or more inorganic components over a time interval selected from the range of 1 ms to 2 years, thereby providing said programmable transformation of the transient electronic device.

8. The device of claim 1, wherein said preselected transience profile is characterized by a decrease in electrical conductivity of said one or more inorganic components at a rate selected over the range of $10^{10}$ S·m$^{-1}$ s$^{-1}$ to 1 S·m$^{-1}$ s$^{-1}$.

9. The device of claim 1, wherein said external or internal stimulus comprises a change in biological environment, a change in temperature, a change in pressure, exposure to electromagnetic radiation, contact with a chemical agent, application of an electric field, application of a magnetic field, exposure to a solvent, change in pH of an external environment, change in salt concentration of an external environment, or application of an anodic voltage.

10. The device of claim 1, further comprising an encapsulating material at least partially encapsulating one or more of said inorganic components, wherein said encapsulating material comprises a selectively removable material that is at least partially removed to expose said inorganic components.

11. The device of claim 10, wherein said encapsulating material comprises a material selected from the group consisting of MgO, silk, collagen, gelatin, PLGA, polyvinylalcohol (PVA), PLA, SiO$_2$, polyanhydrides (polyesters), polyhydroxyalkanoates (PHAs) and polyphosphates.

12. The device of claim 11, wherein said encapsulating material comprises a silk composite material.

13. The device of claim 1, wherein said one or more inorganic components each independently have a thickness less than or equal to 100 nm.

14. The device of claim 1, wherein said one or more inorganic components independently comprise one or more perforated structures.

15. The device of claim 1, wherein said one or more inorganic components independently comprise a polycrystalline semiconductor material, single crystalline semiconductor material or a doped polycrystalline.

16. The device of claim 1, wherein said one or more inorganic components independently comprise Si, Ga, GaAs, ZnO or any combination of these.

17. The device of claim 1, wherein said one or more inorganic components are selected from inorganic semiconductor components, metallic conductor components and combinations of inorganic semiconductor components and metallic conductor components.

18. The device of claim 17, comprising said inorganic semiconductor components comprising ZnO and said metallic conductor components comprising Mg, Fe, W or an alloy thereof.

19. The device of claim 1, wherein said substrate comprises silk.

20. The device of claim 10, wherein a time for a thickness of said selectively removable material to reach zero is given by:

$$t_c = \frac{4\rho_m M(H_2O)}{kw_0 M(m)} \frac{\sqrt{\frac{kh_0^2}{D}}}{\tanh\sqrt{\frac{kh_0^2}{D}}};$$

where $t_c$ is the critical time, $\rho_m$ is the mass density of the material, $M(H_2O)$ is the molar mass of water, $M(m)$ is the molar mass of the material, $h_0$ is the initial thickness of the material, $D$ is the diffusivity of water, $k$ is the reaction constant for the dissolution reaction, and $w_0$ is the initial concentration of water; wherein $k$ has a value selected from the range of $10^5$ to $10^{-10}$ s$^{-1}$.

21. The device of claim 17, wherein said one or more metallic conductor components independently comprise Mg, W, Fe, an alloy of Mg with one or more additional materials selected from the group consisting of Al, Ag, Ca, Li, Mn, Si, Sn, Y, Zn, and Zr, wherein said one or more additional materials of said alloy has a concentration equal to or less than 10% by weight or an alloy of Mg with one or more rare earth elements, wherein said one or more rare earth elements of said alloy has a concentration equal to or less than 10% by weight.

22. The device of claim 1, wherein said programmable transformation of the actively triggered transient electronic device occurs by a process other than bioresorption.

23. A method of using an actively triggered transient electronic device, said method comprising the steps of:
providing the actively triggered transient electronic device comprising:
a substrate;
one or more inorganic components supported by said substrate; wherein said one or more inorganic components independently comprise a selectively transformable material, wherein said one or more inorganic components have a preselected transience profile in response to an external or internal stimulus;
a silk overcoat provided on at least a portion of said one or more inorganic components; and
an actuator responsive to a user initiated external trigger signal and operably connected to said one or more inorganic components, wherein upon said device receiving said external trigger signal said actuator at least partially removes said silk overcoat so as to expose at least a portion of said one or more inorganic components to said external or internal stimulus, thereby providing a programmable transformation of the actively triggered transient electronic device in response to said external trigger signal, wherein said programmable transformation provides a change of the function of the actively triggered transient electronic device from a first condition to a second condition corresponding to a second functionality different from a first functionality; and
providing said user initiated external trigger signal to said electronic device, wherein said actuator directly or indirectly initiates at least partial transformation of said one or more inorganic components, thereby providing said programmable transformation.

24. The method of claim 23, wherein said one or more inorganic components are selected from inorganic semiconductor components, metallic conductor components and combinations of inorganic semiconductor components and metallic conductor components.

25. The method of claim 23, wherein said programmable transformation of the actively triggered transient electronic device occurs by a process other than bioresorption.

26. An actively triggered transient electronic device comprising:
a substrate;
one or more inorganic components supported by said substrate; wherein said one or more inorganic components independently comprise a selectively transformable material, wherein said one or more inorganic components have a preselected transience profile in response to an external or internal stimulus;
a silk overcoat provided on at least a portion of said one or more inorganic components; and
an actuator responsive to a user initiated external trigger signal and operably connected to said one or more inorganic components, wherein upon said device receiving said external trigger signal said actuator at least partially removes said silk overcoat so as to expose at least a portion of said one or more inorganic components to said external or internal stimulus, thereby providing a programmable transformation of the actively triggered transient electronic device in response to said external trigger signal, wherein said programmable transformation provides a change in function of the actively triggered transient electronic device from a first condition to a second condition;
an encapsulating material at least partially encapsulating one or more of said inorganic components, wherein said encapsulating material comprises a selectively removable material that is at least partially removed to expose said inorganic components;
wherein a time for a thickness of said selectively removable material to reach zero is given by:

$$t_c = \frac{4\rho_m M(H_2O)}{kw_0 M(m)} \frac{\sqrt{\frac{kh_0^2}{D}}}{\tanh\sqrt{\frac{kh_0^2}{D}}};$$

where $t_c$ is the critical time, $\rho_m$ is the mass density of the material, $M(H_2O)$ is the molar mass of water, $M(m)$ is the molar mass of the material, $h_0$ is the initial thickness of the material, $D$ is the diffusivity of water, $k$ is the reaction constant for the dissolution reaction, and $w_0$ is the initial concentration of water; wherein $k$ has a value selected from the range of $10^5$ to $10^{-10}$ s$^{-1}$.

27. The device of claim 26, wherein said user initiated external trigger signal is an electronic signal, an optical signal, a thermal signal, a magnetic signal, a mechanical signal, a chemical signal, an acoustic signal or an electrochemical signal.

28. The device of claim 26, wherein said actuator generates electromagnetic radiation, acoustic energy, an electric field, a magnetic field, heat, a RF signal, a voltage, a chemical change, or a biological change in response to said user initiated external trigger signal, thereby initiating said at least partial transformation.

29. The device of claim 26, wherein said actuator comprises a heater, a reservoir containing a chemical agent capable of causing a chemical change or a biological change, a source of electromagnetic radiation, a source of an electric field, a source of RF energy or a source of acoustic energy.

30. The device of claim 26, wherein said actuator comprises an encapsulating material at least partially encapsulating one or more of said inorganic components, wherein said encapsulating material comprises a selectively removable material that is at least partially removed upon said device receiving said external trigger signal to expose said inorganic components to said internal or external stimulus, thereby initiating said at least partial transformation.

31. The device of claim 26 further comprising an encapsulating material at least partially encapsulating one or more of said inorganic components, wherein said encapsulating material comprises a selectively removable material that is at least partially removed to expose said inorganic components.

32. The device of claim 31, wherein said encapsulating material comprises a silk composite material.

33. The device of claim 26, wherein said one or more inorganic components each independently have a thickness less than or equal to 100 nm.

34. The device of claim 26, wherein said one or more inorganic components are selected from inorganic semiconductor components, metallic conductor components and combinations of inorganic semiconductor components and metallic conductor components.

\* \* \* \* \*